US007061038B2

(12) United States Patent
Endoh et al.

(10) Patent No.: US 7,061,038 B2
(45) Date of Patent: Jun. 13, 2006

(54) SEMICONDUCTOR MEMORY DEVICE AND ITS PRODUCTION PROCESS

(75) Inventors: Tetsuo Endoh, Natori (JP); Fujio Masuoka, Sendai (JP); Takuji Tanigami, Fukuyama (JP); Takashi Yokoyama, Sendai (JP); Shinji Horii, Sendai (JP)

(73) Assignees: Sharp Kabushiki Kaisha, Osaka (JP); Fujio Masuoka, Miyagi (JP)

( * ) Notice: Subject to any disclaimer, the term of this patent is extended or adjusted under 35 U.S.C. 154(b) by 0 days.

(21) Appl. No.: 10/727,266

(22) Filed: Dec. 4, 2003

(65) Prior Publication Data

US 2005/0101087 A1    May 12, 2005

(30) Foreign Application Priority Data

Dec. 5, 2002    (JP)    ............................. 2002-354403

(51) Int. Cl.
*H01L 29/76*    (2006.01)
(52) U.S. Cl. ........................ 257/300; 257/296; 438/257
(58) Field of Classification Search ................. 438/257
See application file for complete search history.

(56) References Cited

U.S. PATENT DOCUMENTS 6,512,695 B1*    1/2003    Forbes et al. .......... 365/185.17
6,778,441 B1*    8/2004    Forbes et al. .......... 365/185.26

FOREIGN PATENT DOCUMENTS

JP    2877462    1/1999

OTHER PUBLICATIONS

Endoh et al., "Semiconductor Memory and Its Production Process", U.S. Appl. No. 10/17,259, filed Jun. 20, 2002.

* cited by examiner

*Primary Examiner*—Thao P. Le
(74) *Attorney, Agent, or Firm*—Nixon & Vanderhye P.C.

(57) ABSTRACT

The present invention provides a semiconductor memory device comprising: a first conductivity type semiconductor substrate; and a plurality of memory cells constituted of an island-like semiconductor layer which is formed on the semiconductor substrate, and a charge storage layer and a control gate which are formed entirely or partially around a sidewall of the island-like semiconductor layer, wherein the plurality of memory cells are disposed in series, the island-like semiconductor layer which constitutes the memory cells has cross-sectional areas varying in stages in a horizontal direction of the semiconductor substrate, and an insulating film capable of passing charges is provided at least in a part of a plane of the island-like semiconductor layer horizontal to the semiconductor substrate.

23 Claims, 241 Drawing Sheets

SEMICONDUCTOR MEMORY DEVICE AND ITS PRODUCTION PROCESS

CROSS-REFERENCE TO RELATED APPLICATION

This application is related to Japanese application No. 2002-354403 filed on Dec. 5, 2002, whose priority is claimed under 35 USC §119, the disclosure of which is incorporated by reference in its entirety.

BACKGROUND OF THE INVENTION

1. Field of the Invention

The present invention relates to a semiconductor memory device and its production process and, more particularly, to a semiconductor memory device provided with a memory transistor having a charge storage layer and a control gate, and its production process.

2. Description of the Related Art

As a memory cell of an EEPROM, there is known a device of a MOS transistor structure having a charge storage layer and a control gate in a gate portion, in which an electric charge is injected into and released from the charge storage layer by use of a tunnel current. In this memory cell, data "0" and "1" is stored as changes in a threshold voltage according to the charge storing state of the charge storage layer.

For example, in the case of an n-channel memory cell using a floating gate as the charge storage layer, when a source/drain diffusion layer and a substrate are grounded and a high positive voltage is applied to the control gate, electrons are injected from the substrate into the floating gate by a tunnel current. This injection of electrons shifts the threshold voltage of the memory cell to be positive. When the control gate is grounded and a high positive voltage is applied to the source/drain diffusion layer or the substrate, electrons are released from the floating gate to the substrate by the tunnel current. This release of electrons shifts the threshold voltage of the memory cell to be negative.

In the above-described operation, a relationship of capacity coupling between the floating gate and the control gate with capacity coupling between the floating gate and the substrate plays an important role in effective injection and release of electrons, i.e., effective writing and erasure. That is, the larger the capacity between the floating gate and the control gate is, the more the potential of the control gate can be transmitted effectively to the floating gate and the easier the writing and erasure become.

With recent development in semiconductor technology, especially, in micro-patterning techniques, the size reduction and the capacity increase of memory cells of EEPROM are rapidly progressing.

Accordingly, it is an important issue to assure a large capacity between the floating gate and the control gate without enlarging the memory cell area.

For increasing the capacity between the floating gate and the control gate, it is necessary to thin a gate insulating film therebetween, to increase the dielectric constant of the gate insulating film or to enlarge an area where the floating gate opposes the control gate.

However, the thinning of the gate insulating film is limited in view of reliability of memory cells. In order to increase the dielectric constant of the gate insulating film, for example, a silicon nitride film is used as the gate insulating film instead of a silicon oxide film. This is also questionable in view of reliability and is not practical.

Therefore, in order to ensure a sufficient capacity between the floating gate and the control gate, it is necessary to set a sufficient overlap area therebetween. This is, however, contradictory to the size reduction of memory cells and the capacity increase of EEPROM.

In an EEPROM disclosed by Japanese Patent No. 2877462, memory transistors are formed by use of sidewalls of a plurality of columnar semiconductor layers arranged in matrix on a semiconductor substrate, the columnar semiconductor layers being separated by trenches in a lattice form.

FIG. 238 shows the EEPROM. FIG. 238 is a plan view of the EEPROM in which columnar silicon layers 2 are cylindrical, that is, the top face has a circular shape. FIGS. 239A and 239B are sectional views taken on lines A–A' and B–B', respectively, in FIG. 238. In FIG. 238, selection gate lines formed by continuing gate electrodes of selection gate transistors are not shown for avoiding complexity of the figure.

The EEPROM uses a P-type silicon substrate 1, on which a plurality of columnar P-type silicon layers 2 are arranged in matrix. The columnar P-type silicon layers 2 are separated by trenches 3 in a lattice form and each of the columnar silicon layers 2 functions as a memory cell region. The memory transistor is constructed by drain diffusion layers 10 formed on the top of the silicon layers 2, common source diffusion layers 9 formed at the bottom of the trenches 3, floating gates 6 formed below the silicon layers 2 with intervention of tunnel oxide films 5 so as to surround the silicon layers 2, and control gates 8 formed with intervention of interlayer insulating films 7 on the outside of the floating gates 6. Oxide films 4 are buried at the bottom of the trenches 3. As shown in FIGS. 238 and 239B, the control gates 8 are provided continuously for a plurality of memory cells in one direction so as to form control gate lines or word lines WL (WL1, WL2, . . . ). In a direction crossing the control gate line, bit lines connected to the drain diffusion layers of the plurality of memory transistors are provided.

In a one transistor/one cell structure, if a memory transfer is over-erased (specifically, a reading potential is 0 V and the threshold is negative), a cell current flows in the memory cell even if the cell is not selected and it is inconvenient. In order to surely prevent it, like the memory transistors, selection gate transistors are formed by providing gate electrodes 32 around an upper part of the silicon layers 2 with intervention of gate oxide films 31. The gate electrodes 32 of the transistors, like the control gates 8 of the memory cells, are provided continuously in the same direction as that of the control gate lines to form selection gate lines.

In the control gate lines, a mask by PEP is formed in columnar silicon layer positions at ends of the cell array. Contact portions 14 made by a polysilicon layer continued from the control gate lines are left on the surface. Also in the selection gate lines, contact portions 15 are left on silicon layers on an end opposite to the contact portions 14 of the control gates. Aluminum wires 13 and 16 to become control gate lines CG and the word lines WL, respectively, are in contact with the contact portions 14 and 15, respectively.

The surface of the substrate of the memory cells formed as described above is covered with a CVD oxide film 11. In the CVD oxide film 11, contact holes are opened, and aluminum wires 12 are provided which serve as bit lines BL (BL1, BL2, . . . ) for connecting the drain diffusion layers 10 of memory cells lined in a direction crossing the word lines WL.

With such a configuration, sufficiently large capacitance between the charge storage layer and the control gate can be assured with a small occupation area. The drain diffusion layers connected to the bit lines of memory cells are formed on the top of the columnar semiconductor layers and are electrically completely insulated by trenches. The device isolation area can be reduced, so that a small memory cell size is achieved. Therefore, a larger-capacity EEPROM in which memory cells having excellent writing and erasing efficiency are integrated can be obtained.

A concrete production process of the EEPROM shown in FIG. 239A will be described with reference to FIGS. 240A to 240G.

The P-type silicon layer 2 with a low impurity concentration is epitaxially grown on the P-type silicon substrate 1 (wafer) with a high impurity concentration. A mask layer 21 is deposited on the silicon layer 2 and a photoresist pattern 22 is formed by a known PEP process. The mask layer 21 is etched by using the photoresist pattern 22 (FIG. 240A).

The silicon layer 2 is etched by a reactive ion etching method using the resulting mask layer 21 to form the trenches 3 in a lattice form which reach the substrate 1. Thereby the silicon layer 2 is separated into a plurality of columnar islands. A silicon oxide film 23 is deposited by a CVD method and anisotropically etched to remain on the sidewalls of the columnar silicon layers 2. By implantation of N-type impurity ions, the drain diffusion layers 10 are formed on the top of the columnar silicon layers 2. The common source diffusion layers 9 are formed at the bottom of the trenches (FIG. 240B).

The oxide films 23 around the columnar silicon layers 2 are etched away by isotropic etching. Channel ion implantation is carried out on the sidewalls of the columnar silicon layers 2 by use of a slant ion implantation as required. By the CVD method instead of the channel ion implantation, an oxide film containing boron may be deposited and diffusion of boron from the oxide film may be utilized. The silicon oxide film 4 is deposited by the CVD method and isotropically etched to be buried at the bottom of trenches 3. The tunnel oxide films 5 are formed to a thickness of about 10 nm around the silicon layers 2 by thermal oxidation. A first-layer polysilicon film is deposited on the tunnel oxide films 5 and is anisotropically etched while leaving the film on lower sidewalls of the columnar silicon layers 2, thereby forming the floating gates 6 around the silicon layers 2 (FIG. 240C).

The interlayer insulating films 7 are formed on the surface of the floating gates 6 formed around the columnar silicon layers 2. The interlayer insulating film 7 is an ONO film, for example. A second-layer polysilicon film is deposited on the interlayer insulating films 7 and is anisotropically etched to form the control gates 8 on lower parts of the columnar silicon layers 2 (FIG. 240D). At this time, the control gates 8 are formed as control gate lines continuous in a longitudinal direction in FIG. 238 without using a masking process by pre-setting intervals between the columnar silicon layers 2 in the longitudinal direction at a predetermined value or less. Unnecessary parts of the interlayer insulating films 7 and underlying tunnel oxide films 2 are etched away. A silicon oxide film 111 is deposited by a CVD method and etched halfway down the trenches 3, that is, to a depth such that the floating gates 7 and control gates 8 of the memory cells are buried and hidden (FIG. 240E).

The gate oxide film 31 is formed to a thickness of about 20 nm on the exposed parts of the columnar silicon layers 2 by thermal oxidation. A third layer polysilicon film is deposited and anisotropically etched to form the gate electrodes 32 of MOS transistors (FIG. 240F). The gate electrodes 32 are also patterned to be continuous in the same direction as the control gate lines, thereby forming selection gate lines. The selection gate lines can be formed continuously in self-alignment, but this is more difficult than the control gates 8 of the memory cells. For, the selection gate transistors are single-layer gates whereas the memory transistors are two-layered gates, and therefore, the intervals between gate electrodes of adjacent cells are wider than the intervals between the control gates. Accordingly, in order to ensure that the gate electrodes 32 are continuous, the gate electrodes may be formed in a two-layer polysilicon structure, a first polysilicon film may be patterned to remain only in locations to connect the gate electrodes by use of a masking process, and a second polysilicon film may be left on the sidewalls of the columnar silicon layers 2.

The control gate lines and selection gate lines are covered with a mask before corresponding polysilicon film etching so that the contact portions 14 and 15 are formed on the top of the columnar silicon layers at different ends.

Finally, a silicon oxide film 112 is deposited by a CVD method and, as required, is planarized. Contact holes are opened and an Al film is deposited and patterned to form Al wires 12 to be bit lines BL, aluminum wires 13 to be control gate lines CG and aluminum wires 16 to be word lines WL at the same time (FIG. 240G).

FIG. 241A is a schematic sectional view of a major part of one memory cell of the EEPROM, and FIG. 241B shows an equivalent circuit of the memory cell. The operation of the EEPROM will be briefly explained with reference to FIGS. 241A and 241B.

For writing by use of injection of hot carriers, a sufficiently high positive potential is applied to a selected word line WL, and predetermined positive potentials are applied to a selected control gate line CG and a selected bit line BL. Thereby, a positive potential is transmitted to the drain of a memory transistor Qc via a selected gate transistor Qs to let a channel current flow in the memory transistor Qc and inject hot carriers. Thereby, the threshold of the memory cell is shifted to be positive.

Data is erased by applying 0 V to a selected control gate CG and applying high positive potentials to the word line WL and the bit line BL to release electrons from the floating gate to the drain. Data in all the memory cells is erased by applying a high positive potential to the common sources to release electrons to the sources. Thereby, the thresholds of the memory cells are shifted to be negative.

Data is read by rendering the selection gate transistor Qs to be ON by the word line WL and applying a reading potential to the control gate line CG. Whether data is "0" or "1" is determined according to the presence or absence of a current.

In the case where the Fowler-Nordheim tunneling is utilized for injecting electrons, high potentials are applied to a selected control gate line CG and a selected word line WL and 0 V is applied to a selected bit line BL to inject electrons from the substrate to the floating gate.

In this EEPROM, the control gates of the memory cells are formed to be continuous in one direction without using a mask. This is possible, however, only when the columnar silicon layers are not arranged symmetrical. That is, by setting the intervals between adjacent columnar silicon layers in a word line direction to be smaller than the intervals between adjacent columnar silicon layers in a bit line direction, it is possible to automatically obtain control gate lines that are separated in the bit line direction and are continuous in the word line direction without using a mask.

In contrast, when the columnar silicon layers are arranged symmetrically, a PEP process is required. More particularly, the second-layer polysilicon film is deposited thick, and through the PEP process, the second-layer polysilicon film is selectively etched to remain in locations to be continuous as control gate lines. The third-layer polysilicon film is deposited and etched to remain on the sidewalls as described above. Even in the case where the columnar silicon layers are arranged asymmetrically, there is a case such that the continuous control gate lines cannot be automatically formed depending upon the intervals of the columnar silicon layers. In such a case as well, it is sufficient to form the control gate lines continuous in one direction by using the mask process as described above. Although the memory cells of the floating gate structure is used in the EEPROM, the charge storage layers do not have to have the floating gate structure but may have a structure such that the charge storage layer is realized by a trap in a laminated insulating film, e.g., a MNOS structure.

FIG. 242 is a sectional view of a memory cell of the MNOS structure. FIG. 242 corresponds to FIG. 239A.

A laminated insulating film 24 functioning as the charge storage layer is has a laminated structure of a tunnel oxide film and a silicon nitride film, or has a structure in which a tunnel oxide film, a silicon nitride film and further an oxide film are stacked.

FIG. 243 is a sectional view of a conventional EEPROM in which the memory transistors and the selection gate transistors are exchanged, specifically, the selection gate transistors are formed in the lower parts of the columnar silicon layers 2 and the memory transistors are formed in the upper parts of the columnar silicon layers 2. FIG. 243 corresponds to FIG. 239A. This structure in which the selection gate transistors are provided on a common source side can apply to the case where the injection of hot electrons is used for writing.

FIG. 244 shows an example in which a plurality of memory cells are formed on one columnar silicon layer. The same numbers are given to components corresponding to those in the above-described examples and their description will not be repeated.

In this EEPROM, a selection gate transistor Qs1 is formed in the lowermost part of a columnar silicon layer 2, three memory transistors Qc1, Qc2 and Qc3 are laid above the selection gate transistor Qs1, and another selection gate transistor Qs2 is formed above.

In the above example, however, as shown in FIG. 241A, diffusion layers do not exist between the selection gate transistors Qs and the memory transistors Qc. This is because, it is hard to form the diffusion layers selectively on the sidewalls of the columnar silicon layers.

Therefore, in the structure shown in FIGS. 239A and 239B, desirably, isolation oxide films between the gates of the memory transistors and the gates of the selection gate transistors are as thin as possible. In the case of utilizing the injection of hot electrons, in particular, the thickness of the isolation oxide films has to be about 30 to 40 nm for allowing a sufficient "H" level potential to be transmitted to the drain of a memory transistor.

Such fine intervals, however, cannot be practically made only by burying the oxide films by the CVD method as described in the above production process.

In the above example, transistors are formed in a direction vertical to the substrate stage by stage, so that it causes increase in the number of the production steps, increase in the manufacturing cost, increase in manufacturing period and deterioration in the yield. In the produced memory transistor, characteristics of the memory cells vary owing to differences in the properties of the tunnel oxide films caused by thermal histories different stage by stage, and differences in the profile of diffusion layers.

Further, although the charge storage layer and the control gate are formed in self-alignment with the columnar semiconductor layer in the example, from the viewpoint of increase in the capacity of the cell array, it is preferable to form the columnar semiconductor layer with the minimum processing dimensions. In the case of using the floating gate as the charge storage layer, the relation between capacitive coupling between the floating gate and the control gate and capacitive coupling between the floating gate and the substrate is determined by the area of the periphery of the columnar semiconductor layer, the area of the periphery of the floating gate, thickness of the tunnel oxide film for insulating the columnar semiconductor layer from the floating gate, and thickness of the interlayer insulating film for insulating the floating gate from the control gate. In the above example, an object is to provide a charge storage layer and a control gate formed around the columnar semiconductor layer by using the side walls of the columnar semiconductor layer and to assure sufficiently large capacitance between the charge storage layer and the control gate with the small occupation area. In the case of forming the columnar semiconductor layer with the minimum processing dimensions and the thickness of the tunnel oxide film and the thickness of the interlayer insulating film are fixed, the capacitance between the charge storage layer and the control gate is simply determined by the area of the periphery of the floating gate, that is, the thickness of the floating gate. Therefore, it is difficult to further increase the capacitance between the charge storage layer and the control gate without increasing the occupation area of the memory cell. In other words, it is difficult to increase the ratio of the capacitance between the floating gate and the control gate to the capacitance between the floating gate and the island-like semiconductor layer without increasing the occupation area of the memory cell.

In the above example, if a plurality of memory cells are connected in series on one columnar semiconductor layer and the thresholds of the memory cells are supposed to be the same, significant changes take place in the thresholds of memory cells at both ends of the memory cells connected in series owing to a back-bias effect of the substrate in a reading operation. In the reading operation, the reading potential is applied to the control gate lines CG and "0" or "1" is determined according to the presence or absence of a current. For this reason, the number of memory cells connected in series is limited in view of the performance of memories. It is therefore to realize further increase in capacity.

SUMMARY OF THE INVENTION

The present invention has been made in view of the above-described problems. An object of the present invention is to provide a semiconductor memory device and its production process realizing improved packing density by facilitating formation of impurity diffusion layers between memory transistors and between a memory transistor and a selection gate transistor with good control, forming a semiconductor memory device having a structure such that a plurality of memory cells are disposed in series in the direction perpendicular to the surface of the semiconductor substrate by a smaller number of processes with good control without increasing the number of processes in association with an increase in the number of stages, and further increasing the capacitance ratio between the charge storage layer and the control gate without increasing an area occupied by memory cells and reducing the influence of the back-bias effect of a semiconductor memory device having a charge storage layer and a control gate.

The present invention provides a semiconductor memory device comprising:

a first conductivity type semiconductor substrate; and a plurality of memory cells constituted of an island-like semiconductor layer which is formed on the semiconductor substrate, and a charge storage layer and a control gate which are formed entirely or partially around a sidewall of the island-like semiconductor layer, wherein the plurality of memory cells are disposed in series, the island-like semiconductor layer which constitutes the memory cells has cross-sectional areas varying in stages in a horizontal direction of the semiconductor substrate, and an insulating film capable of passing charges is provided at least in a part of a plane of the island-like semiconductor layer horizontal to the semiconductor substrate.

The present invention also provides a production process of a semiconductor memory device having a plurality of memory cells constituted of a charge storage layer and a control gate which are formed entirely or partially around a sidewall of an island-like semiconductor layer, the process comprising the steps of:

forming at least one preliminary island-like semiconductor layer on or in a semiconductor substrate;

forming a sidewall spacer of a first insulating film on a sidewall of the preliminary island-like semiconductor layer;

etching the semiconductor substrate while using the sidewall spacer as a mask to form the island-like semiconductor layer whose cross-sectional areas in a horizontal direction of the semiconductor substrate vary in stages;

forming a fifteenth insulating film for covering on the surface of the island-like semiconductor layer and forming sidewall spacers of a sixteenth insulating film on side faces of the island-like semiconductor layer formed in step shape;

selectively removing the fifteenth insulating film using the sidewall spacers as a mask;

forming an insulating film of a single-layer or stacked-layer structure on the island-like semiconductor layer and a first conductive film; and forming an isolated first conductive films by forming the first conductive film in the form of a sidewall spacer on a sidewall of the island-like semiconductor layer with the intervention of the insulating film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
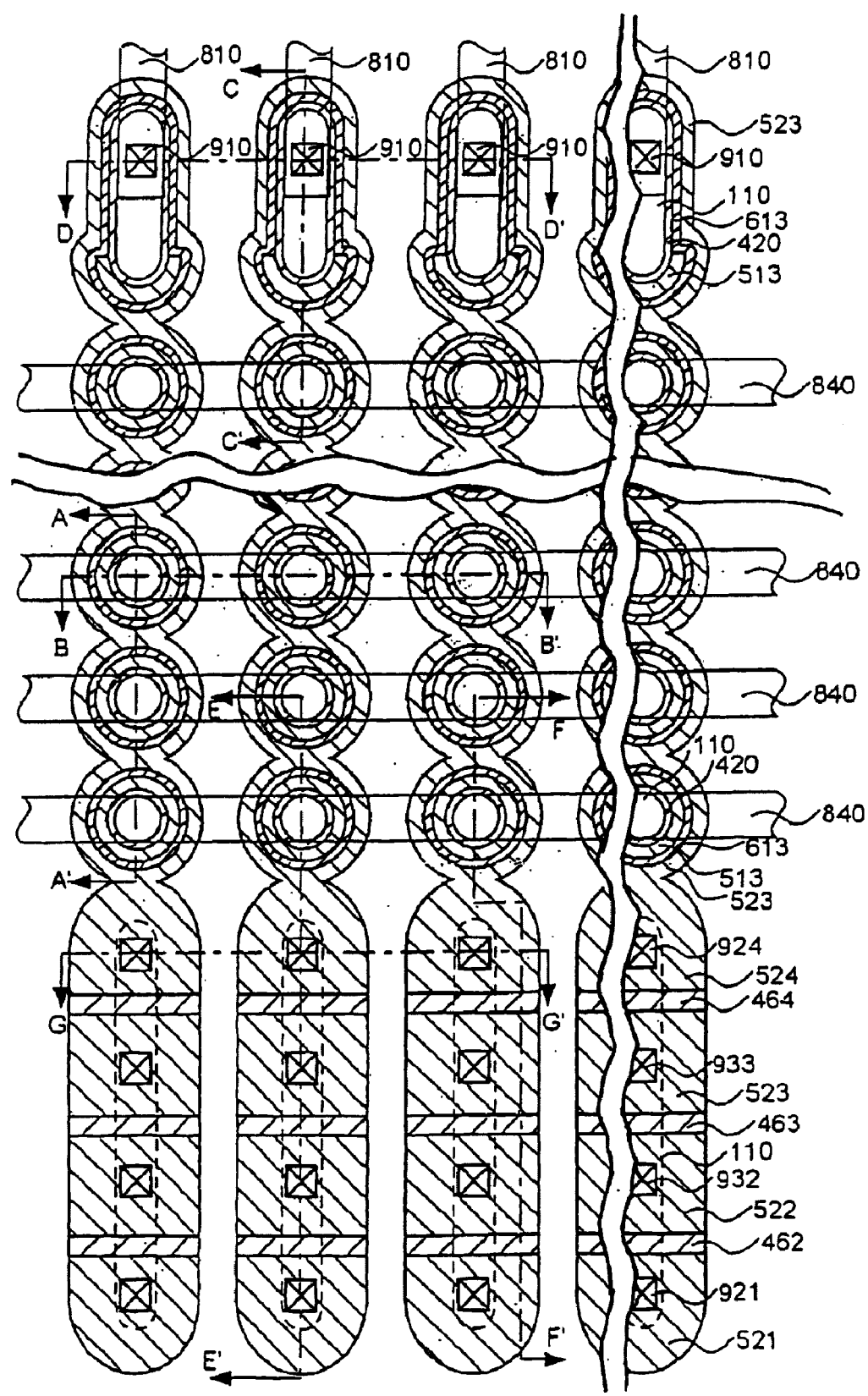
FIGS. 1 to 6 are schematic plain views of memory cell arrays of an EEPROM having a floating gate as the charge storage layer of the invention.

A semiconductor memory device of the present invention has a plurality of memory cells each having a charge storage layer and a third electrode serving as a control gate, which are connected in series in a direction perpendicular to the surface of a semiconductor substrate. The memory cells are formed on or in the semiconductor substrate and sidewalls of a plurality of island-like semiconductor layers arranged in a matrix so as to be isolated from each other in a lattice shape on the semiconductor substrate.

The island-like semiconductor layer has a shape of which cross sectional area in the horizontal direction of the semiconductor substrate varies in stages. Examples of the shape are a shape in which the cross-sectional area decreases toward the semiconductor substrate side, a shape in which the cross-sectional area increases toward the semiconductor substrate side, and a shape in which the cross-sectional area decreases or increases once, then increases or decreases, and becomes equal to the cross sectional area on the semiconductor substrate side.

The charge storage layer and the control gate are formed on side walls of the island-like semiconductor layer. The charge storage layer and the control gate may be formed to surround the entire periphery of the sidewall of the island-like semiconductor layer or may be formed in an area except for an area as a part of the periphery. The charge storage layer and the control gate may be formed in a stage of the island-like semiconductor layer or in two stages. It is preferable from the viewpoint of simplicity of a production process that the charge storage layer and the control gate are formed in one stage. The charge storage layer may be a floating gate and may be formed by a single film or a stacked film of a dielectric film and an insulating film.

Only one memory cell or two or more memory cells may be formed on one island-like semiconductor layer. If three or more memory cells are formed, preferably, a selection gate is formed below and/or above the memory cells to form a selection transistor together with the island-like semiconductor layer. Specifically, at both ends of the plurality of memory cells connected in series, a selection gate transistor having a thirteenth electrode serving as a selection gate is connected. The selection gate is formed on the side wall of the island-like semiconductor layer.

An impurity diffusion layer disposed in the island-like semiconductor layer is formed as the source or drain of the memory cell.

The control gates form a control gate line as a third line disposed continuously with respect to the plurality of island-like semiconductor layers and disposed in the horizontal direction of the surface of the semiconductor substrate. A bit line as a fourth line is disposed so as to be electrically connected to the impurity diffusion layer in a direction crossing the control gate line and provided in the horizontal direction of the surface of the semiconductor substrate.

Preferably, at least one of the memory cells is "electrically insulated" from the semiconductor substrate. Accordingly, the selection gate transistor is also "electrically insulated" from the semiconductor substrate. "Electrical insulation" from the semiconductor substrate means that the semiconductor substrate and the island-like semiconductor layer are electrically insulated from each other. If two or more memory cells are formed, memory cells may be electrically insulated from each other so that a memory cell/memory cells above the insulating site is/are electrically insulated from the semiconductor substrate. If a selection gate (memory gate) is arbitrarily formed below the memory cell(s) as will be described later, a selection transistor composed of the selection gate may be electrically insulated from the semiconductor substrate. Alternately, a selection transistor and a memory cell may be electrically insulated from each other so that a memory cell/memory cells above the insulating site is/are electrically insulated from the semiconductor substrate. It is particularly preferable that the selection transistor is formed between the semiconductor substrate and the island-like semiconductor layer or below the memory cell(s) and the selection transistor is electrically insulated from the semiconductor substrate.

Electric insulation may be made, for example, by forming an impurity diffusion layer of a conductivity type (second conductivity type) different from that of the semiconductor substrate over an entire region to be insulated or by forming the second conductivity type impurity diffusion layer in part of the region to be insulated and utilizing a depletion layer at a junction of the impurity diffusion layer. Alternately, by providing an interval to a degree that electric conduction is not made, electric insulation may be carried out as a result. The semiconductor substrate may be electrically insulated from the memory cell(s) or the selection transistor by an insulating film of $SiO_2$ or the like. In the case where a plurality of memory cells are formed and selection transistors are optionally formed above and/or below the memory cells, the electric insulation may be carried out between optional memory cells and/or between a selection transistor and a memory cell.

Embodiments of Memory Cell Arrays in Plan Views

FIGS. 1 to 6 are plan views of a memory cell array in the semiconductor memory device of the present invention. In the drawings, memory cells in a low stage of the memory cell array are shown and selection gate transistors are not shown for simplicity of the drawings. These figures also illustrate layouts of selection gate lines as second or fifth wiring, control gate lines as third wiring, bit lines as fourth wiring, and source lines as first wiring.

FIGS. 1 to 6 show memory cell arrays of an EEPROM having a floating gate as the charge storage layer.

In FIG. 1, island-like semiconductor layers in a columnar for constituting memory cells are arranged to be located at intersections where a group of parallel lines and another group of parallel lines cross at right angles. First, second, third and fourth wiring layers for selecting and controlling the memory cells are disposed in parallel to the surface of the substrate. By changing intervals between island-like semiconductor layers between an A–A' direction which crosses fourth wiring layers 840 and a B–B' direction which is the direction of the fourth Wiring layers 840, second conductive films which act as the control gates of the memory cells are formed continuously in one direction which is, in FIG. 1, the A–A' direction and become the third wiring layers. Likewise, second conductive films which act as the gates of the selection gate transistors are formed continuously in one direction to be the second wiring layers.

A terminal for electric connection to the first wiring layer disposed on a substrate side of island-like semiconductor layers is provided, for example, at an A'-side end of a row of memory cells connected in the A–A' direction in FIG. 1, and terminals for electric connection to the second and third wiring layers are provided at an A-side end of the row of memory cells connected in the A–A' direction in FIG. 1. The fourth wiring layers 840 disposed on a side of the island-like semiconductor layers opposite to the substrate are formed, for example, in the direction which crosses the second and third wiring layers and are electrically connected to the island-like semiconductor layers. The terminals for electric connection to the first wiring layers are formed of island-like semiconductor layers, and the terminals for electric connection to the second and third wiring layers are formed of second conductive films covered with the island-like semiconductor layers.

The terminals for electric connection to the first, second and third wiring layers are connected to first contacts 910, second contacts 921 and 924 and third contacts 932 and 933, respectively.

First wiring layers 810 are led onto the top face of the semiconductor memory device via the first contacts 910.

The arrangement of the island-like semiconductor layers, in the columnar, constituting the memory cells is not particularly limited and may be arbitrary as long as the above-mentioned positional relationship and electric connection between the wiring layers are satisfied.

The island-like semiconductor layers connected to the first contacts 910 are all located at the A-side ends of the memory cells connected in the A–A' direction. However, they may be located at all or part of the A'-side ends or may be located at any of the island-like semiconductor layers constituting the memory cells connected in the A–A' direction.

The island-like semiconductor layers covered with the second conductive films connected to the second contacts 921 and 924 and the third contacts 932 and 933 may be located at the ends where the first contacts 910 are not disposed, may be located continuously at the ends where the first contacts 910 are disposed, and may be located at any of the island-like semiconductor layers constituting the memory cells connected in the A–A' direction. The second contacts 921 and 924, the third contacts 932 and 933, and the like may be located at different places.

The width and shape of the first wiring layers 810 and the fourth wiring layers 840 are not particularly limited so long as a desired wiring can be obtained.

In the case where the first wiring layers, which are disposed on the substrate side of the island-like semiconductor layers, are formed in self-alignment with the second and third wiring layers formed of the second conductive films, the island-like semiconductor layers which act as the terminals for electric connection to the first wiring layers are electrically insulated from the second and third wiring layers formed of the second conductive films but have to be in contact with the second and third wiring layers with intervention of insulating films. For example, first conductive films are formed partially on the sidewalls of the island-like semiconductor layers connected to the first contacts 910 with intervention of insulating films. The first conductive films are located to face the island-like semiconductor layers. The second conductive films are formed on the first conductive films with intervention of insulating films. The second conductive films are connected to the second and third wiring layers formed continuously in the A–A' direction. At this time, the shape of the first and the second conductive films formed on the sidewalls of the island-like semiconductor layers is not particularly limited.

The first conductive films on the sidewalls of the island-like semiconductor layers which act as the terminals for electric connection to the first wiring layers may be removed by setting the distance between the island-like semiconductor layers serving as the terminal for electric connection to the first wiring layer and the first conductive films on the island-like semiconductor layers for constituting the memory cells, for example, to be twice or less as large as the thickness of the second conductive films.

In FIG. 1, the second and third contacts are formed on the second wiring layers and the third wiring layers which are formed to cover the top face of the island-like semiconductor layers. However, the shape of the second and third wiring layers is not particularly limited so long as their connection is realized.

Figure 2:
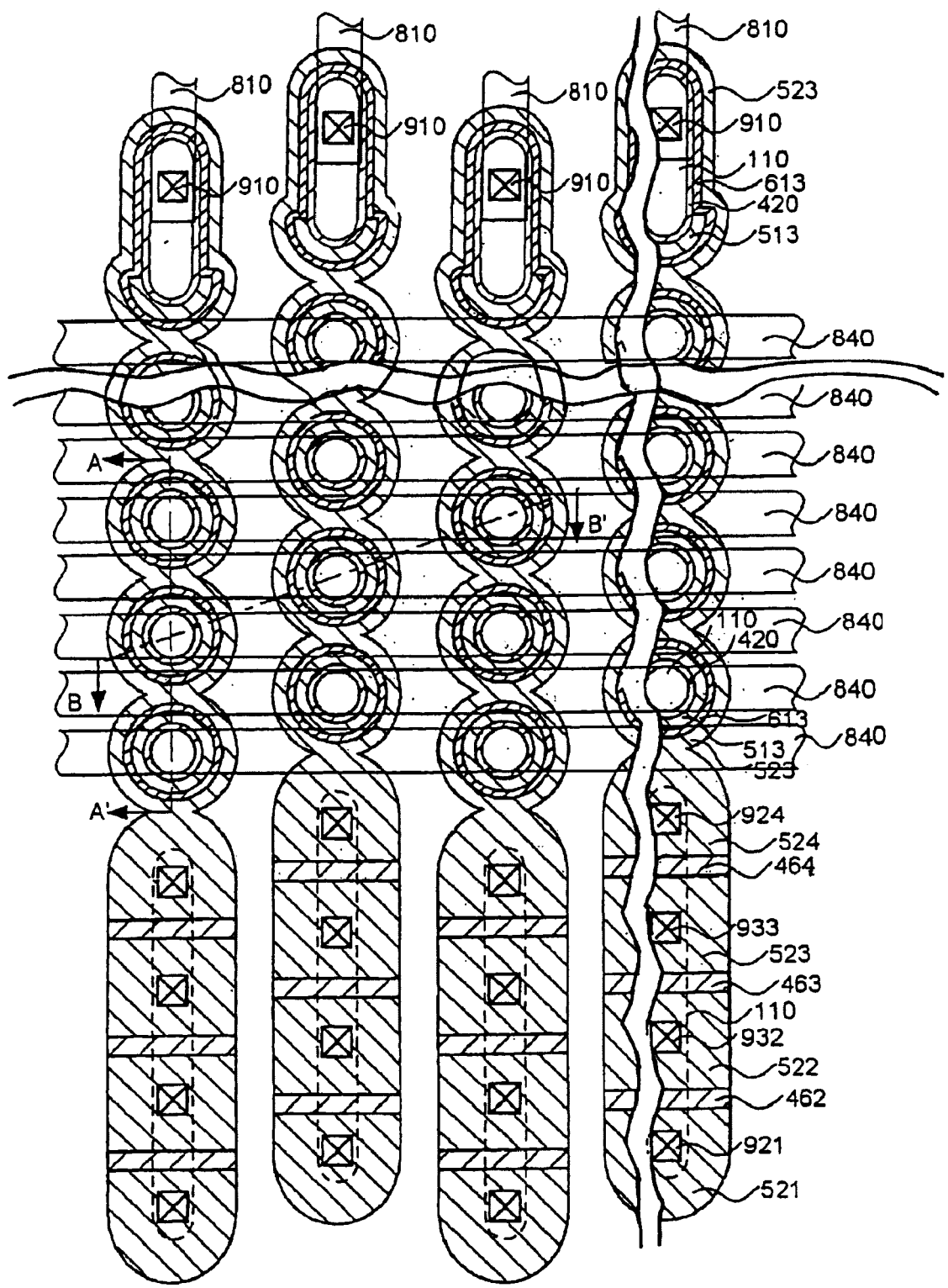

In FIG. 2, the island-like semiconductor layers in a columnar for constituting memory cells are located at intersections where a first group of parallel lines and another group of parallel lines cross at right angles and intersections where a group of second group of parallel lines disposed between the first group and another group of parallel lines cross at right angles. First, second, third and fourth wiring layers for selecting and controlling the memory cells are disposed in parallel to the surface of the substrate. By changing intervals between the island-like semiconductor layers between the A–A' direction and the B–B' direction, second conductive films which act as the control gates of the memory cells are formed continuously in one direction which is the A–A' direction in FIG. 2, to form the third wiring layers. Likewise, second conductive films which act as the gates of the selection gate transistors are formed continuously in one direction to form the second wiring layers.

Further, terminals for electric connection to the first wiring layers disposed on a substrate side of the island-like semiconductor layers are provided at the A-side end of rows of memory cells connected in the A–A' direction, and terminals for electric connection to the second and third wiring layers are provided at the A'-side end.

The fourth wiring layers 840 disposed on a side of the island-like semiconductor layers opposite to the substrate are electrically connected to the island-like semiconductor layers. The fourth wiring layers 840 are formed in the direction crossing the second and third wiring layers.

The terminals for electric connection to the first wiring layers are formed of island-like semiconductor layers, and the terminals for electric connection to the second and third wiring layers are formed of the second conductive film covering the island-like semiconductor layers. The terminals for electric connection to the first, second and third wiring layers are connected to the first contacts 910, the second contacts 921 and 924 and the third contacts 932, 933, respectively.

The first wiring layers 810 are led onto the top of the semiconductor memory device via the first contacts 910.

The arrangement of the island-like semiconductor layers in the columnar is arbitrary so long as the above-mentioned positional relationship and electric connection between the wiring layers are satisfied. Although the island-like semiconductor layers connected to the first contacts 910 are all located at the A'-side end of the rows of memory cells connected in the A–A' direction in FIG. 2, they may be located all or part of the ends on the A side or may be located at any of the island-like semiconductor layers for constituting the memory cells connected in the A–A' direction.

The island-like semiconductor layers covered with the second conductive film and connected to the second contacts 921 and 924 and the third contacts 932 and 933 may be located at ends where the first contacts 910 are not disposed, may be continuously located at the end where the first contacts 910 are disposed, or may be located at any of the island-like semiconductor layers for constituting the memory cells connected in the A–A' direction. The second contacts 921 and 924 and the third contacts 932 and 933 may be located at different places.

The width and shape of the first wiring layers 810 and the fourth wiring layers 840 are not particularly limited so long as desired wiring can be obtained.

In the case where the first wiring layers disposed on the substrate side of the island-like semiconductor layers are formed in self-alignment with the second and third wiring layers formed of the second conductive film, the island-like semiconductor layers serving as the terminal for electric connection to the first wiring layers are electrically insulated from the second and third wiring layers formed of the second conductive film but have to be in contact with the second and third wiring layers with intervention of an insulating film. For example, the first conductive films are formed on part of the sidewalls of the island-like semiconductor layers connected to the first contacts 910 with intervention of insulating films. The first conductive films are located to face the island-like semiconductor layers. The second conductive films are formed on the side face s of the first conductive films with intervention of insulating films. The second conductive films are connected to the second and third wiring layers formed continuously in the A–A' direction. The shapes of the first and the second conductive films formed on the side faces of the island-like semiconductor layers are not particularly limited.

The first conductive films on the sidewalls of the island-like semiconductor layers which act as the terminals for electric connection to the first wiring layers may be removed by setting the distance between said island-like semiconductor layers serving as the terminal for electric connection to the first wiring layers and the first conductive films on the island-like semiconductor layers for constituting the memory cells, for example, to be twice or less as large as the thickness of the second conductive films.

Although the second and third contacts are formed on the second wiring layers, the third wiring layers, and the like which are formed so as to cover the top face of the island-like semiconductor layers, the shapes of the second and third wiring layers are not particularly limited so long as the contacts can be connected.

Figure 3:
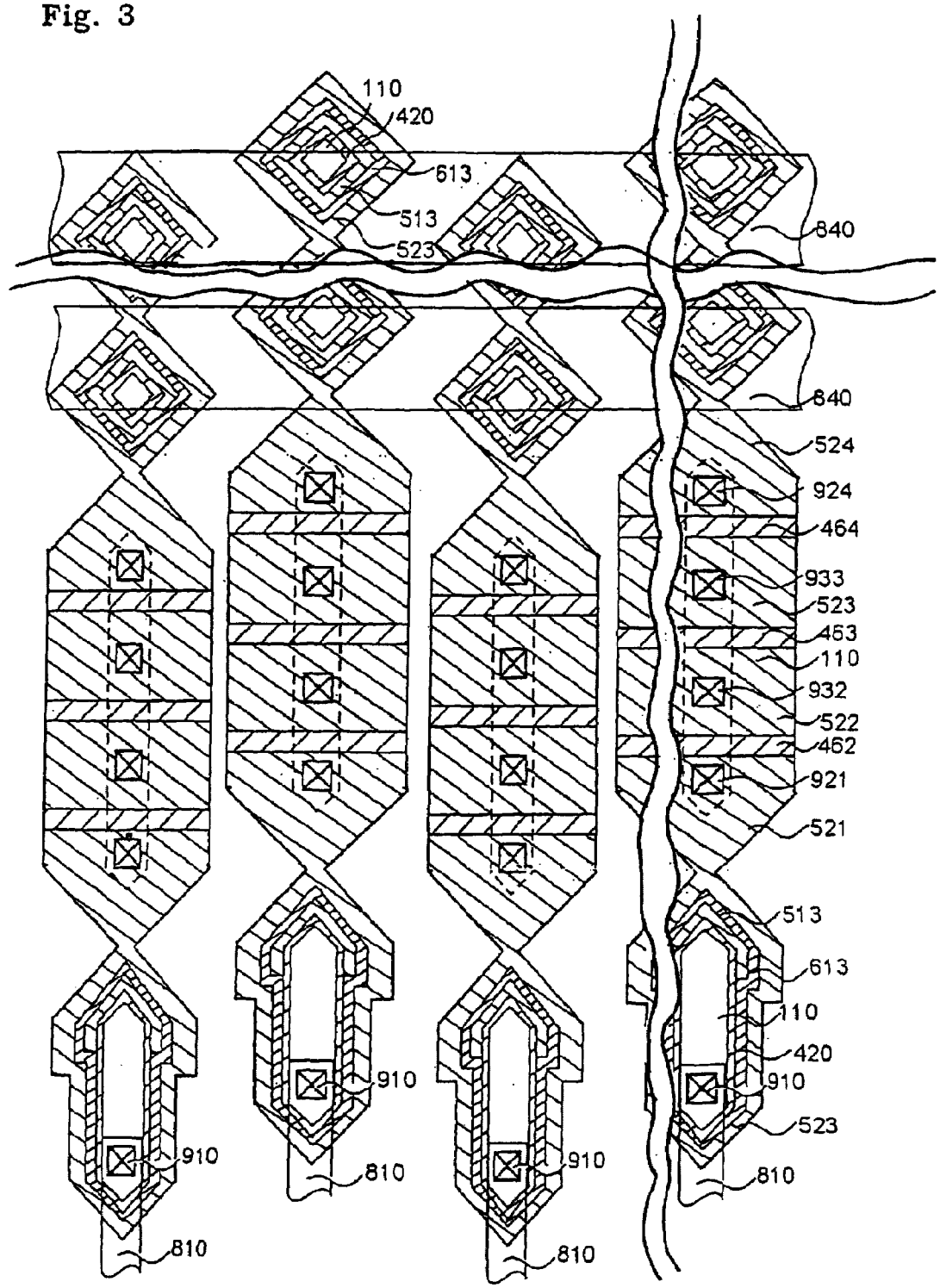
Figure 4:
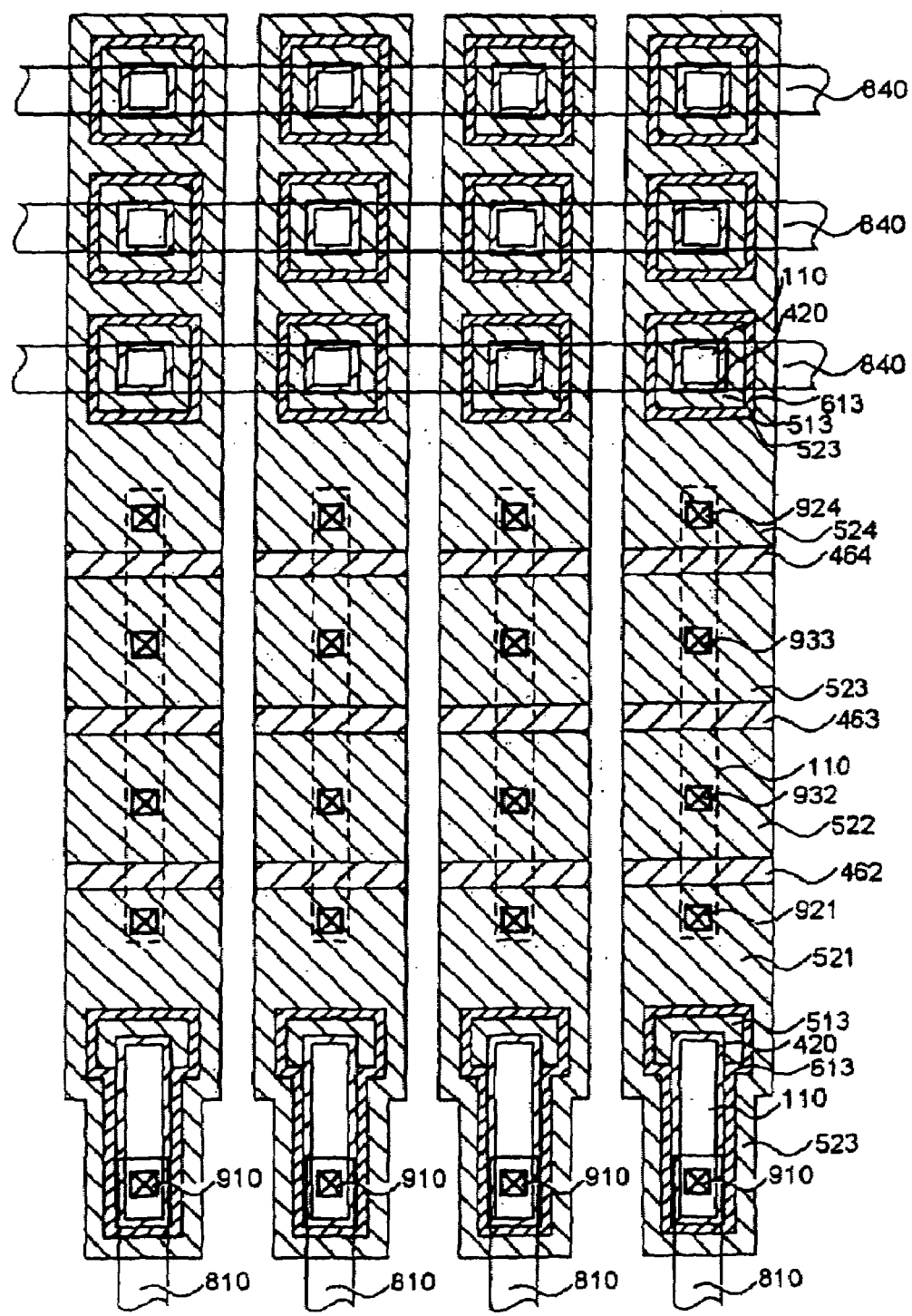

FIG. 3 and FIG. 4, different from FIGS. 1 and 2, the island-like semiconductor layer has a square shape in cross section. The orientation of the island-like semiconductor layers in FIG. 3 and that in FIG. 4 are different from each other. The sectional shape of the island-like semiconductor layer may be a polygonal shape such as ellipse, hexagon or octagon. However, if the island-like semiconductor layers have a dimension close to the limit of processing, even if the island-like semiconductor layer has a polygonal shape at the time of designing, the shape becomes like a circle or ellipse through photolithography, etching, and the like.

Figure 5:
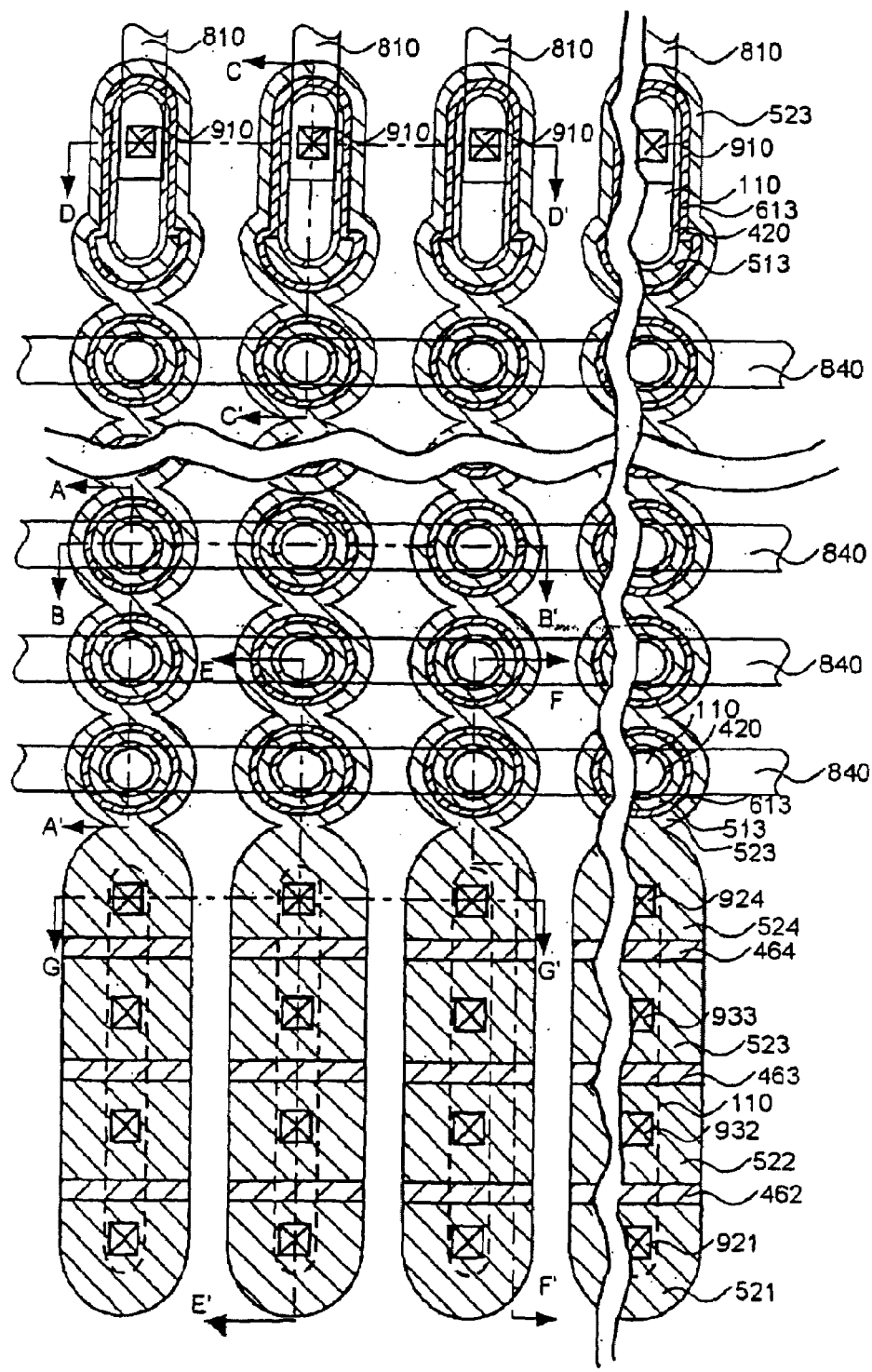

In FIG. 5, different from FIG. 1, the island-like semiconductor layer has an elliptic cross section, and the major axis of an ellipse is in the B–B' direction.

Figure 6:
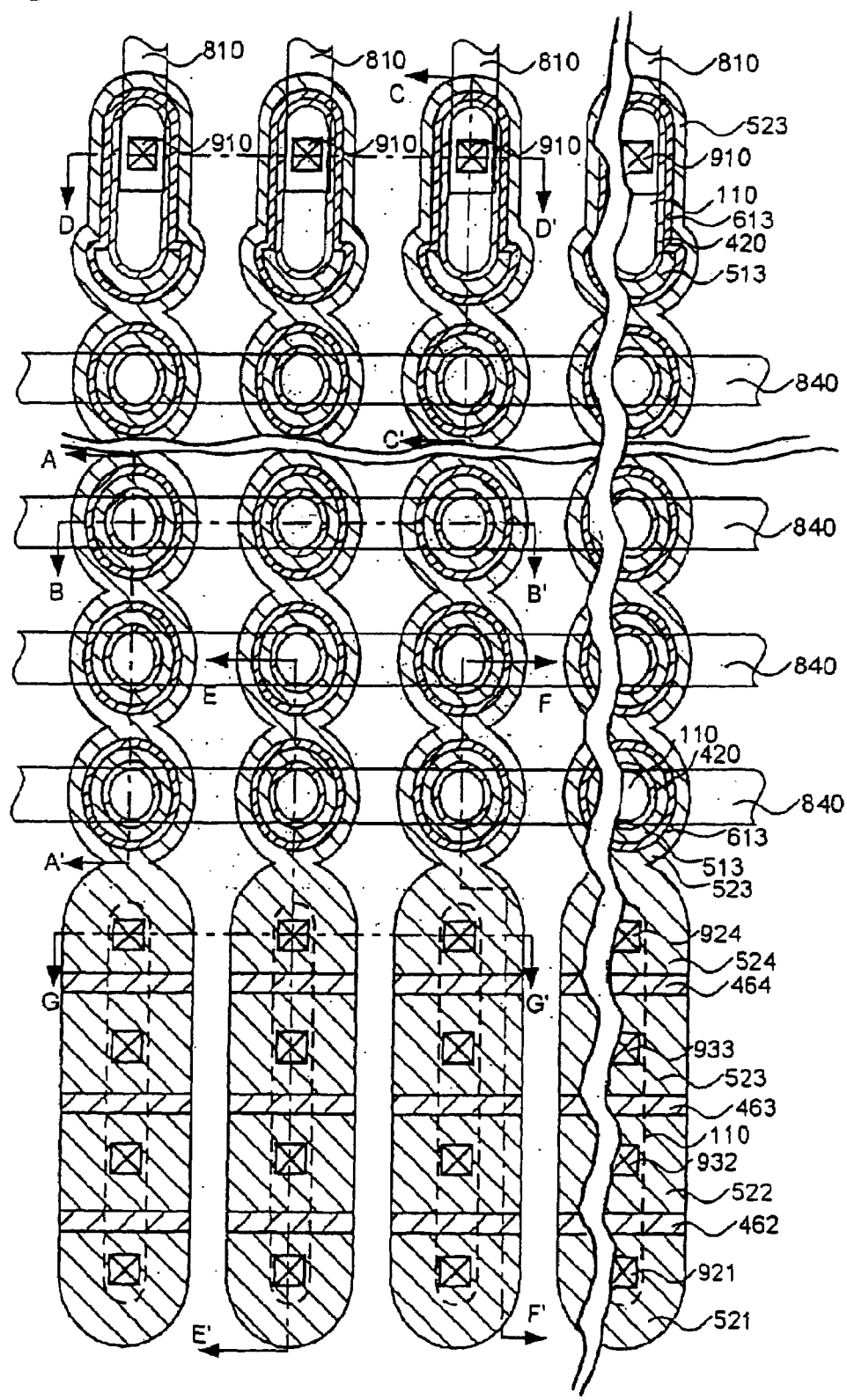

In FIG. 6, different from FIG. 5, the major axis of an ellipse is in the A–A' direction. The major axis may be in any direction.

The arrangements and structures shown in FIGS. 1 to 6 may be combined in various ways.

Embodiments of Memory Cell Arrays as Shown in Sectional Views

Figure 7:
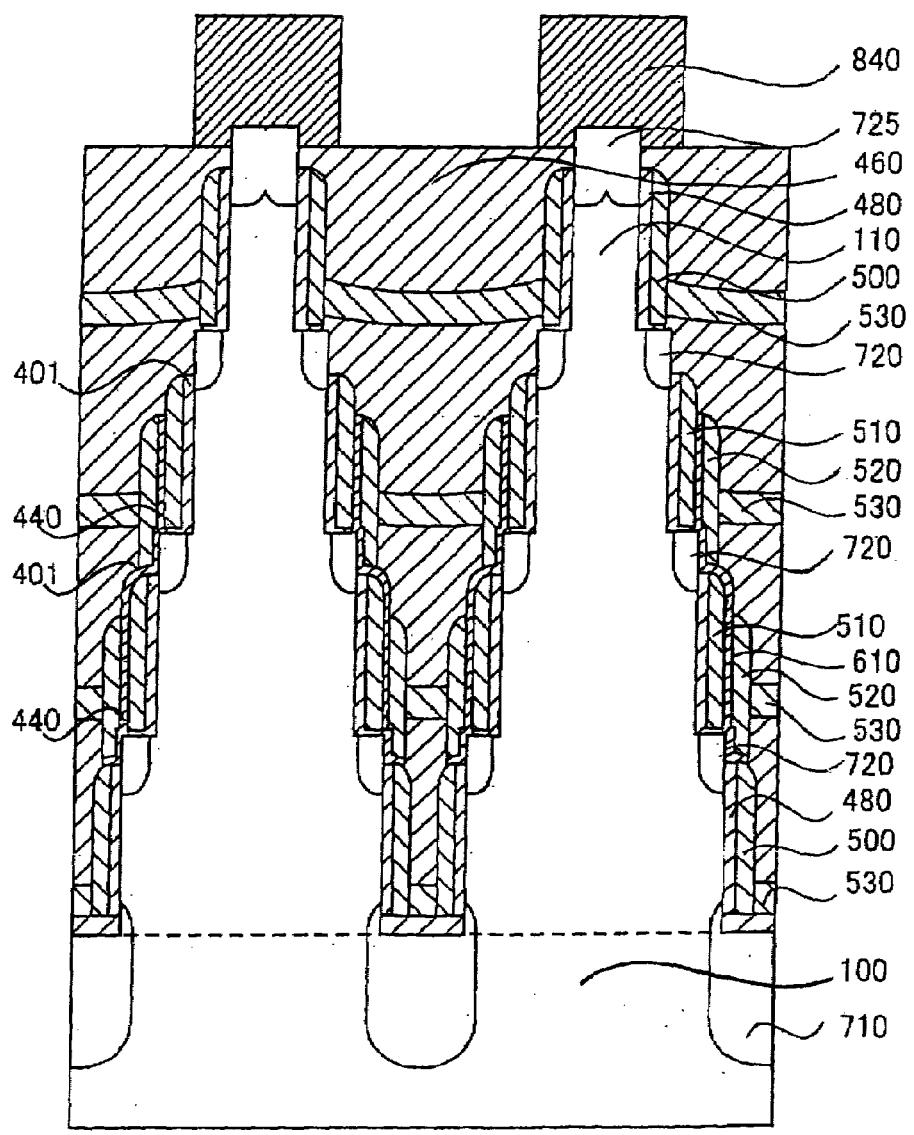
FIGS. 7, 9, 11, 13, 15, 17, 19, 21, 23, 25, 27, 29, 31, 33, 35, 37, 39, 41, 43, 45, 47, 49, 51, 53, 55, 57 and 59 are schematic sectional views of A–A' line of FIG. 1.
Figure 60:
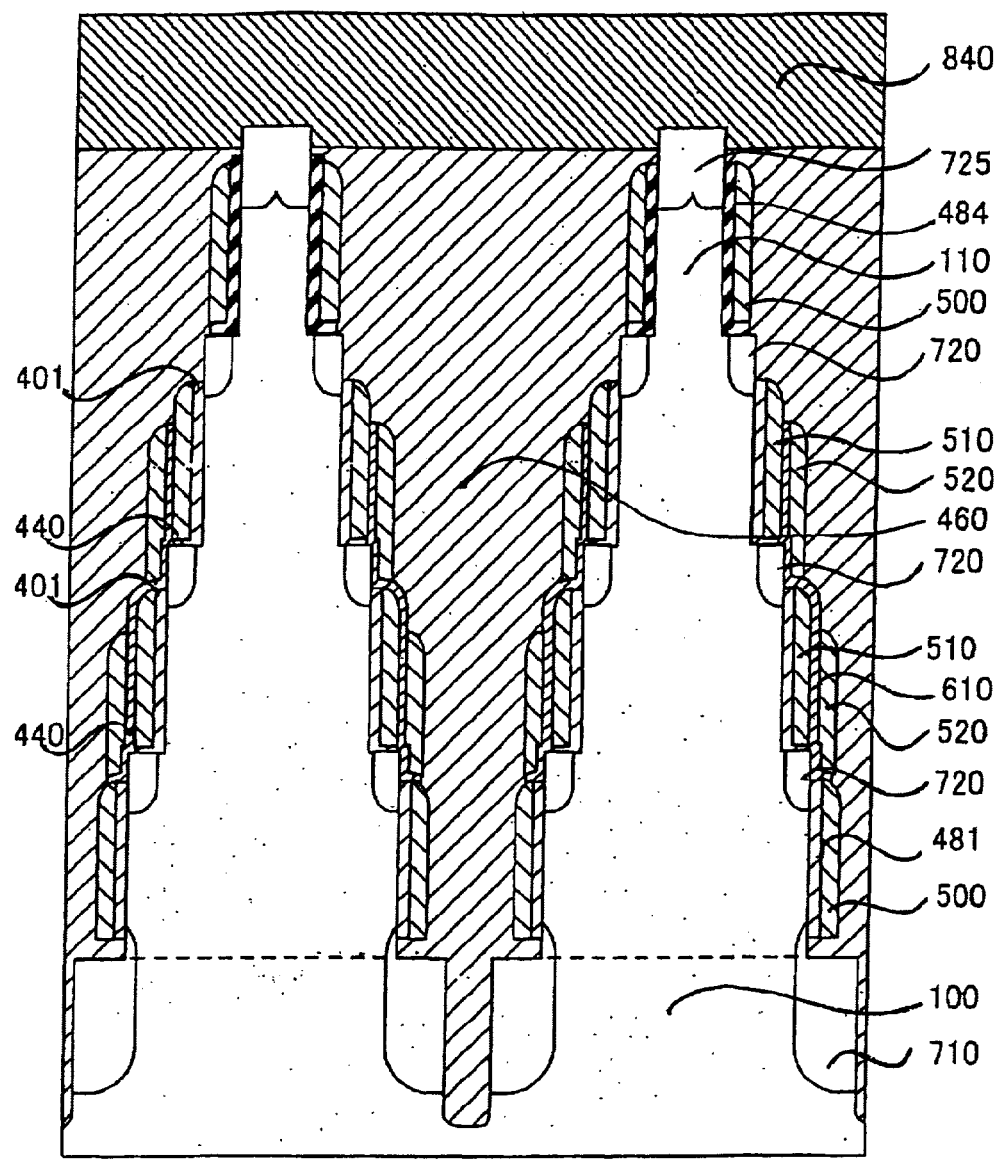

FIGS. 7 to 60 are sectional views of semiconductor memories having floating gates as charge storage layers. In FIGS. 7 to 60, the odd-numbered figures show cross sections taken on line A–A' as shown in FIG. 1, and the even-numbered figures show cross sections taken on line B–B' as shown in FIG. 1.

In FIGS. 7 to 60, a plurality of columnar island-like semiconductor layers 110 having three steps are arranged in a matrix on a P-type silicon substrate 100.

A silicon oxide film 460 as a seventh insulating film having a specific thickness is formed at the bottom of the trench between island-like semiconductor layers 110. In the dent formed so as to surround each island-like semiconductor layer 110, a second electrode 500 to be a selection gate is formed with intervention of a gate insulating film 480. In such a manner, a selection gate transistor is constituted.

Above the selection gate transistor, a memory gate oxide film 401 is disposed on the side wall of the island-like semiconductor layer 110, a floating gate 510 is formed at least a part of the horizontal surface of the step of the island-like semiconductor layer 110 with intervention of a tunnel oxide film 440 and, further, a control gate 520 is disposed on at least a part of the sidewall of the floating gate 510 with intervention of an interlayer insulating film 610 to thereby form a memory transistor. The interlayer insulating film 610 is formed of a multi-layer film.

Above the memory transistors, a transistor to be a selection gate having a fifth electrode 500 serving as a selection gate is formed with intervention of the gate insulating film 480.

As shown in FIGS. 1 and 7, the selection gate 500 and the control gate 520 are continuously provided with regard to a plurality of transistors in one direction to form a selection gate line which is a second wiring or a fifth wiring and a control gate line which is the third wiring.

In the semiconductor substrate, a source diffusion layer 710 of a memory cell is formed, and further, a diffusion layer 720 is arranged each between memory cells and between the selection gate transistor and the memory cell. A drain diffusion layer 725 is arranged for each memory cell in the top face of each island-like semiconductor layer 110. The source diffusion layer 710 of the memory cell may be arranged so that the active region of the memory cell is floated from the semiconductor substrate. Alternately, a structure in which an insulating film is inserted under the semiconductor substrate, for example, a SOI substrate may be used. Between the thus arranged memory cells, the oxide film 460 which is an eighth insulating film is formed so that the top of the drain diffusion layer 725 is exposed. The aluminum wiring 840 is provided which serves as a bit line commonly connecting the drain diffusion layers 725 of memory cells in a direction crossing the control gate line.

Preferably, the impurity concentration distribution of the diffusion layer 720 is that, rather than uniform, the concentration is gradually lowered toward the inside from the surface of the island-like semiconductor layer 110. Thereby the junction withstand voltage between the diffusion layer 720 and the island-like semiconductor layer 110 is improved, and also the parasitic capacitance decreases. Similarly, it is also preferable that the impurity concentration in the source diffusion layer 710 is gradually lowered toward the inside of the semiconductor substrate 100 from the surface of the semiconductor substrate 100. Thereby the junction withstand voltage between the source diffusion layer 710 and the semiconductor substrate 100 is improved, and also the parasitic capacitance in the first wiring layer decreases.

Figure 8:
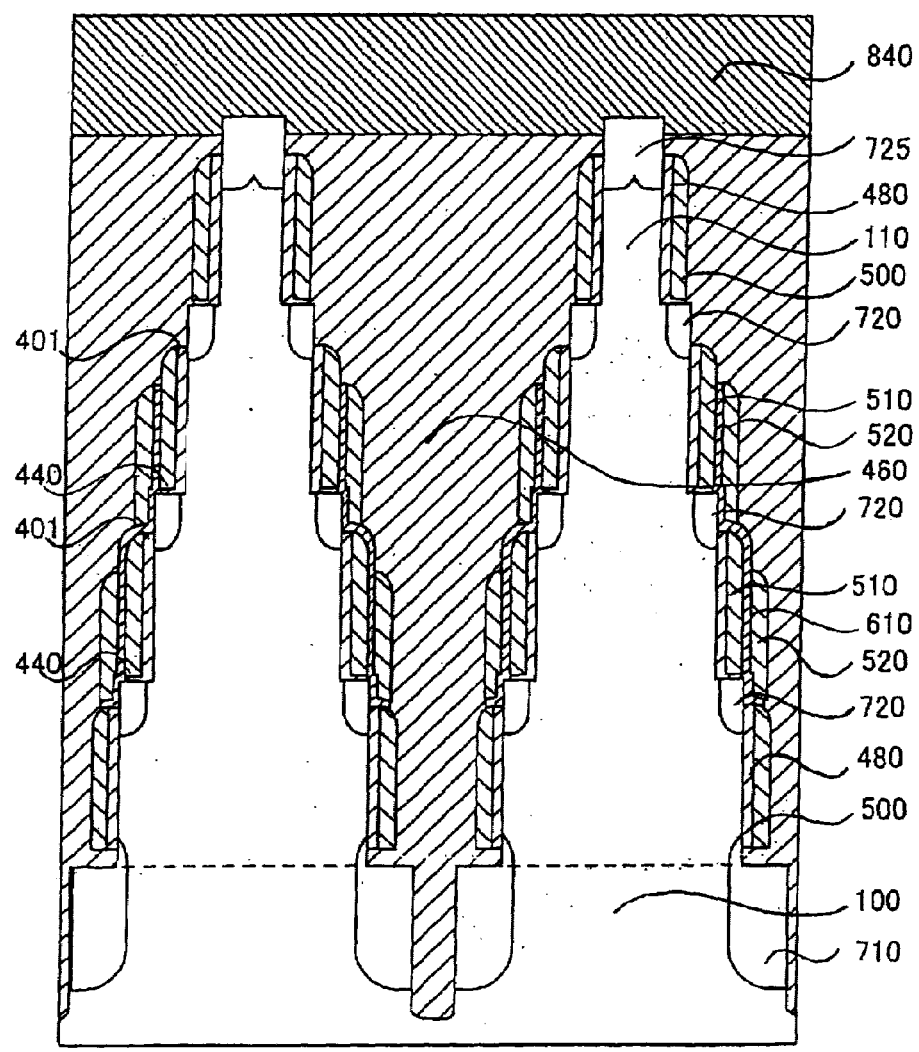
FIGS. 8, 10, 12, 14, 16, 18, 20, 22, 24, 26, 28, 30, 32, 34, 36, 38, 40, 42, 44, 46, 48, 50, 52, 54, 56, 58 and 60 are schematic sectional views of B–B' line of FIG. 1.

In FIGS. 7 and 8, the bit lines and the source lines formed by the source diffusion layers 710 are disposed in directions crossing each other, and the thickness of the floating gate 510 is equal to that of the control gate 520.

Figure 9:
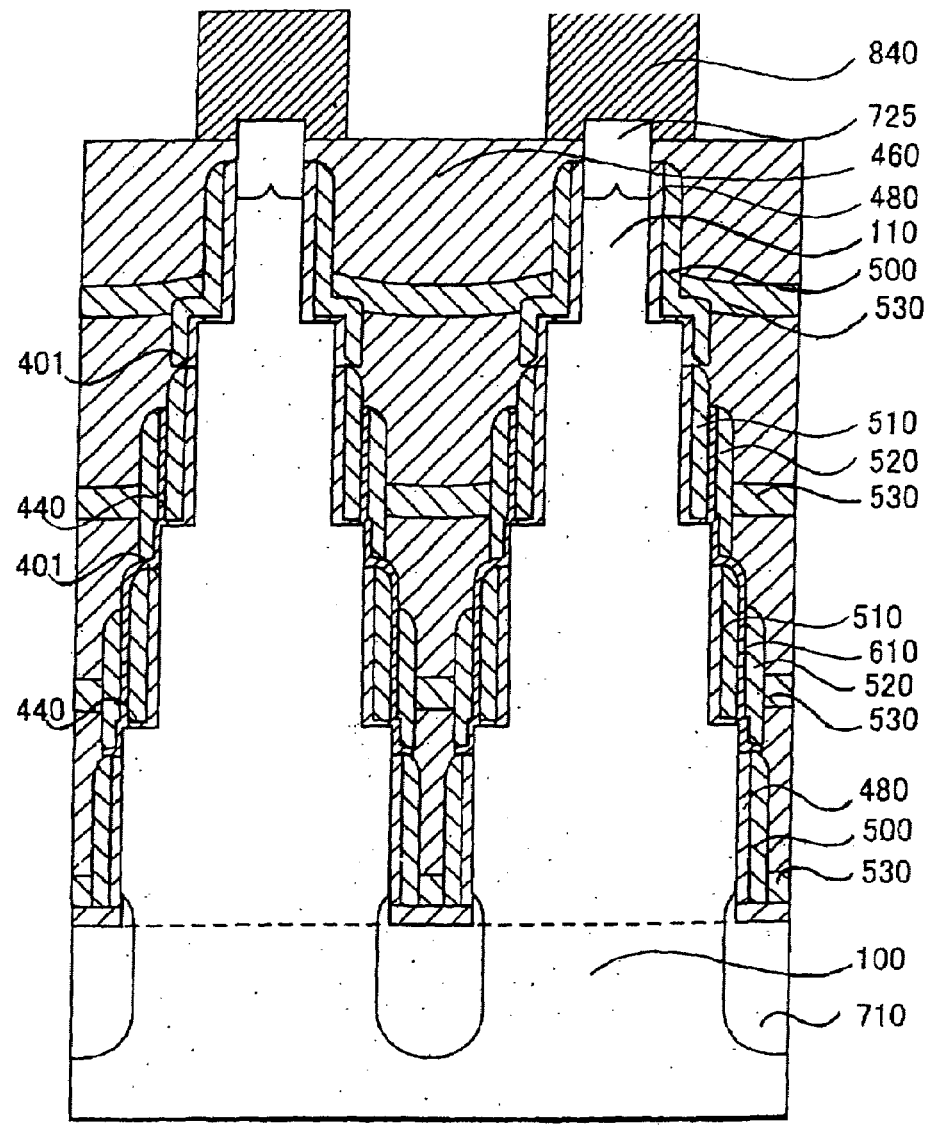
Figure 10:
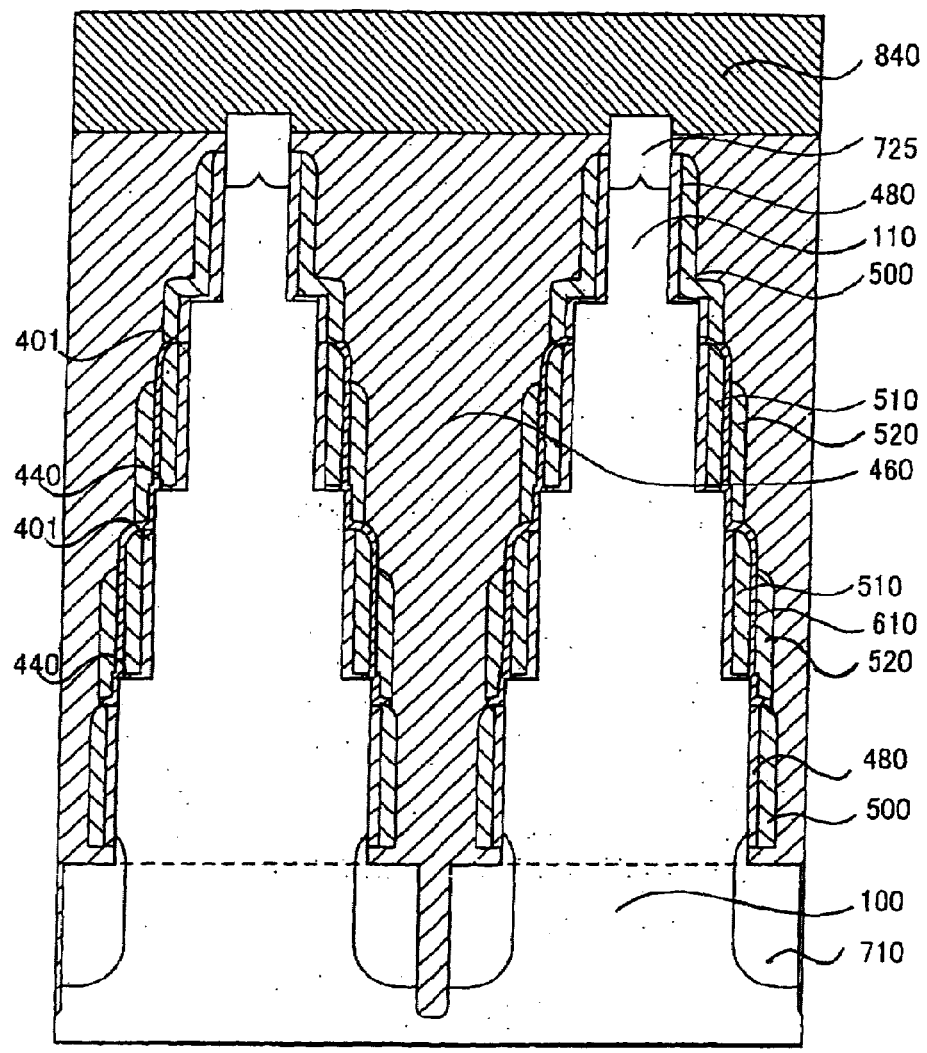

In FIGS. 9 and 10, the diffusion layer 720 is not provided between transistors.

Figure 11:
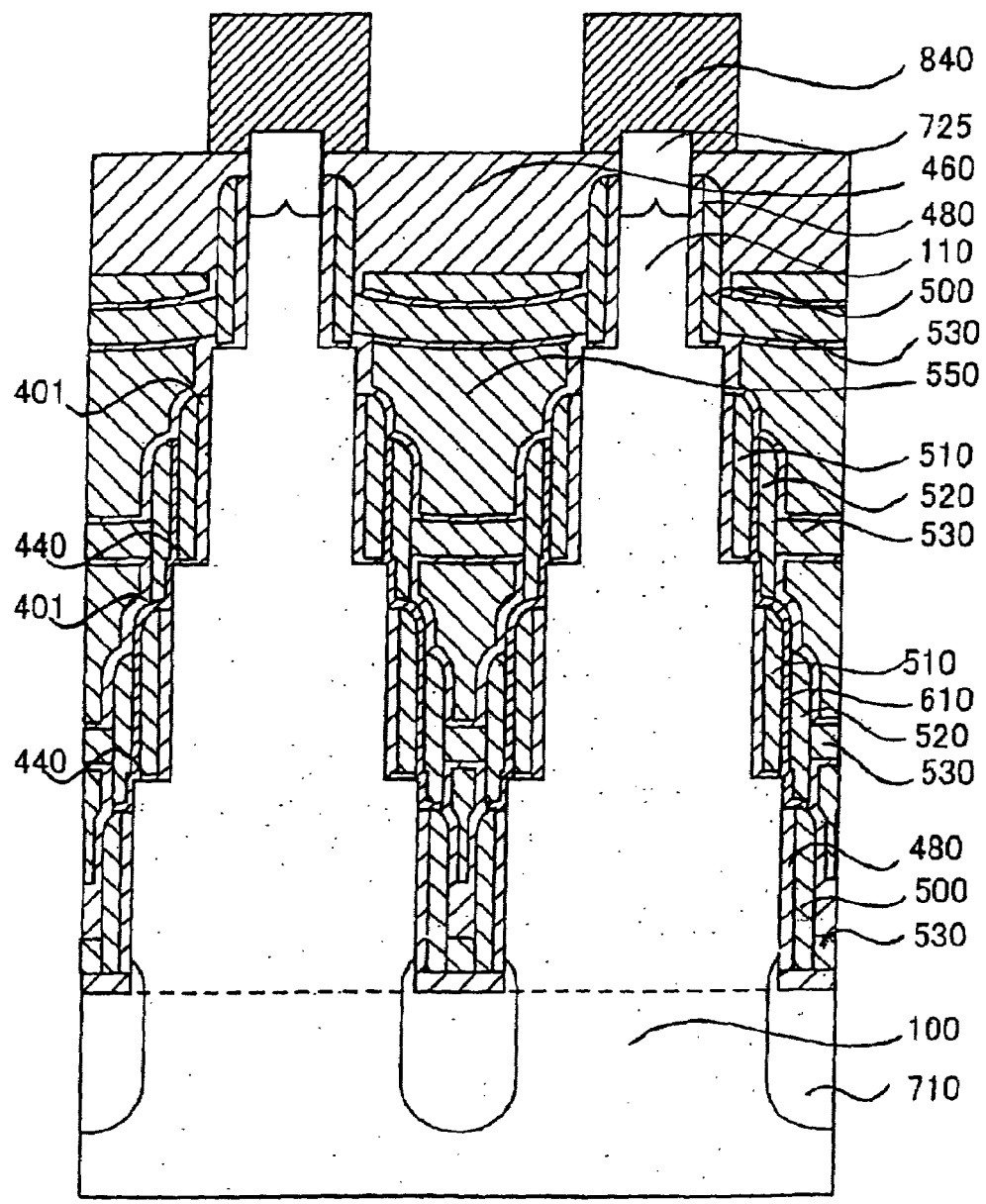
Figure 12:
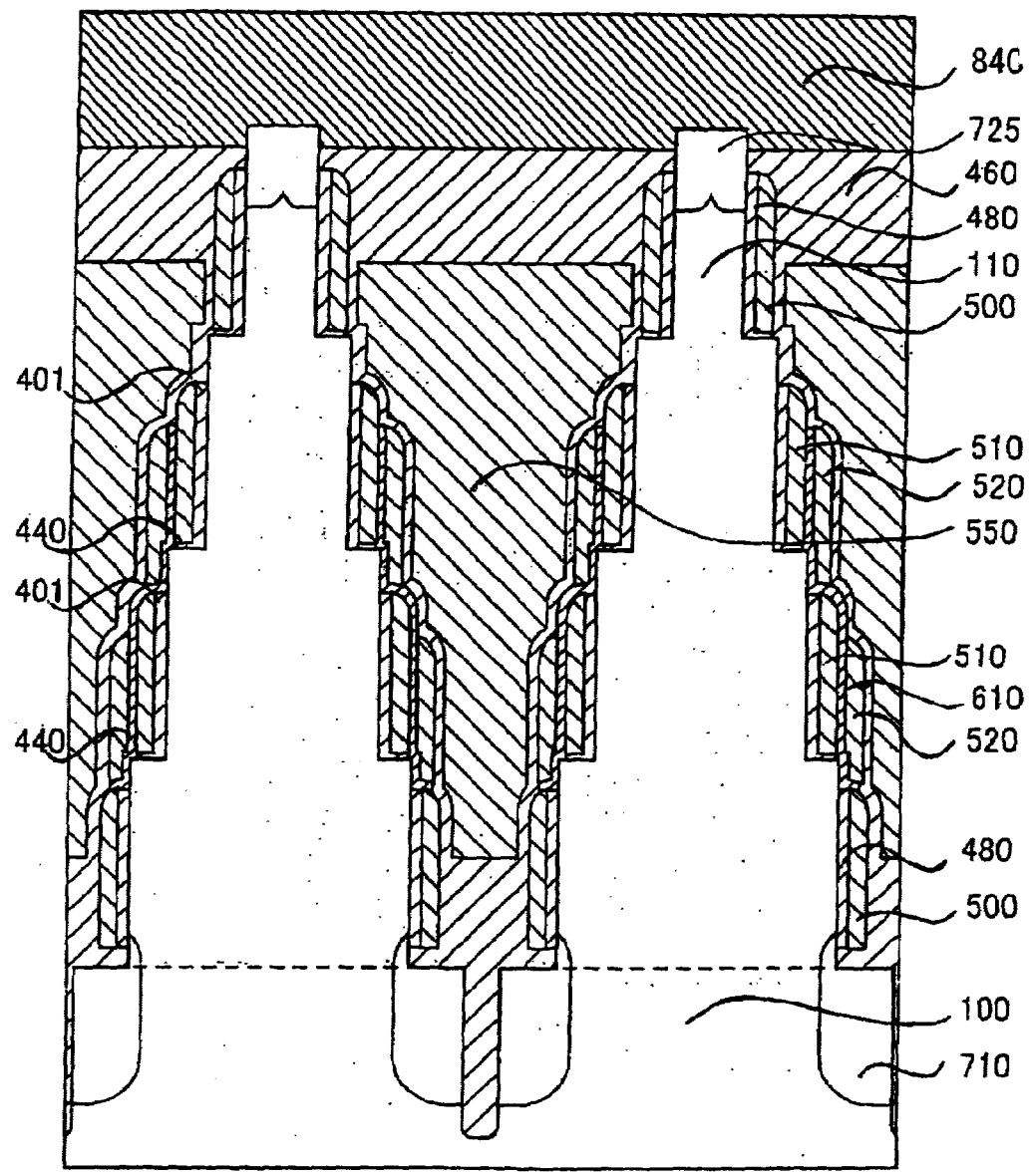

In FIGS. 11 and 12, the diffusion layers 720 are not provided and polysilicon films 550 are formed as third electrodes between the gate electrodes 500, 510 and 520 of the memory transistors and the selection gate electrodes.

Figure 13:
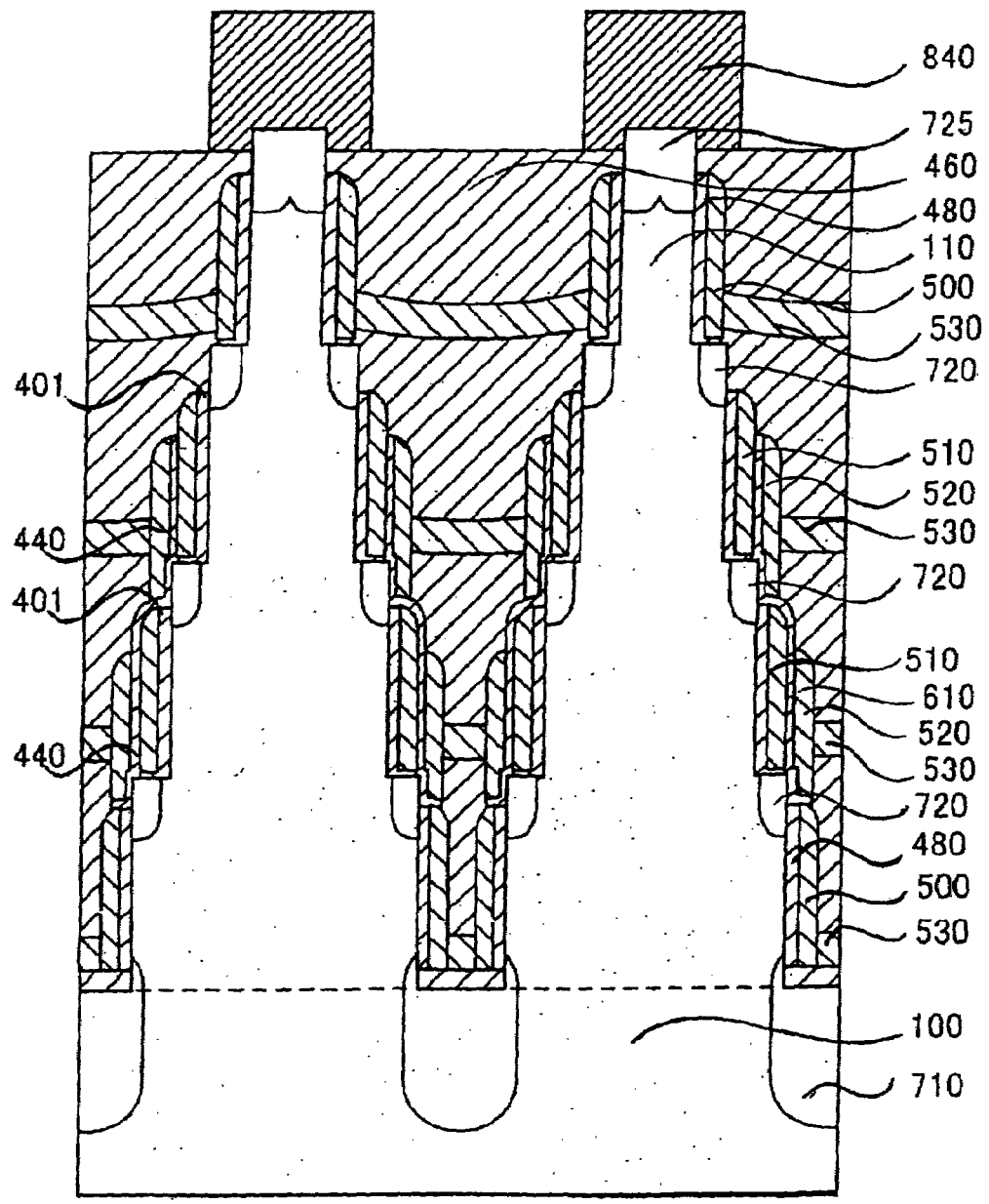
Figure 14:
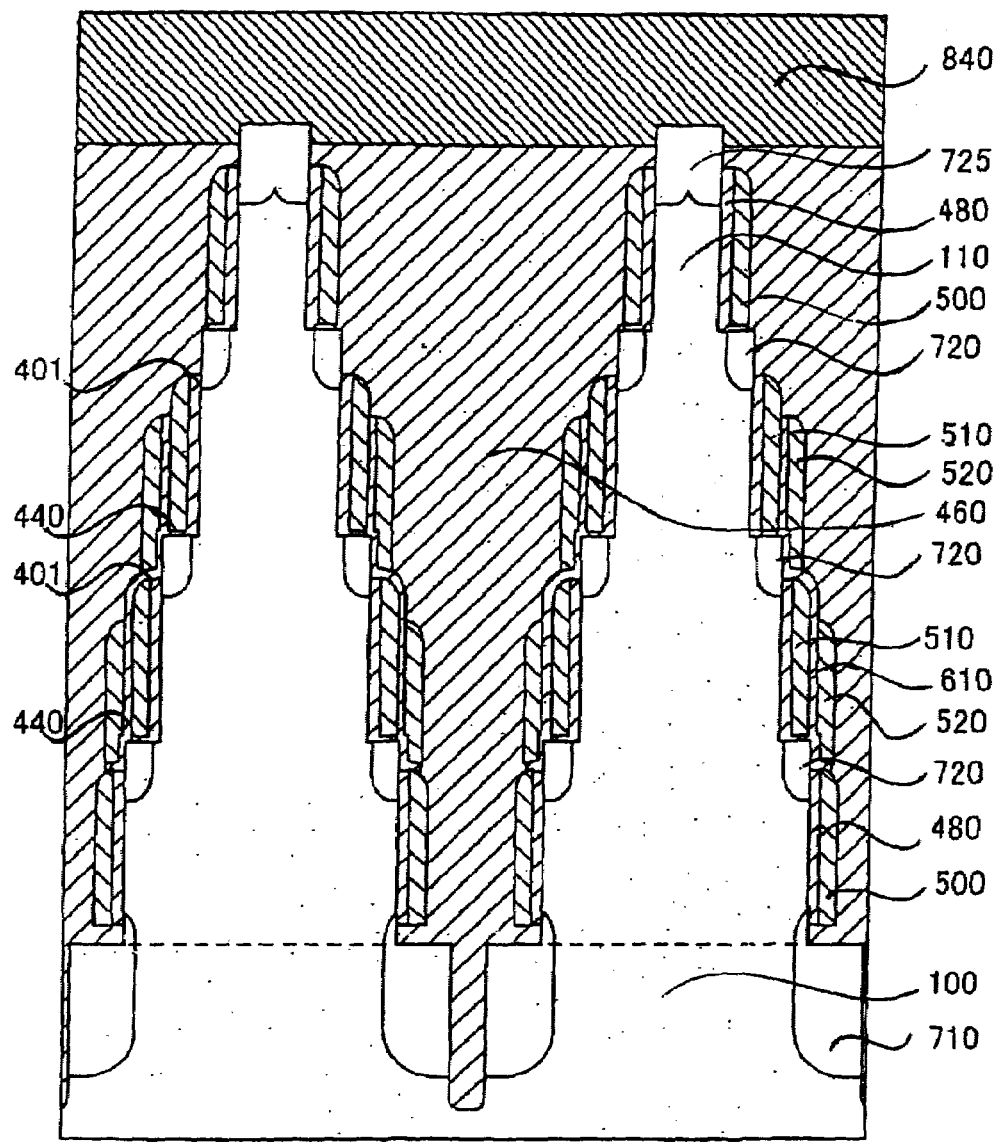

In FIGS. 13 and 14, the interlayer insulating film 610 is formed of a single layer film.

Figure 15:
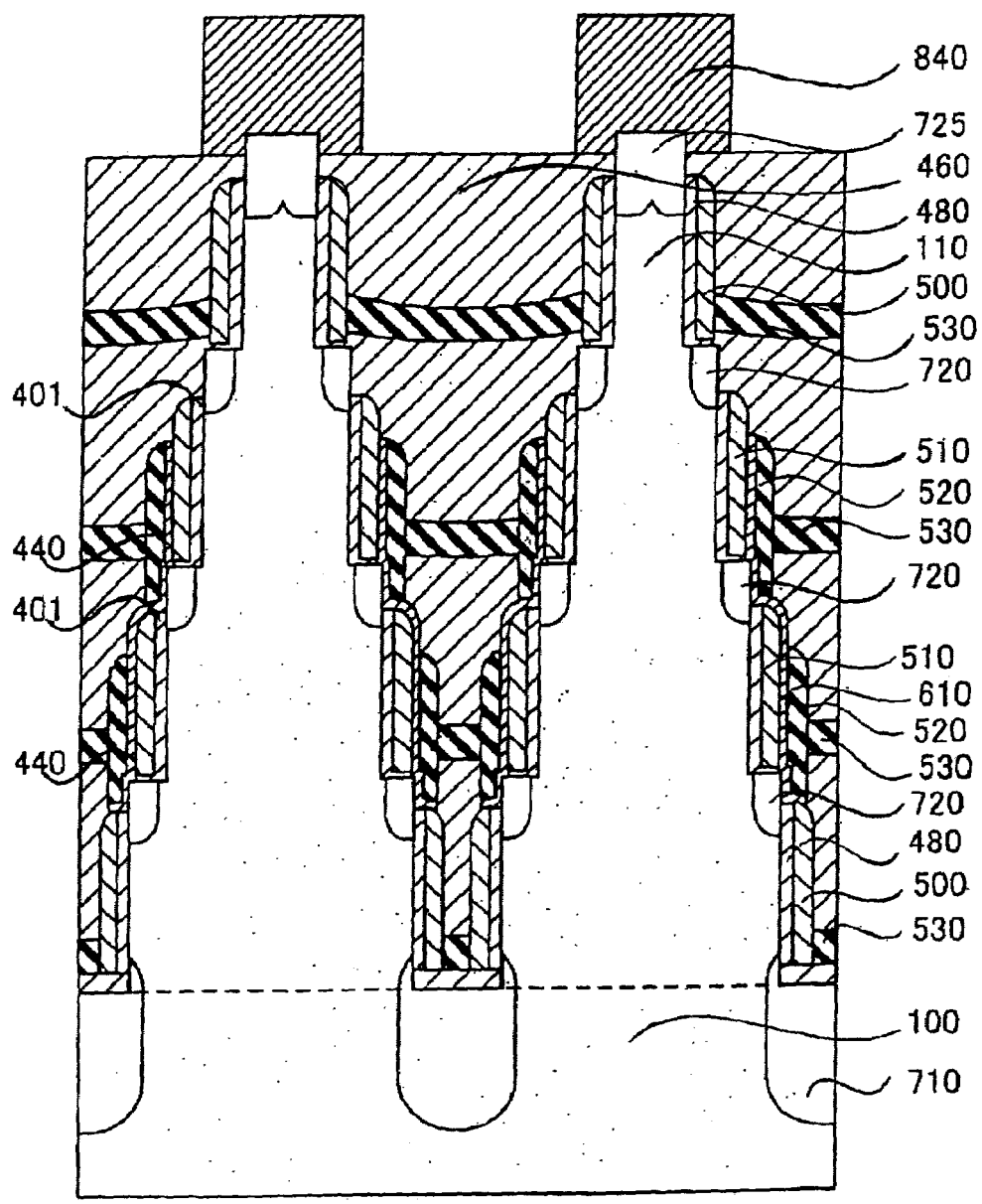
Figure 16:
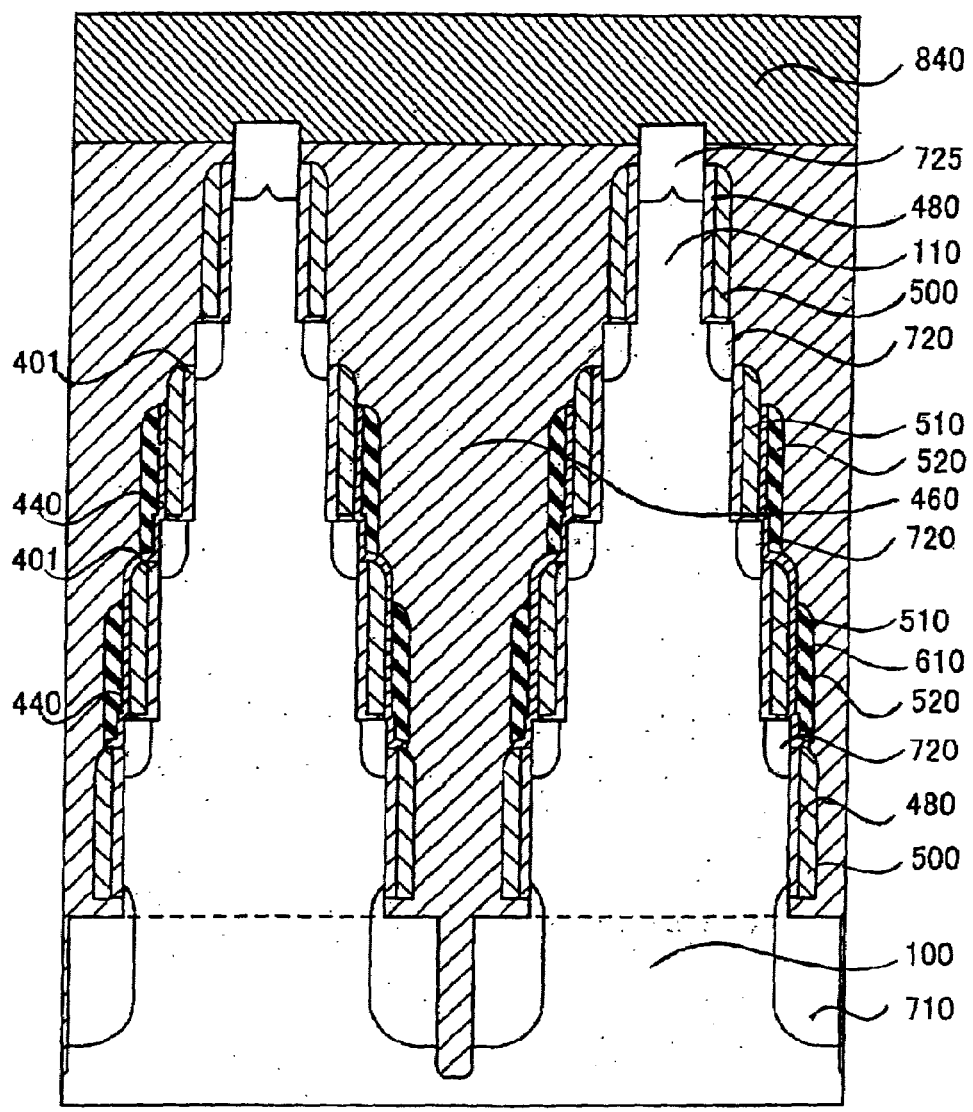

In FIGS. 15 and 16, the material of a gate is different from that of another gate. Specifically, the material of the control gates 520 of the memory cells and the third conductive film 530 connecting the control gates is different from that of the floating gate 510.

Figure 17:
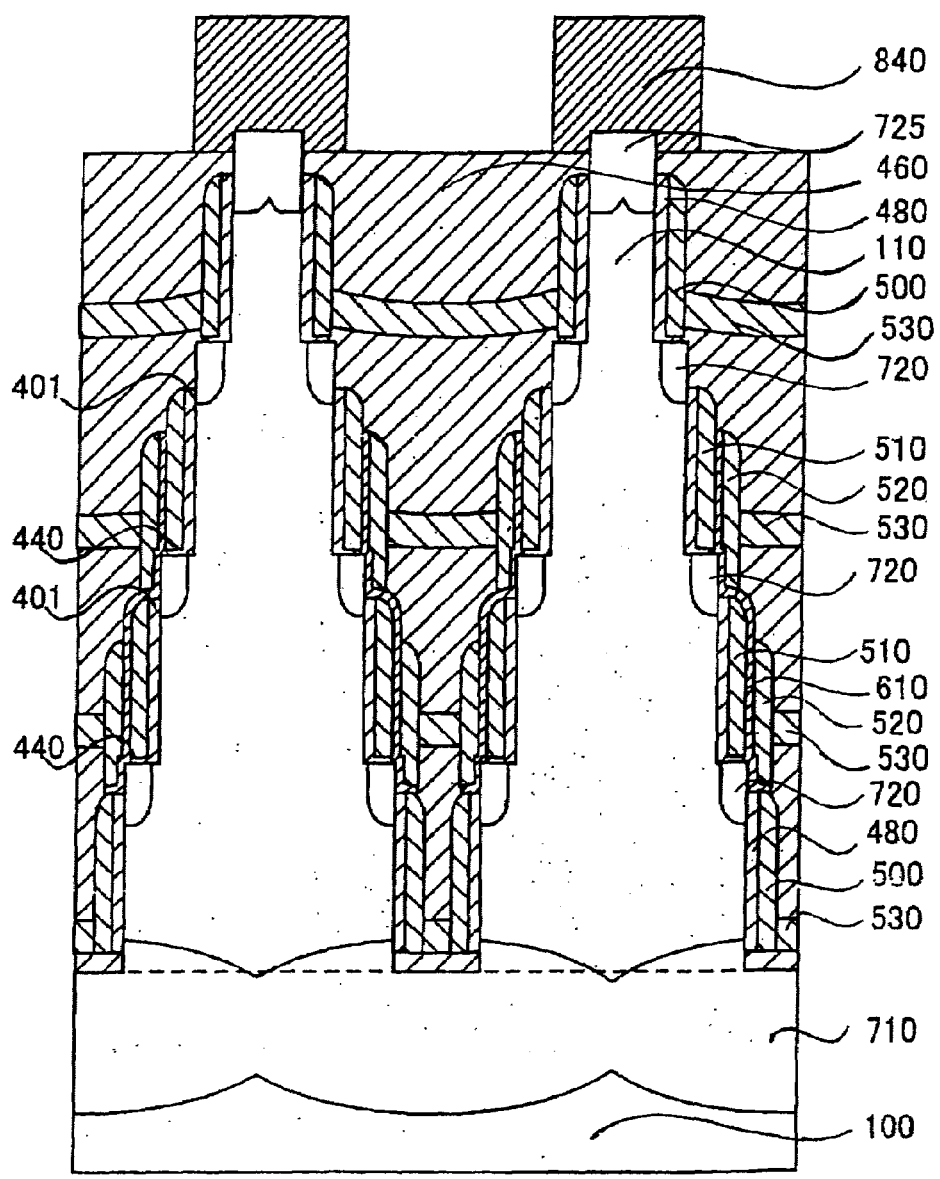
Figure 18:
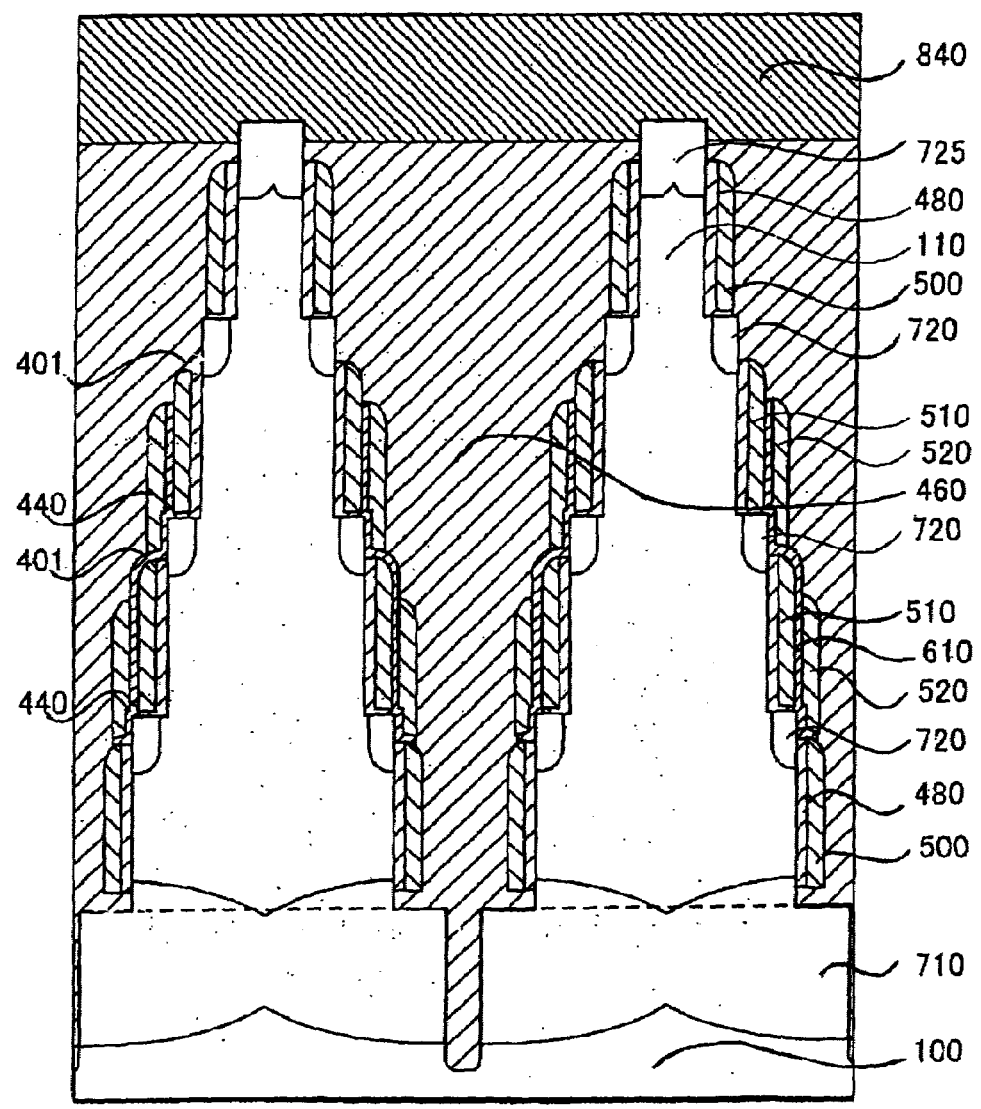

In FIGS. 17 and 18, the active region of the memory cell is floated from the semiconductor substrate by the source diffusion layer 710.

Figure 19:
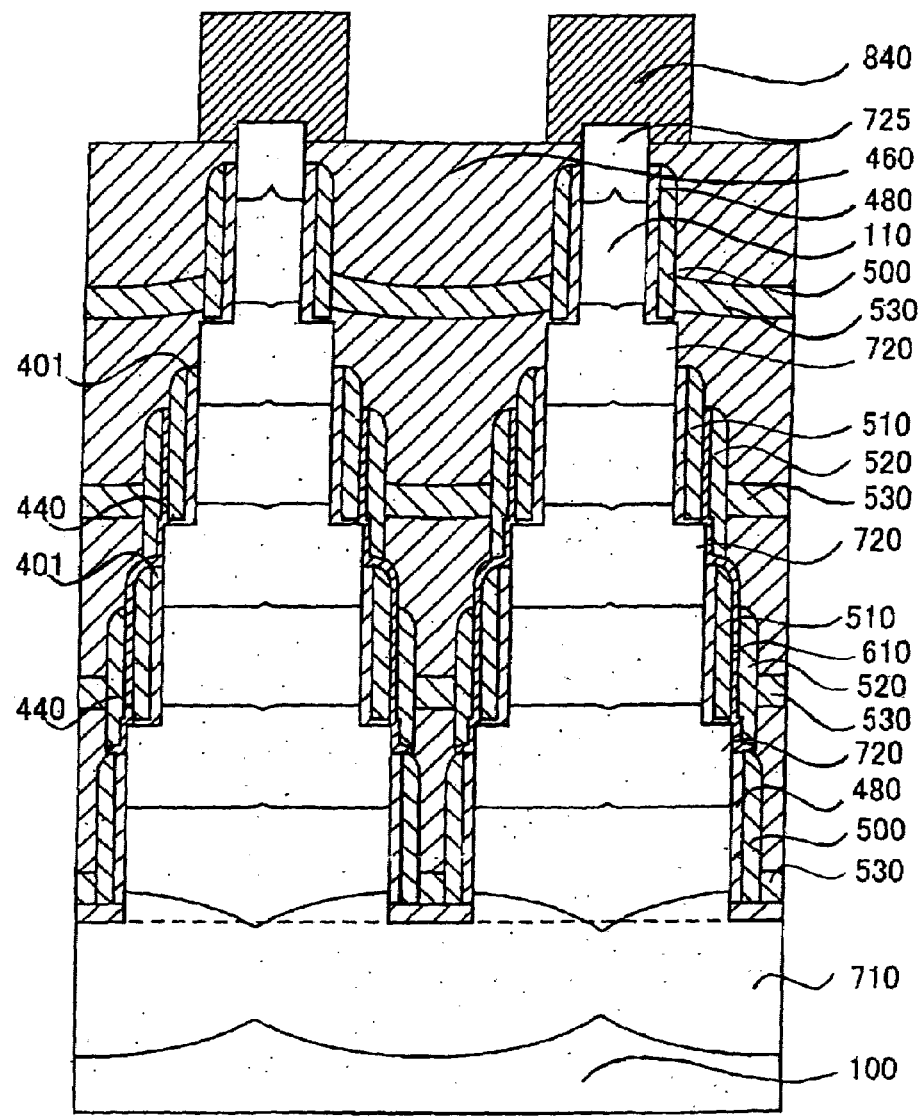
Figure 20:
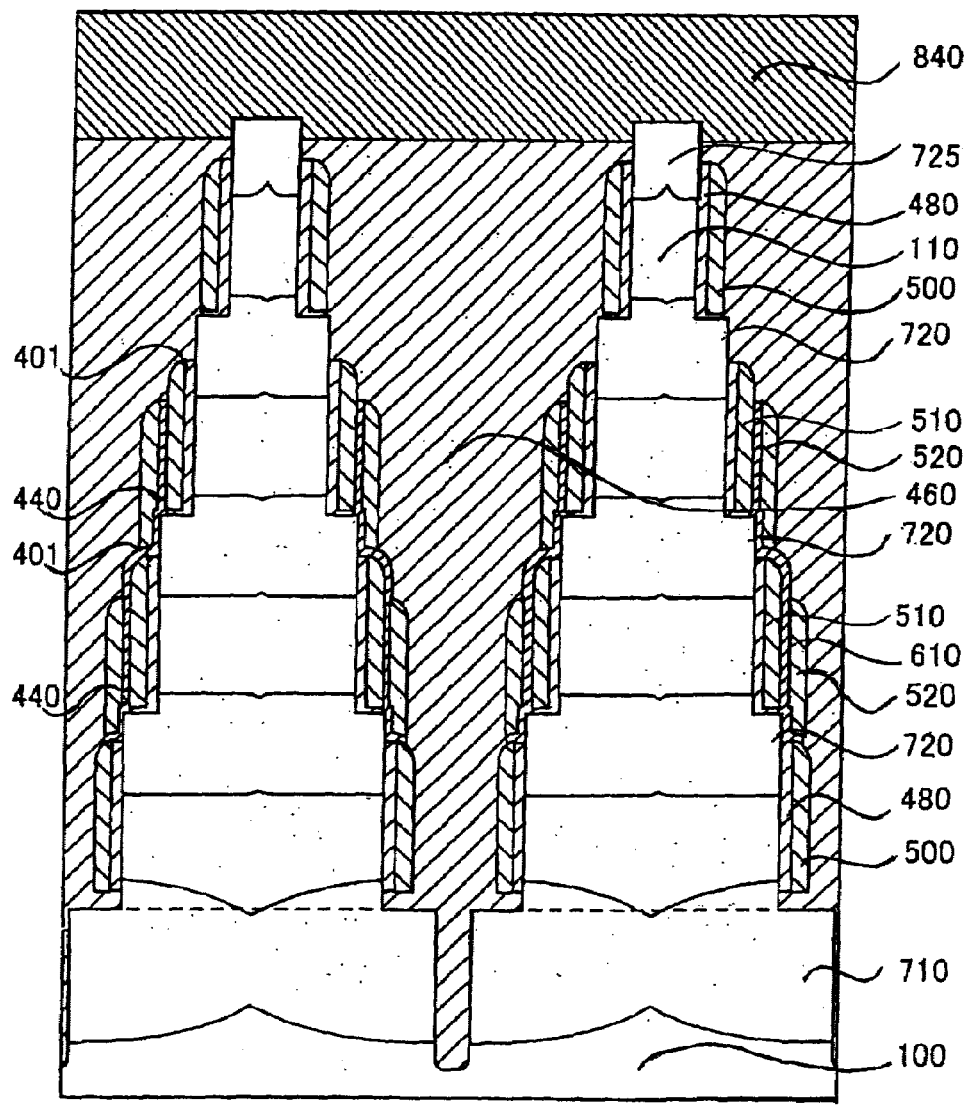

In FIGS. 19 and 20, the active regions of the memory cells are floated from the semiconductor substrate by the source diffusion layer 710 and the diffusion layers 720 between the memory cells.

Figure 21:
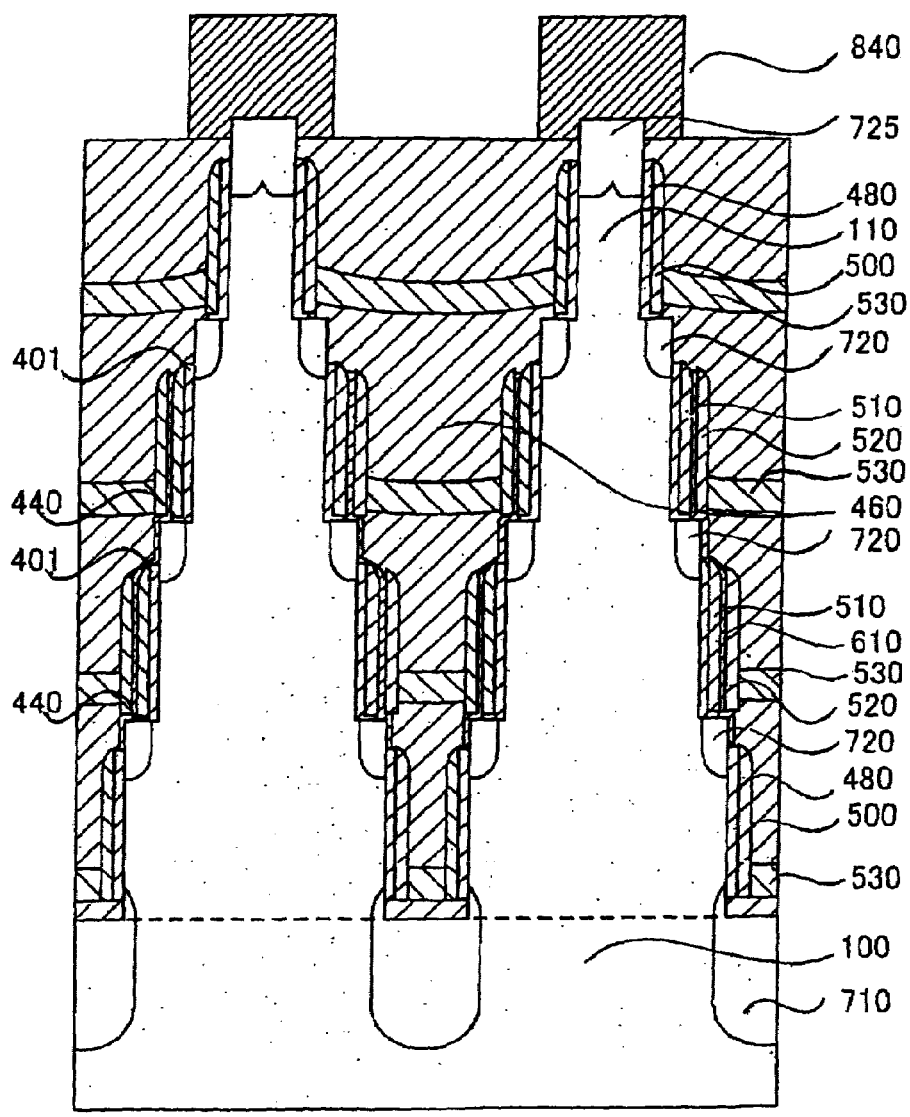
Figure 22:
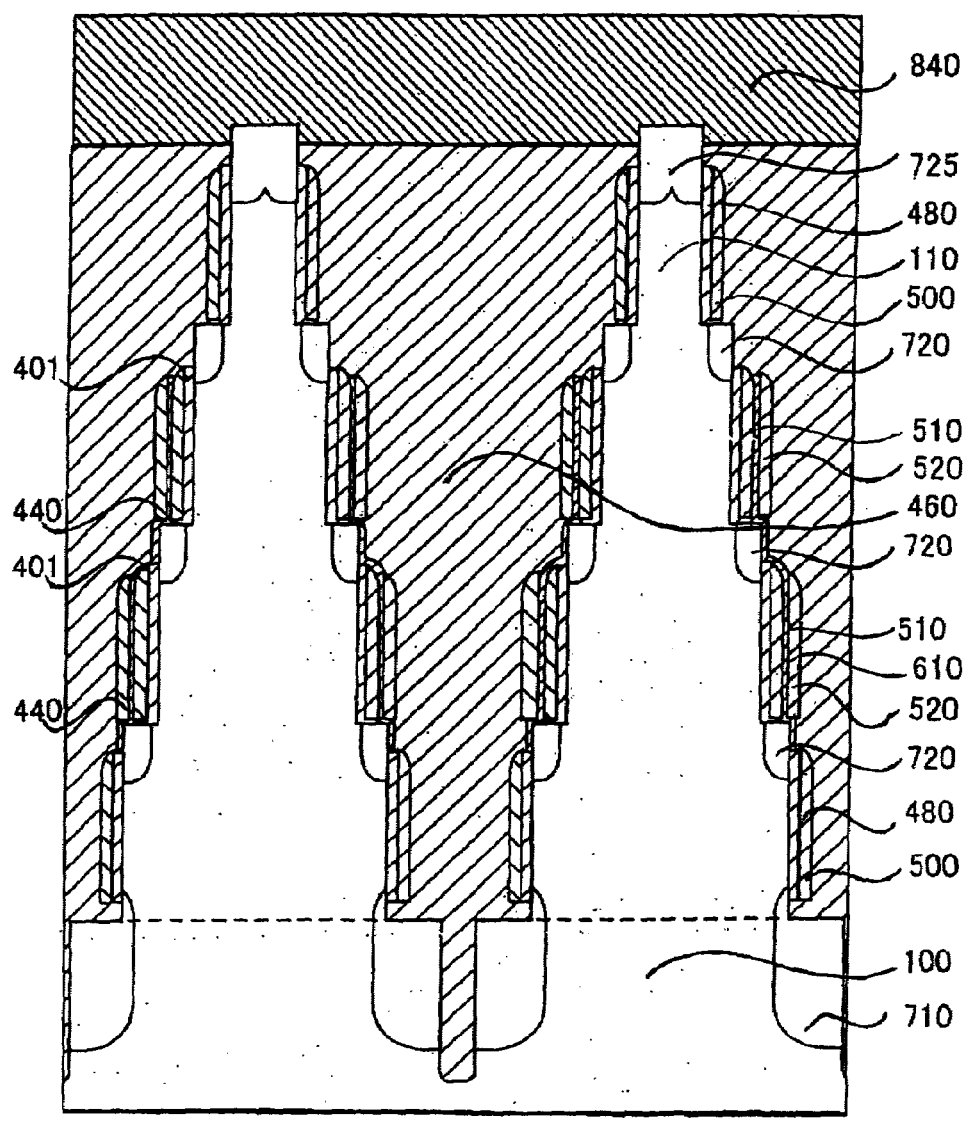

In FIGS. 21 and 22, both the floating gate 510 and the control gate 520 are provided on a step without sticking out from the step.

Figure 23:
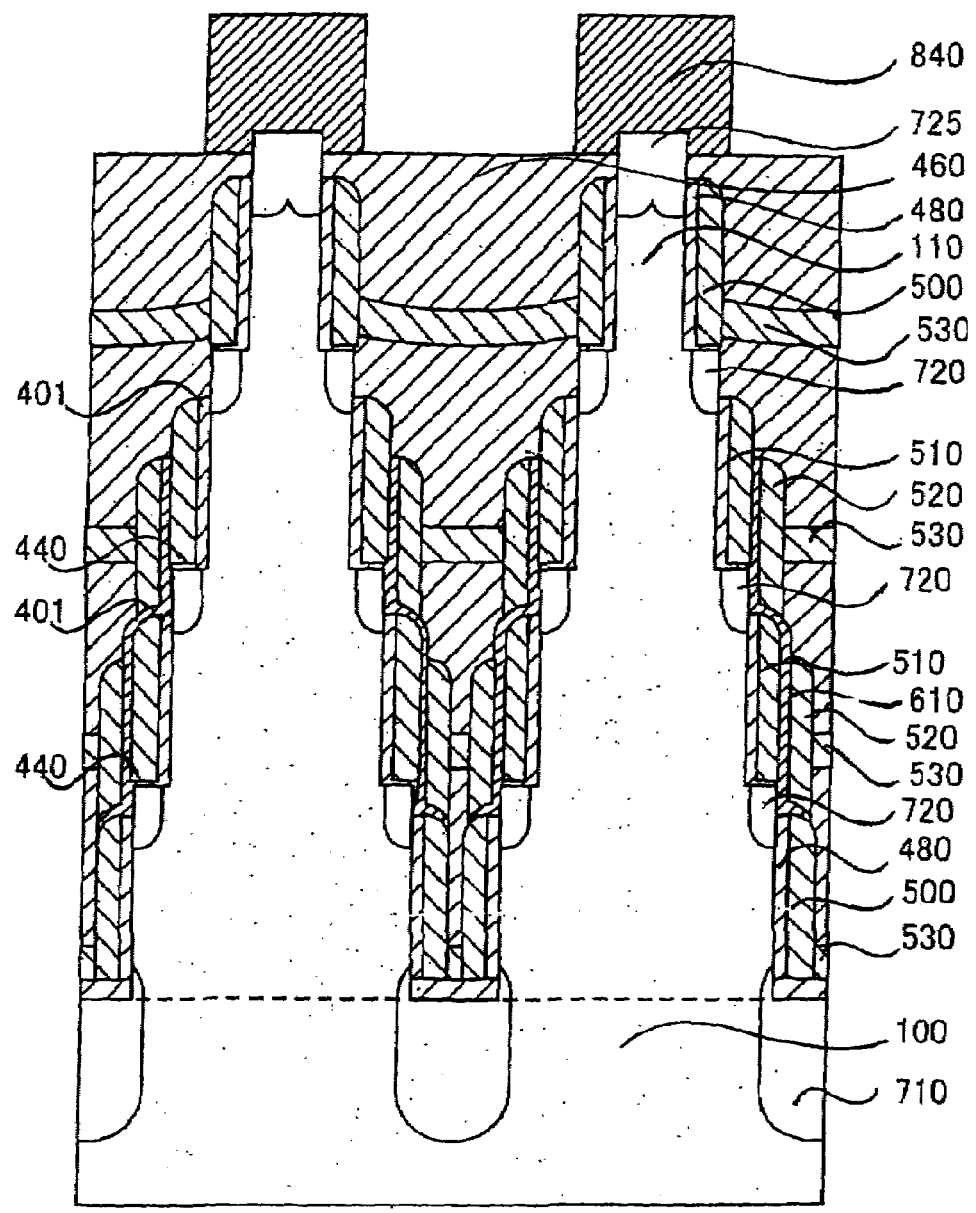
Figure 24:
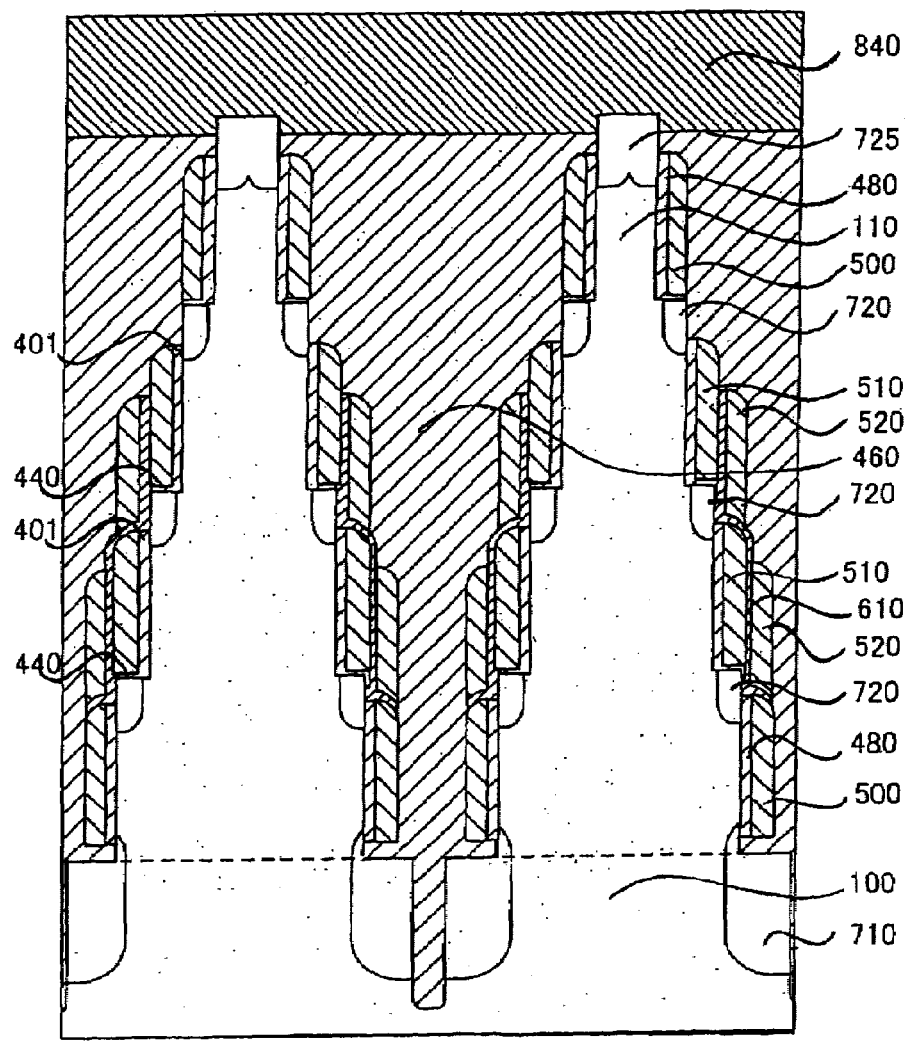

In FIGS. 23 and 24, the control gate 520 is disposed on a step so as to stick out from the step completely.

Figure 25:
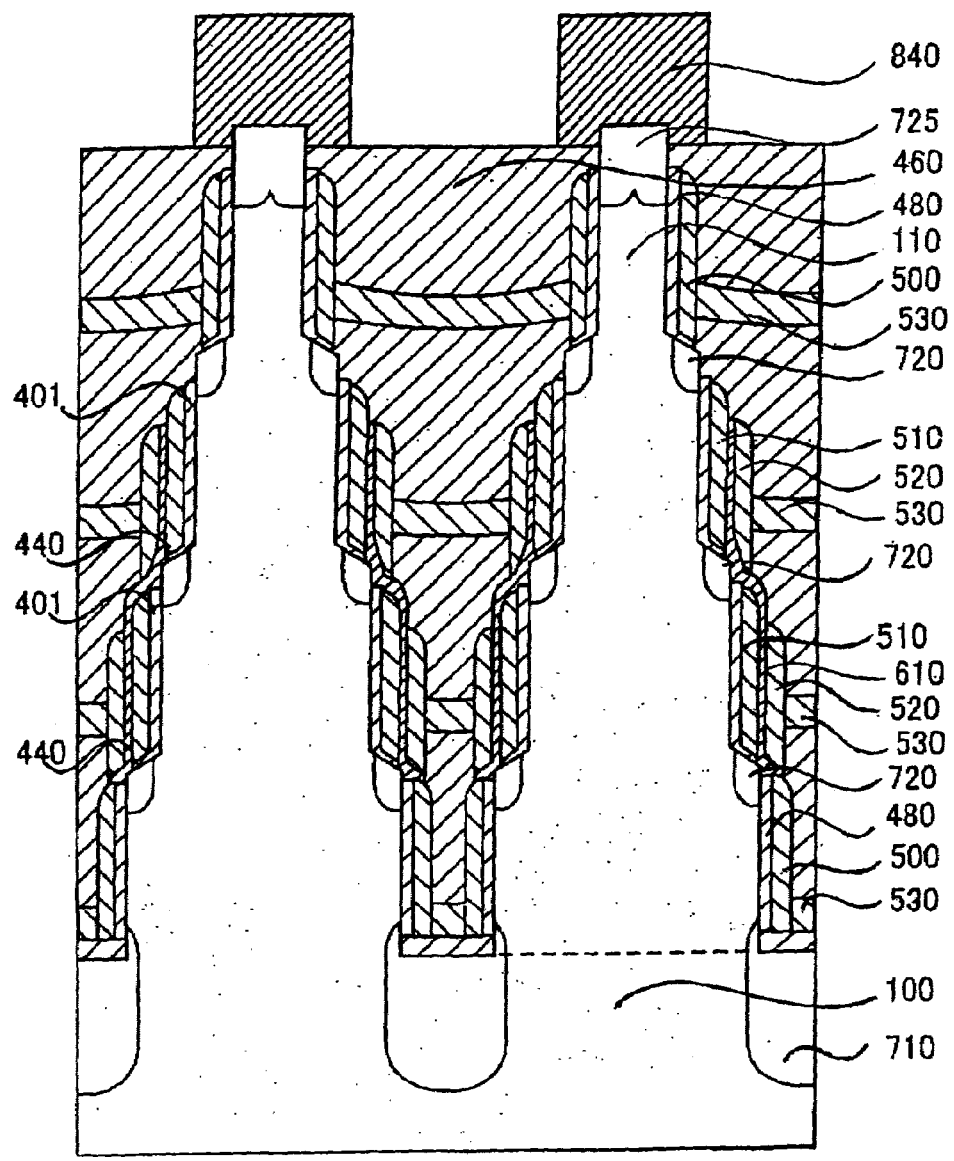
Figure 26:
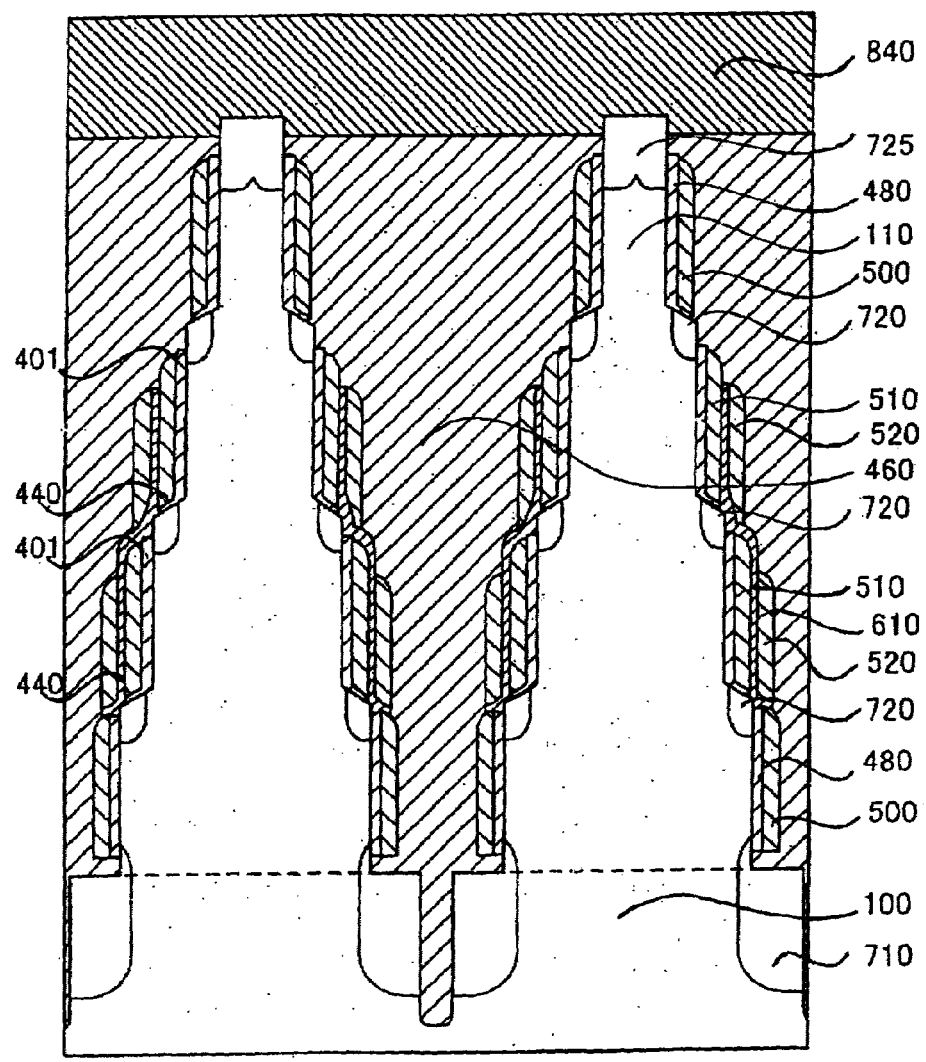

In FIGS. 25 and 26, each step in the island-like semiconductor layer is formed to have an obtuse angle.

Figure 27:
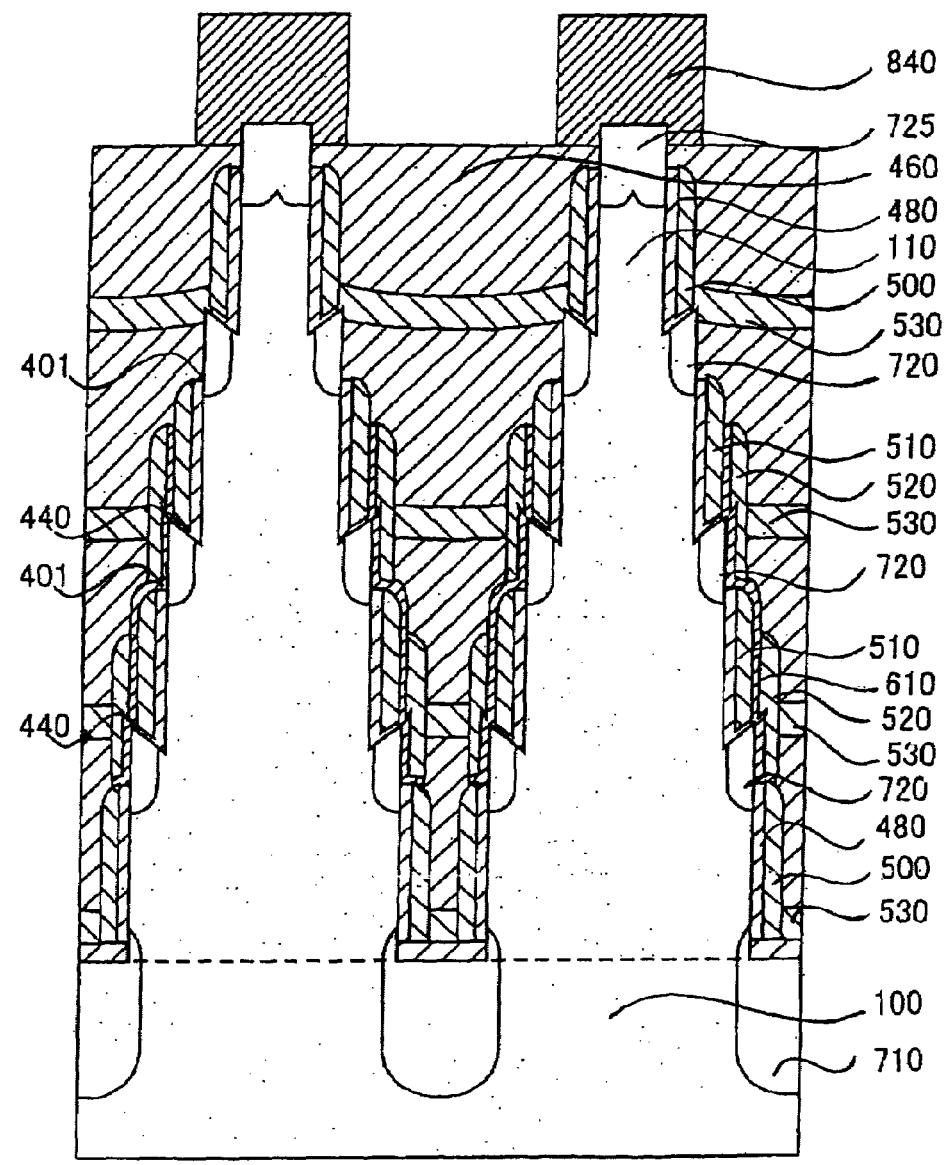
Figure 28:
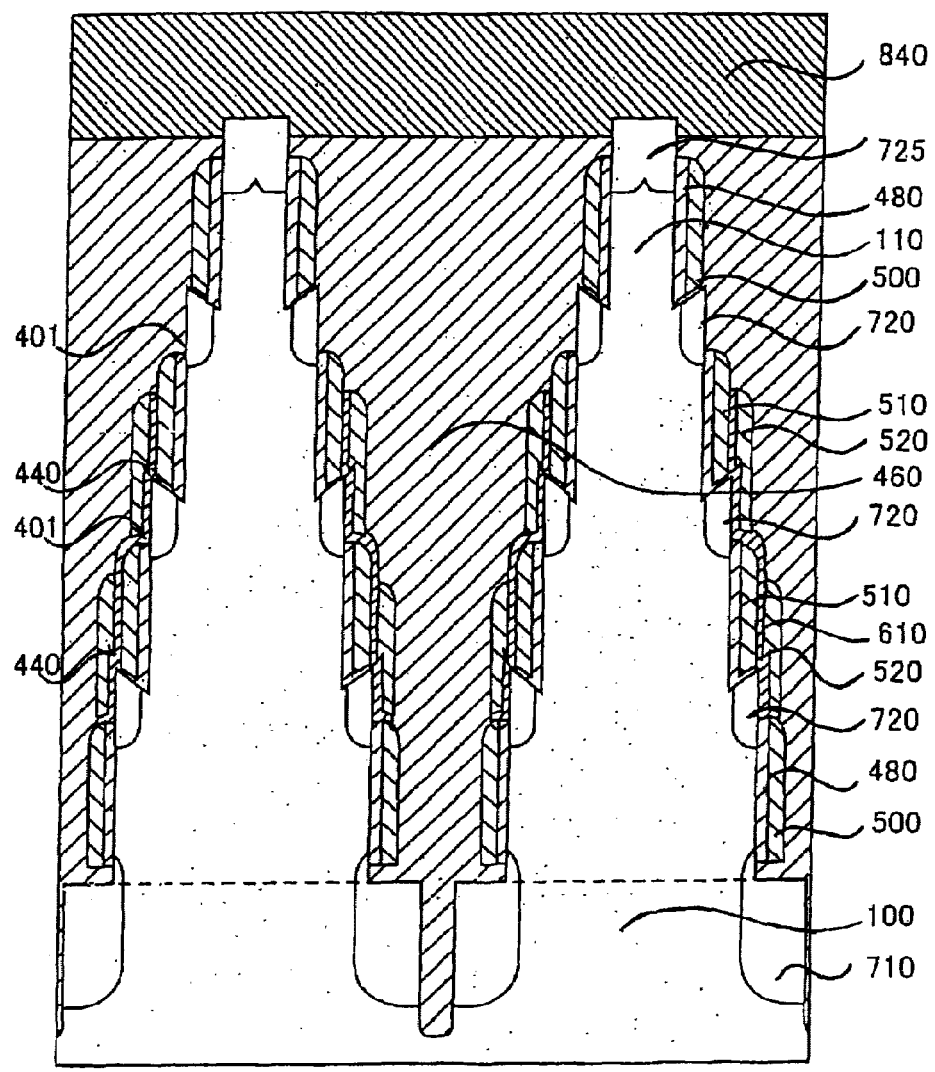

In FIGS. 27 and 28, each step in the island-like semiconductor layer is formed to have an acute angle.

Figure 29:
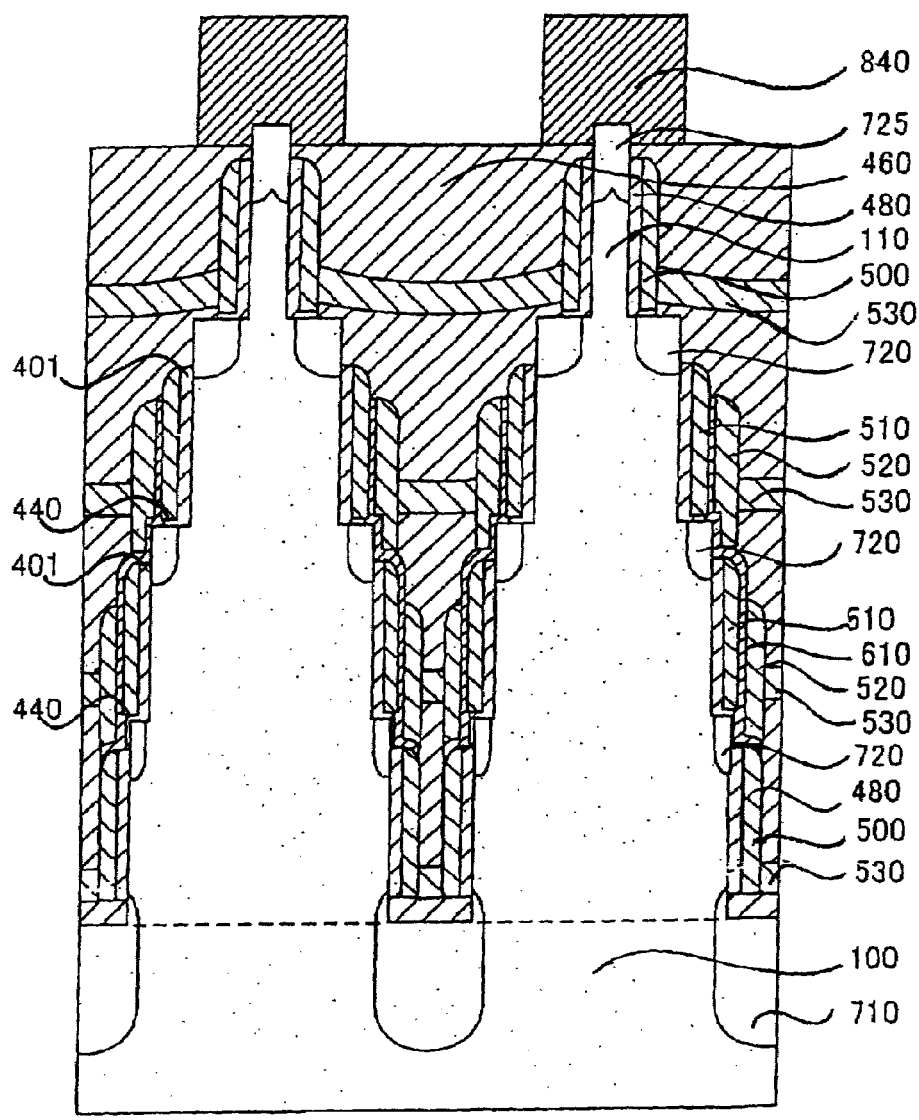
Figure 30:
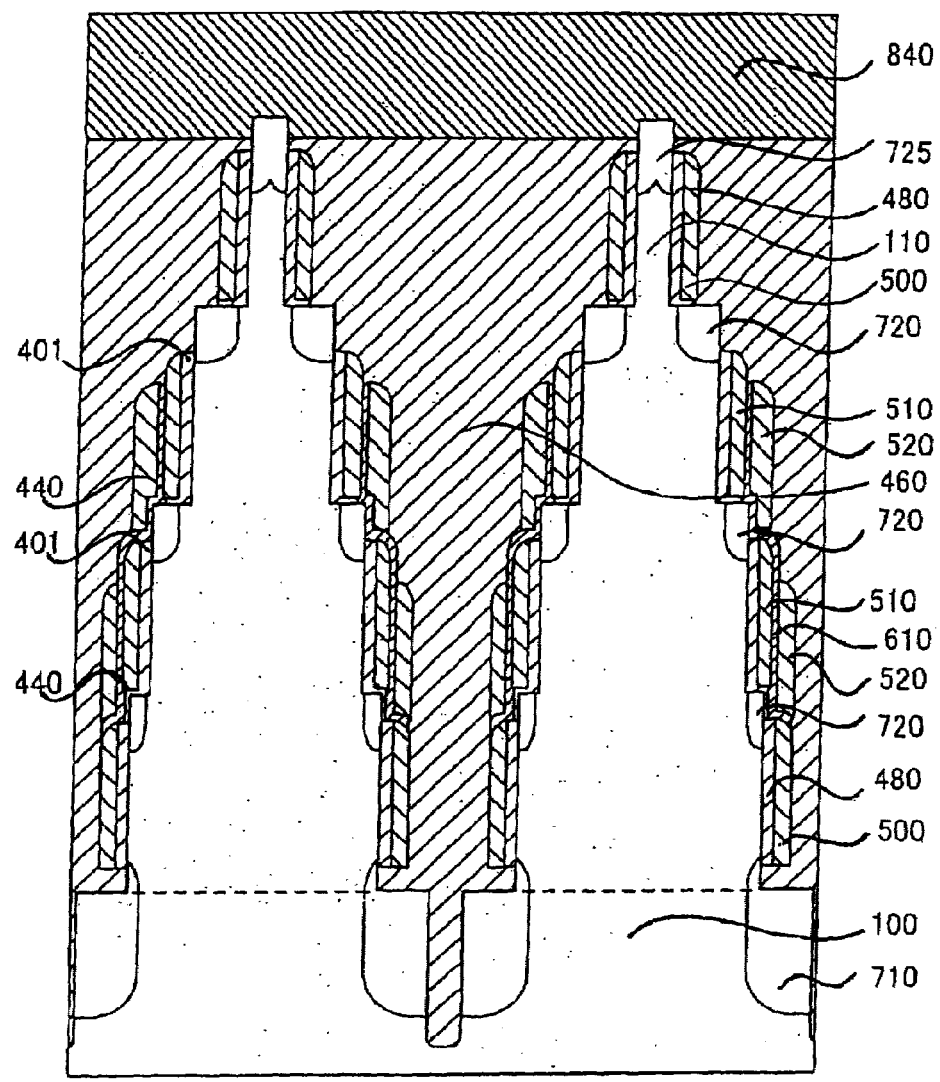

In FIGS. 29 and 30, the widths of the steps of the island-like semiconductor layer decrease in order from the top surface of the semiconductor substrate.

Figure 31:
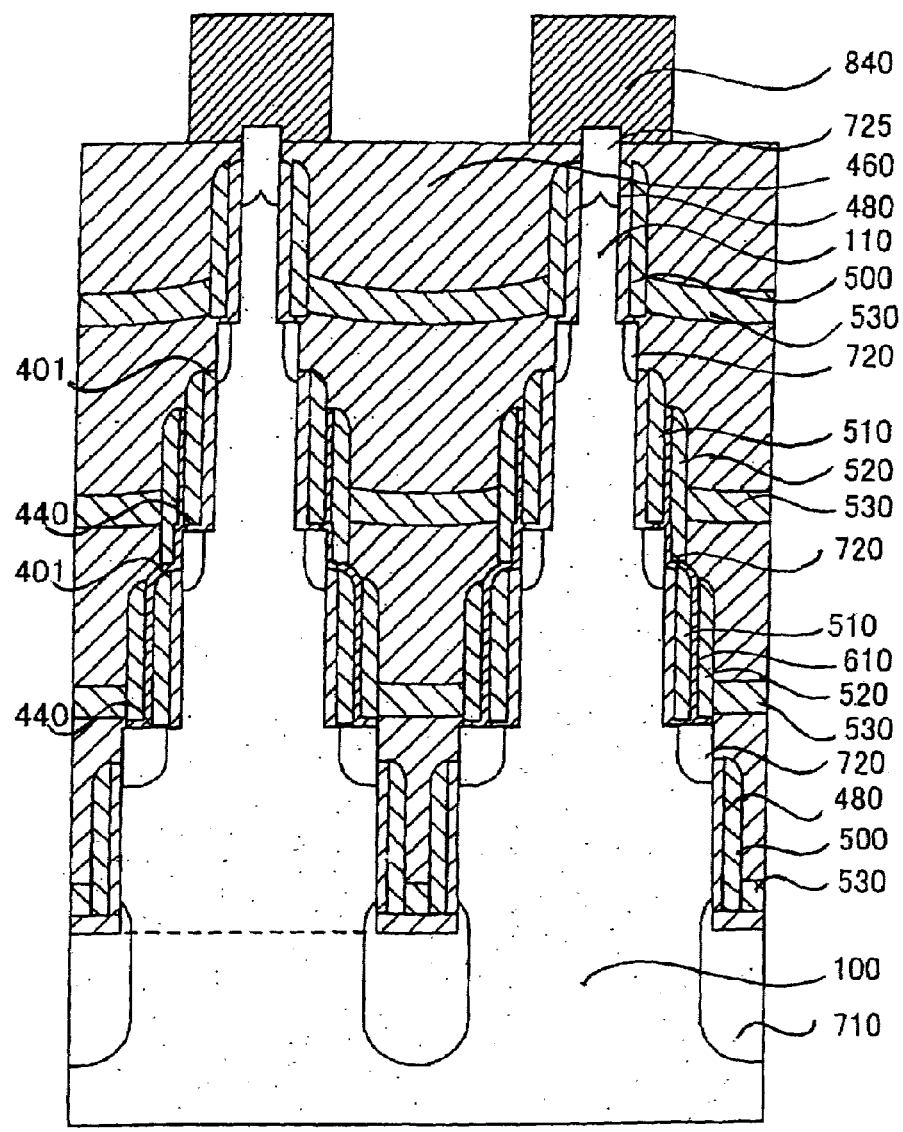
Figure 32:
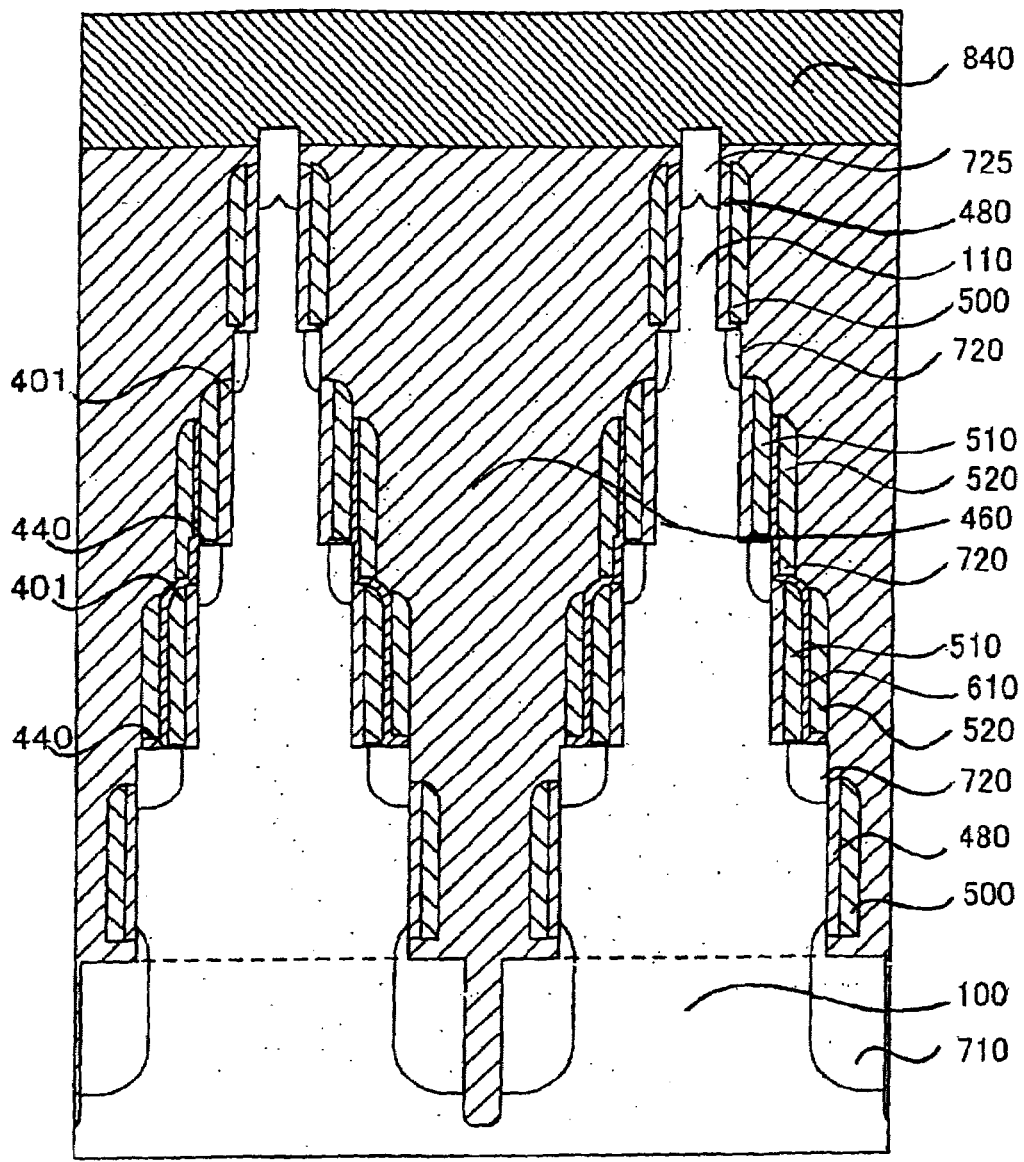

In FIGS. 31 and 32, the widths of the steps of the island-like semiconductor layer increase in order from the top surface of the semiconductor substrate.

Figure 33:
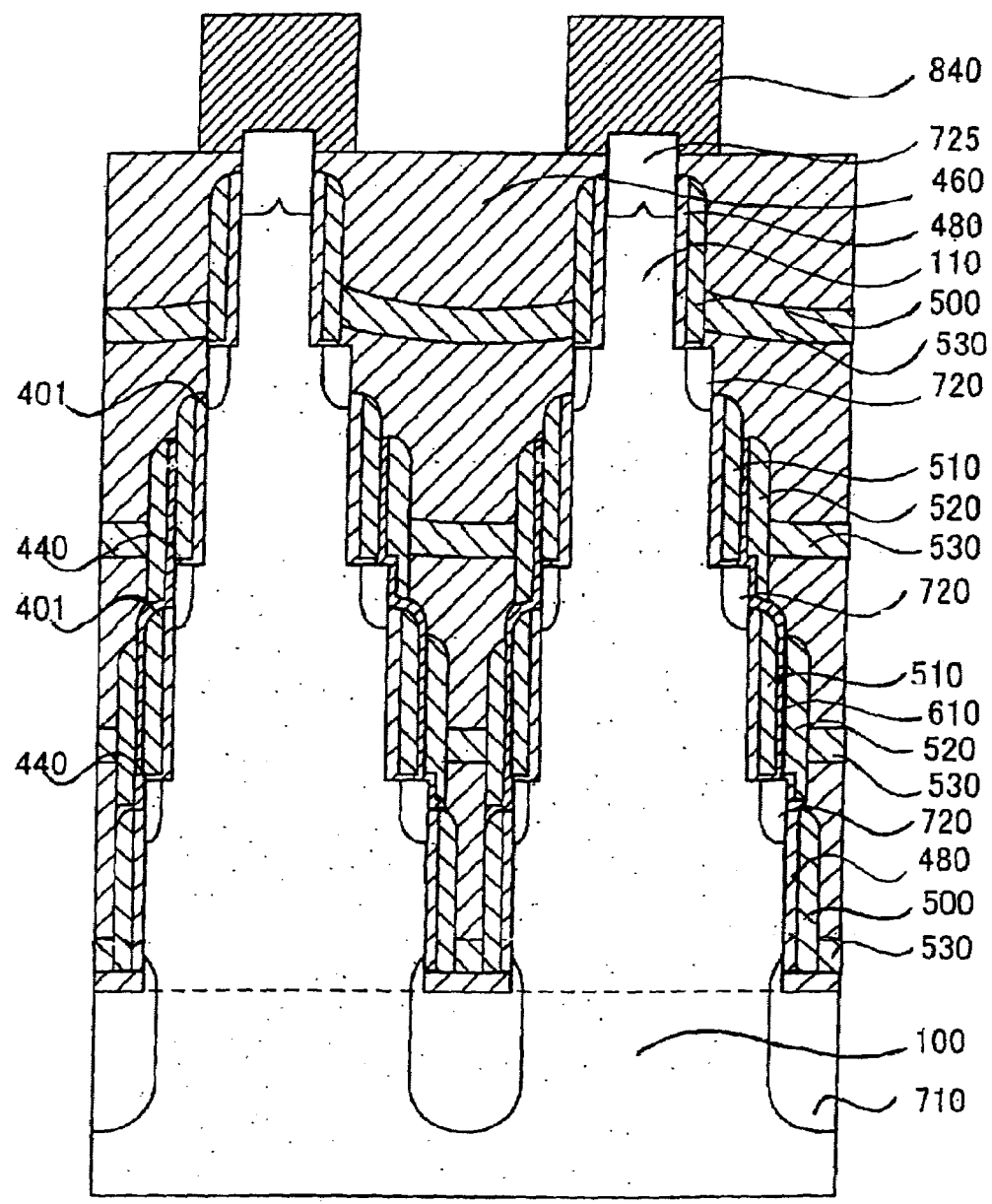
Figure 34:
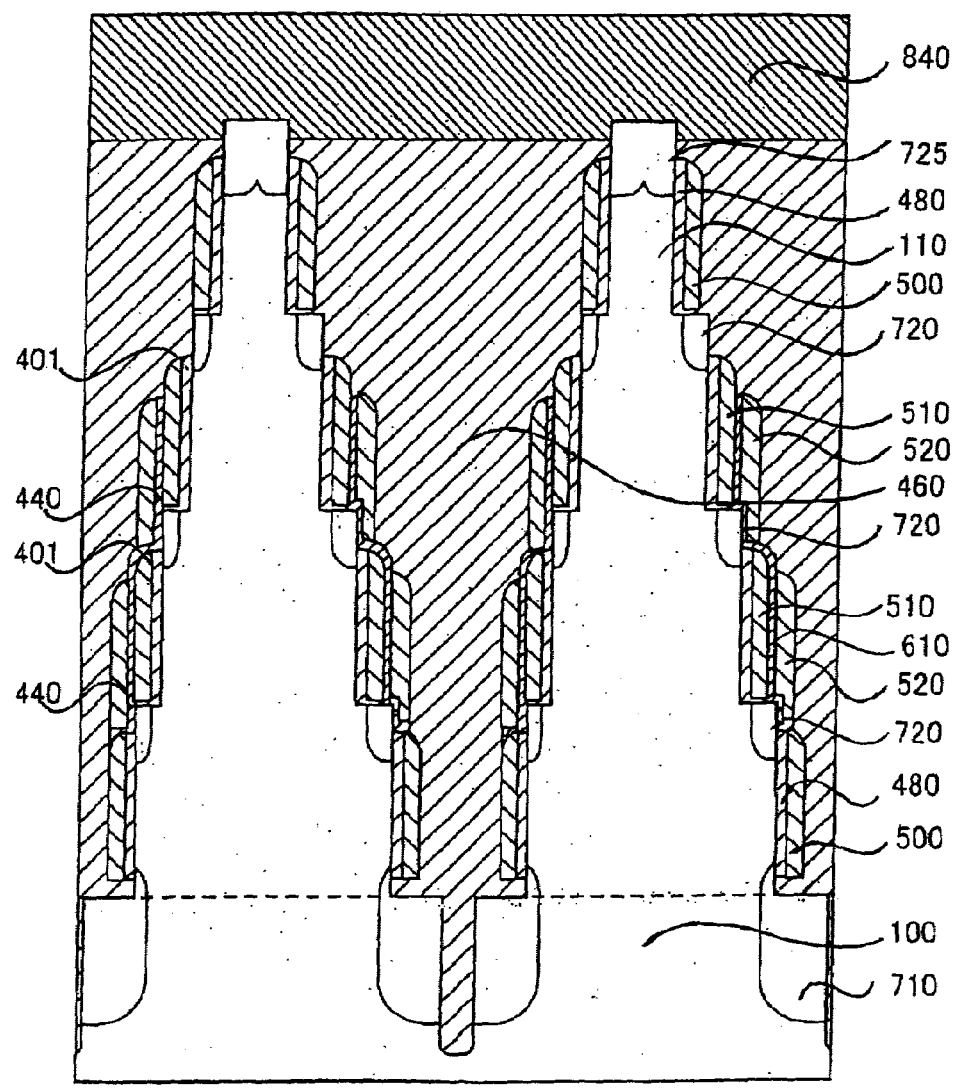

In FIGS. 33 and 34, the central axis of each of the steps in the island-like semiconductor layer is one-sided.

Figure 35:
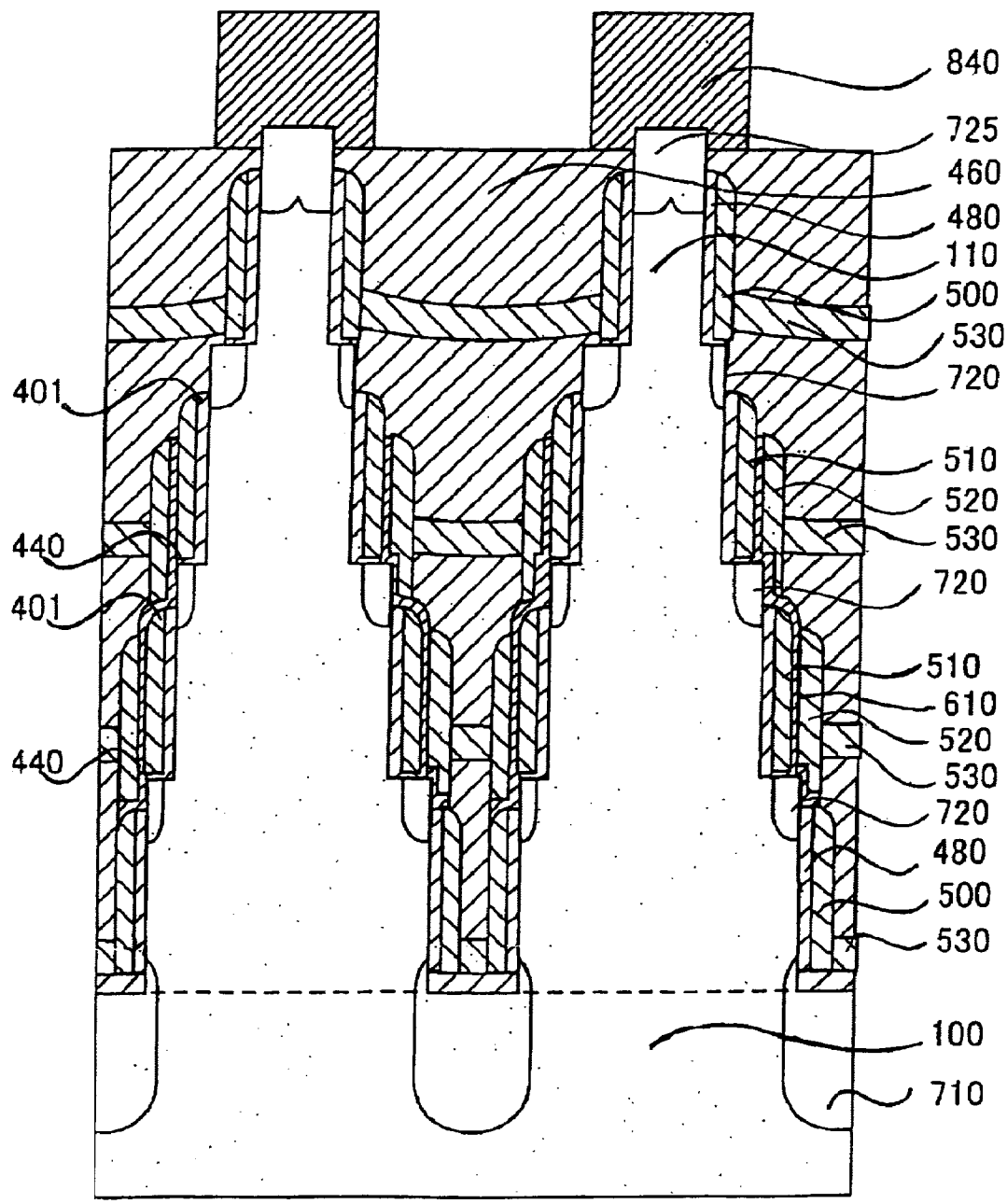
Figure 36:
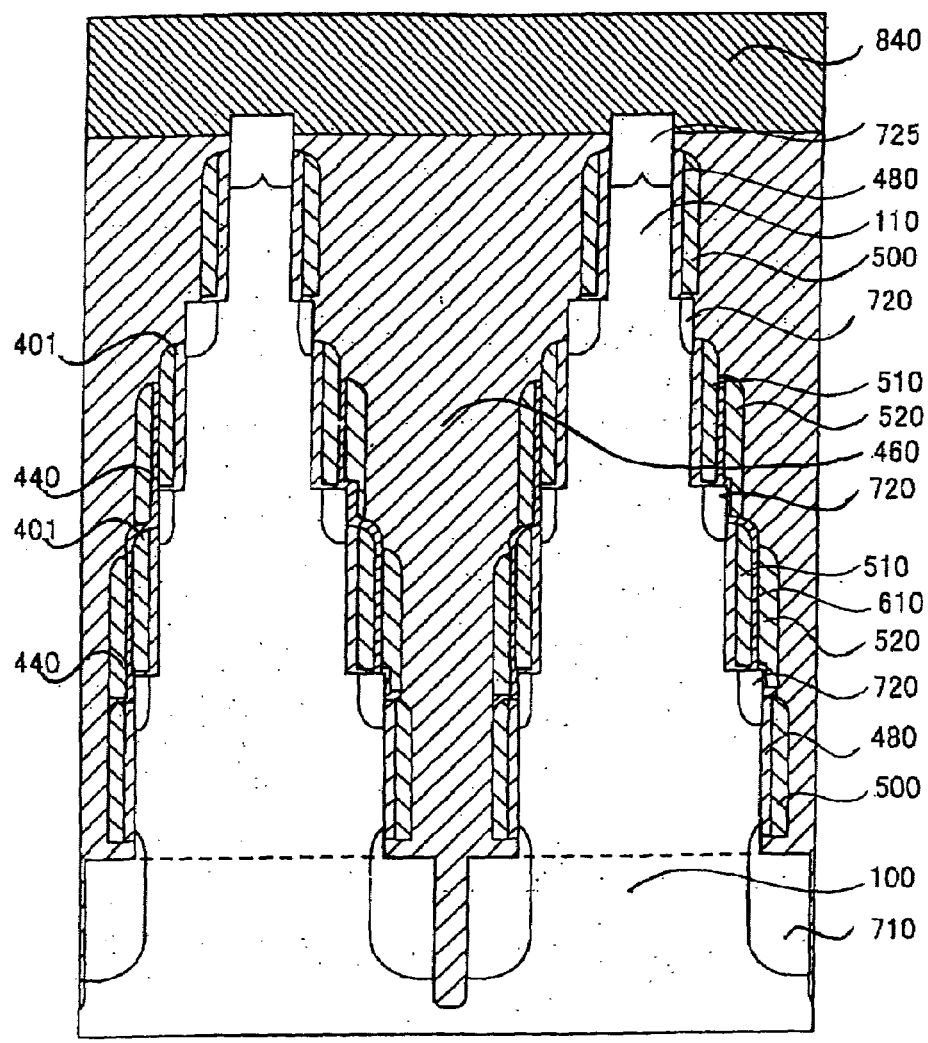

In FIGS. 35 and 36, the central axes of the steps of the island-like semiconductor layer are shifted at random.

Figure 37:
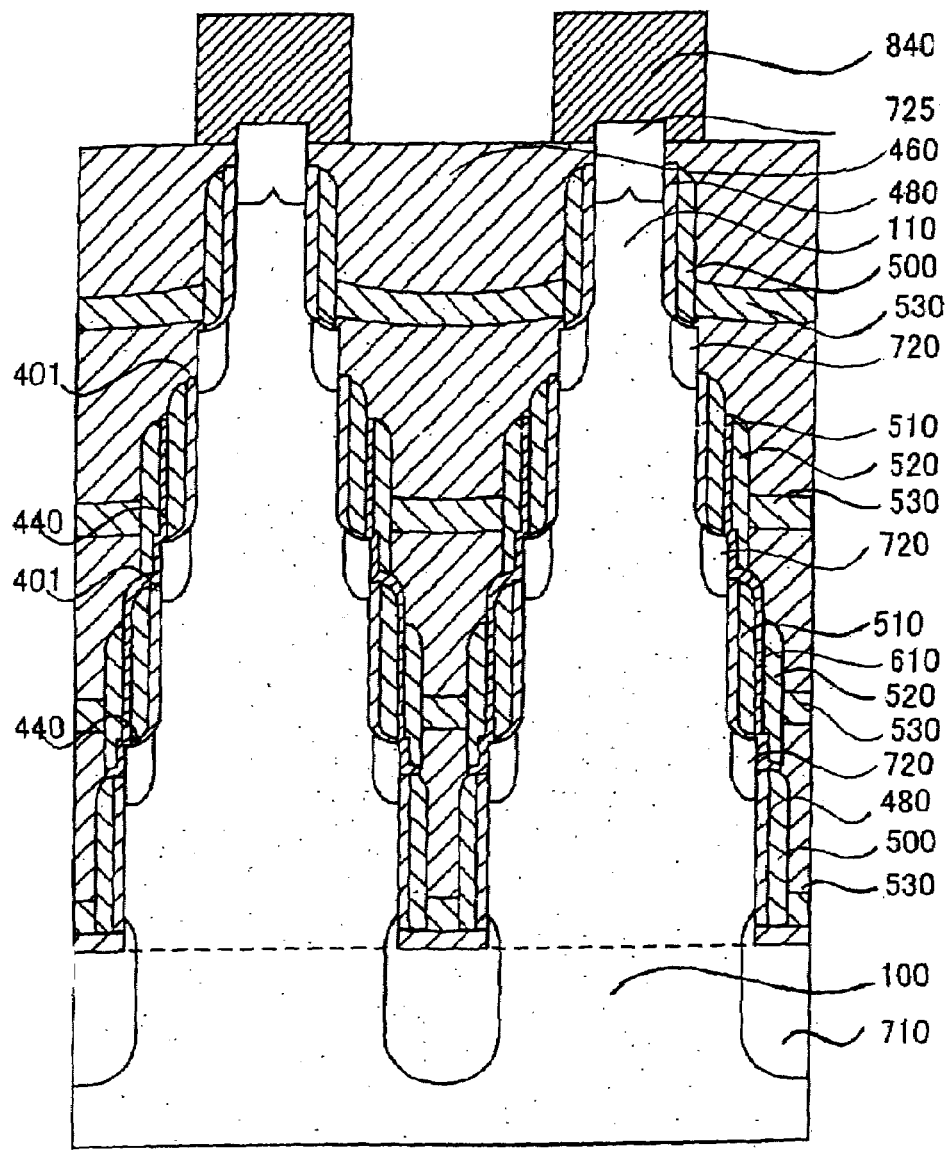
Figure 38:
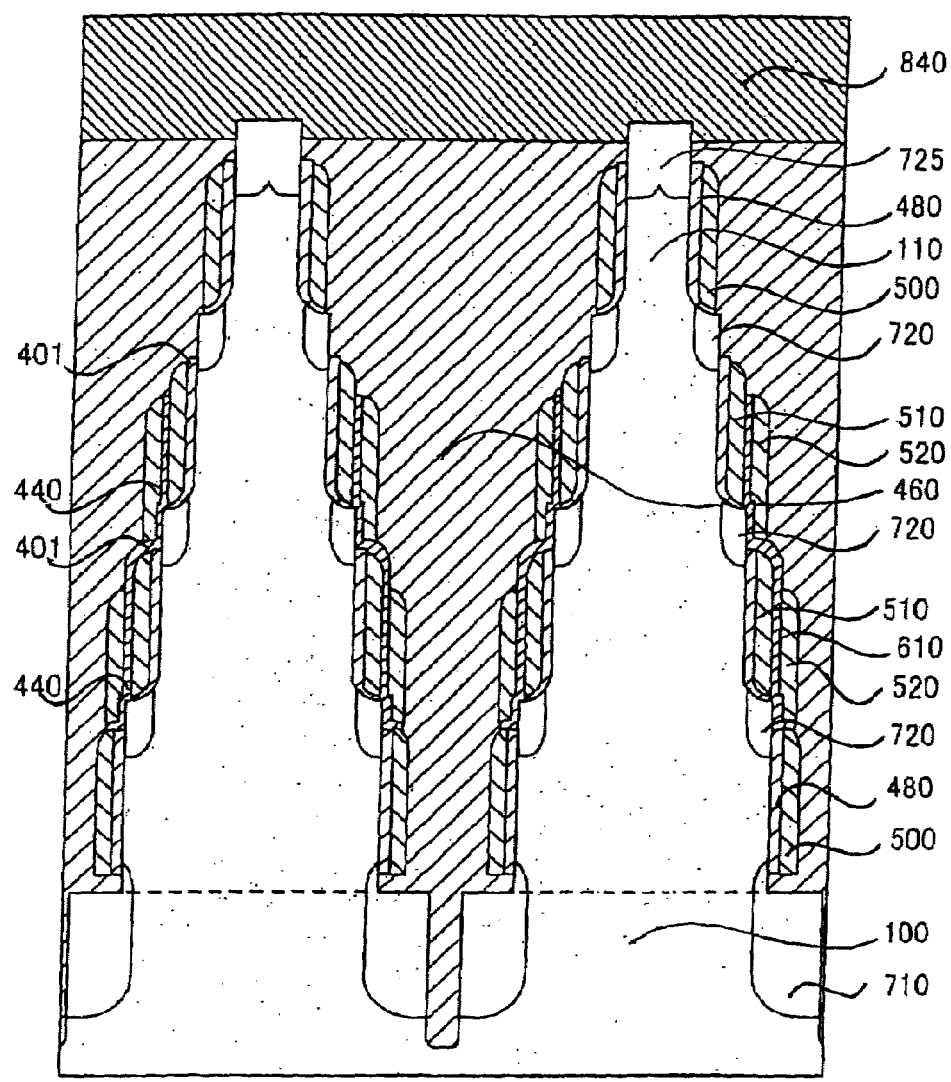

In FIGS. 37 and 38, the corners of each step in the island-like semiconductor layer are rounded.

Figure 39:
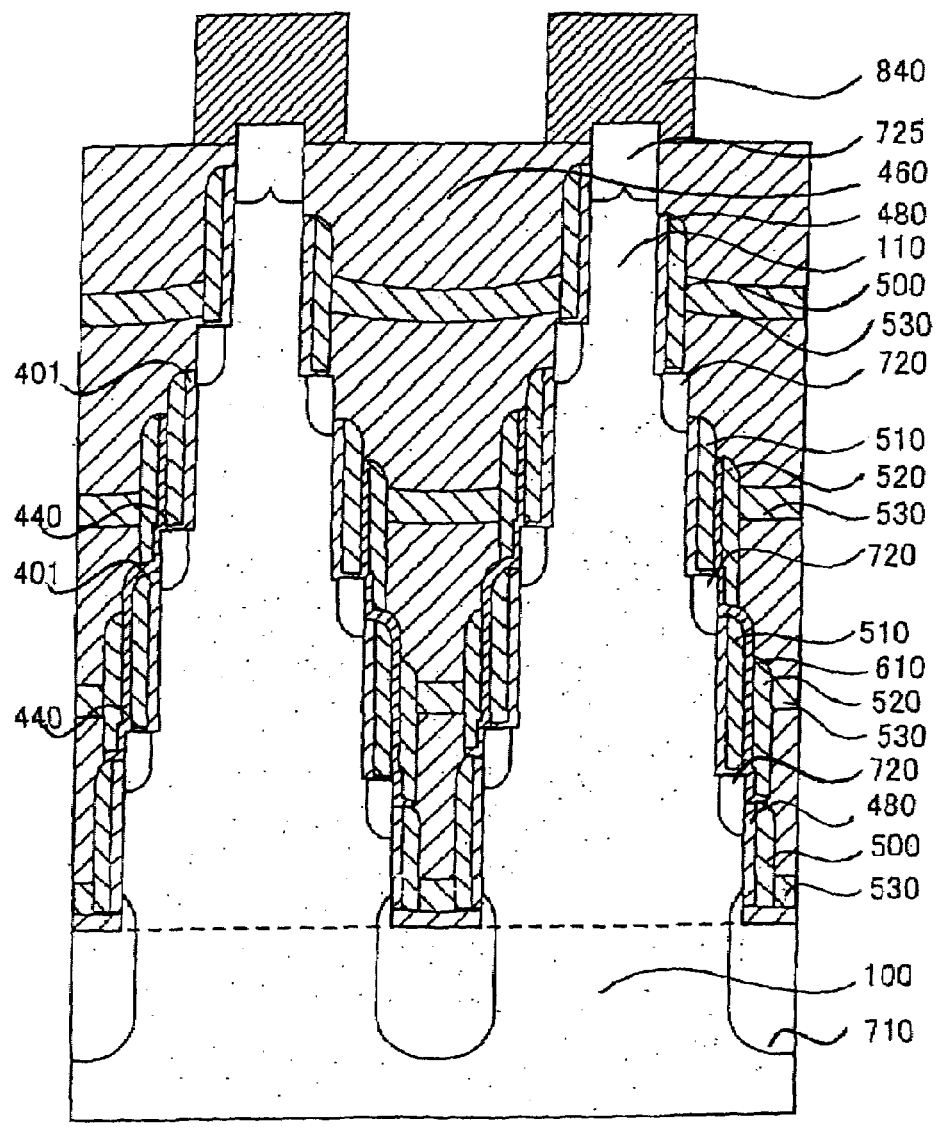
Figure 40:
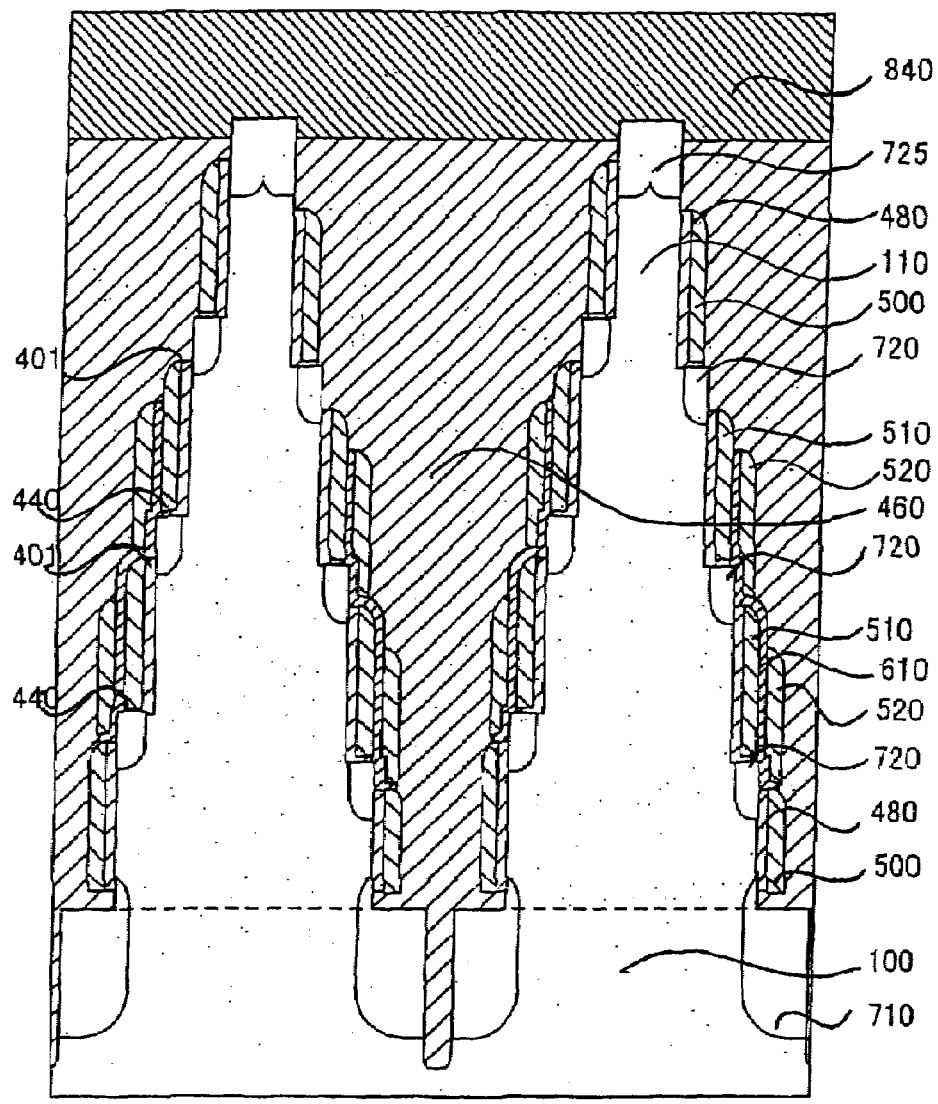

In FIGS. 39, and 40, the level of each of the steps in the island-like semiconductor layer varies.

Figure 41:
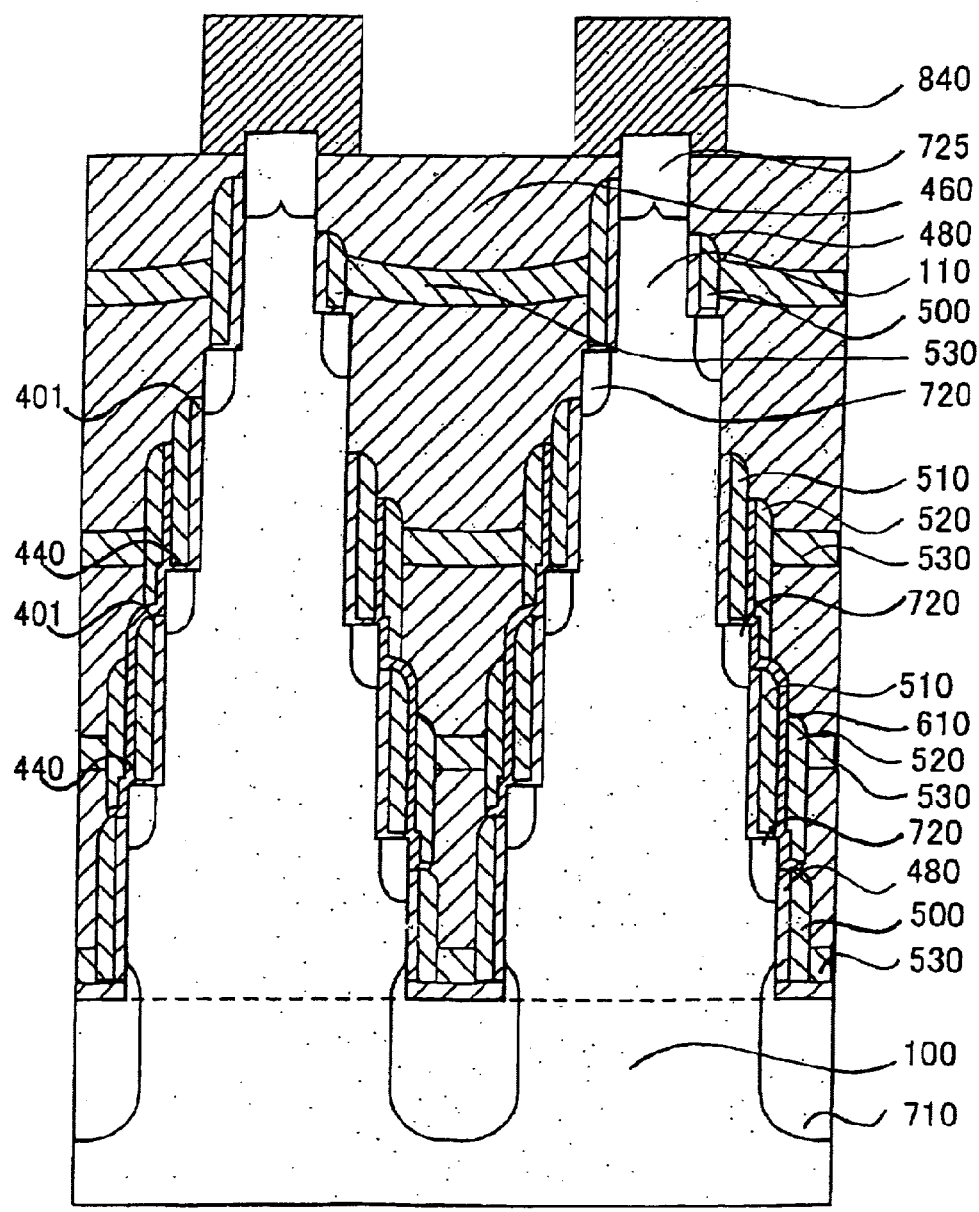
Figure 42:
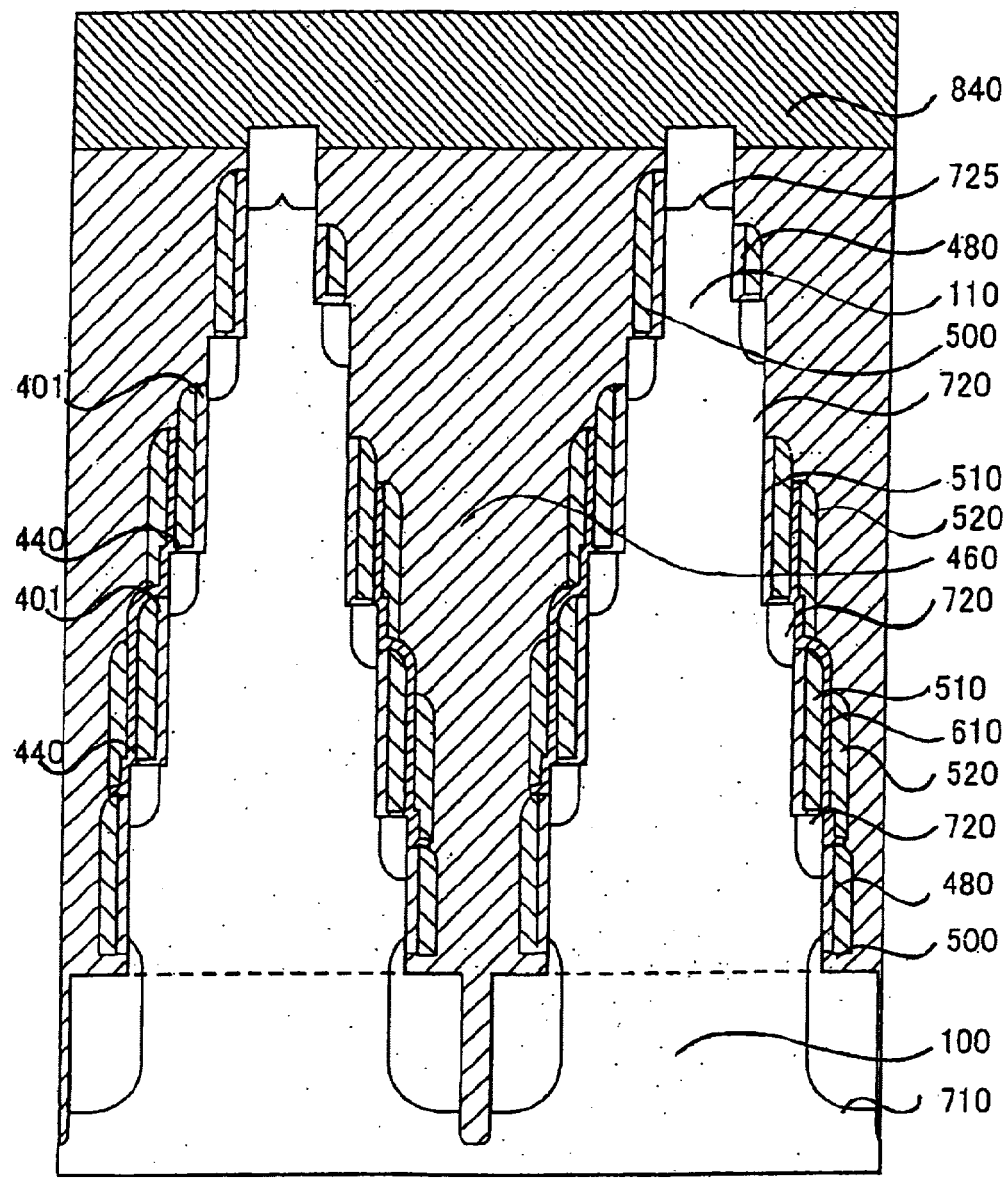

In FIGS. 41 and 42, the height of the steps in the island-like semiconductor layer varies at random.

Figure 43:
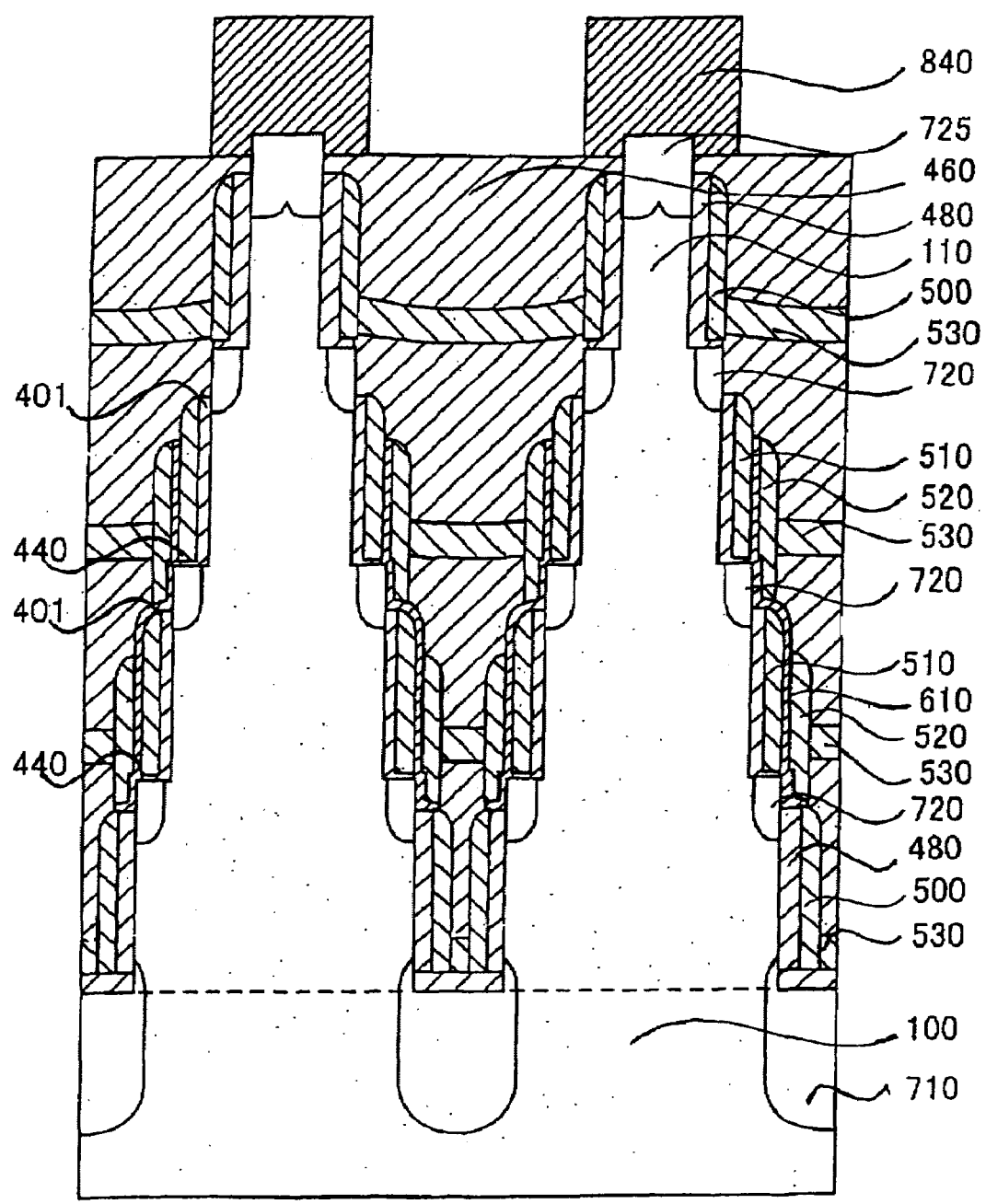
Figure 44:
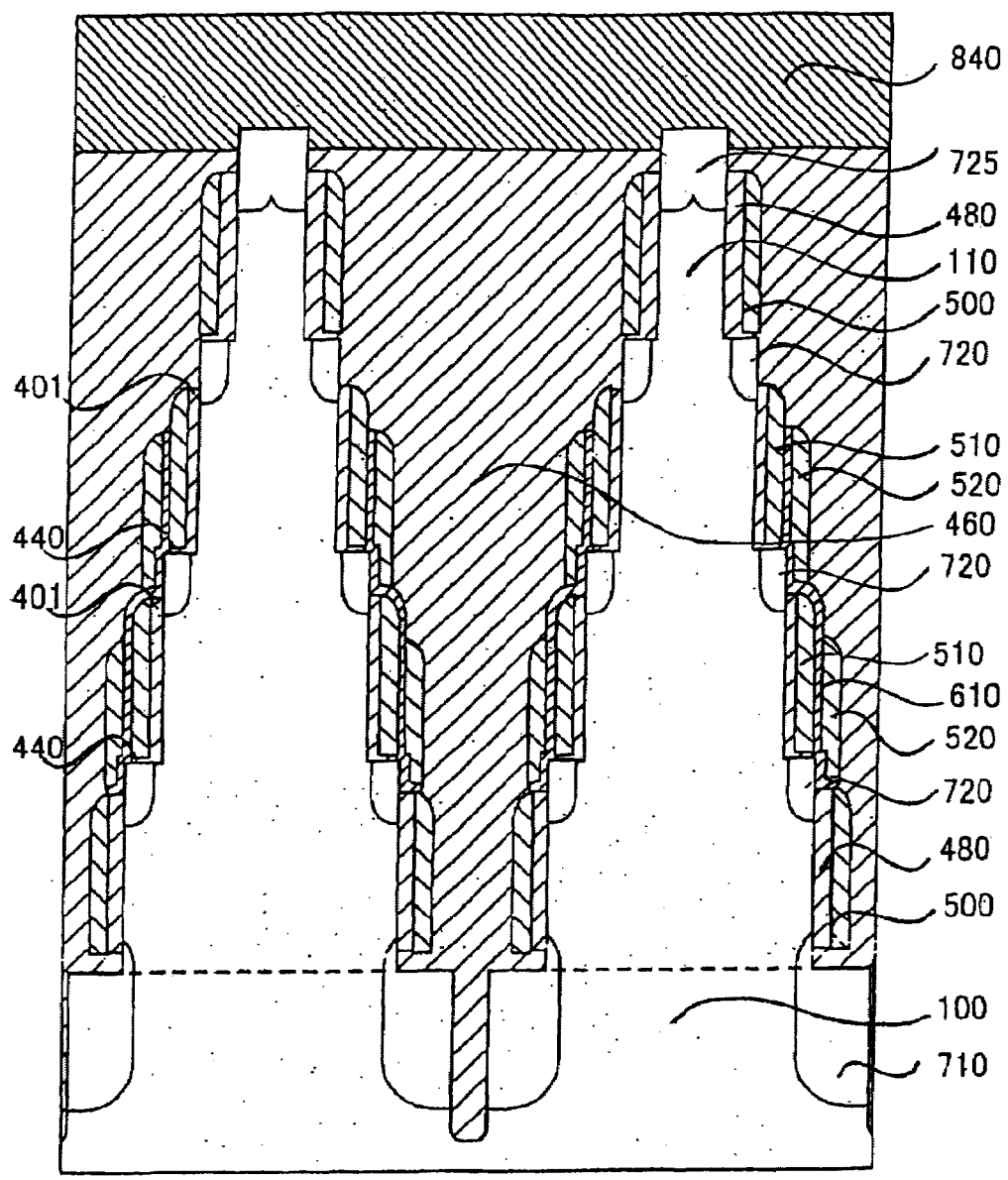

In FIGS. 43 and 44, the thickness of the gate insulating film 480 is larger than that of the tunnel oxide film 440.

Figure 45:
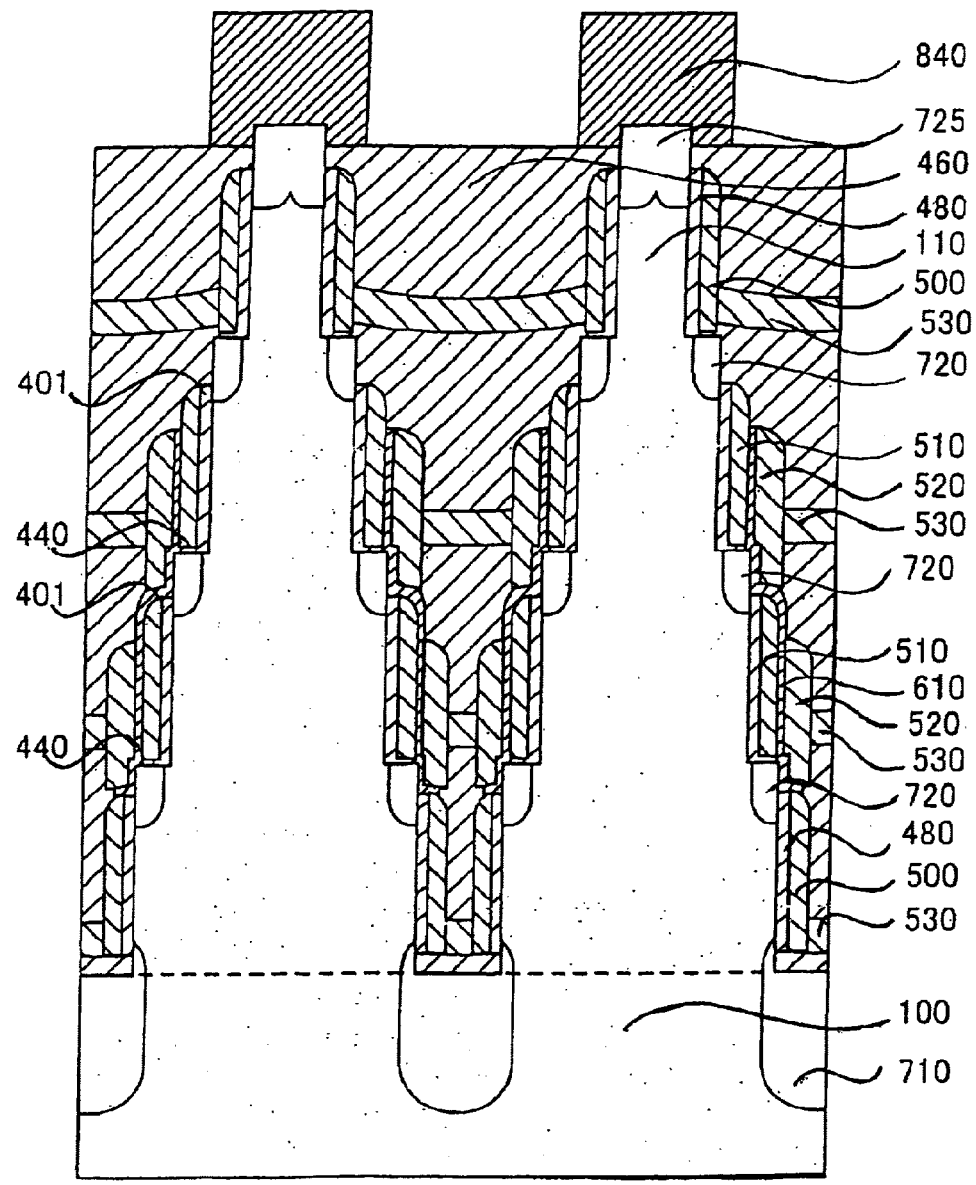
Figure 46:
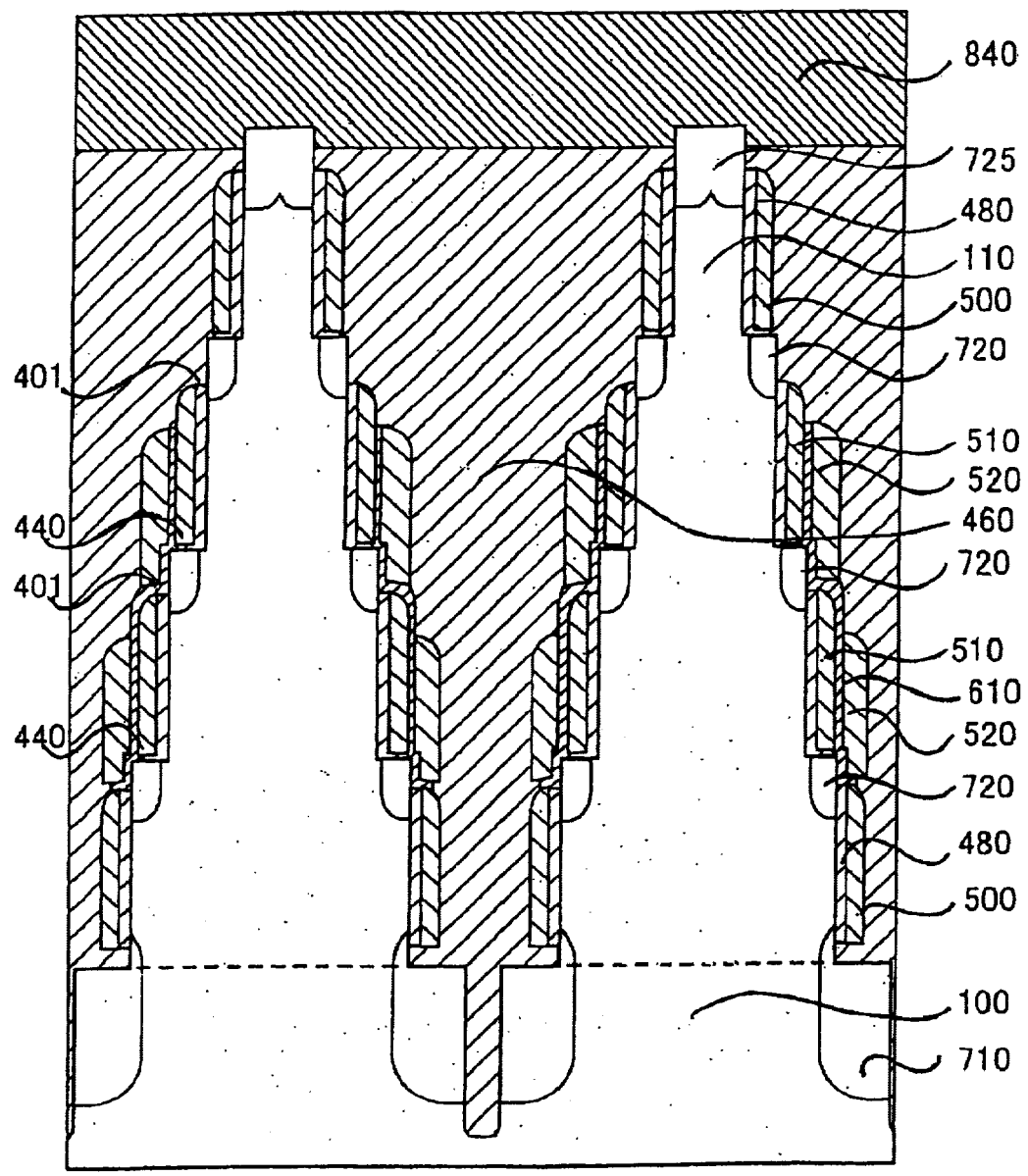

In FIGS. 45 and 46, the thickness of the control gate 520 is larger than that of the floating gate 510.

Figure 47:
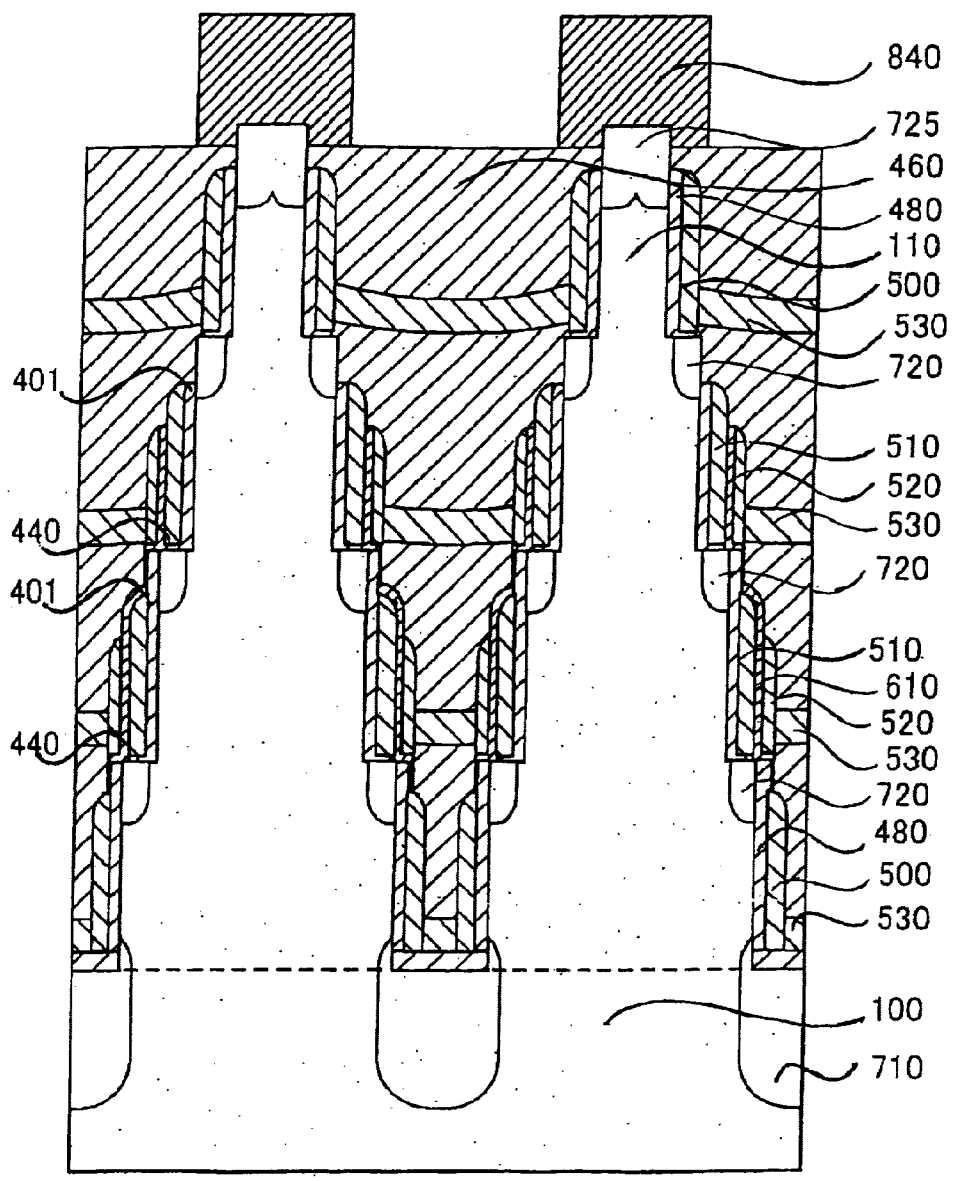
Figure 48:
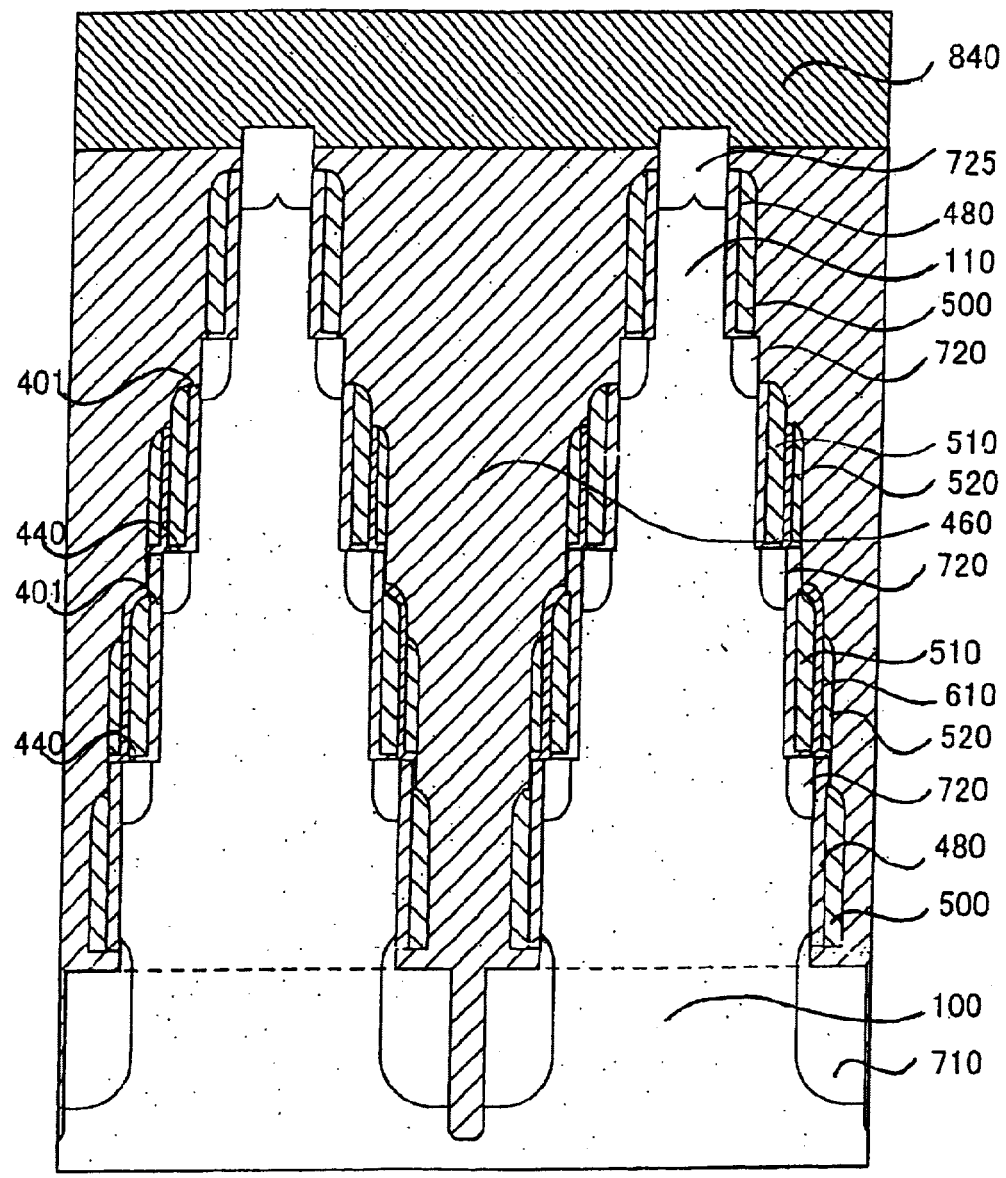

In FIGS. 47 and 48, the film thickness of the control gate 520 is smaller than that of the floating gate 510.

Figure 49:
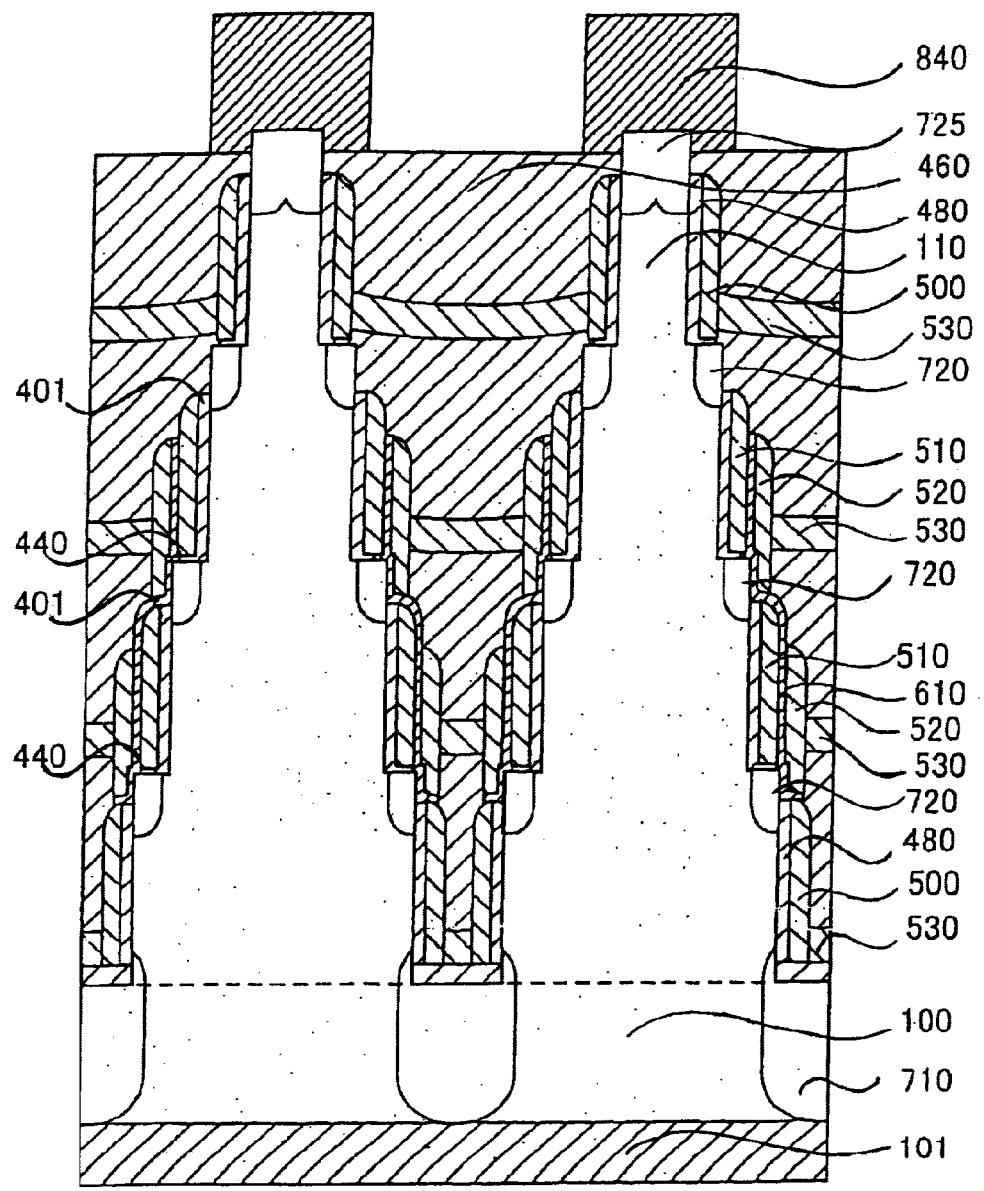
Figure 50:
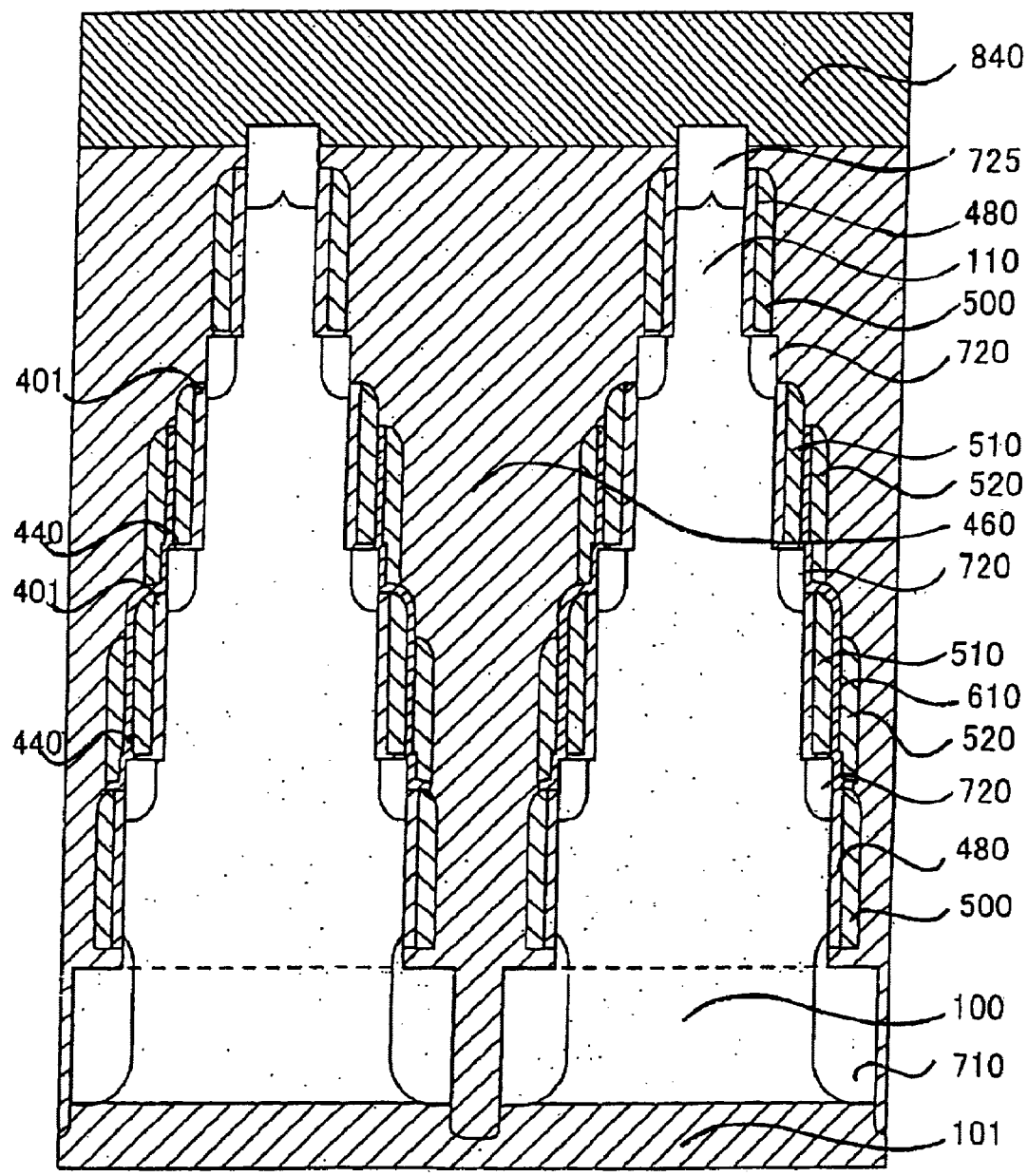

In FIGS. 49 and 50, an SOI substrate is used as the semiconductor substrate and is disposed so that the active region in a memory cell is floated from the semiconductor substrate and each of the island-like semiconductor layers are in a floating state.

Figure 51:
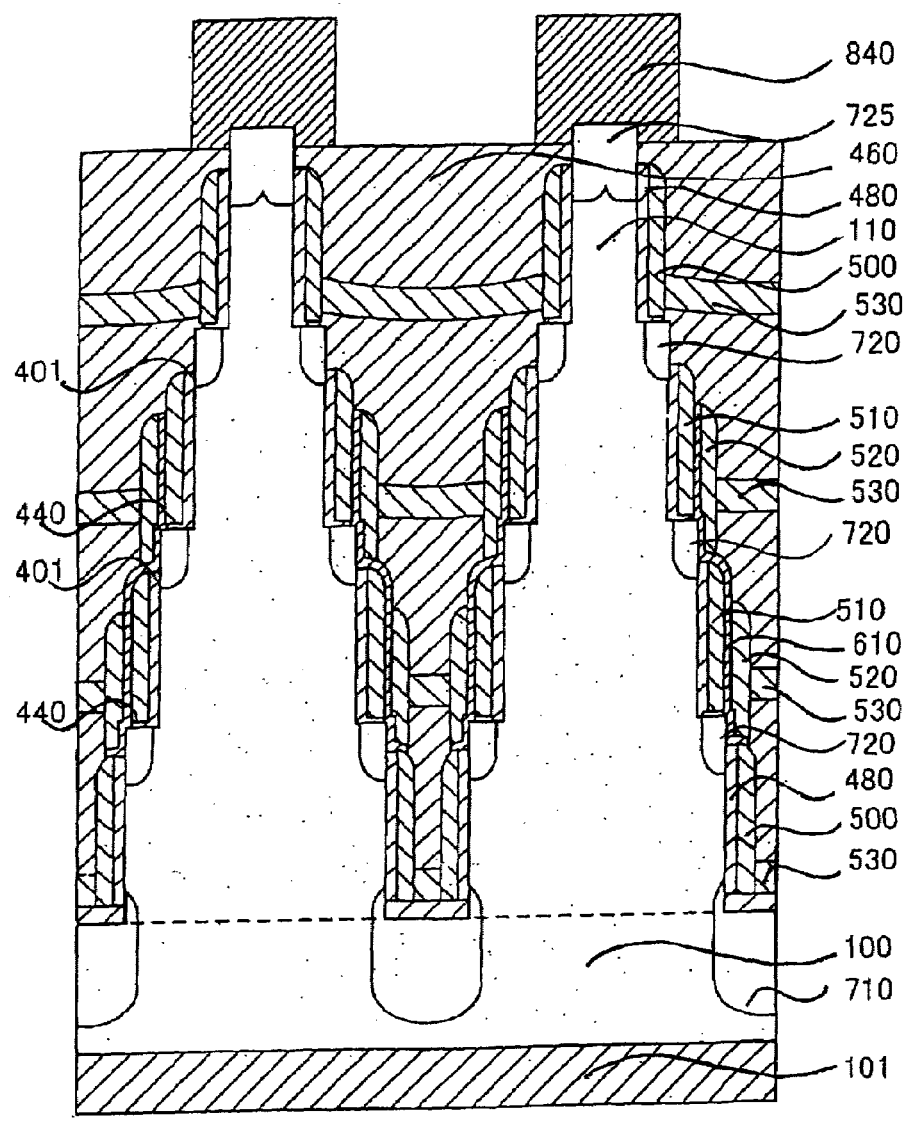
Figure 52:
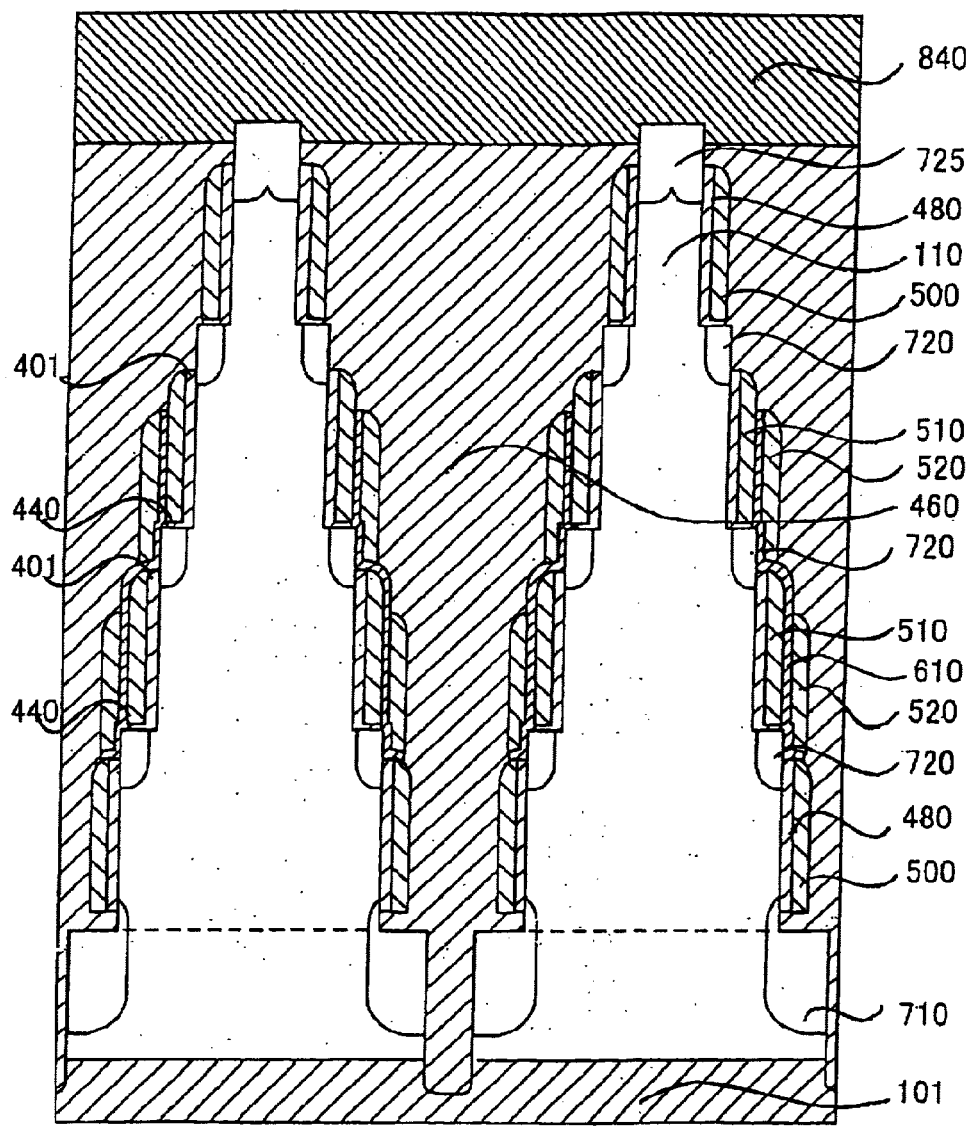

In FIGS. 51 and 52, different from FIGS. 49 and 50, the island-like semiconductor layers are disposed so as to have the same potential.

Figure 53:
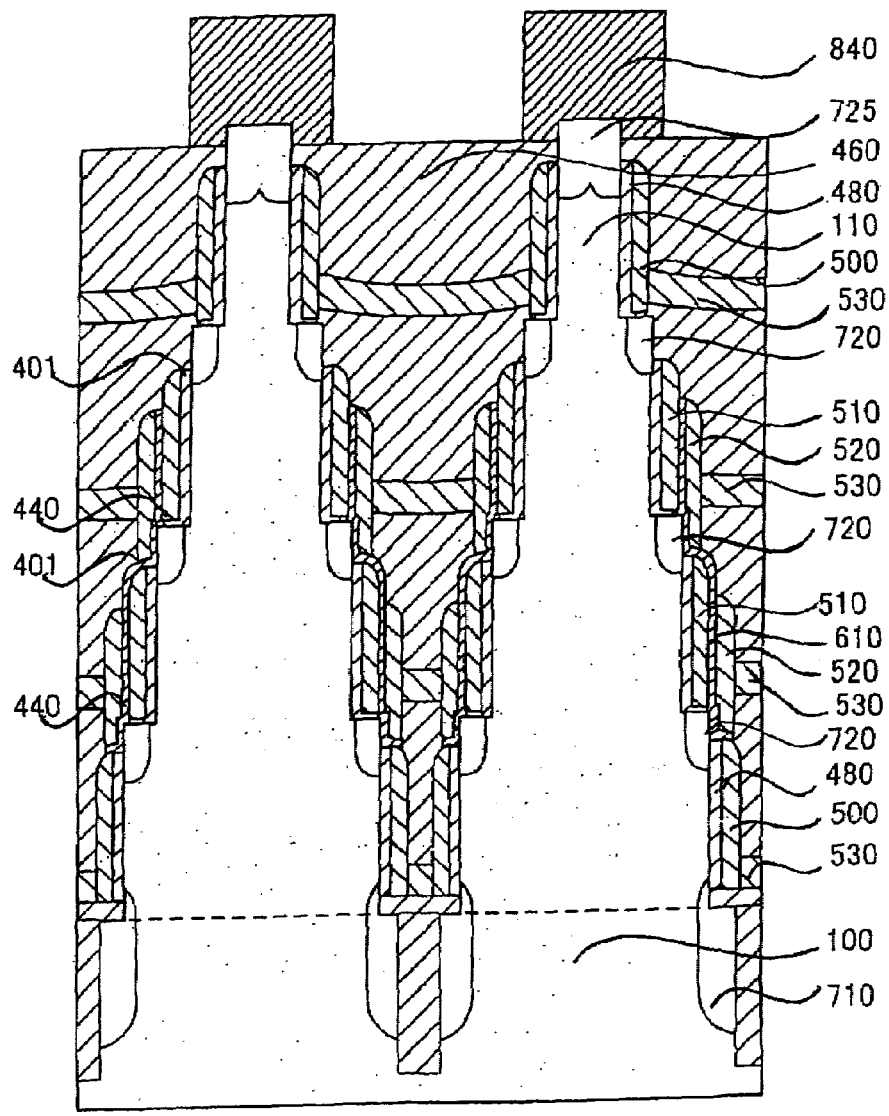
Figure 54:
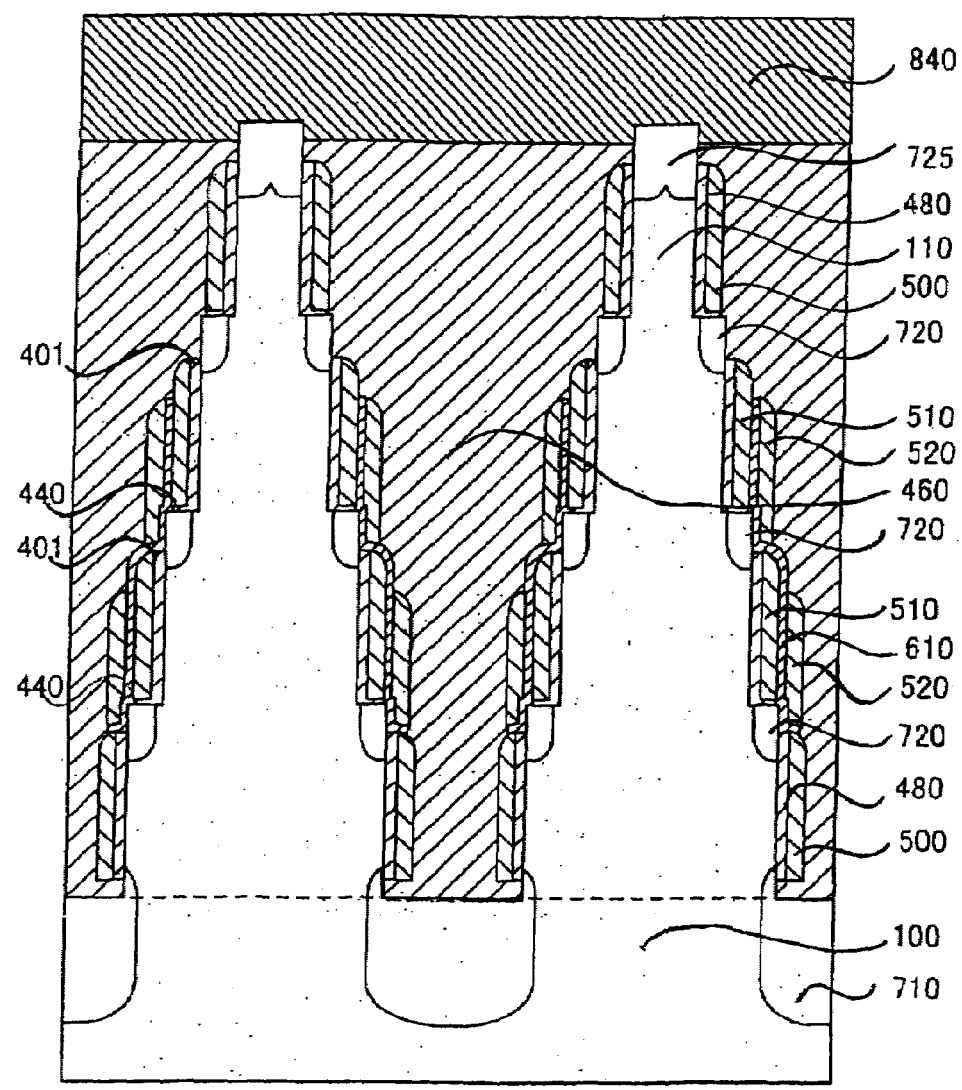

In FIGS. 53 and 54, bit lines and source lines are disposed parallel to each other.

Figure 55:
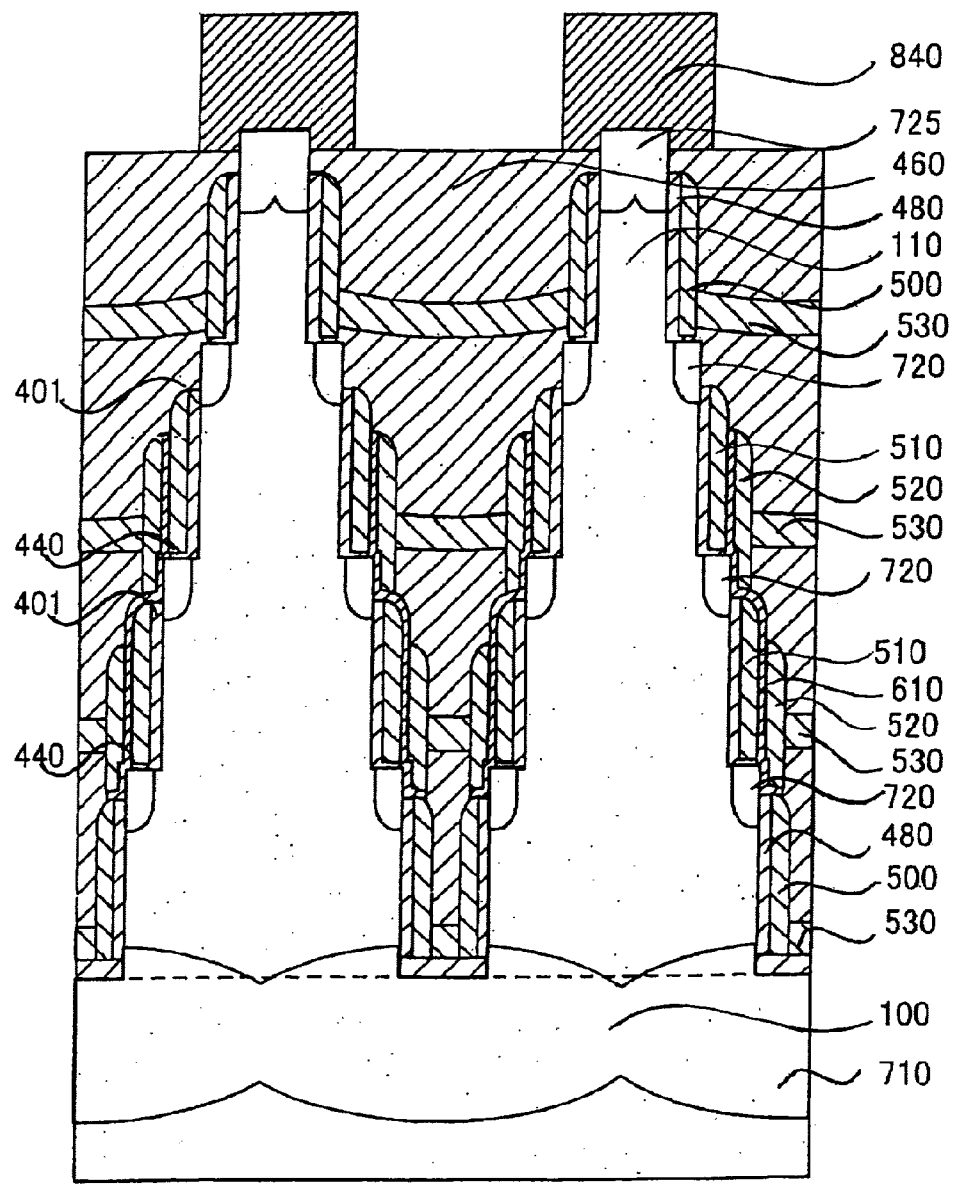
Figure 56:
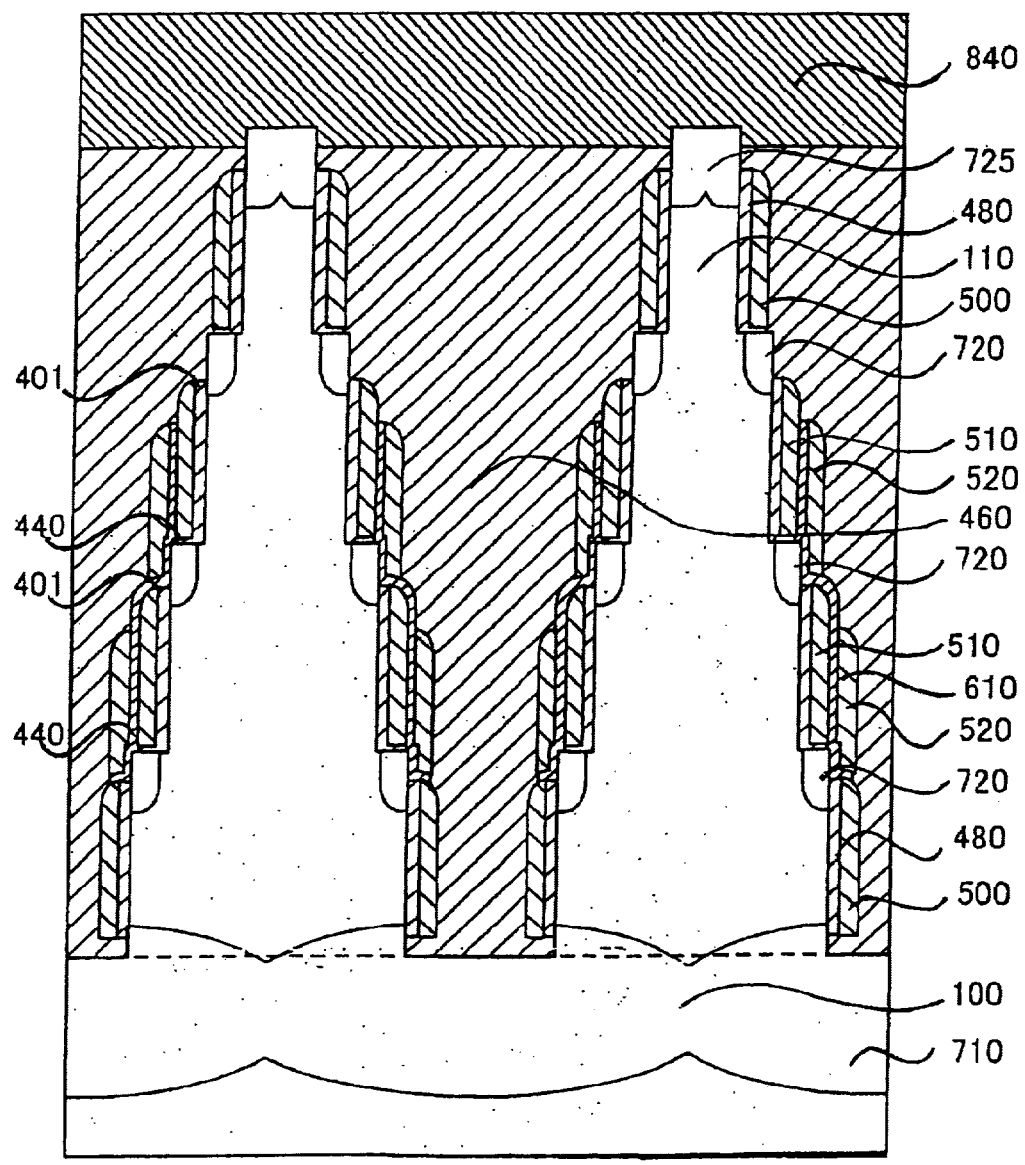
Figure 57:
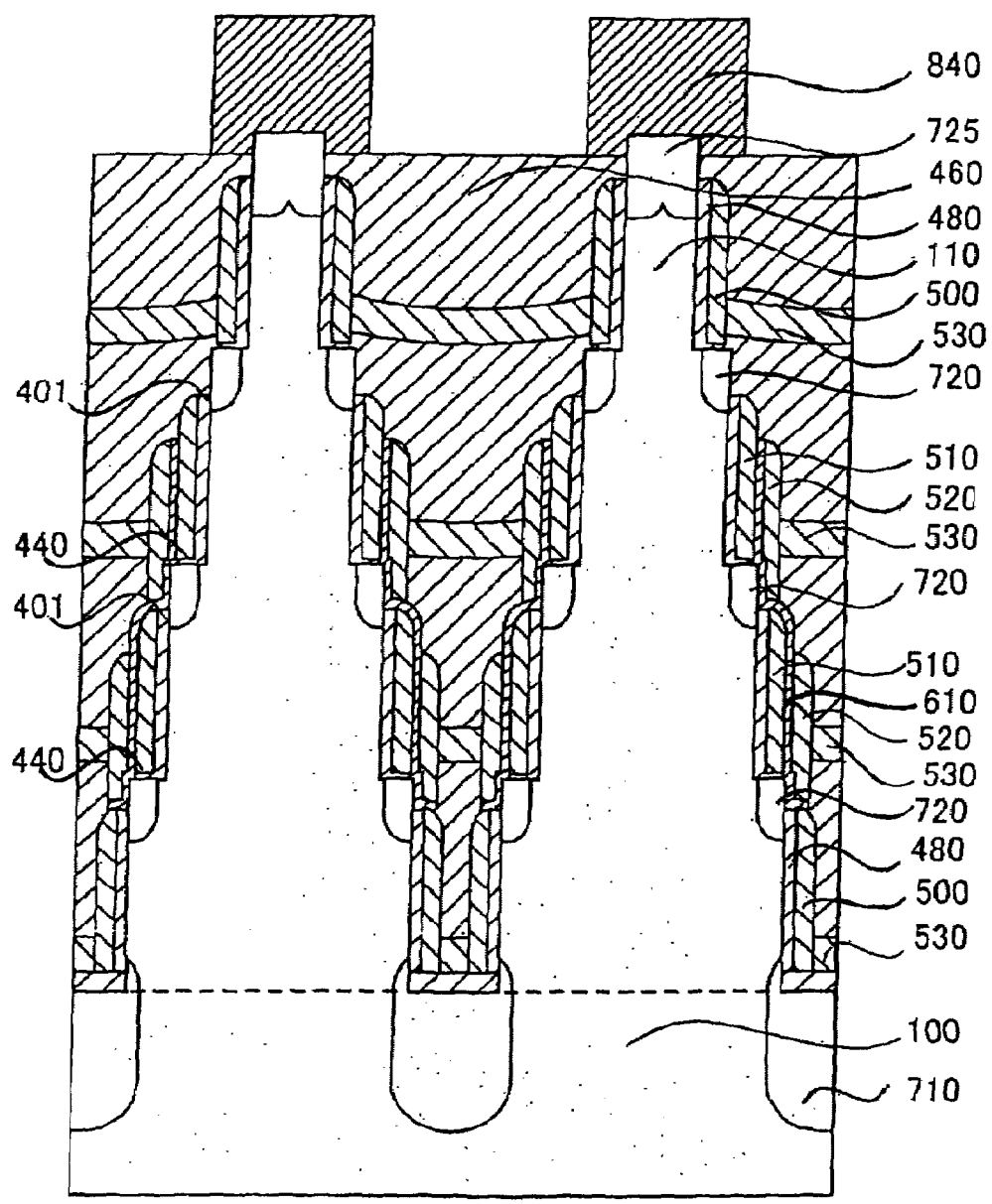
Figure 58:
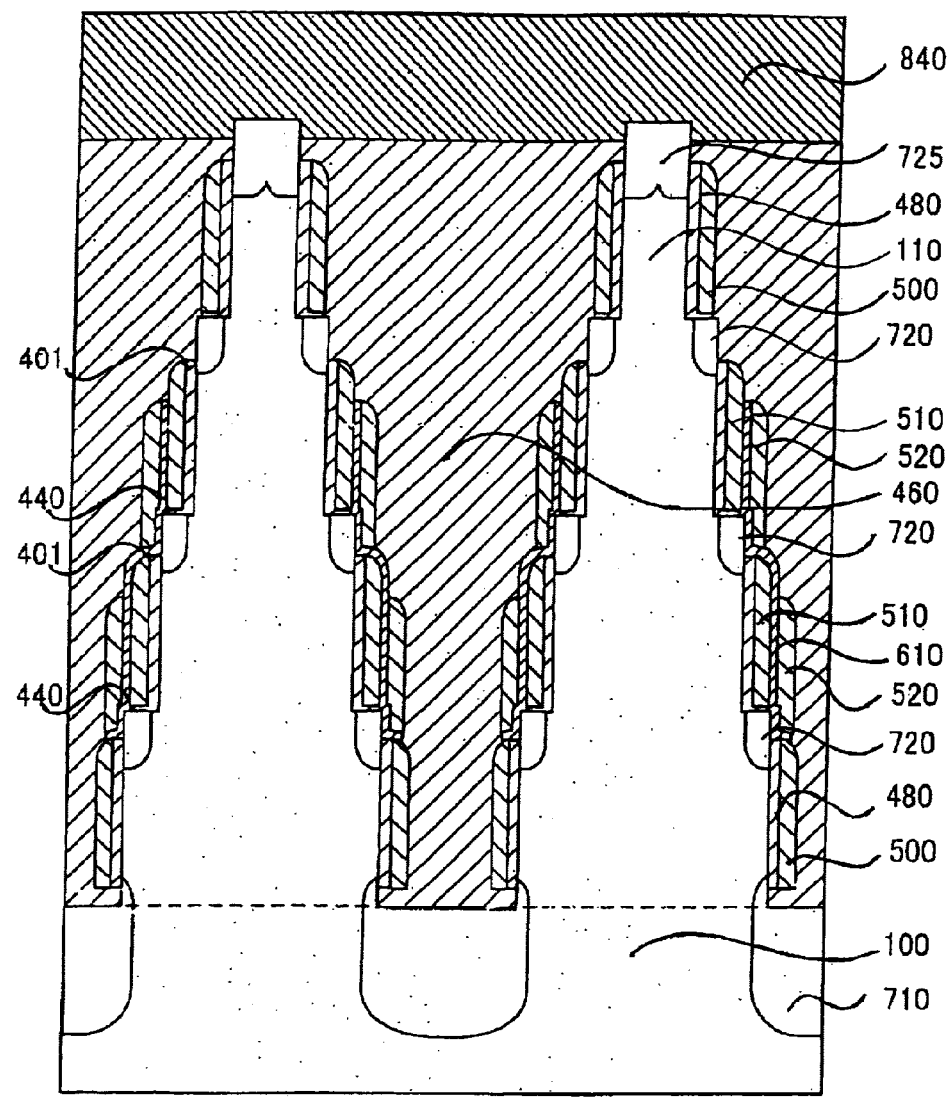

In FIGS. 55 to 58, the source line is commonly connected to the island-like semiconductor layers. In FIGS. 55 and 56, the active region in a memory cell is floated from the semiconductor substrate. In FIGS. 57 and 58, the island-like semiconductor layers have the same potential.

Figure 59:
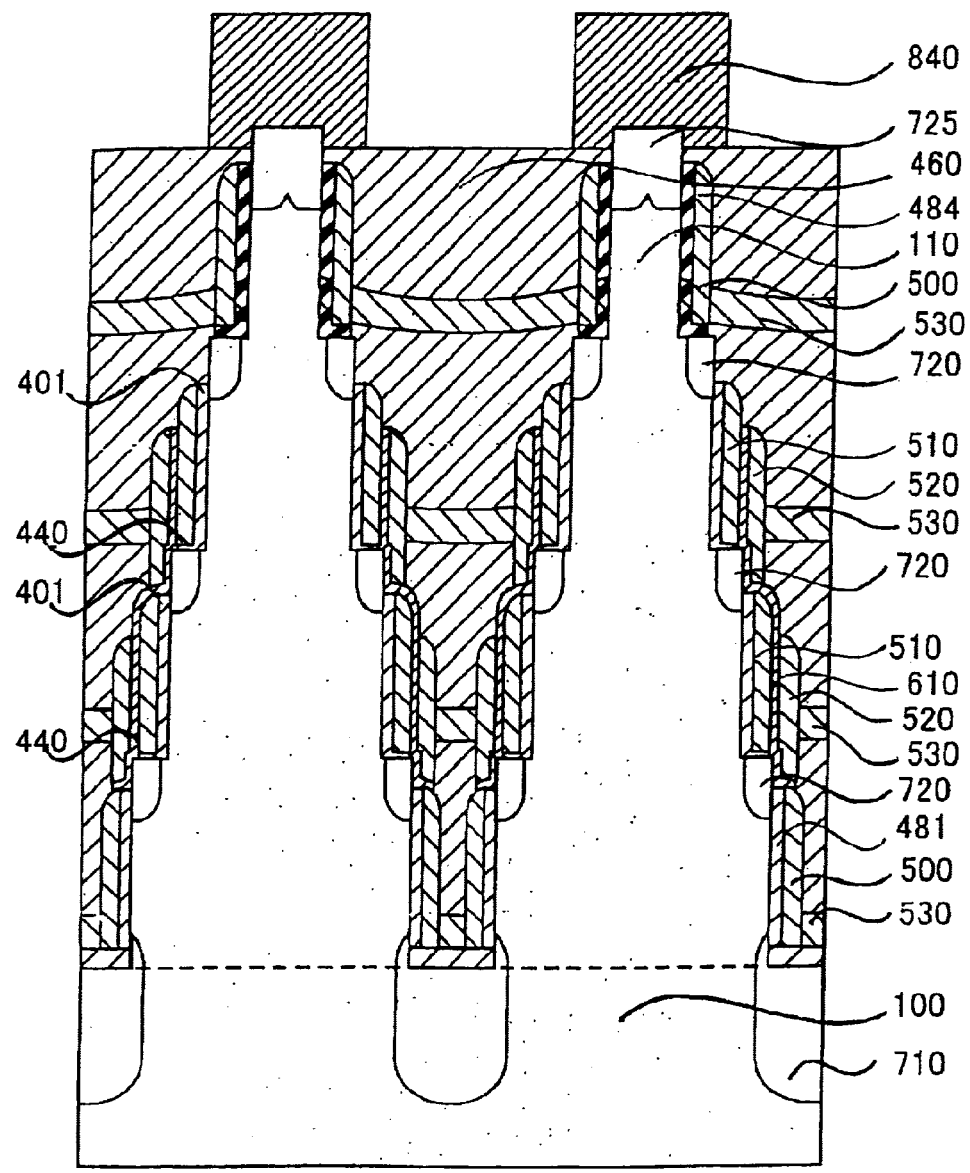

In FIGS. 59 and 60, in a lower part of a memory transistor, a transistor having the fifth electrode 500 serving as a selection gate is disposed via a gate insulating film 481. In an upper part of the memory transistor, a transistor having the fifth electrode 500 serving a selection gate is disposed via a gate insulating film 484. The gate insulating films 481 and 484 are different from each other.

Embodiments of Operating Principles of Memory Cell Arrays

The semiconductor memory device of the present invention has a memory function according to the state of a charge stored in the charge storage layer. The operating principles for reading, writing and erasing data will be explained by taking, as an example, an array having memory cells each including a floating gate as the charge storage layer and selection gate transistors.

A method of reading data from a semiconductor memory device will be described below, which has transistors having second and fifth electrodes as gate electrodes as selection gate transistors and has island-like semiconductor layers having L (L: positive integer) pieces of memory cells each provided with a charge storage layer and a third electrode as a control gate electrode are connected in series between the selection gate transistors.

Figure 61:
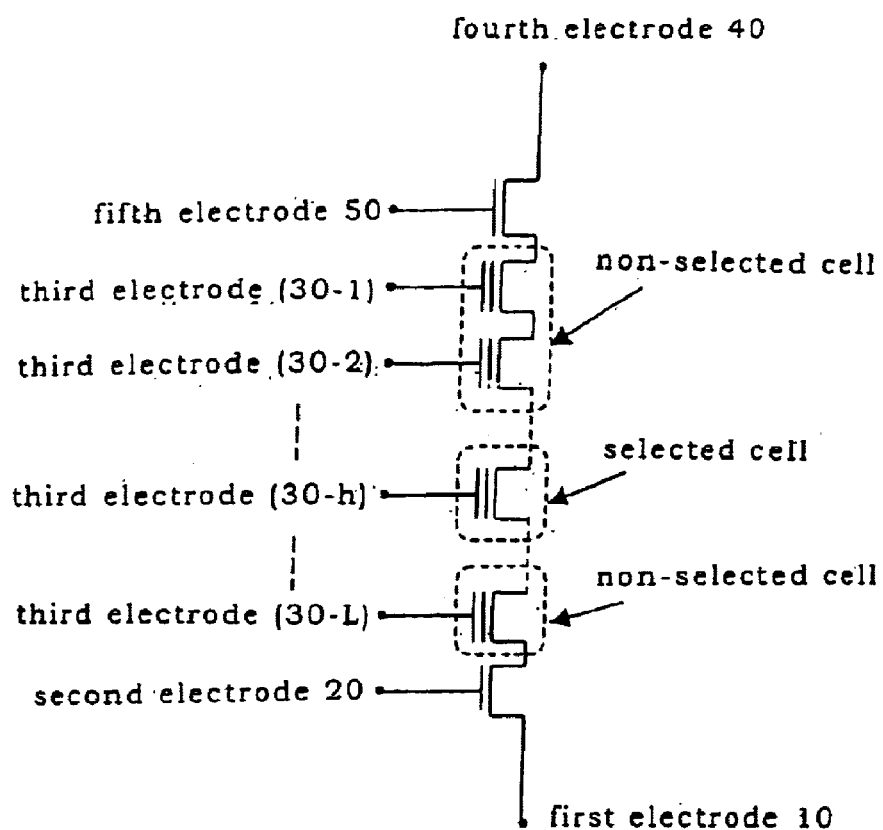
FIGS. 61 to 72 are equivalent circuit diagrams of the memory cell structure of the invention.

FIG. 61 shows an equivalent circuit of the memory cell structure.

In the case where the island-like semiconductor layers are formed of a P-type semiconductor, a selected cell as shown in FIG. 61 is read by applying a first potential to a first electrode 10 connected to the island-like semiconductor layer including the selected cell, a second potential to a second electrode 20 disposed in series with the selected cell, a third potential to a third electrode 30-$h$ (h: a positive integer satisfying $1 \leq h \leq L$) connected to the selected cell, a seventh potential to third electrodes (30-1 to 30-(h−1)) connected to non-selected cells disposed in series with the selected cell, an eleventh potential to third electrodes (30-(h+1) to 30-L) connected to non-selected cells, a fourth potential to a fourth electrode 40, and a fifth potential to a fifth electrode 50 connected to the selected cell in series. The fourth potential is larger than the first potential. "0" or "1" is determined according to a current flowing through the fourth electrode 40 or a current flowing through the first electrode 10.

At this time, by the third potential, the amount of a charge stored in the charge storage layer can be determined. Specifically, as potentials by which "0" or "1" can be determined, the seventh and eleventh potentials may be potentials at which a cell current can be always passed to the memory cell irrespective of the stored charge amount of the charge storage layer, that is, the potentials at which an inversion layer can be formed in a channel region of the memory cell. For example, the potentials may be potentials equal to or larger than the threshold of a memory transistor using the third electrode as a gate electrode.

When h=1, a potential similar to the potential applied to the third electrodes (30-(h+1) to 30-L) when $2 \leq h \leq L-1$ is applied to the third electrodes (30-2 to 30-L). When h=L, a potential similar to that applied to the third electrodes (30-1 to 30-(h−1)) when $2 \leq h \leq L-1$ is applied to the third electrodes (30-1 to 30-(L−1)).

The above can be applied to the other embodiments of the invention. The second and fifth potentials may be potentials at which a cell current flows, for example, a potential equal to or larger than the threshold of a transistor using the second and fifth electrodes as gate electrodes.

In the case where the first electrode 10 is formed as an impurity diffusion layer in the semiconductor substrate and a channel region of a memory cell is electrically connected to the semiconductor substrate, the first potential applied to the first electrode 10 connected to the island-like semiconductor layer including a selected cell is set to a potential at which the island-like semiconductor layer is electrically floated from the semiconductor substrate by a depletion layer extended on the semiconductor substrate side. The potential of the island-like semiconductor layer thereby becomes equal to the first potential, and a selected cell on the island-like semiconductor layer can be read without being influenced by the substrate potential. As a result, an effect of a back-bias which can happen when the semiconductor substrate and the channel region of the memory cell in the island-like semiconductor layer are electrically connected and the potentials are equal can be prevented. When a read current is passed to the first electrode, due to a resistance component of the impurity diffusion layer from the first electrode of the island-like semiconductor layer including the selected memory cell to the power source, the potential of the first electrode increases with respect to the substrate potential and, in the selected cell, a back bias is seemingly applied to the substrate. By the back bias, the threshold increases, and decrease in the read current can be prevented.

In the case where the first electrode 10 is formed as an impurity diffusion layer in the semiconductor substrate and the tenth potential applied to the semiconductor substrate is the ground potential, generally, the first potential is the ground potential.

In the case where the first electrode 10 is electrically insulated from the semiconductor substrate, for example, in the case where the first electrode 10 as an impurity diffusion layer is formed in an SOI substrate and is insulated from the semiconductor substrate by an insulating film, the first potential does not always have to be the same as the tenth potential.

Memory cells from the memory cell connected to the third electrode (30-L) to the memory cell connected to the third electrode (30-1) may be continuously read or read in reverse order or at random.

Figure 73:
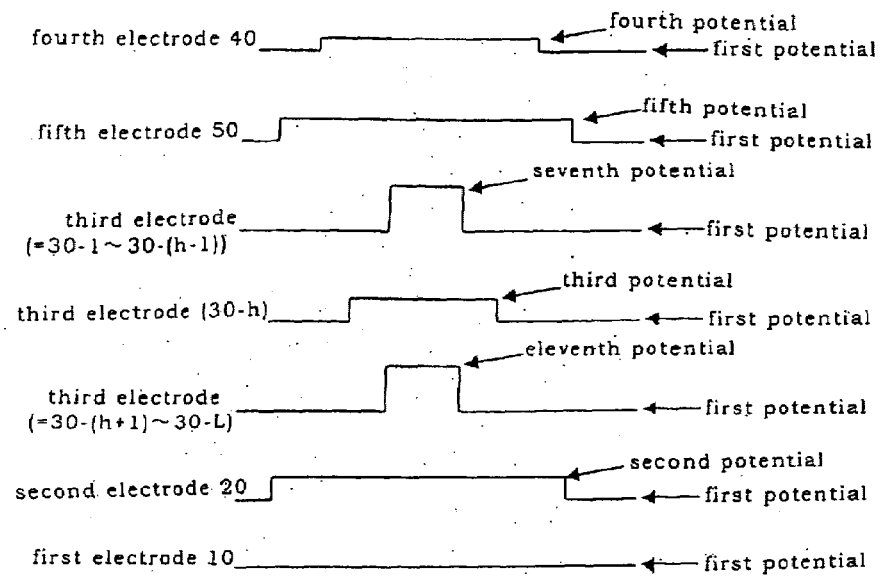
FIGS. 73 to 137 are timing charts of potentials applied of the memory cell structure of the invention.

FIG. 73 shows an example of timings of potentials applied to the electrodes in reading operation in the case where a ground potential is applied as the first potential, the threshold of a transistor having the second and fifth electrodes is 0.5 V, a memory cell writing state is defined as the threshold of the memory cell of 5.0 V to 7.5 V, and an erase state is defined as the threshold of 0.5 V to 3.0 V.

The ground potential as the first potential is applied to each of the first electrode 10, second electrode 20, third electrode 30, fourth electrode 40, and fifth electrode 50. 3 V is applied as the second potential to the second electrode 20, 3 V is applied as the fifth potential to the fifth electrode 50, 1 V is applied as the fourth potential to the fourth electrode 40, 4 V is applied as the third potential to the third electrode (30-$h$) connected to the selected cell, 8 V is applied as the seventh potential to the third electrodes (30-1 to 30-($h$−1)) connected to non-selected cells disposed in series with the selected cell, and 8 V is applied as the eleventh potential to the third electrodes (30-($h$+1) to 30-L). The current flowing through the fourth electrode 40 or first electrode 10 is sensed.

Thereafter, the potentials applied to the third electrodes other than the third electrode (30-$h$), the third electrode (30-$h$), fourth electrode 40, second electrode 20, and fifth electrode 50 are reset to the ground potential as the first potential.

The timing of applying the potential to the electrodes and the timing of resetting the potential to be applied to the electrodes to the ground potential may not be the same. The second potential and the fifth potential may be different from each other. The eleventh potential and the seventh potential may be different from each other.

Although it is preferable to apply the first potential as the same potential to the first electrode 10, second electrode 20, third electrodes (30-1 to 30-L), fourth electrode 40, and fifth electrode 50, different potentials may be applied. Further, the third potential may be always applied to the third electrode (30-$h$). The first potential and the fourth potential may be interchanged.

The reading method in the case where the memory cell using the third electrode (30-$h$) as a gate electrode is employed as a selected cell has been described above. A reading method in the case where the memory cell using the third electrode other than the third electrode (30-$h$) as a gate electrode is employed as the selected cell is similar to the above.

Figure 74:
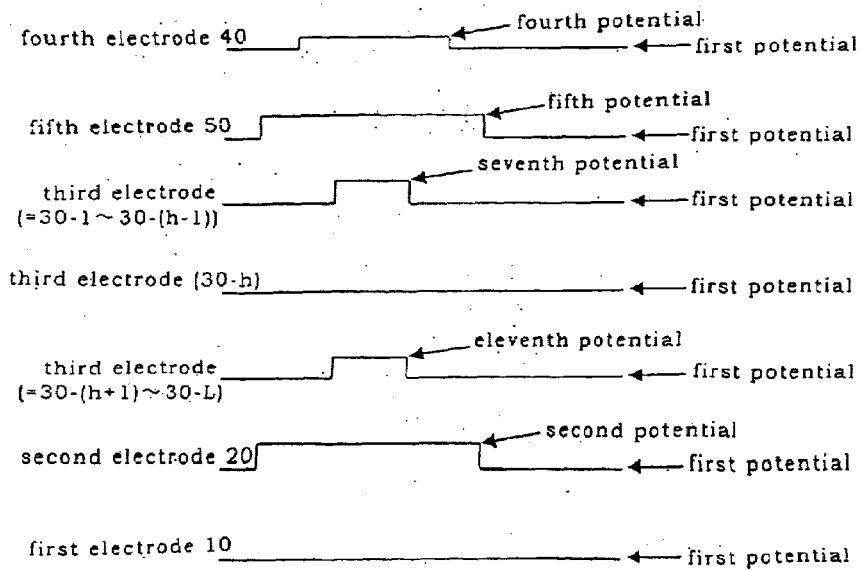

FIG. 74 shows an example of timings of potentials applied to the electrodes in reading operation in the case where a ground potential is applied as the first potential, the threshold of a transistor having the second and fifth electrodes is 0.5 V, a memory cell writing state is defined as the threshold of the memory cell of 1.0 V to 3.5 V, and an erase state is defined as the threshold of −1.0 V or less.

The ground potential as the first potential is applied to each of the first electrode 10, second electrode 20, third electrode 30, fourth electrode 40, and fifth electrode 50. 3 V is applied as the second potential to the second electrode 20, 3 V is applied as the fifth potential to the fifth electrode 50, 1 V is applied as the fourth potential to the fourth electrode 40, the ground potential as the first potential is continuously applied as the third potential to the third electrode (30-$h$) connected to the selected cell, 5 V is applied as the seventh potential to the third electrodes (30-1 to 30-($h$−1)) connected to non-selected cells disposed in series with the selected cell, and 5 V is applied as the eleventh potential to the third electrodes (30-($h$+1) to 30-L). The current flowing through the fourth electrode 40 or first electrode 10 is sensed.

Thereafter, the potentials applied to the third electrodes other than the third electrode (30-$h$), fourth electrode 40, second electrode 20, and fifth electrode 50 are reset to the ground potential. The timing of applying the potential to the electrodes and the timing of resetting the potential to be applied to the electrodes to the ground potential may not be the same. The second potential and the fifth potential may be different from each other. The eleventh potential and the seventh potential may be different from each other. The first potential and the fourth potential may be interchanged. Although it is preferable to apply the first potential as the same potential to the first electrode 10, second electrode 20, third electrodes (30-1 to 30-L), fourth electrode 40, and fifth electrode 50, different potentials may be applied. Further, the third potential may be always applied to the third electrode (30-$h$). The third potential may be the ground potential.

The reading method in the case where the memory cell using the third electrode (30-$h$) as a gate electrode is employed as a selected cell has been described above. A reading method in the case where the memory cell using the third electrode other than the third electrode (30-$h$) as a gate electrode is employed as the selected cell is similar to the above.

Although the case where the island-like semiconductor layer is formed of a p-type semiconductor has been described above, in the case of an n-type semiconductor, it is sufficient to invert the polarities of all of electrodes and reverse the relations of magnitude of the potentials. This rule is applied to all of the embodiments of the invention.

A reading process of a semiconductor memory device according to the present invention will now be described. The semiconductor memory device has M×N pieces (M, N: positive integers) of island-like semiconductor layers which include, as a selection gate transistor, a transistor provided with a second electrode and a fifth electrode as gate electrodes and in which L pieces (L: a positive integer) of memory cells are connected in series between the selection gate transistors, each memory cell having a charge storage layer and a third electrode as a control gate electrode. In the memory cell array, M pieces of fourth wirings disposed in parallel with the semiconductor substrate are connected to one ends of the island-like semiconductor layers. The first wirings are connected to the other ends. N×L pieces of third wirings disposed in parallel to the semiconductor substrate and disposed in a direction crossing the fourth wirings are connected to the third electrodes of the memory cells.

Figure 63:
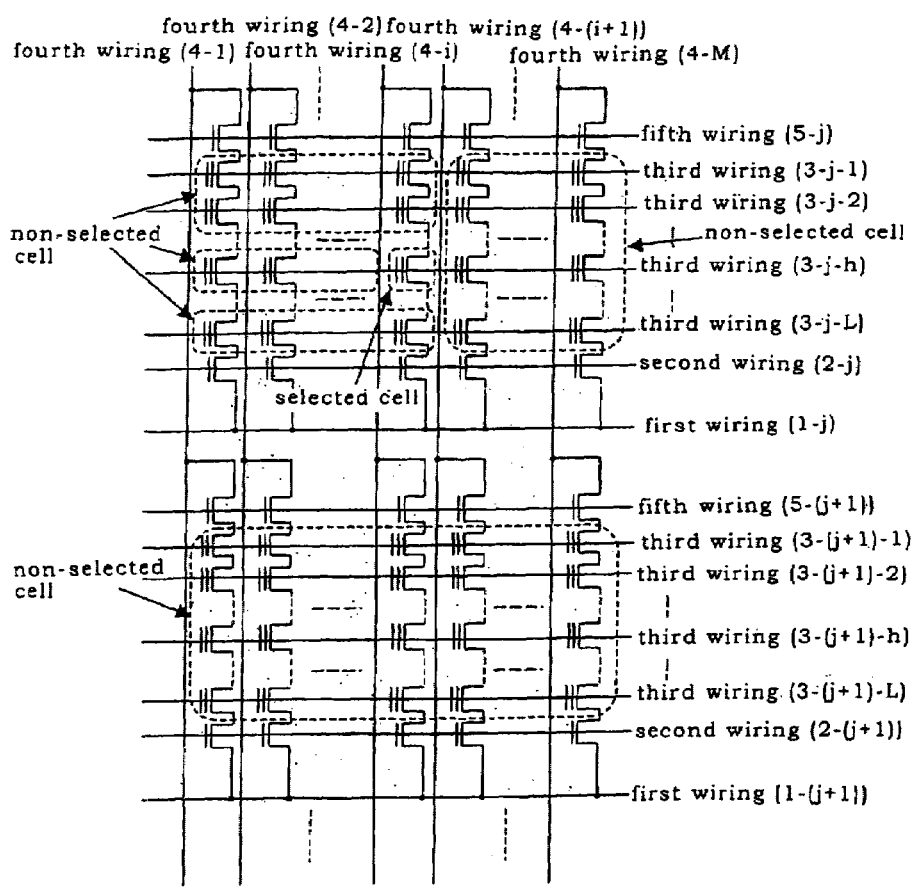

FIG. 63 shows an equivalent circuit of the above-described memory cell array structure in which the first wirings are disposed in parallel with the third wirings.

In the case where the island-like semiconductor layers are formed of a P-type semiconductor, a selected cell as shown in FIG. 63 is read out by applying a first potential to a first wiring (1-$j$) ($j$: a positive integer satisfying the relation of $1 \leq j \leq N$) connected to the island-like semiconductor layer including the selected cell, a second potential to a second wiring (2-$j$) connected to the second electrode arranged in series with the selected cell, a third potential to a third wiring (3-$j$-$h$) connected to the selected cell ($h$: a positive integer satisfying the relation of $1 \leq h \leq L$) connected to the selected cell, a seventh potential to third wirings (3-$j$–1 to 3-$j$-($h$–1)) connected to non-selected cells arranged in series with the selected cell, an eleventh potential to third wirings (3-$j$-($h$+1) to 3-$j$-L) connected to non-selected cells arranged in series with the selected cell, a twelfth potential to third wirings (which are not 3-$j$–1 to 3-$j$-L) which are not arranged in series with the selected cell but connected to non-selected cells, a fourth potential to a fourth wiring (4-$i$) ($i$: a positive integer satisfying $1 \leq i \leq M$) connected to the island-like semiconductor layer including the selected cell, an eighth potential to fourth wirings other than the fourth wiring (4-$i$), a fifth potential to a fifth wiring (5-$j$) connected to the fifth electrode arranged in series with the selected cell, and a sixth potential to at least either the second wirings other than the second wiring (2-$j$) or the fifth wirings other than the fifth wiring (5-$j$).

If $h=1$, third electrodes (3-$j$–2 to 3-$j$-L) are given the same potential as that applied to the third electrodes (3-$j$-($h$+1) to 3-$j$-L) when $2 \leq h \leq L-1$.

If $h=L$, the third electrodes (3-$j$–1 to 3-$j$-(L–1)) are given the same potential as that applied to the third electrodes (3-$j$–1 to 3-$j$-($h$–1)) when $2 \leq h \leq L-1$.

This rule can be applied also to the other embodiments of the invention.

The relation of magnitude of potentials are as follows. The fourth potential is larger than the first potential. "0" or "1" is determined according to the current flowing through the fourth wiring (4-$i$) or the current flowing through the first wiring (1-$j$).

At this time, the third potential is a potential allowing the distinction of the amount of a charge stored in the charge storage layer, i.e., a potential allowing the determination of "0" or "1". The seventh and eleventh potentials are potentials always allowing a cell current to flow through the memory cell regardless of the amount of the charge stored in the charge storage layer, i.e., potentials allowing the formation of an inversion layer in the channel region of the memory cell. For example, they may be potentials which are not lower than the threshold of the memory transistor having the third electrode as the gate electrode connected to the third wiring.

The second and fifth potentials are potentials allowing the cell current to flow, e.g., potentials not lower than the thresholds of the transistors having the second electrode connected to the second wiring and the fifth electrode connected to the fifth electrode as gate electrodes.

The sixth potential is a potential which does not allow the cell current to flow, e.g., a potential equal to or lower than the threshold of the transistor having the second electrode connected to the second wiring and the fifth electrode connected to the fifth electrode as gate electrodes.

In the case where the first wirings (1-1 to 1-N) are formed as an impurity diffusion layer in the semiconductor substrate and the channel region of the memory cell is electrically connected to the semiconductor substrate, the first potential applied to the first wiring (1-$j$) connected to the island-like semiconductor layer including the selected cell is such that, by applying the first potential, the island-like semiconductor layer is electrically floated from the semiconductor substrate by a depletion layer extended toward the semiconductor substrate. Thereby, the potential of the island-like semiconductor layer becomes equal to the first potential, and the selected cell on the island-like semiconductor layer can be read without being affected by the potential of the substrate. As a result, it is possible to prevent a back-bias effect which may occur when the semiconductor substrate is electrically connected with the channel region of a memory cell on the island-like semiconductor layer and has the same potential with the channel region. Specifically, the selected memory cell is apparently back-biased to the substrate since the potential of the first electrode rises with respect to the potential of the substrate because of a resistant component in the impurity diffusion layer from the first electrode of the island-like semiconductor layer including the selected memory cell to a power source when a reading current flows to the first wiring (1-$j$) connected to the island-like semiconductor layer including the selected cell. A rise in the threshold and a decrease in the read current can be prevented.

In the case where the first wirings (1-1 to 1-N) are formed as impurity diffusion layers in the semiconductor substrate and the tenth potential applied to the semiconductor substrate is the ground potential, the first potential is generally a ground potential.

In the case where the first wirings (1-1 to 1-N) are formed to be electrically insulated from the semiconductor substrate, for example, where the first wirings (1-1 to 1-N) made of an impurity diffusion layer are formed in an SOI substrate and are insulated from the semiconductor substrate by an insulating film, the first potential is not necessarily the same as the tenth potential.

The memory cells may be sequentially read out from a memory cell connected to the third wiring (3-$j$-L) to a memory cell connected to the third wiring (3-$j$–1), or may be read in an inverse order or at random.

A plurality or all of memory cells connected to the third wiring (3-$j$-$h$) may be read simultaneously. In a special case, memory cells connected to the third wiring (3-$j$-$h$) may be simultaneously read at certain intervals, for example, every eight memory cells, that is, all of fourth wirings (4-($j$–16)), (4-($i$–8)), (4-$i$), (4-($i$+8)), and (4-($i$+16)). A plurality of third wirings having four wirings which are not common can be simultaneously read.

The above-described reading methods may be combined.

FIG. 61 shows an equivalent circuit of the memory cell array structure when the first wirings are arranged in parallel with the fourth wirings. Read voltages in FIG. 61 are similar to those in FIG. 63 except that the first potential is applied to the first wiring (1-i).

Figure 70:
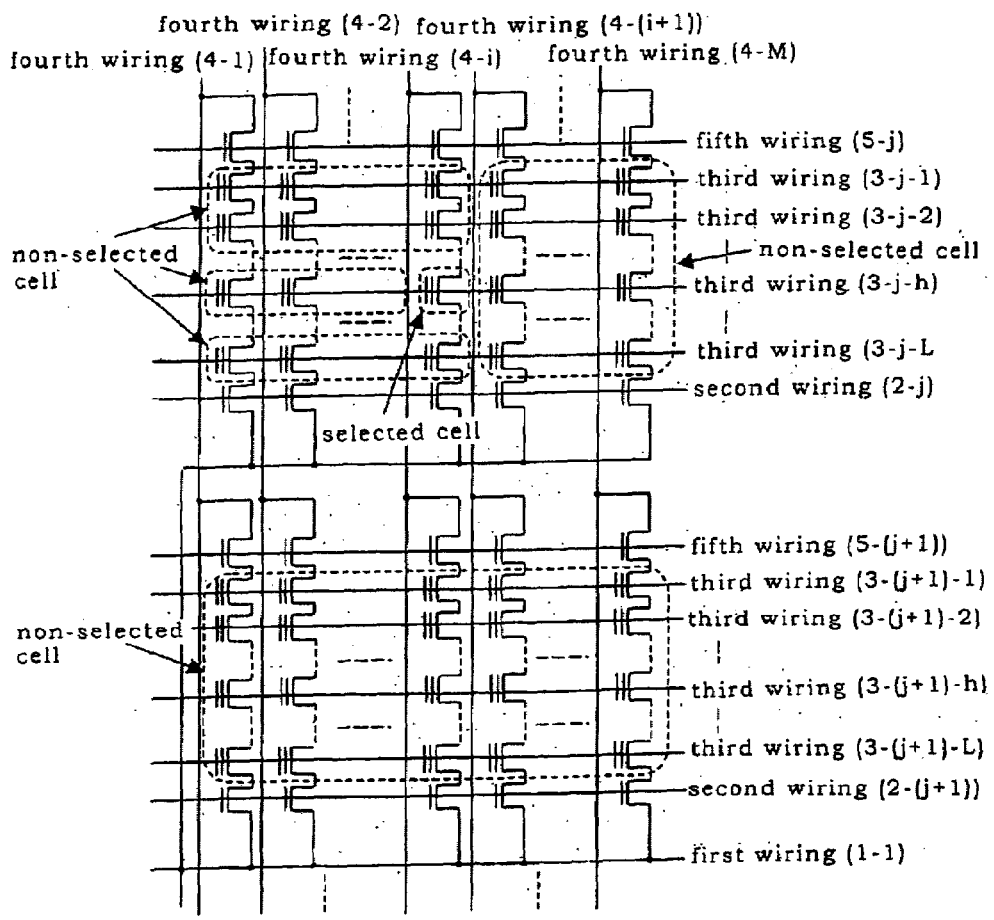

FIG. 70 shows an equivalent circuit of the memory cell array structure in which a plurality of first wirings are electrically connected and are common. Read voltages in FIG. 70 are similar to those in FIG. 63 except that the first potential is applied to the first wiring (1-1).

Figure 75:
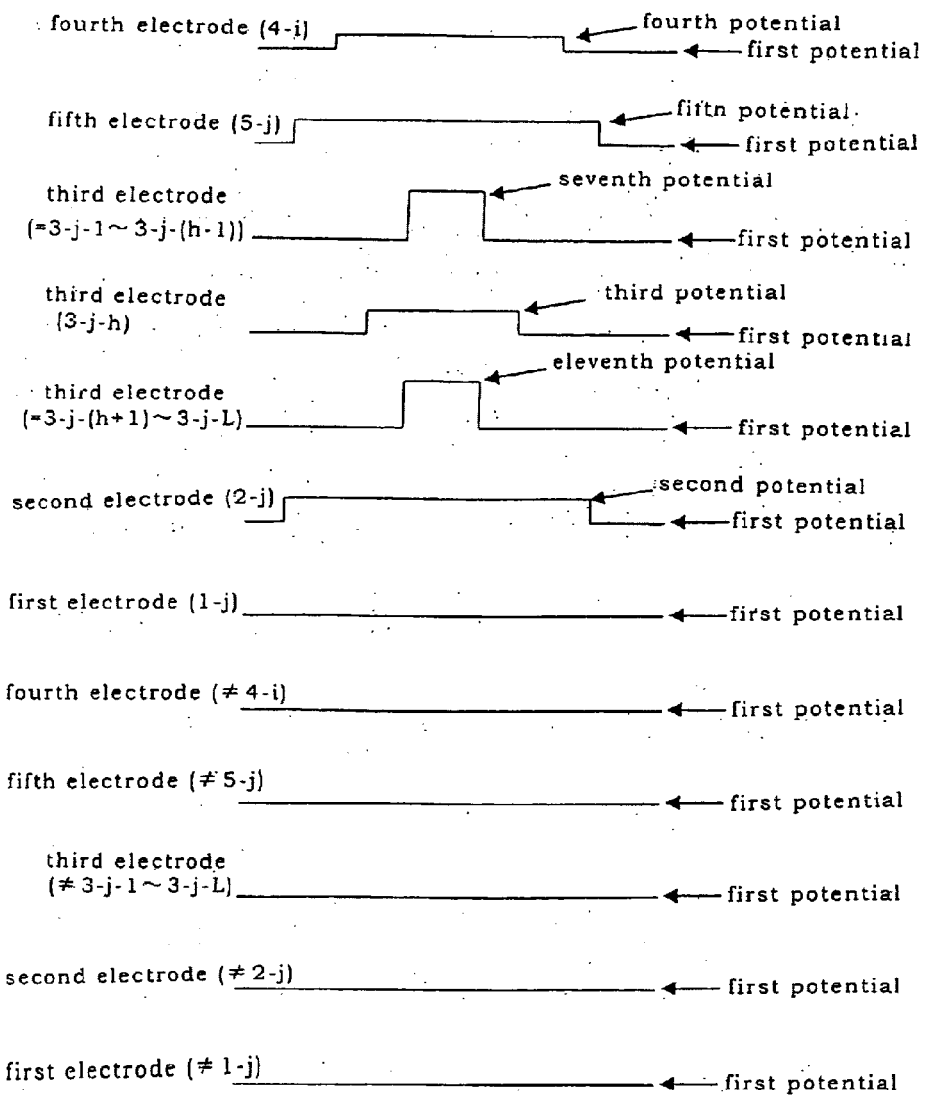

FIG. 75 is a timing chart at the time of reading when the first wiring is disposed in parallel with the third wiring. FIG. 75 shows an example of timings of applying potentials in reading operation in the case where a ground potential is applied as the first potential, the threshold of the transistor having the gate electrodes connected to the second wiring and the fifth wiring is 0.5 V, the writing state of the memory cell is defined as a threshold of 5.0 V to 7.5 V, and an erase state is defined as a threshold of 0.5 V to 3.0 V.

First, the ground potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). The second potential, e.g., 3 V, is applied to the second wire (2-j), and the fifth potential, e.g., 3 V is applied to the fifth wire (5-j). The fourth potential, e.g., 1 V, is applied to the fourth wire (4-i), and the third potential, e.g., 4 V, is applied to the third wire (3-j-h) connected to the selected cell. The seventh potential, e.g., 8 V, is applied to third wires (3-j-1 to 3-j-(h-1)) connected to non-selected cells arranged in series with the selected cell, and the eleventh potential, e.g., 8 V is applied to third wires (3-j-(h+1) to 3-j-L) connected to non-selected cells arranged in series with the selected cell. The current flowing through the fourth wire (4-i) or the first wire (1-j) is sensed.

The third wires (not 3-j-h) other than the third wire (3-j-h), third wire (3-j-h), fourth wire (4-i), second wire (2-j), and fifth wire (5-j) are reset to the ground potential. The timings of applying the potentials to the electrodes and timings of resetting the electrodes to the ground potential may be simultaneous. The second and fifth potentials may be different from each other. The eleventh and seventh potentials may be different from each other.

Although it is preferable to apply the same potential initially as the first potential to the first wires (1-1 to 1-N), the second wires (2-1 to 2-N), the third wires (3-1-1 to 3-N-L), the fourth wires (4-1 to 4-M) and the fifth wires (5-1 to 5-N), different potentials may be applied. The third potential may be continuously applied to the third wire (3-j-h).

The reading method has been described with respect to the case where the selected cell is a memory cell having the third wire (3-j-h) as the gate electrode. The reading method is the same with respect to the case where the selected cell is a memory cell having a third wire other than the third wire (3-j-h) as the gate electrode.

Figure 76:
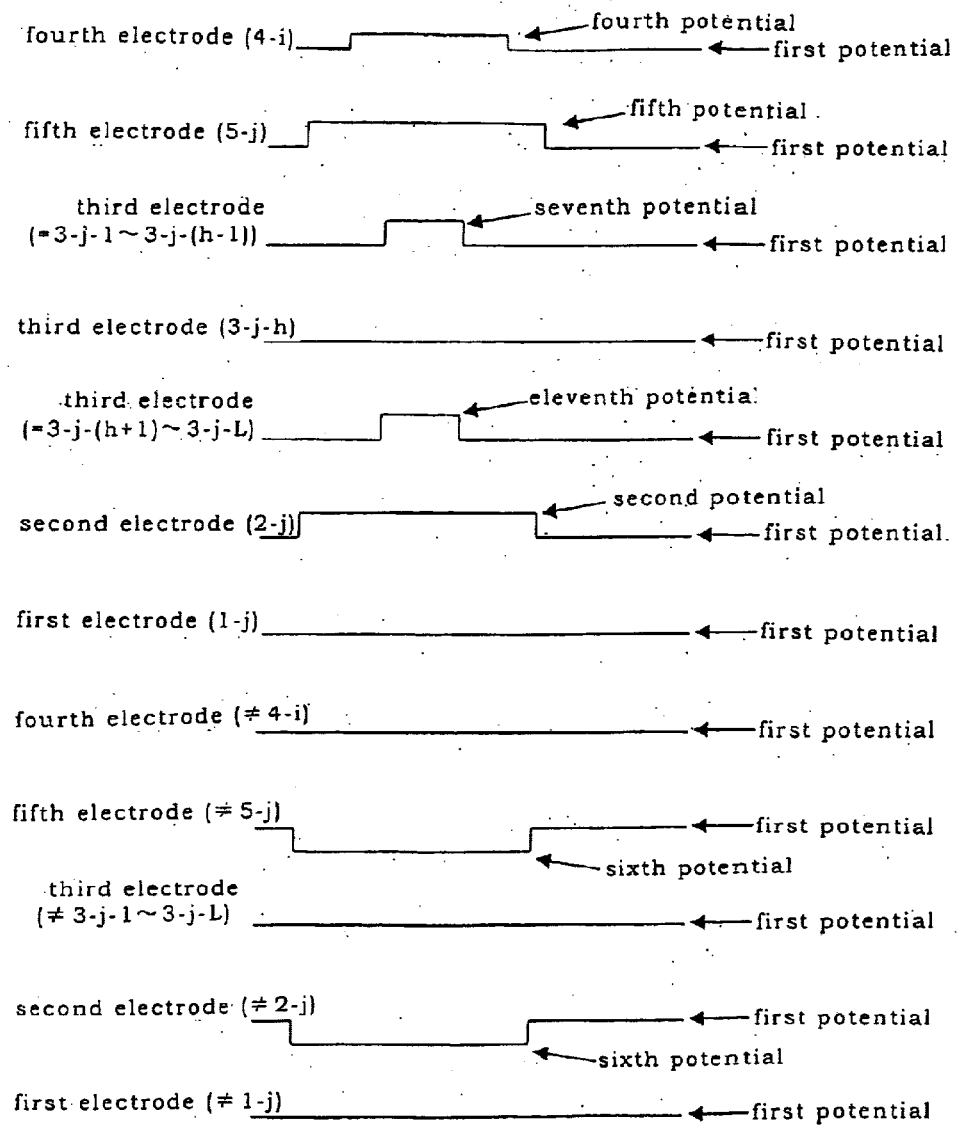

FIG. 76 shows another timing chart of reading operation in the case where the first wires are arranged in parallel to the third wires. In FIG. 76, a ground potential is applied as the first potential, the thresholds of transistors having gate electrodes connected to the second wire and the fifth wire are 0.5 V, a writing state of a memory cell is defined as a threshold of, for example, 1.0 V to 3.5 V, and an erase state is defined as a threshold of −1.0 V or lower.

First, the ground potential as the first potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the sixth potential, e.g., −1 V, is applied to second wires (not 2-j) and fifth wires (not 5-j), the second potential, e.g., 3 V, is applied to the second wire (2-j), the fifth potential, e.g., 3 V is applied to the fifth wire (5-j), the fourth potential, e.g., 1 V, is applied to the fourth wire (4-i), the third potential, e.g., the ground potential is continuously applied to the third wiring (3-j-h) connected to the selected cell, the seventh potential, e.g., 5 V, is applied to third wires (3-j-1 to 3-j-(h-1)) connected to non-selected cells arranged in series with the selected cell, the eleventh potential, e.g., 5 V is applied to third wires (3-j-(h+1) to 3-j-L) connected to non-selected cells arranged in series with the selected cell, and the twelfth potential is applied to third wires (not 3-j-1 to 3-j-L) connected to non-selected cells not arranged in series with the selected cell. The current flowing through the fourth wire (4-i) or the first wire (1-j) is sensed.

The third wires (not 3-j-h) other than the third wire (3-j-h), the fourth wire (4-i), the second wire (2-j), the fifth wire (5-j), the second wires (not 2-j), and the fifth wires (not 5-j) are reset to the ground potential. The timings of applying the potentials to the respective electrodes and the timings of resetting the electrodes to the ground potential may be simultaneous. The second and fifth potentials may be different from each other. The eleventh and seventh potential may be different from each other.

Although it is preferable to initially apply the first potential as the same potential to the first wires (1-1 to 1-N), the second wires (2-1 to 2-N), the third wires (3-1-1 to 3-N-L), the fourth wires (4-1 to 4-M) and the fifth wires (5-1 to 5-N), different potentials may be applied. The third potential may be continuously applied to the third wire (3-j-h). The sixth potential may be the ground potential.

In the above, the reading method has been described with respect to the case where the selected cell is a memory cell having the third wire (3-j-h) as the gate electrode. The reading method is the same with respect to the case where the selected cell is a memory cell having a third wire other than the third wire (3-j-h) as the gate electrode.

Figure 77:
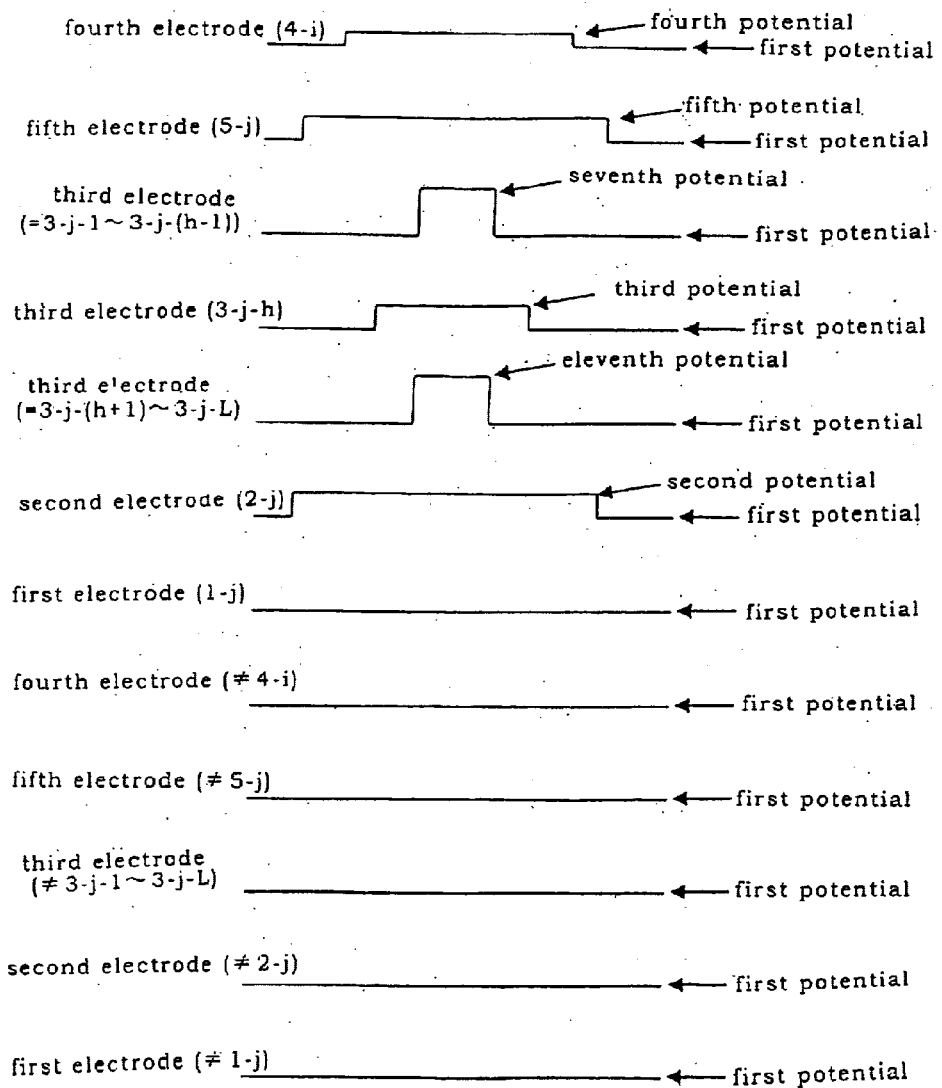

FIG. 77 shows a timing chart of reading operation in the case where the first wires are arranged in parallel to the fourth wires. In FIG. 77, a ground potential is applied as the first potential, the thresholds of transistors having gate electrodes connected to the second wire and the fifth wire are 0.5 V, a writing state of a memory cell is defined as a threshold of 5.0 V to 7.5 V, and an erase state is defined as a threshold of 0.5 V to 3.0 V.

FIG. 77 corresponds to FIG. 75 except that a first wire (1-i) in place of the first wire (1-j) is connected to the end portion of the island-like semiconductor layer including the selected cell.

Figure 78:
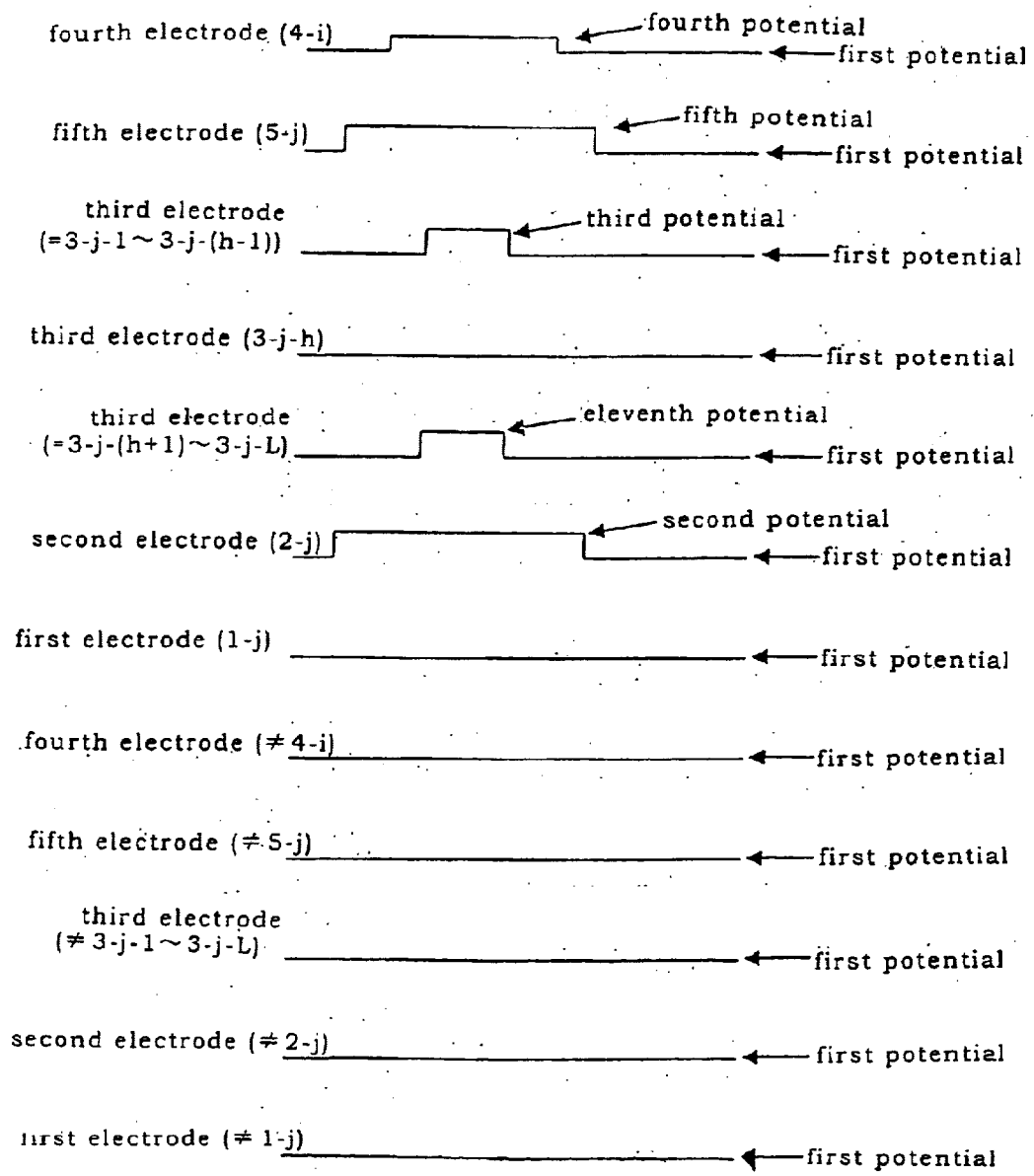

FIG. 78 shows a timing chart of another reading operation in the case where the first wires are arranged in parallel with the fourth wires. In FIG. 78, a ground potential is applied as the first potential, the thresholds of transistors having gate electrodes connected to the second wire and the fifth wire are 0.5 V, a memory cell writing state is defined as a threshold of 1.0 V to 3.5 V, and an erase state is defined as a threshold of −1.0 V or lower.

FIG. 78 corresponds to FIG. 76 except that a first wiring (1-j) in place of the first wiring (1-i) is connected to the end portion of the island-like semiconductor layer including the selected cell and the sixth potential is used as the first potential. The sixth potential is not necessarily the same as the first potential.

Figure 79:
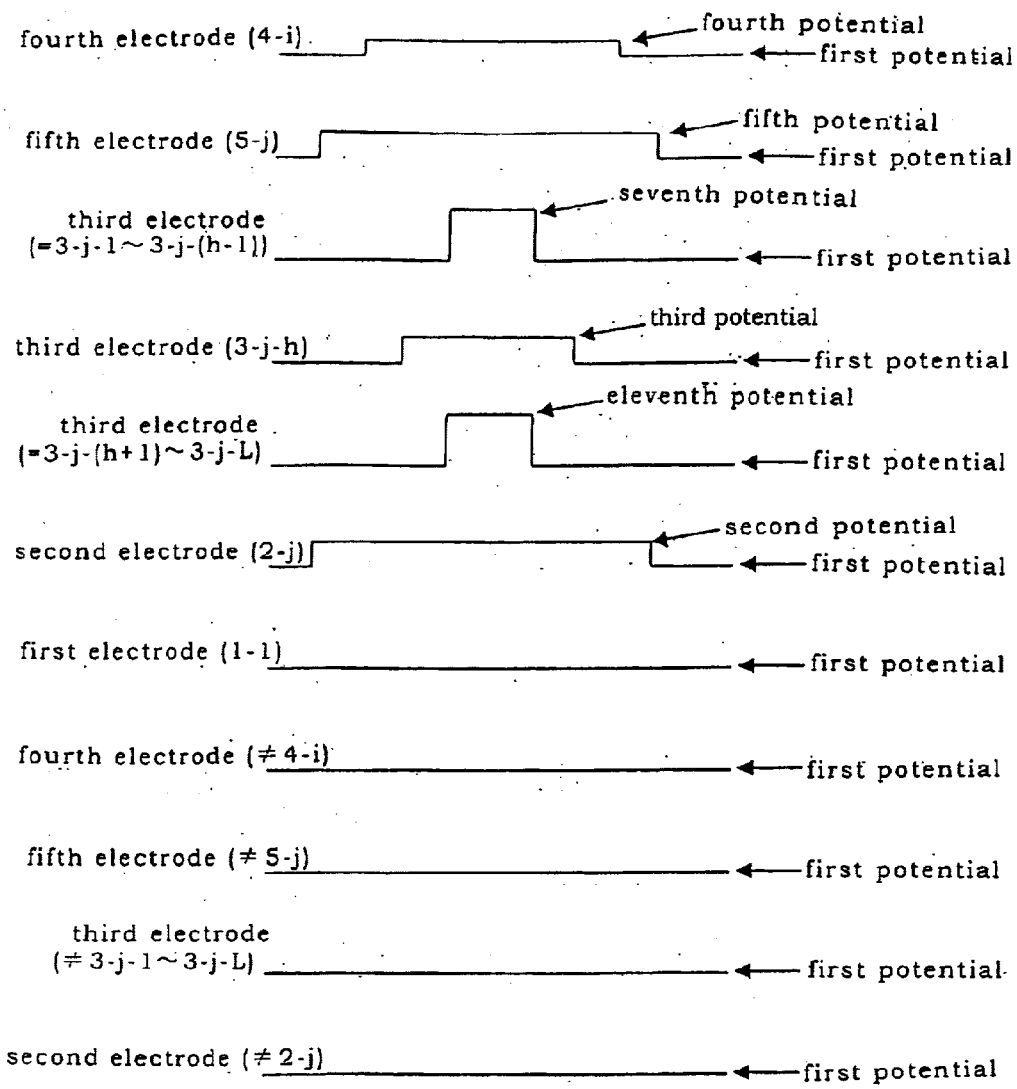

FIG. 79 shows a timing chart of reading operation in the case where the first wires are connected in common to the entire array. FIG. 79 shows an example of timings of potentials in reading operation in the case where a ground potential is applied as the first potential, the thresholds of transistors having gate electrodes connected to the second wire and the fifth wire are 0.5 V, the writing state of the memory cell is defined as a threshold of 5.0 V to 7.5 V of the memory cell, and the erase state is defined as a threshold of 0.5 to 3.0 V.

FIG. 77 corresponds to FIG. 75 except that a first wire (1-1) in place of the first wiring (1-j) is connected to the end portion of the island-like semiconductor layer including the selected cell.

Figure 80:
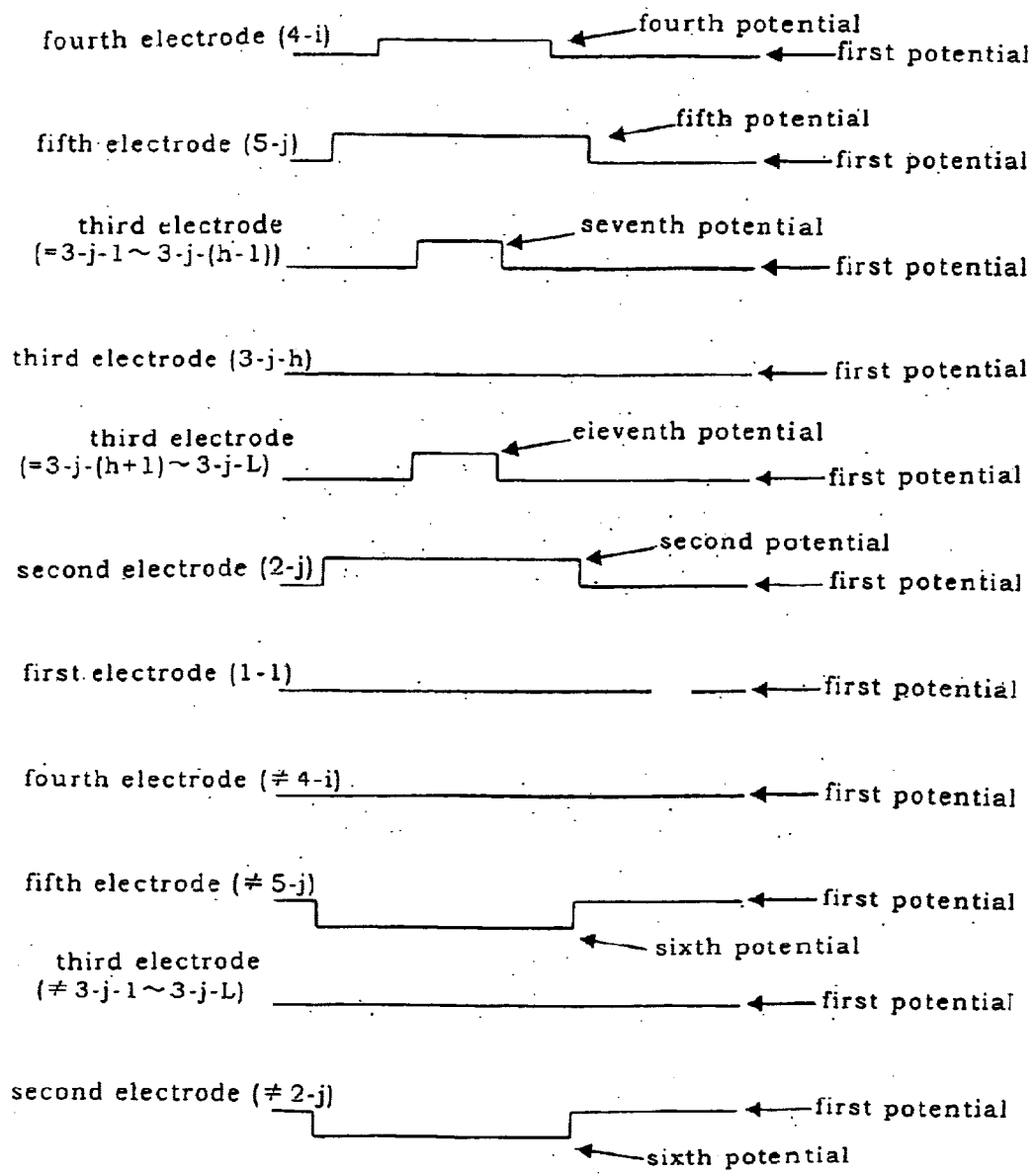

FIG. 80 shows a timing chart of another reading operation in the case where the first wires are connected in common to the entire array. FIG. 80 shows an example of timings of potentials applied in reading operation in the case where a ground potential is applied as the first potential, the thresholds of transistors having gate electrodes connected to the second wire and the fifth wire are 0.5 V, and the memory cell has a threshold of 1.0 V to 3.5 V when it is in the written state and has a threshold of −1.0 V or lower when it is in the erased state.

FIG. 80 corresponds to FIG. 76 except that a first wiring (1-1) in place of the first wiring (1-j) is connected to the end portion of the island-like semiconductor layer including the selected cell.

A writing method using a Fowler-Nordheim tunneling current (hereinbelow, referred to as F-N current) of a semiconductor memory device will be described hereinbelow. The semiconductor memory device has island-like semiconductor layers each of which includes, as selection gate transistors, a transistor having the second electrode as a gate electrode and a transistor having the fifth electrode as a gate electrode, and L (L: a positive integer) pieces of memory cells provided with a charge storage layer and the third electrode as a control gate electrode and connected in series.

FIG. 61 shows an equivalent circuit of the above-described memory cell structure.

In the case where the island-like semiconductor layers are formed of a P-type semiconductor, a selected cell shown in FIG. 61 is written by applying a first potential to the first electrode 10 of an island-like semiconductor layer including the selected cell, the second potential to a second electrode 20 arranged in series with the selected cell, a third potential to the third electrode (30-h) (h is an positive integer, $1 \leq h \leq L$) connected to the selected cell, a seventh potential to the third electrodes (3-j-1 to 3-j-(h−1)) connected to non-selected cells arranged in series with the selected cell, an eleventh potential to the third electrodes (3-j-(h+1) to 3-j-L), a fourth potential to the fourth electrode 40 of the island-like semiconductor layer including the selected cell, and a fifth potential to the fifth electrode 50 arranged in series with the selected cell. The application of these potentials generates the F-N current only in the tunnel oxide film of the selected cell and changes the state of the charge in the charge storage layer.

If "1" is written by storing a negative charge in the charge storage layer, the third potential is larger than the fourth potential. If "1" is written by drawing a negative charge from the charge storage layer, i.e., by storing a positive charge, the third potential is smaller than the fourth potential. Thereby "0" or "1" can be set by utilizing a change in the state of the charge in the charge storage layer. At this time, the third potential is used in such a manner that "1" can be written according to the difference between the third and fourth potentials. Specifically, the third potential is a potential allowing generation of a sufficient F-N current serving as means of changing the state of a charge flowing in the tunnel oxide film of the memory transistor having, as the gate electrode, third electrode to which the third potential is applied in accordance with the difference between the third and fourth potentials.

The seventh potential is a potential always allowing a cell current to flow through the memory cell regardless of the state of the charge stored in the charge storage layer, i.e., a potential allowing the formation of an inversion layer in the channel region of the memory cell, and not fluctuating the charge by the F-N current flowing the tunnel oxide film.

If "1" is written by storing electrons in the charge storage layer, the seventh potential is a potential which is not less than the threshold of memory transistors having as gate electrodes the third electrodes connected to the third electrodes (3-j-1 to 3-j-(h−1)) and sufficiently reduces the F-N current flowing in the tunnel oxide film of the memory transistors having as gate electrodes the third electrodes to which the seventh potential is applied.

The eleventh potential may be a potential which sufficiently reduces the F-N current flowing in the tunnel oxide film of the memory transistors having as gate electrodes the third electrodes to which the eleventh potential is applied.

The second potential is a potential not allowing the cell current to flow, for example, a potential not higher than the threshold of a transistor having, as a gate electrode, the second electrode 20 to which the second potential is applied.

The fifth potential may be a potential allowing the cell current to flow, for example, a potential not lower than the threshold of a transistor having, as a gate electrode, the fifth electrode 50 to which the fifth potential is applied.

The first electrode 10 may be in an open state.

In the case where the channel region of a memory cell is electrically connected to the semiconductor substrate, specifically, in the case where the island-like semiconductor layer is not floated from the semiconductor substrate by an impurity diffusion layer, all memory cells having the third electrodes to which the third potential is applied can also be written at the same time if the tenth potential applied to the semiconductor substrate is a potential such that "1" is written according to the difference between the third potential and the tenth potential, for example, a potential such that a sufficiently large F-N current flows according to the difference between the third potential and the tenth potential. The F-N current flows in the tunnel oxide film of the memory transistor having, as the gate electrode, the third electrode to which the third potential is applied.

In the case where the first electrode is formed as an impurity diffusion layer in the semiconductor substrate and the tenth potential applied to the semiconductor substrate is the ground potential, the first potential is generally the ground potential.

In the case where the first electrode is electrically insulated from the semiconductor substrate, specifically, in the case where the first electrode is formed of an impurity diffusion layer on an SOI substrate and is insulated from the semiconductor substrate by an insulating film, the first potential is not necessarily the same as the tenth potential.

Memory cells may be sequentially written from a memory cell connected to the third electrode (30-L) to a memory cell connected to the third electrode (30-1), or may be written in reverse order or at random.

Further, some or all memory cells connected to the third electrode (30-h) and some or all memory cells connected to the third electrodes (30-1 to 30-L) may be written at the same time.

In the invention, "0" may be written by changing the state of the charge in the charge storage layer and "1" may be written by not changing the state of the charge. Further, "0"

may be written by slightly changing the state of the charge in the charge storage layer and the "1" may be written by greatly changing the state of the charge, and vice versa. Furthermore, "0" may be written by changing the state of the charge in the charge storage layer to be negative and "1" may be written by changing the state of the charge to be positive, and vice versa. The above-mentioned definitions of "0" and "1" may be combined. The F-N current is not the only means for changing the state of the charge in the charge storage layer. This rule is applied to all of the embodiments of the invention.

A timing chart of the voltages in the writing operation of L (L: a positive integer) pieces of memory cells which are formed of a P-type semiconductor and connected in series will be described hereinbelow.

Figure 81:
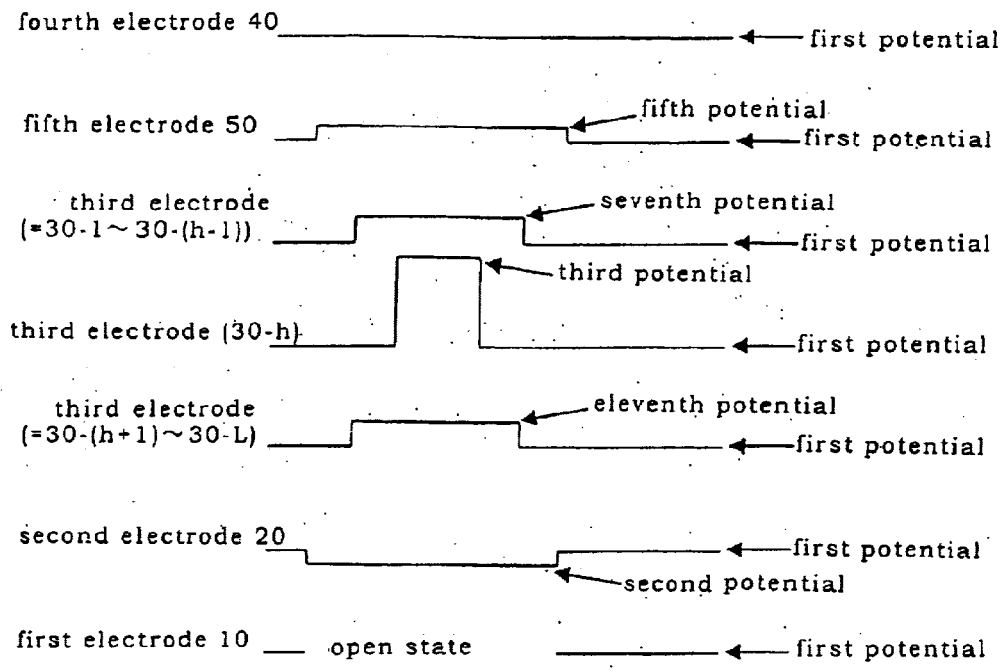

FIG. 81 shows timings of potentials to be applied to the electrodes in writing operation in the case where the first electrode is open, the thresholds of transistors having gate electrodes connected to the second electrode and the fifth electrode are 0.5 V, and the memory cell-has a threshold of 1.0 V to 3.5 V when it is in the written state and has a threshold of −1.0 V or lower when it is in the erased state.

If "1" is written by storing a negative charge in the charge storage layer, the ground potential as the first potential is first applied to the first electrode 10, the second electrode 20, the third electrodes (30-1 to 30-L), the fourth electrode 40 and the fifth electrode 50. In this state, the first electrode 10 is opened. The second potential, e.g., −1 V, is applied to the second electrode 20, and the fifth potential, e.g., 1 V, is applied to the fifth electrode 50. The ground potential is continuously applied as the fourth potential to the fourth electrode 40. The seventh potential, e.g., 10 V, is applied to third electrodes (30-1 to 30-(h−1)) (h is a positive integer satisfying the relation of 1≦h≦L), the eleventh potential, e.g., 10 V, is applied to third electrodes (30-(h+1) to 30-L) (h is a positive integer satisfying the relation of 1≦h≦L), and the third potential, e.g., 20 V, is applied to the third electrode (30-h). This state is maintained for a desired period of time to write "1".

After that, the third electrode (30-h), the third electrodes (not 30-h), the second electrode 20, the fifth electrode 50, and the first electrode 10 are reset to the ground potential. The timings of applying the potentials to the respective electrodes and the timings of resetting the potentials to the ground potential may be simultaneous. The potentials to be applied may be any combination of potentials so long as they satisfy conditions for writing "1" in a desired cell.

Although it is preferable to initially apply the same potential as the first potential to the first electrode 10, the second electrode 20, the third electrode 30-h, the fourth electrode 40 and the fifth electrode 50, different potentials may be applied.

In the above, the writing method has been described with respect to the case where the selected cell is a memory cell having the third electrode (30-h) as the gate electrode. The writing method is the same with respect to the case where the selected cell is a memory cell having a third electrode other than the third electrode (30-h) as the gate electrode.

Figure 82:
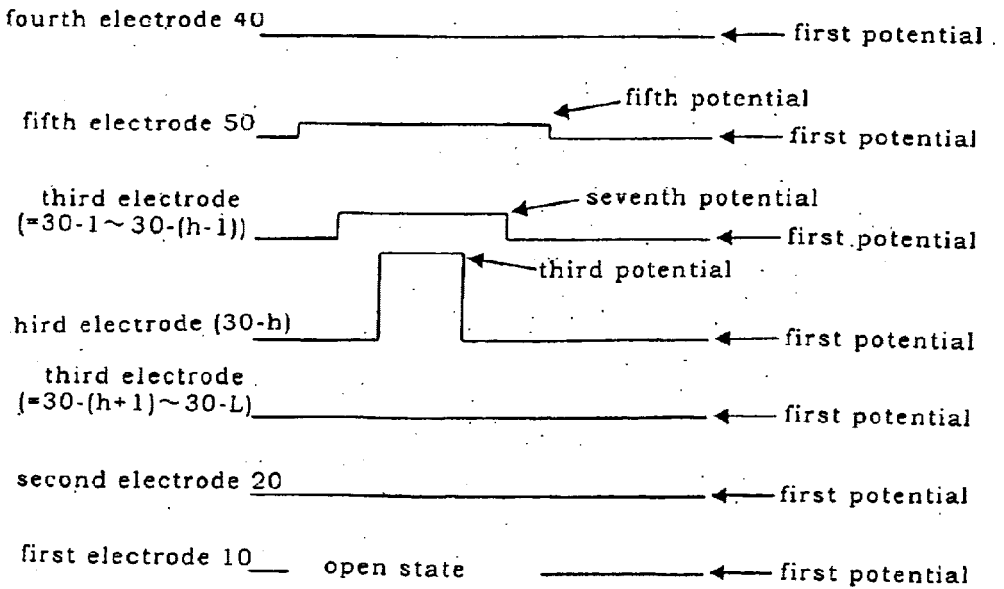

FIG. 82 shows a timing chart for writing data in the case where the eleventh potential is the ground potential. The writing operation of the selected cell is not affected by application of the ground potential as the eleventh potential to the third electrodes (30-(h+1) to 30-L) (h: a positive integer satisfying the relation of 1≦h≦L). The writing operation corresponds to that of FIG. 81.

Figure 83:
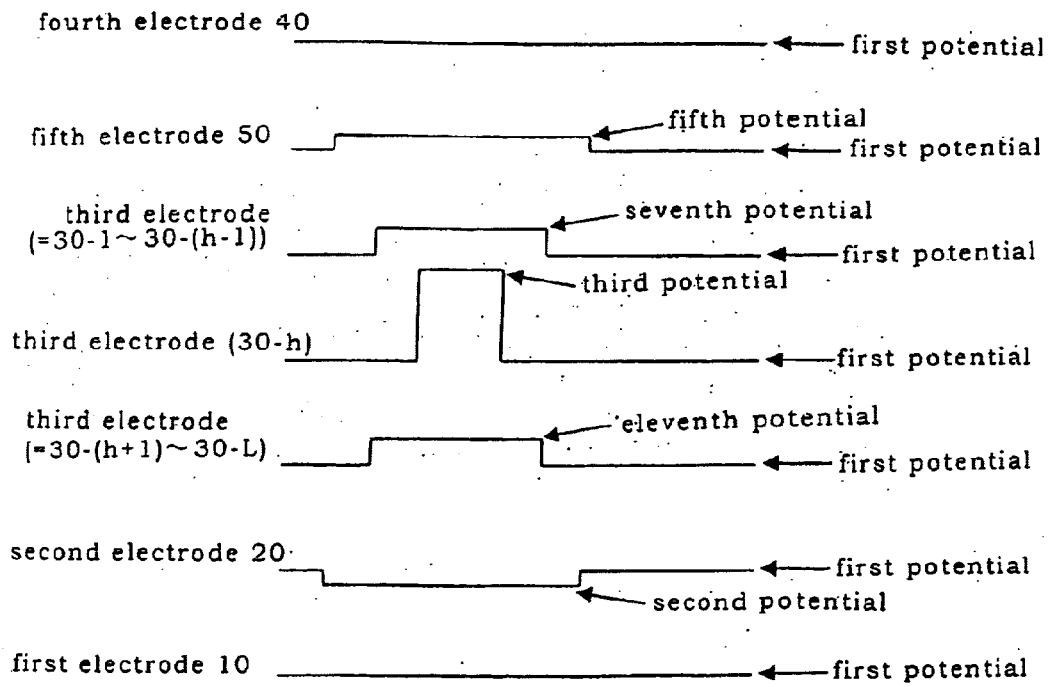

FIG. 83 shows a timing chart for writing data in the case where the first potential is the ground potential. When the second potential is equal to or lower than the threshold of the transistor having the second electrode 20 as the gate electrode, the operation of writing data to the selected cell is not affected by the application of the ground potential to the first electrode 10. The writing operation conforms to that of FIG. 81.

Figure 84:
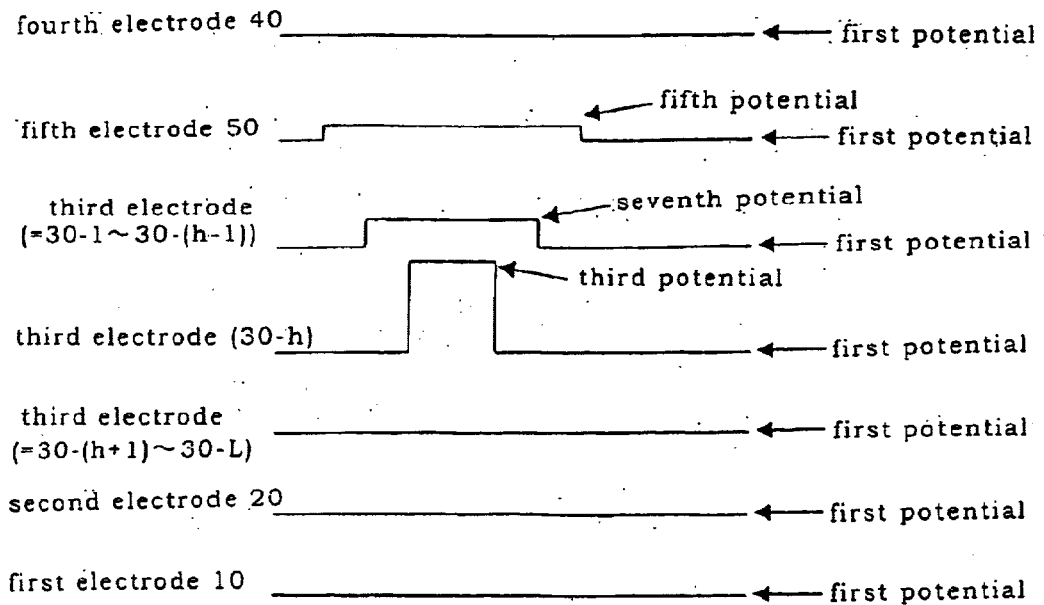

FIG. 84 shows a timing chart for writing data in the case where the first potential is the ground potential. When the second potential is equal to or lower than the threshold of the transistor having the second electrode 20 as the gate electrode, the operation of writing data to the selected cell is not affected by the application of the ground potential to the first electrode 10. The writing operation conforms to that of FIG. 82.

Figure 114:
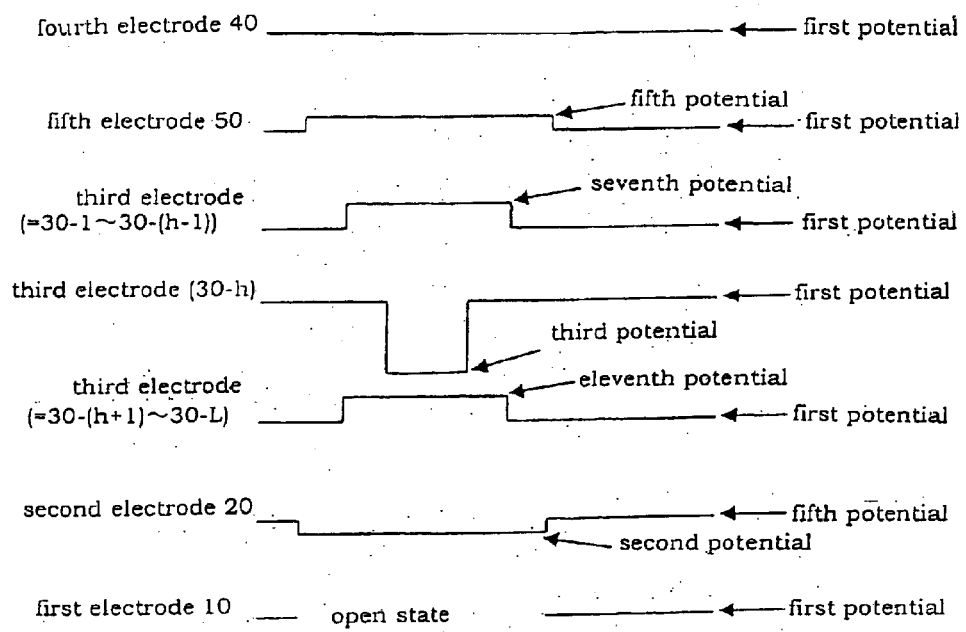

FIG. 114 shows a timing chart of operation of writing "0" by drawing a negative charge from the charge storage layer by applying −20 V as the third potential to the third electrode (30-h). The writing operation conforms to that of FIG. 81 except that the polarity of the third potential is different.

Figure 115:
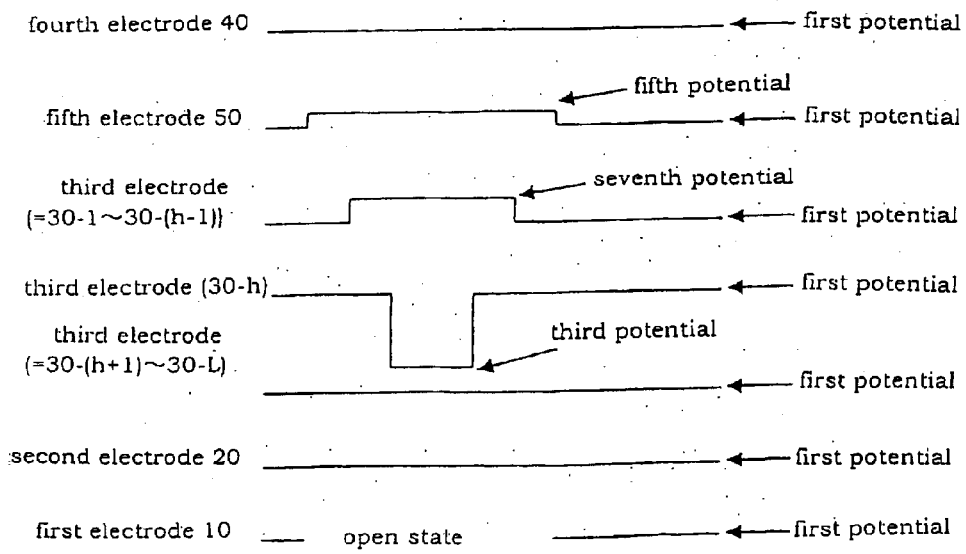

FIG. 115 shows another timing chart of operation of writing "0" by drawing a negative charge from the charge storage layer by applying −20 V as the third potential to the third electrode (30-h). The writing operation conforms to that of FIG. 82 except that the polarity of the third potential is different.

Figure 116:
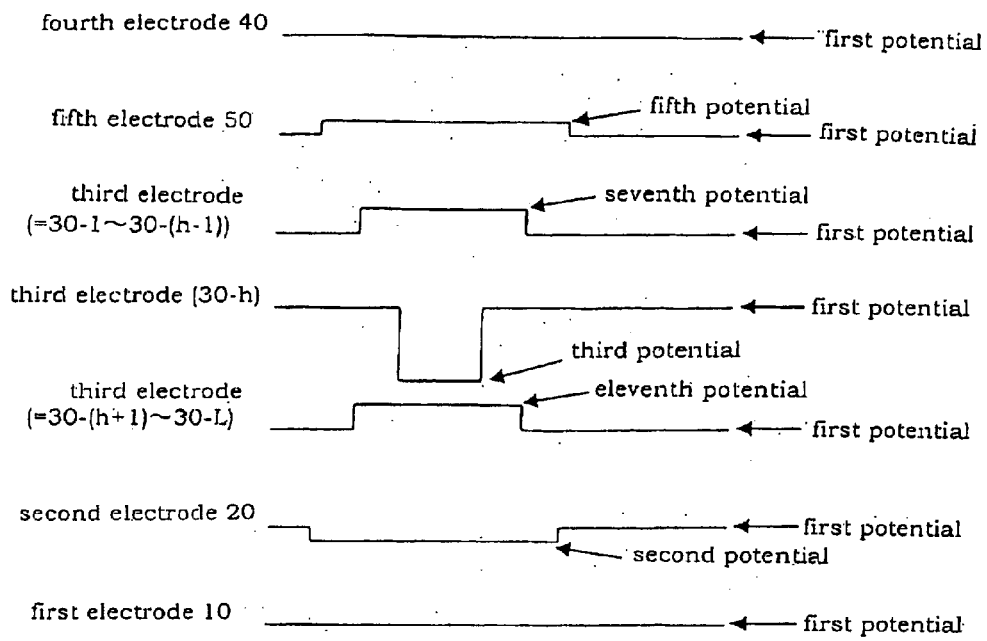

FIG. 116 shows a timing chart of operation of writing "0" by drawing a negative charge from the charge storage layer by applying −20 V as the third potential to the third electrode (30-h). The writing operation conforms to that of FIG. 83 except that the polarity of the third potential is different.

Figure 117:
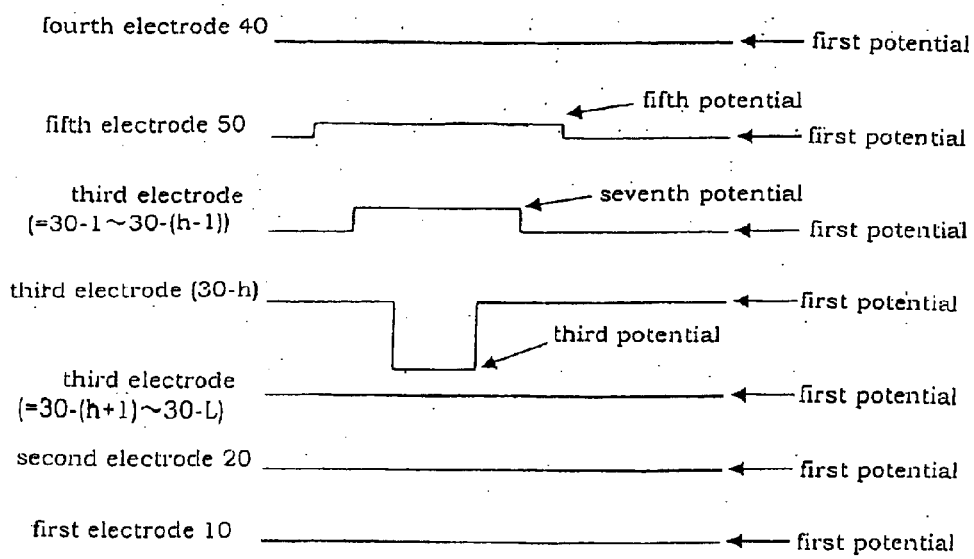
Figure 118:
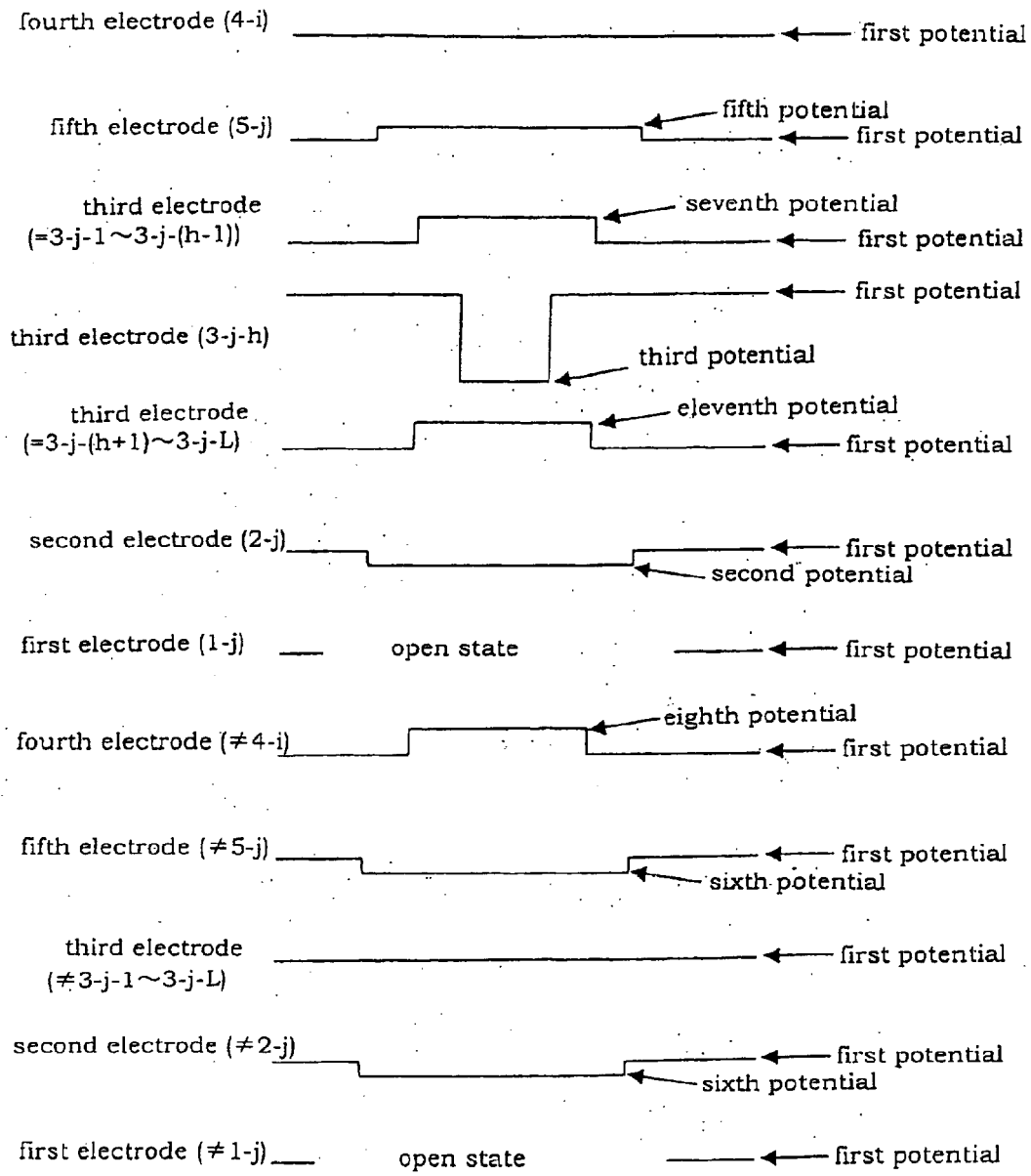
Figure 119:
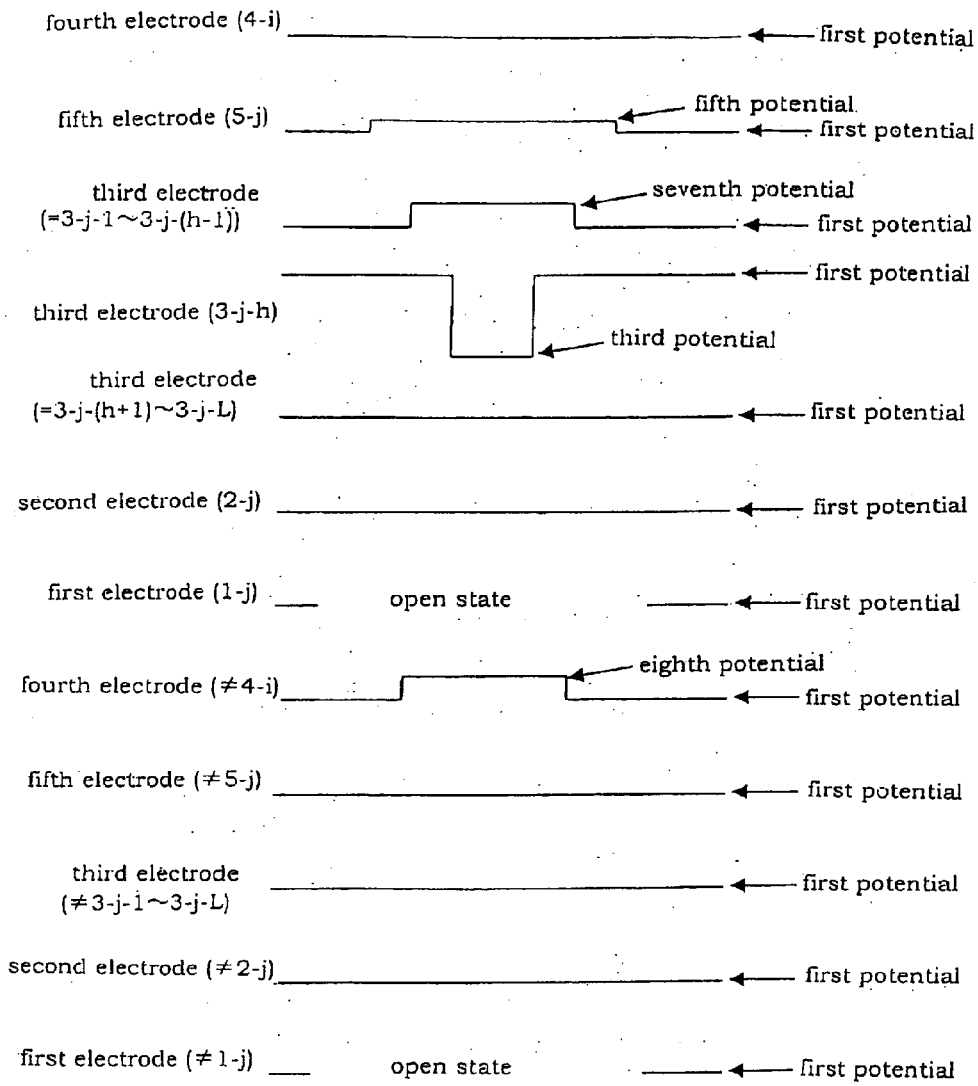
Figure 120:
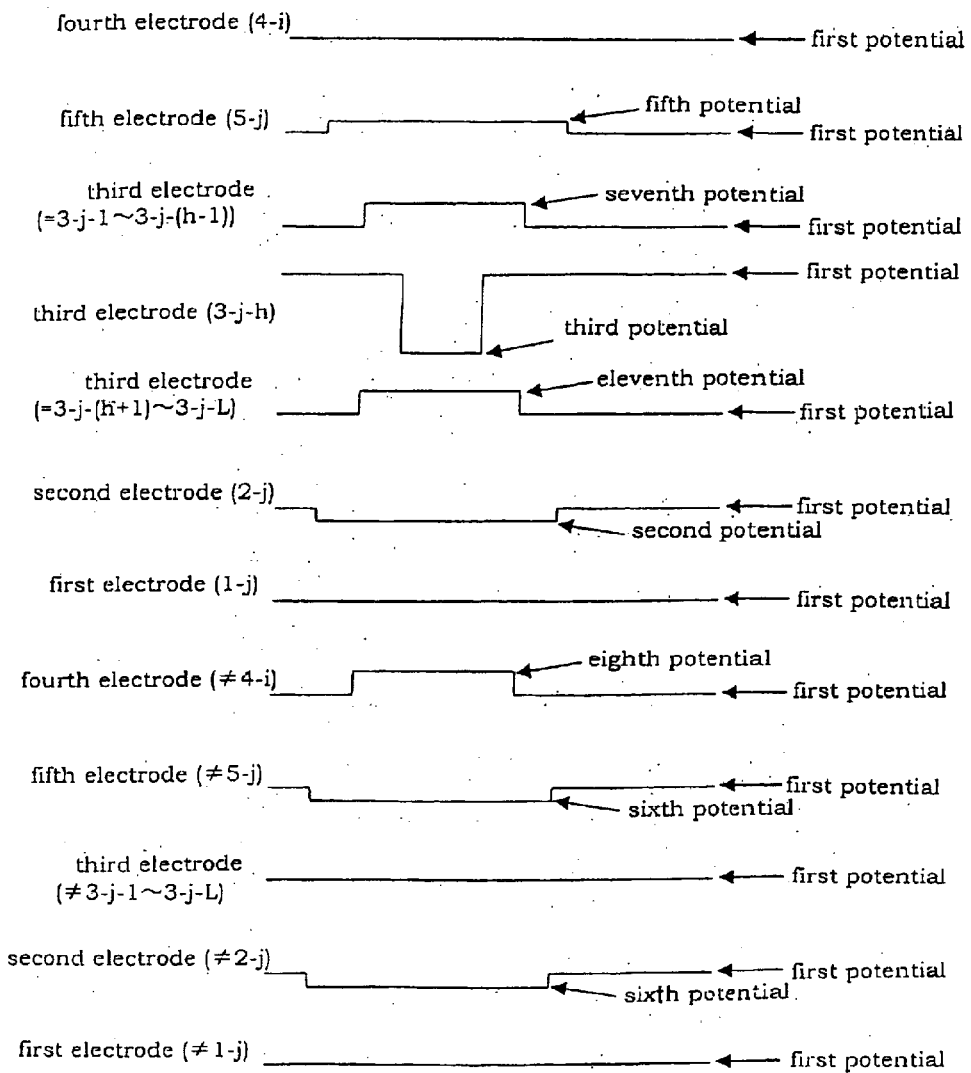
Figure 121:
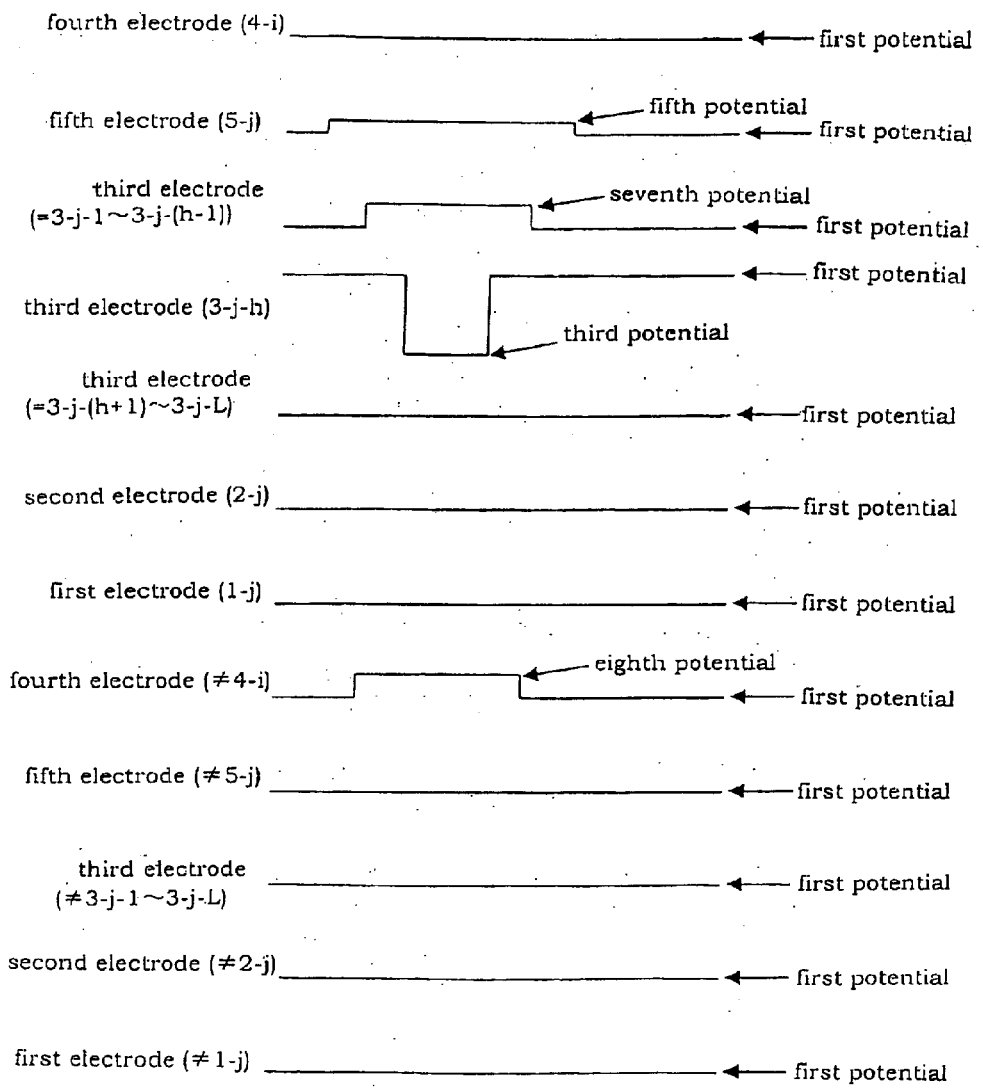
Figure 122:
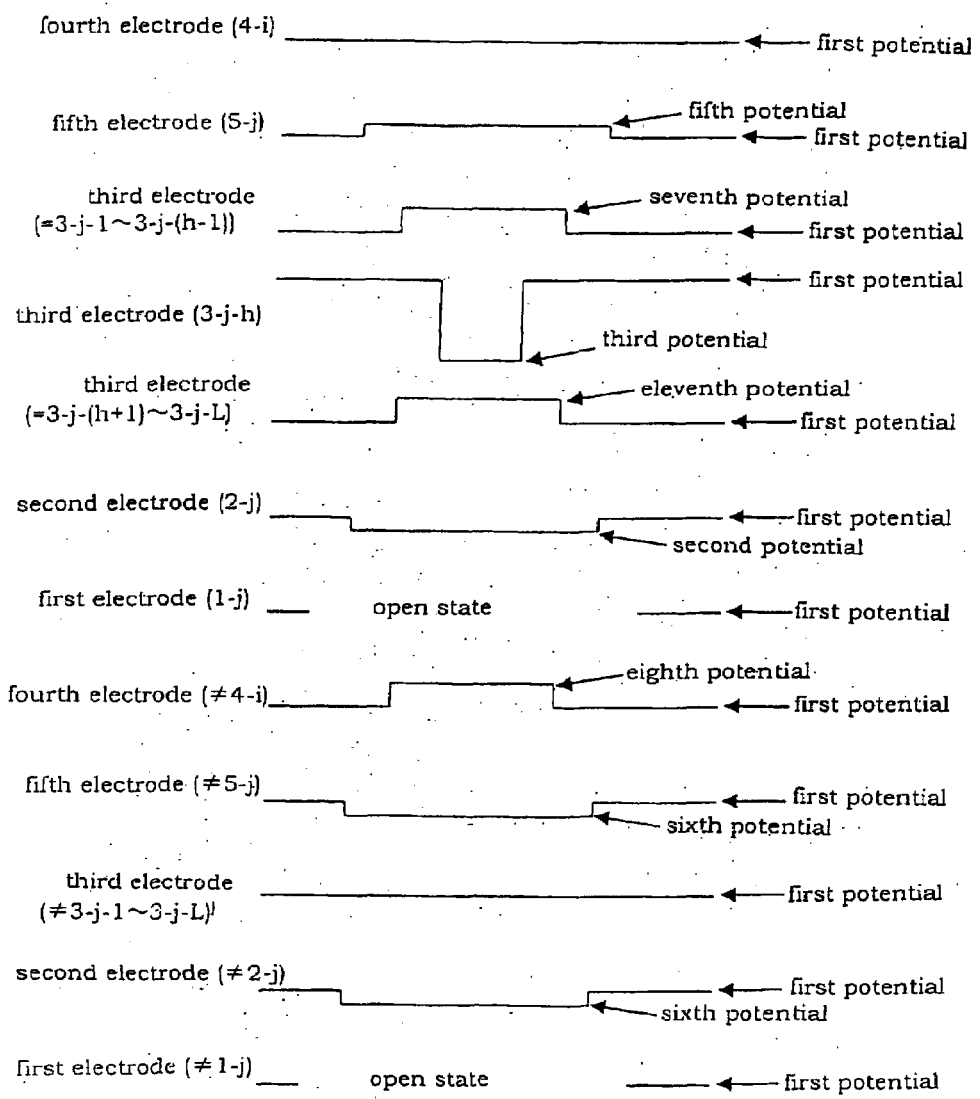
Figure 123:
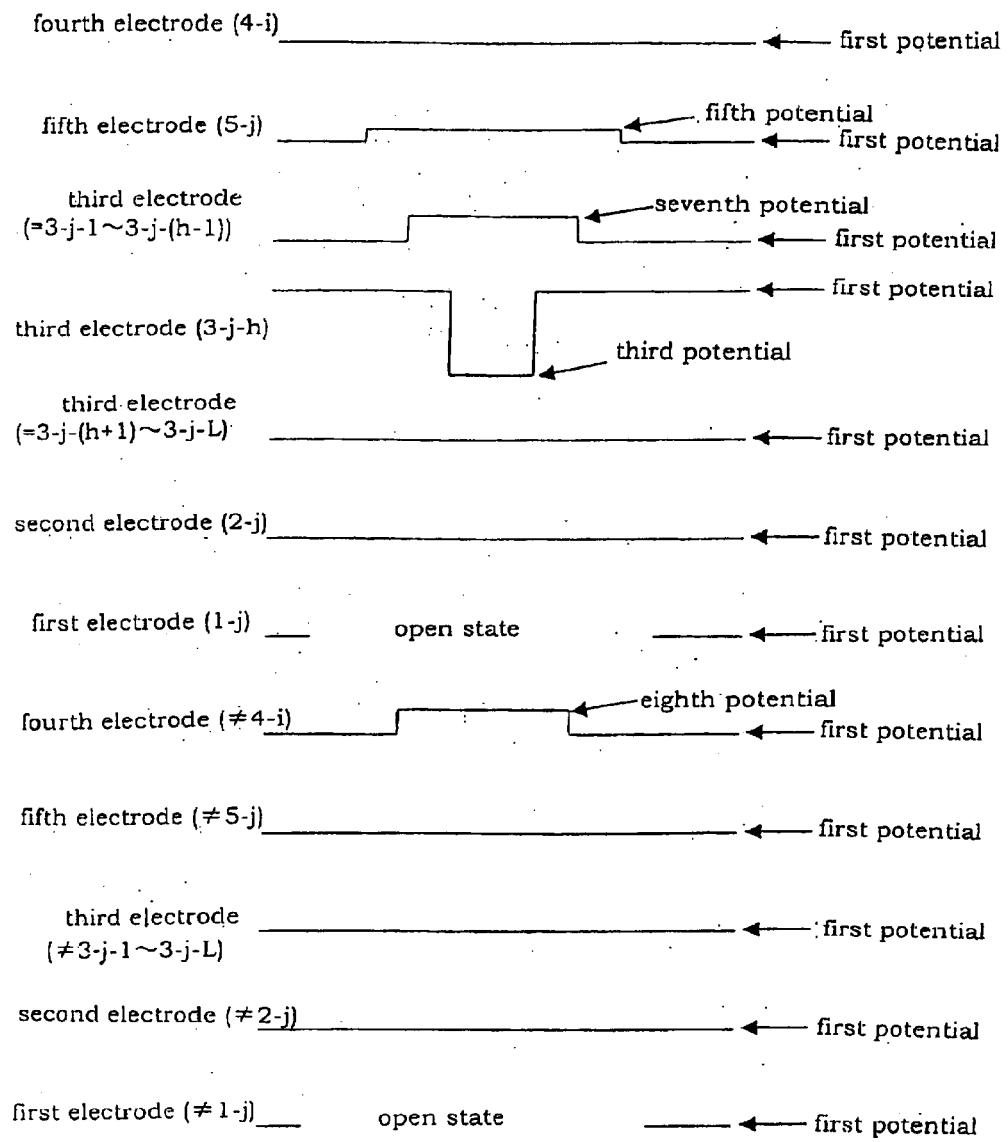
Figure 124:
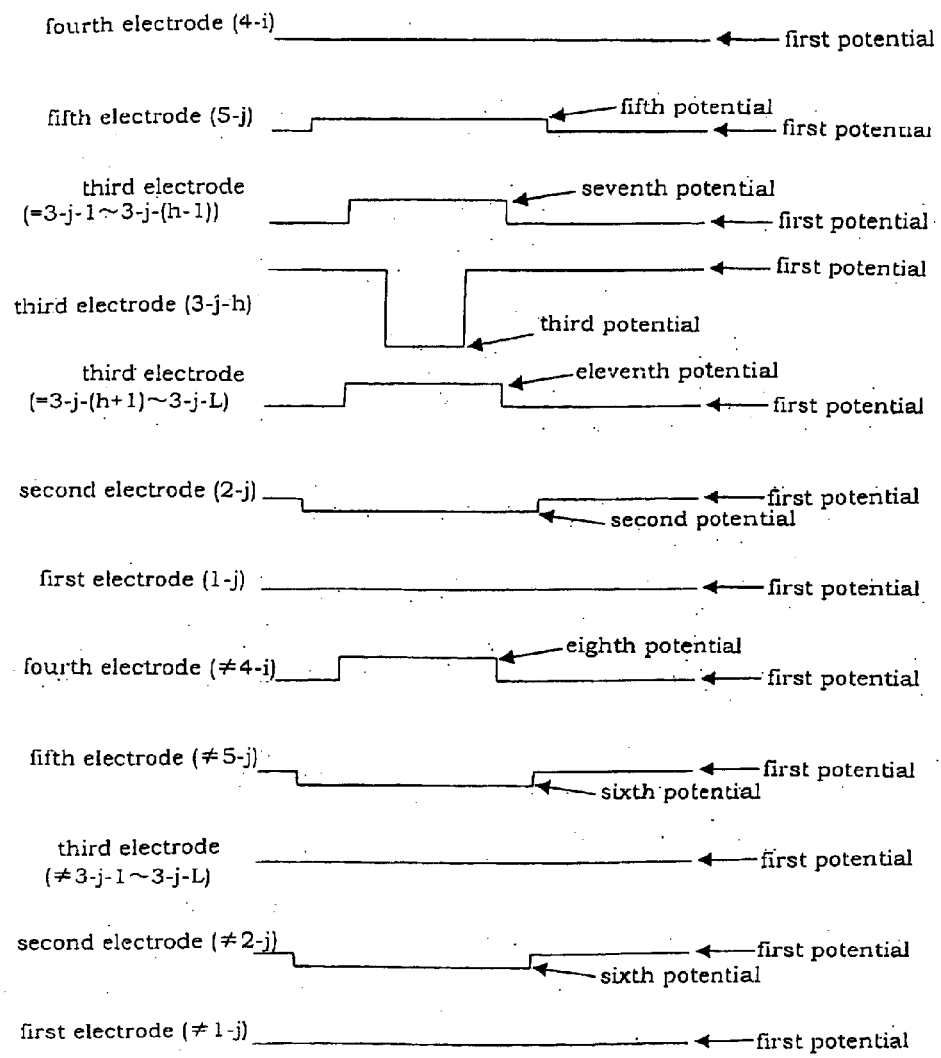
Figure 125:
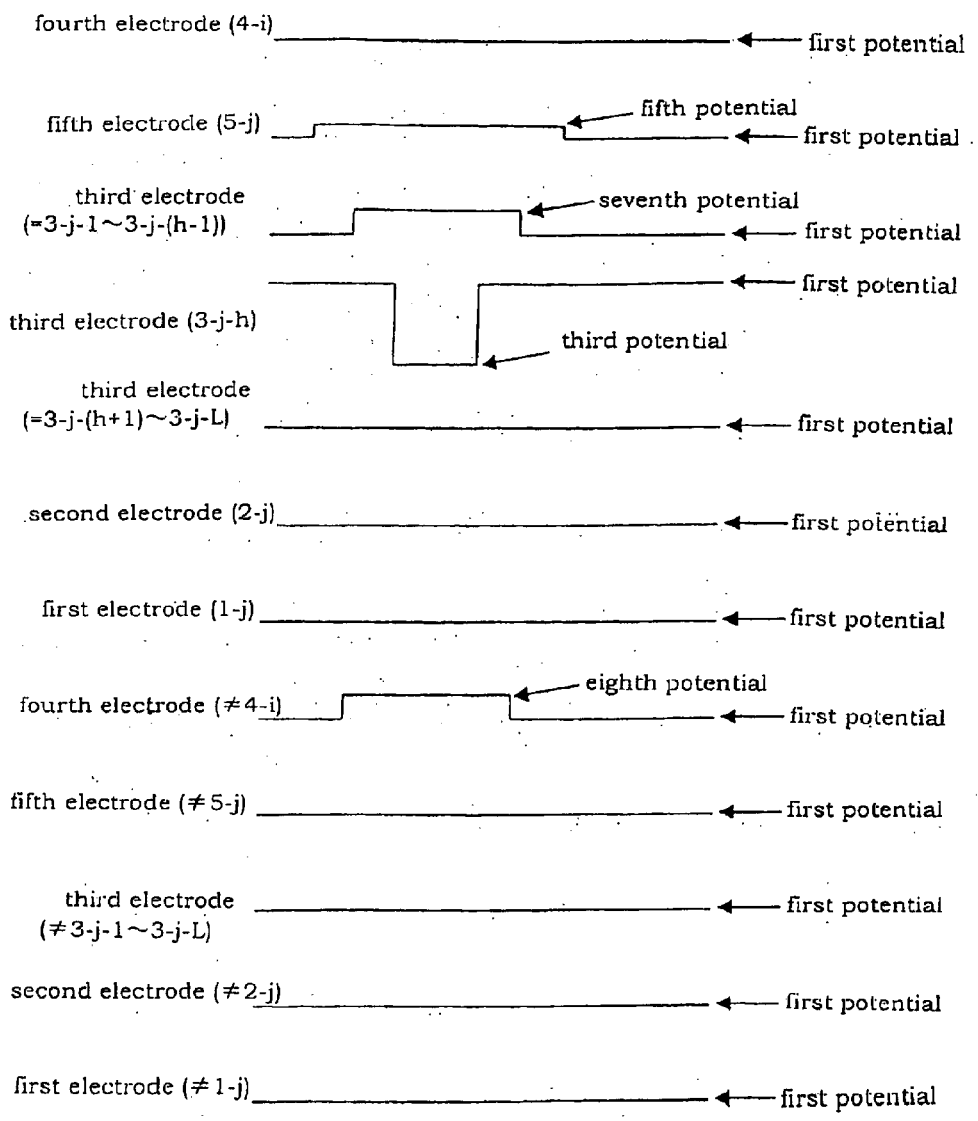
Figure 126:
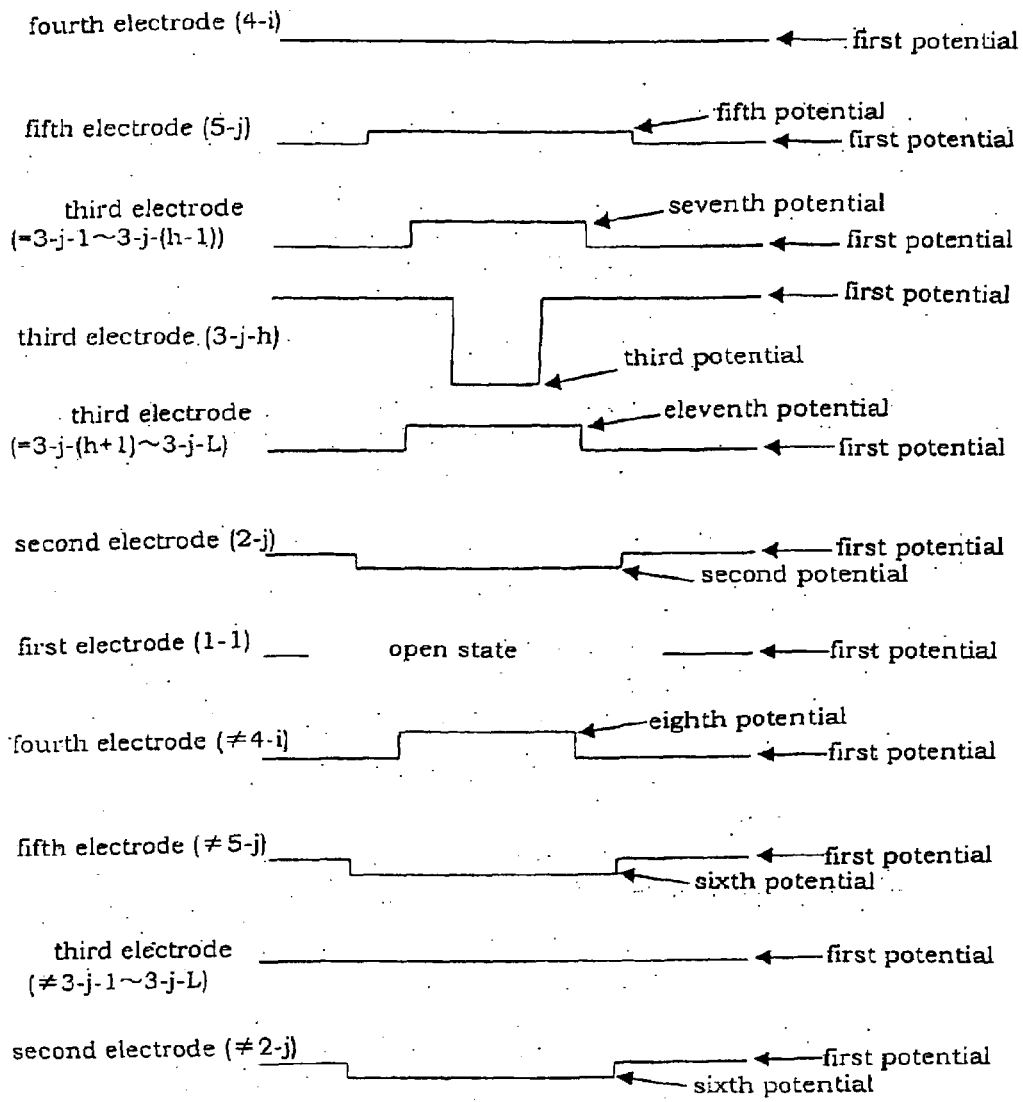
Figure 127:
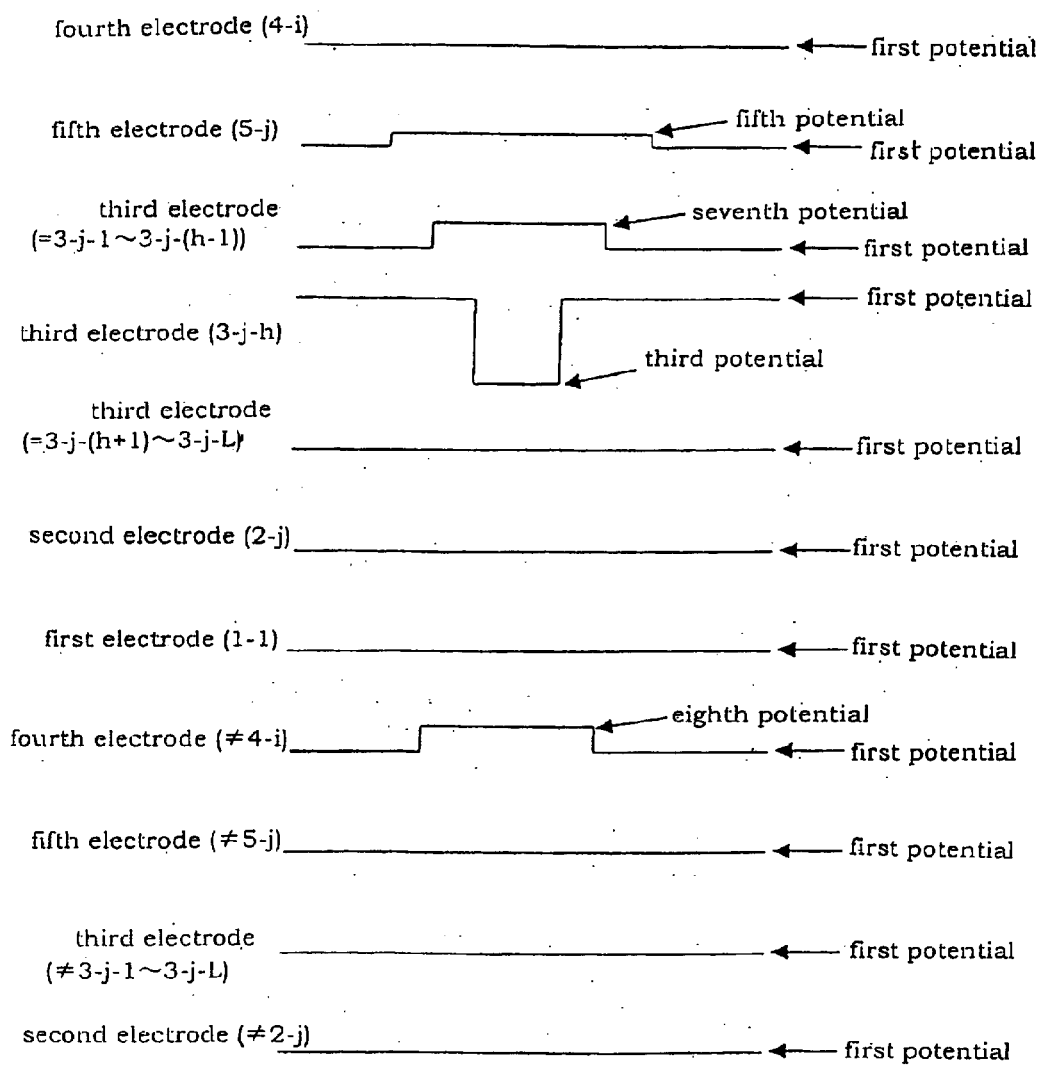
Figure 128:
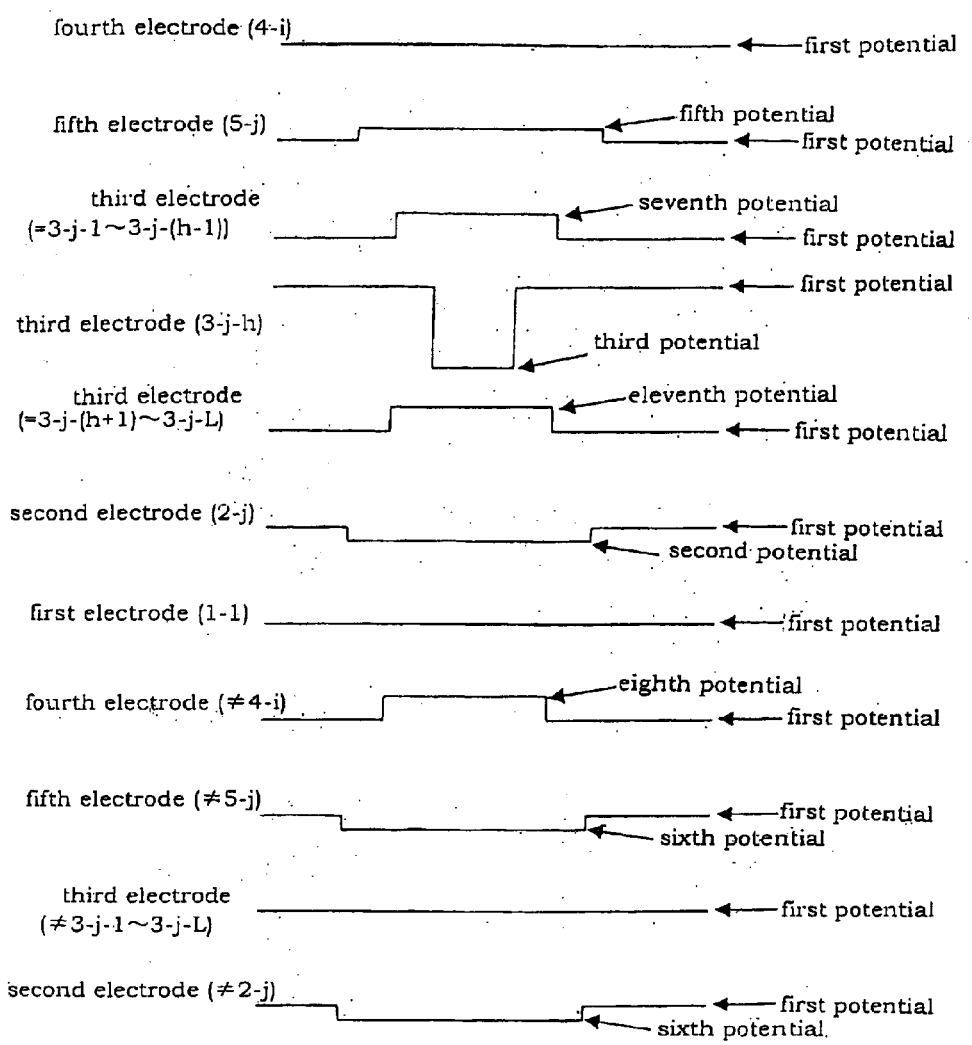
Figure 129:
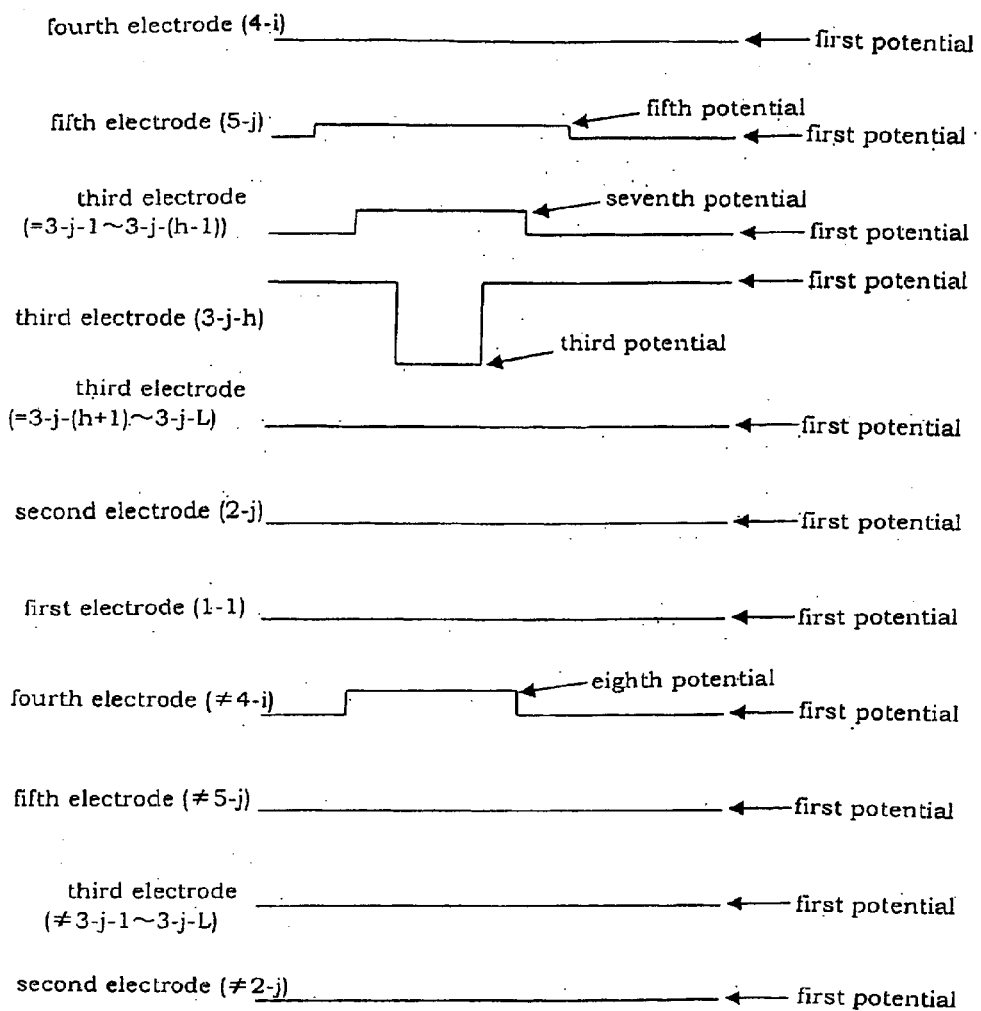

FIG. 117 shows a timing chart of operation of writing "0" by drawing a negative charge from the charge storage layer by applying −20 V as the third potential to the third electrode (30-h). The writing operation conforms to that of FIG. 84 except that the polarity of the third potential is different.

A writing method using the F-N current of a semiconductor memory device will now be described. The semiconductor memory device includes M×N (M and N are positive integers) island-like semiconductor layers each having, as selection gate transistors, a transistor provided with the second electrode as a gate electrode and a transistor provide with the fifth electrode as a gate electrode and L (L is a positive integer) memory cells provided with the charge storage layer and the third electrode as a control gate electrode connected in series between the selection gate transistors. In this memory cell array, M pieces of fourth wires arranged in parallel with the semiconductor substrate are connected to ends of the island-like semiconductor layers, and first wires are connected to opposite ends of the island-like semiconductor layers. N×L pieces of third wires disposed in parallel with the semiconductor substrate and in a direction crossing the fourth wires are connected to the third electrodes of the memory cells. FIG. 63 shows an equivalent circuit of the memory cell array in which the first wires are arranged in parallel to the third wires.

In the case where the island-like semiconductor layers are formed of a P-type semiconductor, a selected cell shown in FIG. 63 is written by applying a first potential to a first wire (1-j) (j: a positive integer satisfying the relation of 1≦j≦N) connected to a first electrode in the island-like semiconductor layer including the selected cell, a ninth potential to first wires (not 1-j) other than the first wire (1-j), a second potential to a second wire (2-j) connected to a second electrode arranged in series with the selected cell, a third potential to a third wire (3-j-h) (h: a positive integer satisfying the relation of 1≦h≦L) connected to the selected cell, a seventh potential to third wires (3-j-1 to 3-j-(h−1)) connected to non-selected cells arranged in series with the selected cell, an eleventh potential to third wires (3-$j$-(h+1) to 3-$j$-L), a twelfth potential to other third wires (not 3-$j$-1 to 3-$j$-L), a fourth potential to a fourth wire (4-$i$) ($i$: a positive integer satisfying the relation of 1≦$i$≦M) connected to the fourth electrode of the island-like semiconductor layer including the selected cell, an eighth potential to fourth wires (not 4-$i$) other than the fourth wire (4-$i$), a fifth potential to a fifth wire (5-$j$) connected to a fifth electrode arranged in series with the selected cell, and a sixth potential to second wires (not 2-$j$) other than the second wire (2-$j$) or fifth wires (not 5-$j$) other than the fifth wire (5-$j$). The application of these voltages generates the F-N current only in the tunnel oxide film of the selected cell and can change the state of the charge in the charge storage layer.

If "1" is written by storing a negative charge in the charge storage layer, the third potential is larger than the fourth potential. If "1" is written by drawing a negative charge from the charge storage layer, i.e., by storing a positive charge, the third potential is smaller than the fourth potential. Thus, the "0" or "1" can be set by utilizing a change in the state of the charge in the charge storage layer.

At this time, the third potential is a potential such that "1" can be written by the difference between the third and fourth potentials. Specifically, the third potential is a potential allowing the generation of a sufficient F-N current flow in accordance with the difference between the third and fourth potentials. The F-N current flows in the tunnel oxide film of the memory transistor having, as the gate electrode, the third electrode to which the third potential is applied and serves as means for changing the state of the charge in the charge storage layer.

The seventh potential is a potential always allowing a cell current to flow through the memory cell regardless of the state of the charge stored in the charge storage layer, i.e., a potential allowing the formation of an inversion layer in the channel region of the memory cell, and not causing a change in the charge by the F-N current flowing the tunnel oxide film.

If "1" is written by storing electrons in the charge storage layer, the seventh potential is a potential which is not less than the threshold of memory transistors having as gate electrodes the third electrodes connected to the third wires (3-$j$-1 to 3-$j$-(h-1)) and sufficiently reduces the F-N current flowing the tunnel oxide film of the memory transistors having as gate electrodes the third electrodes to which the seventh potential is applied.

The eleventh potential may be a potential which sufficiently reduces the F-N current flowing in the tunnel oxide film of the memory transistors having as gate electrodes the third electrodes to which the eleventh potential is applied.

The second potential is a potential not allowing the cell current to flow, specifically, a potential not higher than the threshold of a transistor having, as a gate electrode, the second electrode connected to the second wire (2-$j$).

The fifth potential may be a potential allowing the cell current to flow, specifically, a potential not lower than the threshold of a transistor having, as a gate electrode, the fifth electrode connected to the fifth wire (5-$j$).

The sixth potential is a potential not allowing the cell current to flow, for example, a potential not higher than the threshold of the transistors having, as the gate electrodes, the second electrodes connected to the second wires (not 2-$j$) and the fifth electrodes connected to the fifth wires (not 5-$j$).

The eighth potential is such that, in a transistor having, as the gate electrode, the fifth electrode connected to the fifth wire (5-$j$) and, as the source or drain electrode, the fourth electrode connected to a fourth wire (not 4-$i$), a cut-off state is generated when a potential difference between the eighth potential and the fifth potential exceeds the threshold and an inversion layer is not generated in the channel region of a memory-cell arranged in series with the above-mentioned transistor.

The first wires (1-1 to 1-N) may be open. The fourth wires (not 4-$i$) may be open or has a potential such that the first and second potentials enter the above-mentioned cut-off state.

The eighth potential may be smaller than the fifth potential. The eighth potential may be any potential as long as "1" is not written according to the potential difference between the third and eighth potentials, for example, a potential such that the F-N current flowing in the tunnel oxide film of the memory transistor having, as the gate electrode, the third electrode to which the third potential is applied is sufficiently small according to the potential difference.

In the case where the channel region of a selected memory cell is electrically connected to the semiconductor substrate, that is, in the case where the island-like semiconductor layer is not floated from the semiconductor substrate by an impurity diffusion layer, all memory cells having the third electrodes connected to the third wire to which the third potential is applied can also be written at the same time if the tenth potential applied to the semiconductor substrate is a potential such that "1" is written by a difference between the third potential and the tenth potential, specifically, a potential such that a sufficiently large F-N current flows in the tunnel oxide film of the memory transistor having, as the gate electrode, the third electrode to which the third potential is applied.

In the case where the island-like semiconductor layer is electrically floated from the semiconductor substrate by a depletion layer extended by the ninth potential applied to the first wires (not 1-$j$) connected to the island-like semiconductor layer which does not include the selected cell, if the potential of the island-like semiconductor layer, that is, the channel region of the memory cell is determined by the ninth potential and the ninth potential is a potential such that the F-N current flowing in the tunnel oxide film of the memory transistor is sufficiently reduced, writing is not performed. In other words, when the potential difference between the ninth potential and the third potential, the potential difference between the ninth potential and the seventh potential, or the potential difference between the ninth potential and the eleventh potential is a potential difference such that the F-N current flowing in the tunnel oxide film of the memory transistor is sufficiently reduced, writing is not performed.

When the channel region of the memory cell is not electrically connected to the semiconductor substrate, extension of the depletion layer by the ninth potential may be arbitrary.

In the case where the first wires (1-1 to 1-N) are formed as impurity diffusion layers in the semiconductor substrate and the tenth potential applied to the semiconductor substrate is the ground potential, the first potential is generally the ground potential.

In the case where the first wires (1-1 to 1-N) are electrically insulated from the semiconductor substrate, for example, where the first electrodes (1-1 to 1-N) are formed of impurity diffusion layers on an SOI substrate and are insulated from the semiconductor substrate by an insulating film, the first potential is not necessarily the same as the tenth potential.

Memory cells may be sequentially written from a memory cell connected to a third wire (3-$j$-L) to a memory cell connected to a third wire (3-$j$–1), or may be written in reverse order or at random.

Some or all memory cells connected to the third wire (3-$j$-$h$), some or all memory cells connected to the third wires (3-$j$–1 to 3-$j$-L), and some or all memory cells connected to the third wires (3-1–1 to 3-N-L) may be written at the same time. Alternately, some or all memory cells connected to third wires selected regularly, e.g., a third wire (3-($j$–8)-$h$), a third wire (3-$j$-$h$), a third wire (3-($j$+8)-$h$), a third wire (3-($j$+16)-$h$), . . . , may be written at the same time.

Some or all memory cells included in one island-like semiconductor layer connected to the fourth wire (4-$i$) may be written at the same time, or some or all memory cells of some or all island-like semiconductor layers connected to the fourth wire (4-$i$) may be written at the same time. Further, one, some or all memory cells included in one island-like semiconductor layer connected to each of a plurality of fourth wires may be written at the same time. Some or all memory cells included in some or all island-like semiconductor layers connected to each of a plurality of fourth wires may be written at the same time.

The memory cells connected to the third wire (3-$j$-$h$) may be written at the same time at given intervals, for example, every eight fourth wires (e.g., a fourth wire (4-($i$–16)), a fourth wire (4-($i$–8)), a fourth wire (4-$i$), a fourth wire (4-($i$+8)), a fourth wire (4-($i$+16)), . . . ).

All the memory cells having, as gate electrodes, the third electrodes connected to the third wire (3-$j$-$h$) can be written at the same time by applying the first potential to all the fourth wires, applying the fourth potential to the first wire (1-$j$) and the eighth potential to the first wires (not 1-$j$), exchanging the potentials of the second and fifth wires and applying the third potential to the third wire (3-$j$-$h$).

Alternately, by applying the fourth potential to a plurality of first wires and applying the third potential to the third wires to which the third electrodes of the memory cells included in the island-like semiconductor layers having the first electrodes connected to the plurality of first wires are connected, all the memory cells having, as gate electrodes, the third electrodes connected to the third wires to which the third potential is applied can be written at the same time.

The above-described writing methods may be combined.

Figure 68:
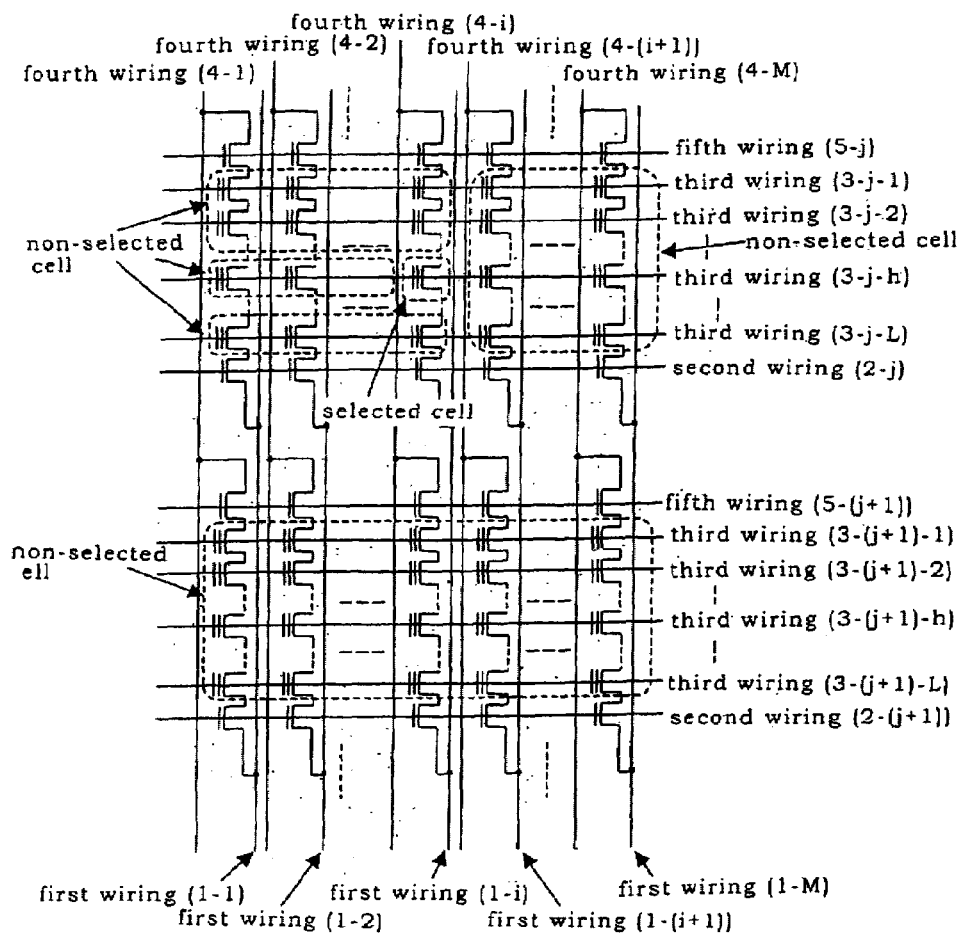

FIG. 68 shows an equivalent circuit of a memory cell array structure in which the first wires are arranged in parallel to the fourth wires. Write voltages of FIG. 68 are similar to those of FIG. 63 except that the first potential is applied to the first wire (1-$i$) and the ninth potential is applied to the first wires (not 1-$i$).

FIG. 70 shows an equivalent circuit of a memory cell array structure in which a plurality of first wires are electrically connected in common. Write voltages of FIG. 70 are similar to those of FIG. 63 except that the first potential is applied to the first wire (1-1).

A timing chart of voltages in the write operation in the case where M×N (M and N are positive integers) island-like semiconductor layers are arranged, each island-like semiconductor layer having L (L is a positive integer) memory cells connected in series and formed of a P-type semiconductor and selection gate transistors formed to sandwich the memory cells, and the first wires are arranged in parallel with the third wires.

Figure 85:
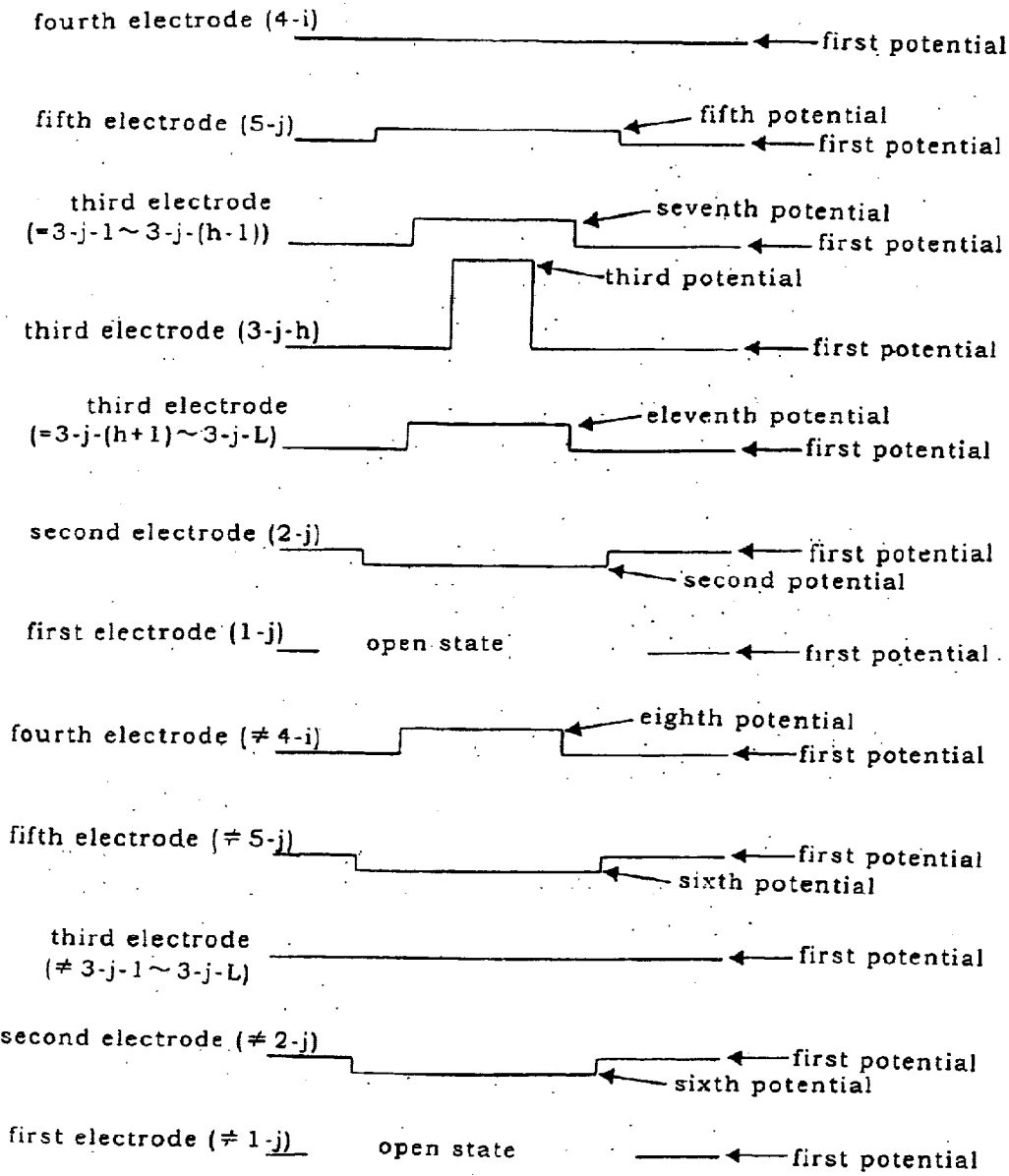

FIG. 85 shows timings of potentials applied to the wires in the writing operation in the case where the first electrode is open, the thresholds of transistors having gate electrodes connected to the second wire and the fifth wire are 0.5 V, and the memory cell has a threshold of 1.0 V to 3.5 V when it is in the written state and has a threshold of –1.0 V or lower when it is in the erased state. If "1" is written by storing a negative charge in the charge storage layer, the ground potential as the first potential is first applied to the first wires (1-1 to 1-N), the second wires (2-1 to 2-N), the third wires (3-1–1 to 3-N-L), the fourth wires (4-1 to 4-M) and the fifth wires (5-1 to 5-N). In this state, the first wires (1-1 to 1-N) are open. The sixth potential, e.g., –1 V, is applied to second wires (not 2-$j$) and fifth wires (not 5-$j$). The second potential, e.g., –1 V, is applied to the second electrode (2-$j$), and the fifth potential, e.g., 1 V, is applied to the fifth wire (5-$j$). The ground potential which is the first potential is continuously applied as the fourth potential to the fourth wire (4-$i$). The eighth potential, e.g., 3 V, is applied to fourth wires (not 4-$i$) other than the fourth wire (4-$i$). The seventh potential, e.g., 10 V, is applied to third wires (3-$j$–1 to 3-$j$-($h$–1)) (h is a positive integer satisfying the relation of $1 \leq h \leq L$) other than the third wire (3-$j$-$h$). The eleventh potential, e.g., 10 V, is applied to third wires (3-$j$-($h$+1) to 3-$j$-L) (h is a positive integer satisfying the relation of $1 \leq h \leq L$). The ground potential is applied as the twelfth potential to third wires (not 3-$j$–1 to 3-$j$-L) other than the above-mentioned third wires. The third potential, e.g., 20 V, is applied to the third electrode (3-$j$-$h$). By maintaining this state for a desired period of time, "1" can be written. The timings of applying the potentials to the respective electrodes may be in another order or simultaneous provided that, while the third potential, e.g., 20 V, is applied to the third electrode (3-$j$-$h$), at least the eighth potential, e.g., 3 V, is applied to the fourth wires (not 4-$i$) or the fifth wires (not 5-$j$) are grounded.

After that, the third wire (3-$j$-$h$), the third wires (not 3-$j$-$h$) other than the third wire (3-$j$-$h$), the fourth wires (not 4-$i$), the second wire (2-$j$) and the fifth wire (5-$j$), the second wires (not 2-$j$) and the fifth wires (not 5-$j$), and the first wires (1-1 to 1-N) are reset to the ground potential. The timings of resetting the respective electrodes to the ground potential may be in another order or simultaneous provided that, while the third potential, e.g., 20 V, is applied to the third wire (3-$j$-$h$), at least the eighth potential, e.g., 3 V, is applied to the fourth wires (not 4-$i$) or the fifth wires (not 5-$j$) are grounded.

The potentials to be applied may be in any combination so long as they satisfy conditions for writing "1" in a desired cell.

Although it is preferable to initially apply the first potential as the same potential to the first wires (1-1 to 1-N), the second wires (2-1 to 2-N), the third wires (3-1–1 to 3-N-L), the fourth wires (4-1 to 4-M) and the fifth wires (5-1 to 5-N), different potentials may be applied.

In the above, the writing method has been described with respect to the case where the selected cell is a memory cell having the third wire (3-$j$-$h$) as the gate electrode. The writing method is the same with respect to the case where the selected cell is a memory cell having a third wire other than the third wire (3-$j$-$h$) as the gate electrode.

At the time of writing, the F-N tunnel current may flow in a region where the channel and the floating gate face each other, a region where an LDD surface and the floating gate face each other, or a combination of the regions.

Figure 86:
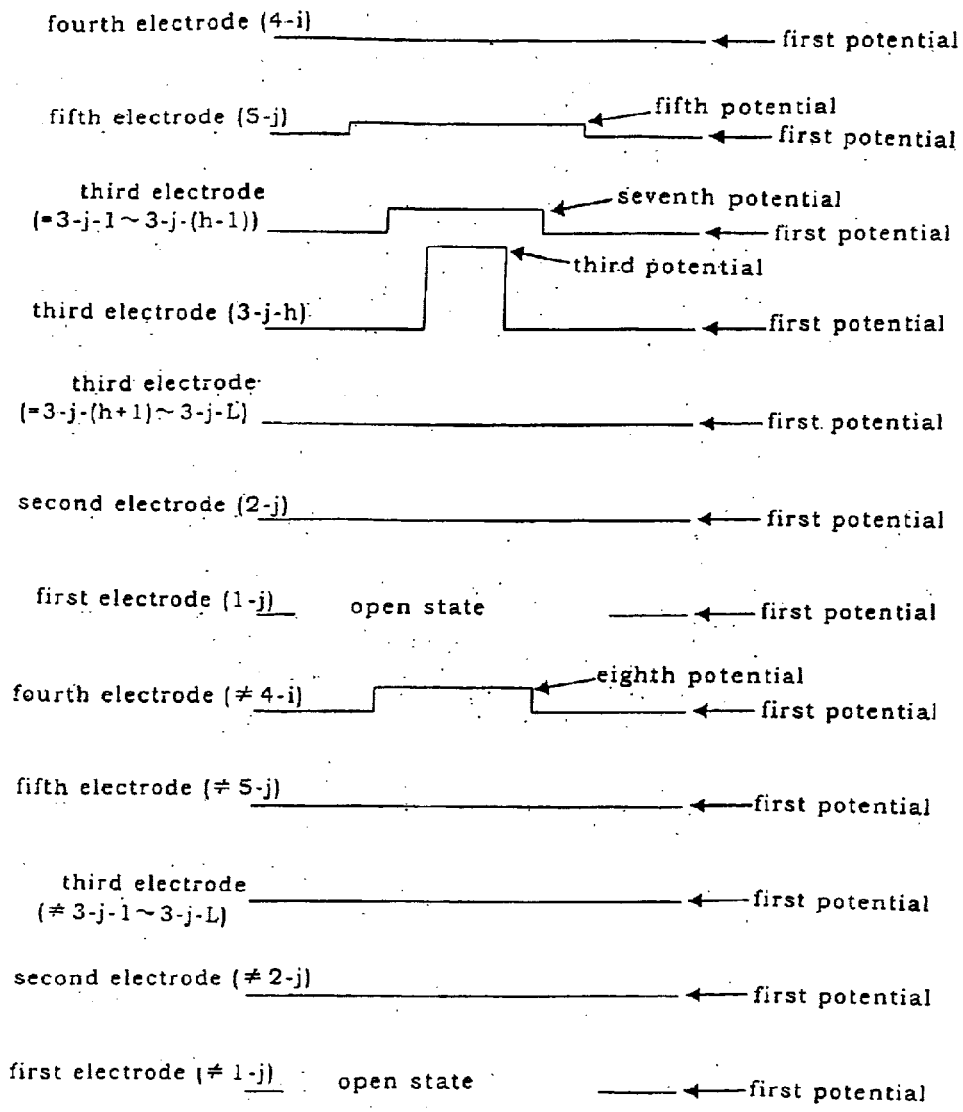

FIG. 86 shows a timing chart of writing operation in the case where the eleventh potential is the ground potential. The writing operation of the selected cell conforms to that of FIG. 85 without being affected by application of the ground potential as the eleventh potential to the third wires (30-($h$+1) to 30-L) (h: a positive integer satisfying the relation of $1 \leq h \leq L$).

Figure 87:
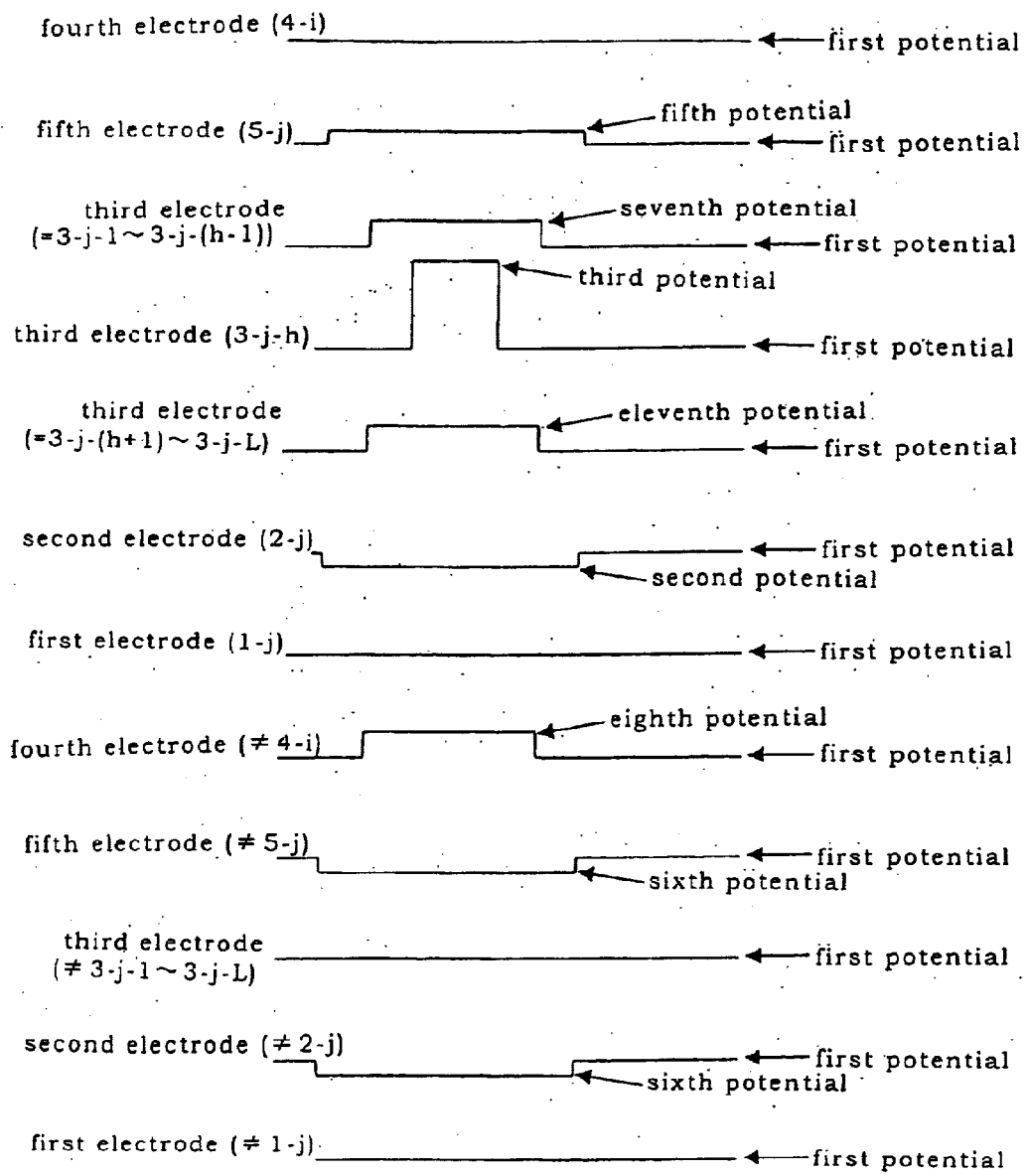

FIG. 87 shows a timing chart of writing operation in the case where the first wire is grounded. The writing operation of the selected cell conforms to that of FIG. 85 without being affected by application of the ground potential to the first wire (1-*j*) if the second potential is not higher than the threshold of the transistor having the second wire (2-*j*) as the gate electrode.

Figure 88:
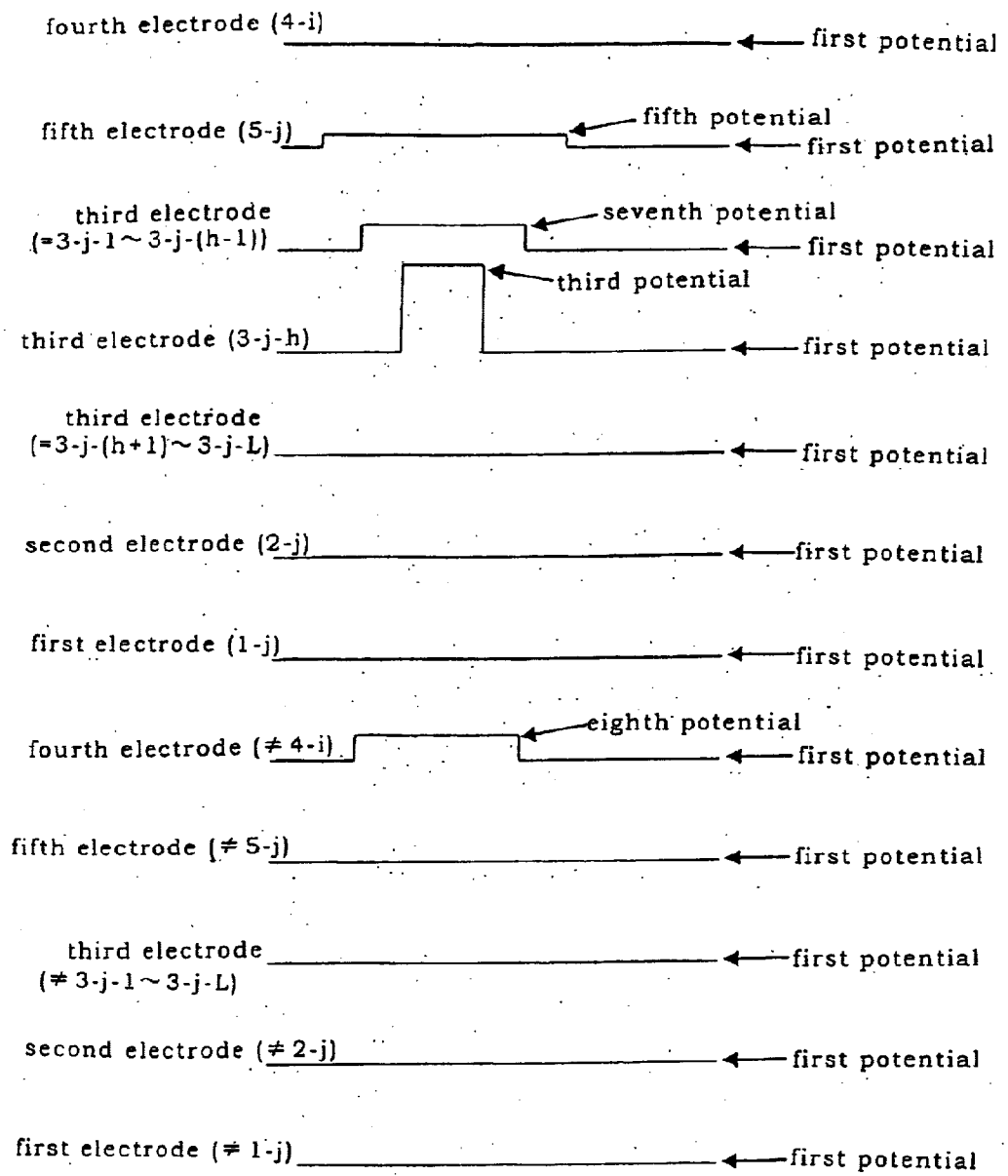
Figure 89:
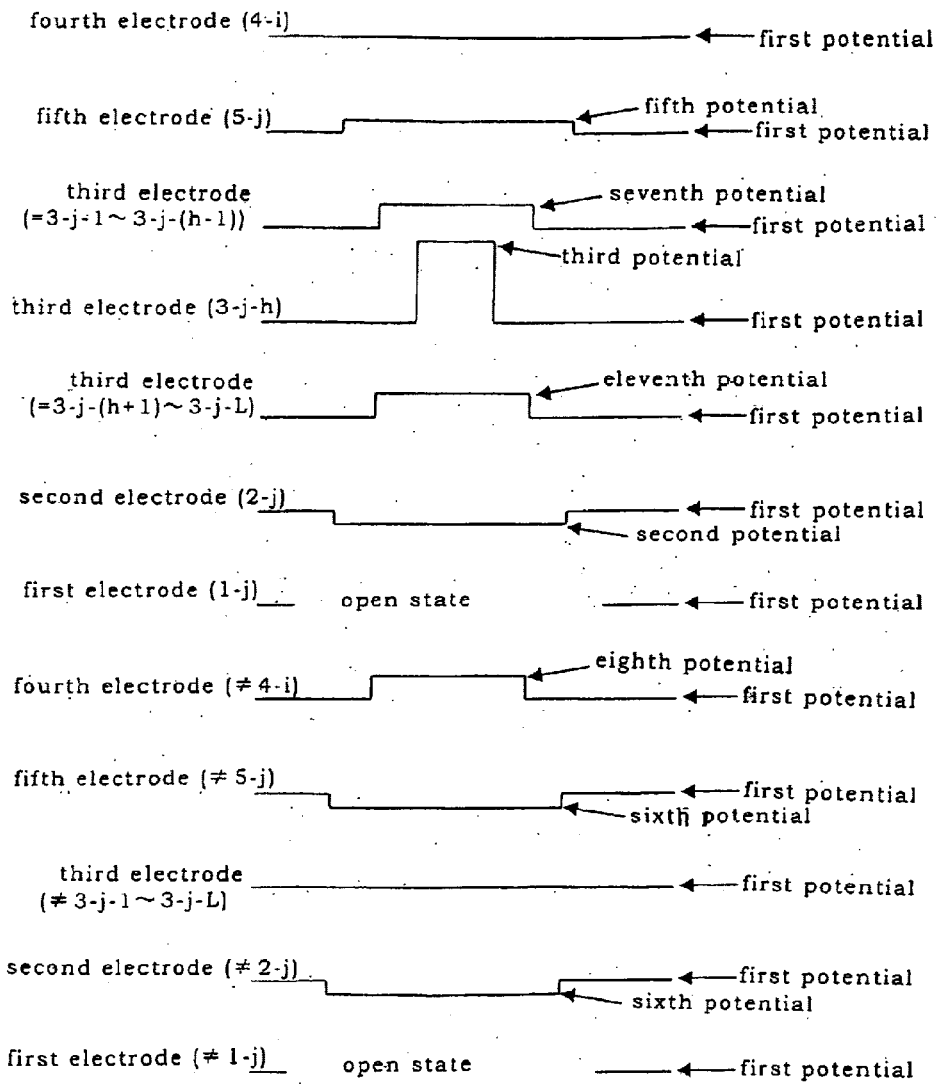
Figure 90:
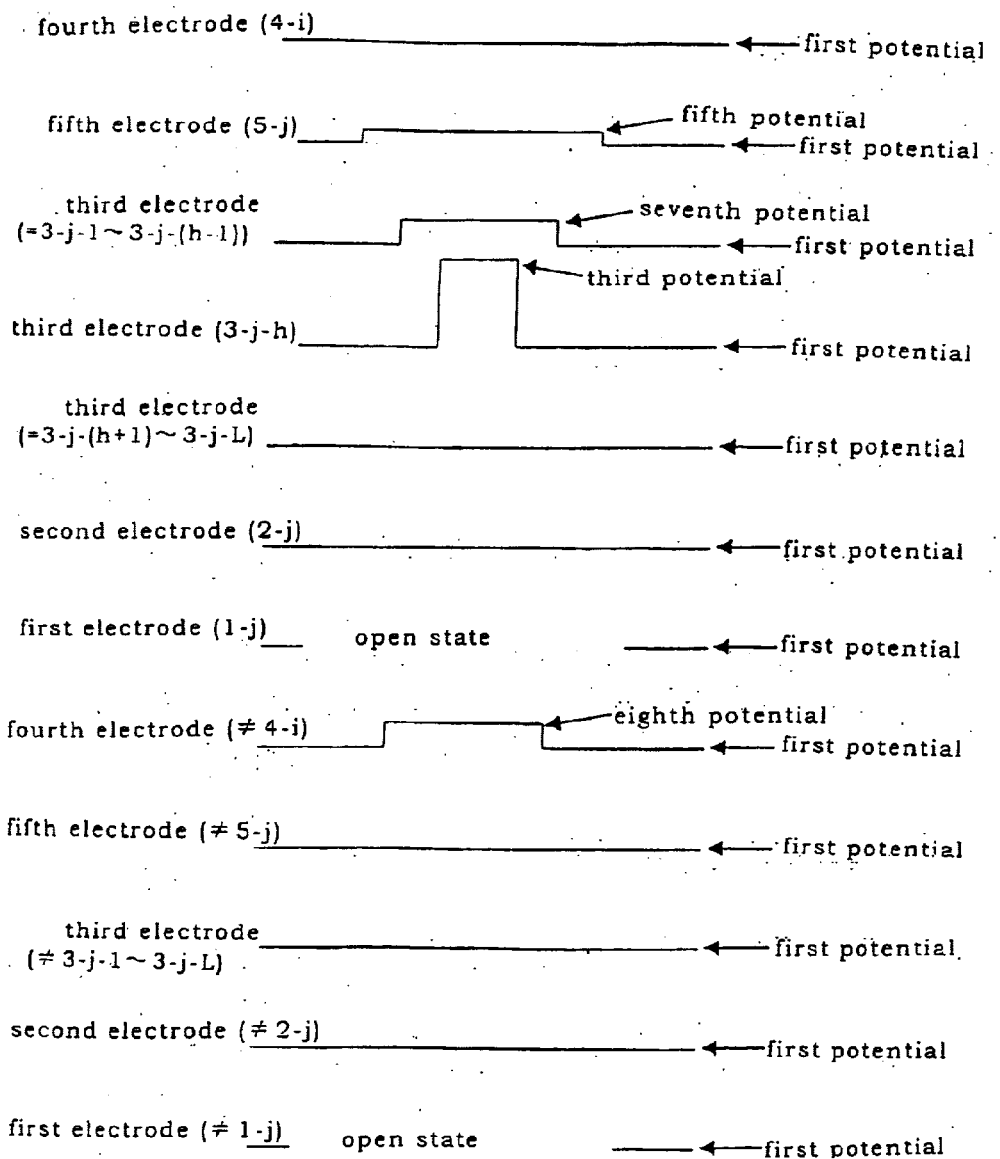
Figure 91:
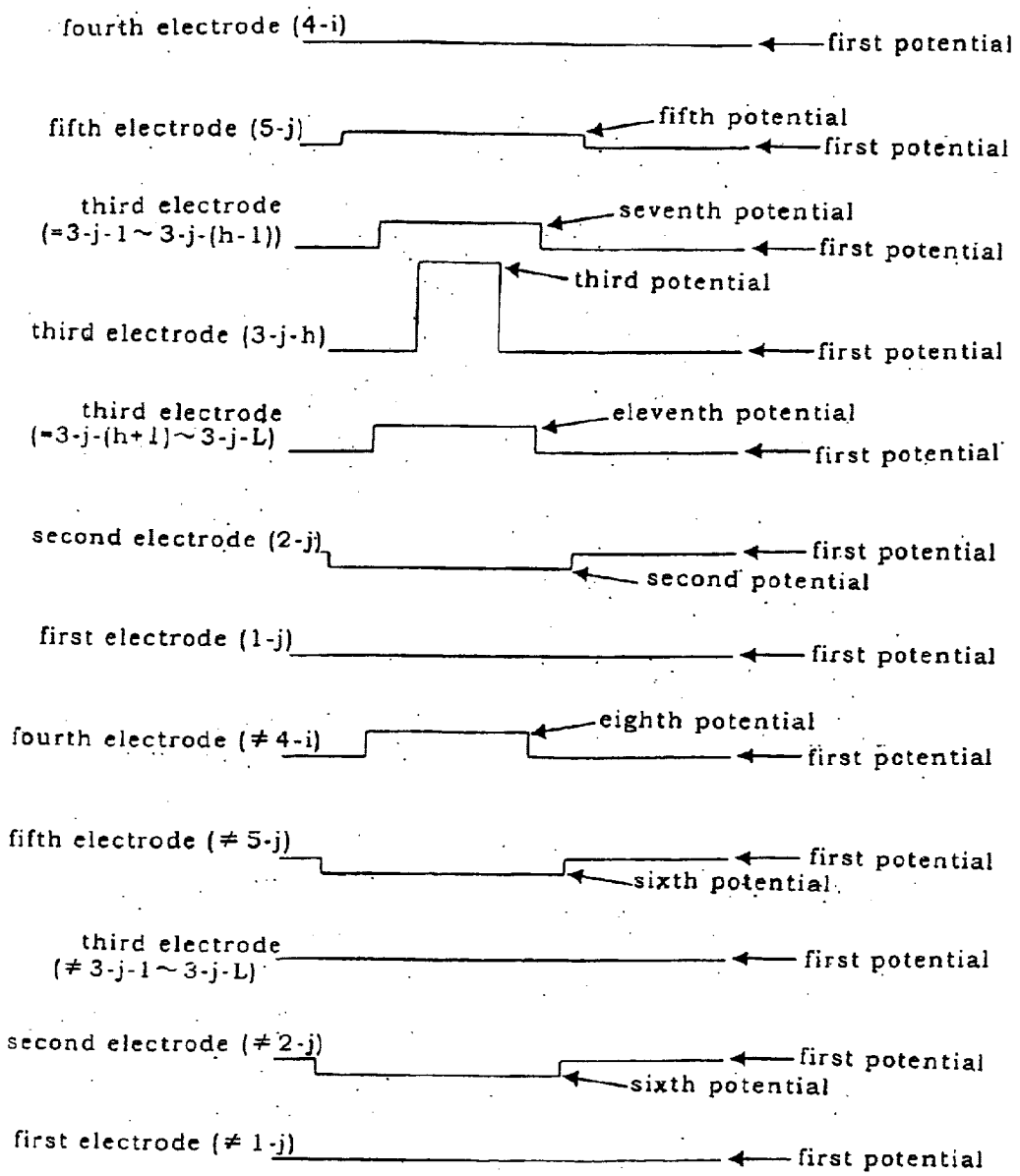
Figure 92:
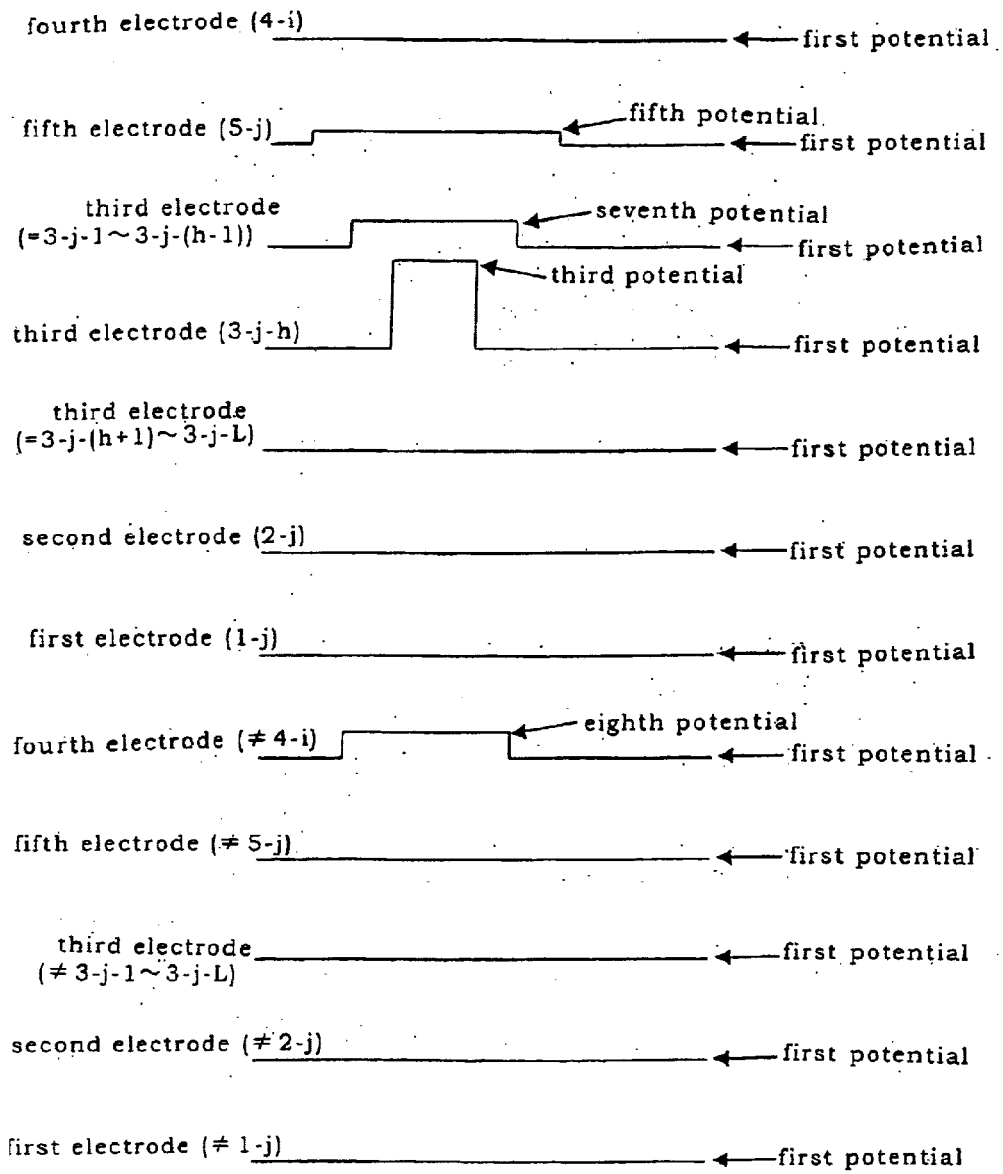
Figure 93:
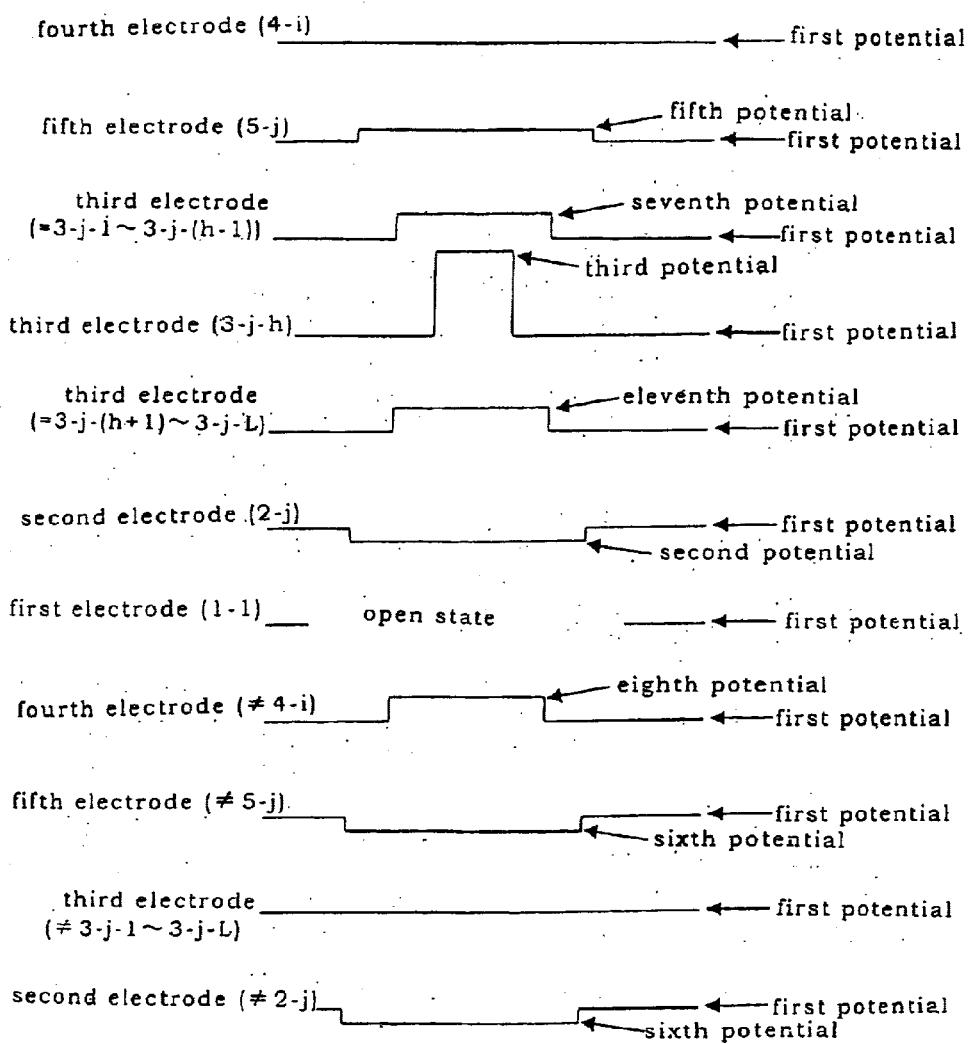
Figure 94:
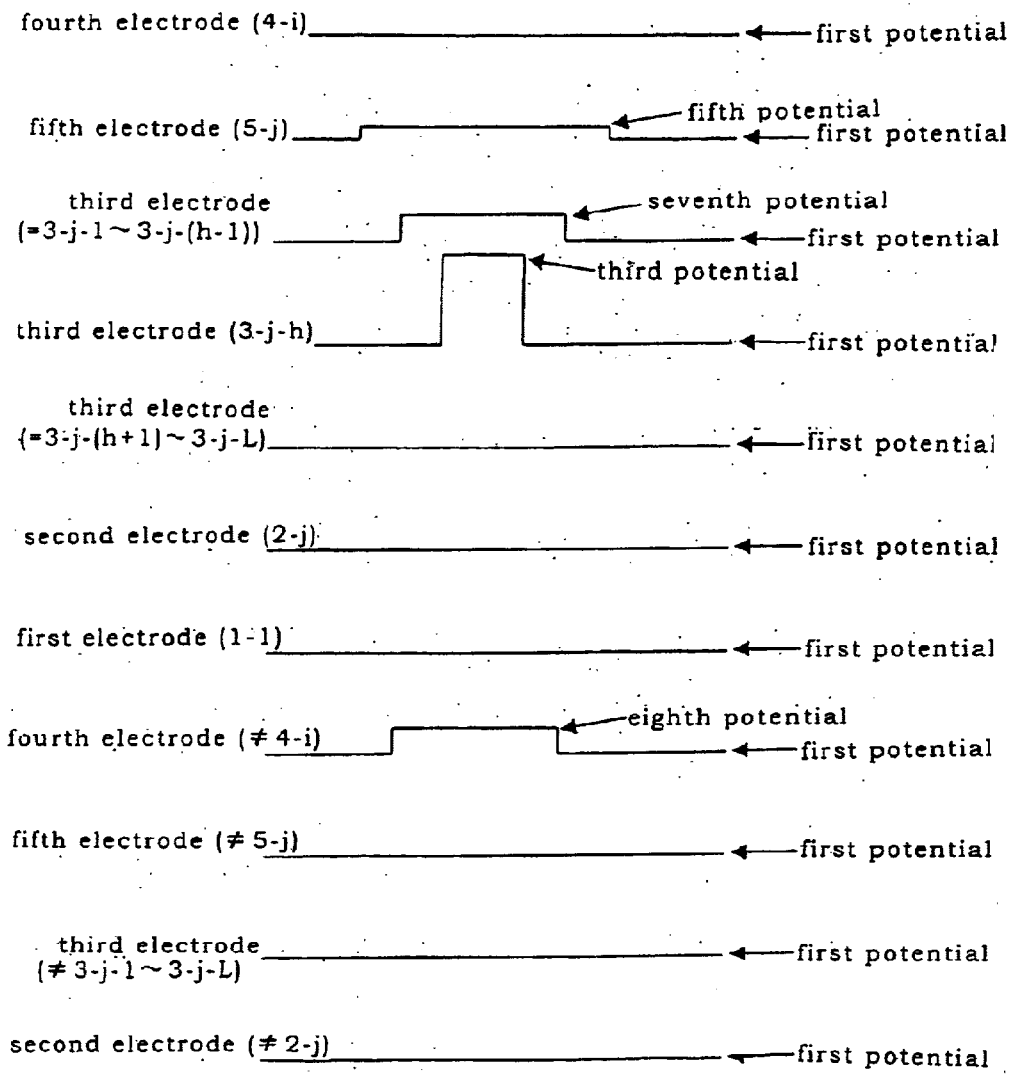
Figure 95:
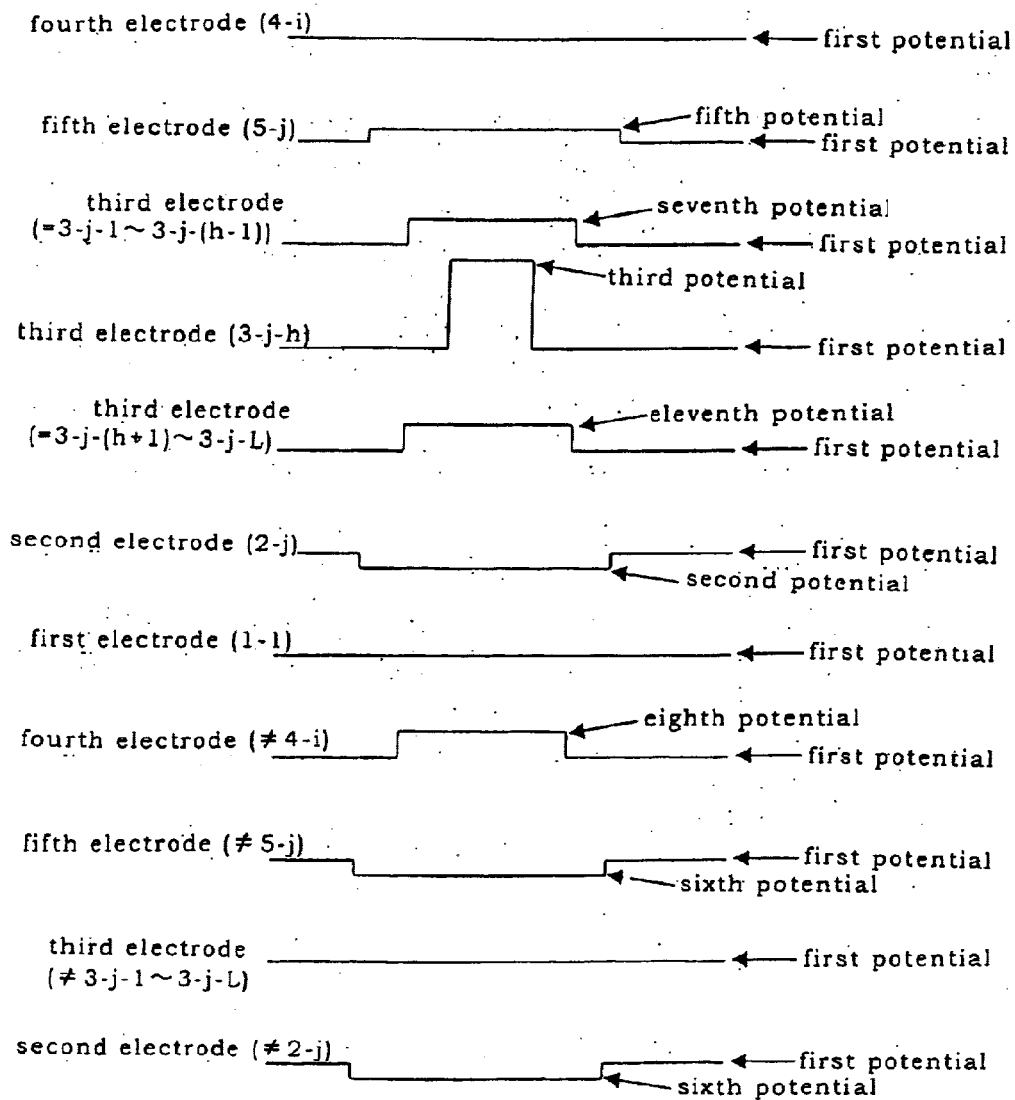
Figure 96:
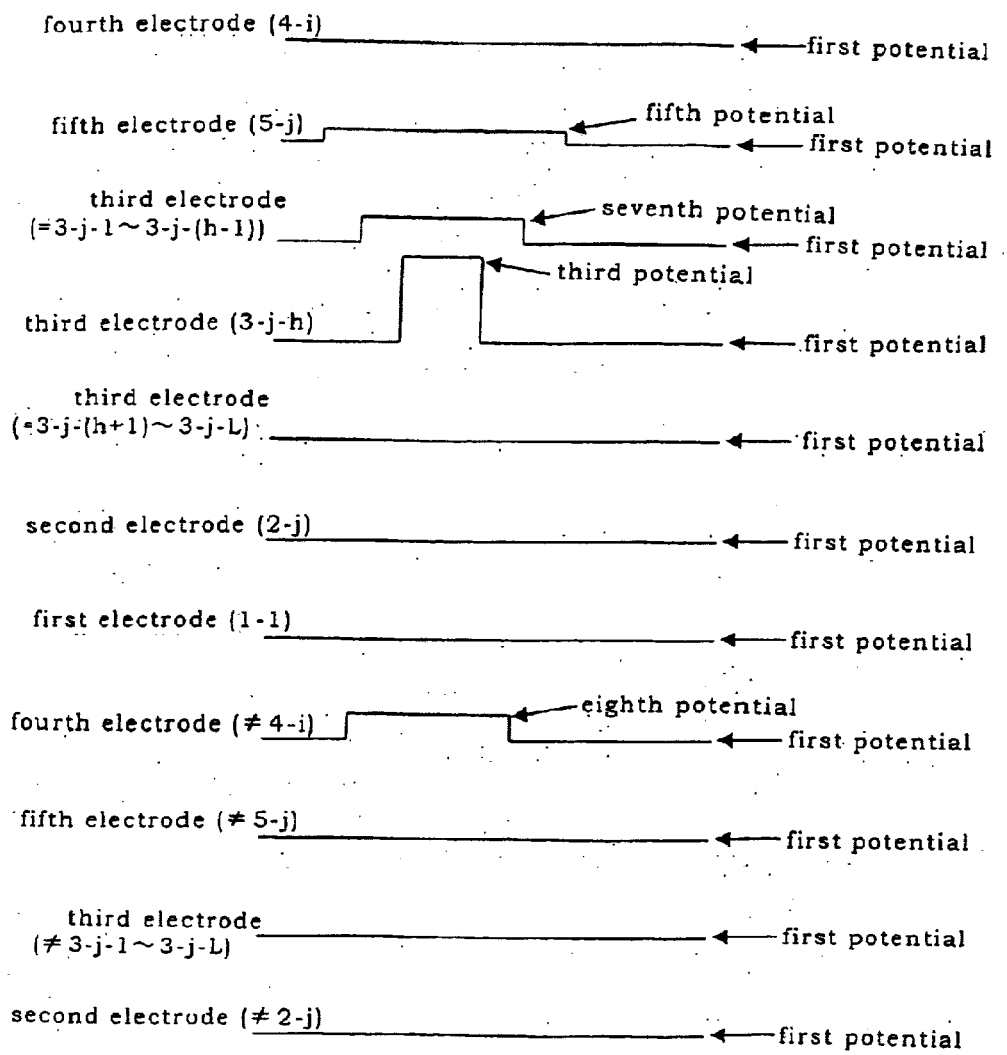

FIG. 88 shows a timing chart of writing operation in the case where the first wire is grounded. The writing operation of the selected cell conforms to that of FIG. 86 without being affected by application of the ground potential to the first wire (1-*j*) if the second potential is not higher than the threshold of the transistor having the second electrode 20 as the gate electrode.

FIGS. 118 to 121 show timing charts of writing operation in the case of writing "0" by drawing a negative charge in the charge storage layer by applying −20 V as the third potential to the third electrode (30-*h*). The writing operation conforms to any of the operations shown in FIGS. 85 to 88 except that the polarity of the third potential is different.

FIGS. 89 to 92 show timing charts of writing operation in the case where the first wires are arranged in parallel to the fourth wires. FIGS. 89 to 92 correspond to FIGS. 85 to 88, respectively, except that the first wire (1-*i*) instead of the first wire (1-*j*) is connected to the end portion of the island-like semiconductor layer including the selected cell.

FIGS. 122 to 125 show timing charts of writing operation in the case of writing "0" by drawing a negative charge in the charge storage layer by applying −20 V as the third potential to the third electrode (30-*h*). The writing operation conforms to any of the operations shown in FIGS. 89 to 92 except that the polarity of the third potential is different.

FIGS. 93 to 96 show timing charts of writing operation in the case where the first wires are connected in common in the entire array. FIGS. 93 to 96 correspond to FIGS. 85 to 88 except that the first wire (1-1) instead of the first wire (1-*j*) is connected to the end of the island-like semiconductor layer including the selected cell.

FIGS. 126 to 129 show timing charts of writing operation in the case of writing "0" by drawing a negative charge in the charge storage layer by applying −20 V as the third potential to the third electrode (30-*h*). The writing operation conforms to any of the operations shown in FIGS. 93 to 96 except that the polarity of the third potential is different.

An erasing process will be described hereinbelow, using an F-N tunneling current of a memory cell having an island-like semiconductor layer which includes, as selection gate transistors, a transistor having a second electrode as a gate electrode and a transistor having a fifth electrode as a gate electrode and in which L (L: a positive integer) pieces of memory cells each having a charge storage layer and a third electrode as a control gate electrode are connected in series between the selection gate transistors.

FIG. 61 shows an equivalent circuit of the memory cell structure.

In the case where the island-like semiconductor layers are formed of a P-type semiconductor, a selected cell shown in FIG. 61 is erased by applying a first potential to the first electrode 10 connected to the island-like semiconductor layer including the selected cell, a second potential to the second electrode 20 arranged in series with the selected cell, a third potential to the third electrode (30-*h*) (h: a positive integer satisfying the relation of 1≦h≦L) connected to the selected cell, a seventh potential to the third electrodes (30-1 to 30-(h−1)) connected to non-selected cells arranged in series with the selected cell, an eleventh potential to the third electrodes (30-(h+1) to 30-L) which are similarly connected to non-selected cells disposed in series with the selected cell, a fourth potential to the fourth electrode 40 connected to the island-like semiconductor layer including the selected cell, and a fifth potential to the fifth electrode 50 arranged in series with the selected cell. By the voltages, the F-N current is generated only in a tunnel oxide film of the selected cell to thereby enable the state of a charge in the charge storage layer to be changed.

In the case where a negative charge is drawn from the charge storage layer for erasing data, the fourth potential is larger than the third potential.

When a state in which a negative charge is stored in the charge storage layer is set as "1", by changing the state of the charge in the charge storage layer, "0" can be set. At this time, the third potential is a potential allowing "0" to be set in accordance with the difference between the third potential and the fourth potential, that is, a potential allowing generation of a sufficient F-N current as means for changing the state of the charge. The F-N current flows in the tunnel oxide film of a memory transistor having, as the gate electrode, the third electrode to which the third potential is applied.

The first electrode 10 may be open.

In the case where the first electrode 10 is formed as an impurity diffusion layer in the semiconductor substrate, the potential of the first electrode 10 is floated, and the channel region of a memory cell is electrically connected to the semiconductor substrate, the fourth potential applied to the first electrode 10 connected to the island-like semiconductor layer including the selected cell is a potential such that the island-like semiconductor layer is electrically floated from the semiconductor substrate by a depletion layer extended toward the semiconductor substrate. Thereby the potential of the island-like semiconductor layer becomes equal to the fourth potential and a sufficiently large F-N current flows in the tunnel oxide film of the memory transistor of the selected cell on the island-like semiconductor layer, so that data can be erased. That is, the difference between the fourth potential and the third potential becomes a potential difference allowing a sufficient F-N current to flow in the tunnel oxide film of the memory transistor.

In the case where the channel region of the memory cell is not electrically connected to the semiconductor substrate, the depletion layer may be extended in any state by the fourth potential.

The seventh potential is a potential causing a sufficiently smaller change in the state of the charge in the charge storage layers, specifically, a potential such that a difference between the seventh potential and the fourth potential causes a sufficiently small F-N current in the tunnel oxide films of the memory transistors having, as the gate electrodes, the third electrodes (30-1 to 30-(h−1)) to which the seventh potential is applied.

The eleventh potential is a potential causing a sufficiently smaller change in the state of the charge in the charge storage layers than in the selected cell, specifically, a potential such that a difference between the eleventh potential and the fourth potential causes a sufficiently small F-N current in the tunnel oxide films of the memory transistors having, as the gate electrodes, the third electrodes (30-(h+1) to 30-L) to which the eleventh potential is applied.

The second potential is a potential not allowing the F-N current to flow in the gate oxide film of the transistor having the second electrode 20 as the gate electrode.

The fifth potential is a potential not allowing the F-N current to flow in the gate oxide film of the transistor having the fifth electrode 50 as the gate electrode.

In the case where the first electrode 10 is formed to be electrically insulated from the semiconductor substrate, specifically, where the first electrode 10 is formed of an impurity diffusion layer in an SOI substrate and is insulated from the semiconductor substrate by an insulating film, the first potential is not necessarily the same as the tenth potential.

In the case where the channel region of a memory cell is electrically connected to the semiconductor substrate, specifically, in the case where the island-like semiconductor layers are floated from the semiconductor substrate by the impurity diffusion layer, the tenth potential applied to the semiconductor substrate can erase simultaneously all memory cells having as the gate electrodes the third electrodes to which the third potential is applied, provided that a difference between the tenth potential and the third potential causes a sufficient change in the state of the charge in the charge storage layer.

The memory cells may be sequentially erased from a memory cell connected to a third electrode (30-L) to a memory cell connected to a third electrode (30-1), or may be erased in reverse order or at random.

In the invention, erasure may be carried out by changing the state of the charge in the charge storage layer and raising the threshold of the selected memory transistor. In this case, the third potential is smaller than the fourth potential, and the third potential is a potential allowing the state of the charge in the charge storage layer to be changed sufficiently by the difference between the third potential and the fourth potential, for example, a potential allowing the occurrence of a sufficient F-N current.

Timing charts of voltages in the erasing operation will be described, in the case where there are arranged M×N (M and N are positive integers) island-like semiconductor layers having L (L: a positive integer) memory cells formed of the P-type semiconductor and arranged in series and selection transistors formed so as to sandwich the memory cells, and a memory cell having a third electrode as a gate electrode is a selected cell.

Figure 97:
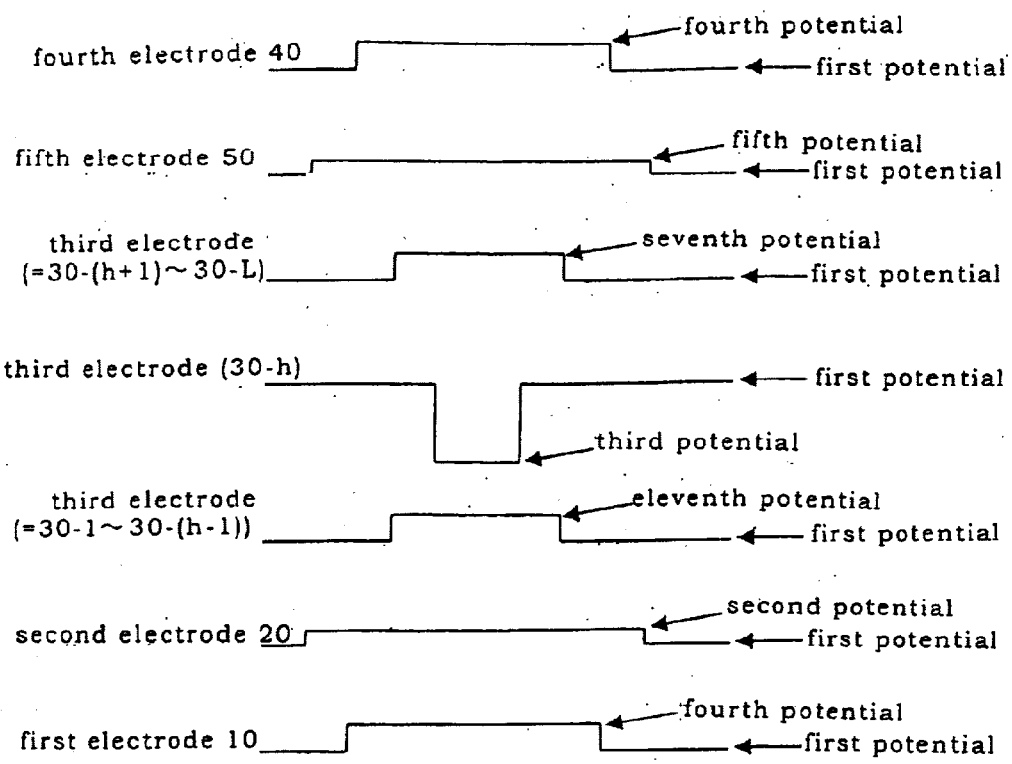

FIG. 97 shows timings of potentials applied to electrodes in the erasing operation in the case where a selected third electrode as shown in FIG. 61 is negative-biased, the threshold of the transistors having the second and fifth electrodes as the gate electrodes is 0.5 V, and the memory cell has a threshold of 1.0 V to 3.5 V when it is in the written state and has a threshold of −1.0 V or lower when it is in the erased state.

For drawing a negative charge from the charge storage layer, first, the ground potential is applied as the first potential to the first electrode 10, the second electrode 20, the third electrodes (30-1 to 30-L), the fourth electrode 40 and the fifth electrode 50.

In this state, the second potential, e.g., 6 V, is applied to the second electrode 20, the fifth potential, e.g., 6 V, is applied to the fifth electrode 50, the fourth potential, e.g., 6 V, is applied to the first electrode 10, and the fourth potential, e.g., 6 V, is applied to the fourth electrode 40. After that, the seventh potential, e.g., 6 V, is applied to third electrodes (30-1 to 30-(h−1)) (h: a positive integer satisfying the relation of 1≦h≦L) other than the third electrode (**30-*h*), the eleventh potential, e.g., 6 V, is applied to third electrodes (30-(h+1) to 30-L) (h: a positive integer satisfying the relation of 1≦h≦L), and the third potential, e.g., −12 V, is applied to the third electrode (30-*h***). By maintaining this state for a desired period of time, erasure of "0" is performed. The timings of applying the potentials to the respective electrodes may be in another order or simultaneously.

After that, the third electrode (**30-*h*), the third electrodes (not 30-*h*) other than the third electrode (30-*h*), the fourth electrode 40, the first electrode 10, the second electrode 20, and the fifth electrode 50** are reset to the ground potential. The timings of resetting the electrodes to the ground potential may be in another order or simultaneously. The potentials to be applied may be in any combination of potentials so long as the conditions for erasing a desired cell are satisfied.

The ground potential may be applied as the second potential to the second electrode 20 and, also, may be applied as the fifth potential to the fifth electrode 50.

Although it is preferable to initially apply the first potential as the same potential to the first electrode 10, the second electrode 20, the third electrodes (30-1 to 30-L), the fourth electrode 40 and the fifth electrode 50, different potentials may be applied.

Thereby the selected cell as shown in FIG. 61 is erased.

In the above, the erasing method has been described with respect to the case where the selected cell is a memory cell having the third electrode (**30-*h*) as the gate electrode. The erasing method is the same with respect to the case where the selected cell is a memory cell having a third electrode other than the third electrode (30-*h***) as the gate electrode.

Figure 98:
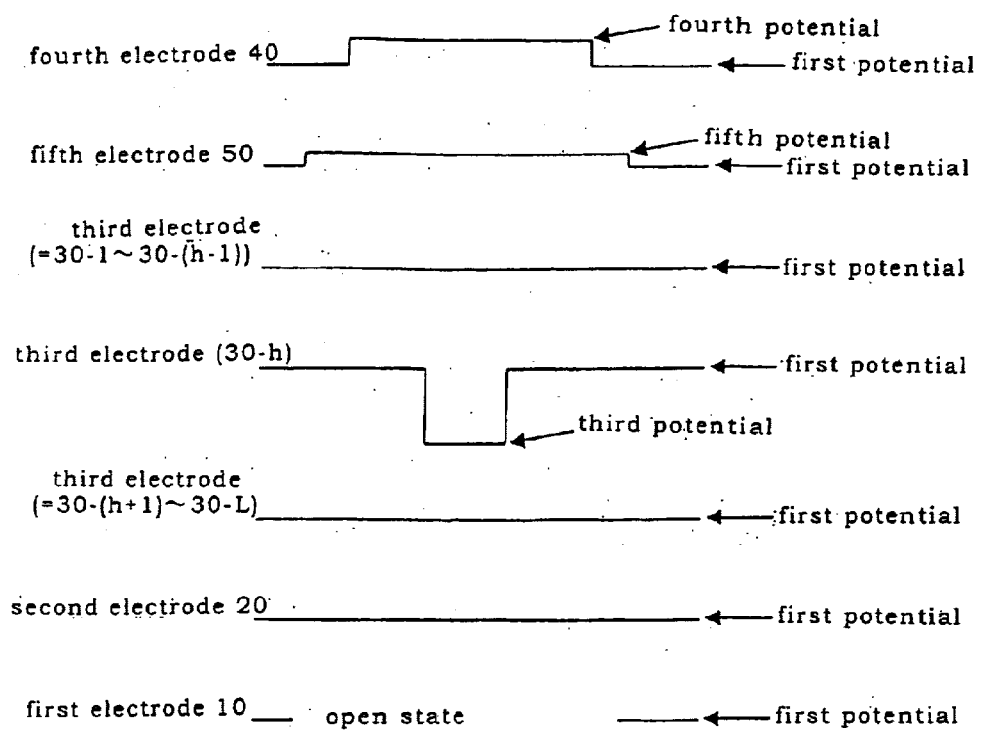

FIG. 98 is a timing chart of the erasing operation in the case where the first electrode is open. The erasing process conforms to that of FIG. 97 except that the first electrode is open and the ground potential is applied as the first potential to the non-selected third electrodes (not **30-*h*) (h: a positive integer satisfying the relation of 1≦h≦L) and the fourth electrode 40. The timing chart of FIG. 98 does not exert an influence on the operation of erasing a selected cell as shown in FIG. 61**.

Figure 62:
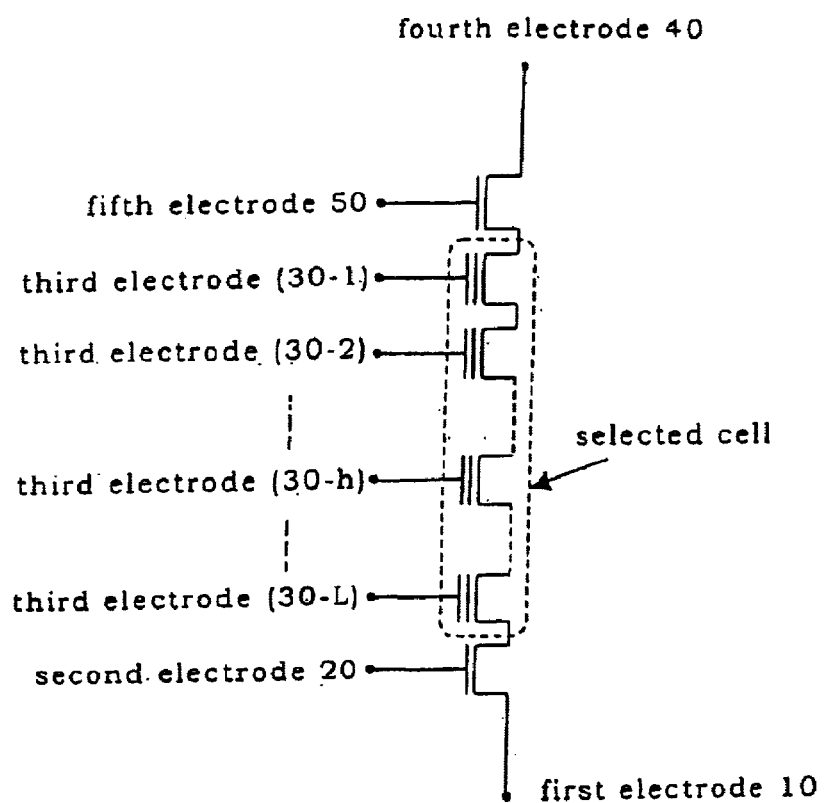

If −12 V is applied as the third potential to the third electrodes (30-1 to 30-(h−1)) and the third electrodes (30-(h−1) to 30-L), a plurality of cells connected to the third electrodes (30-1 to 30-L) as shown in FIG. 62 can be erased.

Figure 99:
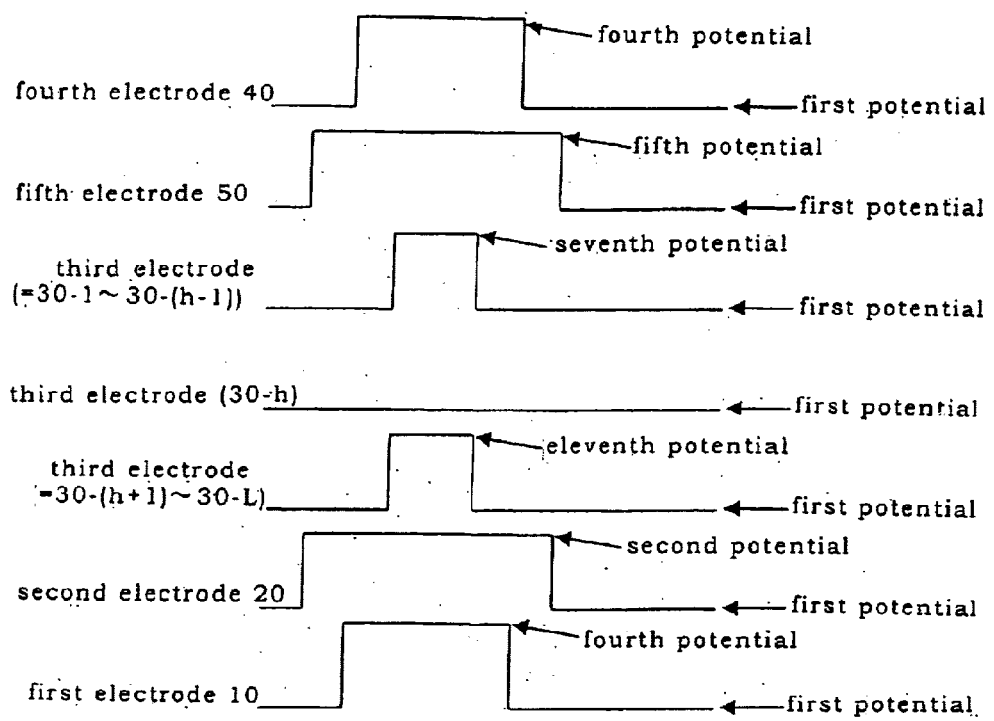

FIG. 99 shows timings of potentials applied to electrodes in the erasing operation in the case where 18 V is applied as the fourth potential to the first electrode, the threshold of the transistors having the second and fifth electrodes as the gate electrodes is 0.5 V, and the memory cell has a threshold of 1.0 V to 3.5 V when it is in the written state and has a threshold of −1.0 V or lower when it is in the erased state.

For drawing a negative charge from the charge storage layer, first, the ground potential is applied as the first potential to the first electrode 10, the second electrode 20, the third electrodes (30-1 to 30-L), the fourth electrode 40 and the fifth electrode 50.

In this state, the second potential, e.g., 18 V, is applied to the second electrode 20, the fifth potential, e.g., 18 V, is applied to the fifth electrode 50, the fourth potential, e.g., 18 V, is applied to the fourth electrode 40, the fourth potential, e.g., 18 V, is applied to the first electrode 10, the seventh potential, e.g., 10 V, is applied to third electrodes (30-1 to 30-(h−1)) (h: a positive integer satisfying the relation of 1≦h≦L) other than the third electrode (**30-*h*), the eleventh potential, e.g., 10 V, is applied to third electrodes (30-(h+1) to 30-L) (h: a positive integer satisfying the relation of 1≦h≦L), and the ground potential as the third potential is continuously applied to the third electrode (30-*h***). By maintaining this state for a desired period of time, erasure of "0" is performed. The timings of applying the potentials to the respective electrodes may be in another order or simultaneously.

After that, the third electrodes (not **30-*h*) other than the third electrode (30-*h*), the fourth electrode 40**, the first electrode 10, the second electrode 20, and the fifth electrode 50 are reset to the ground potential. The timings of resetting the electrodes to the ground potential may be in another order or simultaneously. The potentials to be applied may be in any combination of potentials so long as the conditions for erasing a desired cell are satisfied.

Although it is preferable to initially apply the first potential as the same potential to the first electrode 10, the second electrode 20, the third electrodes (30-1 to 30-L), the fourth electrode 40 and the fifth electrode 50, different potentials may be applied.

Thereby the selected cell as shown in FIG. 61 is erased.

In the above, the erasing method has been described with respect to the case where the selected cell is a memory cell having the third electrode (30-$h$) as the gate electrode. The erasing method is the same with respect to the case where the selected cell is a memory cell having a third electrode other than the third electrode (30-$h$) as the gate electrode.

Figure 100:
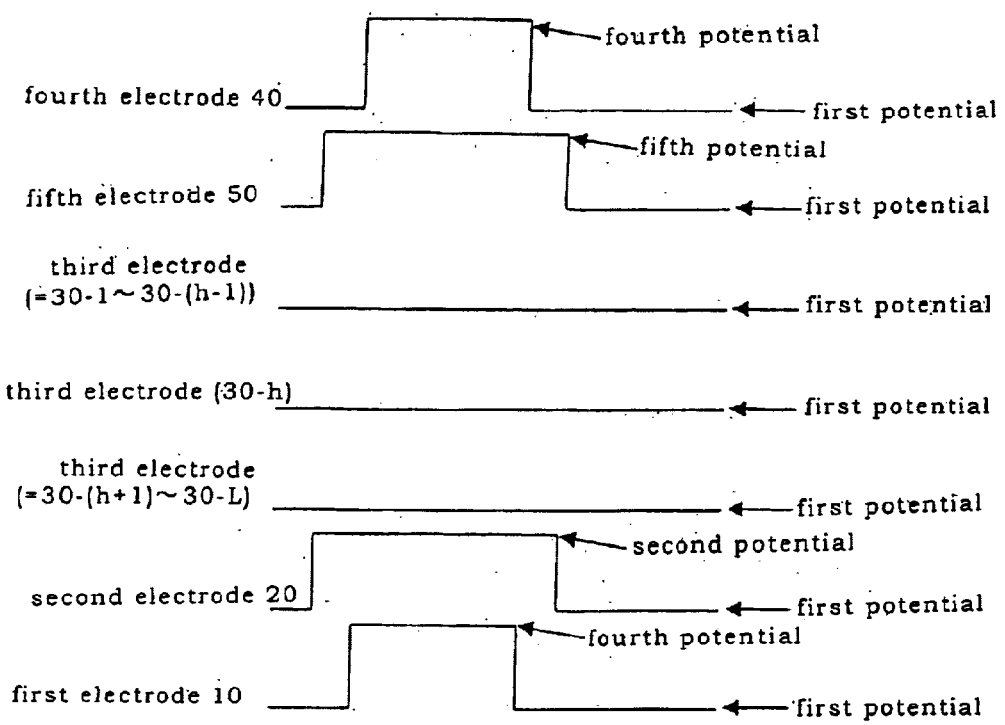

In the case where 18 V is applied as the third potential to the third electrodes (30-1 to 30-($h$–1)) and the third electrodes (30-($h$–1) to 30-L) at timings of potentials applied to the electrodes shown in FIG. 100, a plurality of cells connected to the third electrodes (30-1 to 30-L) as shown in FIG. 62 can be erased.

Figure 130:
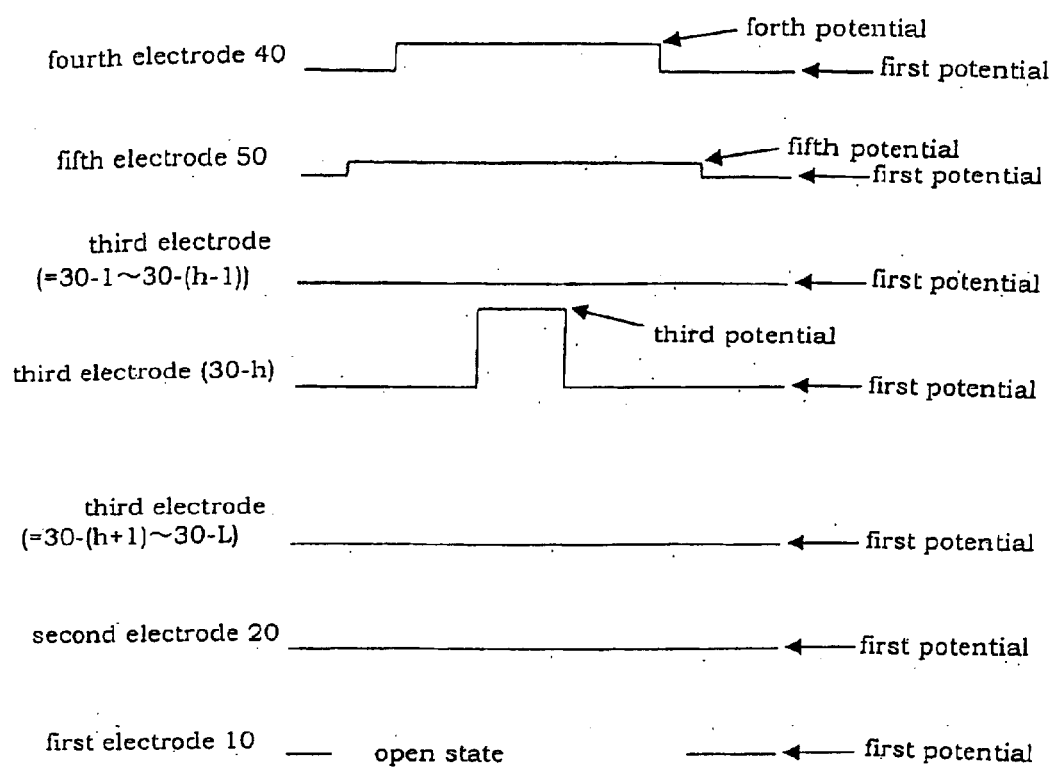
Figure 131:
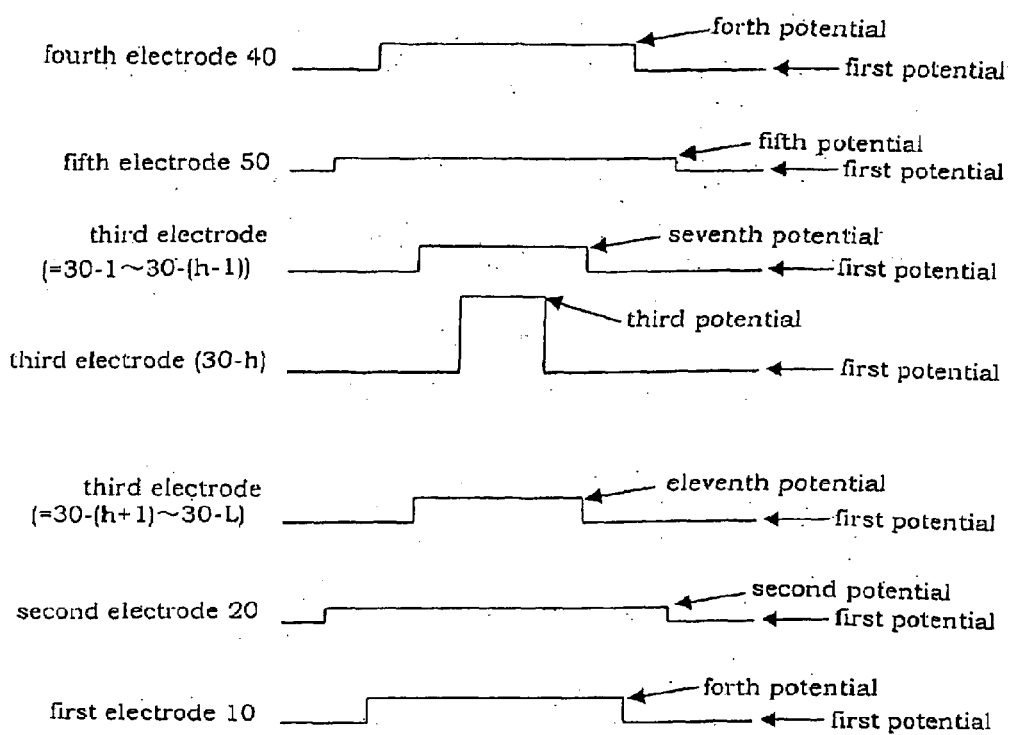

FIGS. 130 and 131 are timing charts of erasing operation performed by storing a negative charge in the charge storage layer by applying –20 V as the third potential to the third electrode (30-$h$). The erasing operation conforms to any of the operations in FIGS. 97 and 98 except that the polarity of the third potential is different.

An erasing method using the F-N current of a semiconductor memory device will be described hereinbelow. The semiconductor memory device includes M×N (M and N: positive integers) island-like semiconductor layers each having, as selection gate transistors, a transistor provided with the second electrode as a gate electrode and a transistor provide with the fifth electrode as a gate electrode and L (L: a positive integer) memory cells connected in series, the memory cells each having the charge storage layer and the third electrode as a control gate electrode, which are provided between the selection gate transistors. In this memory cell array, M pieces of fourth wires arranged in parallel with the semiconductor substrate are connected to end portions of the island-like semiconductor layers, and first wires are connected to opposite end portions of the island-like semiconductor layers. N×L third wires arranged in a direction crossing the fourth wires are connected to the third electrodes of the memory cells.

FIG. 63 shows an equivalent circuit of the above-described memory cell array in which the first wires are arranged in parallel to the third wires.

In the case where the island-like semiconductor layers are formed of a P-type semiconductor, a selected cell shown in FIG. 63 is erased by applying a first potential to the first wire (1-$j$) ($j$: a positive integer satisfying the relation of $1 \leq j \leq N$) connected to the first electrode connected to an island-like semiconductor layer including the selected cell, a ninth potential to first wires (not 1-$j$) other than the above-mentioned first wire (1-$j$), a second potential to a second wire (2-$j$) connected to the second electrode arranged in series with the selected cell, a third potential to a third wire (3-$j$-$h$) ($h$: a positive integer satisfying the relation of $1 \leq h \leq L$) connected to the selected cell, a seventh potential to third wires (3-$j$-1 to 3-$j$-($h$–1)) connected to non-selected cells arranged in series with the selected cell, an eleventh potential to third wires (3-$j$-($h$+1) to 3-$j$-L), a twelfth potential to the other third wires (not 3-$j$-1 to 3-$j$-L), a fourth potential to a fourth wire (4-$i$) ($i$: a positive integer satisfying the relation of $1 \leq i \leq M$) connected to the fourth electrode connected to the island-like semiconductor layer including the selected cell, an eighth potential to fourth wires (not 4-$i$) other than the above-mentioned fourth wire (4-$i$), a fifth potential to a fifth wire (5-$j$) connected to the fifth electrode arranged in series with the selected cell, and a sixth potential to either second wires (not 2-$j$) other than the second wire (2-$j$) or fifth wires (not 5-$j$) other than the fifth wire (5-$j$).

By the voltages, the F-N current is generated only in the tunnel oxide film of the selected cell, thereby enabling the state of the charge in the charge storage layer to be changed.

In the case where a negative charge is drawn from the charge storage layer for erasing data, the fourth potential is larger than the third potential. When a state where a negative charge is stored in the charge storage layer denotes "1", the state of the charge in the charge storage layer can be changed to "0". At this time, the third potential is a potential allowing the state to "0" by the difference between the third potential and the fourth potential. Specifically, the third potential is a potential allowing generation of a sufficient F-N current as means for changing the state of the charge. The F-N current flows in the tunnel oxide film of a memory transistor having, as the gate electrode, the third electrode to which the third potential is applied.

The seventh potential is a potential causing a sufficiently smaller change in the state of the charge in the charge storage layers in non-selected cells than that in the selected cell, specifically, a potential such that a difference between the seventh potential and the fourth potential causes a sufficiently small F-N current in the tunnel oxide films of the memory transistors having, as the gate electrodes, the third electrodes connected to the third wires (3-$j$–1 to 3-$j$-($h$–1)) to which the seventh potential is applied.

The eleventh potential is a potential causing a sufficiently smaller change in the state of the charge in the charge storage layers in non-selected cells than that in the selected cell, specifically, a potential such that a difference between the eleventh potential and the fourth potential causes a sufficiently small F-N current in the tunnel oxide films of the memory transistors having, as the gate electrodes, the third electrodes connected to the third wires (3-$j$-($h$+1) to 3-$j$-L) to which the eleventh potential is applied.

The second potential is a potential not allowing the F-N current to flow in the gate oxide film of the transistor having, as the gate electrode, the second electrode connected to the second wire.

The fifth potential is a potential not allowing the F-N current to flow in the gate oxide film of the transistor having, as the gate electrode, the fifth electrode connected to the fifth wire.

As the sixth potential, a potential similar to the second potential or the fifth potential can be employed.

The eighth potential is preferably a potential equal to the fourth or ninth potential applied to the terminal connected via an island-like semiconductor layer.

The twelfth potential is a potential causing a sufficiently smaller change in the state of the charge in the charge storage layers in non-selected cells than that in the selected cell, specifically, a potential such that a difference between the twelfth potential and the eighth potential and a difference between the twelfth potential and the fourth potential cause only a sufficiently small F-N current in the tunnel oxide films of the memory transistors having, as the gate electrodes, the third electrodes connected to the third wires (not 3-$j$–1 to 3-$j$-L) to which the twelfth potential is applied.

The first wires (1-1 to 1-M) may be open and the ninth potential may be open.

In the case where the first wires (1-1 to 1-N) are formed as impurity diffusion layers in the semiconductor substrate, the potential of the first wires (1-1 to 1-N) are floated, and the channel region of a selected memory cell is electrically connected to the semiconductor substrate, the fourth potential applied to the first wire (1-$j$) connected to the island-like semiconductor layer including the selected cell is a potential such that the island-like semiconductor layer is electrically floated from the semiconductor substrate by a depletion layer extended toward the semiconductor substrate owing to the application of the fourth potential. Thereby the potential of the island-like semiconductor layer becomes equal to the fourth potential and a sufficiently large F-N current flows in the tunnel oxide film of the memory transistor of the selected cell on the island-like semiconductor layer, so that data can be erased. That is, the difference between the fourth potential and the third potential becomes a potential difference allowing a sufficient F-N current to flow in the tunnel oxide film of the memory transistor.

In the case where the channel region of the memory cell is not electrically connected to the semiconductor substrate, the depletion layer owing to the fourth potential may be extended in any state.

In the case where the first wires (1-1 to 1-N) are formed so as to be electrically insulated from the semiconductor substrate, for example, in the case where the first wires (1-1 to 1-N) are formed of an impurity diffusion layer in an SOI substrate and are insulated from the semiconductor substrate by an insulating film, the first potential is not necessarily the same as the tenth potential.

In the case where the channel region of a memory cell is electrically connected to the semiconductor substrate, that is, in the case where the island-like semiconductor layers are not floated from the substrate by impurity diffusion layers, the tenth potential applied to the semiconductor substrate can erase simultaneously all memory cells having as the gate electrodes the third electrodes connected to the third wires to which the third potential is applied, provided that a difference between the tenth potential and the third potential causes a sufficient change in the state of the charge in the charge storage layer.

The memory cells may be sequentially erased from a memory cell connected to a third wire (3-$j$-L) to a memory cell connected to a third electrode (3-$j$-1), or may be erased in reverse order or at random.

Some or all memory cells connected to the third wire (3-$j$-$h$) may be erased at the same time, some or all memory cells connected to the third wires (3-$j$-1 to 3-$j$-L) may be erased at the same time, and some or all memory cells connected to the third wires (3-1-1 to 3-N-L) may be erased at the same time. Alternately, some or all memory cells connected to third wires selected regularly, e.g., the third wires (3-($j$−8)-$h$), (3-$j$-$h$), (3-($j$+8)-$h$), (3-($j$+16)-$h$), . . . , may be erased at the same time.

Some or all memory cells included in one island-like semiconductor layer connected to the fourth wire (4-$i$) may be erased at the same time, or some or all memory cells included in some or all island-like semiconductor layers connected to the fourth wire (4-$i$) may be erased at the same time. One, some or all memory cells included in one island-like semiconductor layer connected to each of a plurality of fourth wires may be erased at the same time, or some or all memory cells included in some or all island-like semiconductor layers connected to each of a plurality of fourth wires may be erased at the same time. The memory cells connected to the fourth wire (4-$j$-$h$) may be erased at the same time by given intervals, for example, every eight fourth wires (e.g., a fourth wire (4-($i$−16)), a fourth wire (4-($i$−8)), a fourth wire (4-$i$), a fourth wire (4-($i$+8)), a fourth wire (4-($i$+16)), . . . ).

All the memory cells having, as the gate electrodes, the third electrodes connected to the third wire (3-$j$-$h$) can be erased at the same time by applying the first potential to all the fourth wires, applying the fourth potential to the first wire (1-$j$), applying the eighth potential to the first wires (not 1-$j$), exchanging the potentials of the second and fifth wires with each other, and applying the third potential to the third wire (3-$j$-$h$). At this time, the fourth potential may be applied to an arbitrary fourth wire.

By applying the fourth potential to a plurality of first wires and applying the third potential to the third wires connected to the third electrodes of the memory cells included in the island-like semiconductor layers having the first electrodes connected to the plurality of first wires, all the memory cells having, as gate electrodes, the third electrodes connected to the third wires to which the third potential is applied can be erased at the same time.

The above-described erasing methods may be combined.

Erasure may be performed by changing the state of the charge in the charge storage layer and raising the threshold of the selected memory transistor. In this case, the third potential is smaller than the fourth potential, and the third potential is a potential allowing the state of the charge in the charge storage layer to be changed sufficiently by the difference between the third potential and the fourth potential, for example, a potential allowing generation of a sufficiently large F-N current. Means for changing the state of the charge in the charge storage layer is not limited to the F-N current.

Figure 64:
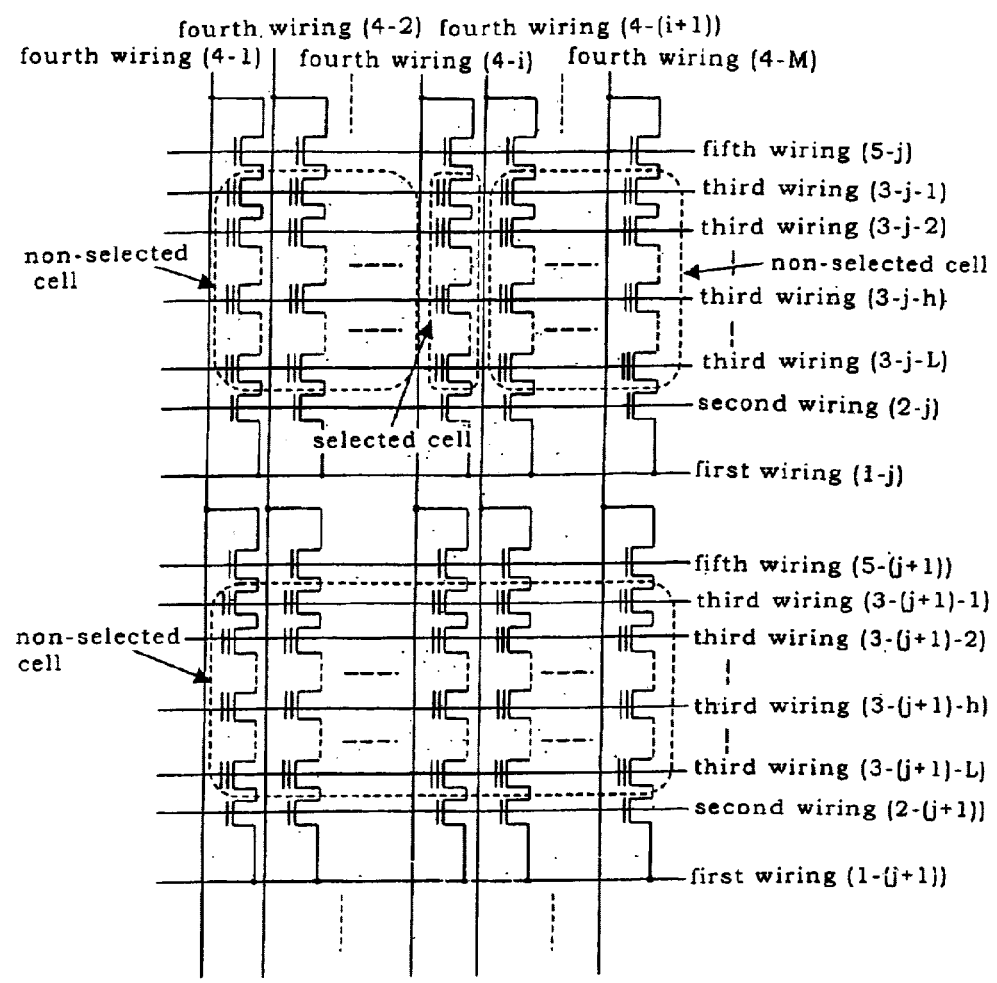

FIG. 64 shows an equivalent circuit of a memory cell array structure in which the first wires are arranged in parallel to the third wires. All memory cells on an island-like semiconductor layer defined by the first wire (1-$j$) and the fourth wire (4-$i$) can be selected and erased. The application of the voltages of FIG. 64 is the same as that of FIG. 63 except that the third potential is applied to the third wires (3-$j$–1 to 3-$j$-L).

Figure 65:
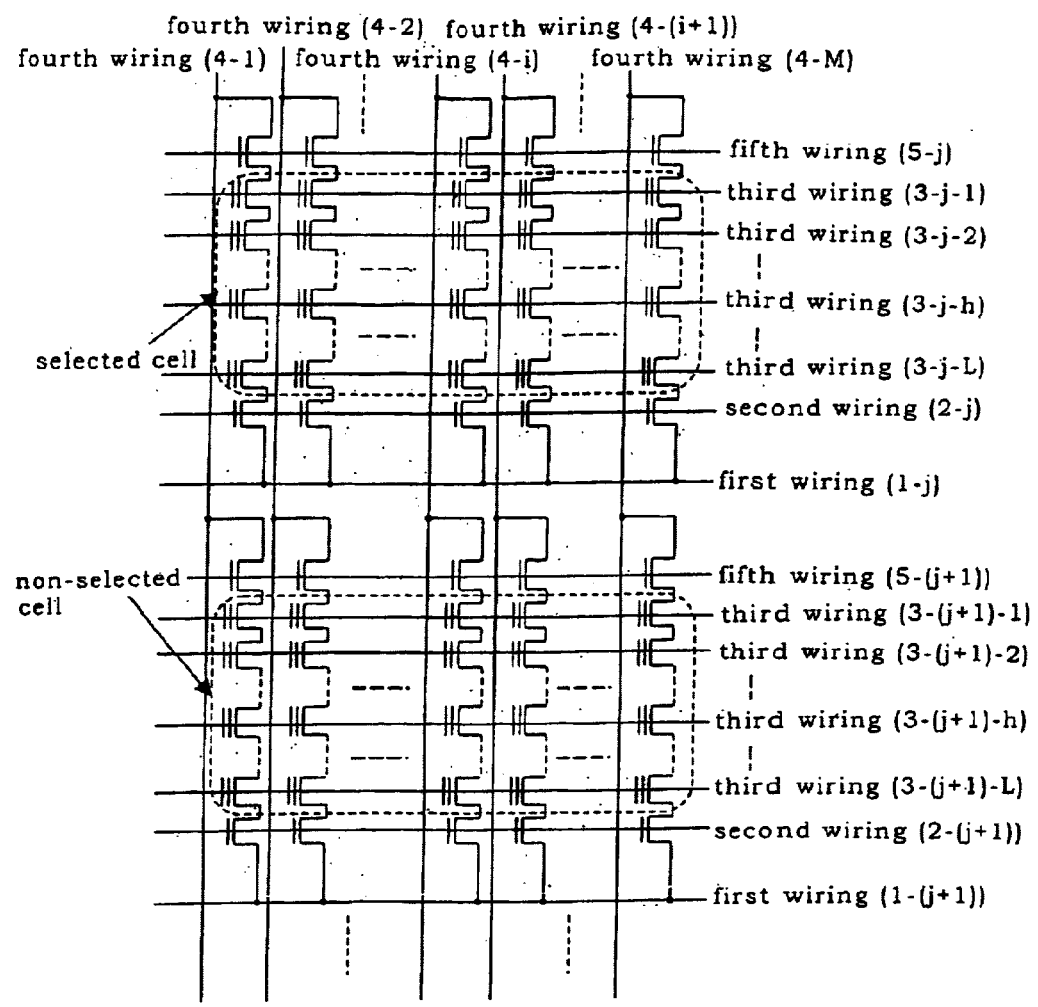

FIG. 65 shows an equivalent circuit of a memory cell array structure in which the first wires are arranged in parallel to the third wires. All memory cells on all island-like semiconductor layers connected to the first wire (1-$j$) can be selected and erased. The application of the voltages of FIG. 65 is the same as that of FIG. 63 except that the third potential is applied to the third wires (3-$j$–1 to 3-$j$-L) and the fourth potential is applied to the fourth wires (4-1 to 4-M).

Figure 66:
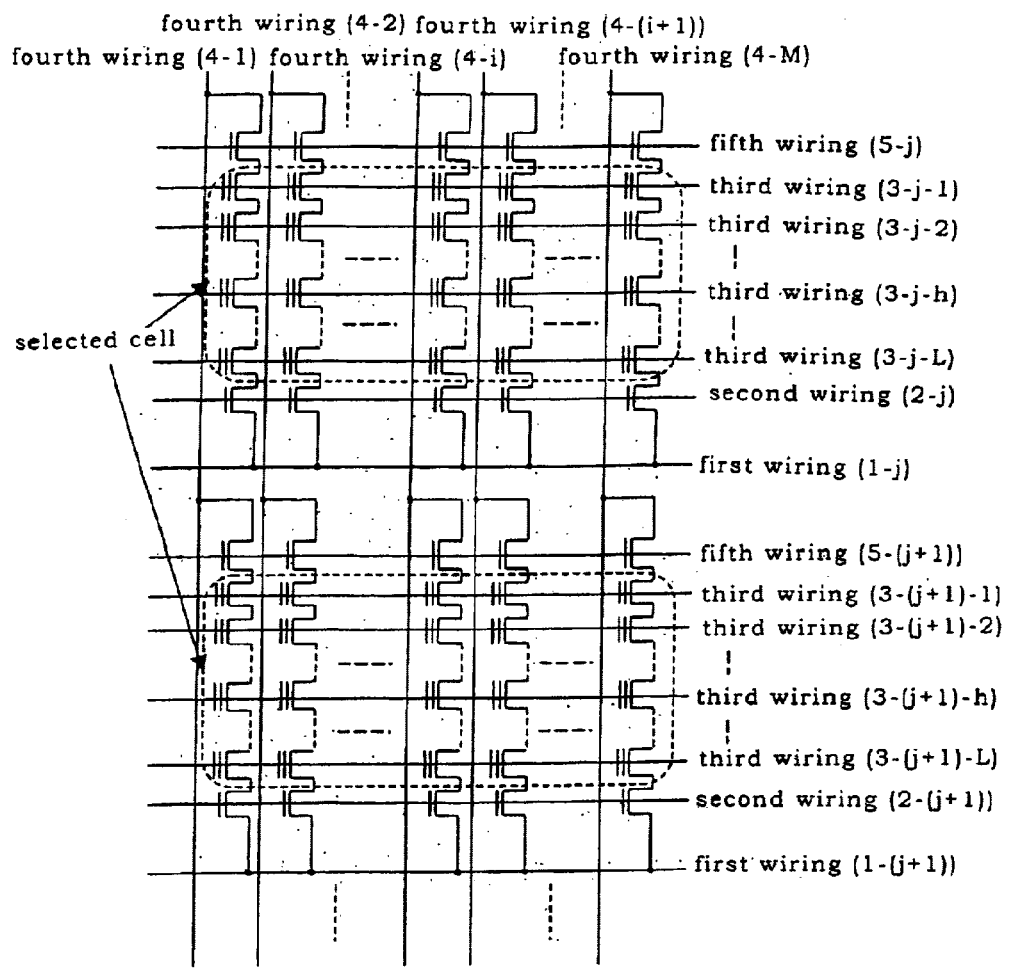

FIG. 66 shows an equivalent circuit of a memory cell array in which the first wires are arranged in parallel to the third wires. All memory cells on all island-like semiconductor layers connected to the first wires (1-1 to 1-N) can be selected and erased. The application of the voltages of FIG. 66 is the same as that of FIG. 63 except that the fourth potential is applied to the first wires (1-1 to 1-N), the third potential is applied to the third wires (3-$j$–1 to 3-N-L) and the fourth potential is applied to the fourth wires (4-1 to 4-M).

FIG. 68 shows an equivalent circuit of a memory cell array structure in which the first wires are arranged in parallel to the fourth wires. The application of the voltages of FIG. 68 is the same as that of FIG. 63 except that the fourth potential is applied to the first wire (1-$i$) and the ninth potential is applied to first wires (not 1-$i$).

Figure 69:
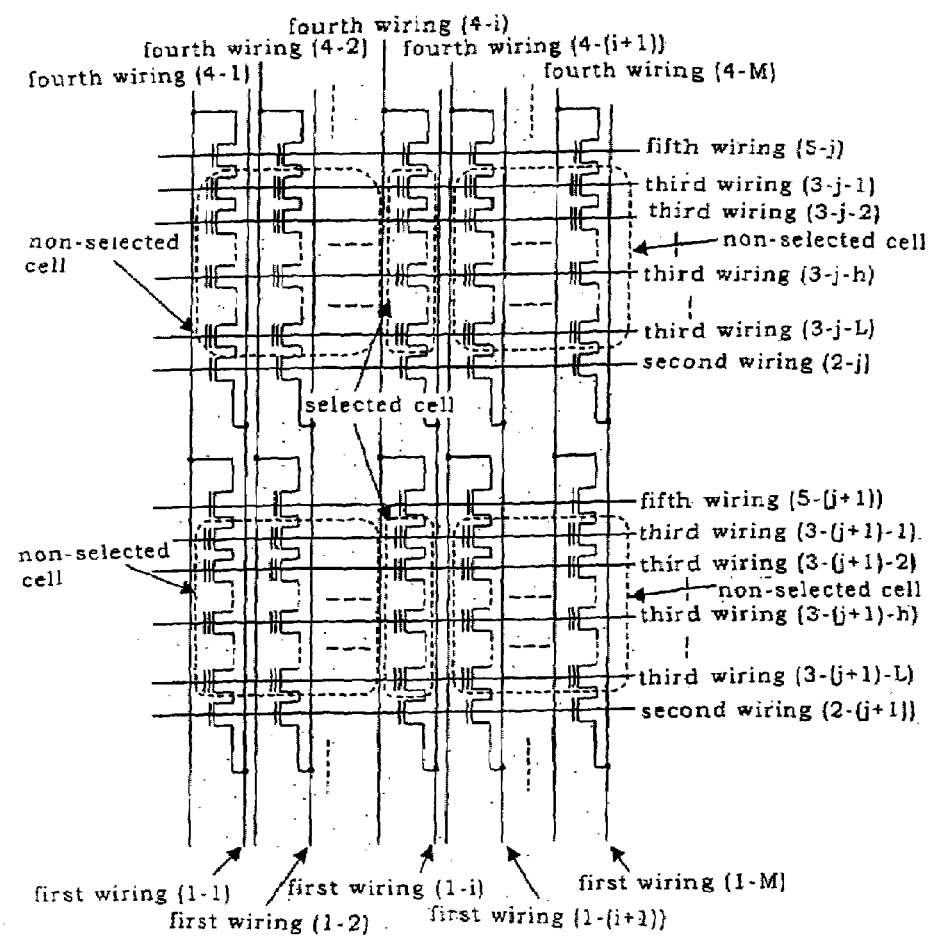

FIG. 69 shows an equivalent circuit of a memory cell array structure in which the first wires are arranged in parallel to the fourth wires. All memory cells on an island-like semiconductor layer defined by the first wire (1-*i*) and the fourth wire (4-*i*) can be selected and erased. The application of the voltages of FIG. 69 is the same as that of FIG. 63 except that the third potential is applied to the third wires (3-*j*-1 to 3-N-L).

FIG. 70 shows an equivalent circuit of a memory cell array in which a plurality of first wires are electrically connected in common. The application of the voltages of FIG. 70 is the same as that of FIG. 63 except that the fourth potential is applied to the first wire (1-1).

Figure 71:
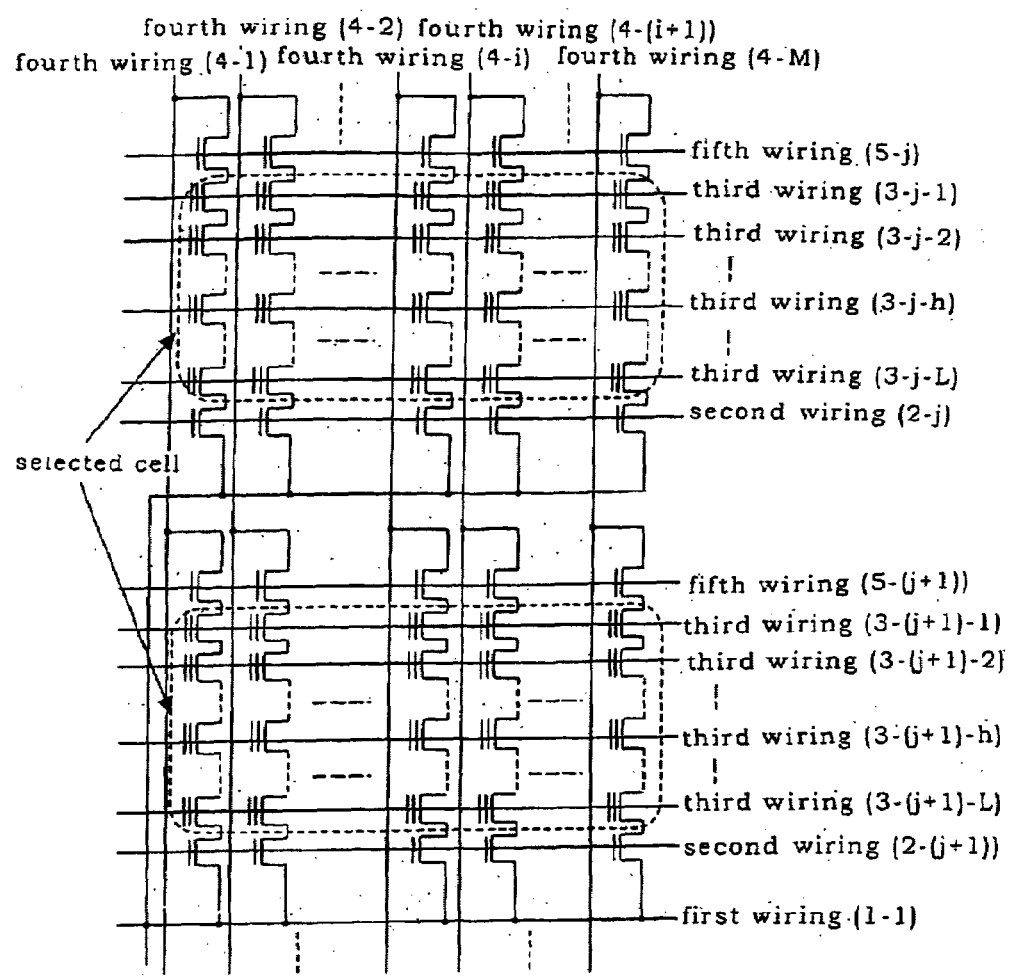

FIG. 71 shows an equivalent circuit of a memory cell array structure in which a plurality of first wires are electrically connected and are in common. All memory cells on all island-like semiconductor layers connected to the first wire (1-1) can be selected and erased. The application of the voltages of FIG. 71 is the same as that of FIG. 70 except that the fourth potential is applied to the first wire (1-1), the third potential is applied to the third wires (3-*j*-1 to 3-(*j*+1)-L) and the fourth potential is applied to the fourth wires (4-1 to 4-M).

Figure 72:
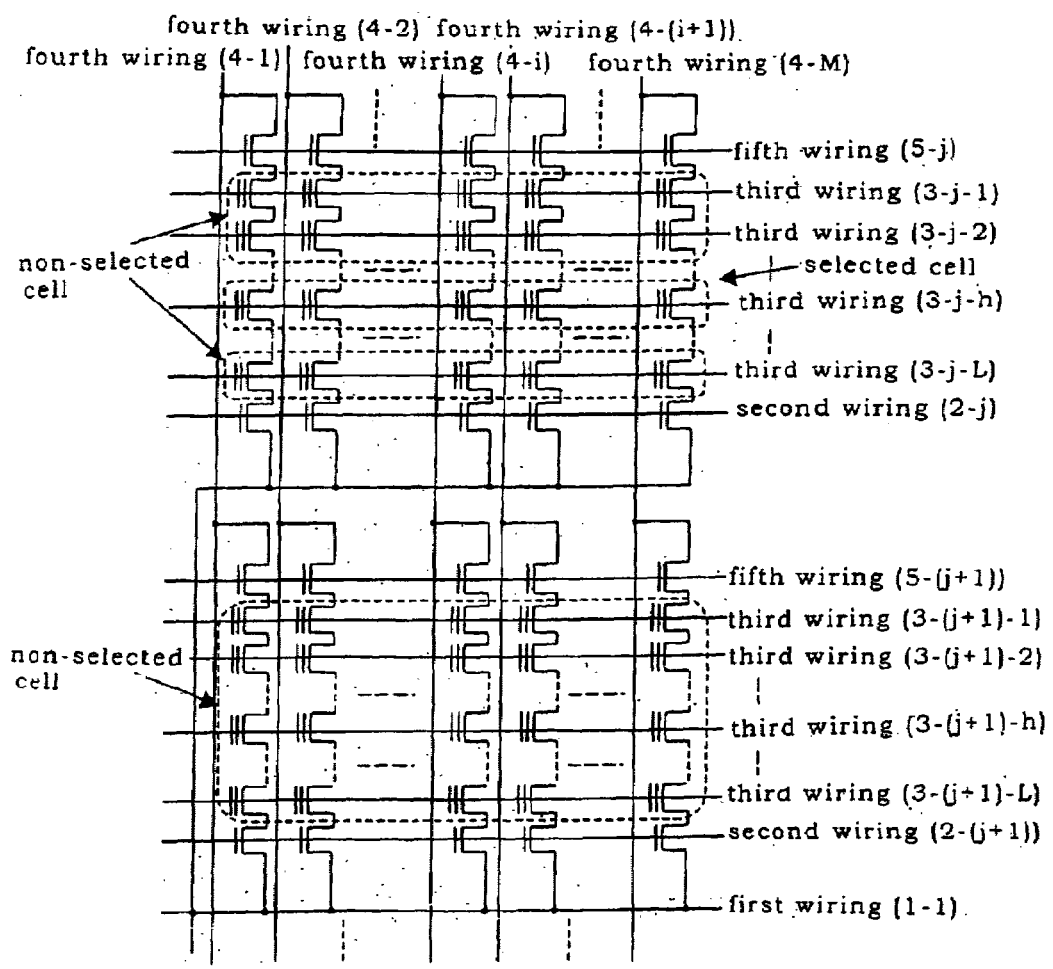

FIG. 72 shows an equivalent circuit of a memory cell array structure in which a plurality of first wires are electrically connected and are in common. All memory cells connected to the third wire (3-*j*-*h*) can be selected and erased. The application of the voltages of FIG. 72 is the same as that of FIG. 70 except that the fourth potential is applied to the first wire (1-1), the third potential is applied to the third wire (3-*j*-*h*) and the fourth potential is applied to the fourth wires (4-1 to 4-M).

Timing charts of voltages in the erasing operation will be described hereinbelow with respect to the case where there are arranged M×N (M and N: positive integers) island-like semiconductor layers having L (L: a positive integer) memory cells formed of the P-type semiconductor and arranged in series and selection transistors formed so as to sandwich the memory cells, the first wires and the third wires are arranged in parallel and the selected cell is a memory cell having the selected third electrode as the gate electrode.

Figure 67:
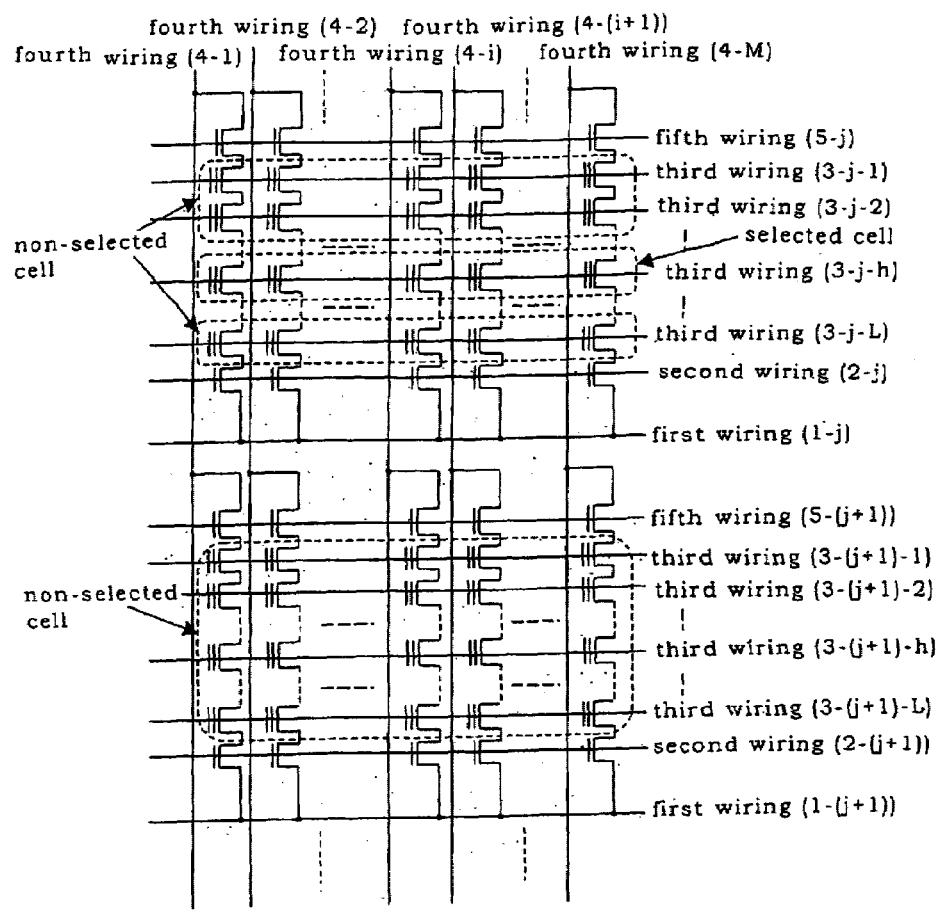
Figure 101:
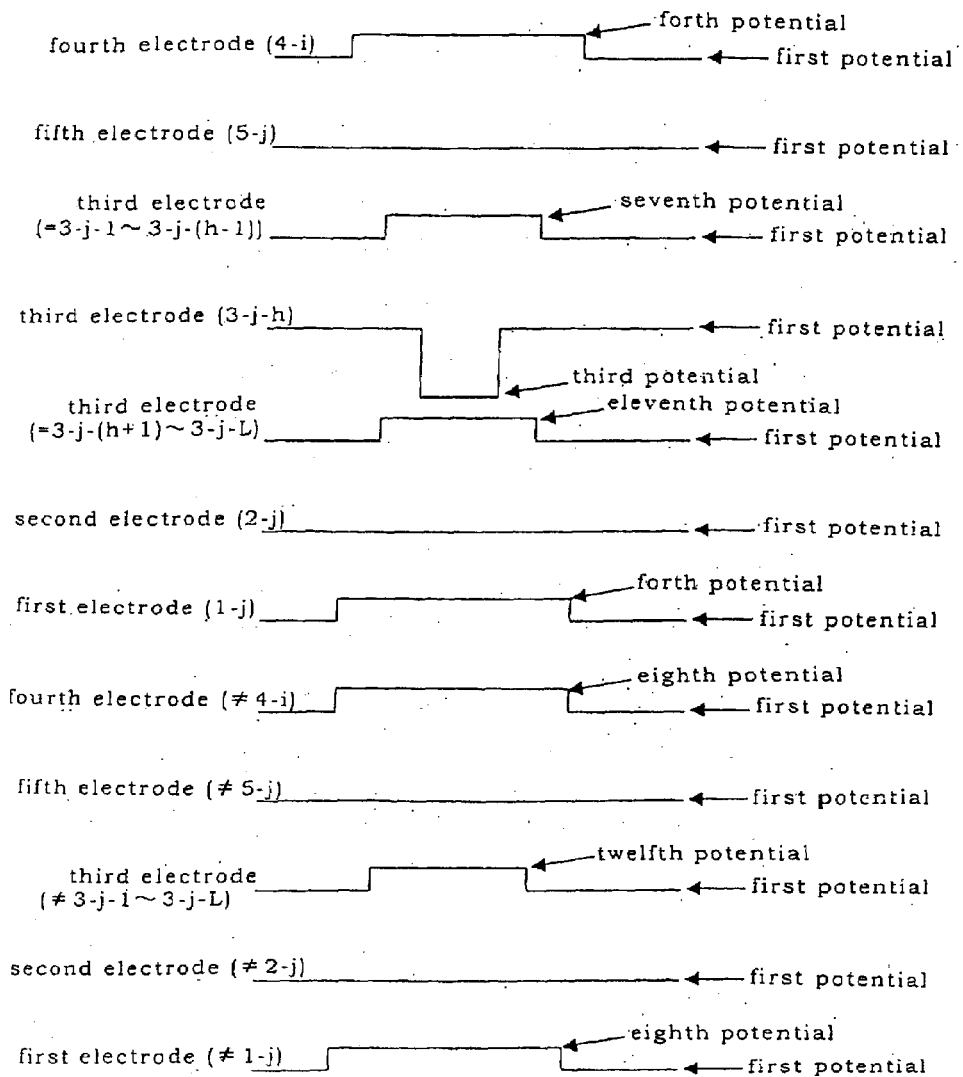

FIG. 101 shows timings of potentials applied to the electrodes in the erasing operation in the case where a selected third wire as shown in FIG. 67 is negative-biased, the threshold of transistors having gate electrodes connected to the second wire and the fifth wire is 0.5 V, and the memory cell has a threshold of 1.0 V to 3.5 V when it is in the written state and has a threshold of −1.0 V or lower when it is in the erased state.

For drawing a negative charge from the charge storage layer, first, the ground potential is applied as the first potential to the first wires (1-1 to 1-N), the second wires (2-1 to 2-N), the third wires (3-1-1 to 3-N-L), the fourth wires (4-1 to 4-M) and the fifth wires (5-1 to 5-N).

The eighth potential, e.g., 6 V which is equal to the fourth potential is applied to first wires (not 1-*j*) other than the first wire (1-*j*), the eighth potential, e.g., 6 V which is equal to the fourth potential is applied to fourth wires (not 4-*i*) other than the fourth wire (4-*i*), the fourth potential, e.g., 6 V, is applied to the first wire (1-*j*), the fourth potential, e.g., 6 V, is applied to the fourth wire (4-*i*), the seventh potential, e.g., 6 V, is applied to third wires (3-*j*-1 to 3-*j*-(*h*−1)) (h: a positive integer satisfying the relation of $1 \leq h \leq L$) other than the third wire (3-*j*-*h*), the eleventh potential, e.g., 6 V, is applied to third wires (3-*j*-(*h*+1) to 3-*j*-L) (h: a positive integer satisfying the relation of $1 \leq h \leq L$), the twelfth potential, e.g., 6 V, is applied to the other third wires (not 3-*j*-1 to 3-*j*-L), and the third potential, e.g., −12 V, is applied to the third wire (3-*j*-*h*). The selected cell is erased to "0" by holding this state for a desired period of time. The timings of applying potentials to the respective wires may be in another order or simultaneously.

After that, the third wire (3-*j*-*h*), the third wires (not 3-*j*-*h*) other than the third wire (3-*j*-*h*), the fourth wires (4-1 to 4-M), and the first wires (1-1 to 1-N) are reset to the ground potential. The timings of resetting respective electrodes to the ground potential may be in another order or simultaneously. The potentials to be given may be in any combination of potentials so long as conditions for erasing a desired cell are satisfied.

Although it is preferable to initially apply the first potential as the same potential to the first wires (1-1 to 1-N), the second wires (2-1 to 2-N), the third wires (3-1-1 to 3-N-L), the fourth wires (4-1 to 4-M) and the fifth wires (5-1 to 5-N), different potentials may be applied.

Thereby a plurality of cells connected to the selected third wire as shown in FIG. 67 are erased.

In the above, the erasing method has been described with respect to the case where the selected cell is a memory cell having the third wire (3-*j*-*h*) as the gate electrode. The erasing method is the same also with respect to the case where the selected cell is a memory cell having a third wire other than the third wire (3-*j*-*h*) as the gate electrode.

Figure 102:
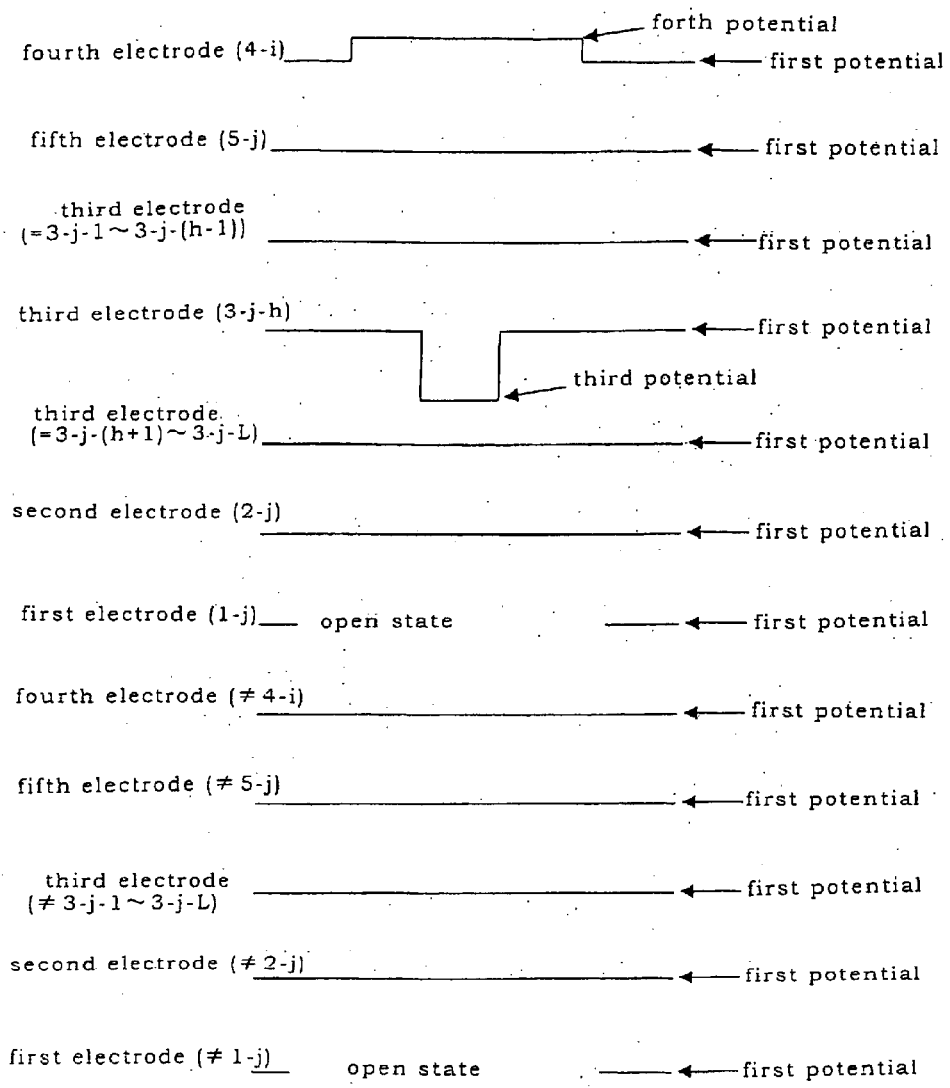

FIG. 102 shows a timing chart of wiring operation in the case where the first wire is open. The erasing process of FIG. 102 corresponds to that of FIG. 101 except that the ground potential is applied to the non-selected third wires (not 3-*i*-*h*) (h: a positive integer satisfying the relation of $1 \leq h \leq L$) and the fourth wires (not 4-*i*) and the first wire is open. The operation of erasing the selected cell as shown in FIG. 63 is not influenced.

If 6 V is applied as the eighth potential to the fourth wires (not 4-*i*), a plurality of cells connected to the selected third wire as shown in FIG. 67 can be erased. If 6 V is applied as the eighth potential to the fourth wires (not 4-*i*) and −12 V is applied as the third potential to the third wires (3-*i*-1 to 3-*i*-(*h*−1)) and the third wires (3-*i*-(*h*−1) to 3-*i*-L), a plurality of cells connected to the first wire (1-*j*) as shown in FIG. 65 are erased.

If 6 V is applied as the fourth potential to all the fourth wires (4-1 to 4-M) and −12 V is applied as the third potential to all the third wires (3-1-1 to 3-N-L), all cells as shown in FIG. 66 can be erased.

Figure 103:
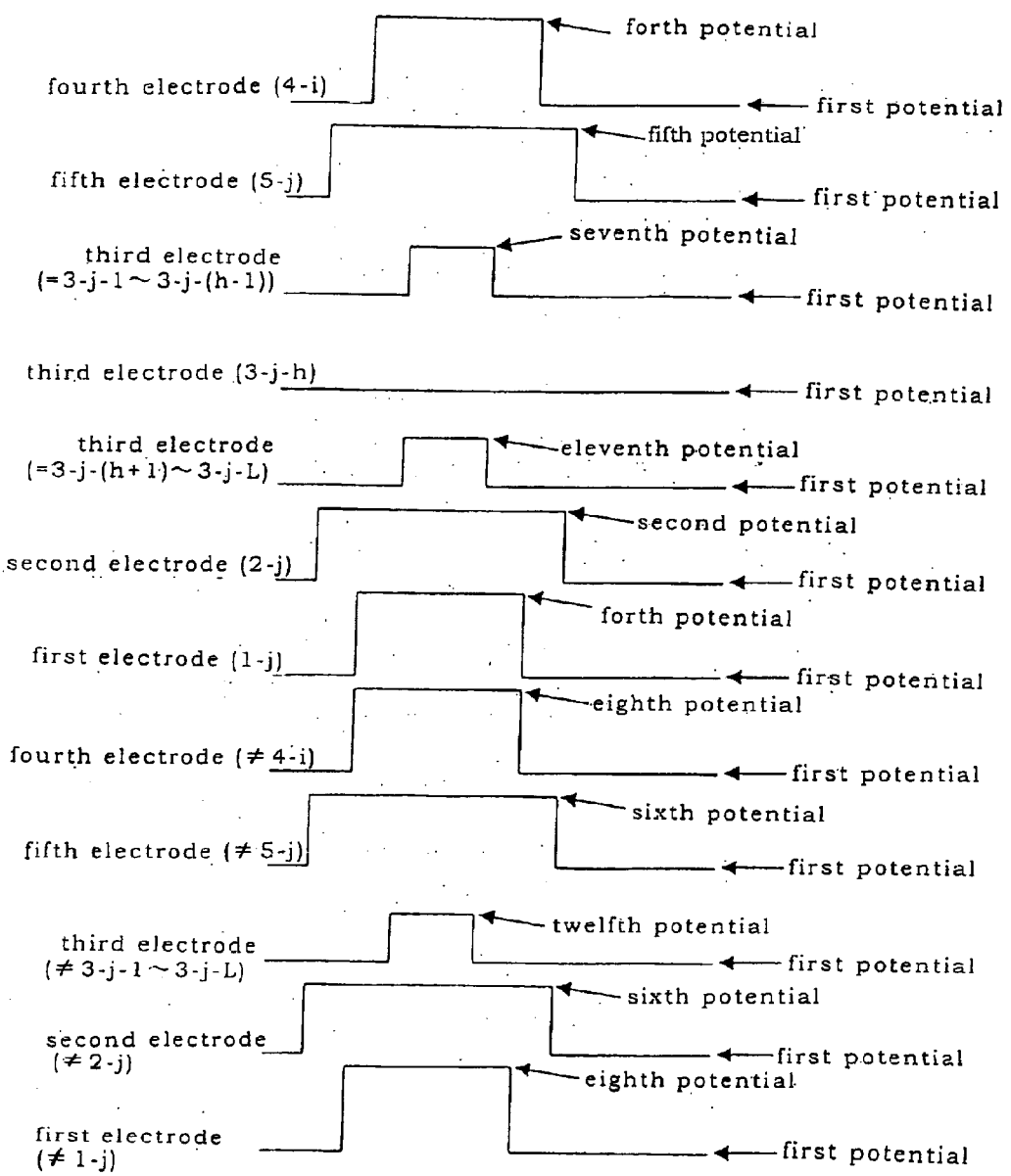

FIG. 103 is a timing chart of potentials applied to the electrodes in the erasing operation in the case where 18 V is applied as the fourth potential and the ninth potential to the first wire, the threshold of transistors having gate electrodes connected to the second wire and the fifth wire is 0.5 V, and the memory cell has a threshold of 1.0 V to 3.5 V when it is in the written state and has a threshold of −1.0 V or lower when it is in the erased state.

For drawing a negative charge from the charge storage layer, first, the ground potential is applied to the first wires (1-1 to 1-N), the second wires (2-1 to 2-N), the third wires (3-1-1 to 3-N-L), the fourth wires (4-1 to 4-M) and the fifth wires (5-1 to 5-N). In this state, the sixth potential, e.g., 18 V, is applied to second wires (not 2-*j*) and fifth wires (not 5-*j*), the second potential, e.g., 18 V, is applied to the second wire (2-*j*), the fifth potential, e.g., 18 V, is applied to the fifth wire (5-*j*), the eighth potential, e.g., 18 V which is equal to the fourth potential is applied to fourth wires (not 4-*i*) other than the fourth wire (4-*i*), the eighth potential, e.g., 18 V which is equal to the fourth potential is applied to first wires (not 1-*j*) other than the first wire (1-*j*), the fourth potential, e.g., 18 V, is applied to the fourth wire (4-*i*), the fourth potential, e.g., 18 V, is applied to the first wire (1-*j*), the seventh potential, e.g., 10 V, is applied to third wires (3-*j*-1 to 3-*j*-(h−1)) (h: a positive integer satisfying the relation of 1≦h≦L) other than the third wire (3-*j*-h), the eleventh potential, e.g., 10 V, is applied to third wires (3-*j*-(h+1) to 3-*j*-L) (h: a positive integer satisfying the relation of 1≦h≦L), the twelfth potential, e.g., 10 V, is applied to the other third wires (not 3-*j*-1 to 3-*j*-L), and the ground potential as the third potential is continuously applied to the third wire (3-*j*-h). The selected cell is erased to "0" by holding this state for a desired period of time. The timings of applying the potentials to the wires may be in another order or simultaneous.

After that, the third wires (not 3-*j*-h) other than the third wire (3-*j*-h), the fourth wires (4-1 to 4-M), the first wires (1-1 to 1-N), the second wires (2-1 to 2-N), and the fifth wires (5-1 to 5-N) are reset to the ground potential. The timings of resetting the wires to the ground potential may be in another order or simultaneous. Any combination of the potentials may be employed as long as conditions for erasing a desired cell are satisfied.

Although it is preferable to initially apply the first potential as the same potential to the first wires (1-1 to 1-N), the second wires (2-1 to 2-N), the third wires (3-1-1 to 3-N-L), the fourth wires (4-1 to 4-M) and the fifth wires (5-1 to 5-N), different potentials may be applied.

Thereby a plurality of cells connected to the selected third wire as shown in FIG. 67 can be erased.

In the above, the erasing method has been described with respect to the case where the selected cell is a memory cell having the third wire (3-*j*-h) as the gate electrode. The erasing method is the same with respect to the case where the selected cell is a memory cell having a third wire other than the third wire (3-*j*-h) as the gate electrode.

If the ground potential is applied as the third potential to the third wires (3-*i*-1 to 3-*i*-(h−1)) and the third wires (3-*i*-(h−1) to 3-*i*-L), a plurality of cells connected to the first wire (1-*j*) as shown in FIG. 65 are erased.

Figure 104:
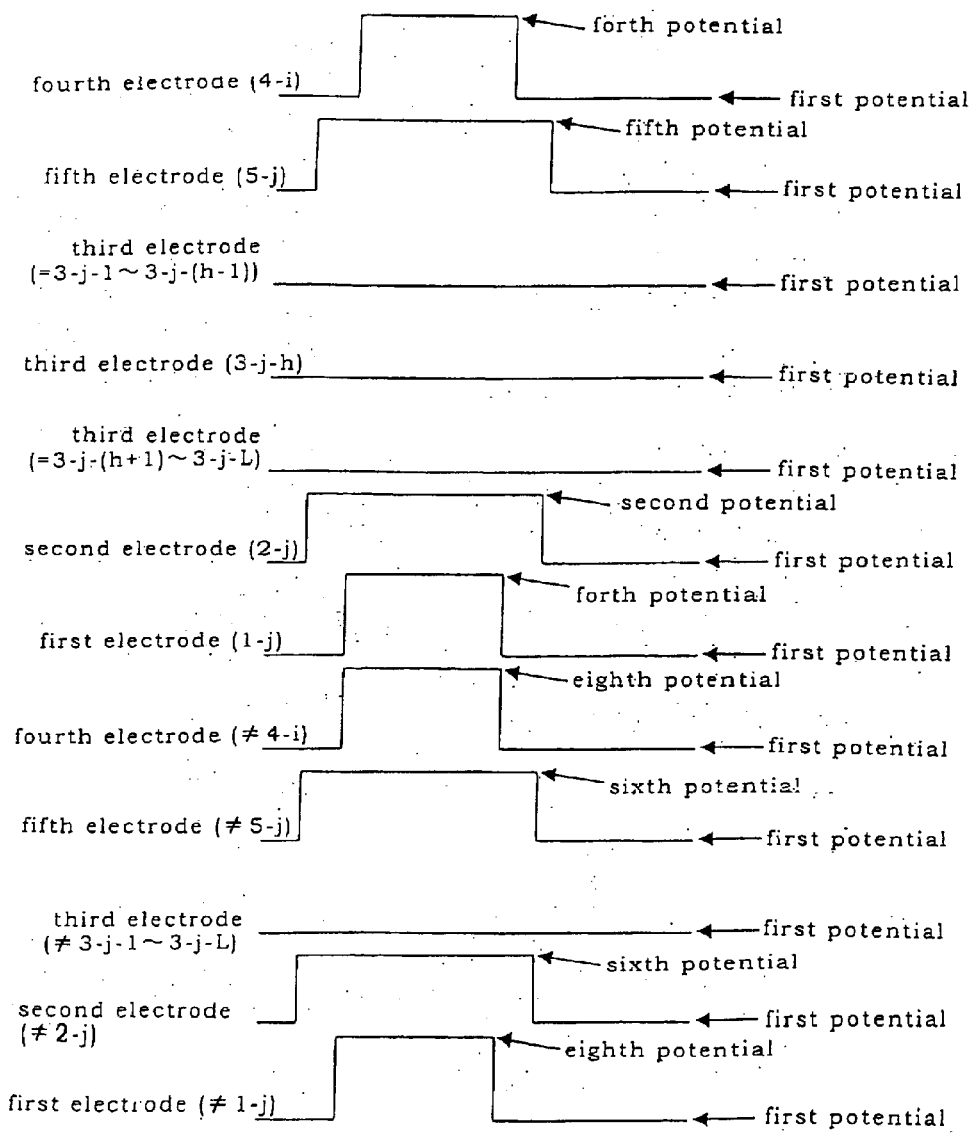
Figure 105:
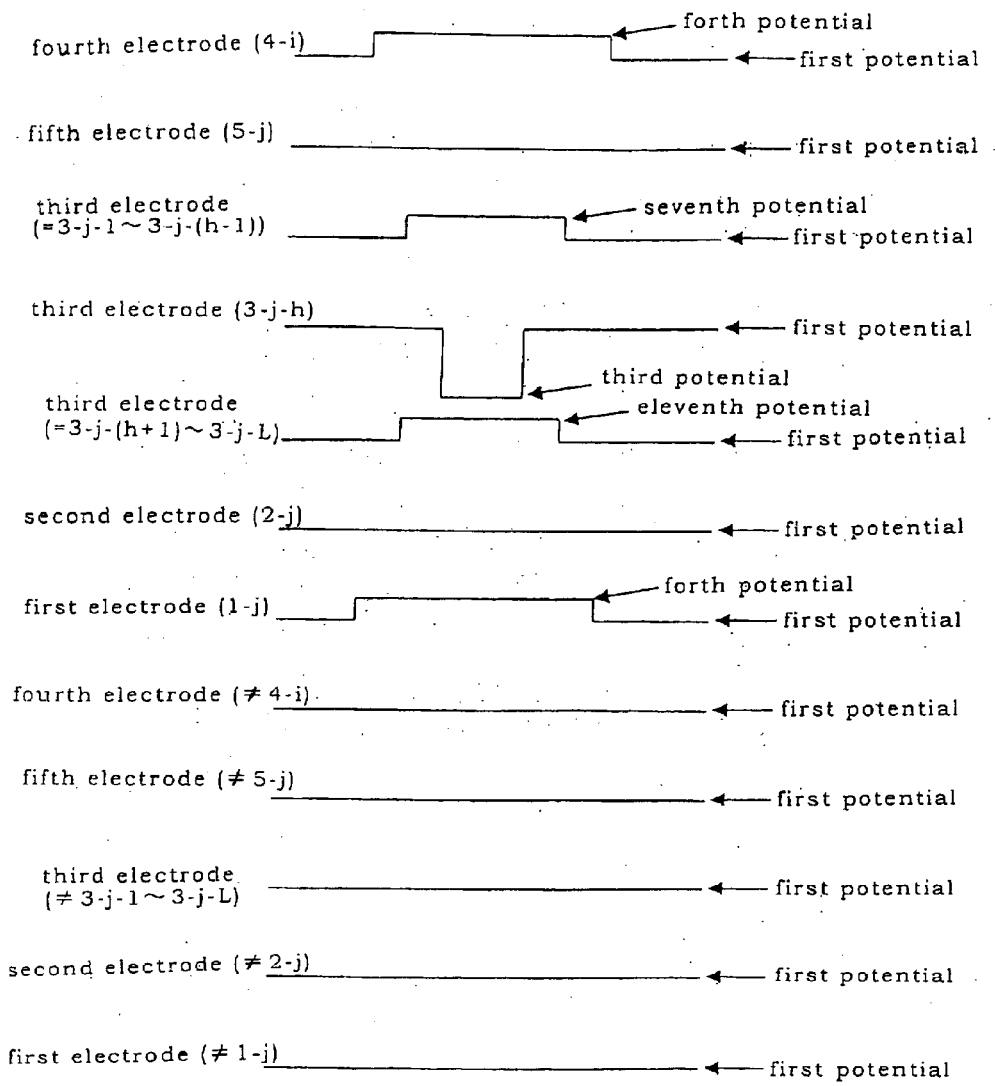
Figure 106:
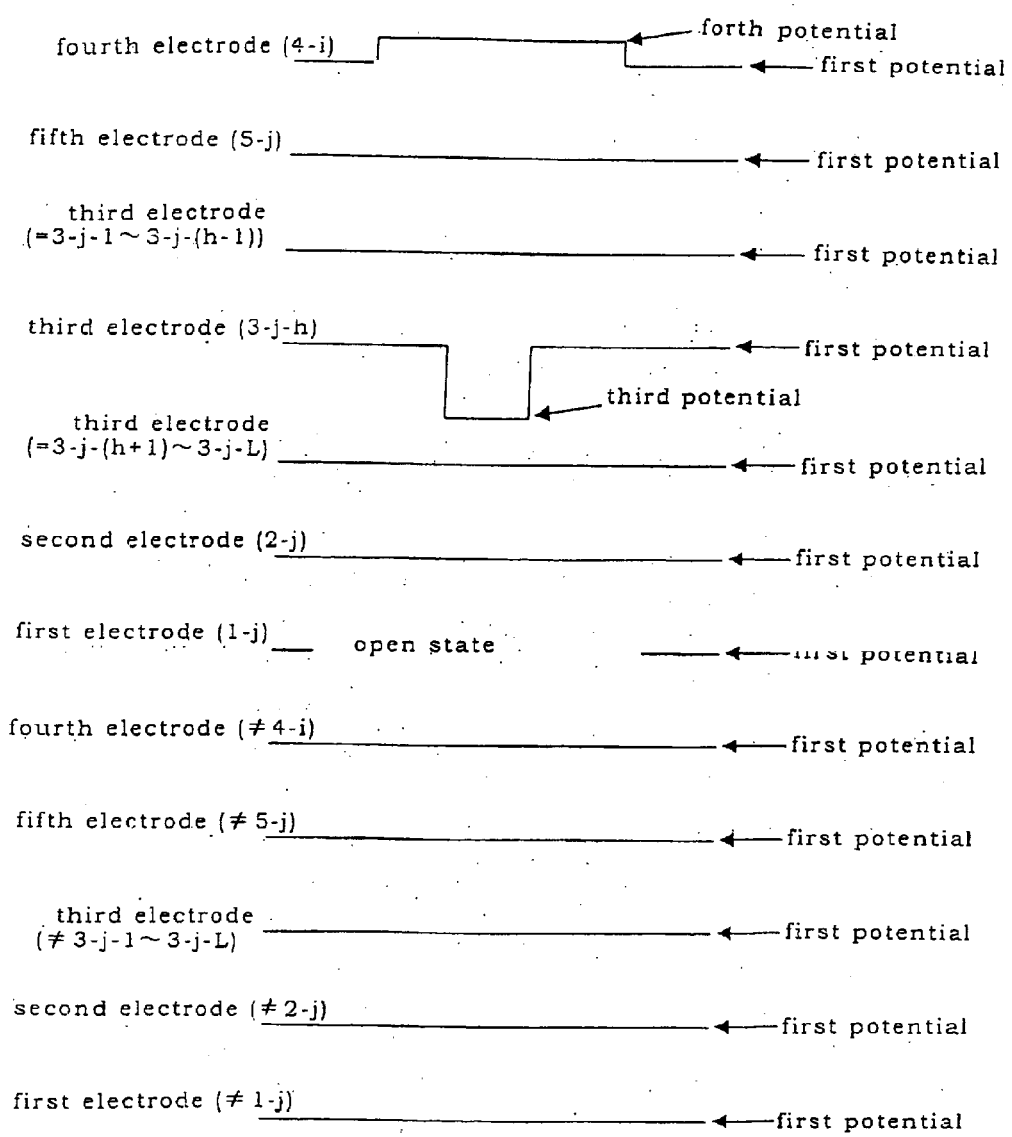
Figure 107:
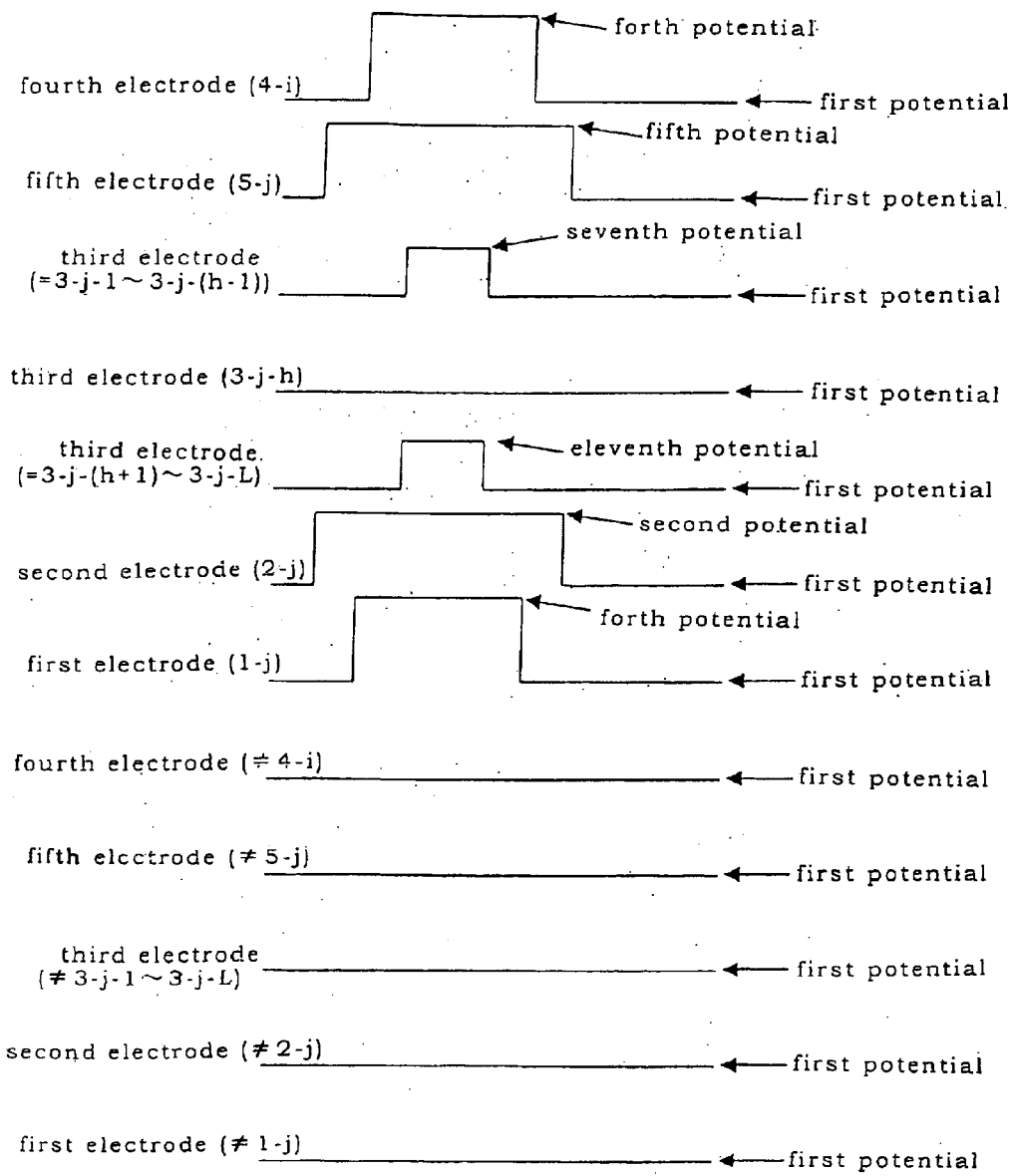

If the ground potential is applied as the third potential to all the third wires (3-1-1 to 3-N-L) and the potentials are applied at the timings shown in FIG. 104, all cells as shown in FIG. 66 can be erased.

Figure 132:
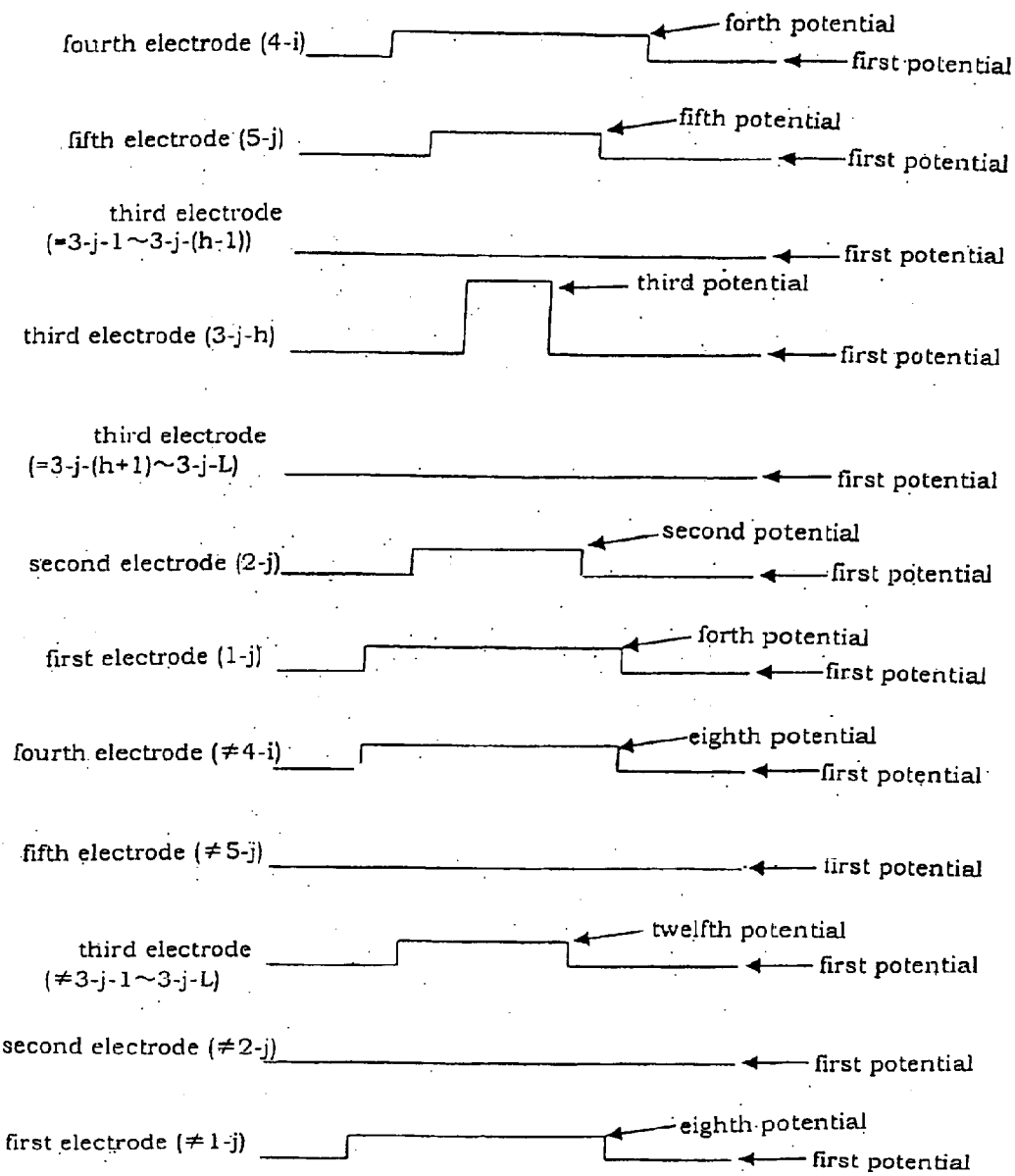
Figure 133:
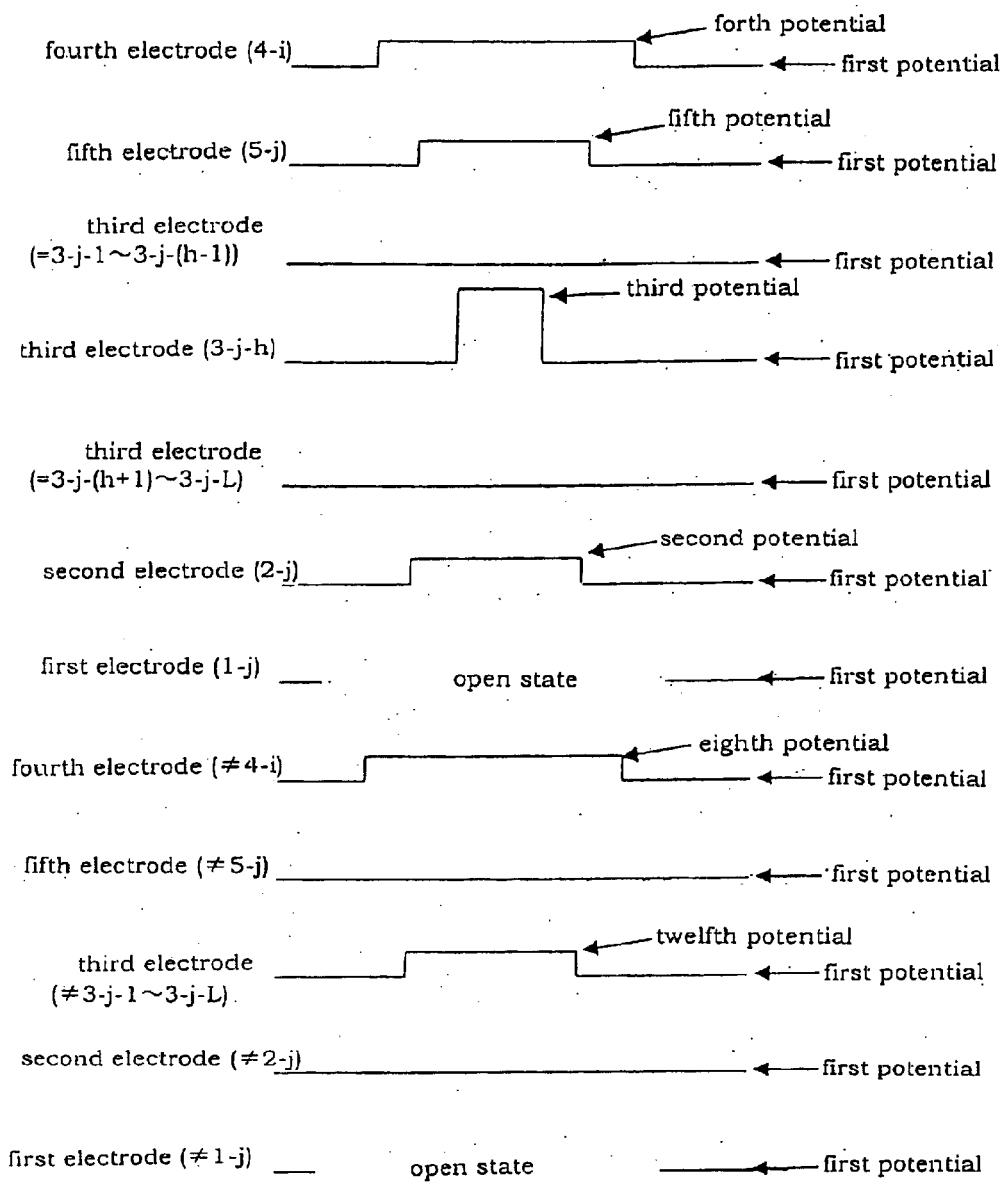

FIGS. 132 and 133 show timing charts of erasing operation in the case where 20 V is applied as the third potential to the third electrode (30-h) and storing a negative charge in the charge storage layer, thereby erasing data. The erasing operation conforms to FIGS. 101 and 102 except that the polarity of the third potential is different.

FIGS. 105 to 108 show timing charts of erasing operation in the case where the first wires are disposed in parallel to the fourth wires. FIGS. 105 to 108 correspond to FIGS. 101 to 104, respectively, except that the first wire (1-*i*) instead of the first wire (1-*j*) is connected to the end of the island-like semiconductor layer including the selected cell. As shown in FIGS. 105 to 108, the ground potential may be applied to the fifth wires (not 5-*j*), the fourth wires (not 4-*i*), the third wires (not 3-*j*-1 to 3-*j*-L), the second wires (not 2-*j*) and the first wires (not 1-*i*).

Figure 108:
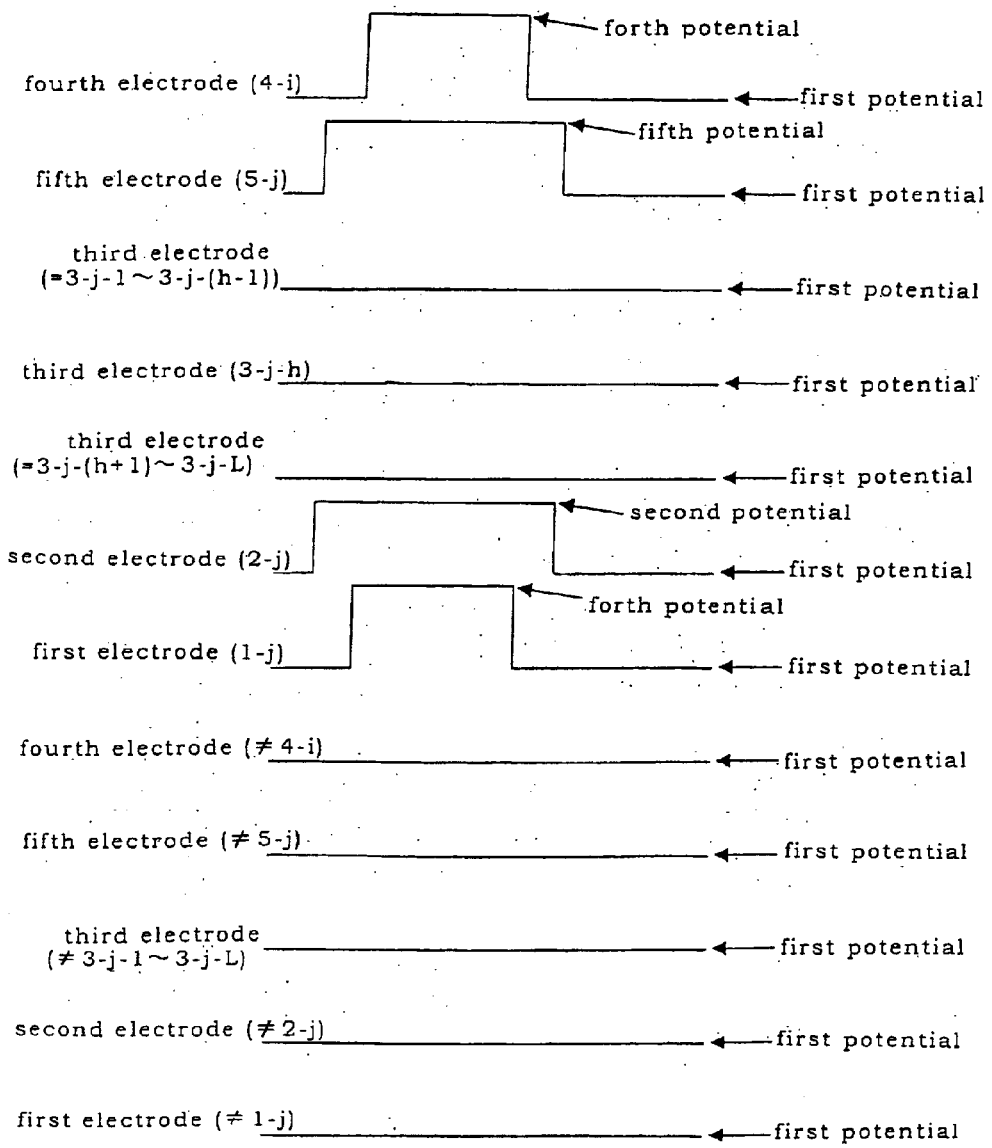
Figure 109:
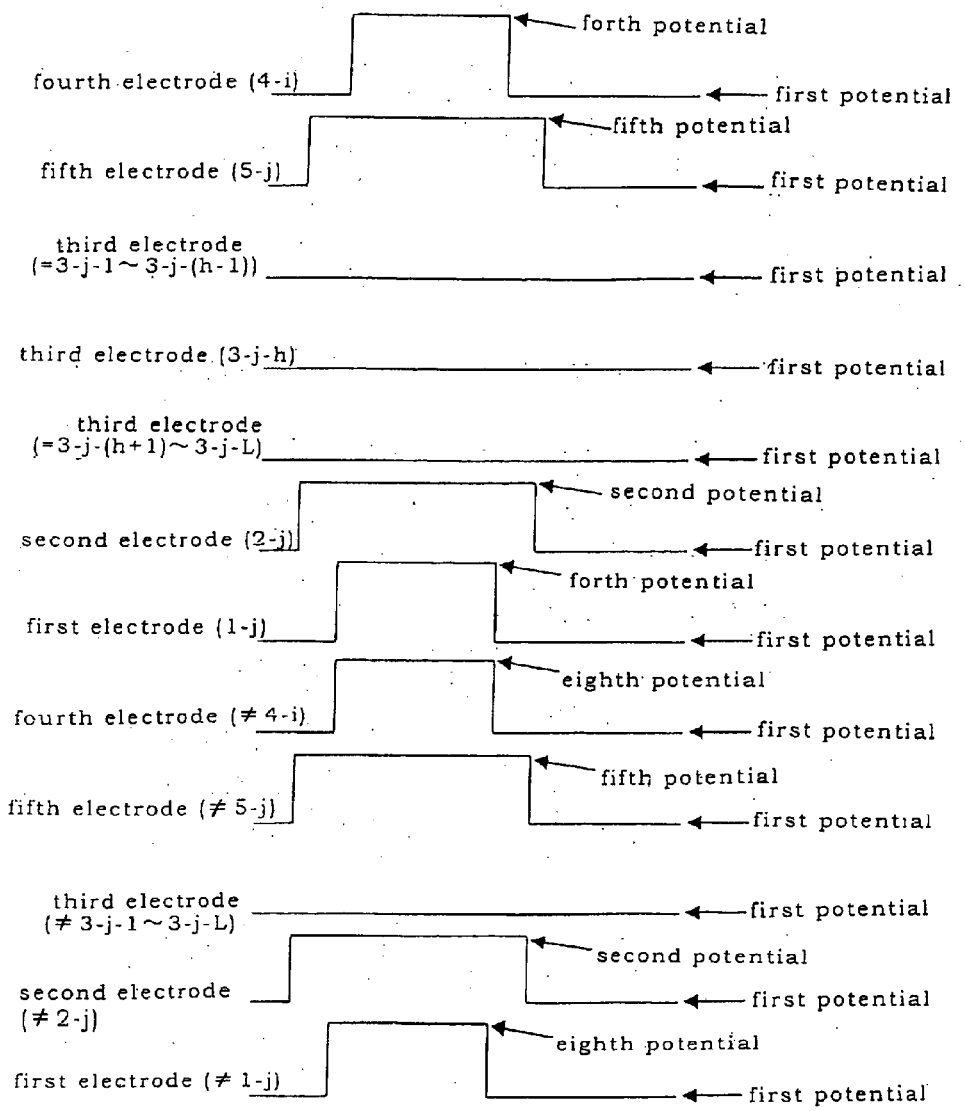
Figure 110:
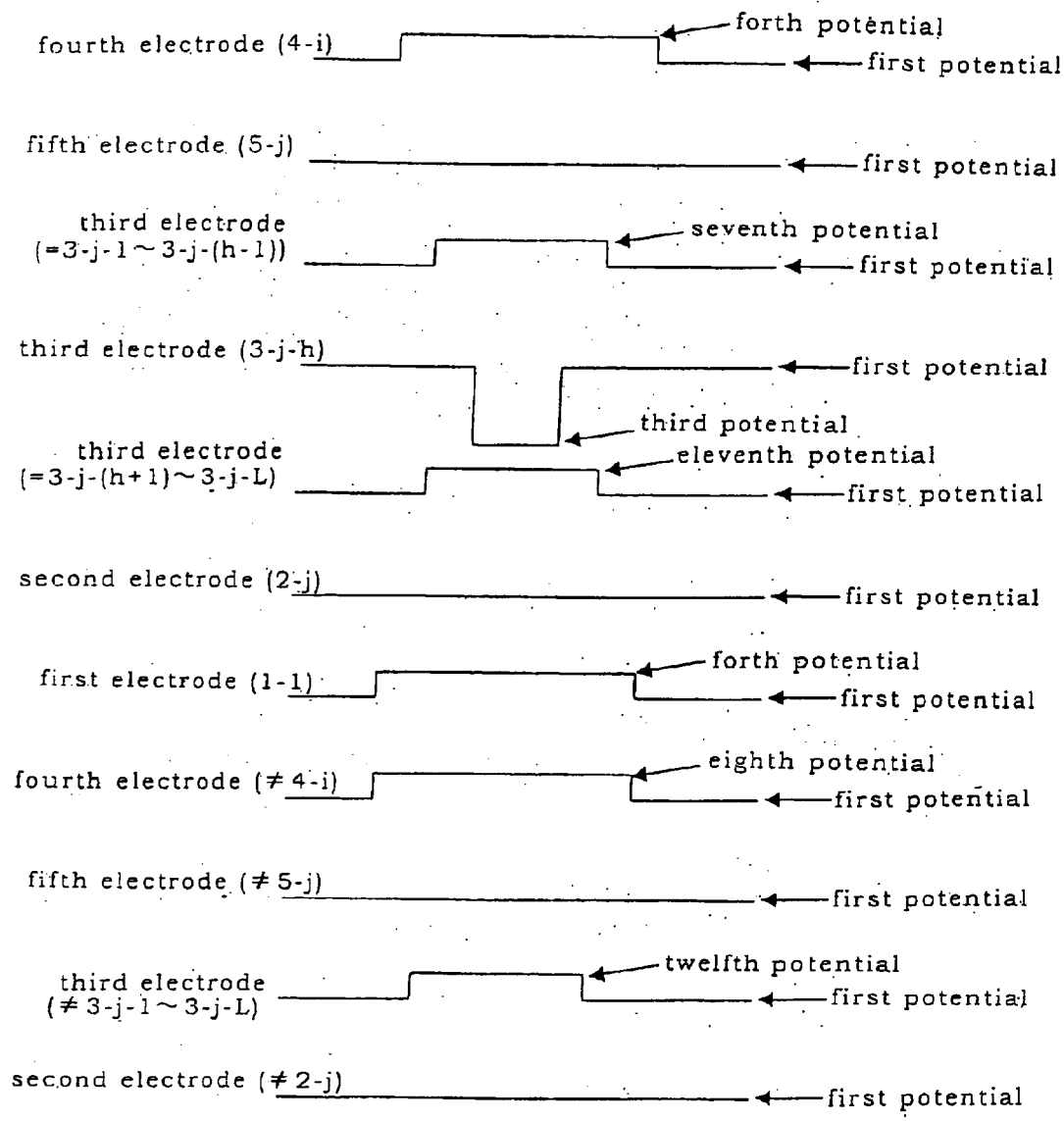
Figure 111:
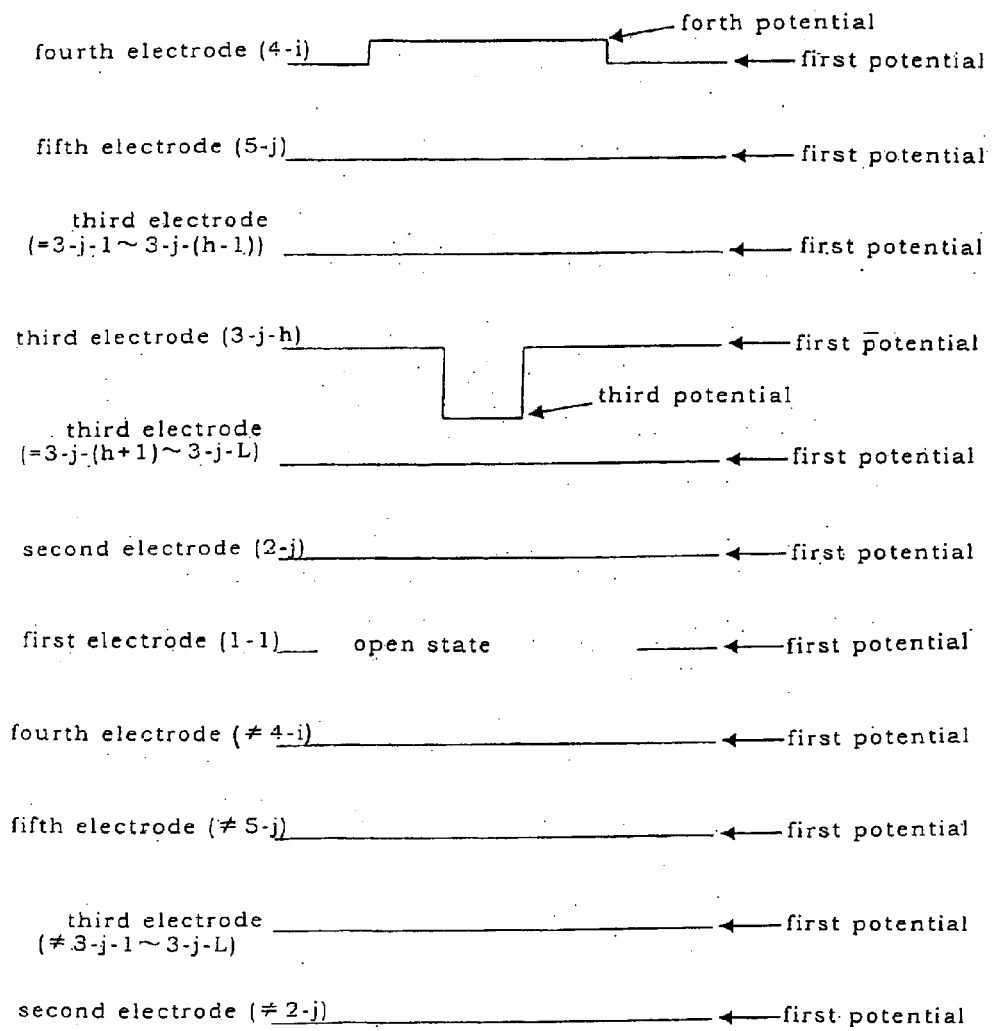
Figure 112:
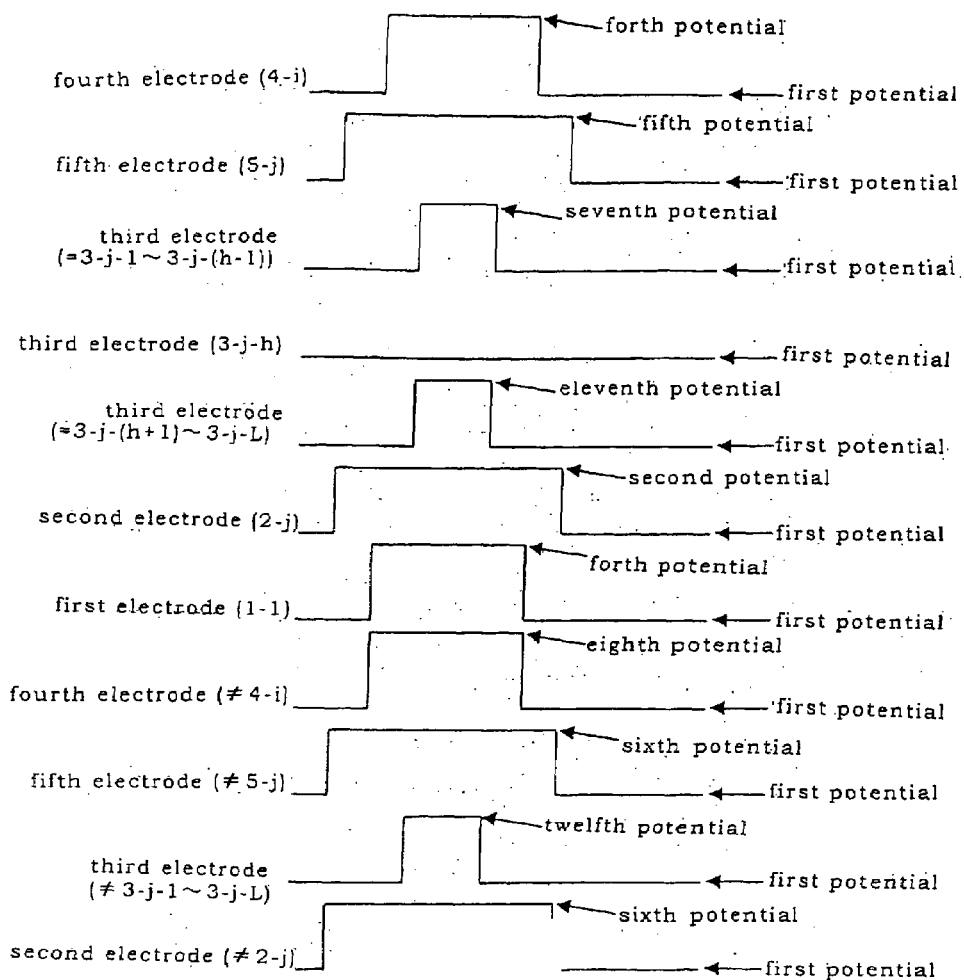

When the ground potential is applied as the third potential to the third wires (3-*j*-1 to 3-*j*-L) and the potentials are applied at the timings shown in FIG. 108, cells connected to the first wire (1-*i*) as shown in FIG. 65 can be erased. As shown in FIG. 109, if 18 V is applied as the fifth potential to the fifth wires (not 5-*j*), 18 V is applied as the second potential to the second wires (not 2-*j*) and 18 V is applied as the fourth potential to the fourth wires (not 4-*i*) and the first wires (not 1-*i*), all cells as shown in FIG. 66 can be erased.

Figure 134:
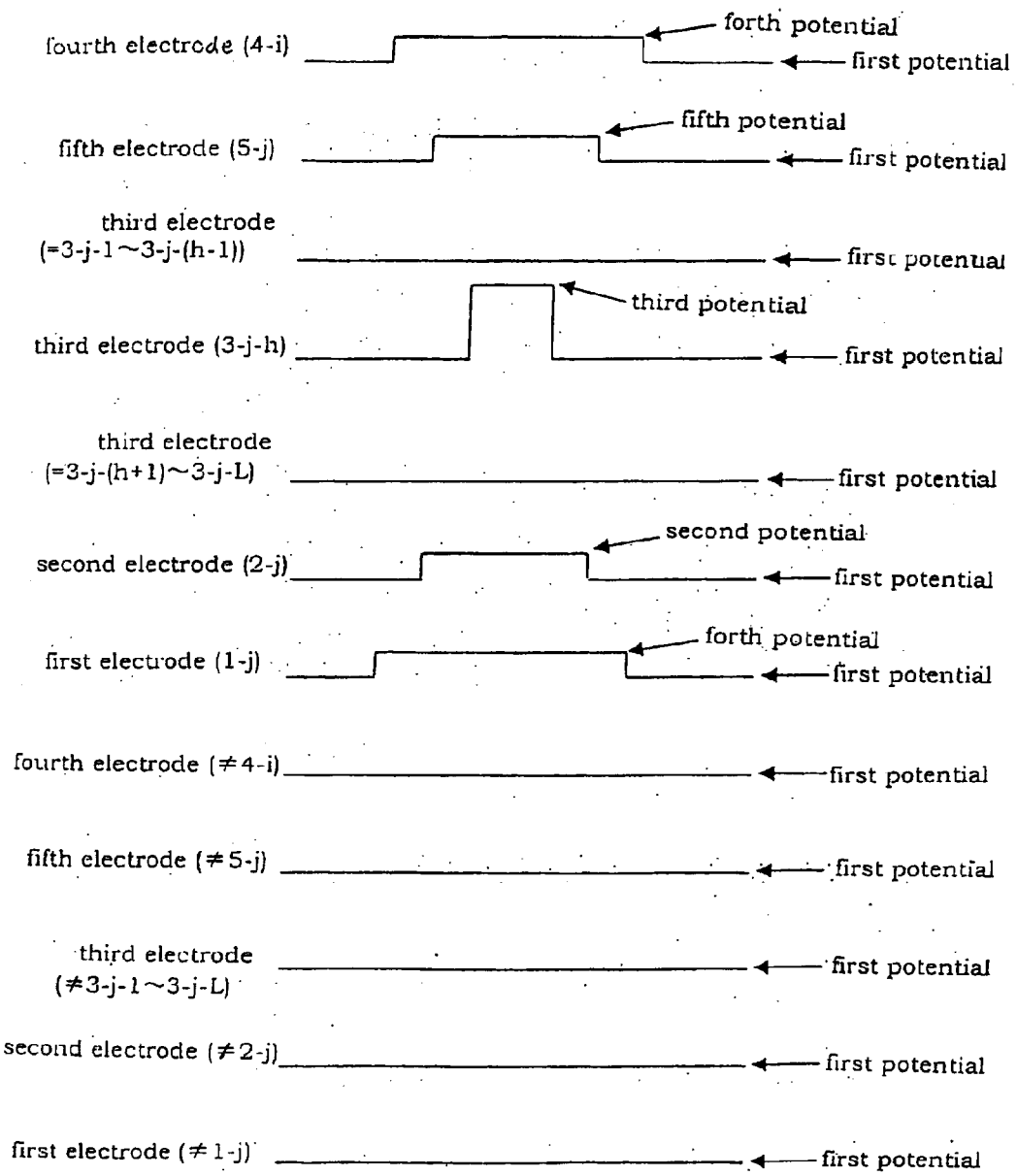
Figure 135:
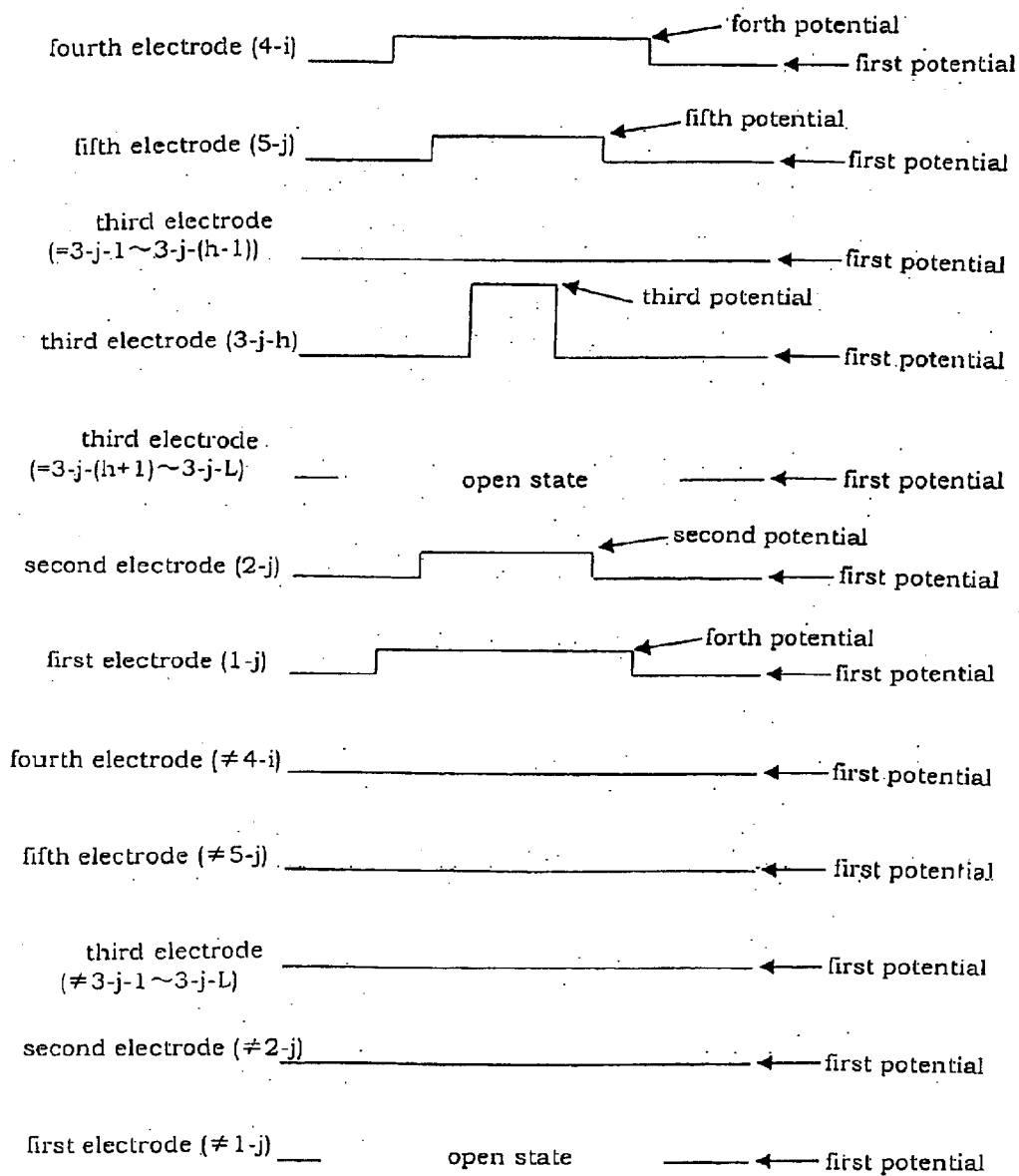

FIGS. 134 and 135 show timing charts of erasing operation in the case of erasing data by applying 20 V as the third potential to thee third electrode (30-h) to store a negative charge in the charge storage layer. The erasing operation is similar to that in any of FIGS. 105 to 110 except for the polarity of the third potential.

FIGS. 110 to 113 show timing charts of erasing operation in the case where the first wires are commonly connected in the entire array. FIGS. 110 to 113 correspond to FIGS. 101 to 104, respectively, except that the first wire (1-1) instead of the first wire (1-*j*) is connected to the end of the island-like semiconductor layer including the selected cell.

Figure 113:
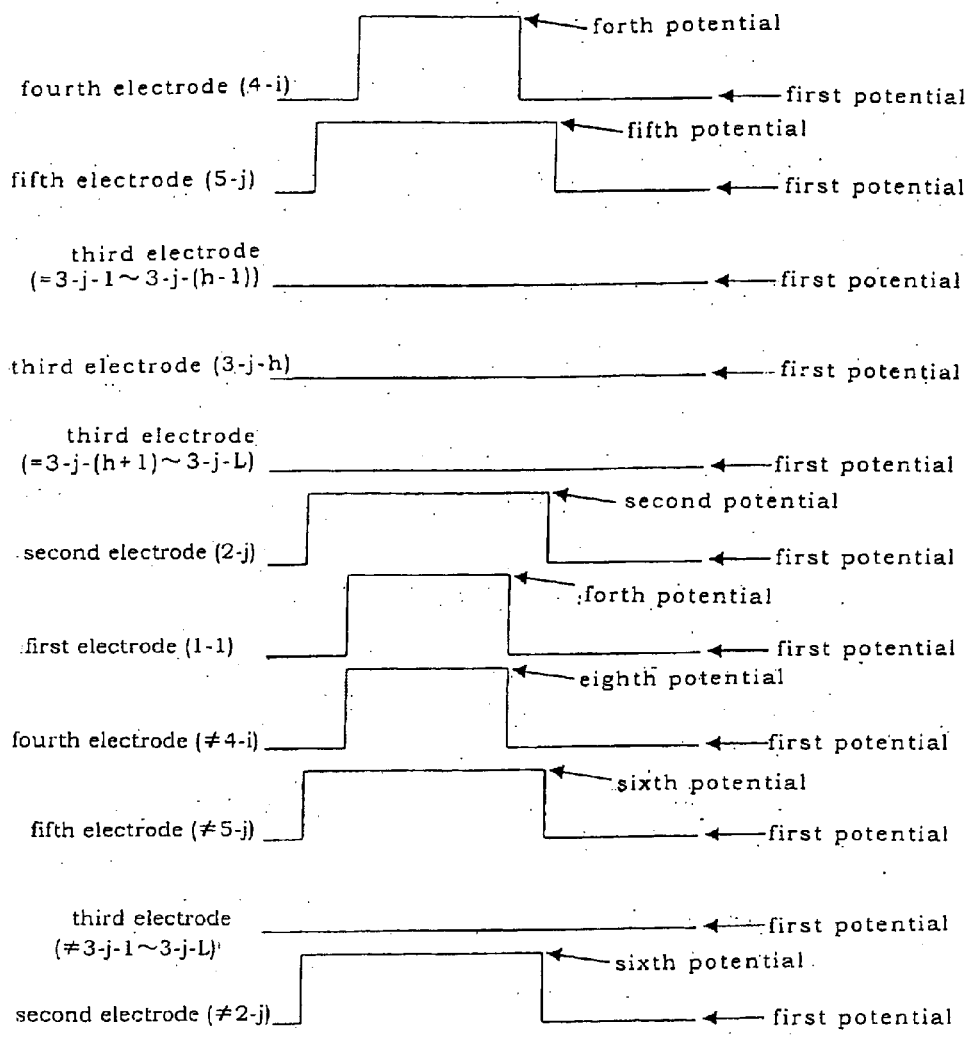

In the case where the ground potential is applied as the third potential to all the third wires (3-1-1 to 3-N-L) and the potentials are applied to the electrodes at the timings shown in FIG. 113, all cells as shown in FIG. 66 can be erased.

Figure 136:
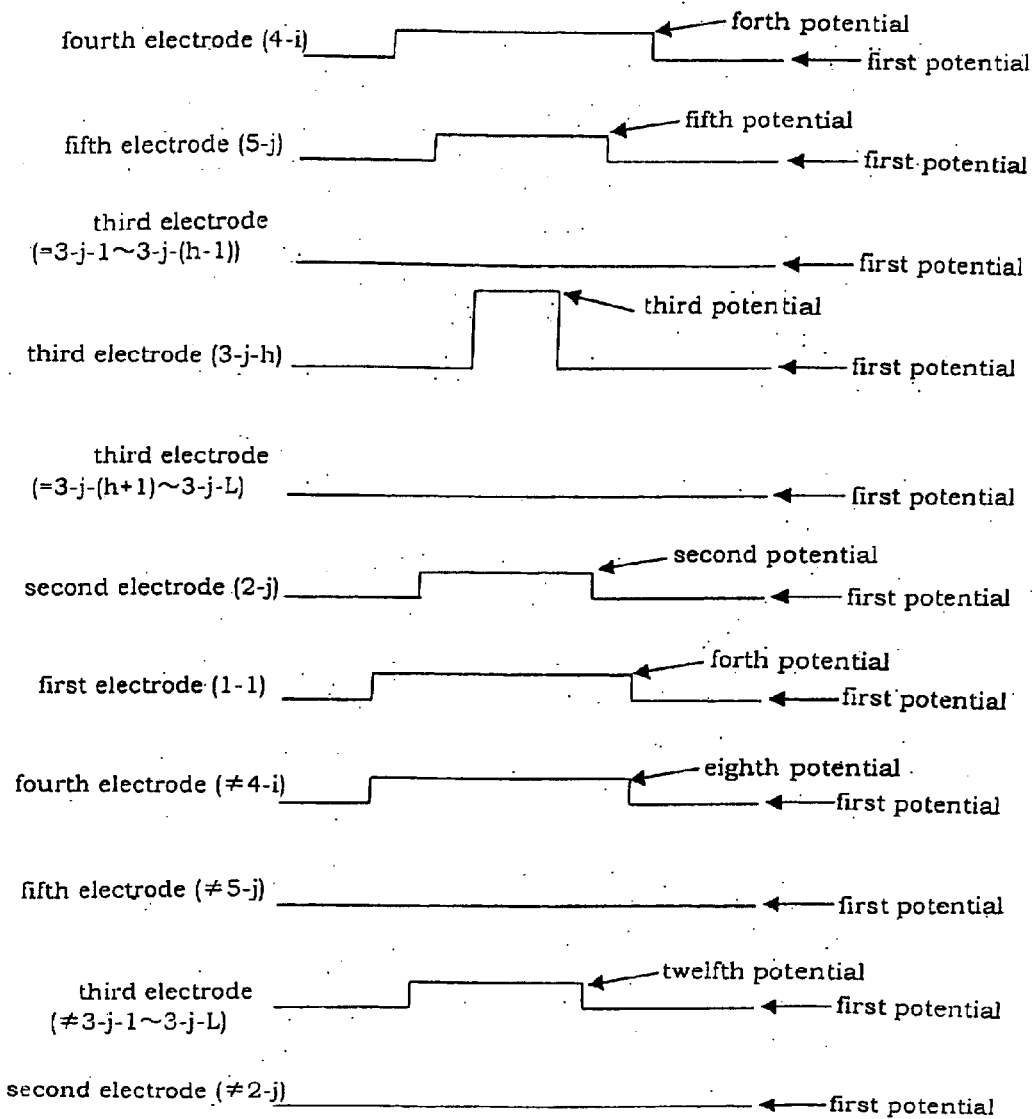
Figure 137:
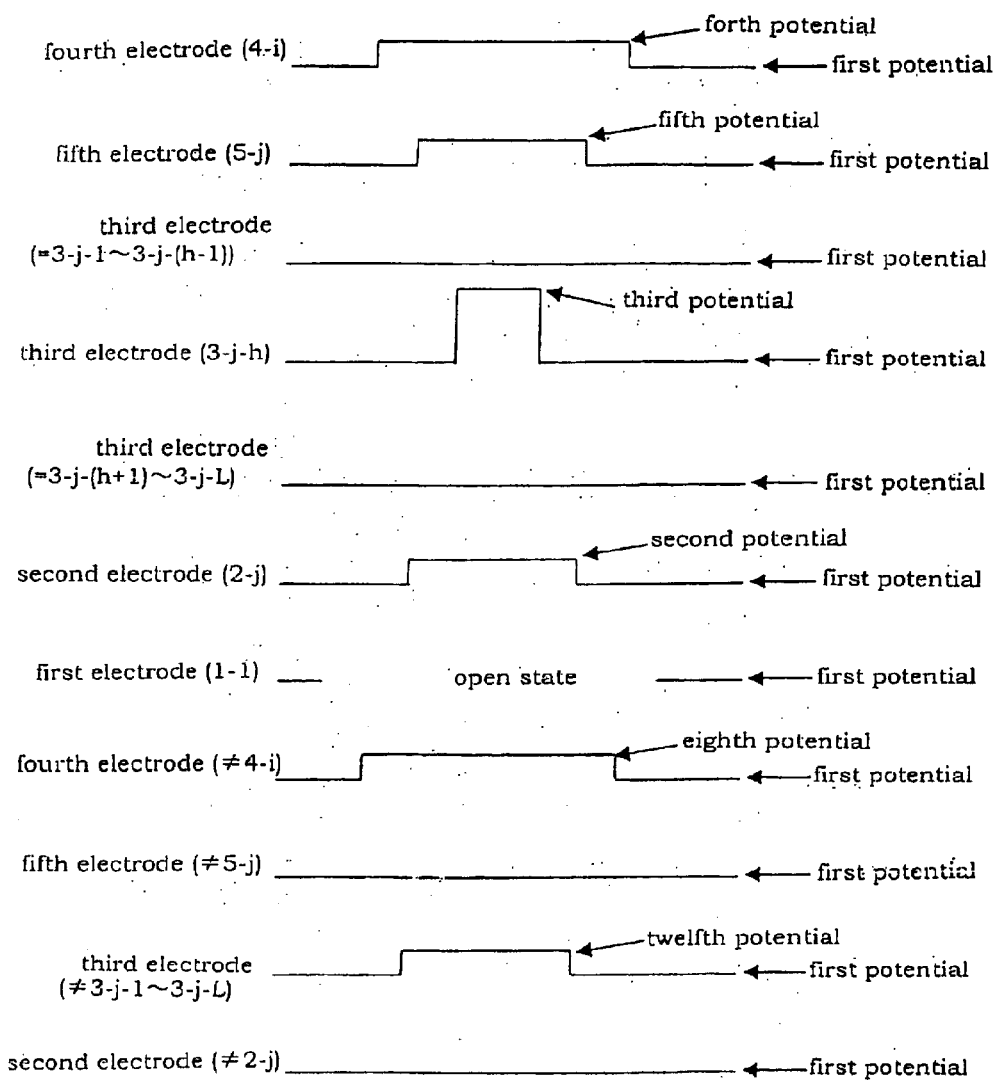

FIGS. 136 and 137 show timing charts of erasing operation in the case of erasing data by applying 20 V as the third potential to the third electrode (30-h) to store a negative charge in the charge storage layer. The erasing operation corresponds to that in FIGS. 110 and 111 except for the polarity of the third potential.

Embodiments of Production Process of Memory Cell Array

A production process of a semiconductor memory device of the invention and an embodiment of a semiconductor memory device formed in accordance with the process will now be described with reference to the attached figures.

A semiconductor memory device of the embodiment is produced in such a manner that a semiconductor substrate is processed in a column shape having at least one step to form an island-like semiconductor layer, side faces of the island-like semiconductor layer are made as active regions, a tunnel oxide film and a floating gate as a charge storage layer are formed on the side face of each step, and a control gate is formed at least in a part of the side face of the floating gate via an interlayer insulating film, thereby forming a memory transistor. At the corners of steps, impurities diffusion layers are formed in self-alignment with the floating gates. For example, two memory transistors are disposed.

On each of the side faces of steps in the upper and lower parts of the island-like semiconductor layer, a selection gate transistor is disposed by forming a gate oxide film and a selection gate so as to sandwich the memory transistors. A channel layer of the selection gate transistor is formed so as to be electrically connected to the channel layer of the memory transistor, the impurity diffusion layer is formed in self-alignment with the floating ate and the selection gate and connected to the memory transistor in series along the island-like semiconductor layer.

The thickness of a gate insulating film of the selection gate transistor is equal to that of a gate insulating film of the memory transistor. The selection gate of each transistor and the floating gate are formed in a lump.

Each step or mode in each of the following production examples can be used in combination with each step or mode in any of the other production examples.

PRODUCTION EXAMPLE 1

Figure 138:
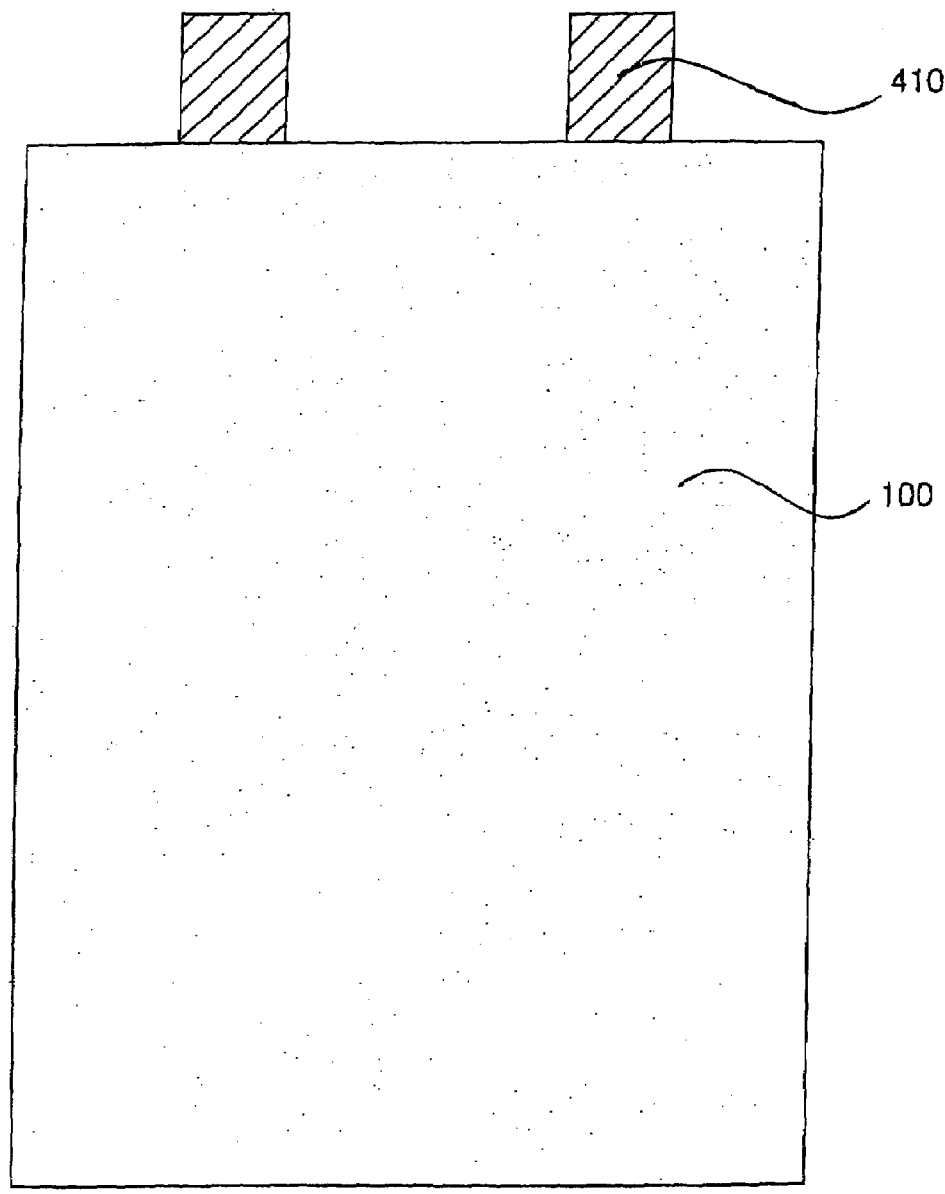
FIGS. 138, 140, 142, 144, 146, 148, 150, 152, 154, 156, 158, 160, 162, 164, 166, 168, 170, 172, 174, 176, 178, 180, 182, 184, 186, 188, 190, 192, 194, 196, 198, 200 and 202 are sectional views showing a production process of a semiconductor memory device of the embodiment 1 (sectional views of A–A' line of FIG. 1).
Figure 203:
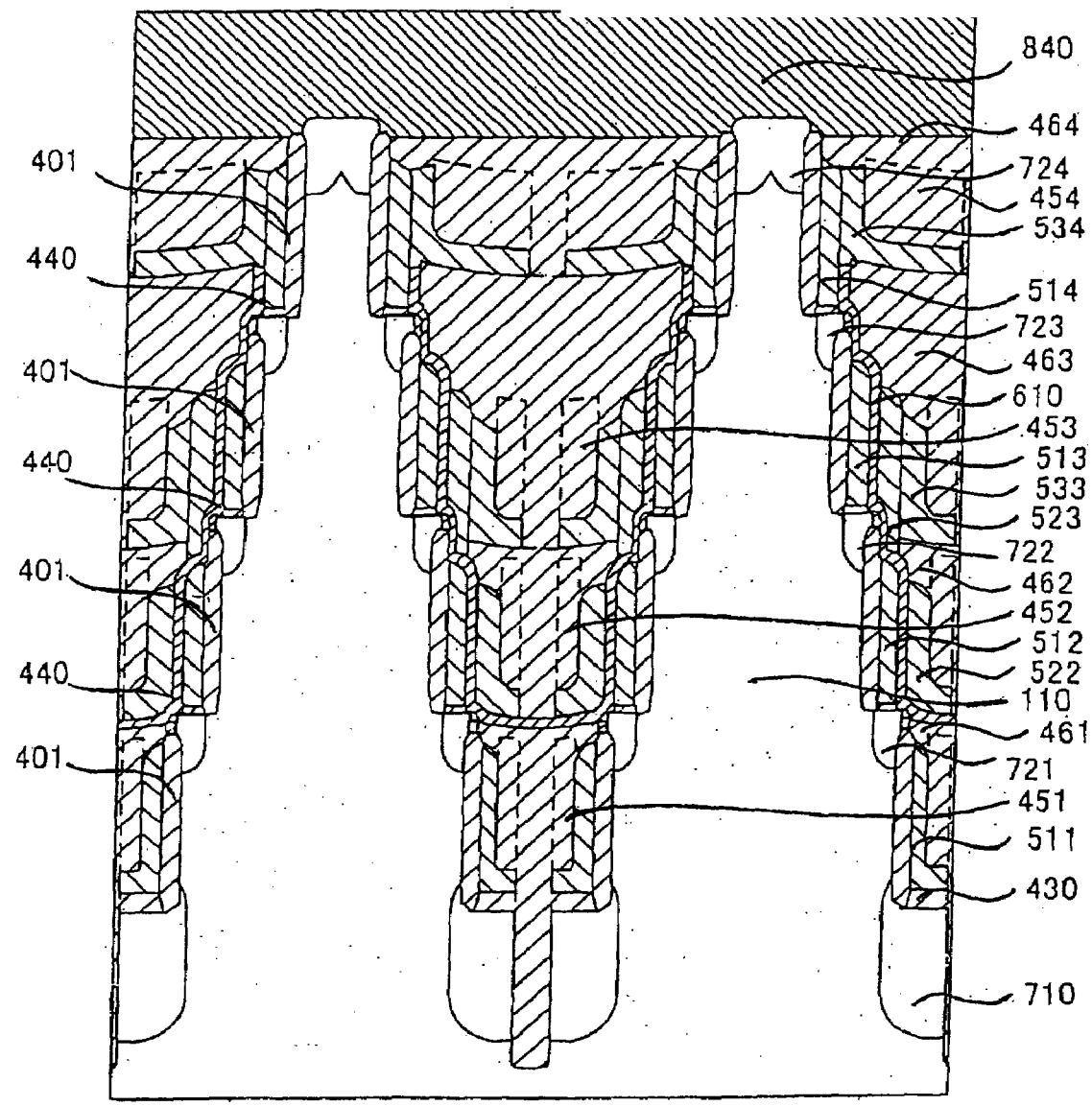

FIGS. 138 to 203 are sectional views showing a production process of a semiconductor memory device of the embodiment. Even-numbered drawings are sectional views taken on line A–A' of FIG. 1 and odd-numbered drawings are sectional views taken on line B–B' of FIG. 1.

Figure 139:
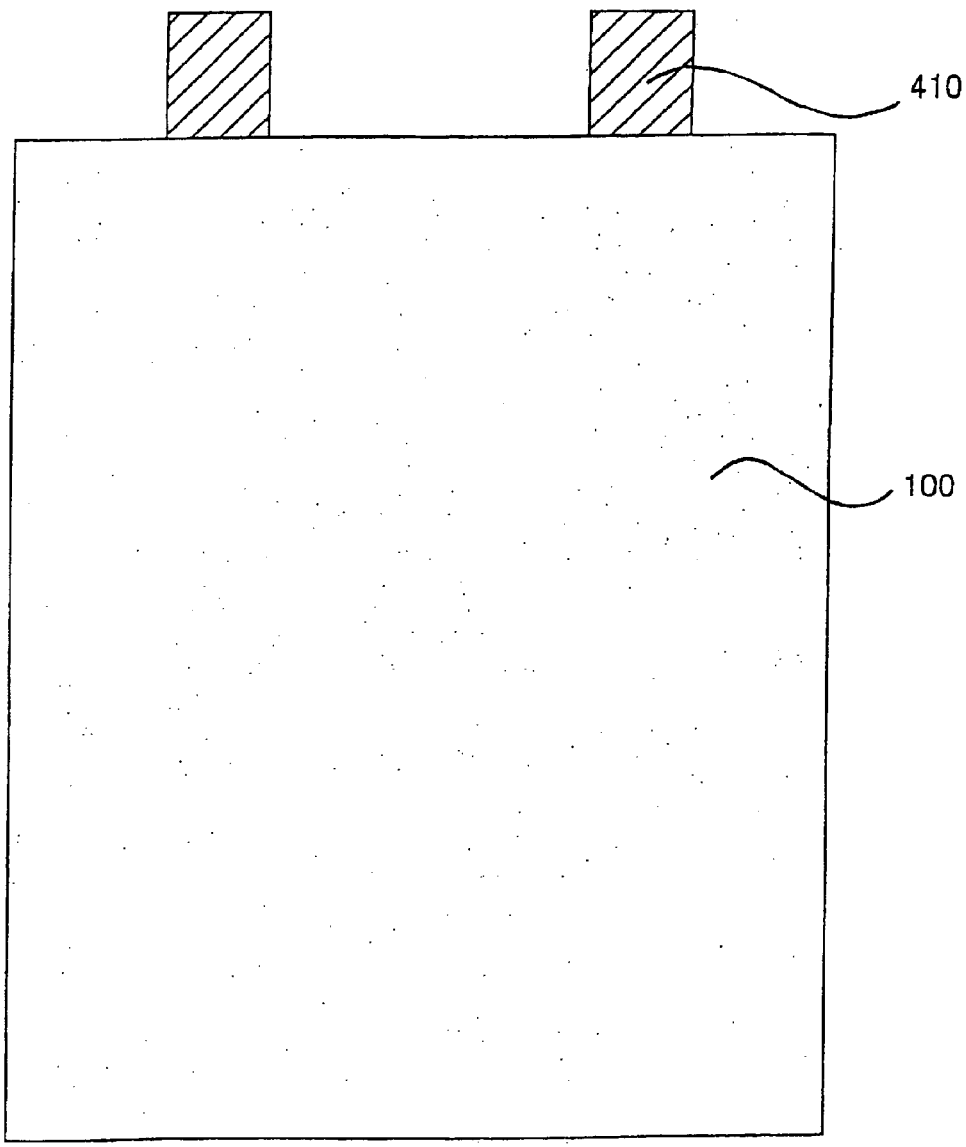
FIGS. 139, 141, 143, 145, 147, 149, 151, 153, 155, 157, 159, 161, 163, 165, 167, 169, 171, 173, 175, 177, 179, 181, 183, 185, 187, 189, 191, 193, 195, 197, 199, 201 and 203 are sectional views showing a production process of a semiconductor memory device of the embodiment 1 (sectional views of B–B' line of FIG. 1).

First, a silicon oxide film 410 is deposited to 200 to 2000 nm as a first insulating film to be a mask layer on the surface of a silicon substrate 100 of, for example, the p type. Using as a mask a resist film R1 patterned by a known photolithography technique, the silicon oxide film 410 is etched by reactive ion etching (FIGS. 138 and 139).

The first insulating film is not limited to the silicon oxide film as long as it is made of a material which is not etched at the time of reactive etching on the p-type silicon substrate 100 or has an etch rate lower than that of silicon. The first insulating film may be a silicon nitride film, a conductive film, or a laminate film of two or more kinds of materials.

Figure 140:
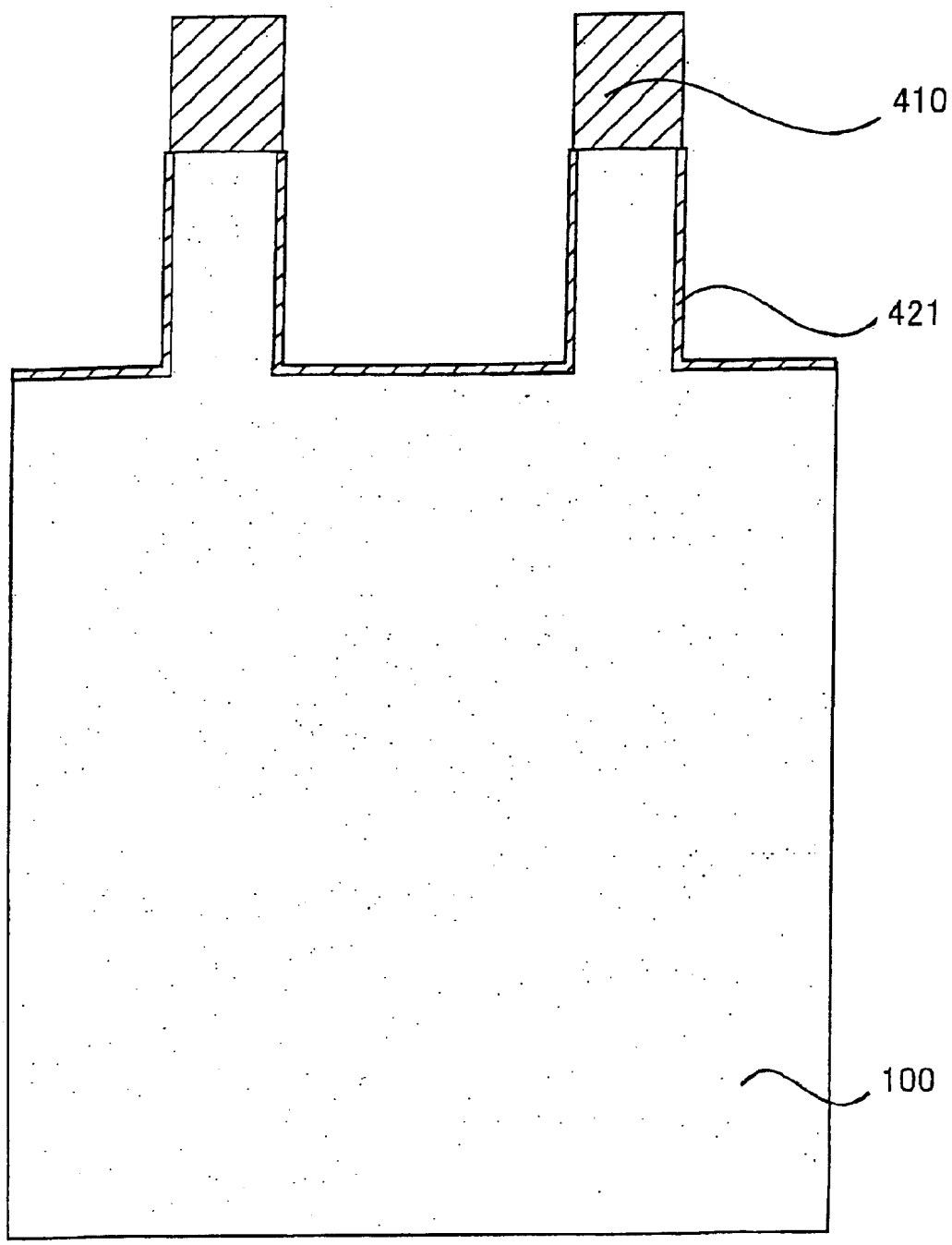
Figure 141:
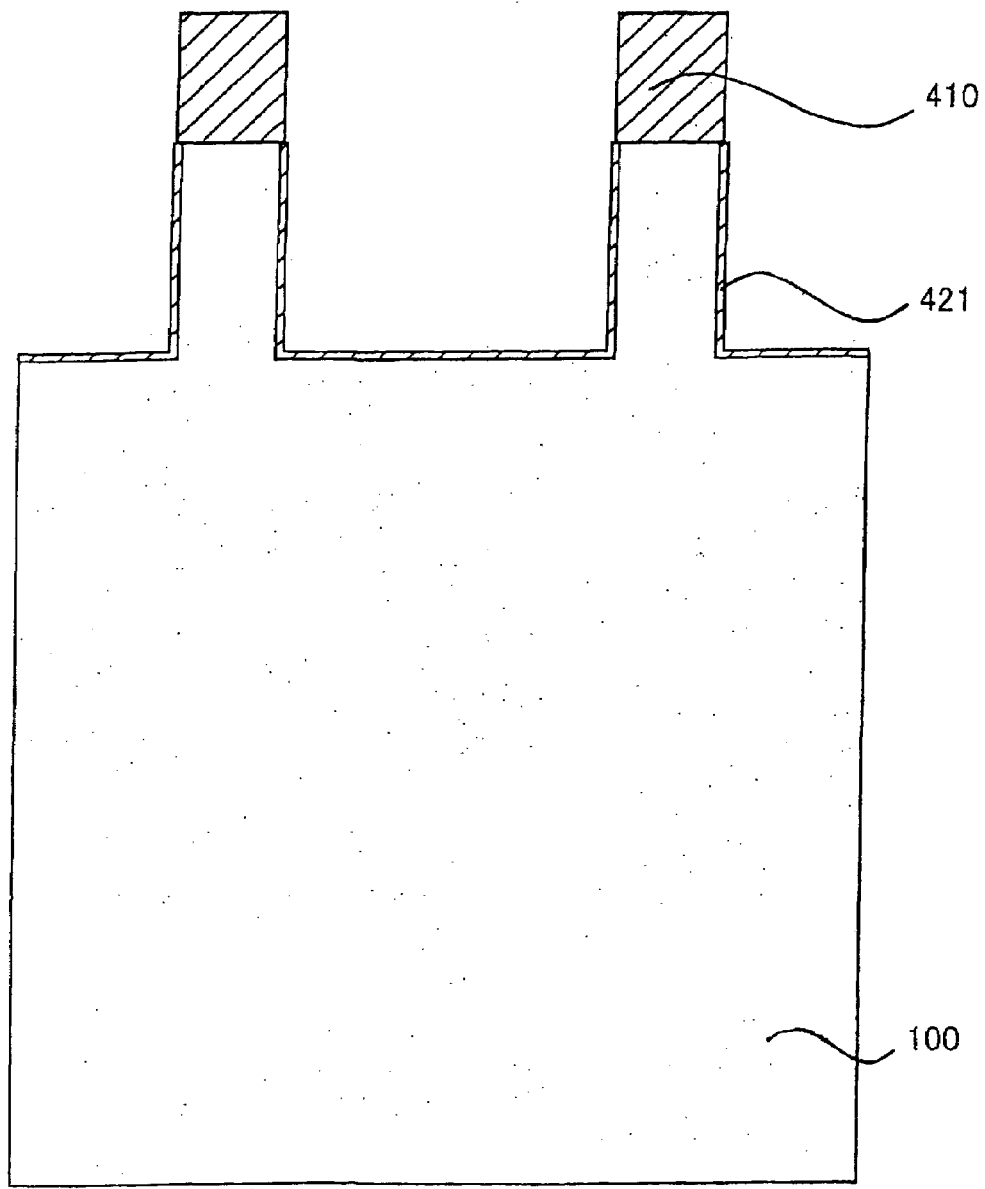

Using the silicon oxide film 410 as a mask, the silicon substrate 100 is etched by 50 to 5000 nm by reactive ion etching. Thereafter, an exposed part of the silicon substrate 100 is thermally oxidized to form a silicon oxide film 421 as a second insulating film having a thickness of 5 to 100 nm (FIGS. 140 and 141).

Figure 142:
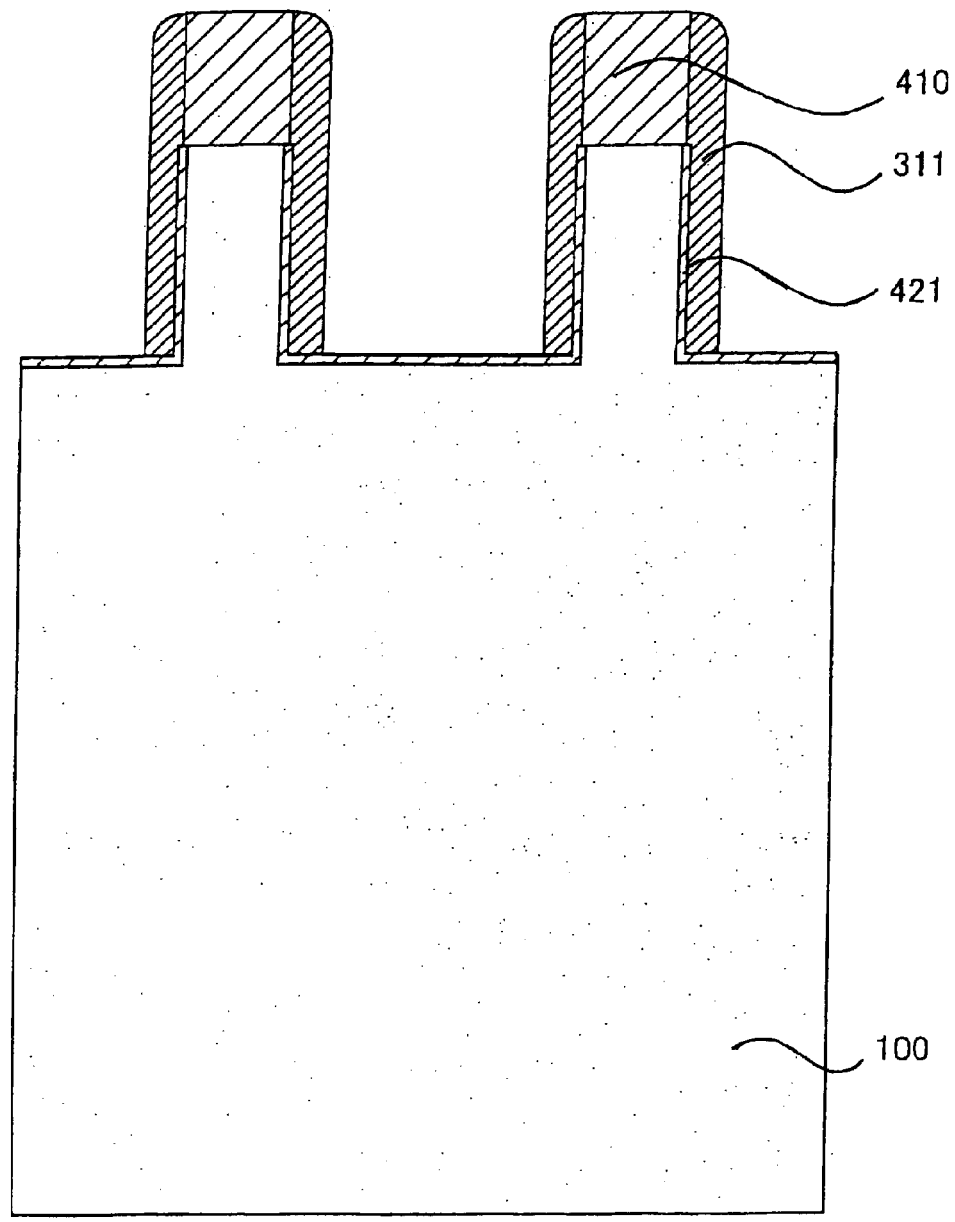
Figure 143:
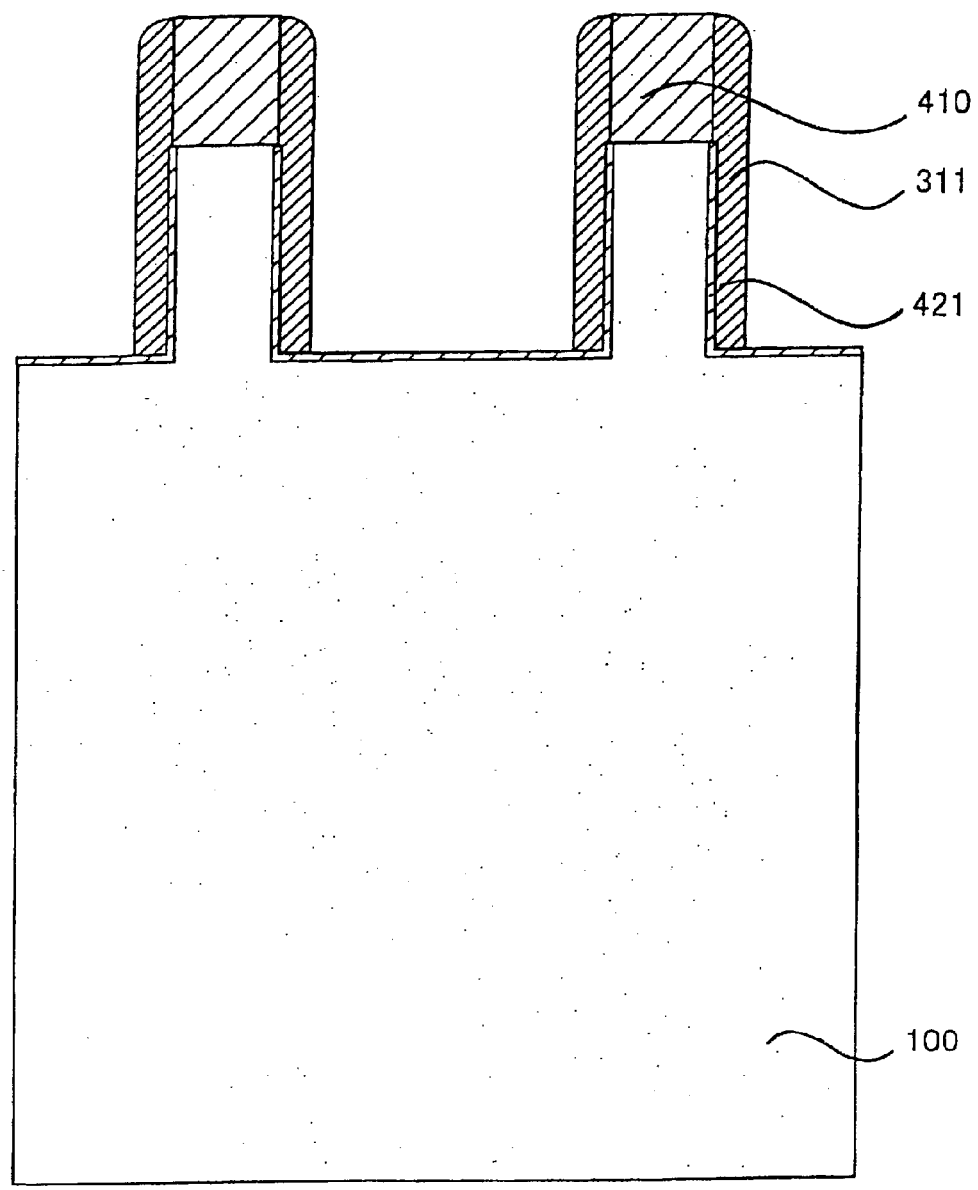

Next, a silicon nitride film 311 is deposited to 10 to 1000 nm as a third insulating film and is processed by anisotropic etching into the form of sidewall spacers on the sidewalls of the silicon oxide film 410 and the silicon substrate 100 patterned in the columnar shape with intervention of the silicon oxide film 421 (FIGS. 142 and 143).

Figure 144:
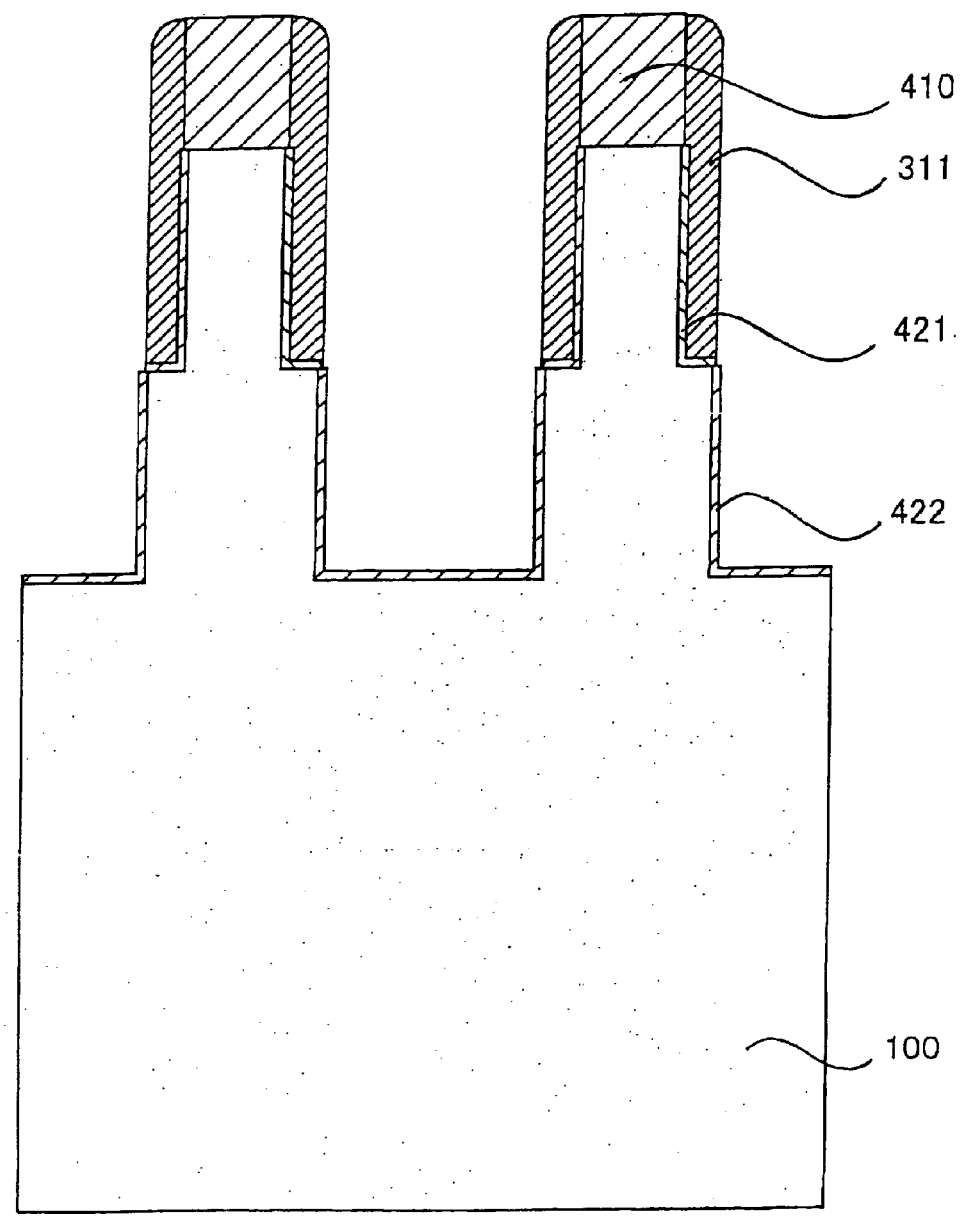
Figure 145:
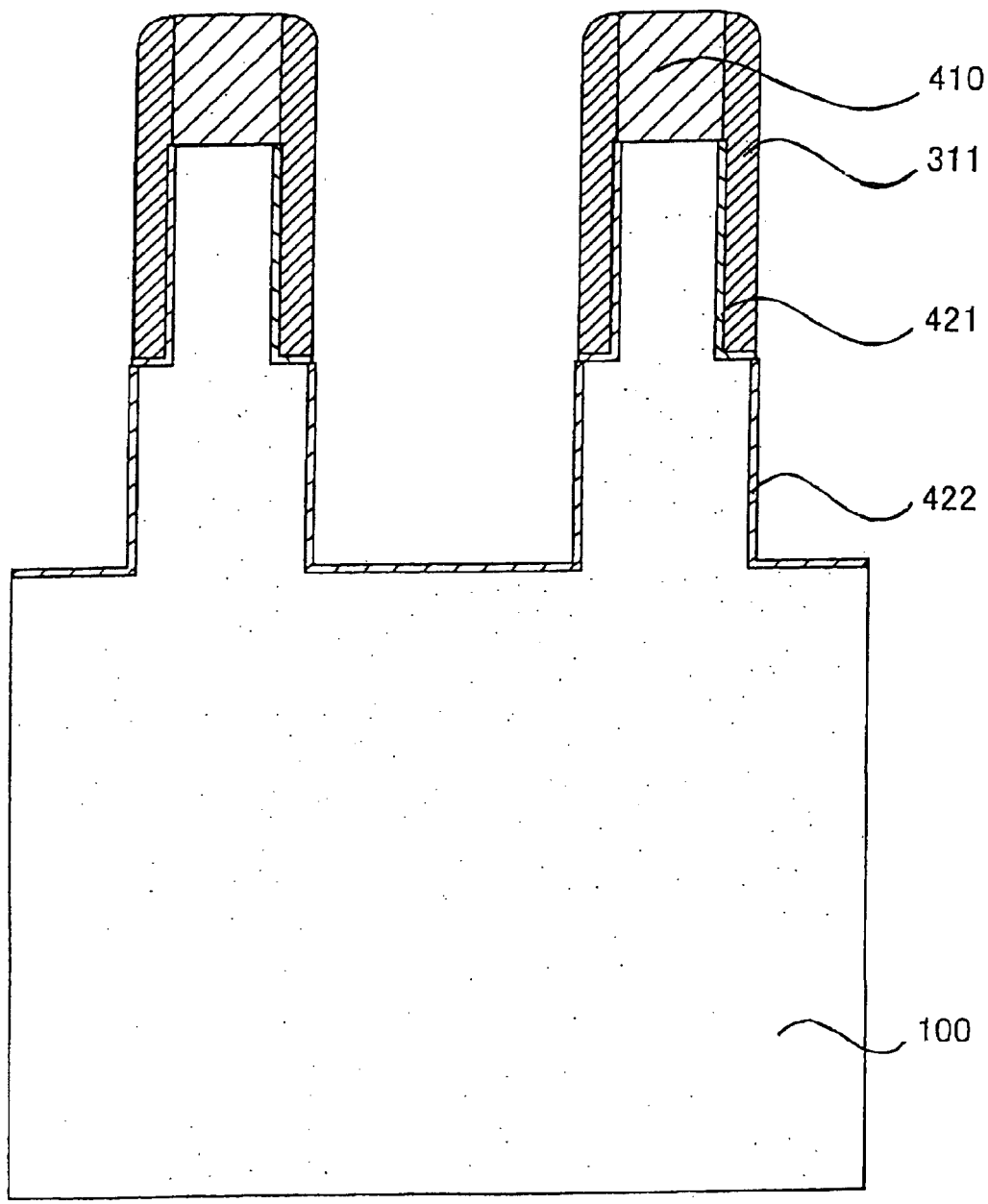

Subsequently, using the silicon nitride film 311 formed as the sidewall spacers as a mask, the silicon oxide film 421 is etched away by reactive ion etching and the exposed silicon substrate 100 is etched by 50 to 5000 nm. Thereby, the silicon substrate 100 is processed in the columnar shape having a step. The exposed part of the silicon substrate 100 is thermally oxidized to form a silicon oxide film 422 of 5 to 100 nm thickness as a second insulating film (FIGS. 144 and 145).

A silicon nitride film 312 is deposited to 10 to 1000 nm as a third insulating film and is processed by anisotropic etching into the form of sidewall spacers on sidewalls of the silicon oxide film 410, the silicon nitride film 311 and the columnar silicon substrate 100 with intervention of the silicon oxide film 422.

Figure 146:
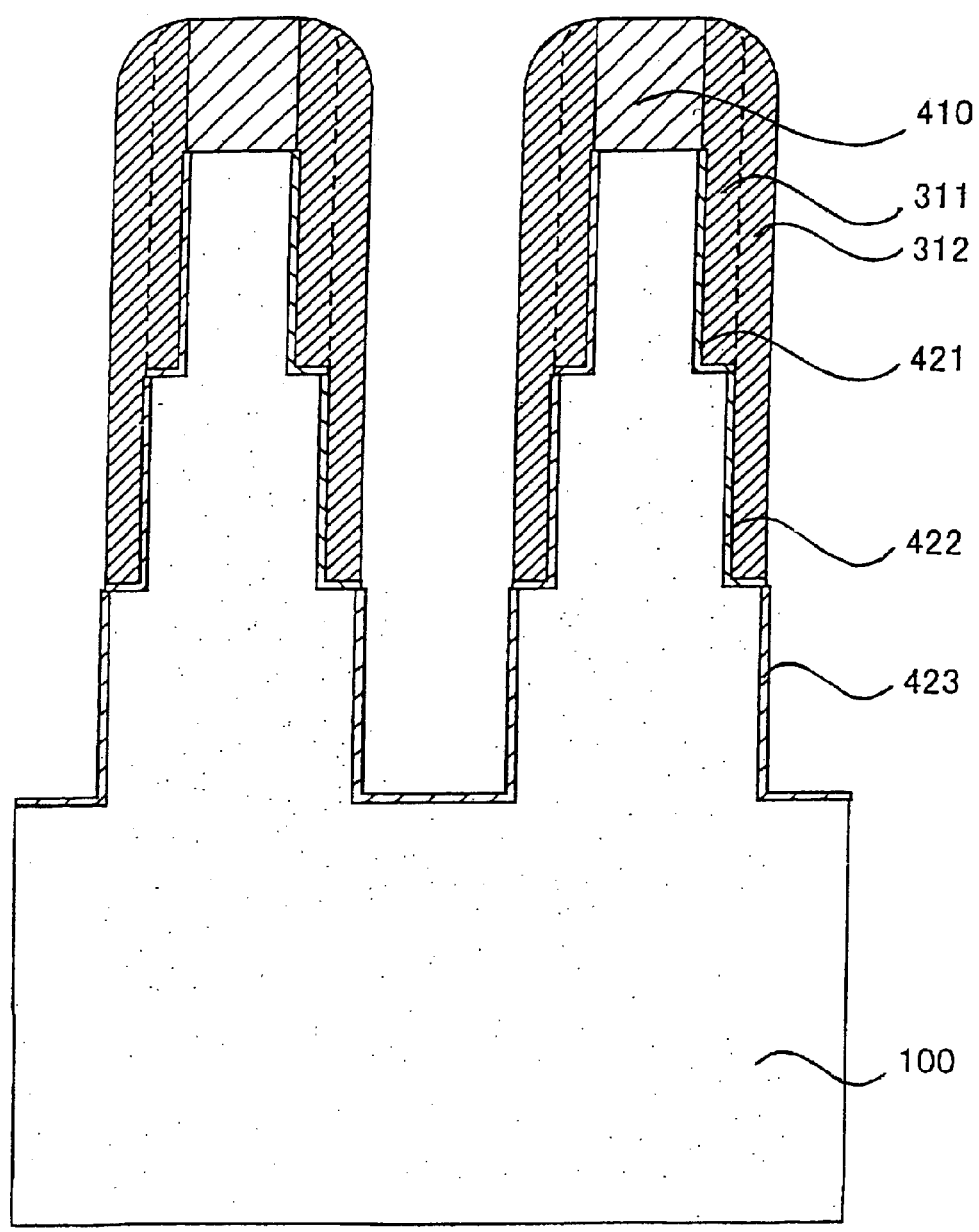
Figure 147:
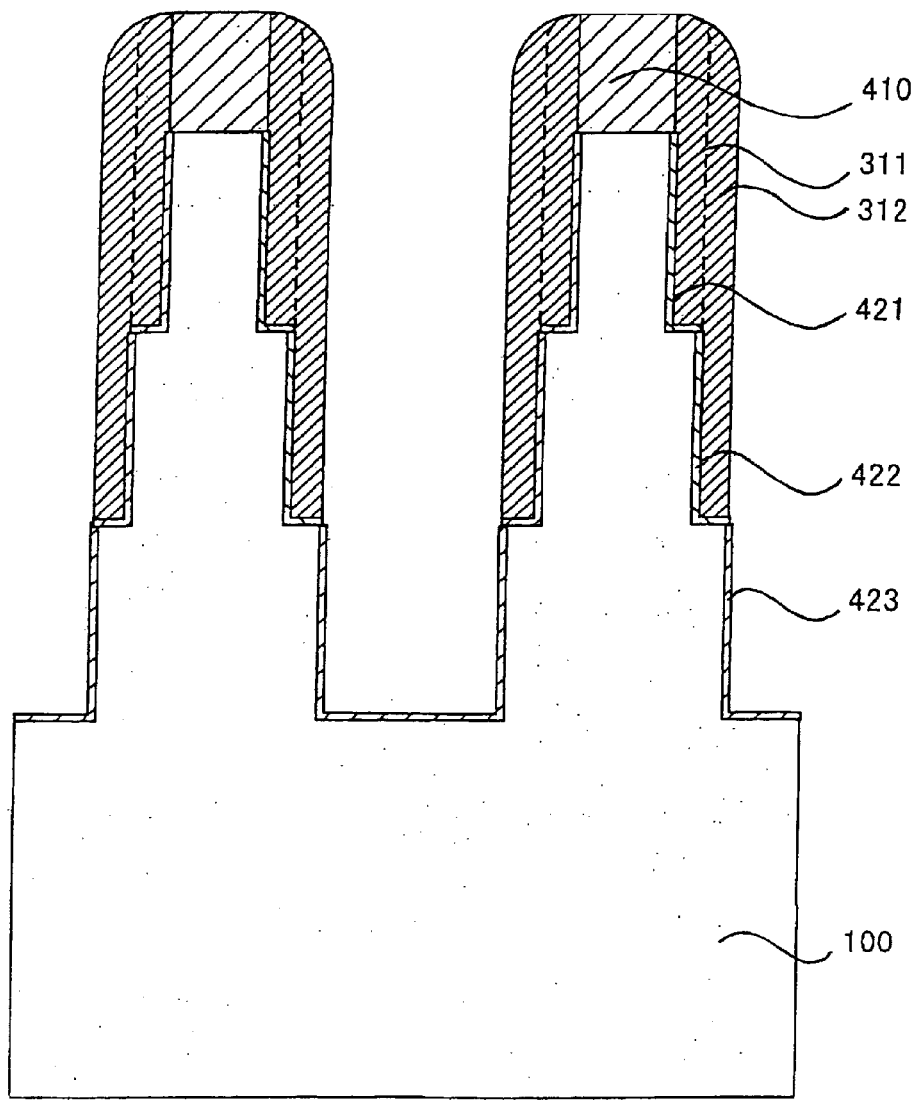

Subsequently, using the silicon nitride film 312 formed as the sidewall spacers as a mask, the silicon oxide film 422 is etched away by reactive ion etching and the exposed silicon substrate 100 is etched by 50 to 5000 nm, thereby processing the silicon substrate 100 into a columnar shape having two steps. After that, the exposed part of the silicon substrate 100 is thermally oxidized to form a silicon oxide film 423 of 5 to 100 nm thickness as a second insulating film (FIGS. 146 and 147).

Next, a silicon nitride film 313 is deposited to 10 to 1000 nm as a third insulating film, and is processed by anisotropic etching into the form of sidewall spacers on sidewalls of the silicon oxide film 410, the silicon nitride film 312 and the columnar silicon substrate 100 having the two steps with intervention of the silicon oxide film 423.

Subsequently, using the silicon nitride film 313 formed in the sidewall spacers as a mask, the silicon oxide film 423 is etched by reactive ion etching and the exposed silicon substrate 100 is etched by 50 to 5000 nm, thereby processing the silicon substrate 100 into a columnar shape having three steps.

By the above-described processes, the silicon substrate 100 is separated into a plurality of columnar island-like semiconductor layers 110 each having the steps.

Figure 148:
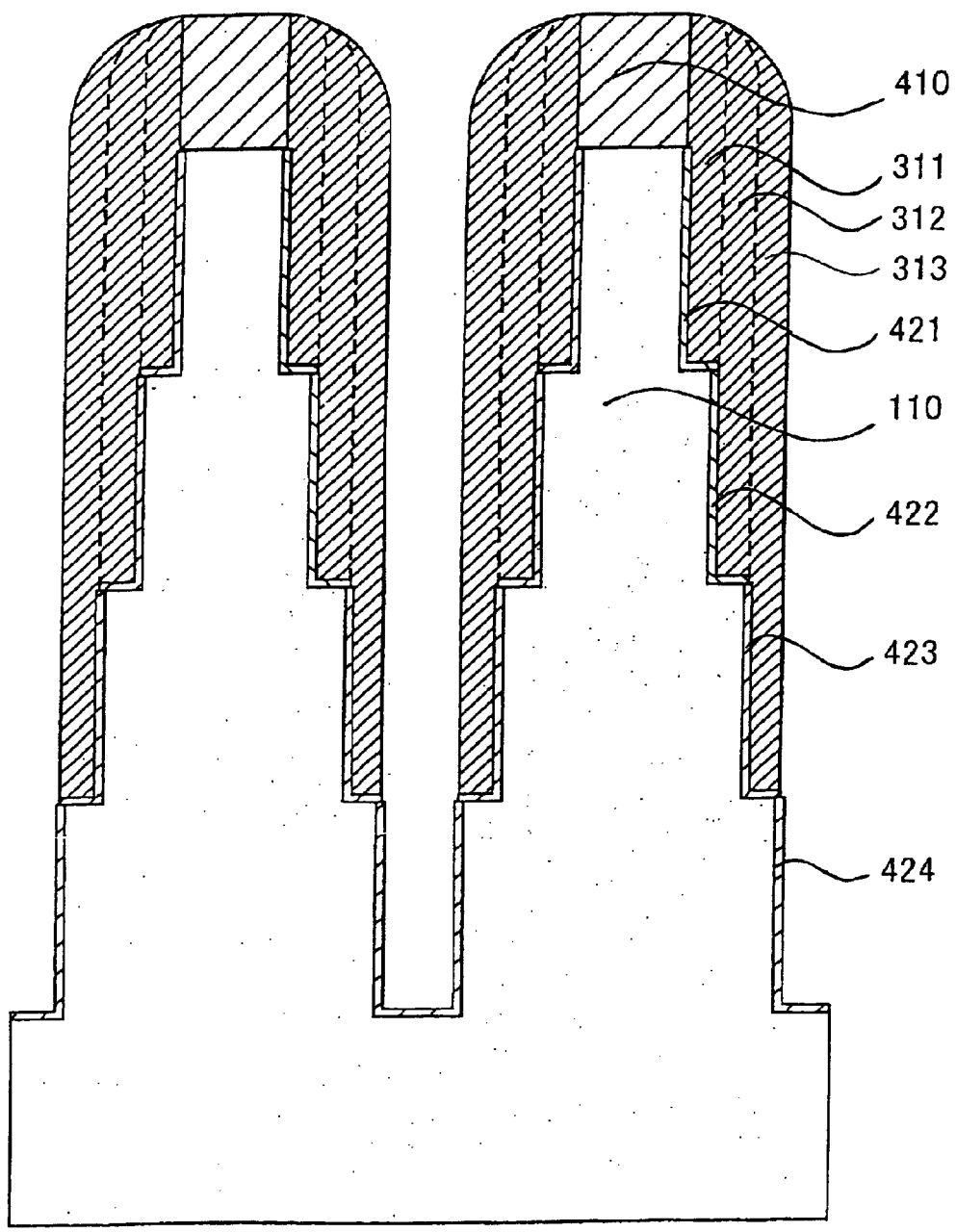
Figure 149:
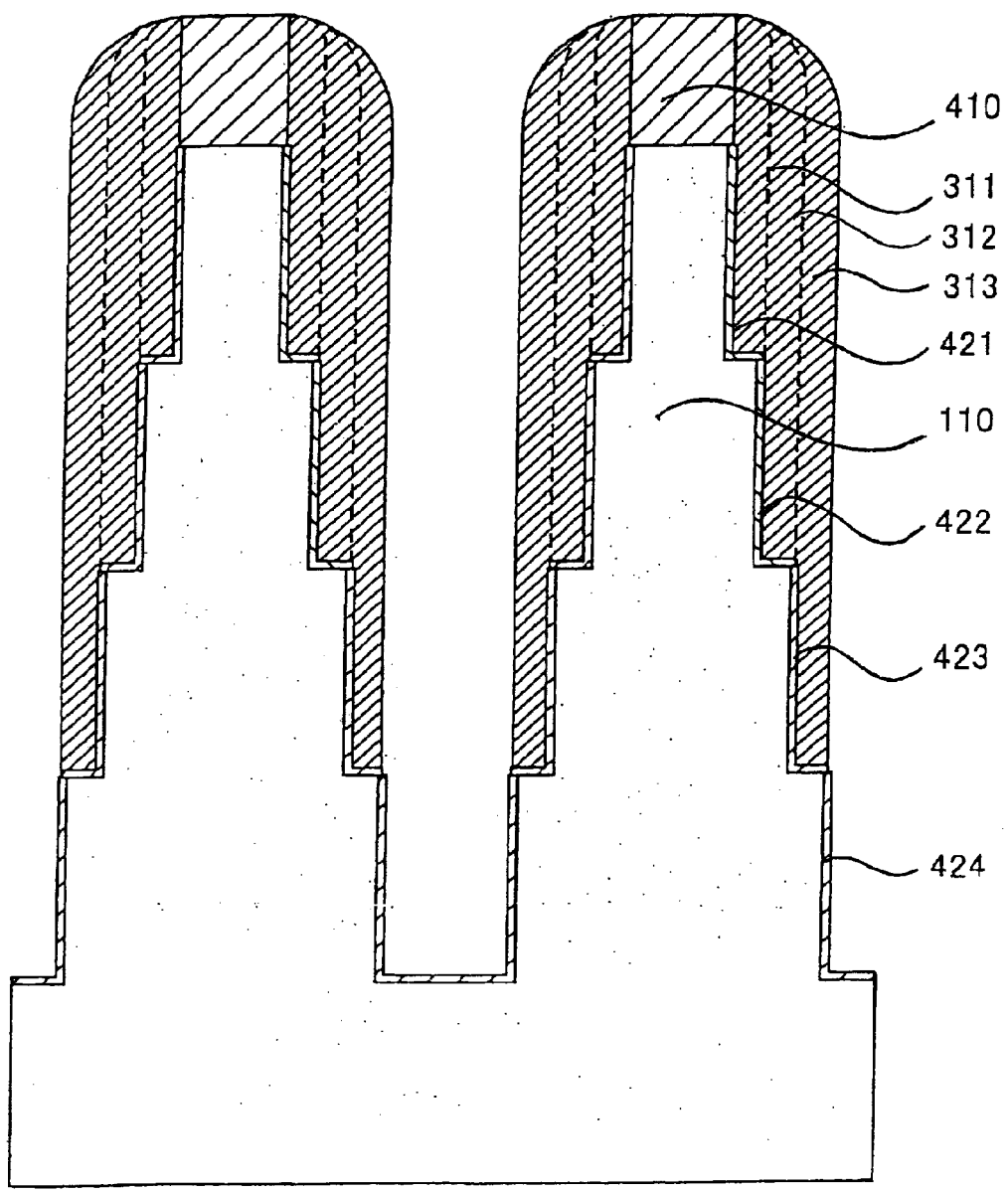

After that, the exposed part of the silicon substrate 100 is thermal-oxidized to form a silicon oxide film 424 as a second insulating film of a thickness of 5 to 100 nm (FIGS. 148 and 149). The second insulating film is not limited to the silicon oxide film but may be a silicon nitride film. The second insulating film may be formed by CVD or the like.

In a bottom portion of each of the obtained island-like semiconductor layers 110, an n-type impurity diffusion layer 710 is formed. The impurity diffusion layer 710 can be formed by, for example, ion implantation with an implantation energy of 5 to 100 keV at a dose of about $1\times10^{13}$ to $1\times10^{17}/cm^2$ of arsenic or phosphorus from a direction inclined about 0 to 7°.

Figure 150:
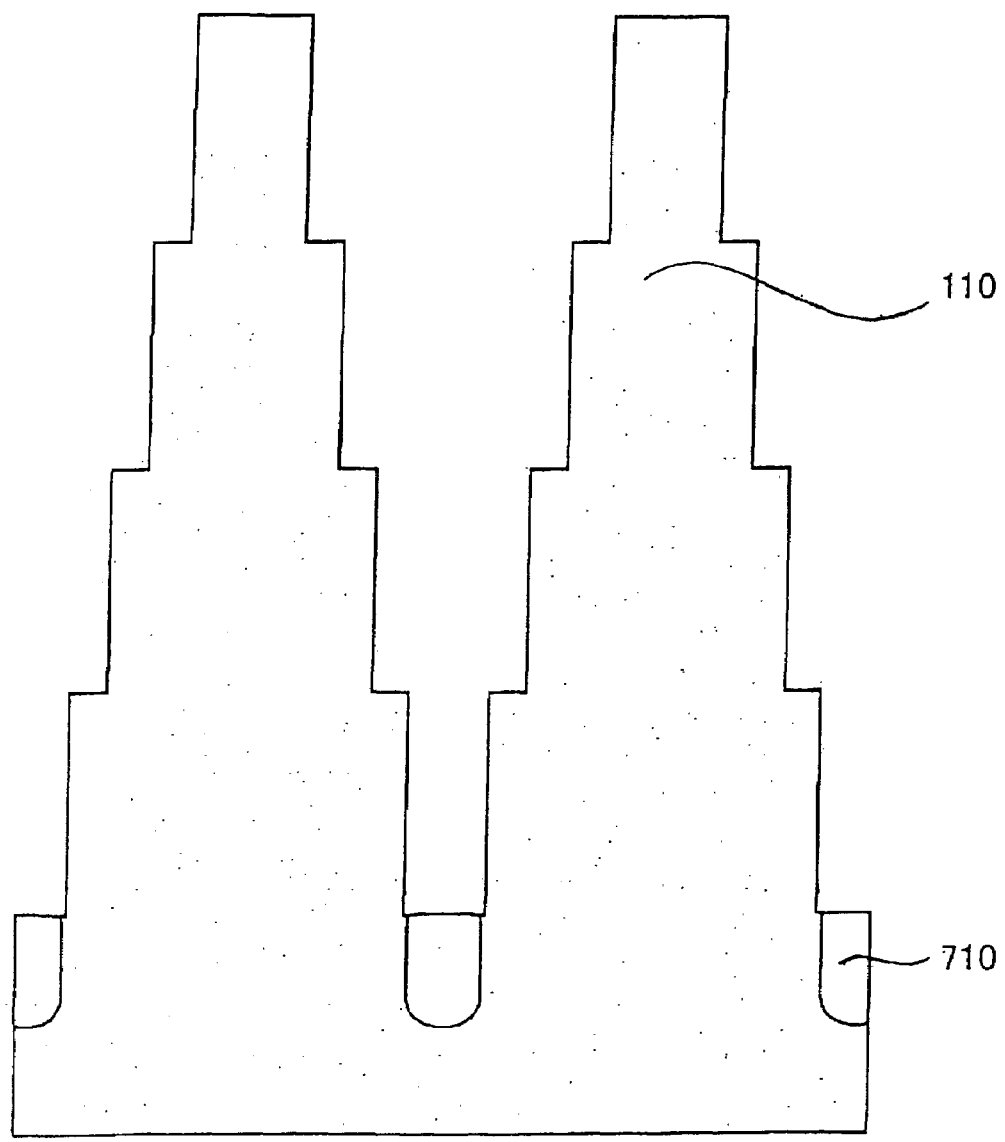
Figure 151:
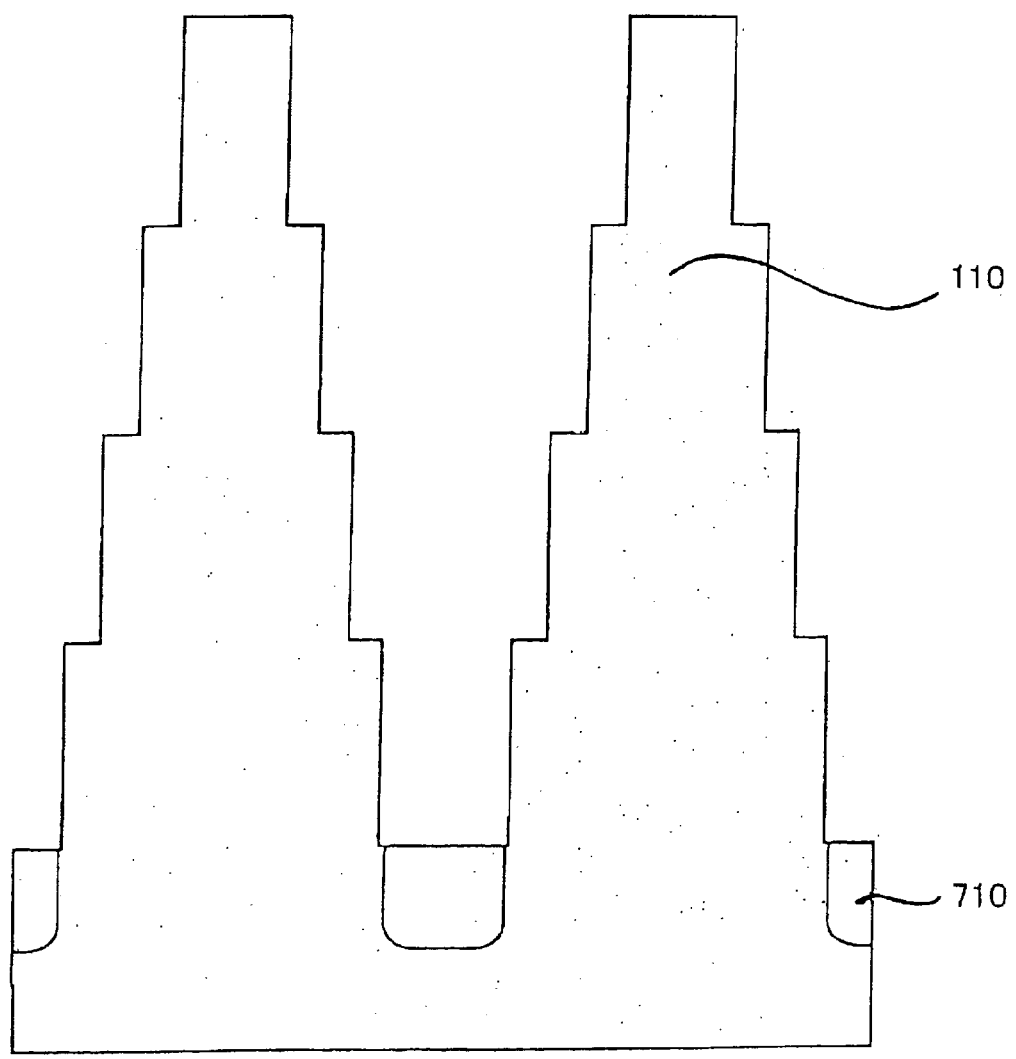

Subsequently, the silicon nitride film and the silicon oxide film are selectively removed by isotropic etching (FIGS. 150 and 151). By the etching, the diameter of the uppermost portion of the island-like semiconductor layer 110 is made smaller. In the case where the uppermost portion of the island-like semiconductor layer 110 is formed with the minimum processing dimensions, by the formation of the silicon oxide film 430, the dimensions become smaller than the minimum processing dimension.

Figure 152:
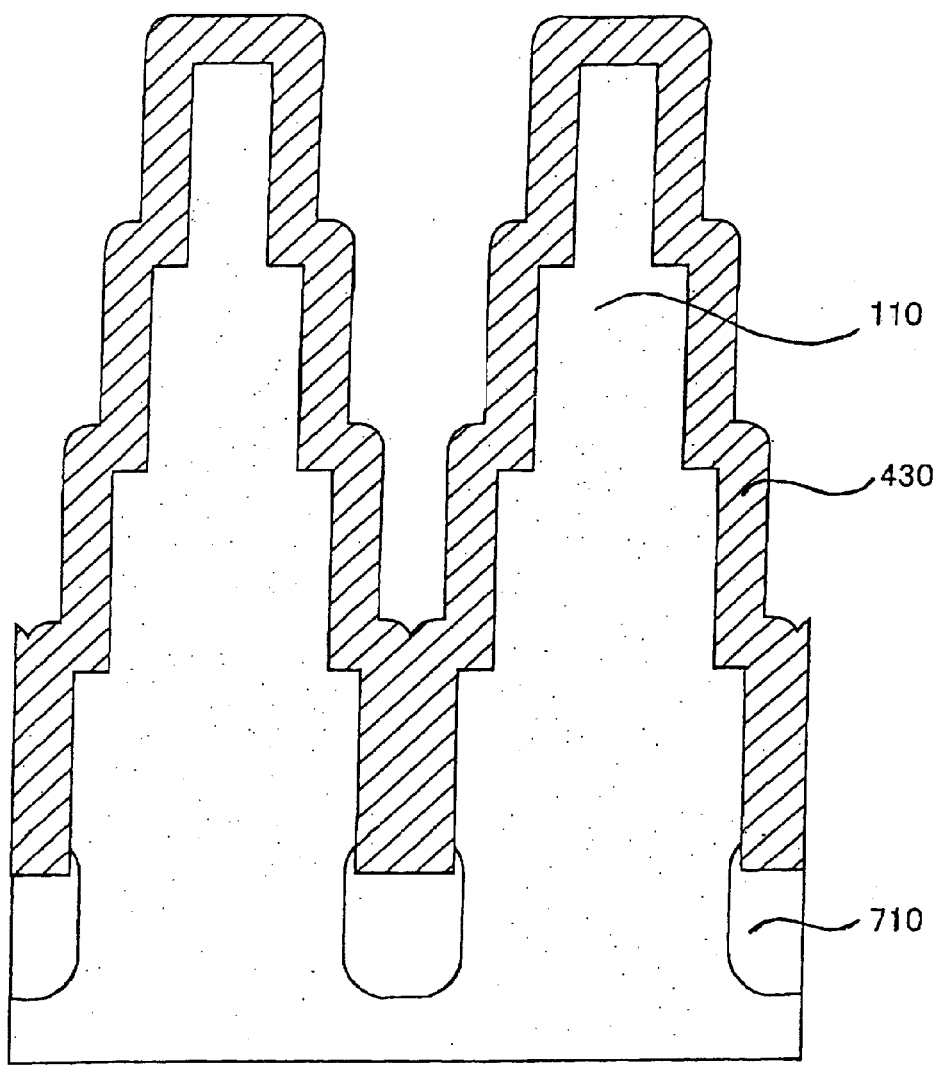
Figure 153:
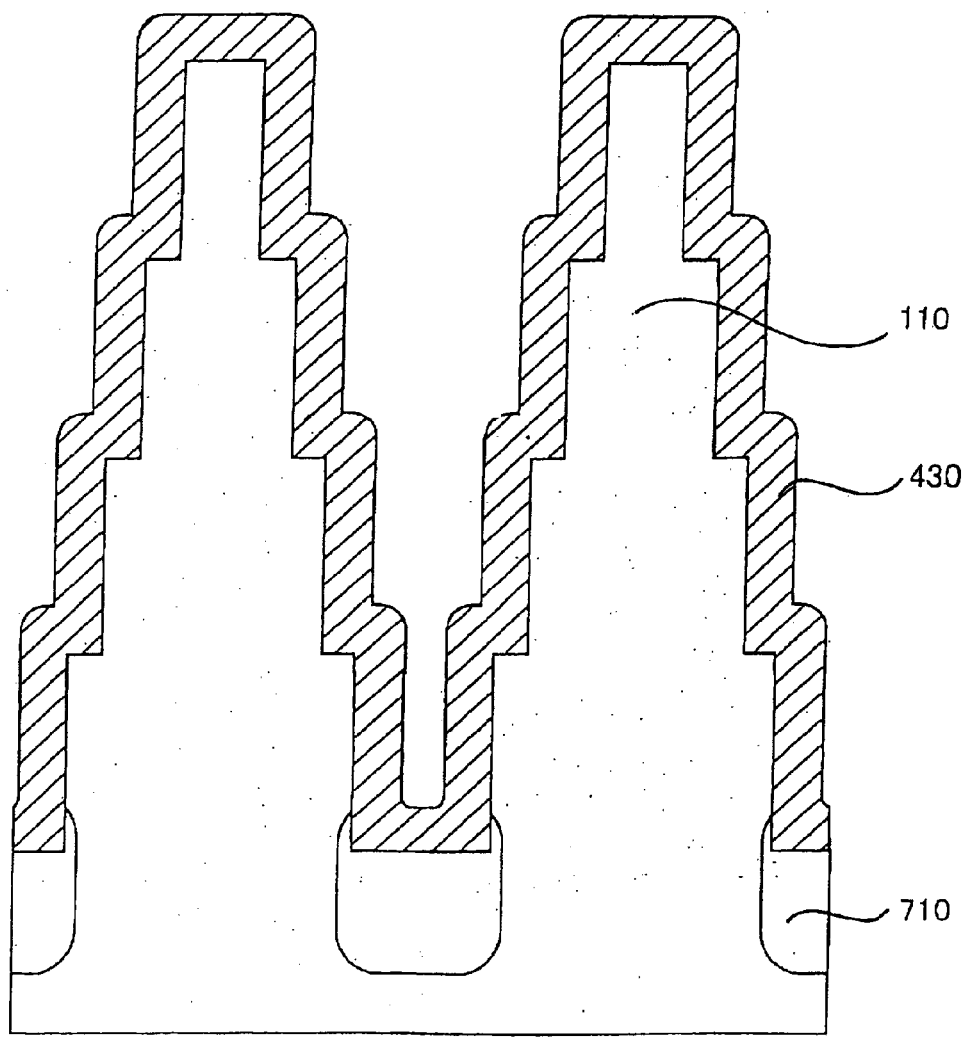

On the surface of the island-like semiconductor layer 110, a silicon oxide film 430 serving as a fourth insulating film is formed with a thickness of 10 to 100 nm (FIGS. 152 and 153).

Figure 154:
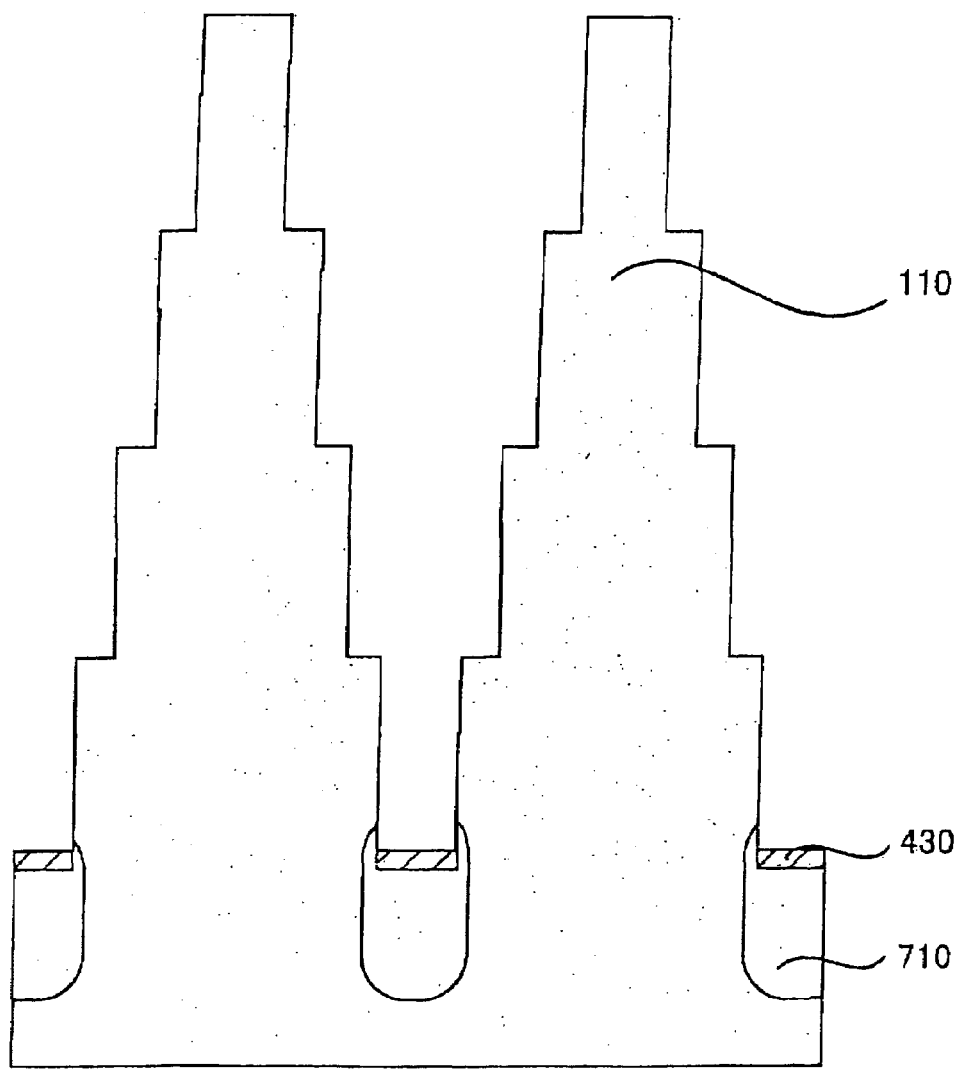
Figure 155:
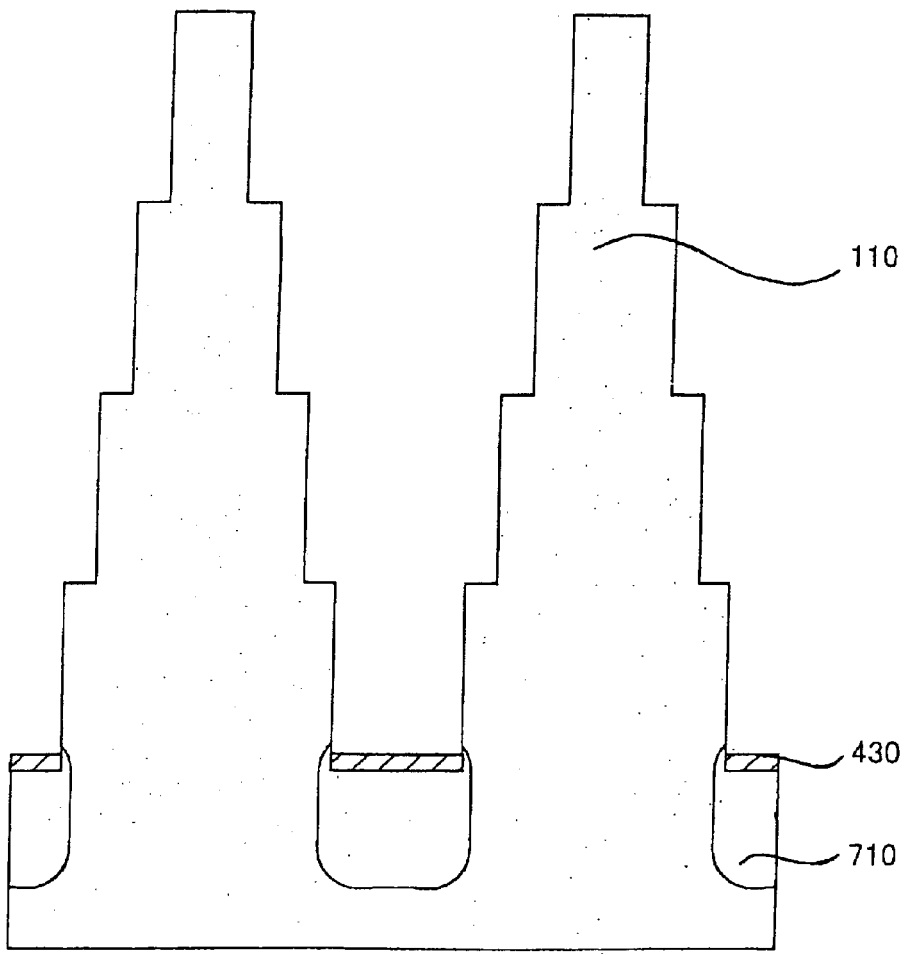

The silicon oxide film 430 is etched back by isotropic etching to a desired height in the bottom portion of the island-like semiconductor layer 110 (FIGS. 154 and 155).

Next, channel ion implantation is carried out on the sidewalls of the island-like semiconductor layer 110 as required by using a slant ion implantation (not shown). The channel ion implantation can be performed, for example, at an implantation energy of about 5 to 100 keV at a dose of about $1\times10^{11}$ to $1\times10^{13}/cm^2$ of boron in a direction inclined about 5 to 45°. The channel ion implantation may preferably be performed from various directions toward the island-like semiconductor layer 110 to make the surface impurity concentration uniform. Alternatively, instead of the channel ion implantation, an oxide film containing boron is deposited by CVD and diffusion of boron from the oxide film may be utilized. If the impurity concentration distribution of the island-like semiconductor layer 110 is equivalent, the implantation of the impurity from the surface of the island-like semiconductor layer 110 may be done before the surface of the island-like semiconductor layer 110 is covered with the silicon oxide film 430 or may be finished before the island-like semiconductor layer 110 is formed. The implantation may be conducted at any timing by any means.

Figure 156:
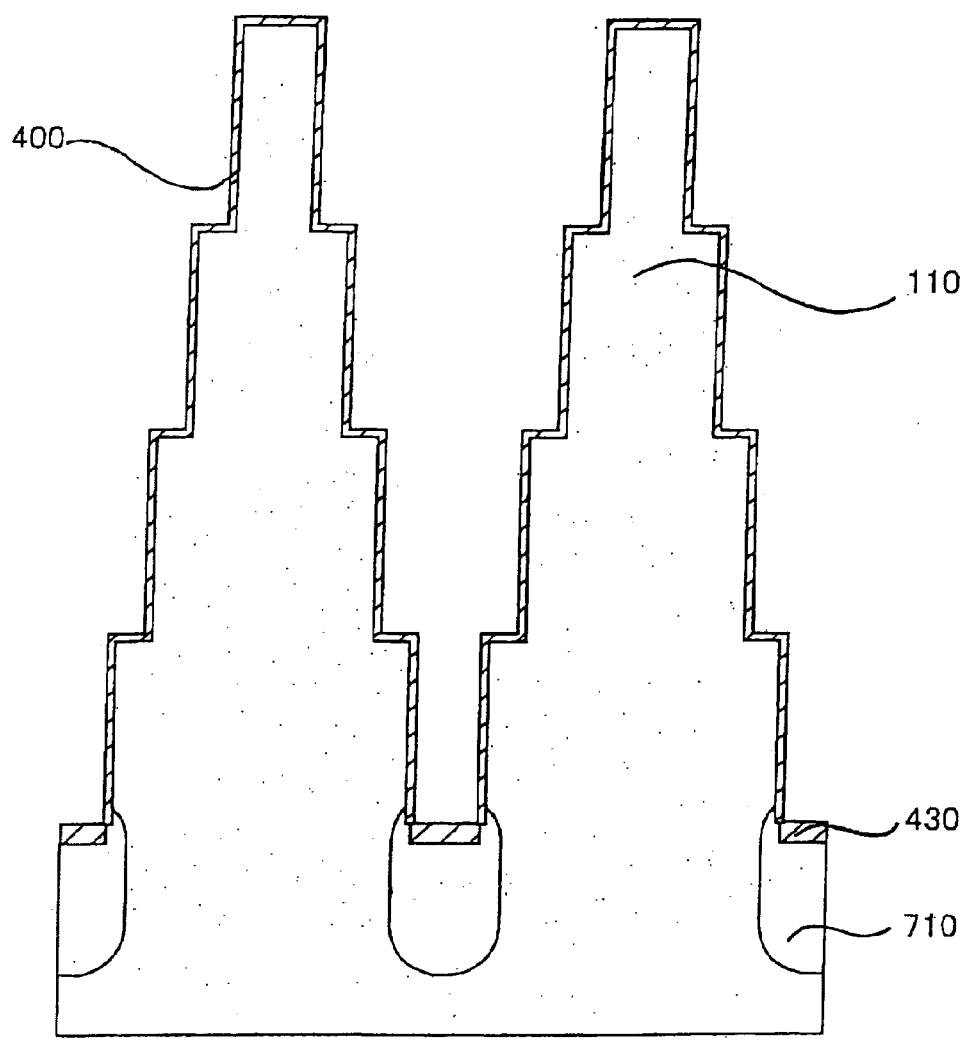
Figure 157:
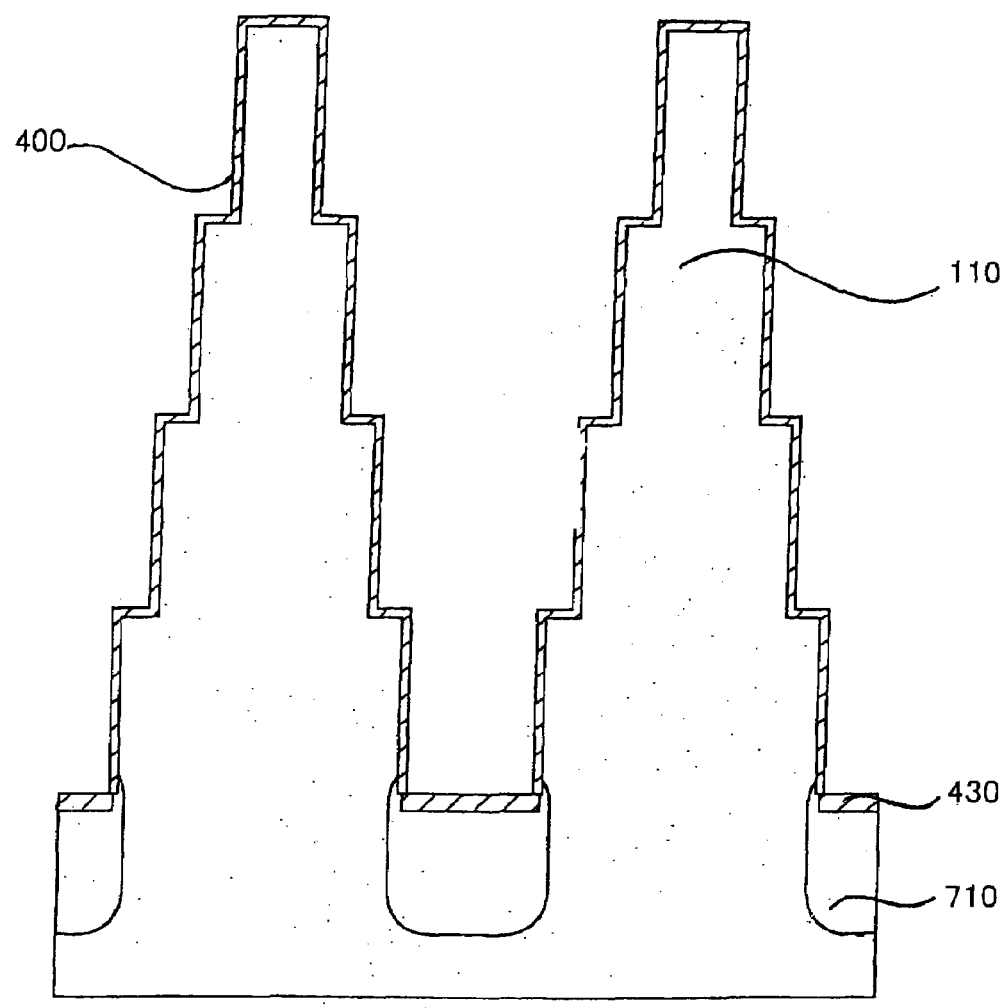

Subsequently, a silicon oxide film 400 (gate oxide film) having a thickness of about 20 nm is formed as a fifteenth insulating film around the island-like semiconductor layer 110 by thermal oxidation (FIGS. 156 and 157).

Figure 158:
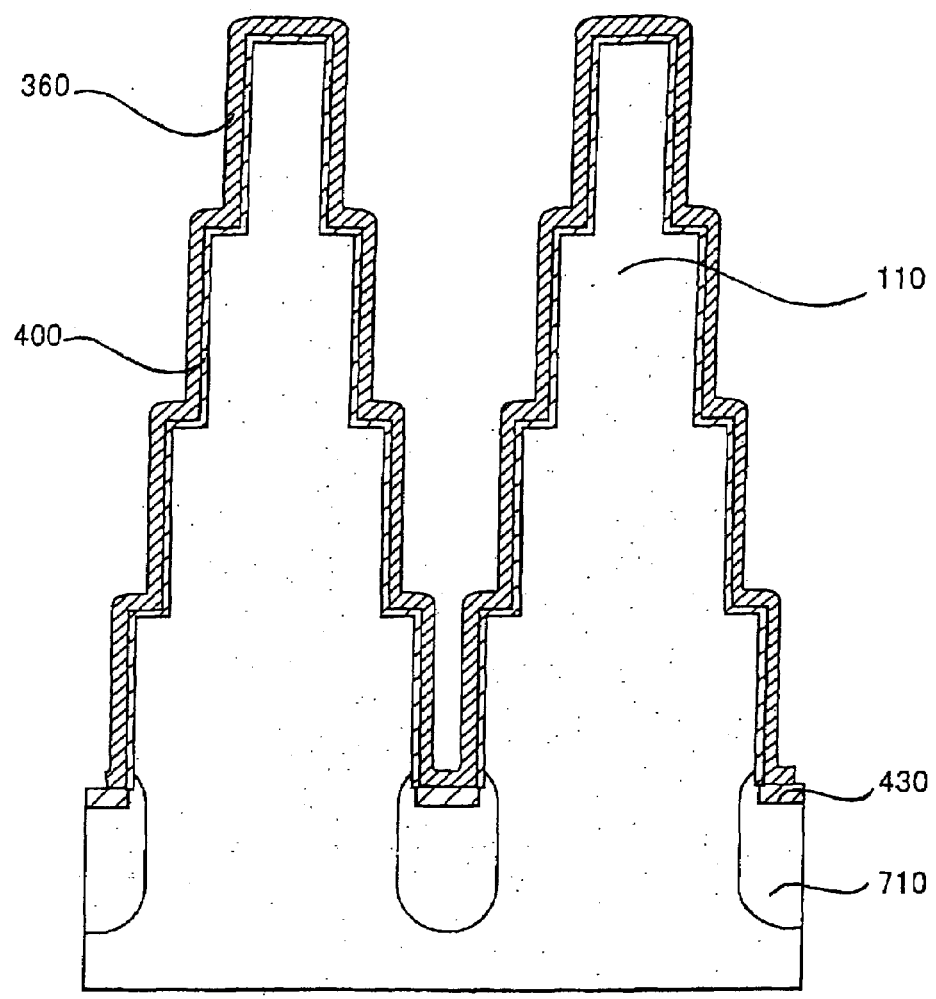
Figure 159:
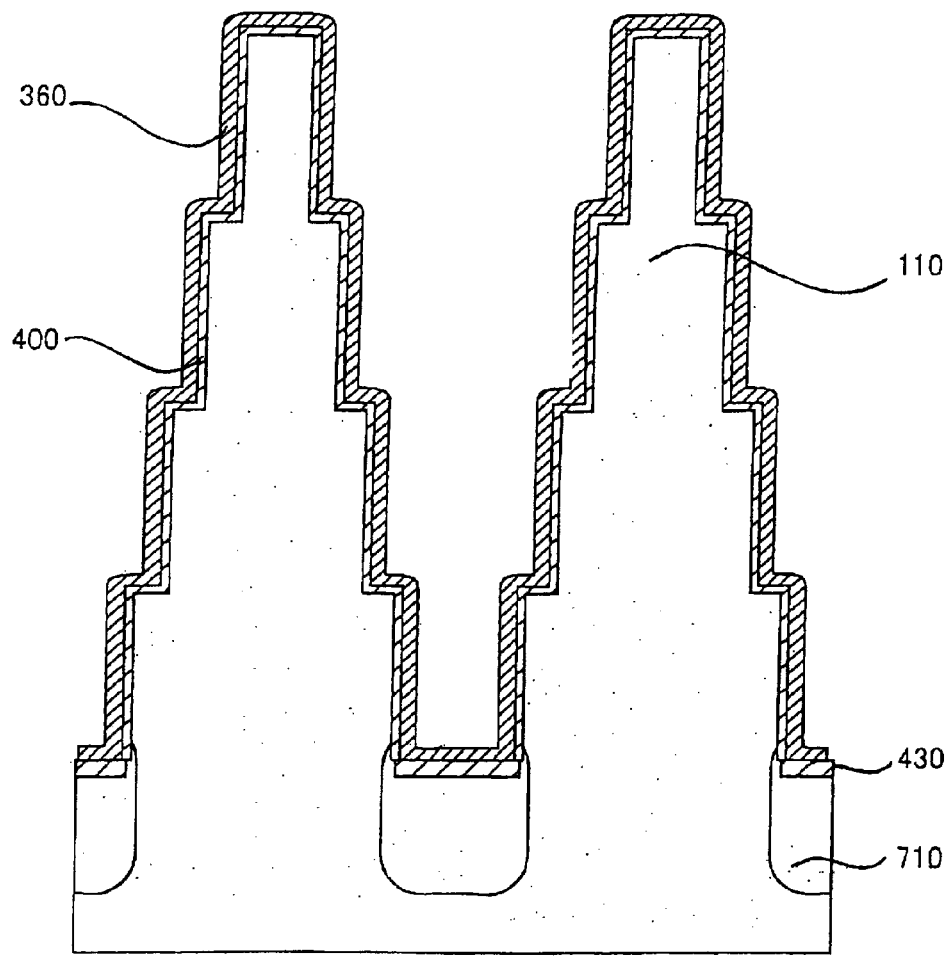
Figure 160:
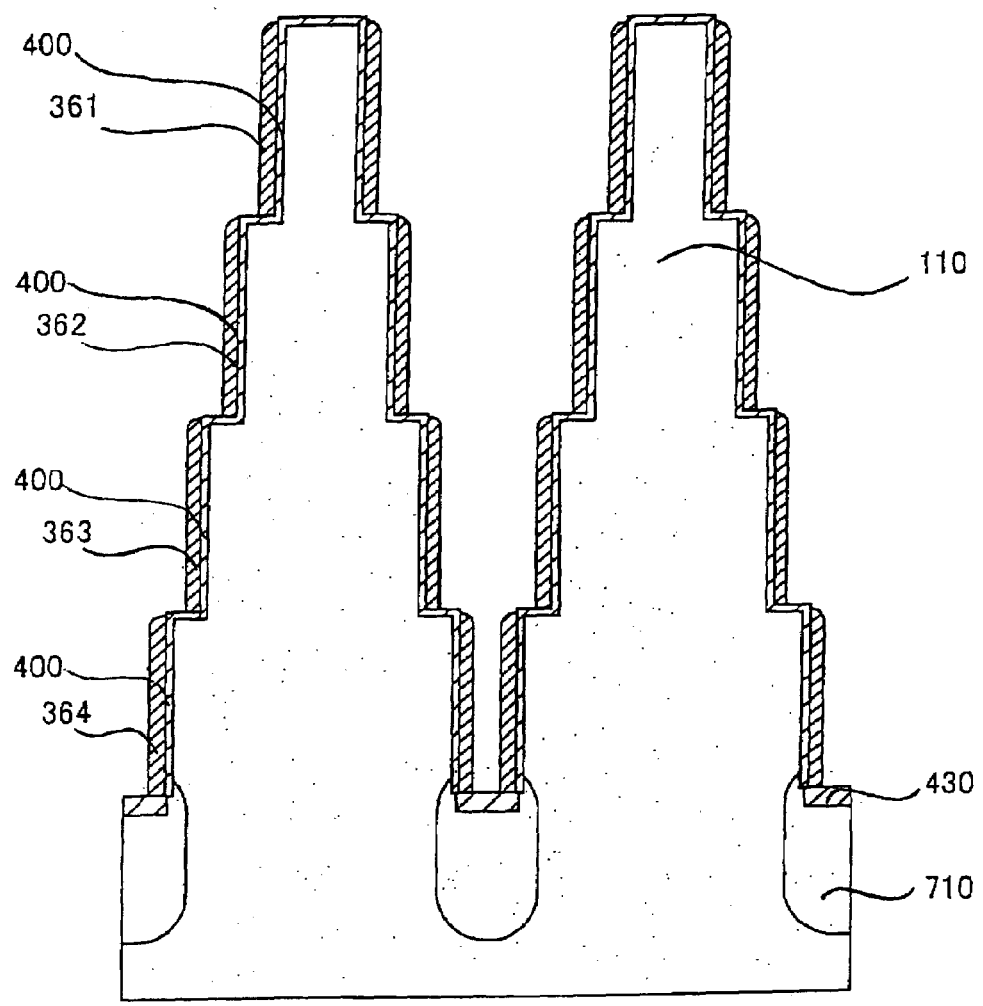
Figure 161:
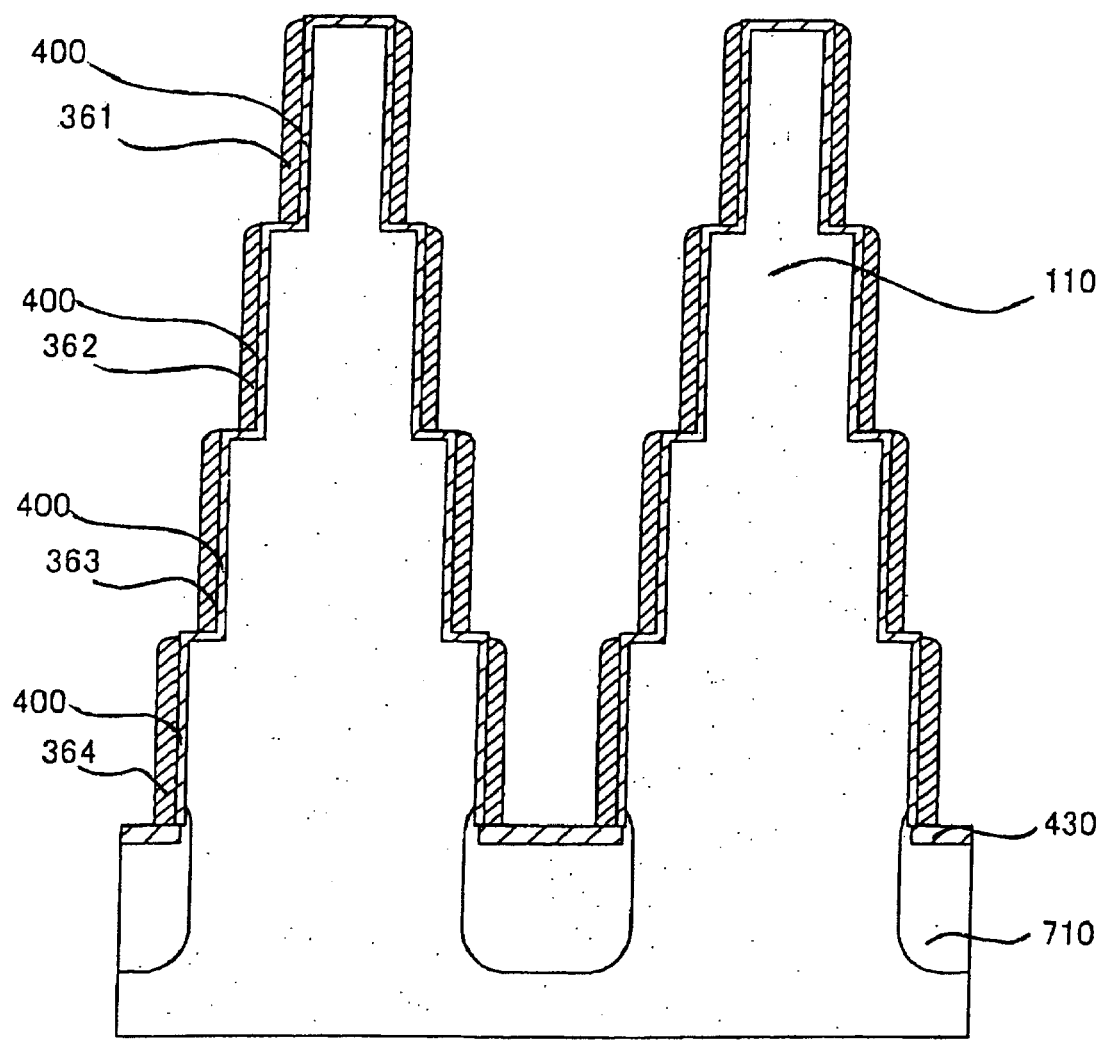

A silicon nitride film 360 is deposited to 10 to 1000 nm as a sixteenth insulating film (FIGS. 158 and 159) and processed by anisotropic etching to form silicon nitride film sidewall spacers 361, 362, 363, and 364 on the side walls of the steps of the island-like semiconductor layer 110 with the intervention of the silicon oxide film 400 (FIGS. 160 and 161).

Figure 162:
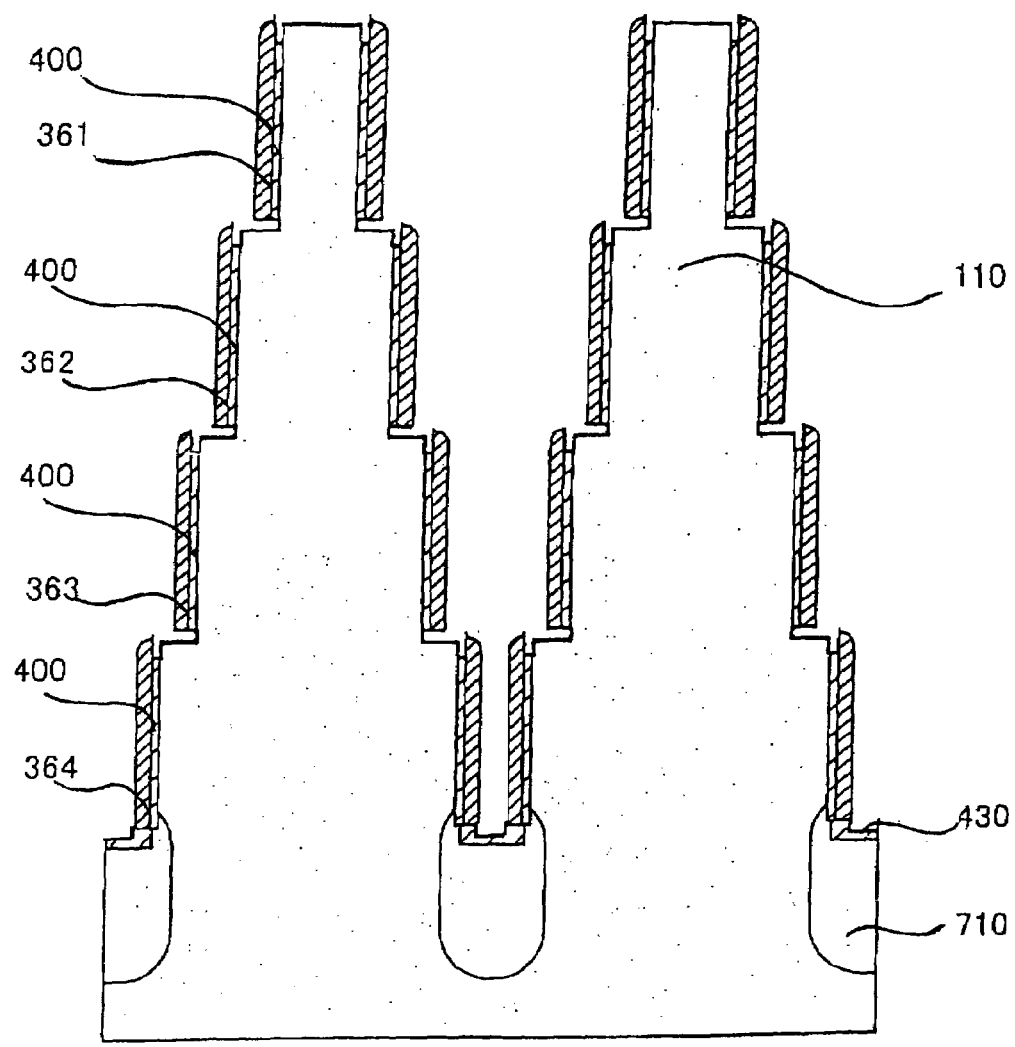
Figure 163:
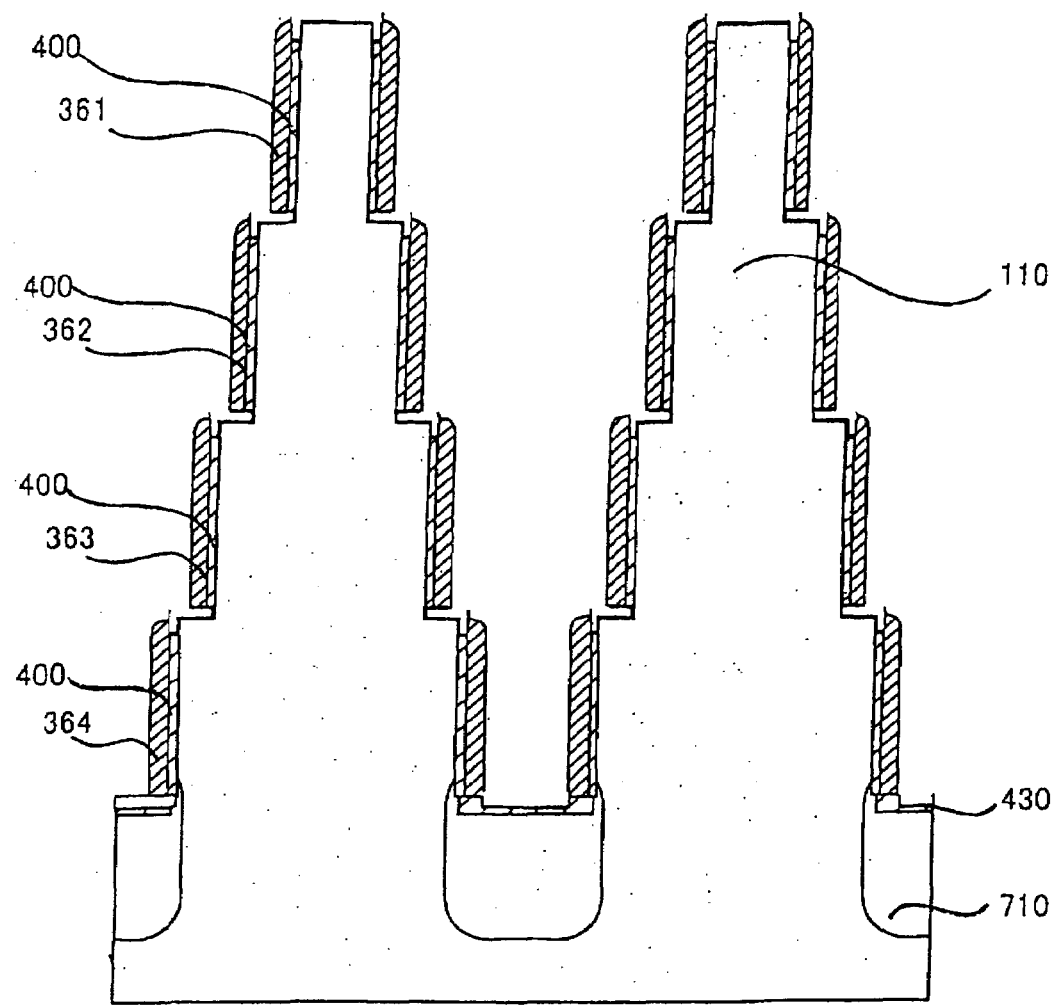

Subsequently, using the silicon nitride film sidewall spacers 361, 362, 363, and 364 as masks, a part of the silicon oxide film 400 is selectively removed to expose the horizontal face of each of the steps of the island-like semiconductor layer 110 by diluted HF method (FIGS. 162 and 163). The silicon oxide film 400 may be removed by using isotropic dry etching such as CDE or a combination of anisotropic dry etching such as RIE and isotropic etching such as diluted HF method.

Figure 164:
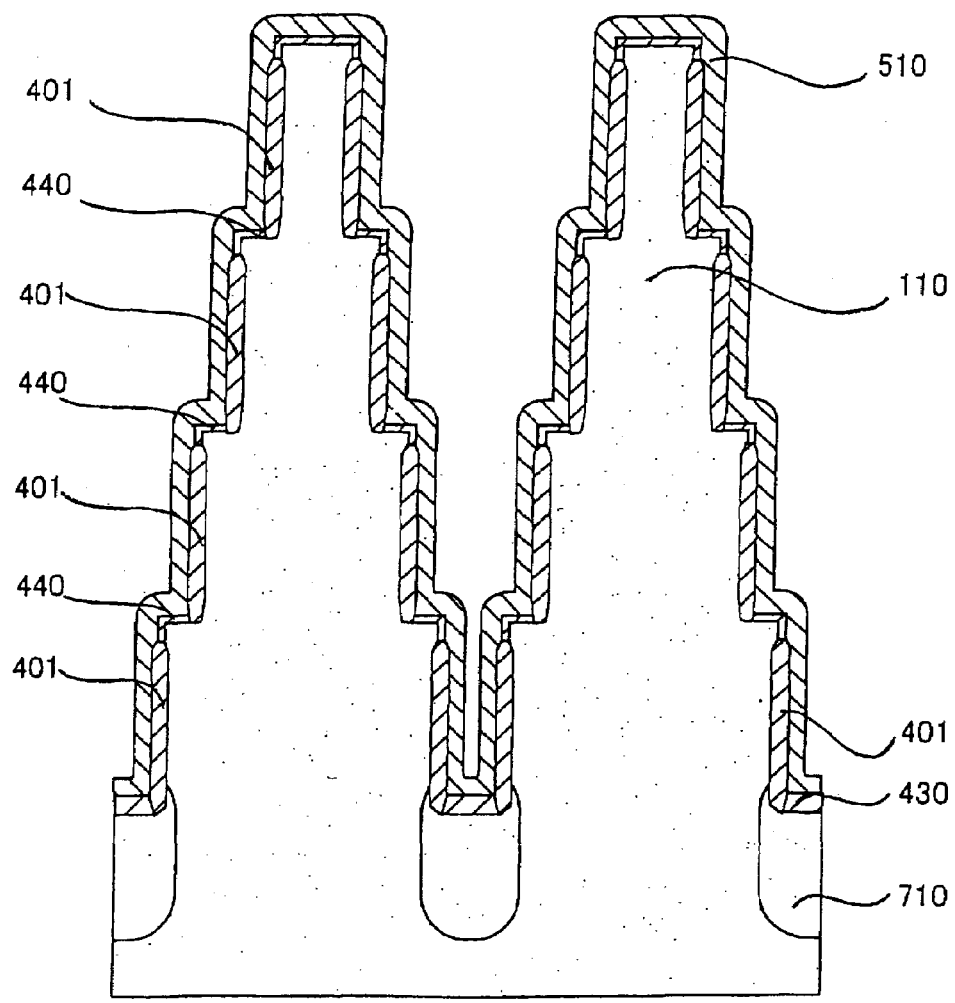
Figure 165:
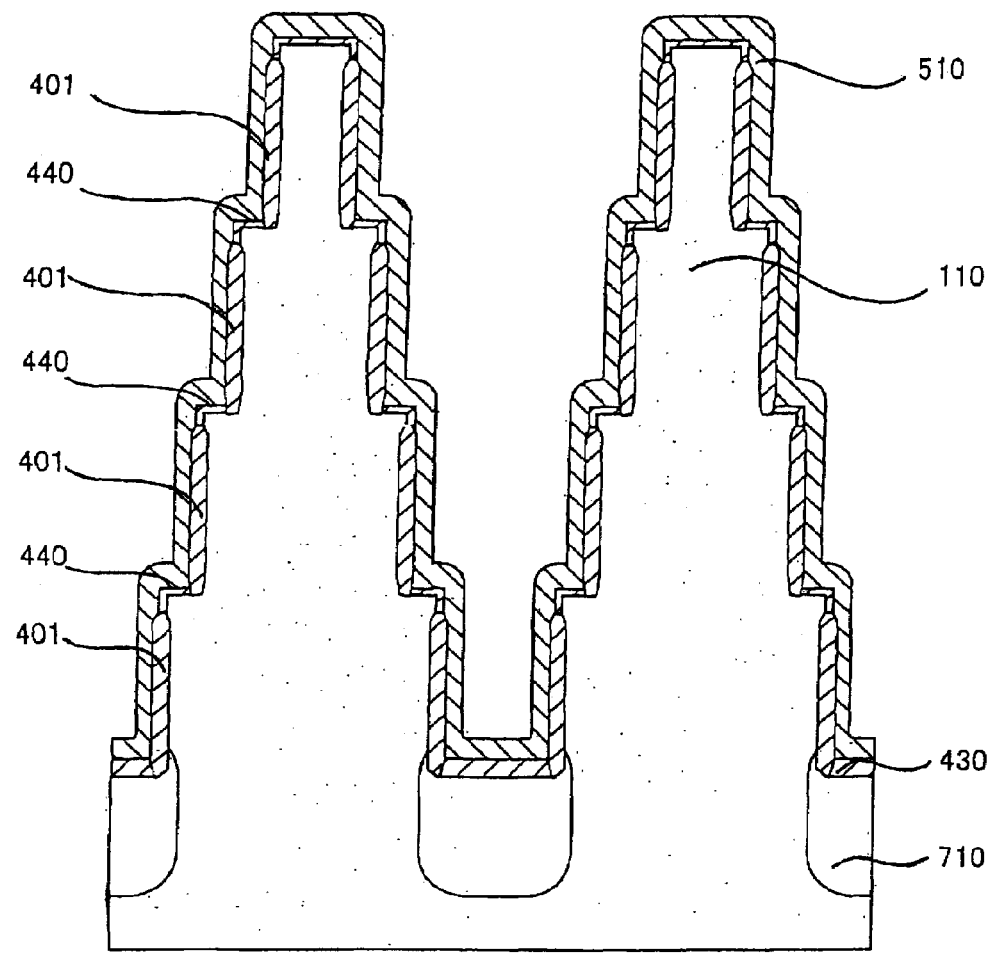

After that, the silicon nitride film sidewall spacers 361, 362, 363, and 364 are selectively removed by isotropic etching, a silicon oxide film 440 (tunnel oxide film) having a thickness of about 10 nm is formed as a fifth insulating film and, simultaneously, a silicon oxide film 401 as a seventeenth insulating film having a thickness of 250 nm is formed in the exposed portions of the island-like semiconductor layer 110 by thermal oxidation. The tunnel oxide film is not limited to the thermally oxidized film but may be a CVD oxide film or an oxynitride film. The thickness and a combination of the fifth, fifteenth, and seventeenth insulating films are not limited to the example. A polysilicon film 510 as a first conductive film is deposited to about 20 to 200 nm (FIGS. 164 and 165).

Figure 166:
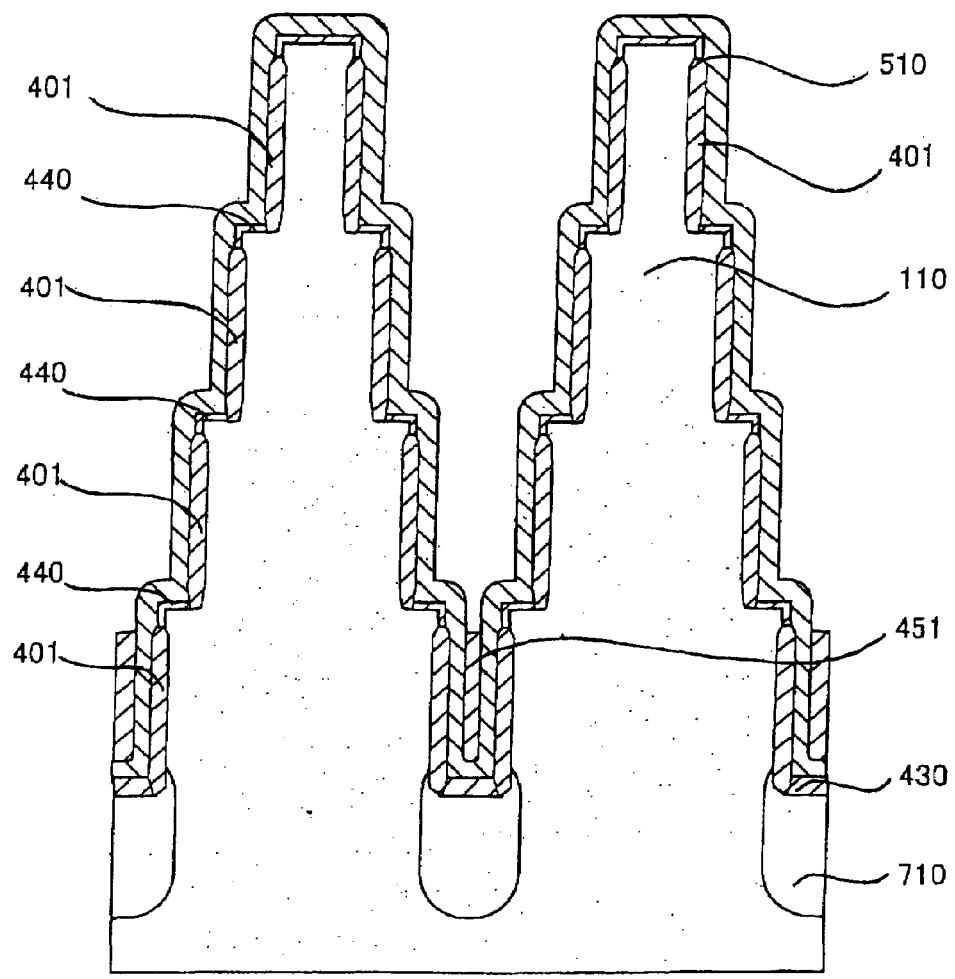
Figure 167:
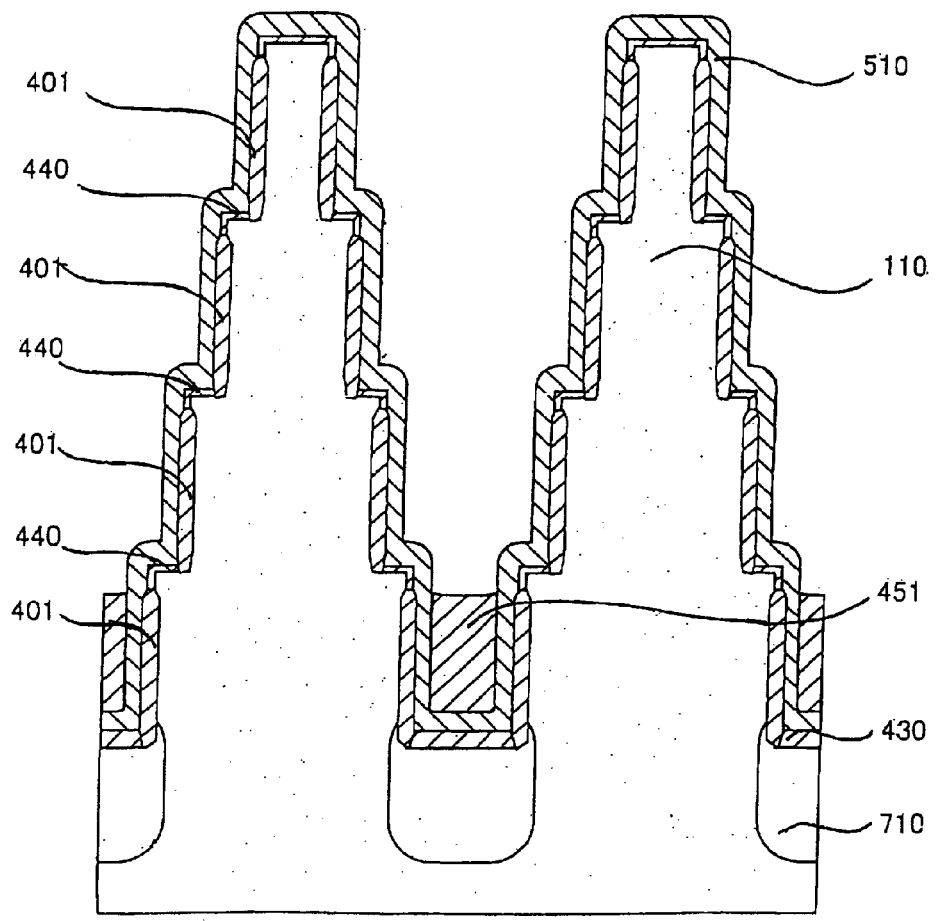

After that, a silicon oxide film 451 as a sixth insulating film is deposited to about 20 to 200 nm and etched back to a desired depth (FIGS. 166 and 167).

Figure 168:
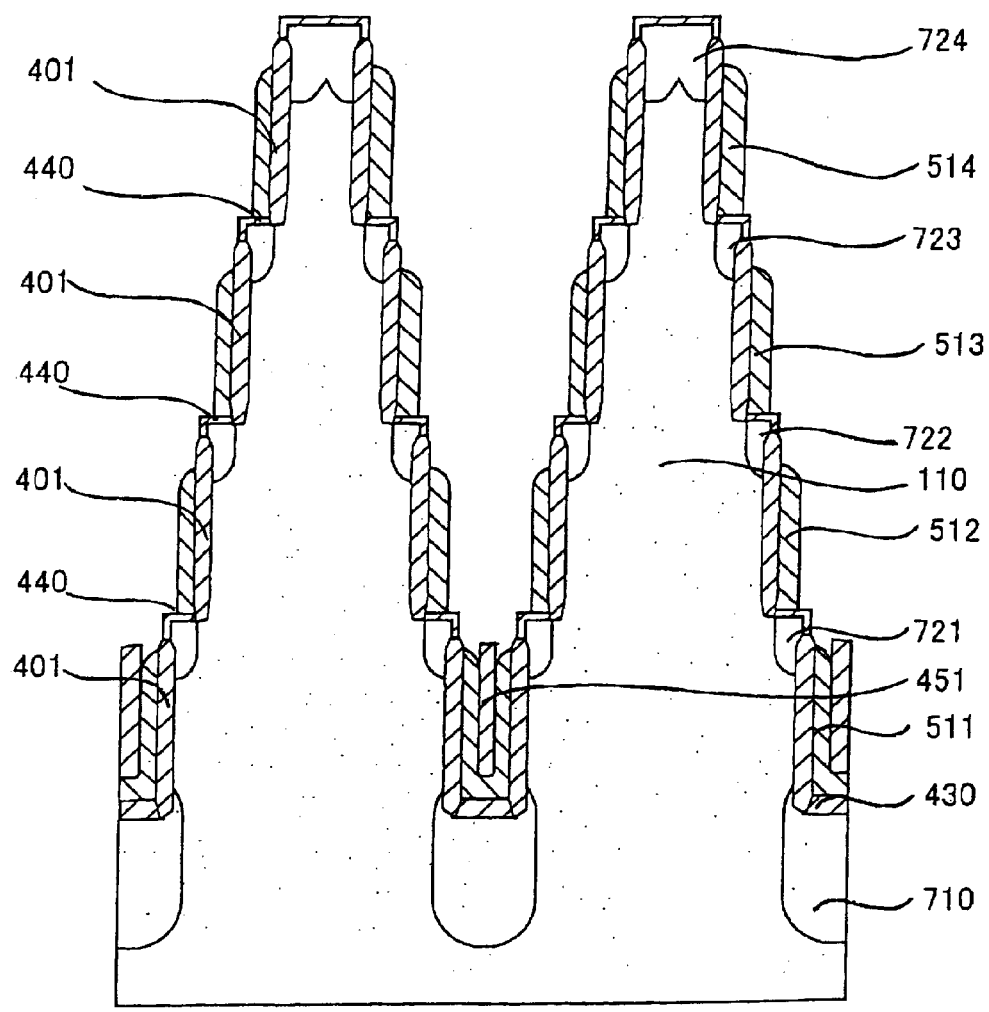
Figure 169:
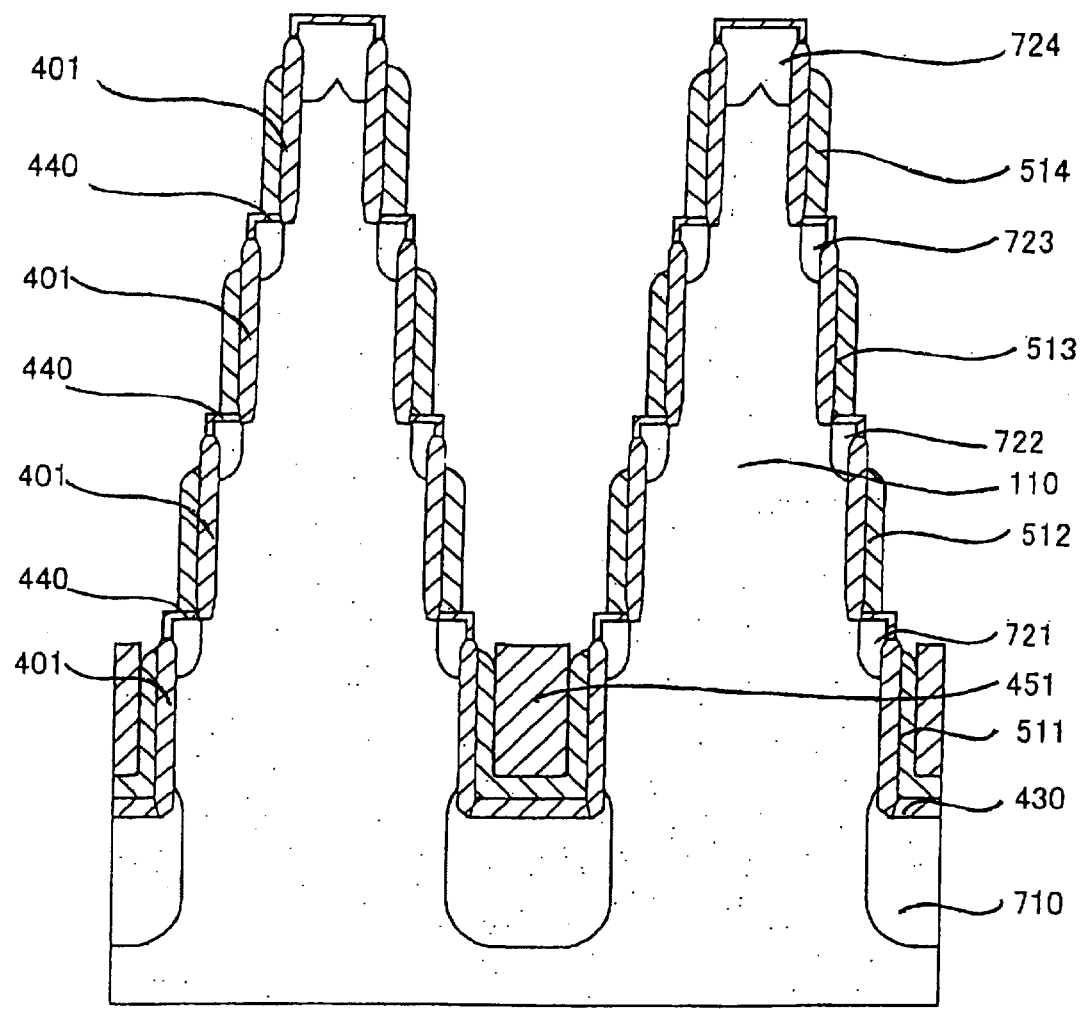

By anisotropic etching, the polysilicon film 510 is processed into the form of sidewall spacers on the sidewalls of the steps of the island-like semiconductor layer 110, whereby separate polysilicon films 511, 512, 513 and 514 are formed at the same time. The polysilicon films 511 (selection gate) at the lowest steps are kept continuous by protection of the silicon oxide film 451. Consequently, the insulating films sandwiched by the polysilicon films 511, 512, 513, and 514 processed in the form of the sidewall spacers and the island-like semiconductor layer 110 are constructed by the silicon oxide films 440 and 401. Next, impurity is introduced into corners of the island-like semiconductor layer 110 having the steps to form n-type impurity diffusion layers 721, 722, 723, and 724 (FIGS. 168 and 169). The impurity diffusion layers 721, 722, 723, and 724 can be formed, for example, with an implantation energy of 5 to 100 keV at a dose of about $1\times10^{12}$ to $1\times10^{15}/cm^2$ of arsenic or phosphorus from a direction inclined about 0 to 45°. The ion implantation may be carried out from one direction, several directions, or all around of the island-like semiconductor layer 110.

Figure 170:
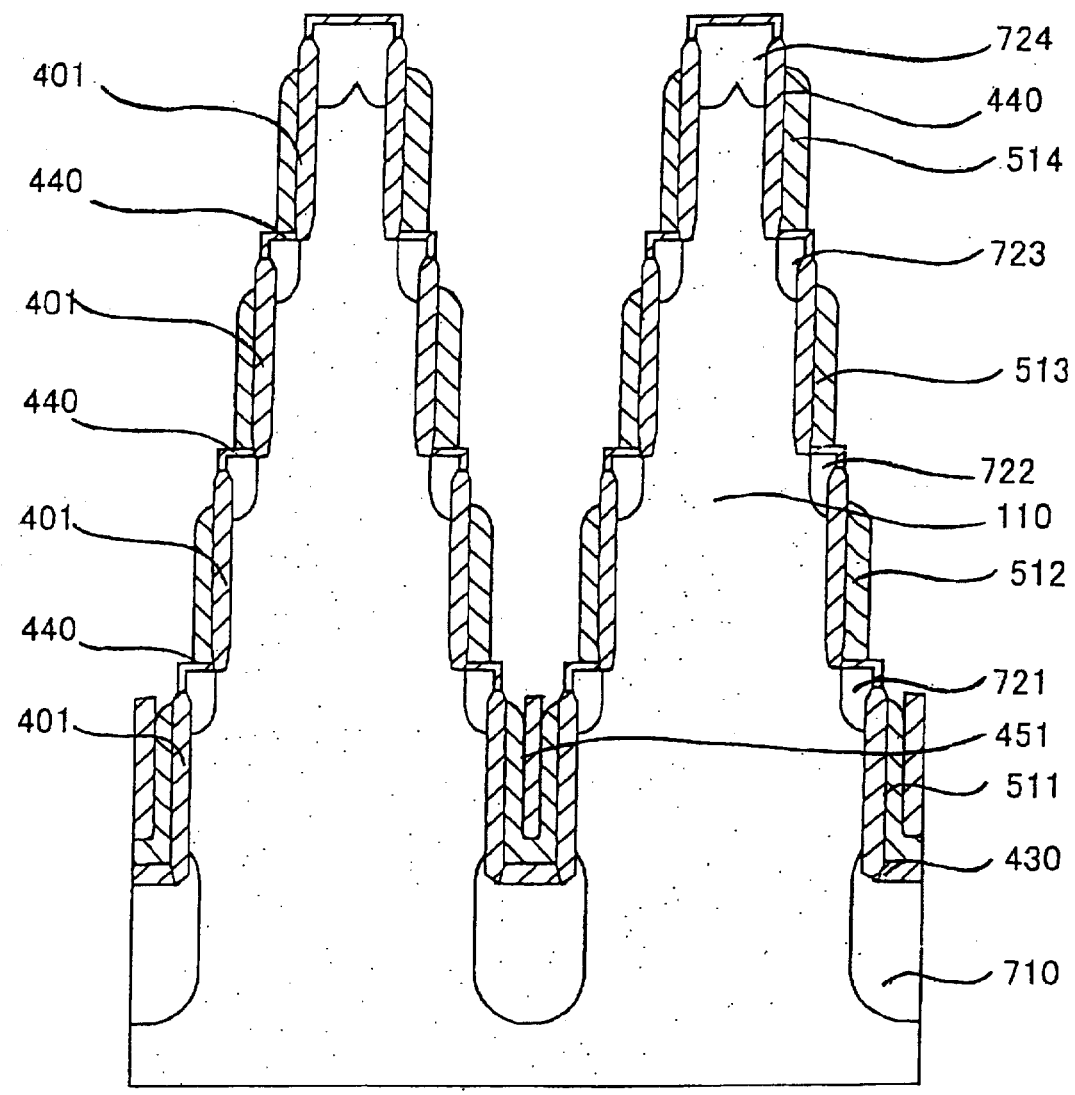
Figure 171:
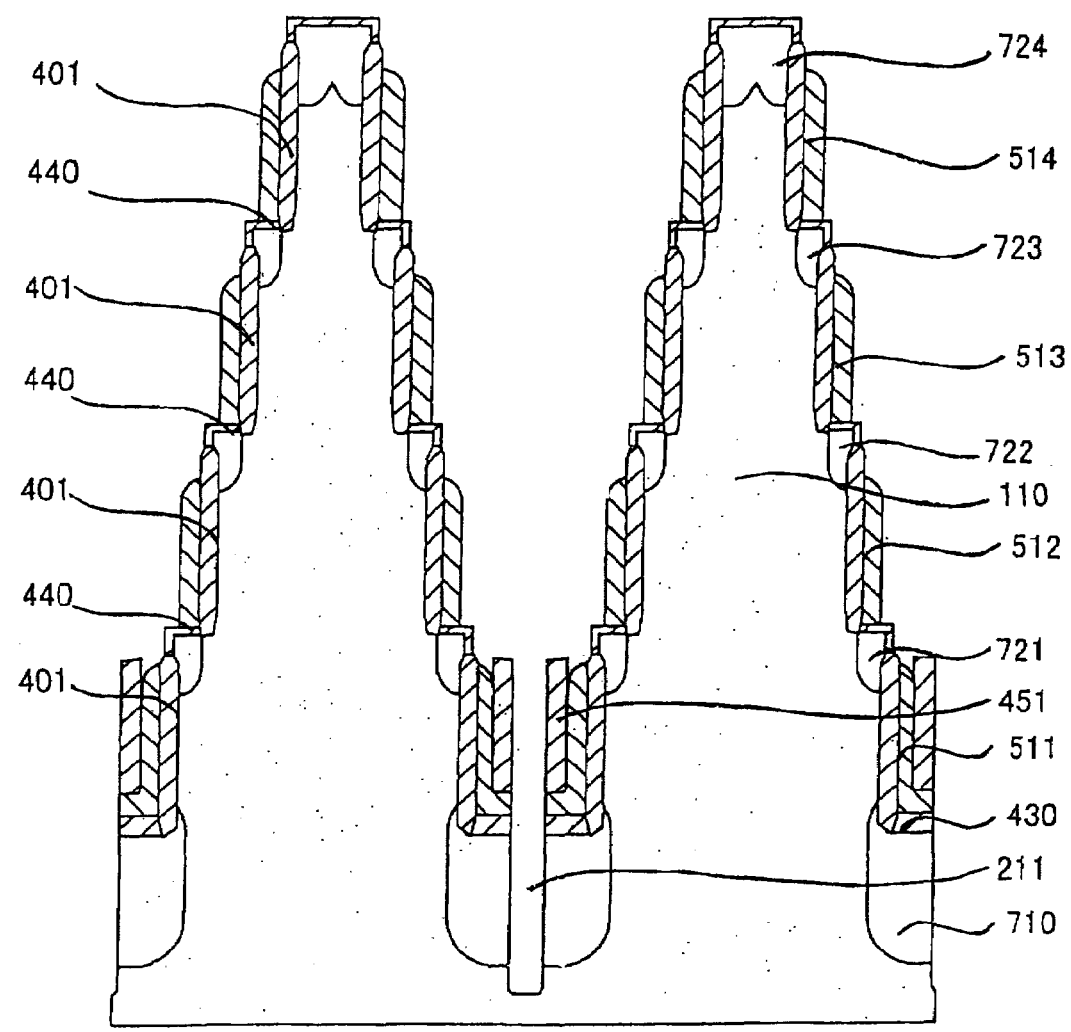

Thereafter, using as a mask a resist film R2 patterned by a known photolithography technique, by reactive ion etching, the silicon oxide film 451 is etched, and the polysilicon film 511, the silicon oxide film 430 and the impurity diffusion layer 710 are etched to form a first trench 211 (FIGS. 170 and 171). Thereby a first wiring layer continuous in the A–A' direction in FIG. 1 and a second wiring layer to be a selection gate line are divided.

Figure 172:
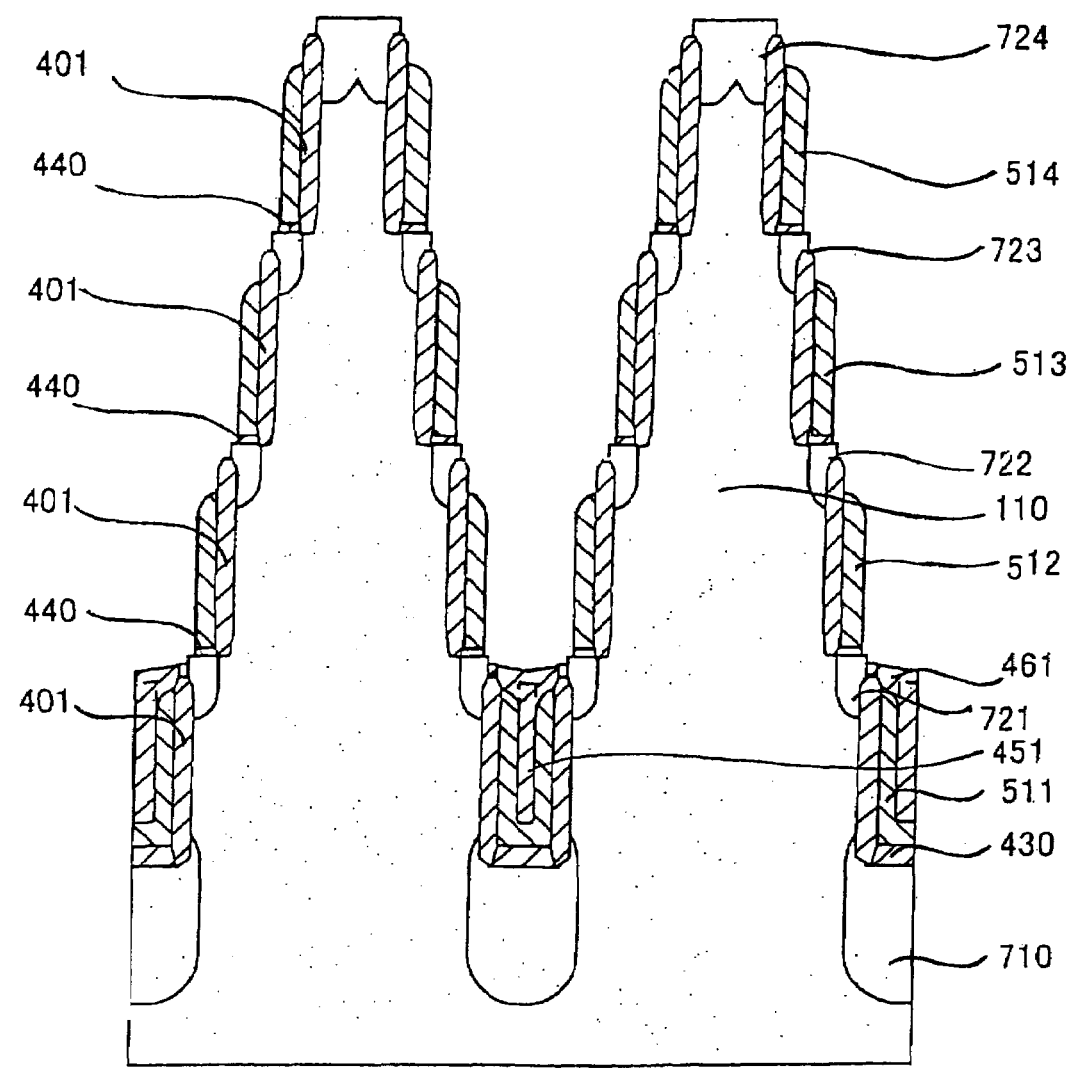
Figure 173:
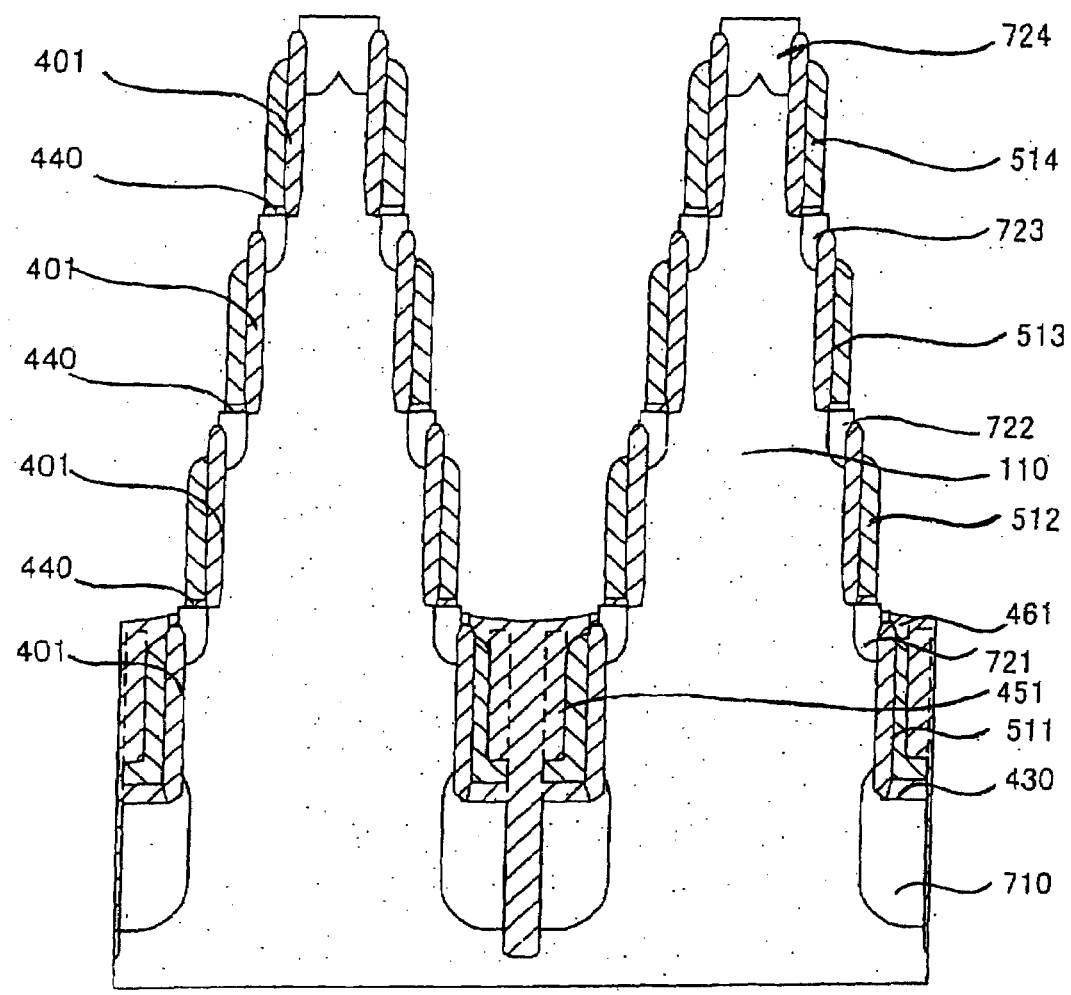

Next, a silicon oxide film 461 is deposited to about 20 to 200 nm as a seventh insulating film and is isotropically etched so as to bury the first trench 211 and the top of the polysilicon film 511 (FIGS. 172 and 173).

Figure 174:
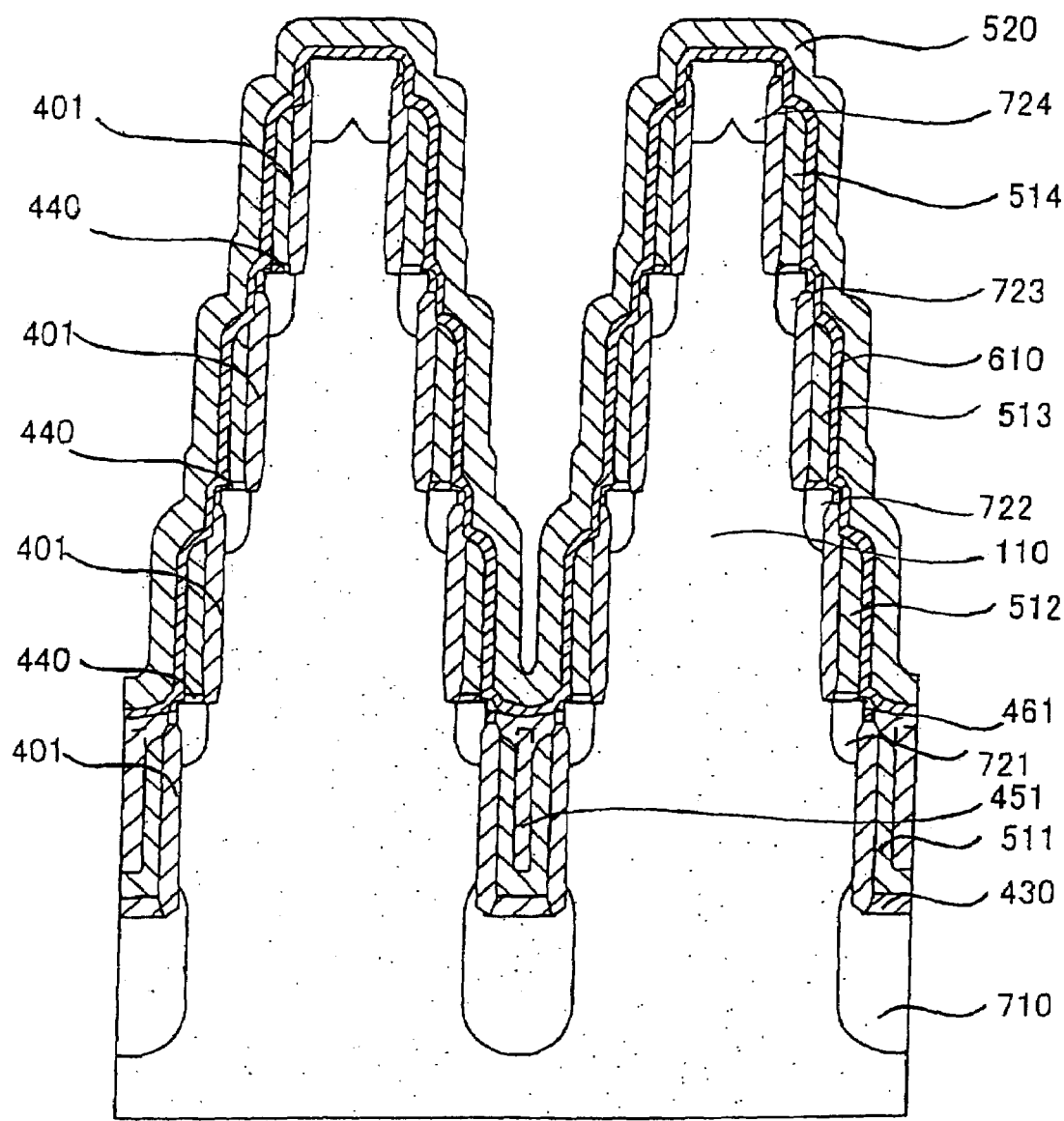
Figure 175:
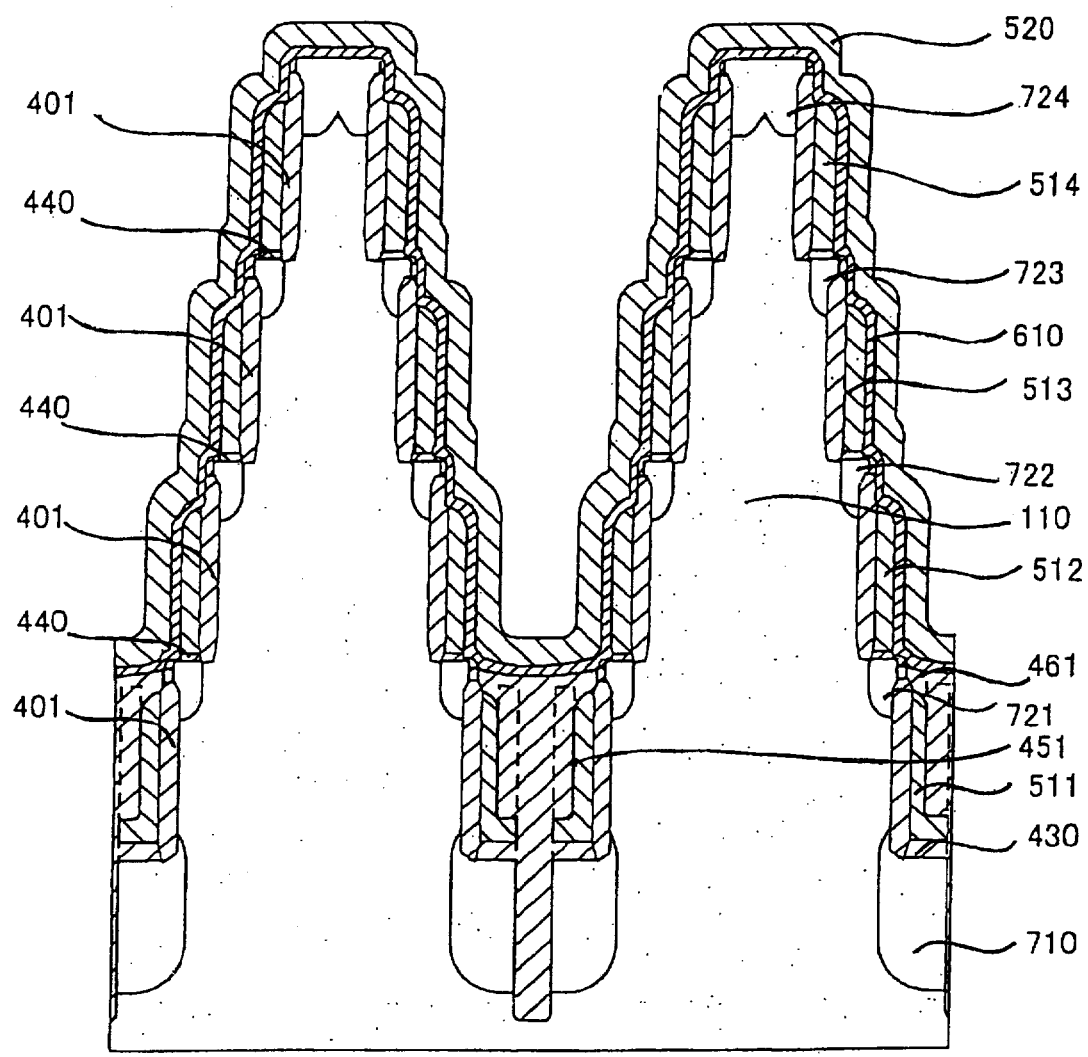

Subsequently, an interlayer insulating film 610 is formed on the exposed surfaces of the polysilicon films 512, 513 and 514. The interlayer insulating film 610 may be an ONO film, for example. The ONO film can be formed as follows. On the surfaces of the polysilicon films, a silicon oxide film of 5 to 10 nm thickness by thermal oxidation, and a silicon nitride film of 5 to 10 nm thickness by CVD and further a silicon oxide film of 5 to 10 nm thickness by CVD are sequentially deposited. Next, a polysilicon film 520 is deposited to 15 to 150 nm as a second conductive film (FIGS. 174 and 175).

Figure 176:
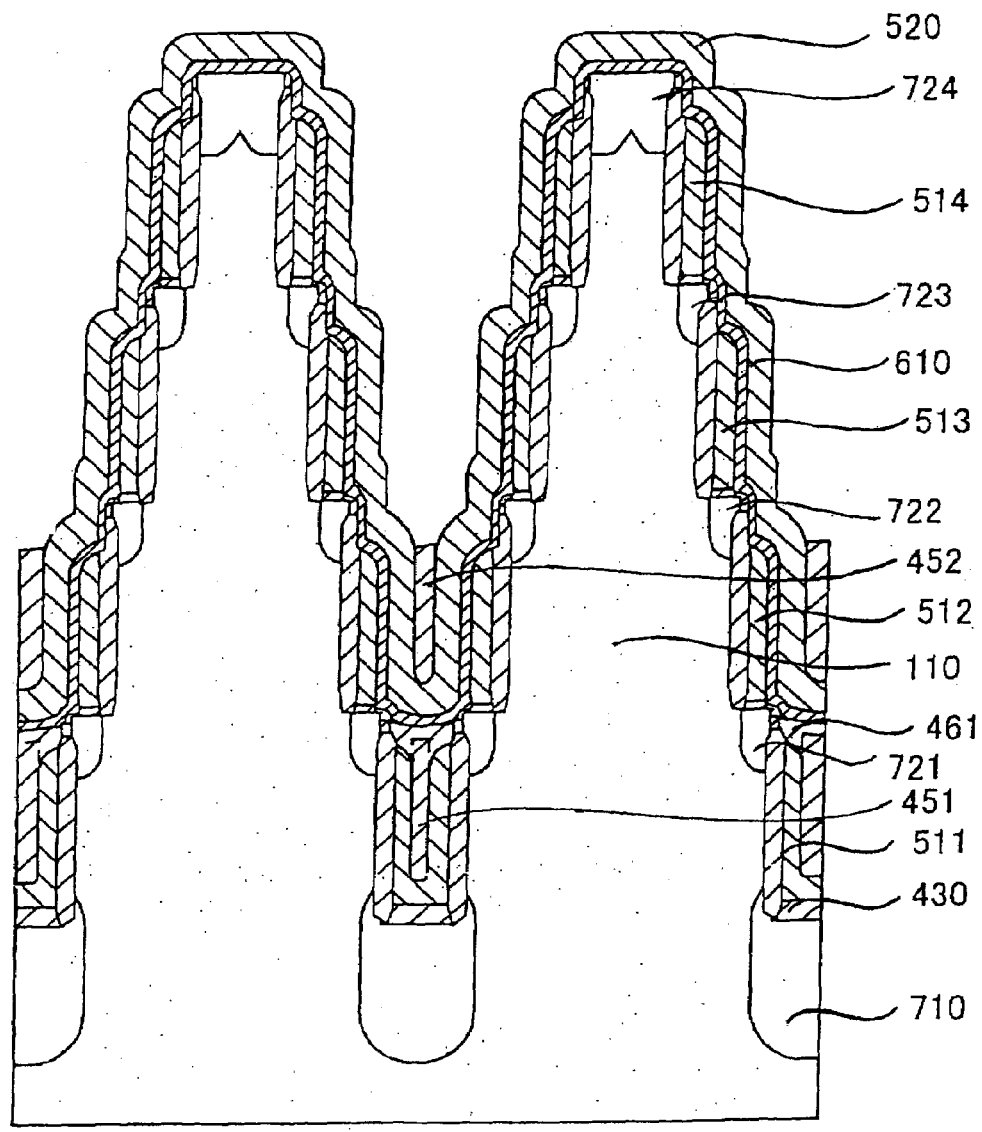
Figure 177:
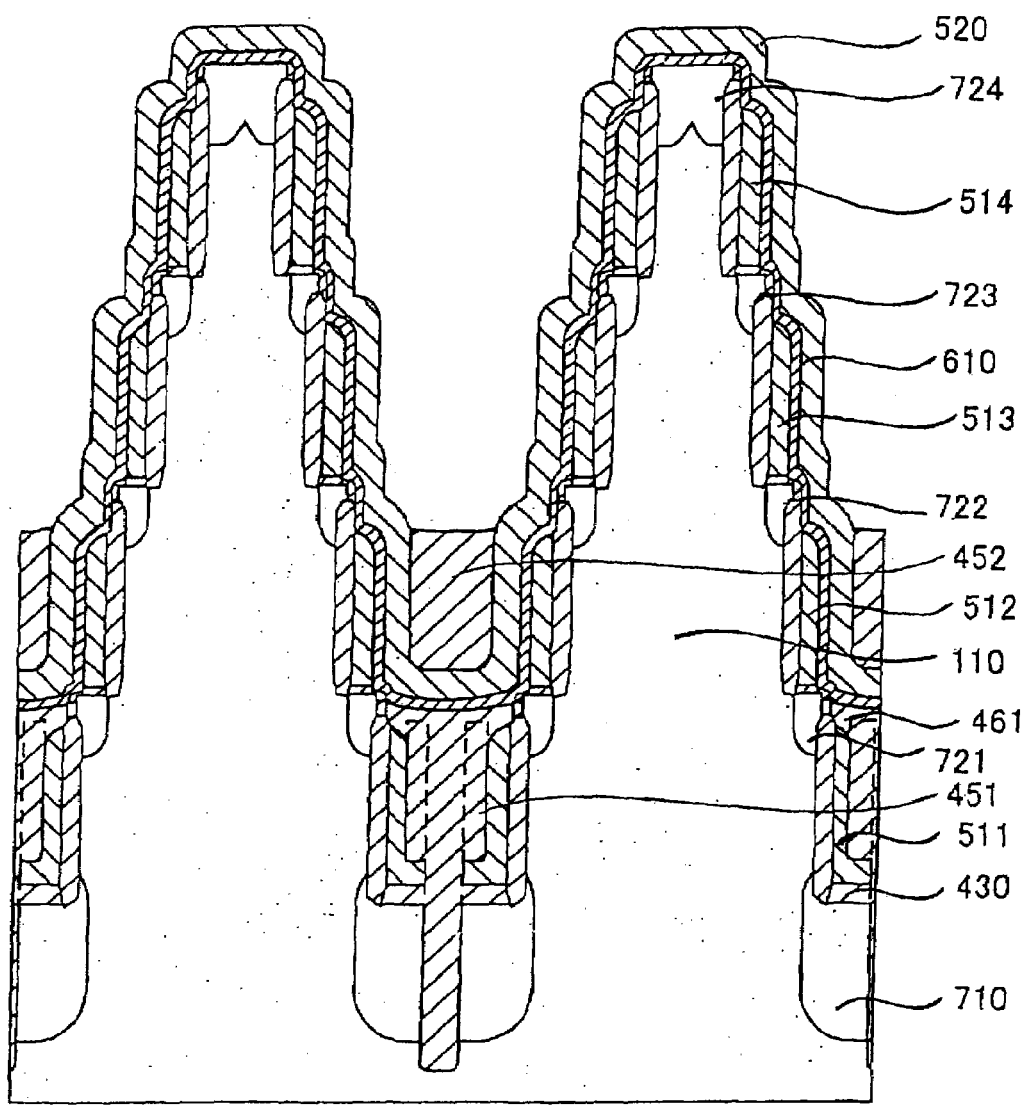

Thereafter, a silicon oxide film 452 is deposited to about 20 to 200 nm as a sixth insulating film and etched back to a desired depth (FIGS. 176 and 177).

Figure 178:
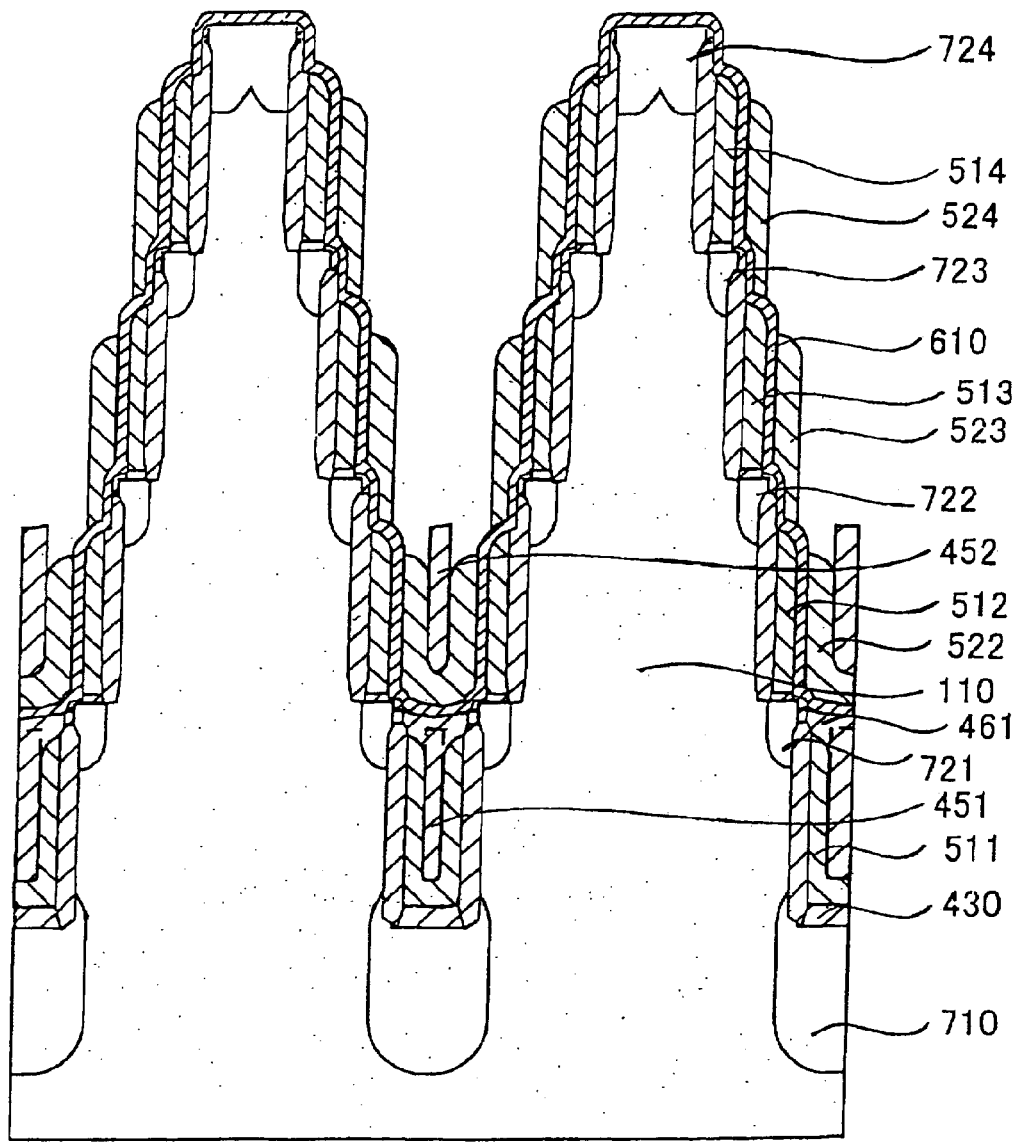
Figure 179:
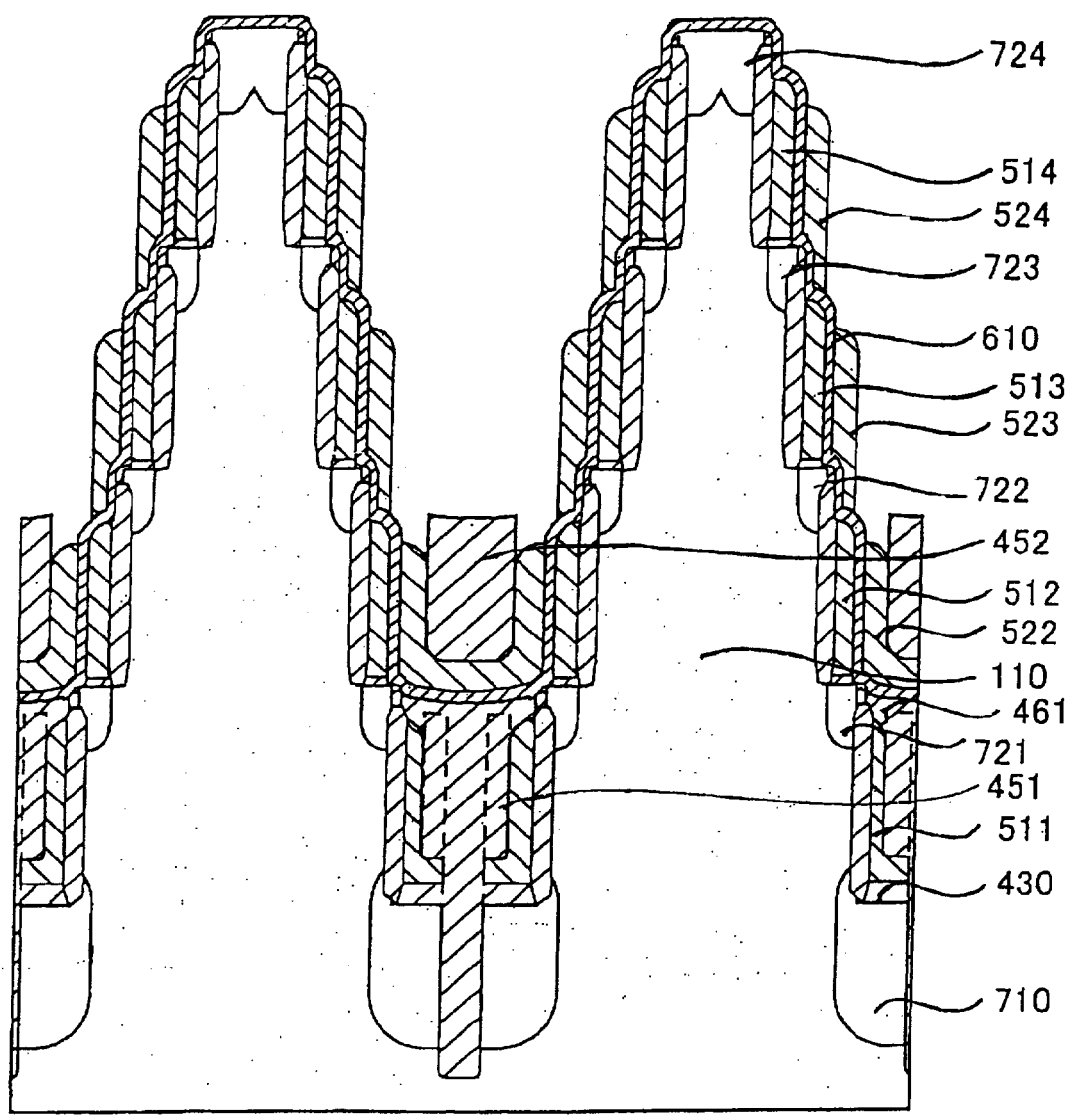

By anisotropic etching, the polysilicon film 520 is processed into the form of sidewall spacers, thereby forming, on the sidewalls of the polysilicon films 512, 513 and 514 in the steps of the island-like semiconductor layer 110 with intervention of the interlayer insulating film 610, separate polysilicon films 522, 523, and 524 in a lump (FIGS. 178 and 179). All of the control gates, i.e., polysilicon film 522 in the low steps are kept continuous by protection of the silicon oxide film 452.

Figure 180:
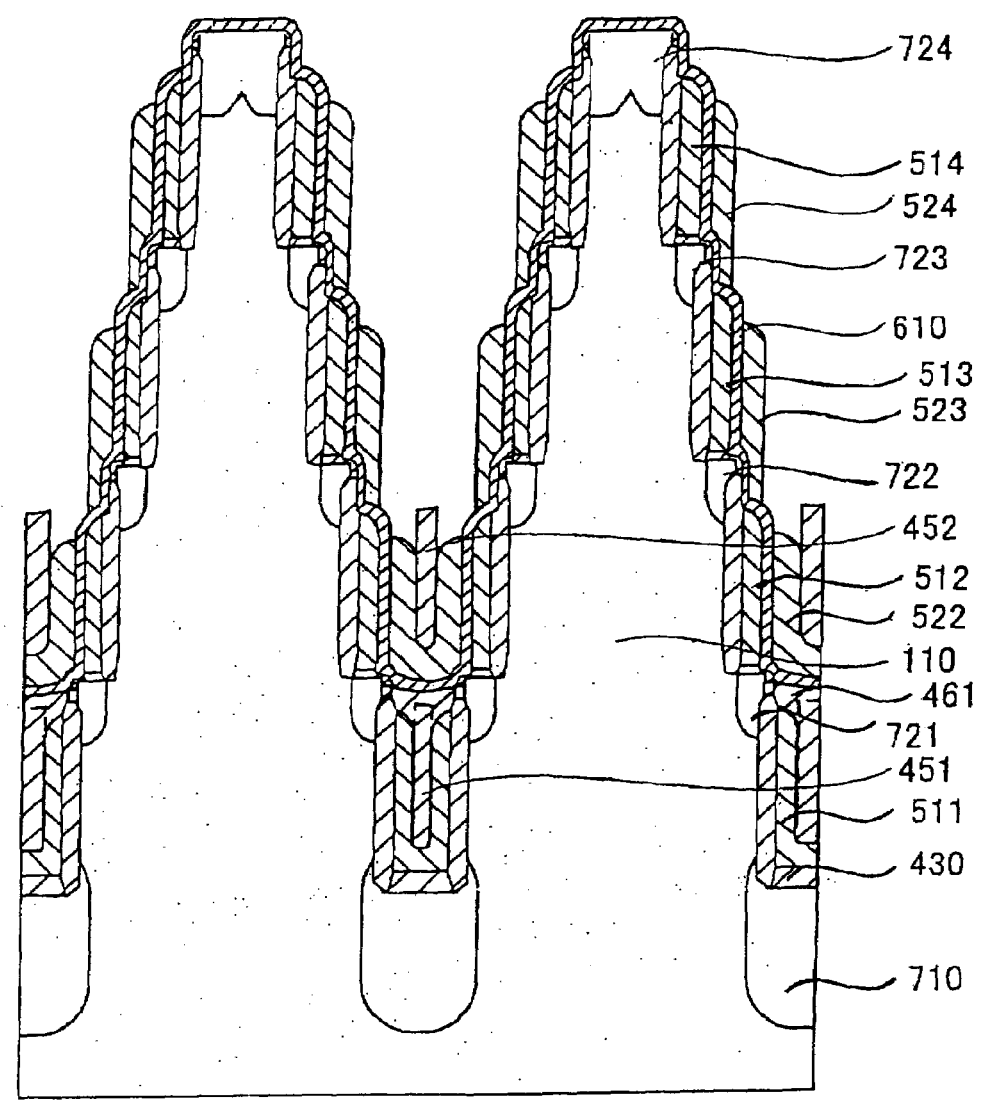
Figure 181:
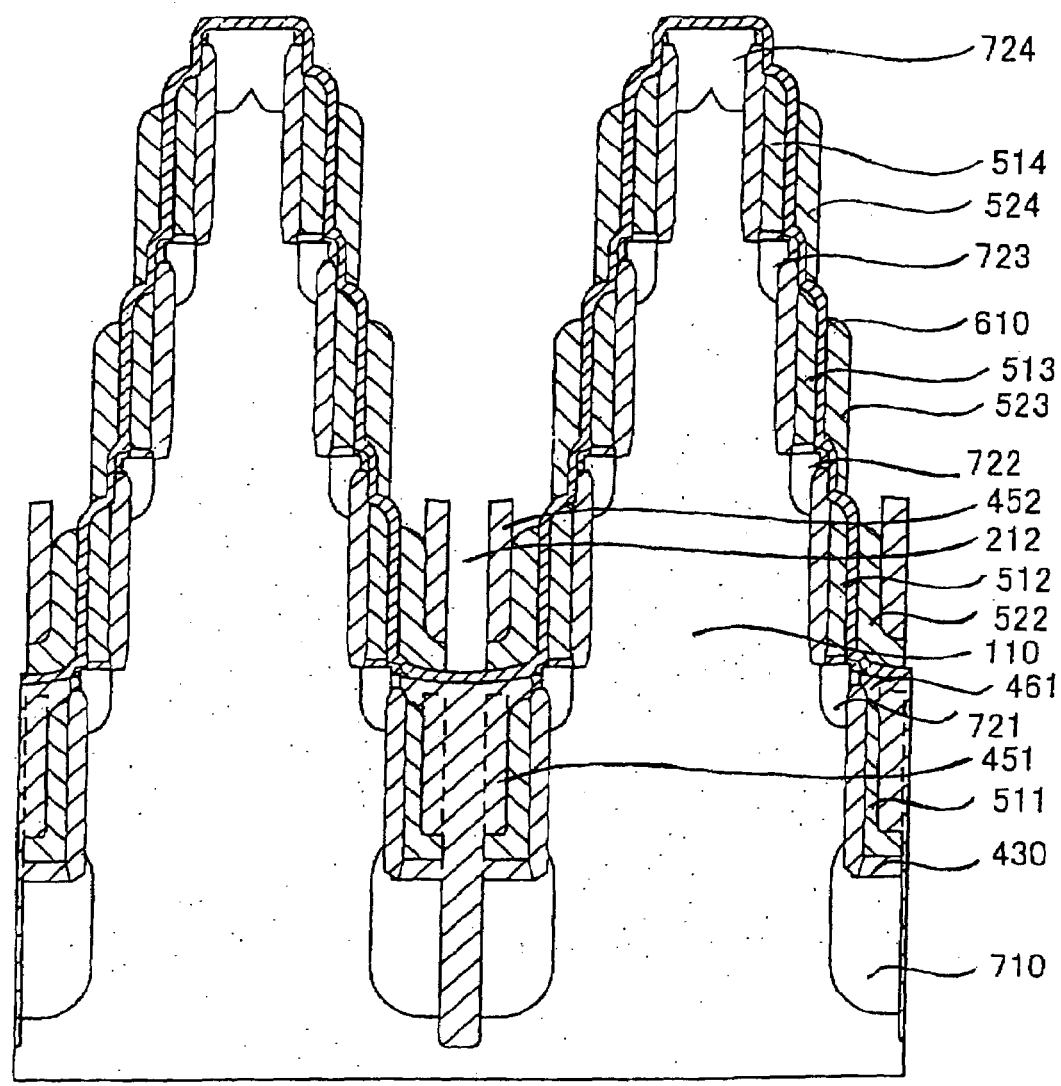

Subsequently, using as a mask a resist film R3 patterned by a known photolithography technique, by reactive ion etching, the silicon oxide film 452 is etched and the polysilicon film 522 is etched to form a first trench 212 (FIGS. 180 and 181). Thereby a third wiring layer to be a control gate line continuous in the A–A' direction in FIG. 1 is formed separately.

Figure 182:
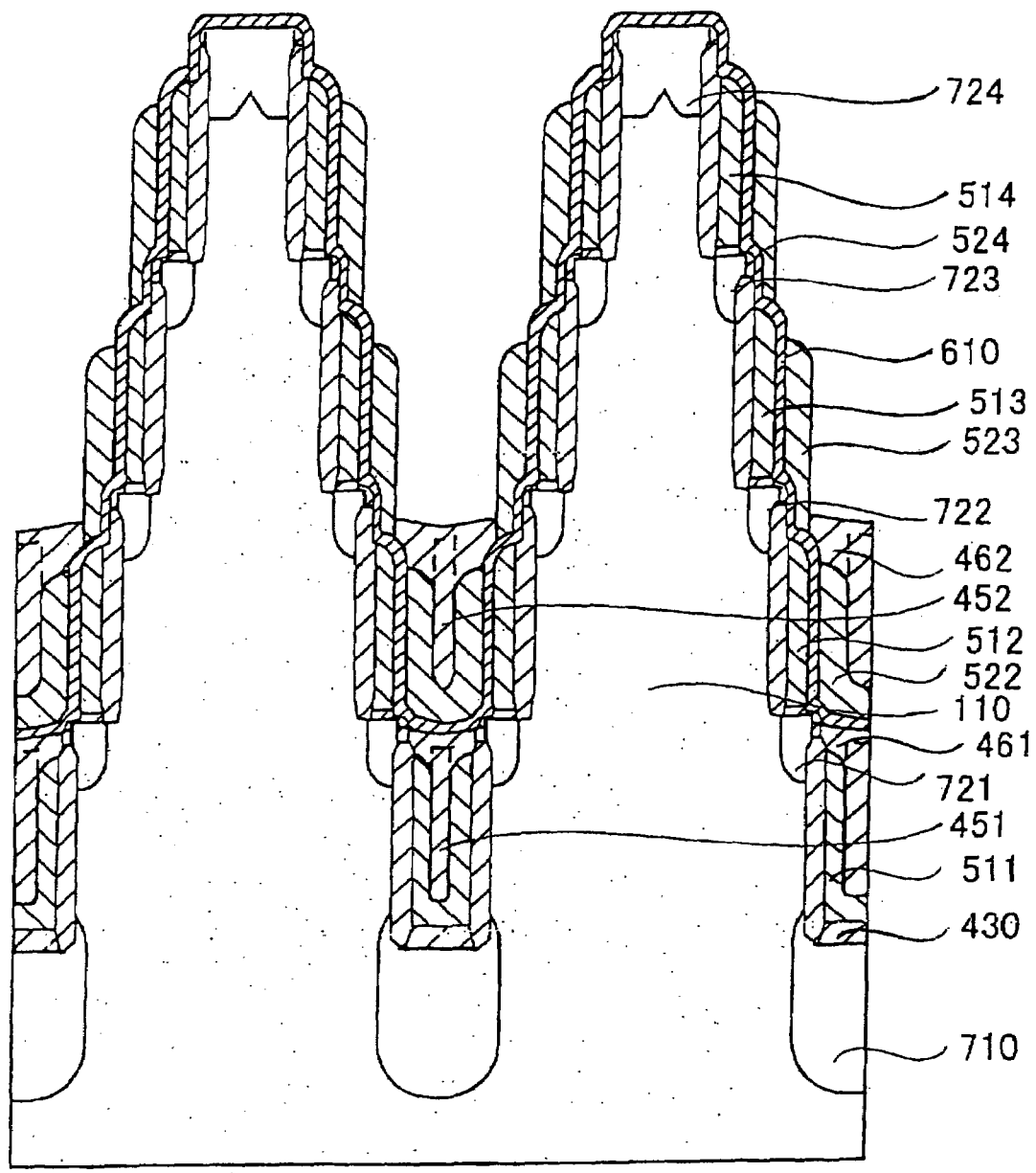
Figure 183:
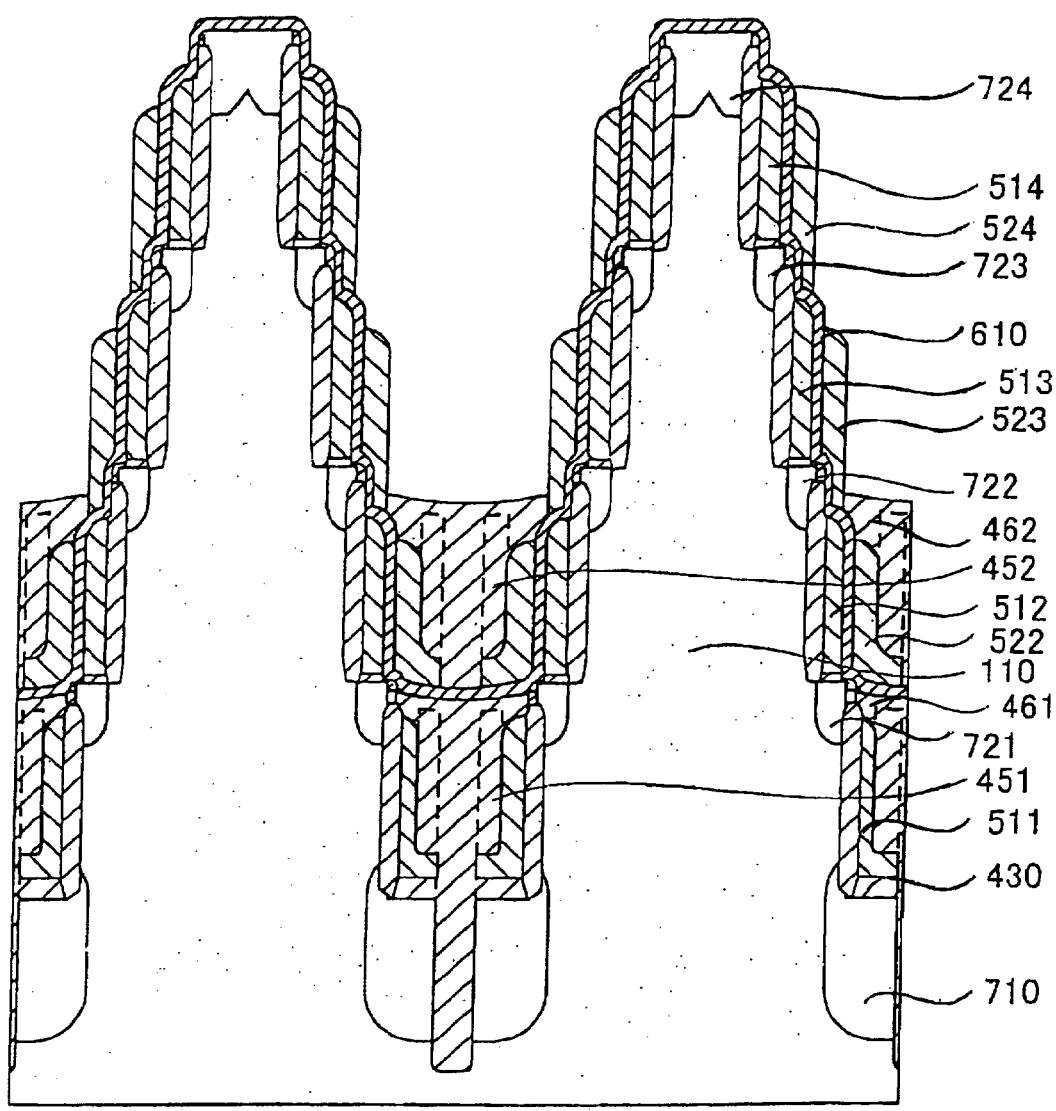

Next, a silicon oxide film 462 is deposited to about 20 to 200 nm as a seventh insulating film and is isotropically etched so as to bury the first trench 212 and the top of the polysilicon film 522 (FIGS. 182 and 183).

Figure 184:
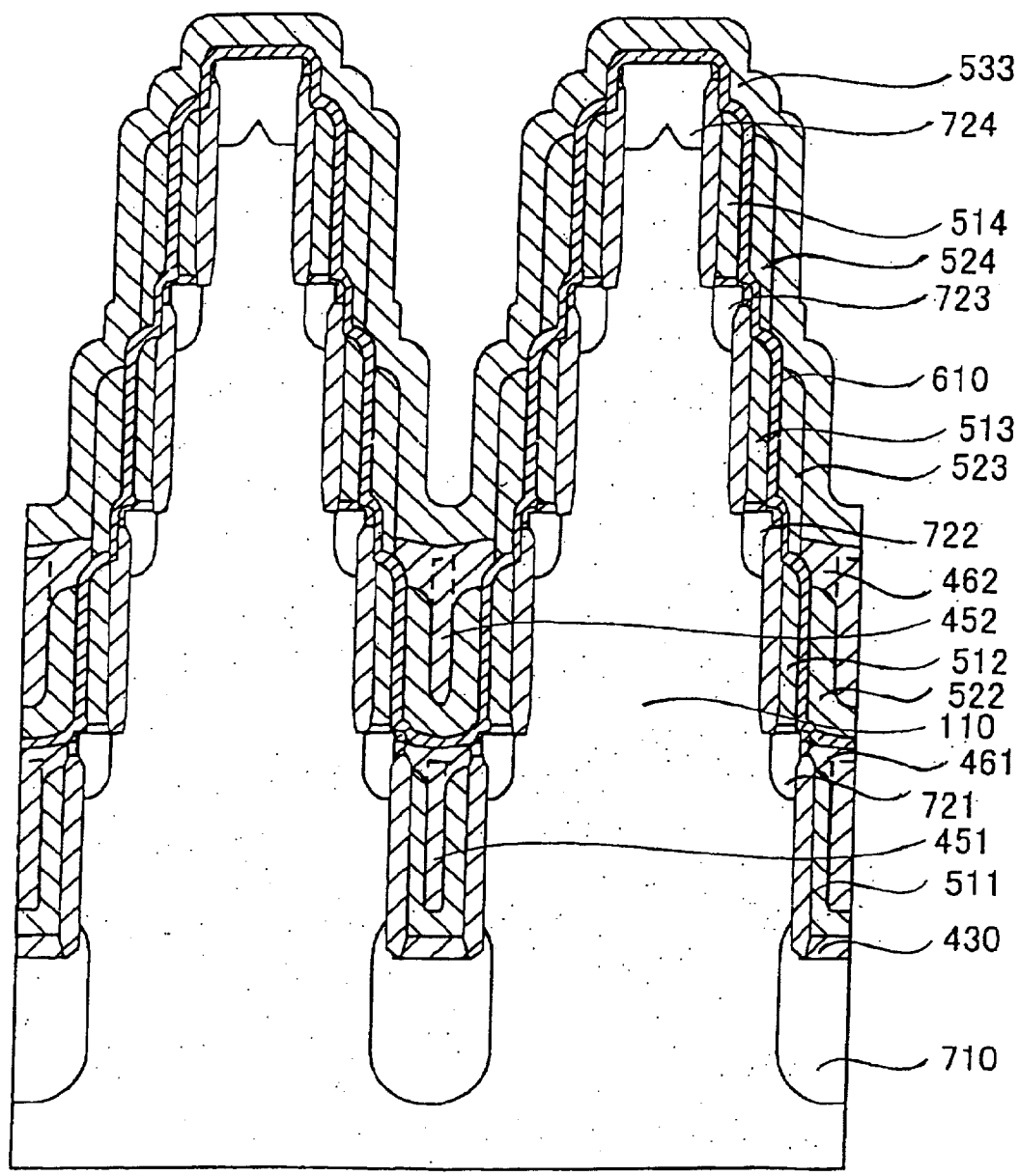
Figure 185:
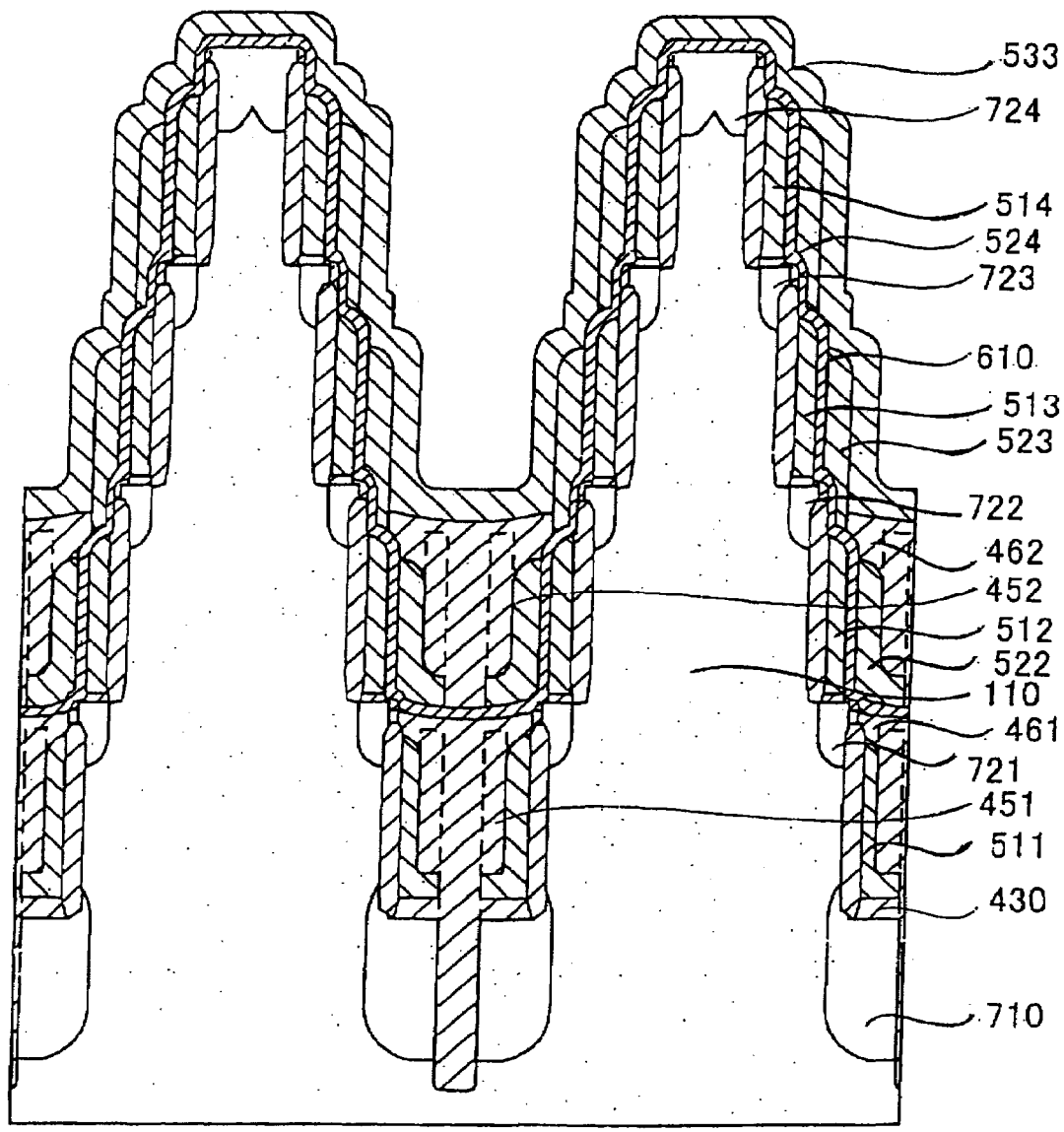

Subsequently, a polysilicon film 533 is deposited to 15 to 150 nm as a third conductive film (FIGS. 184 and 185).

Figure 186:
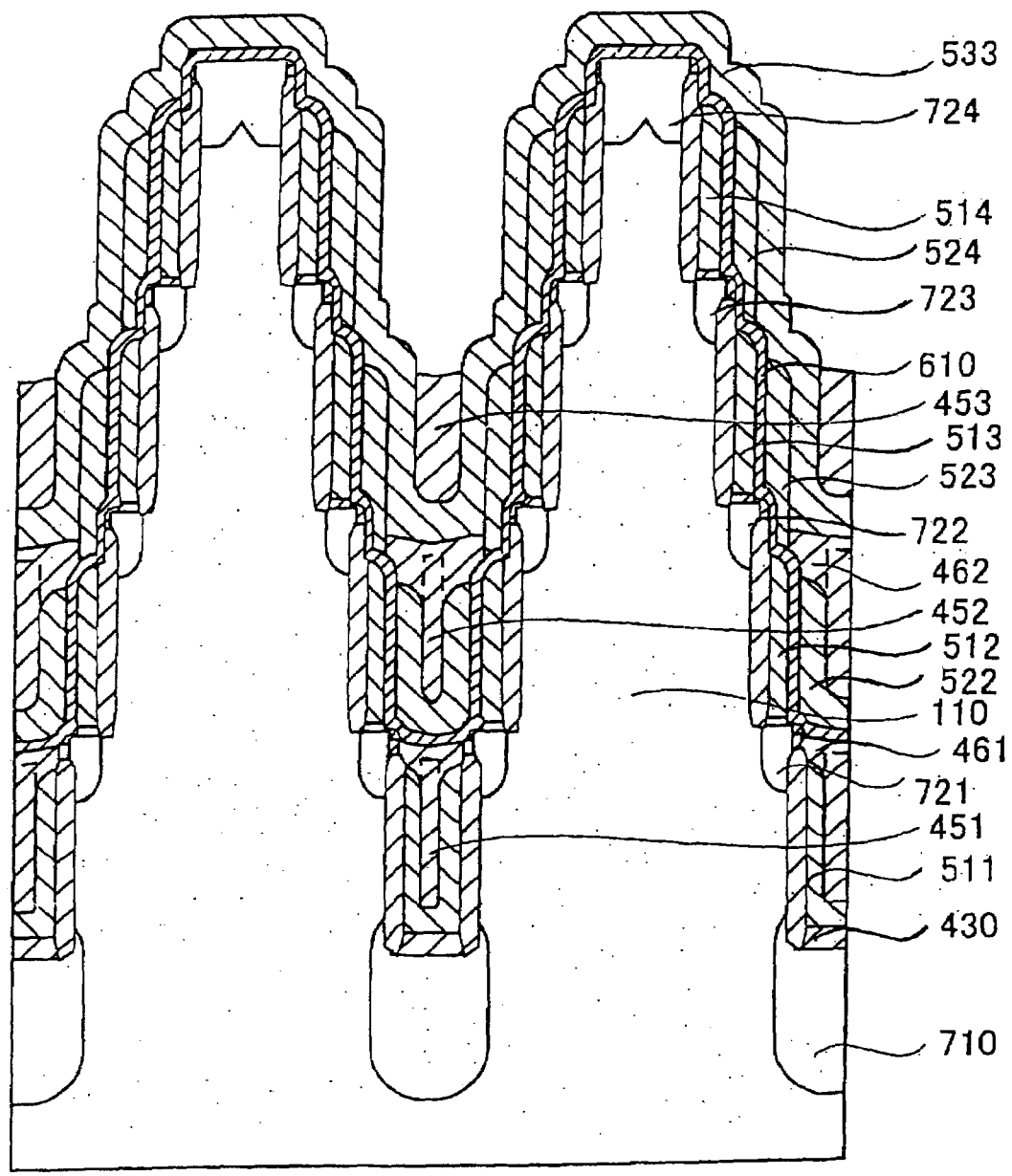
Figure 187:
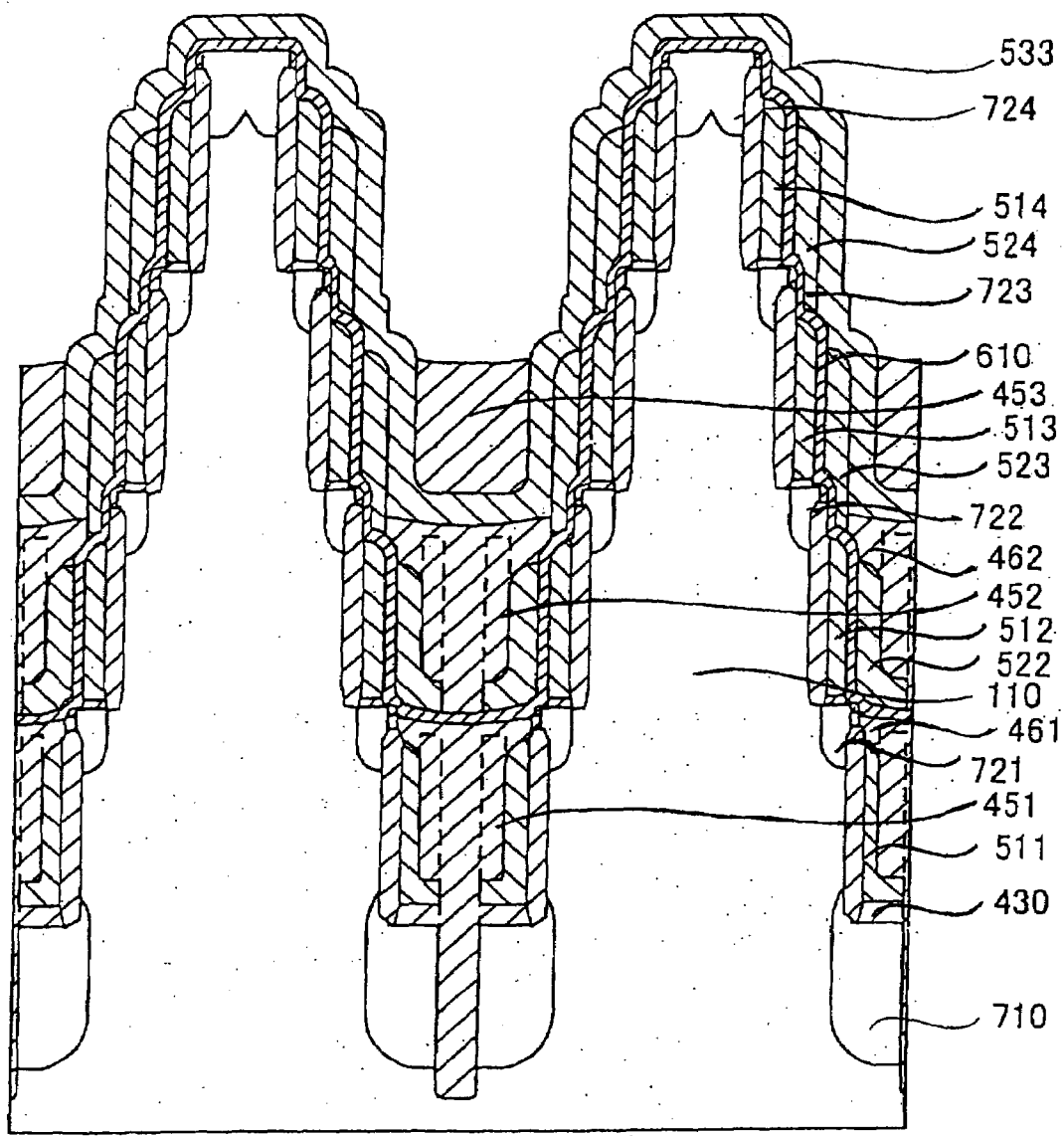

After that, a silicon oxide film 453 is deposited to about 20 to 200 nm as a sixth insulating film and is etched back to a desired depth (FIGS. 186 and 187).

Figure 188:
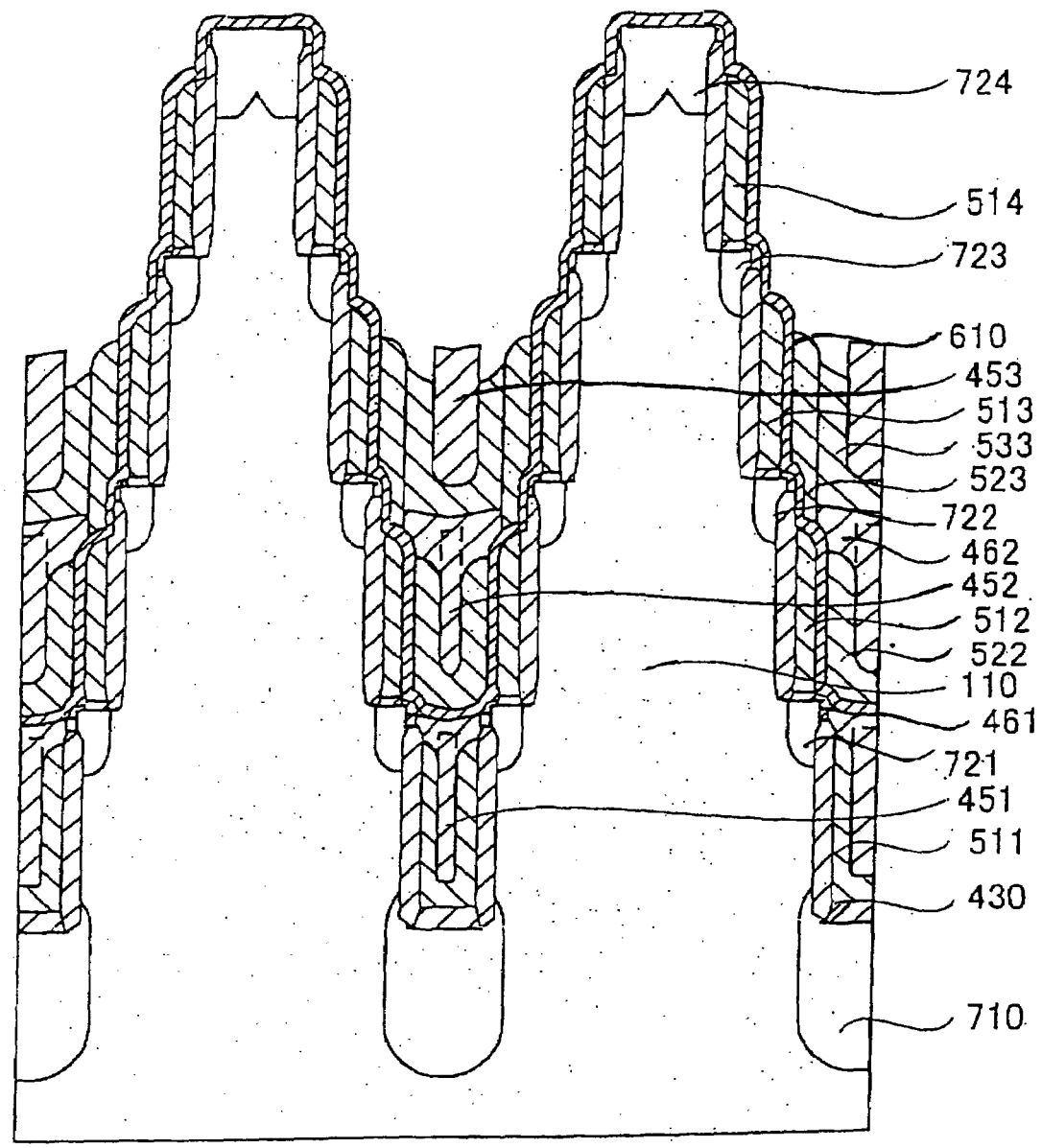
Figure 189:
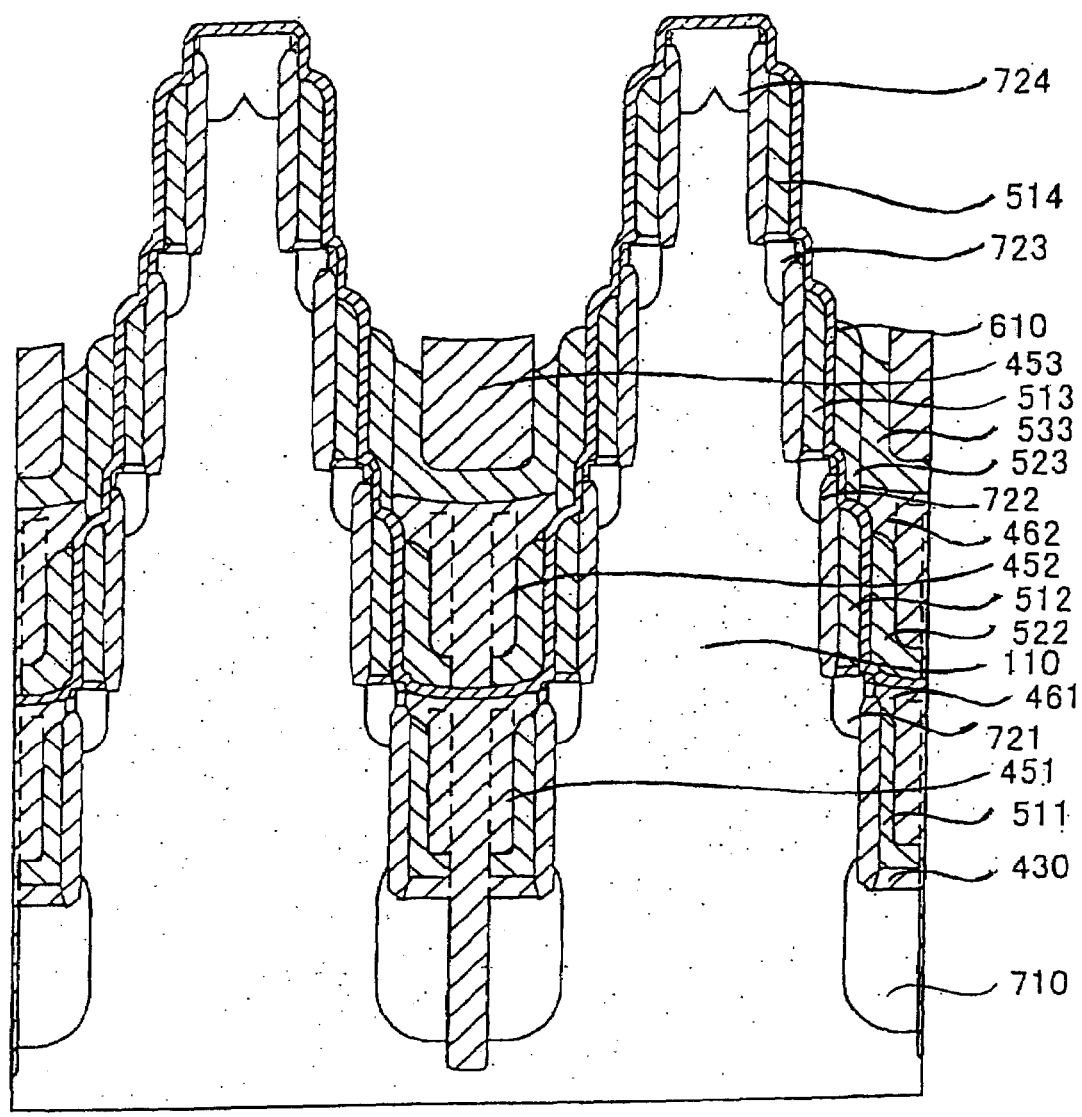

An exposed part of the polysilicon film 533 and the polysilicon film 524 are selectively removed by isotropic etching using the silicon oxide film 453 as a mask (FIGS. 188 and 189). The control gates in the upper step, i.e., polysilicon films 523 are connected by the polysilicon film 533 and are all kept connected by protection of the silicon oxide film 453 also after isotopic etching.

Figure 190:
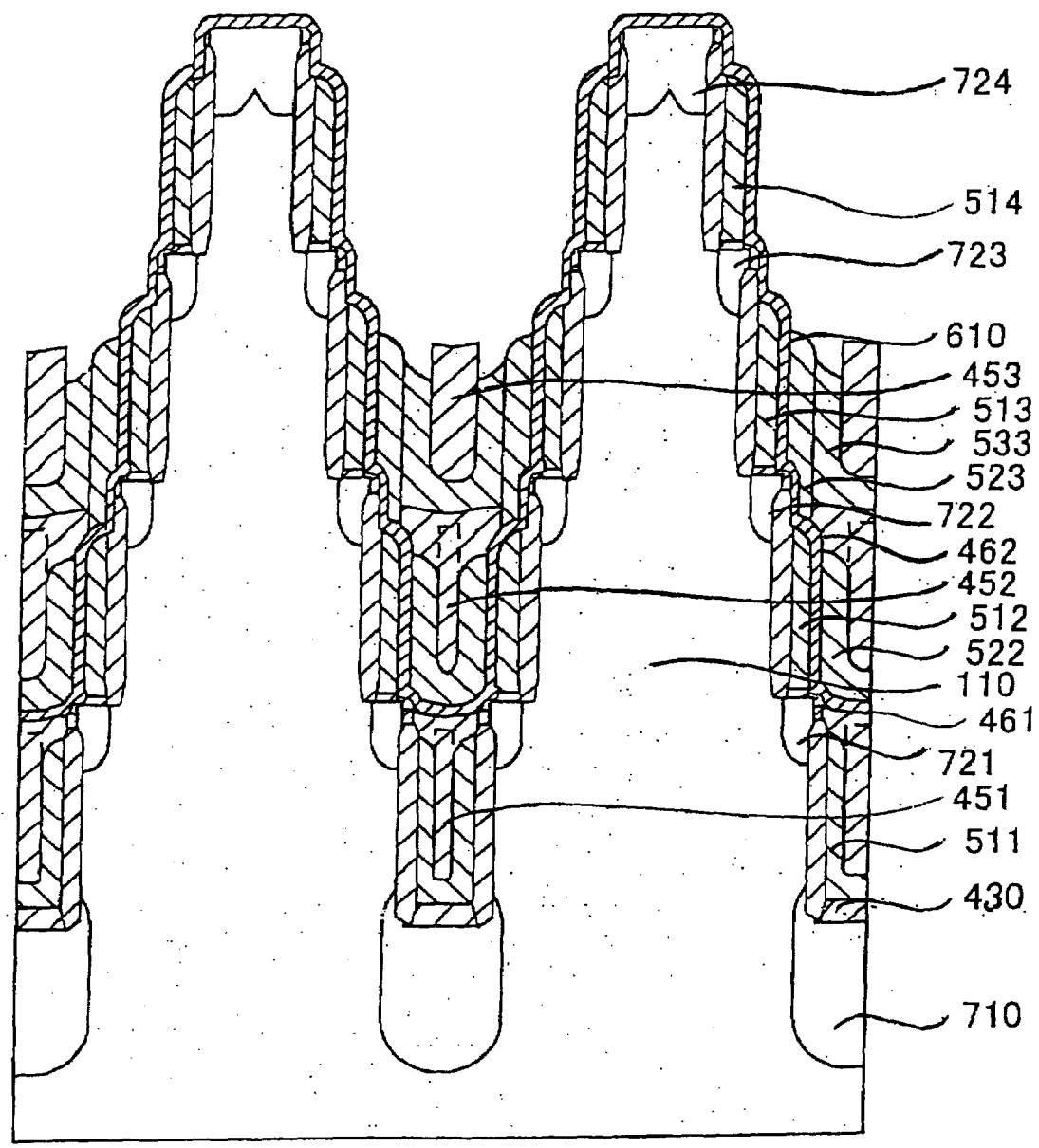
Figure 191:
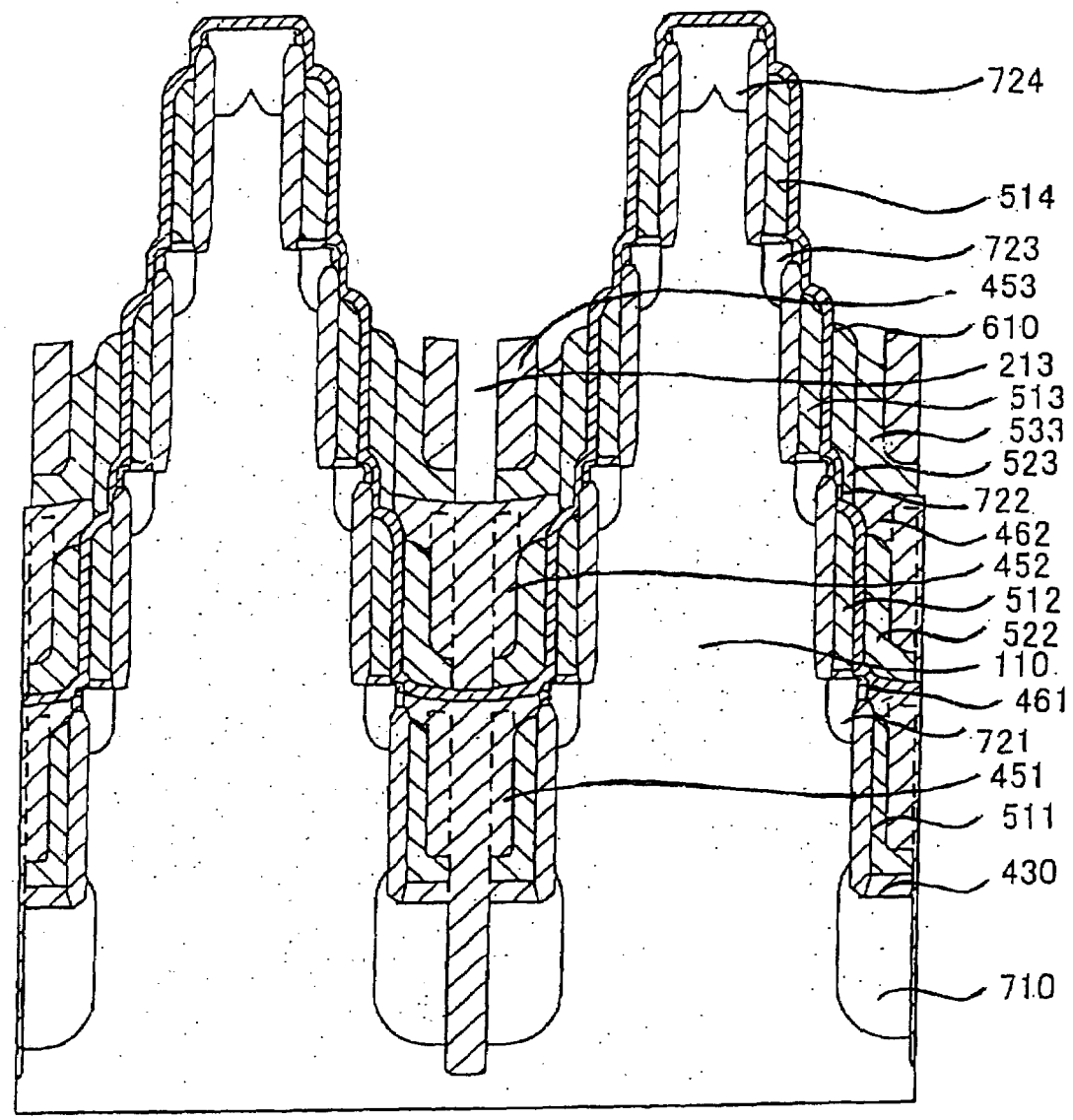

After that, using as a mask a resist film R4 patterned by a known photolithography technique, by reactive ion etching, the silicon oxide film 453 is etched and the polysilicon film 533 is etched to form a first trench 213 (FIGS. 190 and 191). Thereby a third wiring layer to be a control gate line continuous in the A–A' direction in FIG. 1 is formed by separation.

Figure 192:
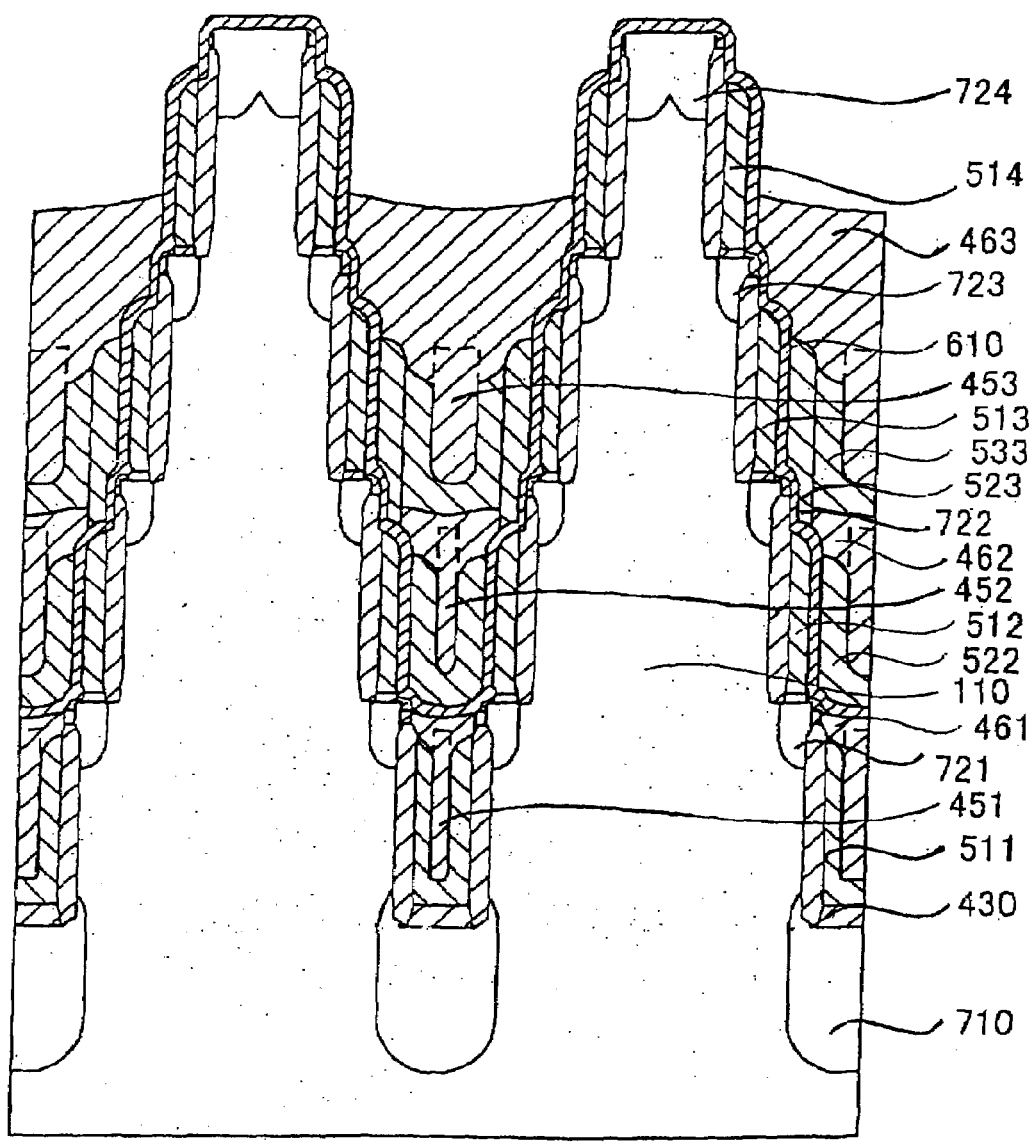
Figure 193:
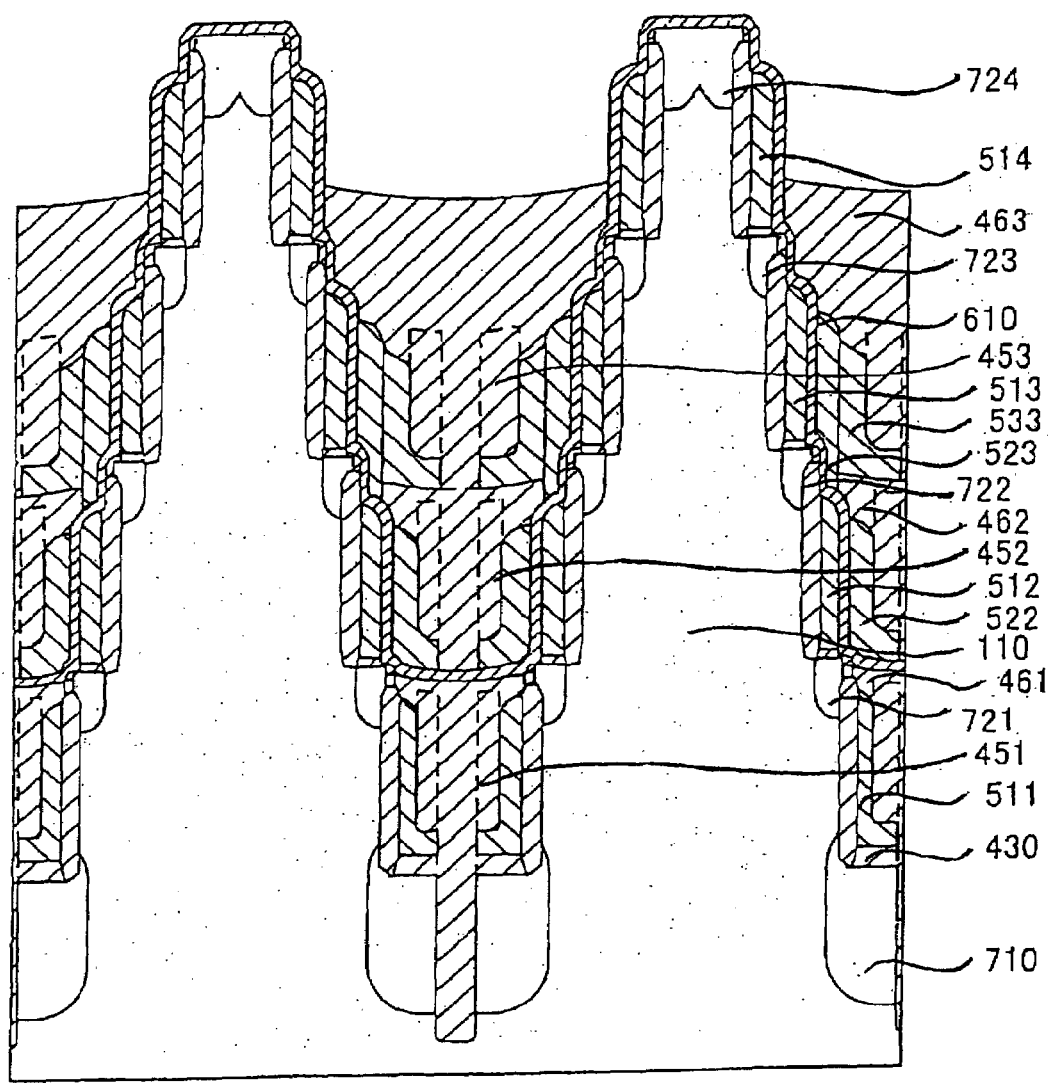

Next, a silicon oxide film 463 is deposited to about 20 to 400 nm as a seventh insulating film and is isotropically etched so as to bury the first trench 213, the polysilicon film 523 and the top of the polysilicon film 533 (FIGS. 192 and 193).

Figure 194:
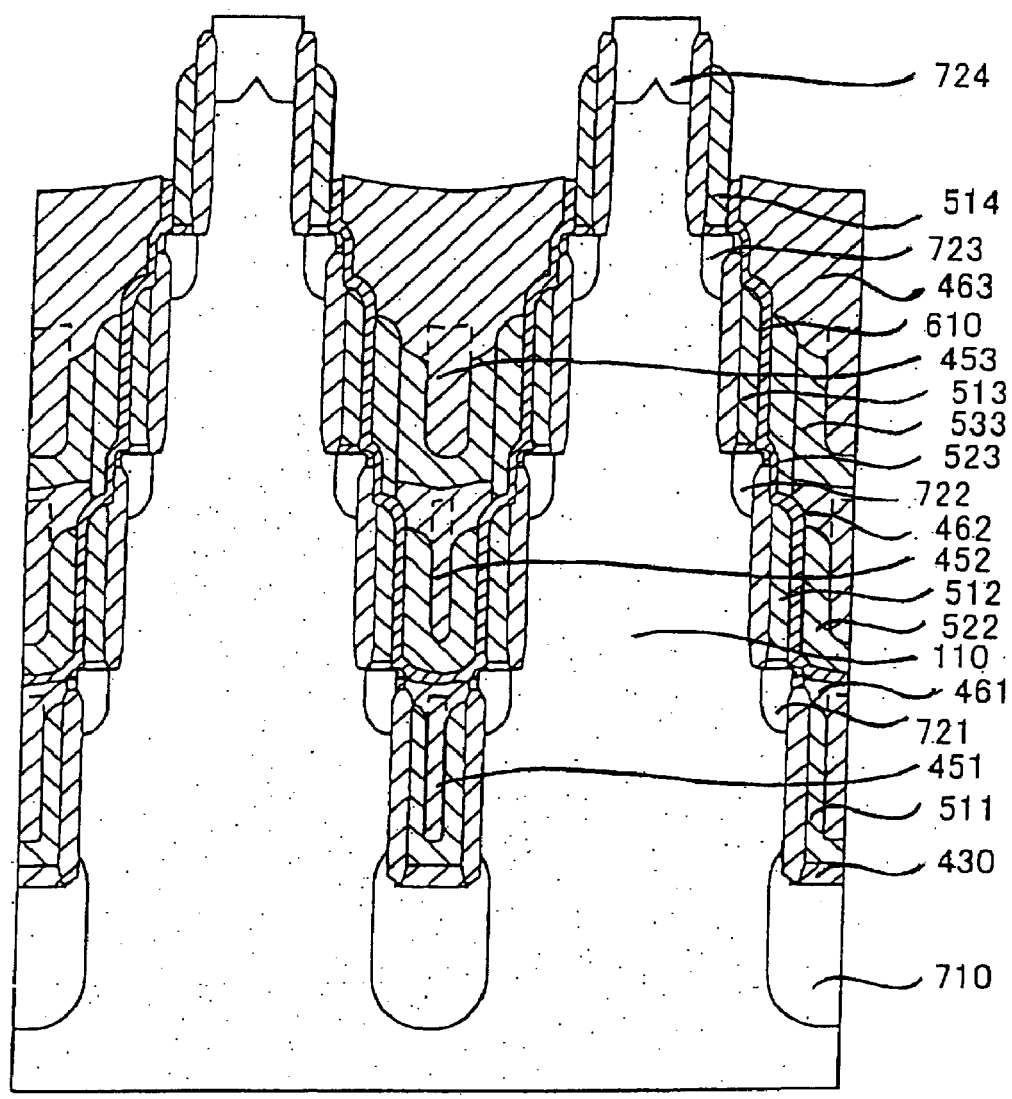
Figure 195:
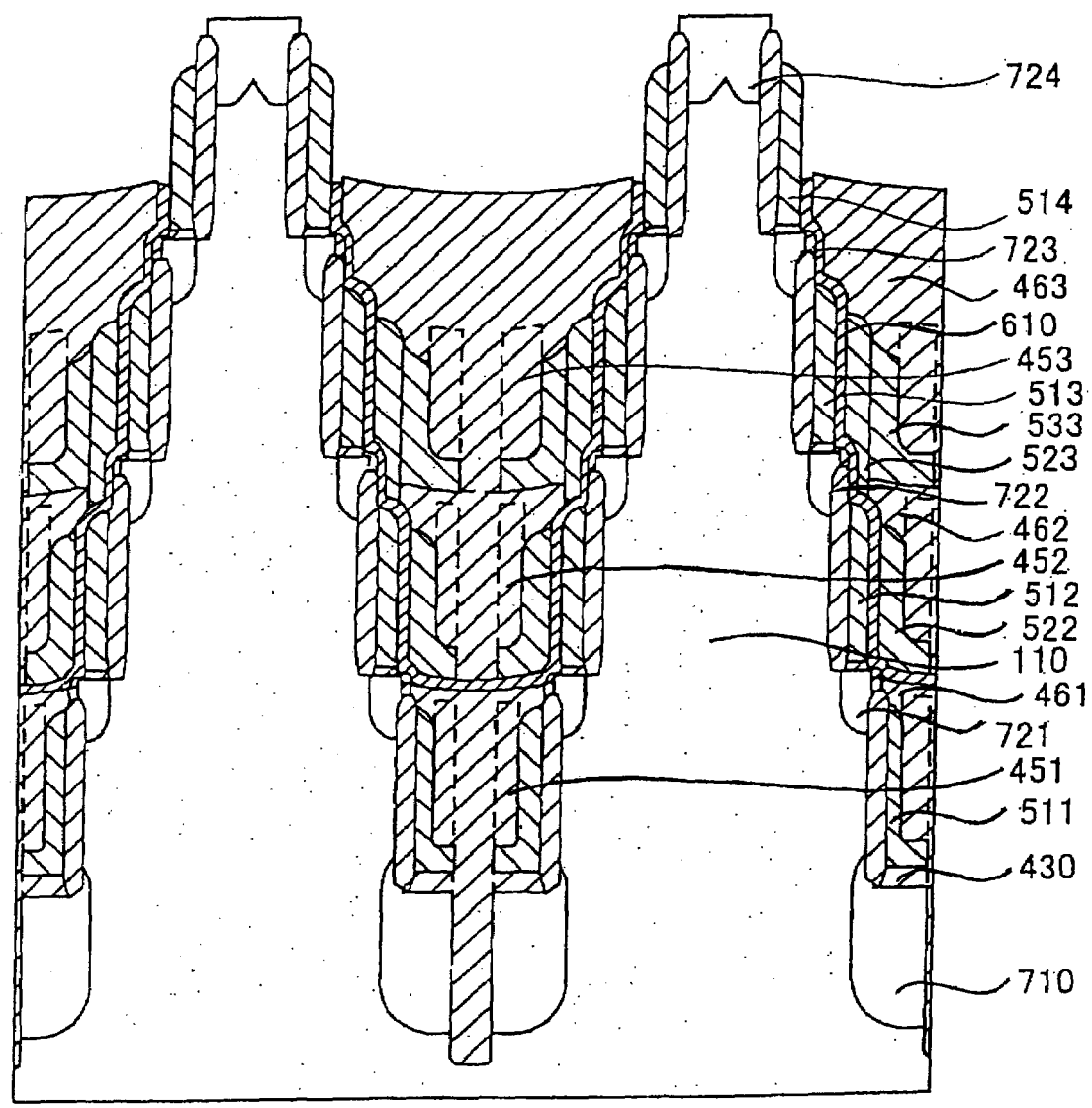

After that, using the silicon oxide film 463 as a mask, the interlayer insulating film 610 exposed is removed to expose at least a part of the selection gate, i.e., the polysilicon layer 514 which is formed on the vertex portion of the island-like semiconductor layer 110 and the uppermost step of the island-like semiconductor layer 110 (FIGS. 194 and 195).

Figure 196:
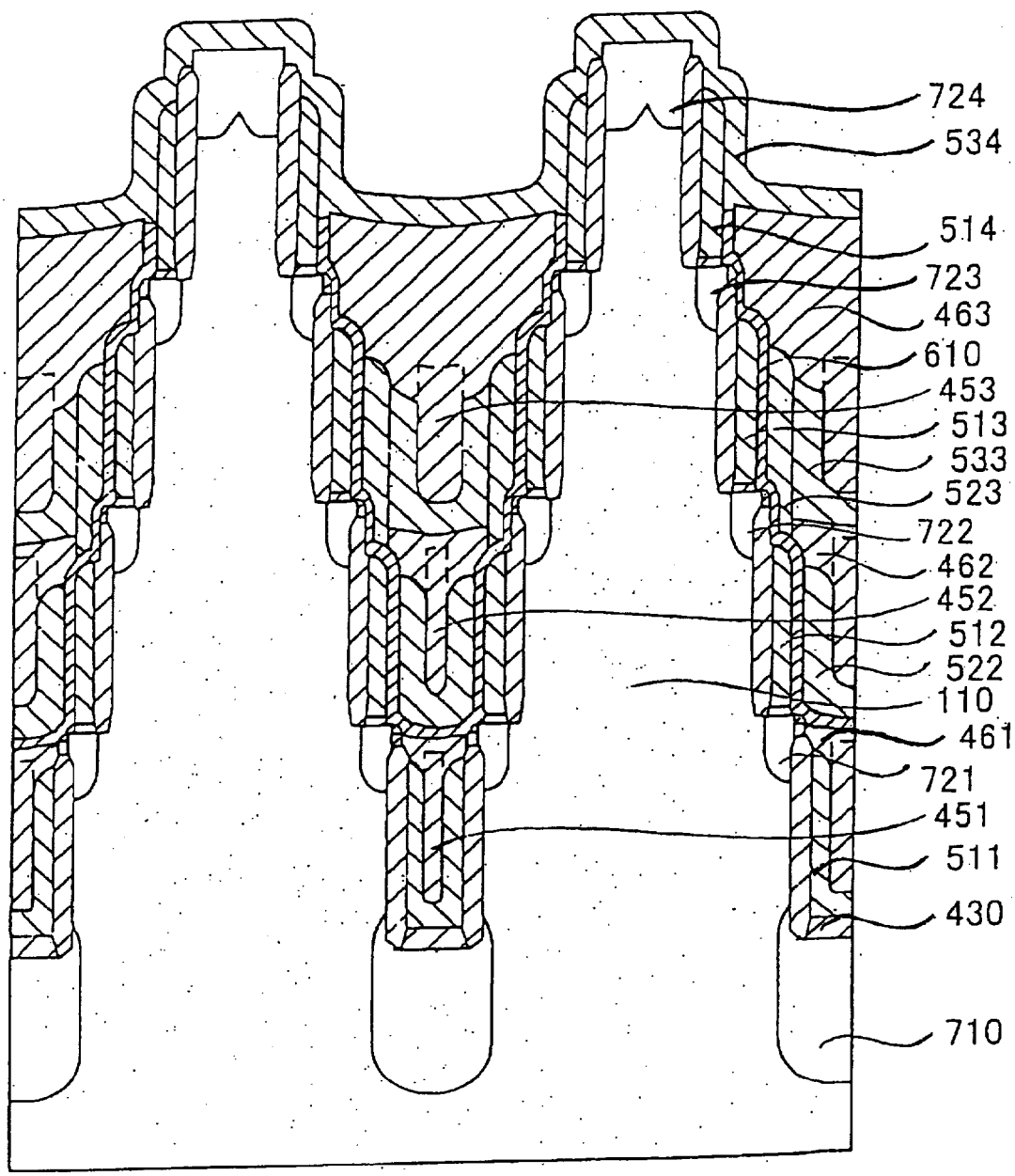
Figure 197:
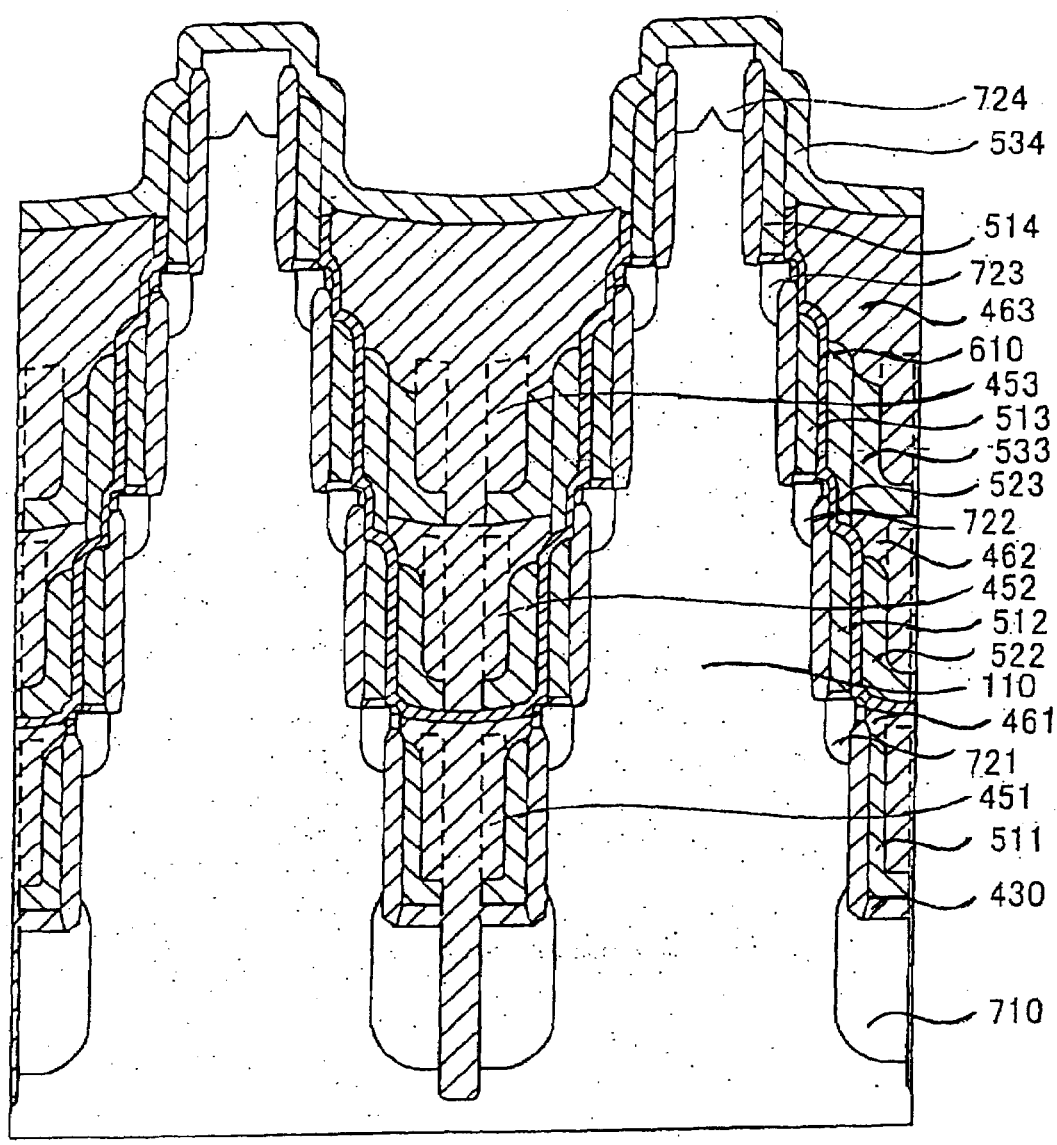

Subsequently, a polysilicon film 534 is deposited to 15 to 150 nm as a third conductive film (FIGS. 196 and 197).

Figure 198:
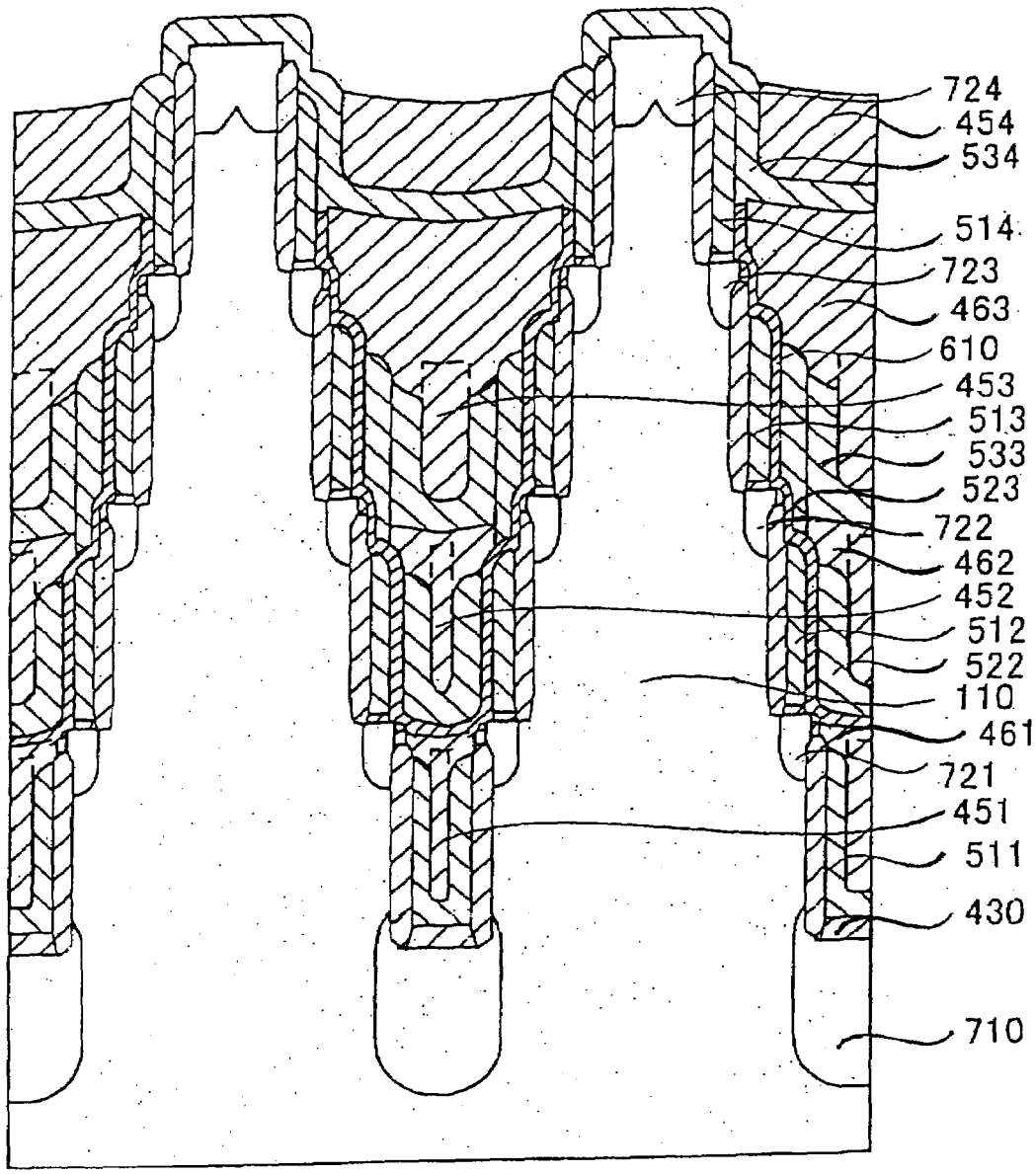
Figure 199:
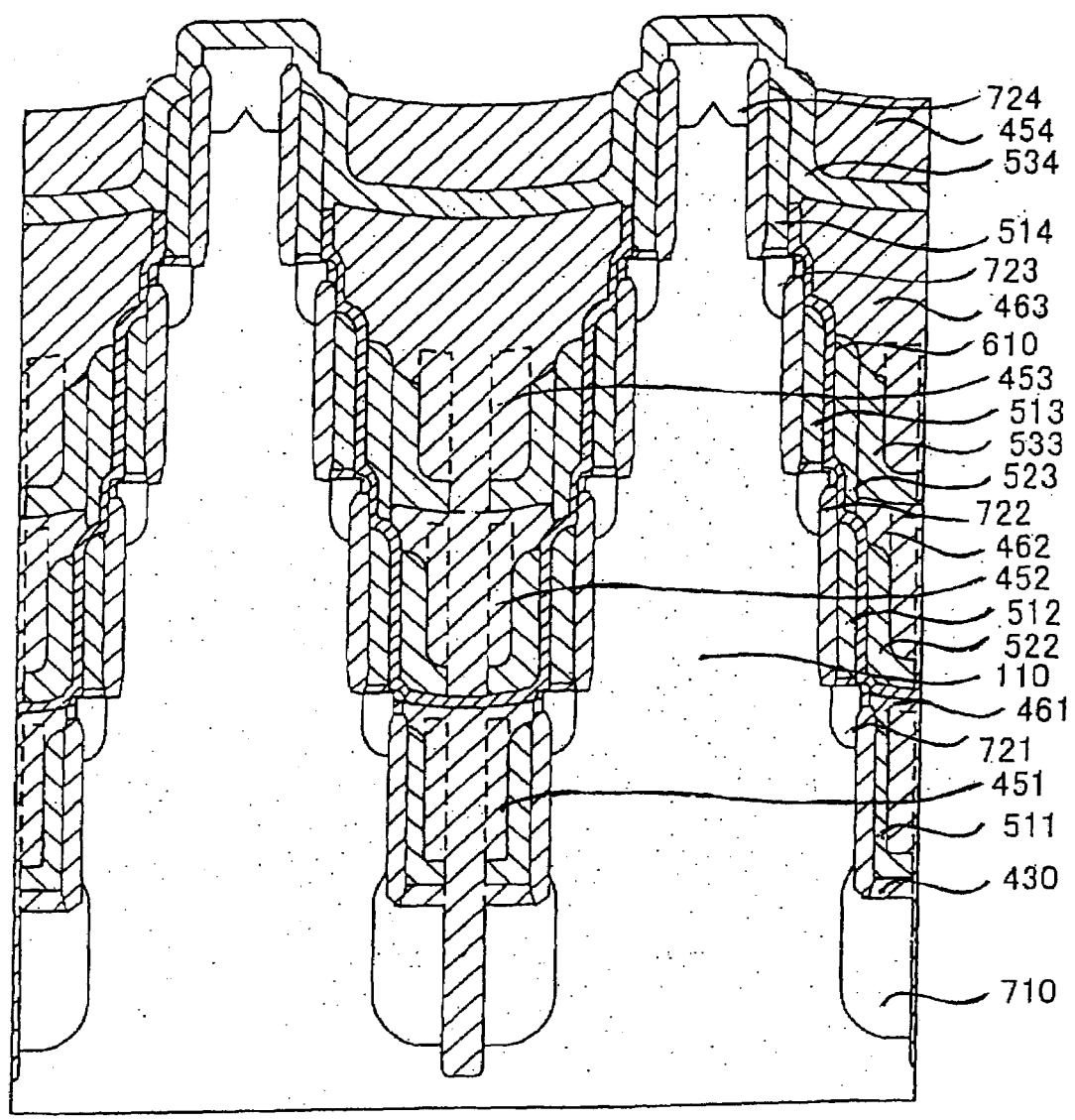

After that, a silicon oxide film 454 is deposited to about 20 to 200 nm as a sixth insulating film and etched back to a desired depth (FIGS. 198 and 199). The selection gates, i.e., the polysilicon film 514 in the uppermost-steps are all kept connected by the polysilicon film 534.

Figure 200:
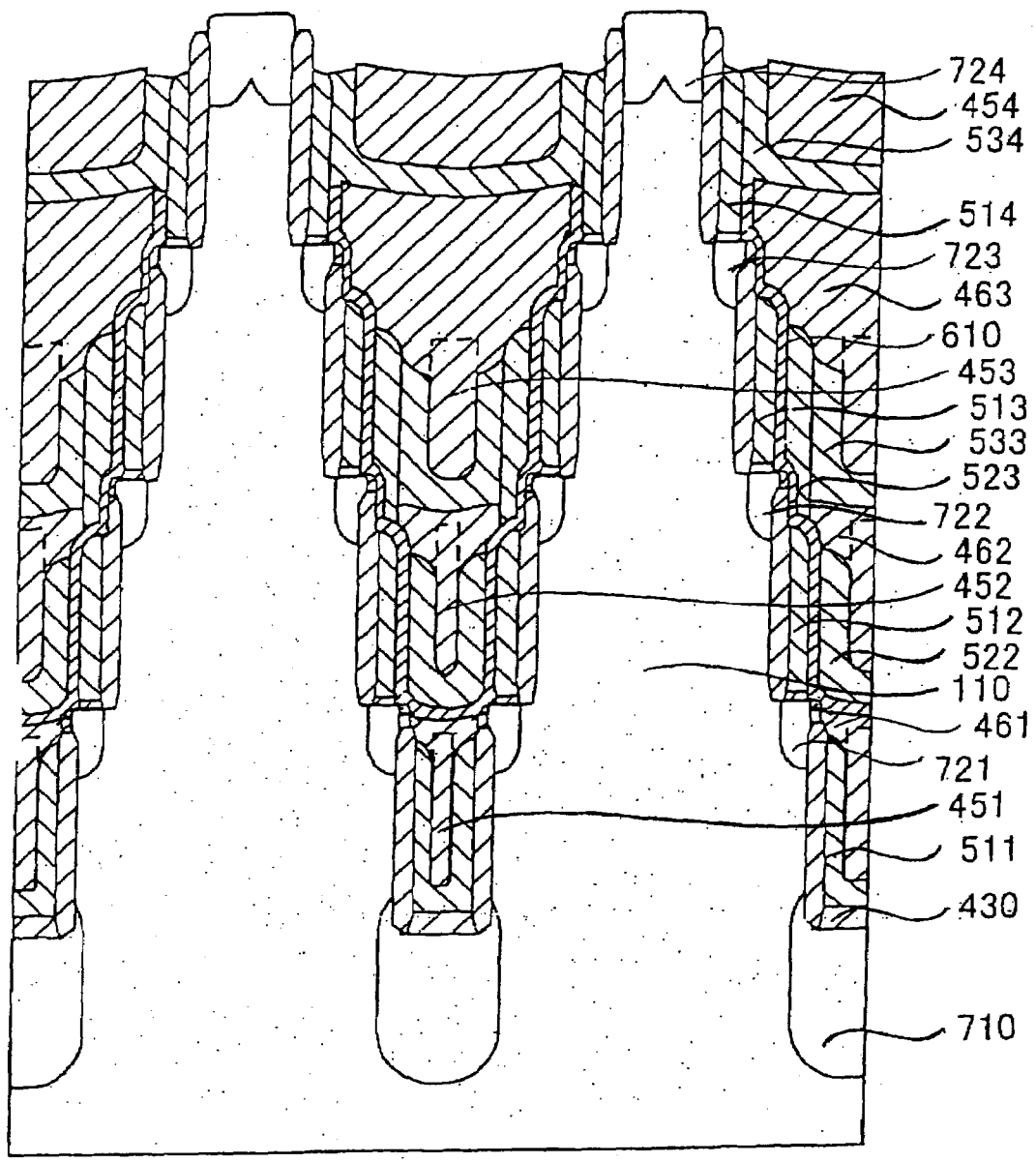
Figure 201:
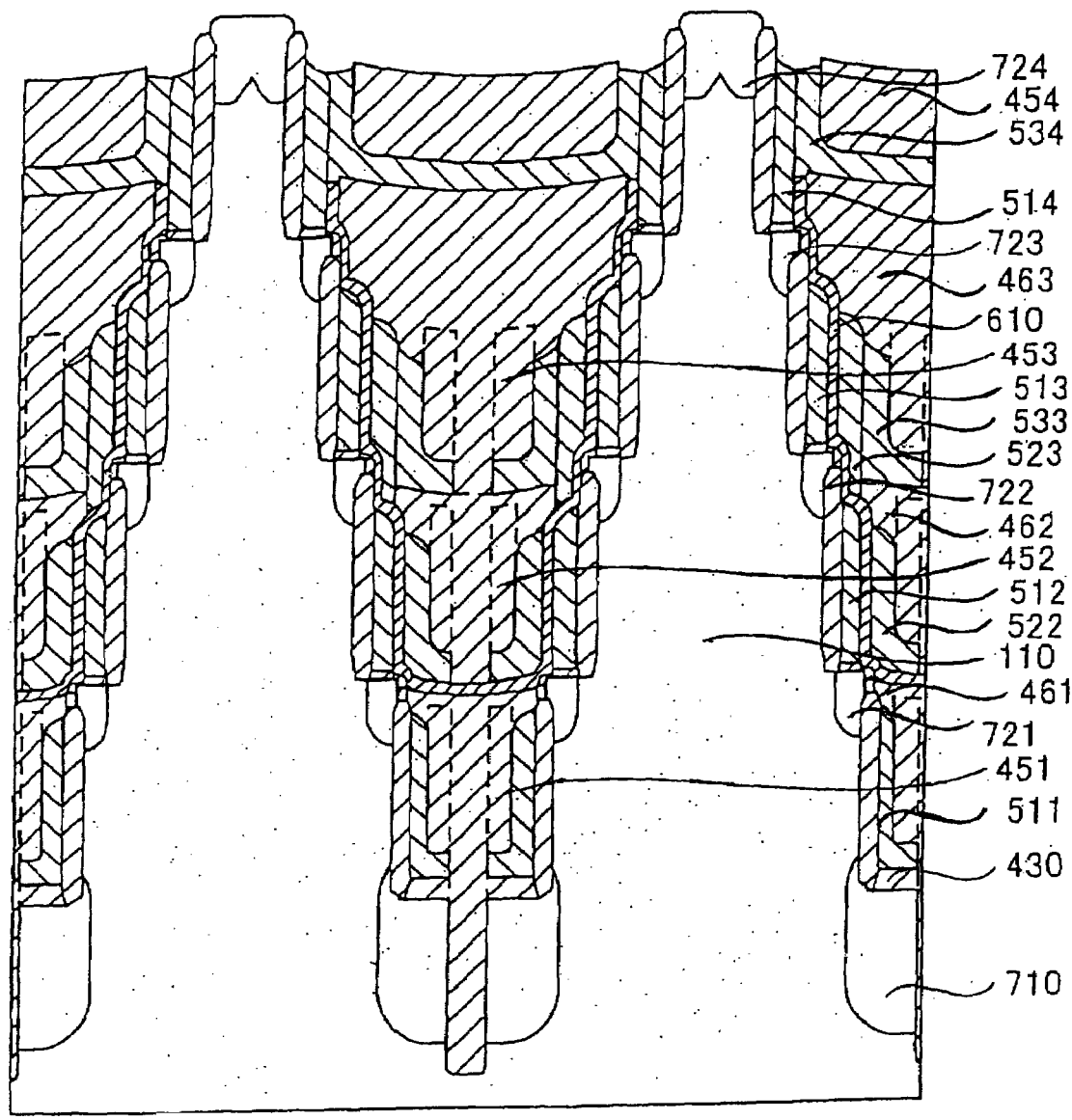

Subsequently, using the silicon oxide film 454 as a mask, the polysilicon film 534 exposed is selectively removed by isotropic etching (FIGS. 200 and 201). At this time, the selection gate, i.e., the polysilicon film 514 formed on the top of the island-like semiconductor layer 110 and in the uppermost step of the island-like semiconductor layer 110 is partially etched. However, it is sufficient that the level of the etched top of the island-like semiconductor layer 110 is higher than that of the uppermost end of the polysilicon film 534 after etching.

Using as a mask a resist R5 patterned by a known photolithography technique, by reactive ion etching, the silicon oxide film 454 is etched and the polysilicon film 534 is etched to form a first trench 214. Thereby a second wiring layer to be a selection gate line continuous in the A–A' direction in FIG. 1 is formed by separation.

Next, a silicon oxide film 464 is deposited to about 20 to 400 nm as a seventh insulating film. The top of the island-like semiconductor layer 110 provided with the impurity diffusion layer 724 is exposed by etch-back or by a known chemical mechanical polishing (CMP) technique. The impurity concentration in the top of the island-like semiconductor layer 110 is adjusted as required, for example, by ion implantation, and a fourth wiring layer 840 is connected to the top of the island-like semiconductor layer 110 in a direction crossing the second or third wiring layers.

Thereafter, an interlayer insulating film is formed by a known technique, and a contact hole and a metal wiring are formed.

Figure 202:
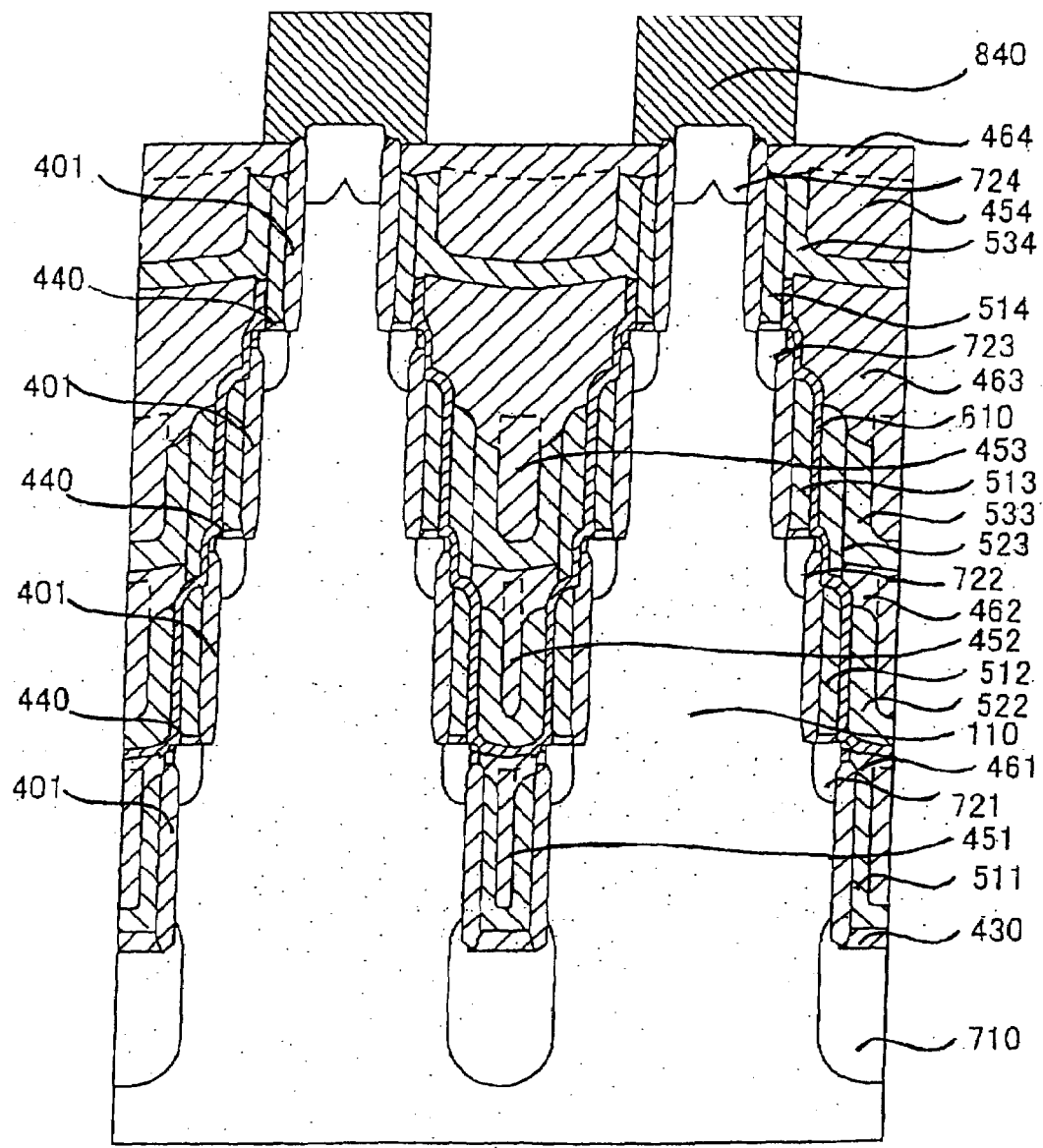

In such a manner, a semiconductor memory device is realized which has a memory function according to the state of a charge in the charge storage layer as the floating gate made of the polysilicon film (FIGS. 202 and 203). By disposing the selection gates above and below a plurality of memory cells, an over-erase state of the memory transistor can be prevented.

In this production example, the island-like semiconductor layer 110 is formed on the p-type semiconductor substrate, but the island-like semiconductor layer 110 may be formed in a p-type impurity diffusion layer formed in an n-type semiconductor substrate or in a p-type impurity diffusion layer formed in an n-type impurity diffusion layer formed in a p-type silicon substrate. The conductivity types of the impurity diffusion layers may be reversed.

To process the island-like semiconductor layer 110 in a stepwise form, the silicon nitride films 311, 312 and 313 are processed in the form of sidewall spacers, and the sidewall spacers are used as a mask. Alternatively, for example, only the tip of the island-like semiconductor layer 110 may be exposed by burying an insulating film or a conductive film and the exposed part may be thermally oxidized or isotropically etched to thereby thin the tip of the island-like semiconductor layer 110. This process may be repeated to process the island-like semiconductor layer 110 into a step shape.

A desired trench may be buried directly by, for example, depositing a silicon oxide film, a polysilicon film or a laminate film of a silicon oxide film and a silicon nitride film and then isotropically etching the top surface of the semiconductor substrate. Alternatively, the trench may be indirectly buried by a resist etch-back method. The silicon oxide film used for burying may be formed not only by CVD but also rotation application of the silicon oxide film.

The control on the height of the buried film by resist etch-back may be executed by using exposure time and/or the exposure amount. The height may be controlled by any method including a development process after exposure. Instead of exposure, the resist etch-back may be performed by ashing, or without performing etch-back, the resist may be buried to have a desired height when applied. In the latter technique, the resist preferably has a low viscosity. These techniques may be combined. The surface to which the resist is applied is preferably hydrophilic. For example, the resist is desirably applied to a silicon oxide film.

PRODUCTION EXAMPLE 2

FIGS. 204 to 209 show a production process of a semiconductor memory device of a production example 2. In FIGS. 204 to 209, even-numbered drawings are sectional views taken on line A–A' of FIG. 1 and odd-numbered drawings are sectional views taken on line B–B' of FIG. 1.

Up to the formation of the silicon nitride film sidewall spacers 361, 362, 363, and 364 on the sidewalls of the island-like semiconductor layer 110 with intervention of the silicon oxide film 400 as the fifteenth insulating film, the processes conform to those in the production example 1.

Figure 204:
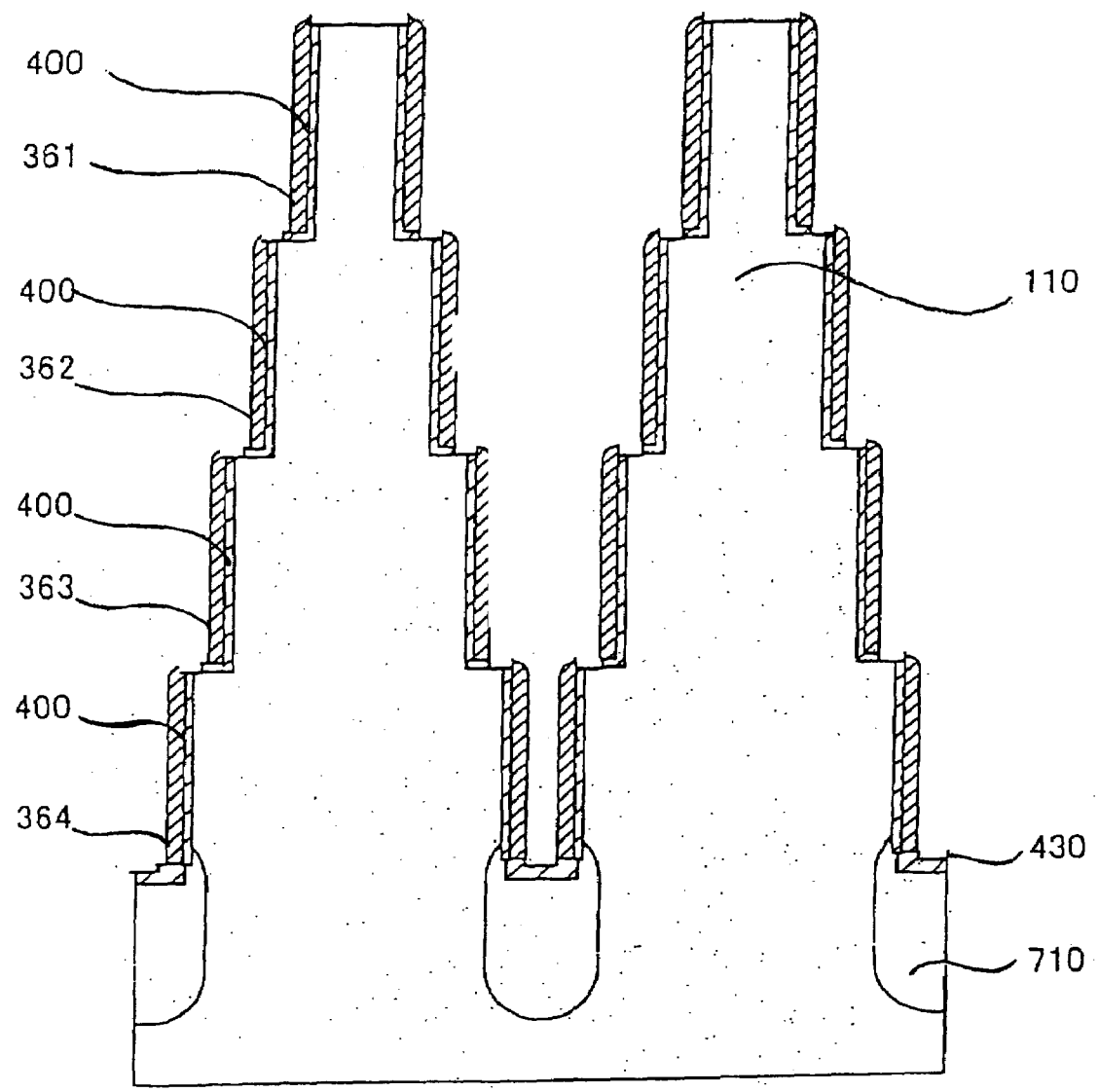
FIGS. 204, 206 and 208 are sectional views showing a production process of a semiconductor memory device of the embodiment 2 (sectional views of A–A' line of FIG. 1).
Figure 205:
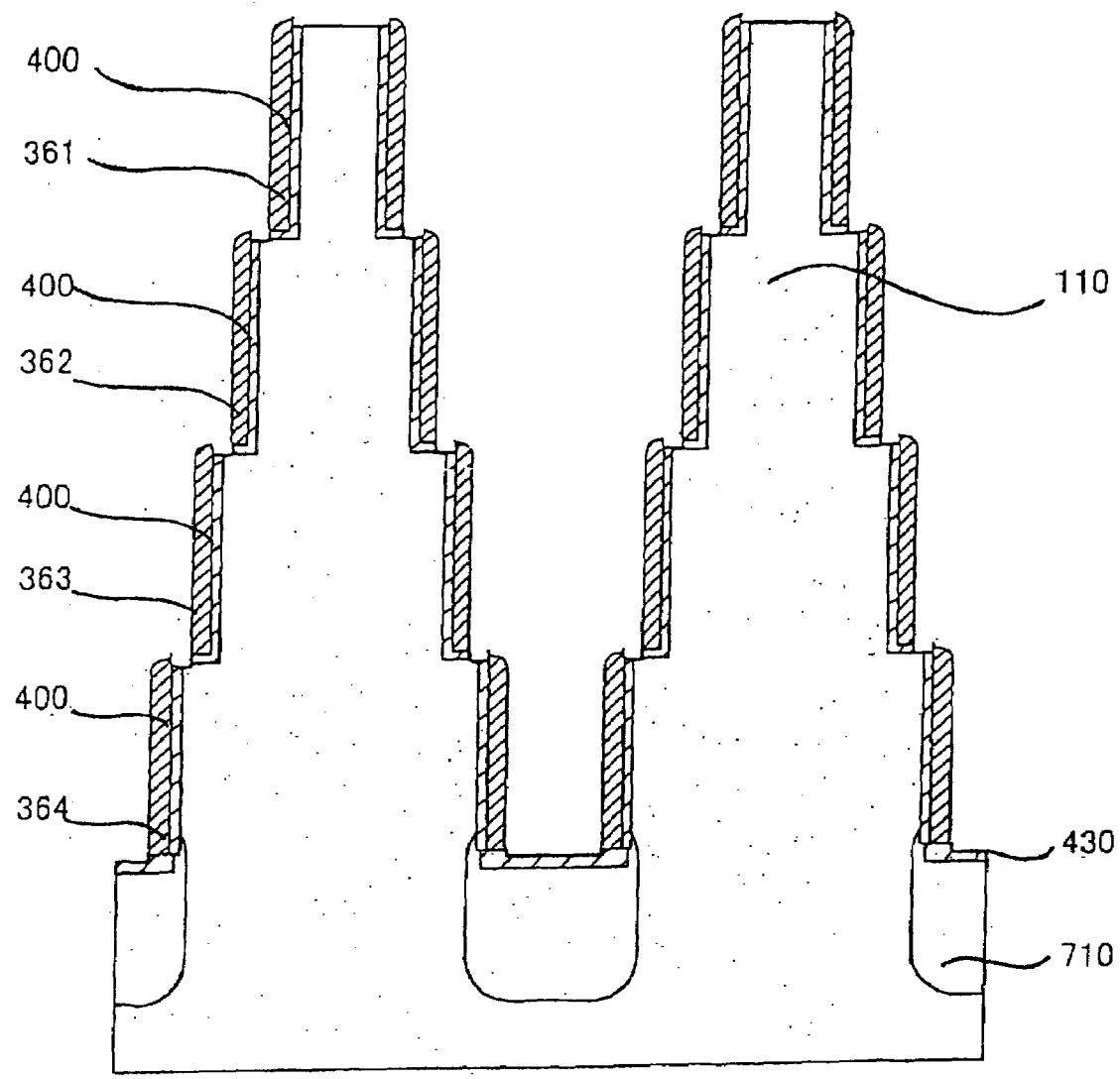
FIGS. 205, 207 and 209 are sectional views showing a production process of a semiconductor memory device of the embodiment 2 (sectional views of B–B' line of FIG. 1).

Using the silicon nitride film sidewall spacers 361, 362, 363, and 364 as a mask, the silicon oxide film 400 is selectively removed in part of the horizontal face of each of the steps of the island-like semiconductor layer 110 by a diluted HF method (FIGS. 204 and 205).

Figure 206:
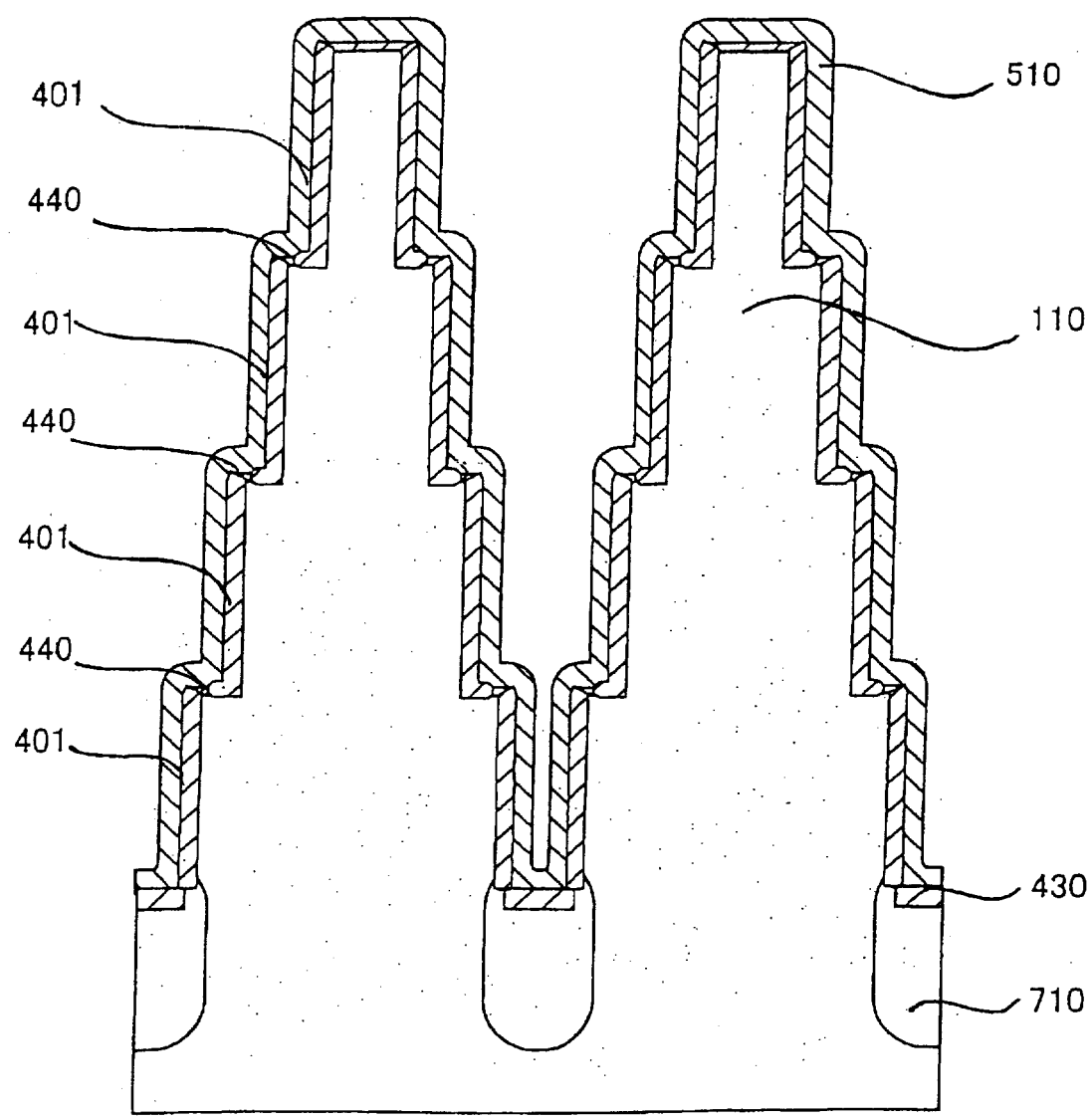
Figure 207:
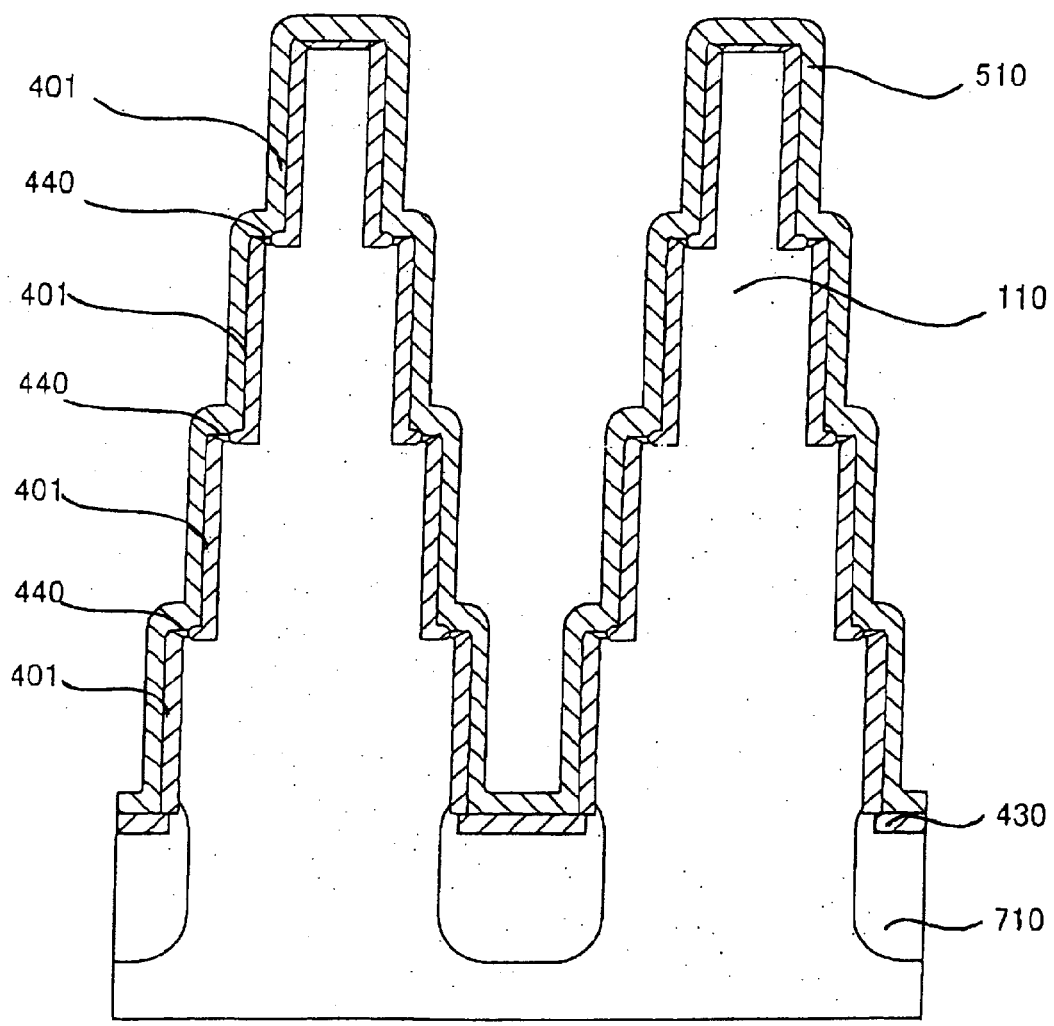

Subsequently, the silicon nitride film sidewall spacers 361, 362, 363, and 364 are selectively removed. A silicon oxide film 440 (tunnel oxide film) having a thickness of about 10 nm is formed as a fifth insulating film in the exposed parts of the island-like semiconductor layer 110 by using thermal oxidation and, simultaneously, the silicon oxide film 401 as the seventeenth insulating film whose thickness is increased to about 250 nm is formed (FIGS. 206 and 207).

Figure 208:
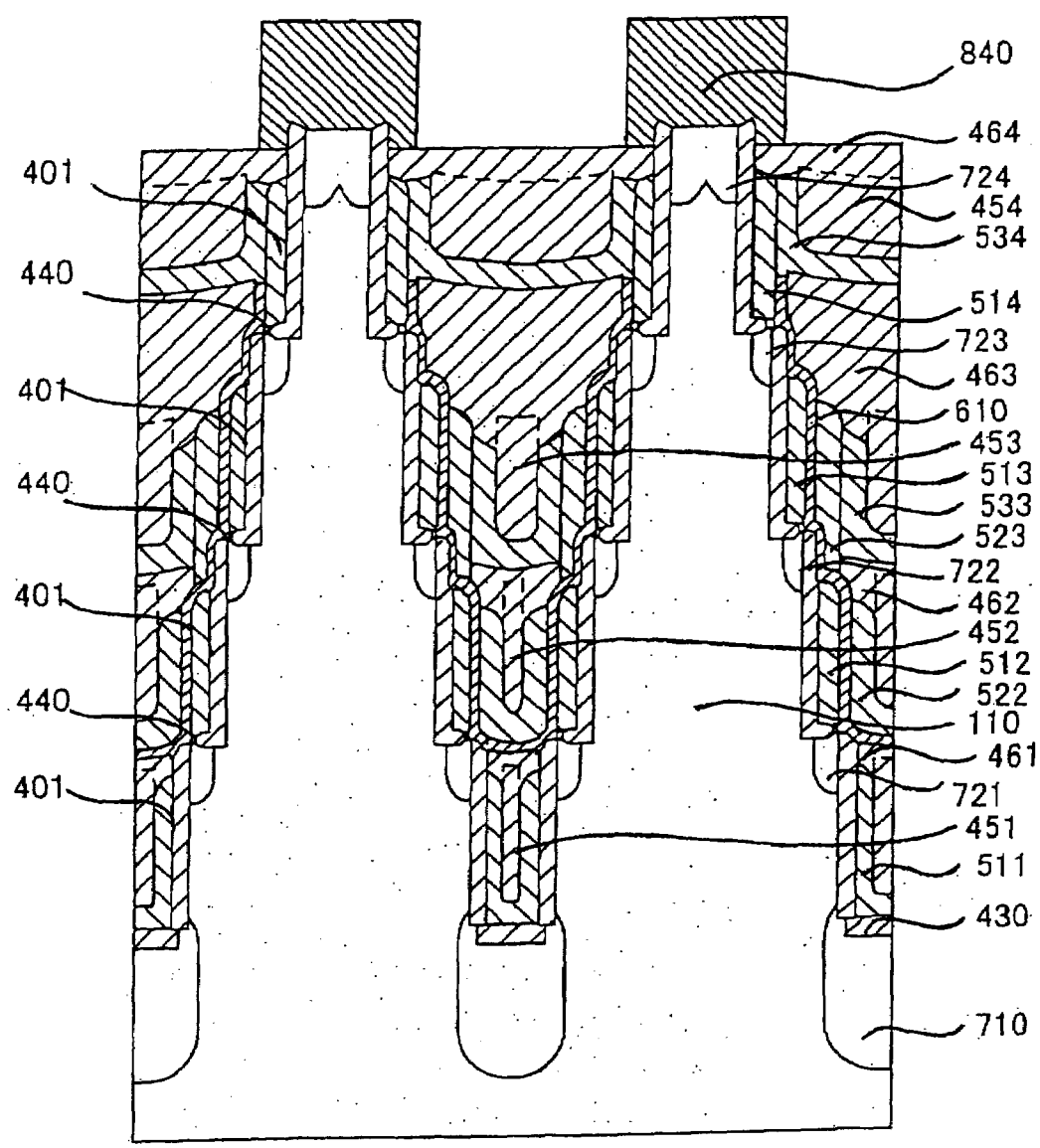
Figure 209:
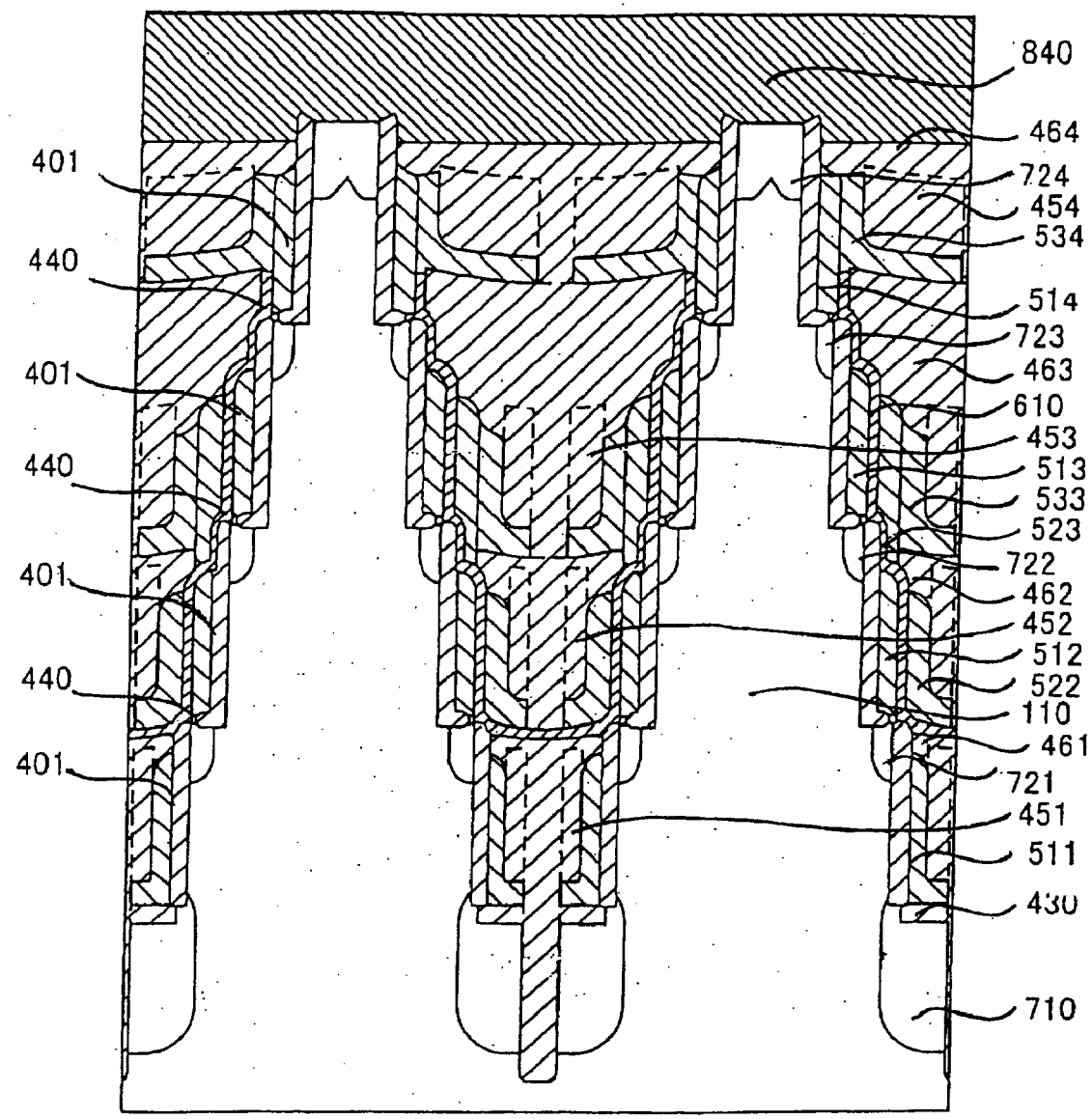

After that, in a manner similar to the production example 1, a semiconductor memory device having a smaller region of the tunnel oxide film than that in the production example 1 can be produced (FIGS. 208 and 209).

PRODUCTION EXAMPLE 3

FIGS. 210 to 215 show a production process of a semiconductor memory device of a production example 3. In FIGS. 210 to 215, even-numbered drawings are sectional views taken on line A–A' of FIG. 1 and odd-numbered drawings are sectional views taken on line B–B' of FIG. 1.

Up to the formation of the silicon nitride film sidewall spacers 361, 362, 363, and 364 on the sidewalls of the island-like semiconductor layer 110 with intervention of the silicon oxide film 400 as the fifteenth insulating film, the processes conform to those in the production example 1.

Figure 210:
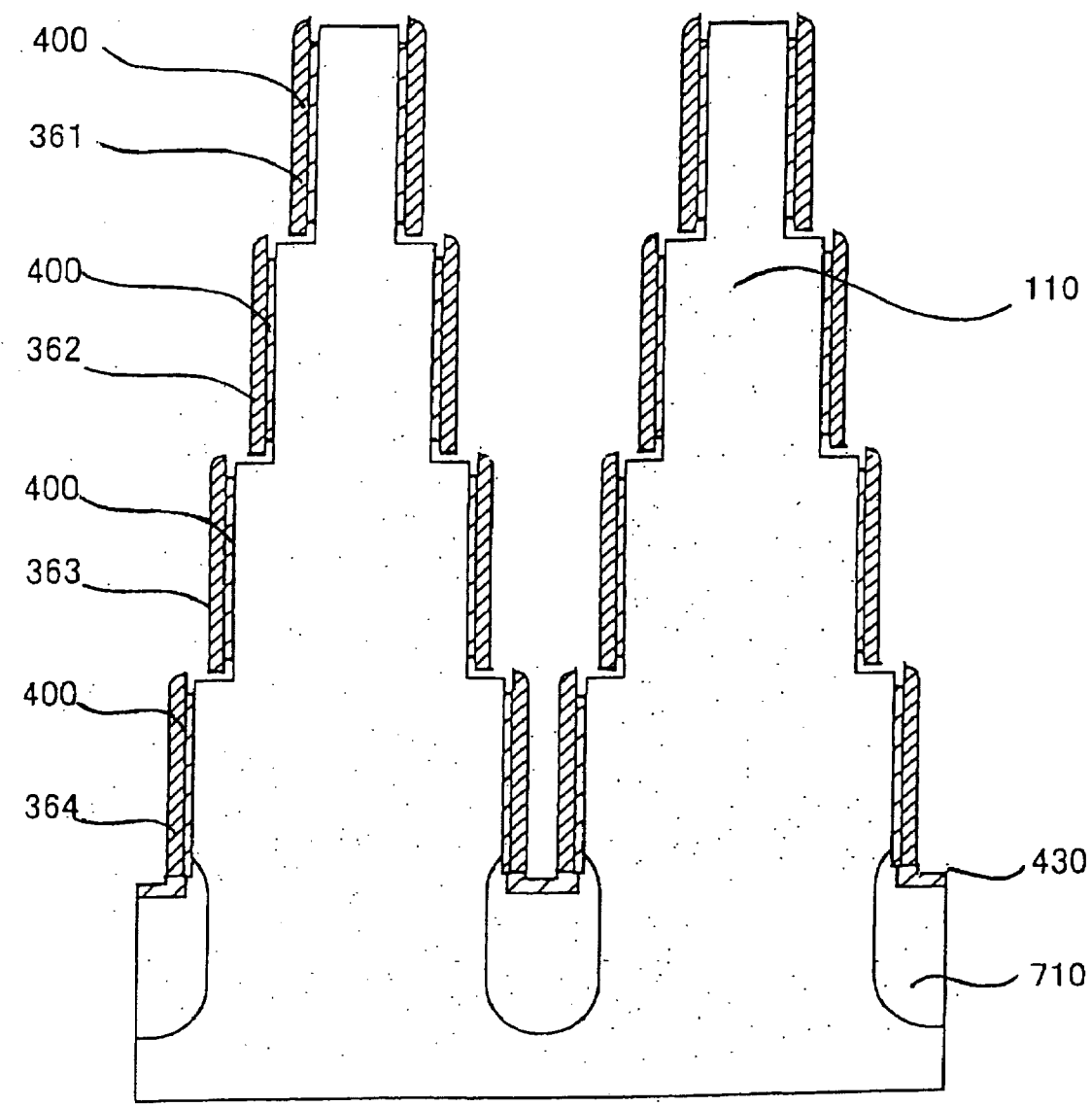
FIGS. 210, 212 and 214 are sectional views showing a production process of a semiconductor memory device of the embodiment 3 (sectional views of A–A' line of FIG. 1).
Figure 211:
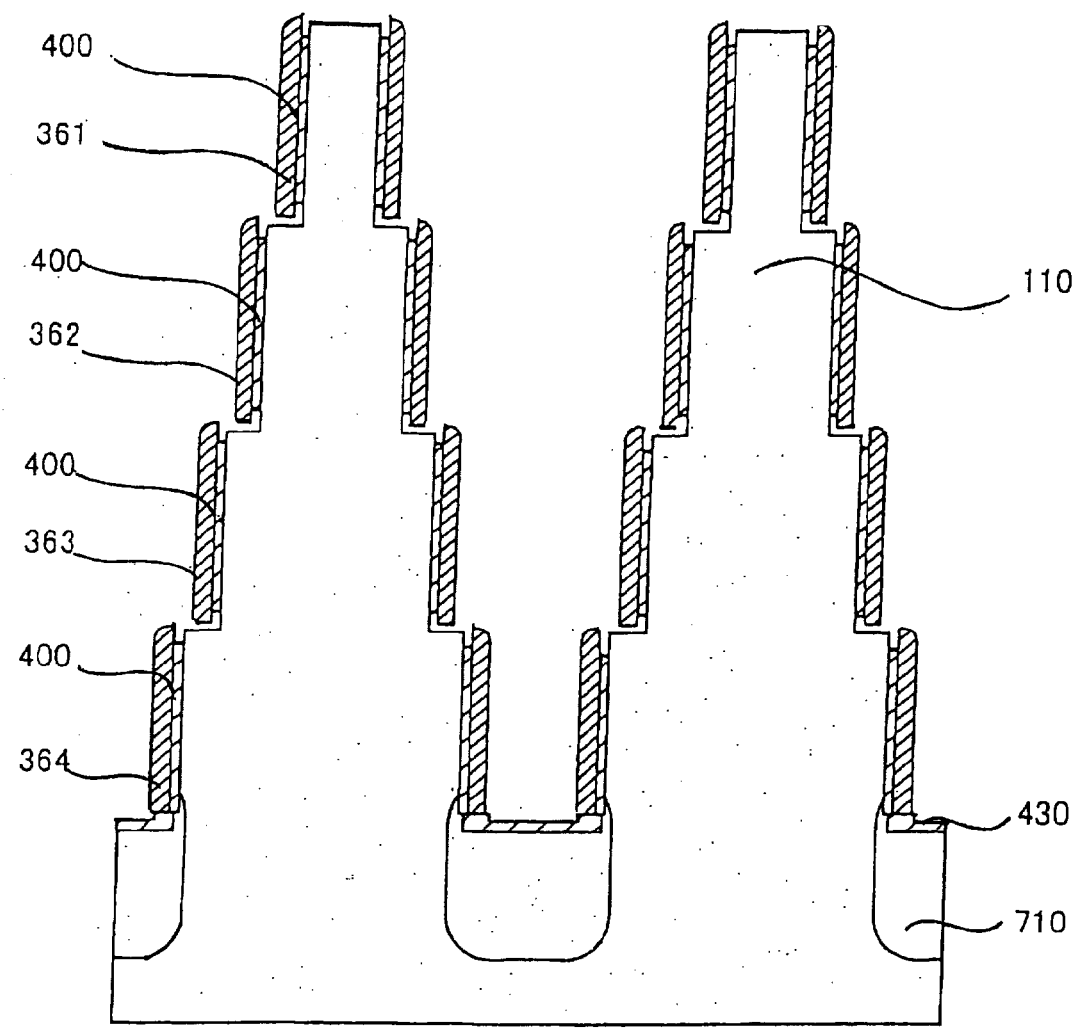
FIGS. 211, 213 and 215 are sectional views showing a production process of a semiconductor memory device of the embodiment 3 (sectional views of B–B' line of FIG. 1).

Using the silicon nitride film sidewall spacers 361, 362, 363, and 364 as a mask, the silicon oxide film 400 is selectively removed in part of the horizontal face of each of the steps and in part of side faces of the island-like semiconductor layer 110 by a diluted HF method (FIGS. 210 and 211).

Figure 212:
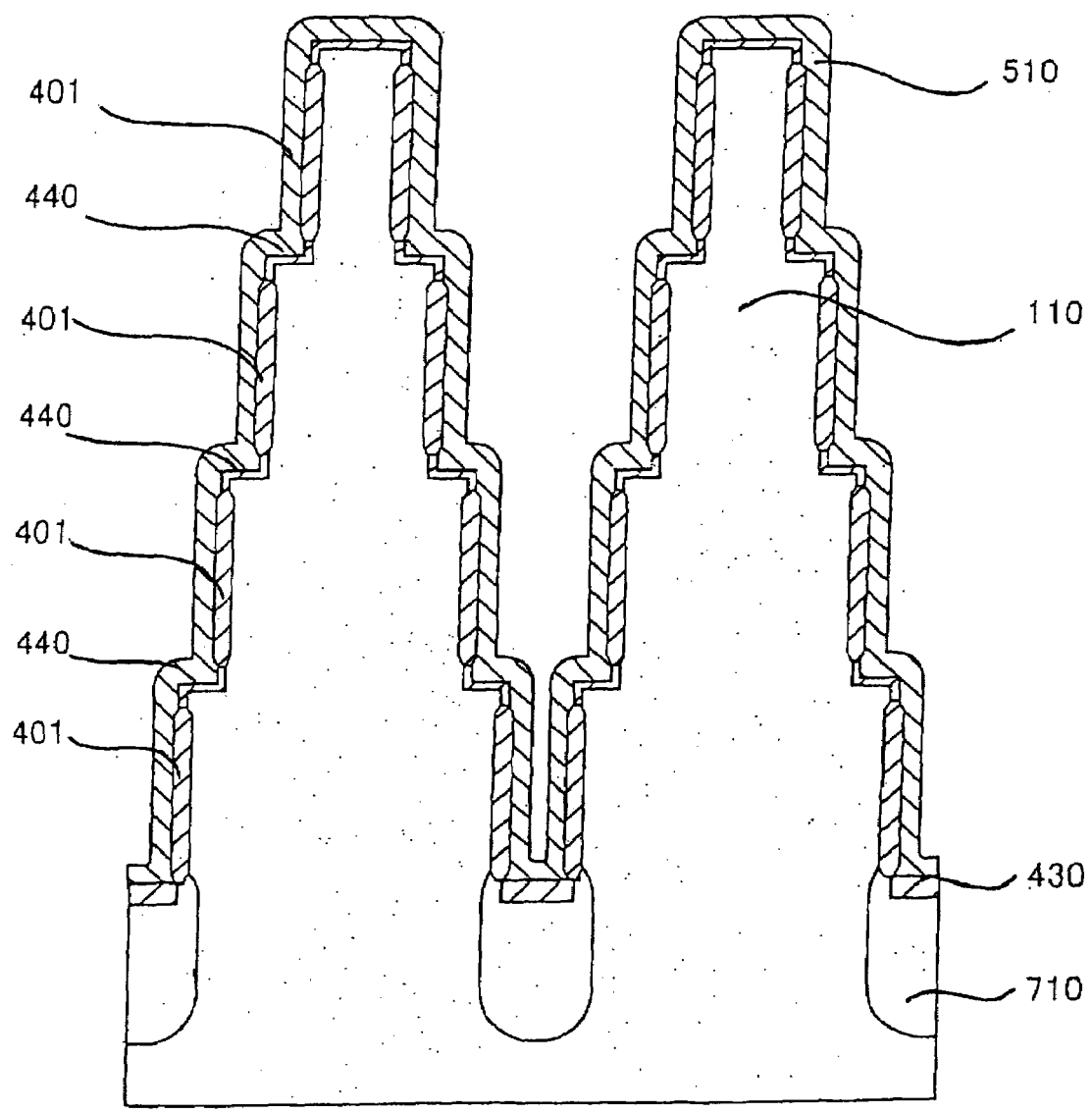
Figure 213:
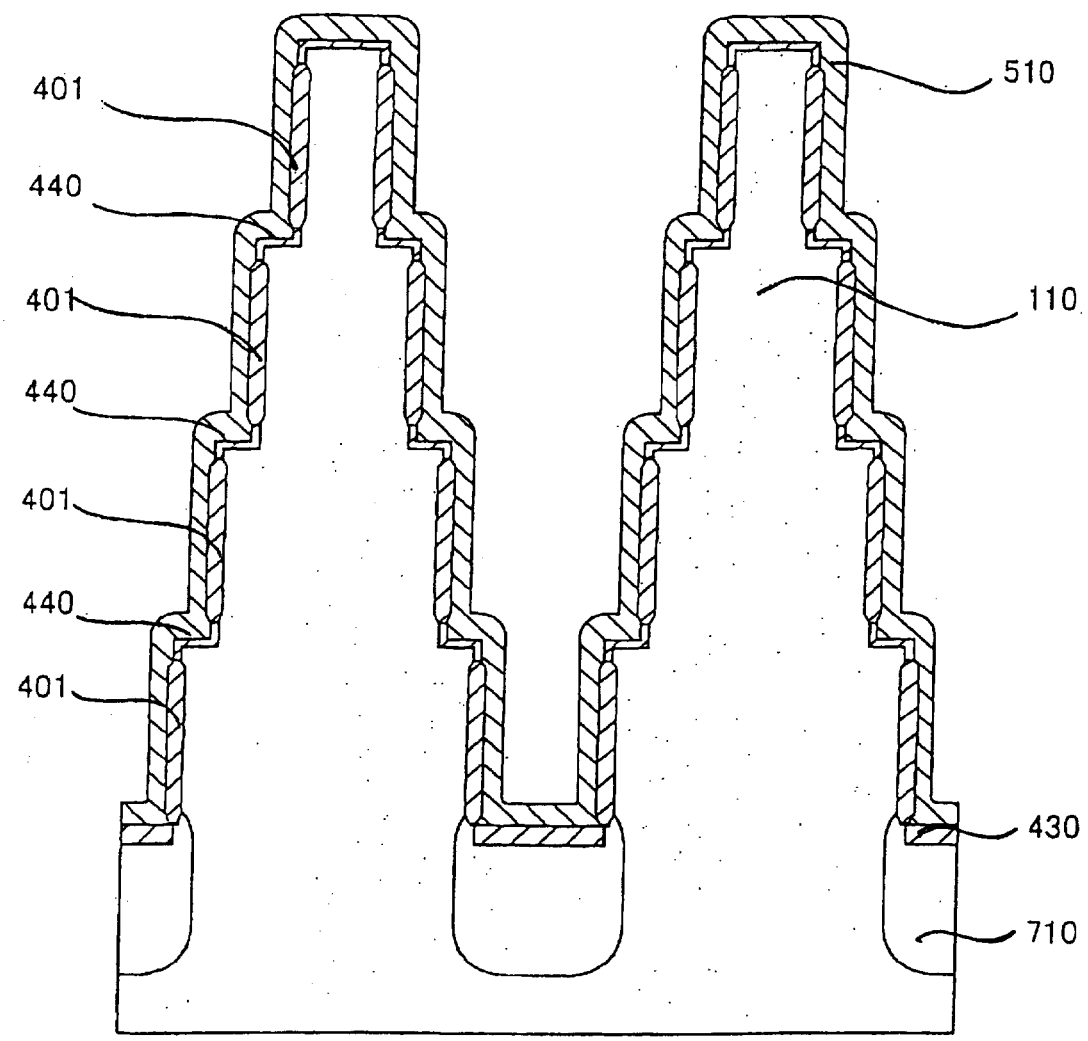

Subsequently, the silicon nitride film sidewall spacers 361, 362, 363, and 364 are selectively removed. The silicon oxide film 440 (tunnel oxide film) having a thickness of about 10 nm is formed as a fifth insulating film in the exposed parts of the island-like semiconductor layer 110 by using thermal oxidation and, simultaneously, the silicon oxide film 401 as the seventeenth insulating film whose thickness is increased to about 250 nm is formed (FIGS. 212 and 213).

Figure 214:
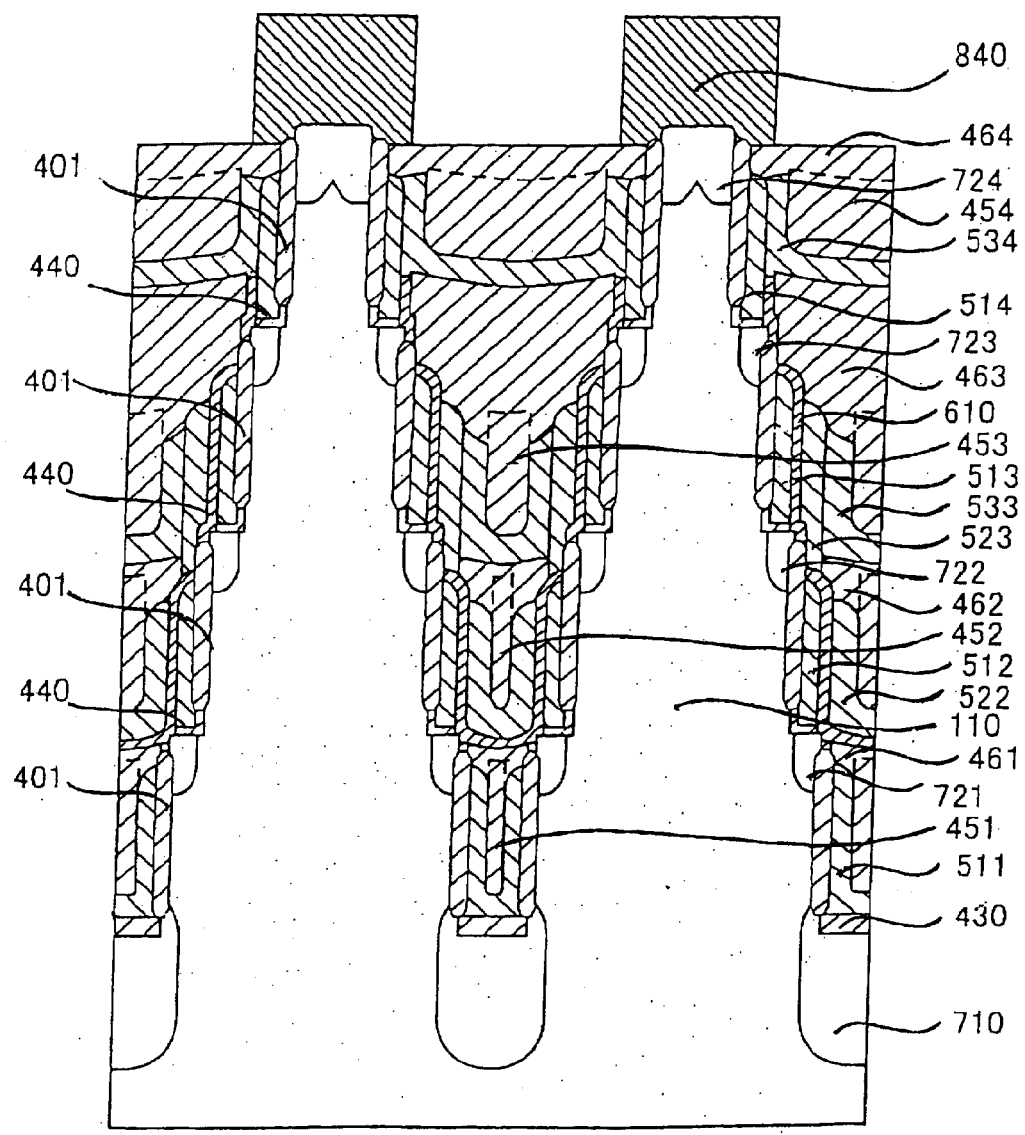
Figure 215:
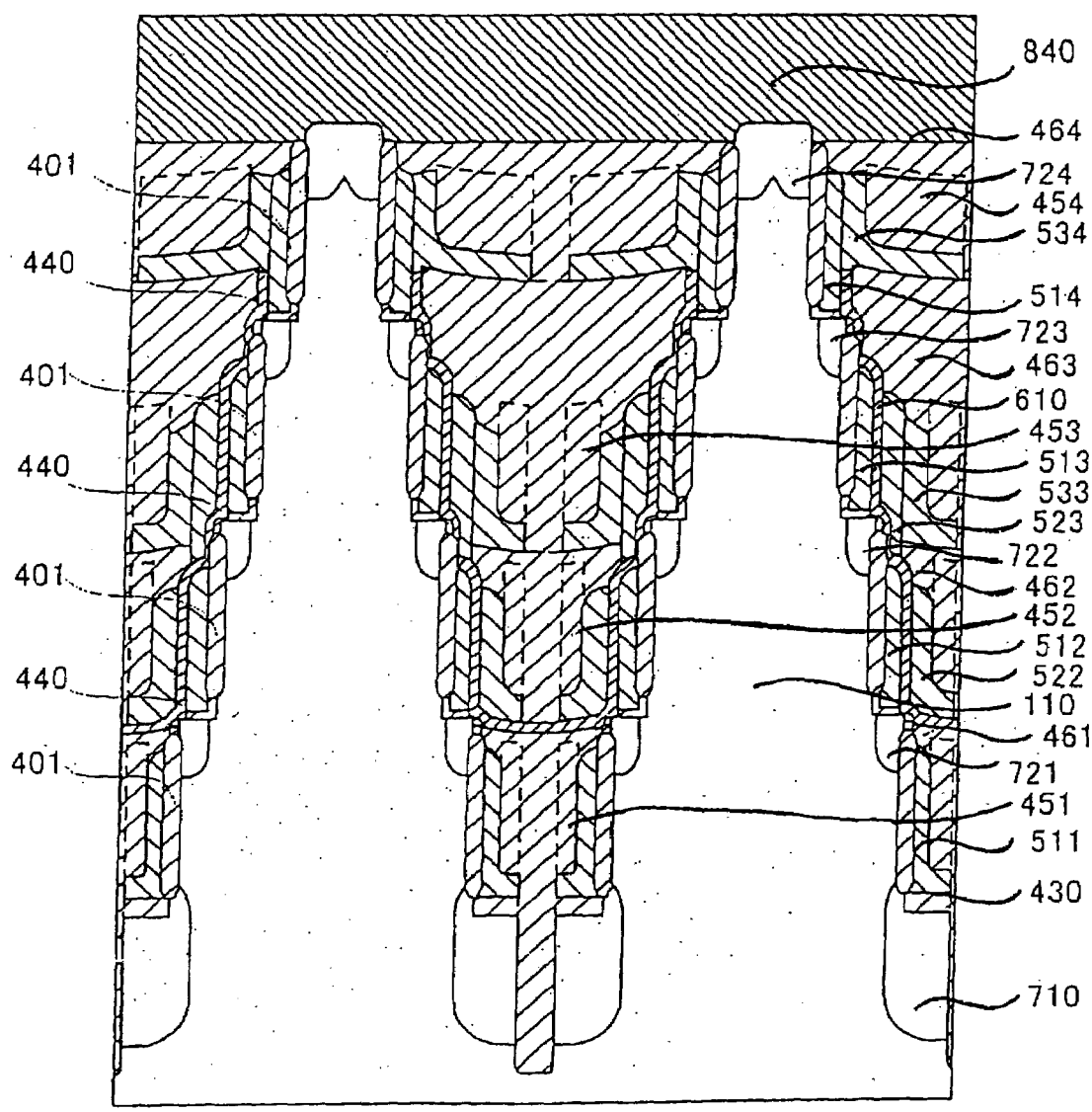

After that, in a manner similar to the production example 1, a semiconductor memory device having a larger region of the tunnel oxide film than that in the production example 1 can be produced (FIGS. 214 and 215).

PRODUCTION EXAMPLE 4

FIGS. 216 to 221 show a production process of a semiconductor memory device of a production example 4. In FIGS. 216 to 221, even-numbered drawings are sectional views taken on line A–A' of FIG. 1 and odd-numbered drawings are sectional views taken on line B–B' of FIG. 1.

Figure 216:
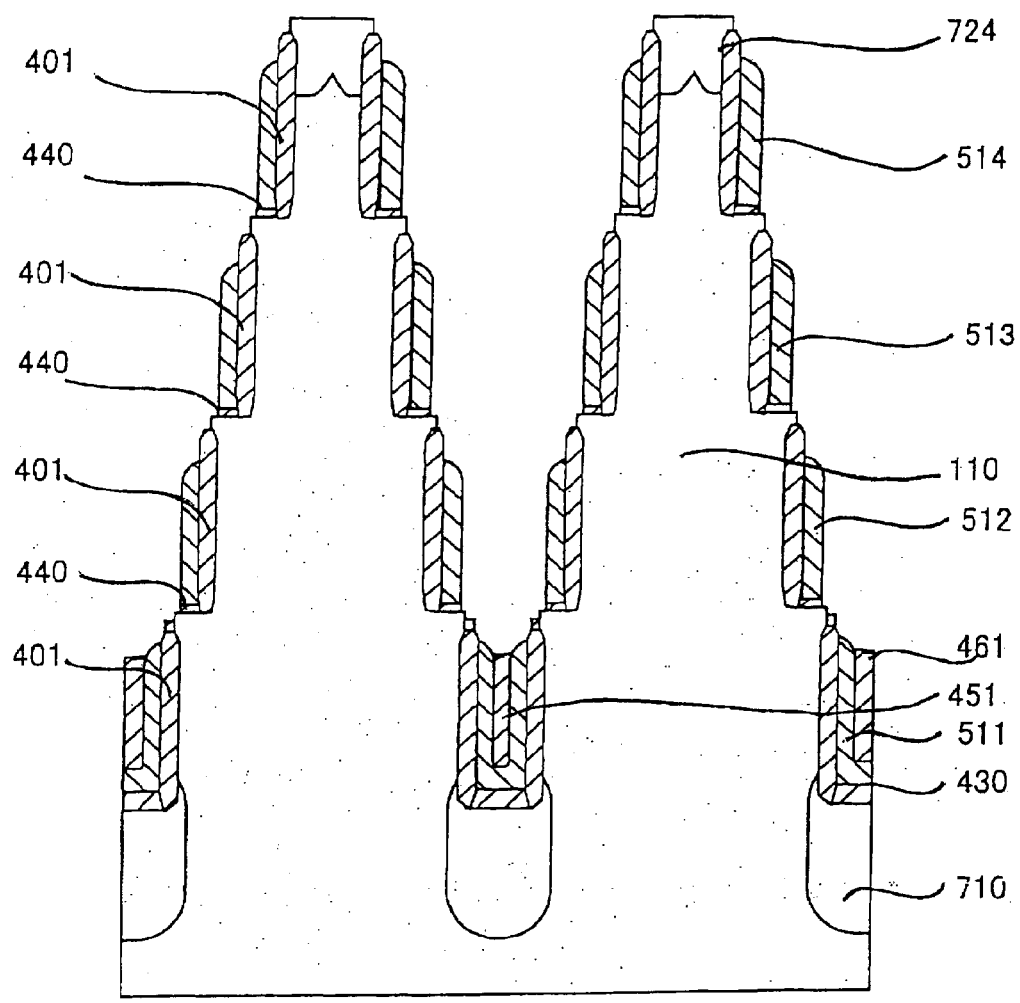
FIGS. 216, 218 and 220 are sectional views showing a production process of a semiconductor memory device of the embodiment 4 (sectional views of A–A' line of FIG. 1).
Figure 217:
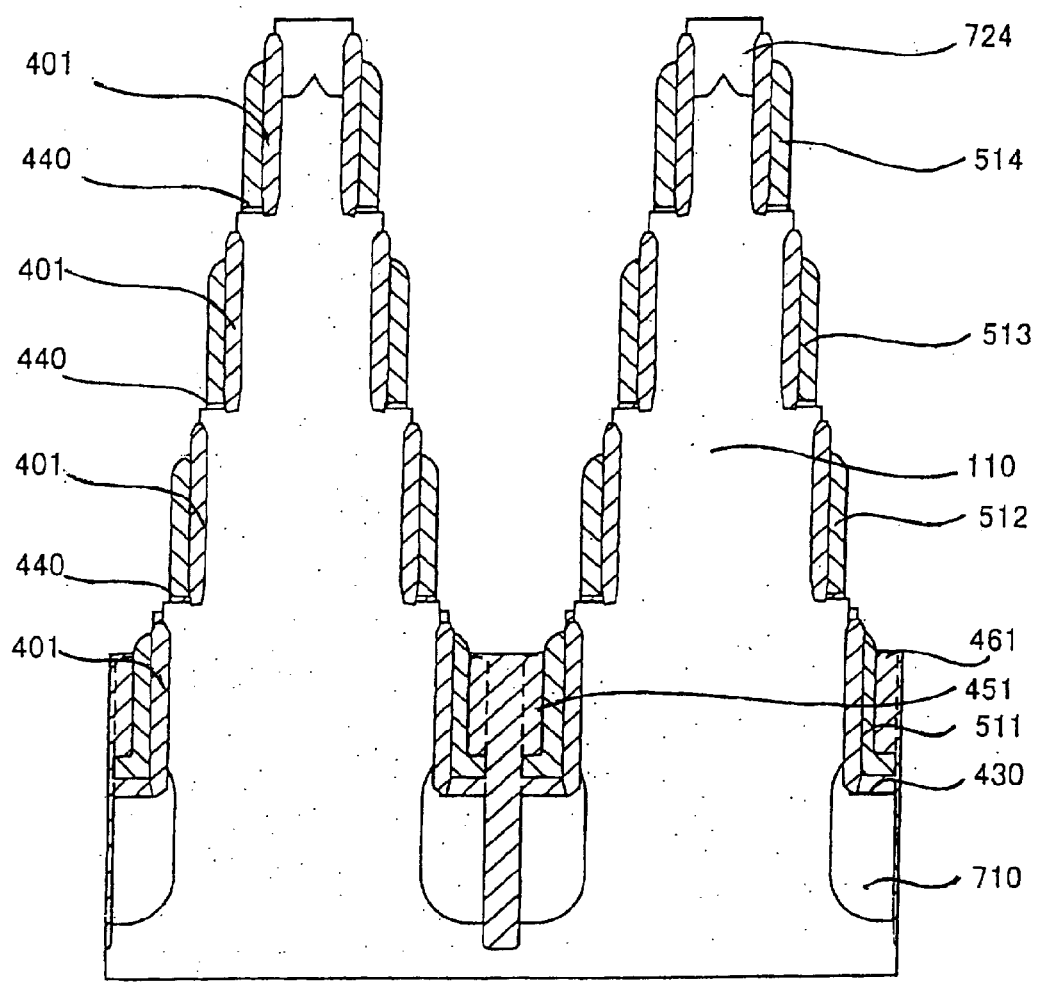
FIGS. 217, 219 and 221 are sectional views showing a production process of a semiconductor memory device of the embodiment 4 (sectional views of B–B' line of FIG. 1).

In a manner similar to the production example 1, on the sidewalls of each of the steps of the island-like semiconductor layer 110, with intervention of the silicon oxide film 440 as the fifth insulating film and the silicon oxide film 401 as the seventeenth insulating film, sidewall spacers 511, 512, 513, and 514 of the polysilicon film as a first conductive film are formed. The selection gates in the lowest steps, that is, the polysilicon films 511 are all kept connected by protection of the silicon oxide film 451 as the sixth insulating film. The insulating film sandwiched by the polysilicon film as the sidewall spacer and the island-like semiconductor layer 110 is constructed by the silicon oxide films 440 and 401 (FIGS. 216 and 217).

After that, using the resist R2 patterned by a known photolithography technique as a mask, by reactive ion etching, the silicon oxide film 451 is etched and the polysilicon film 511, the silicon oxide film 430 as the fourth insulating film, and the impurity diffusion layer 710 are etched, thereby forming the first trench 211. In such a manner, the first wiring layer and the second wiring layer serving as the selection gate layer continuous in the A–A' direction of FIG. 1 are formed so as to be separated.

Next, a silicon oxide film 461 is deposited to about 20 to 200 nm as a seventh insulating film and is isotropically etched so as to bury the first trench 211 and the top of the polysilicon film 511.

Figure 218:
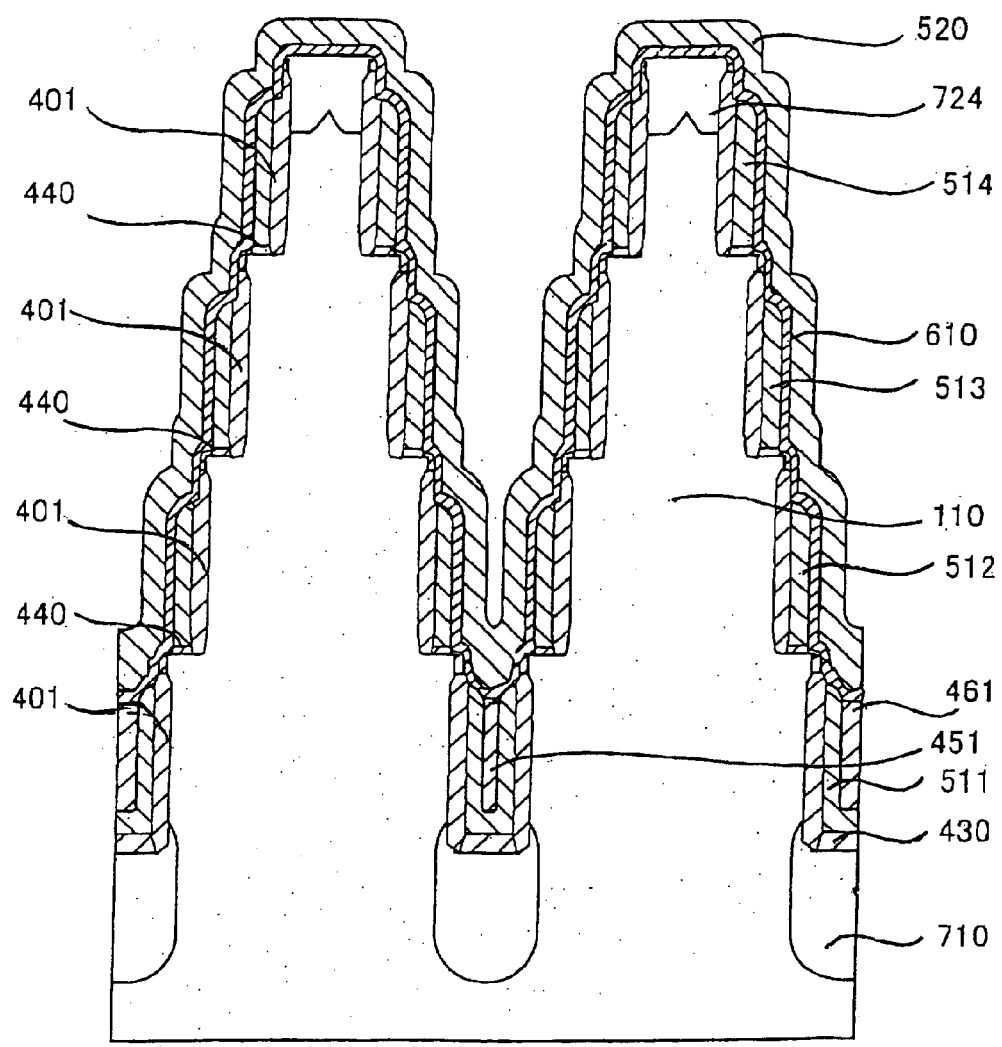
Figure 219:
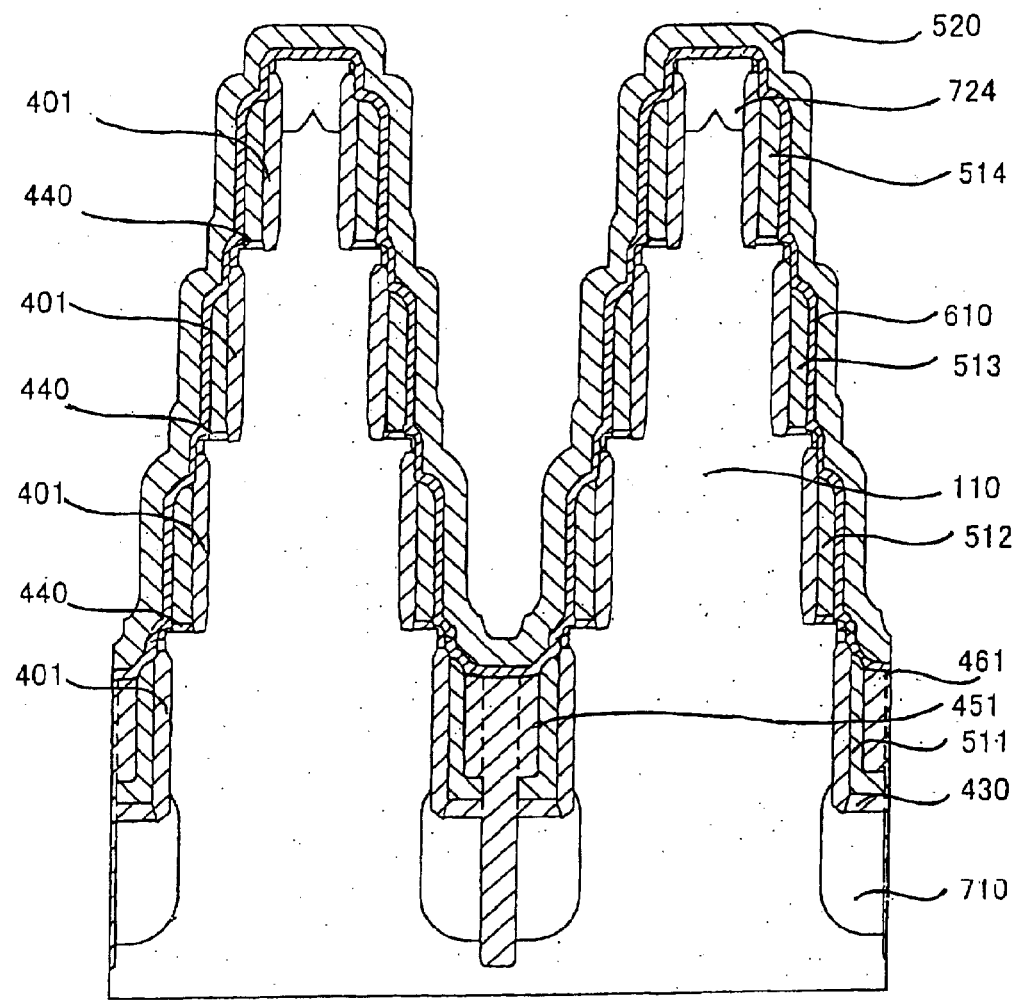
Figure 220:
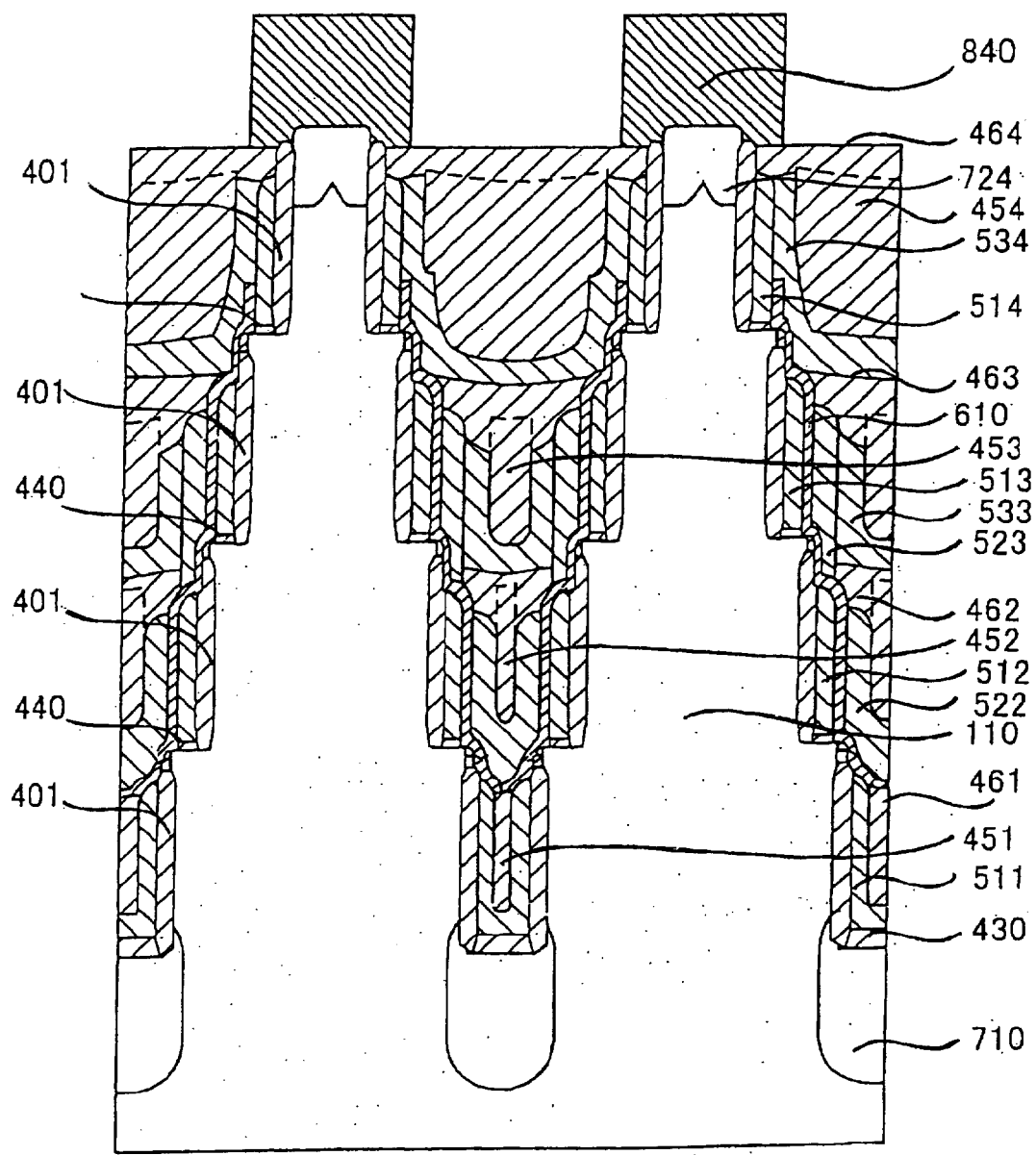
Figure 221:
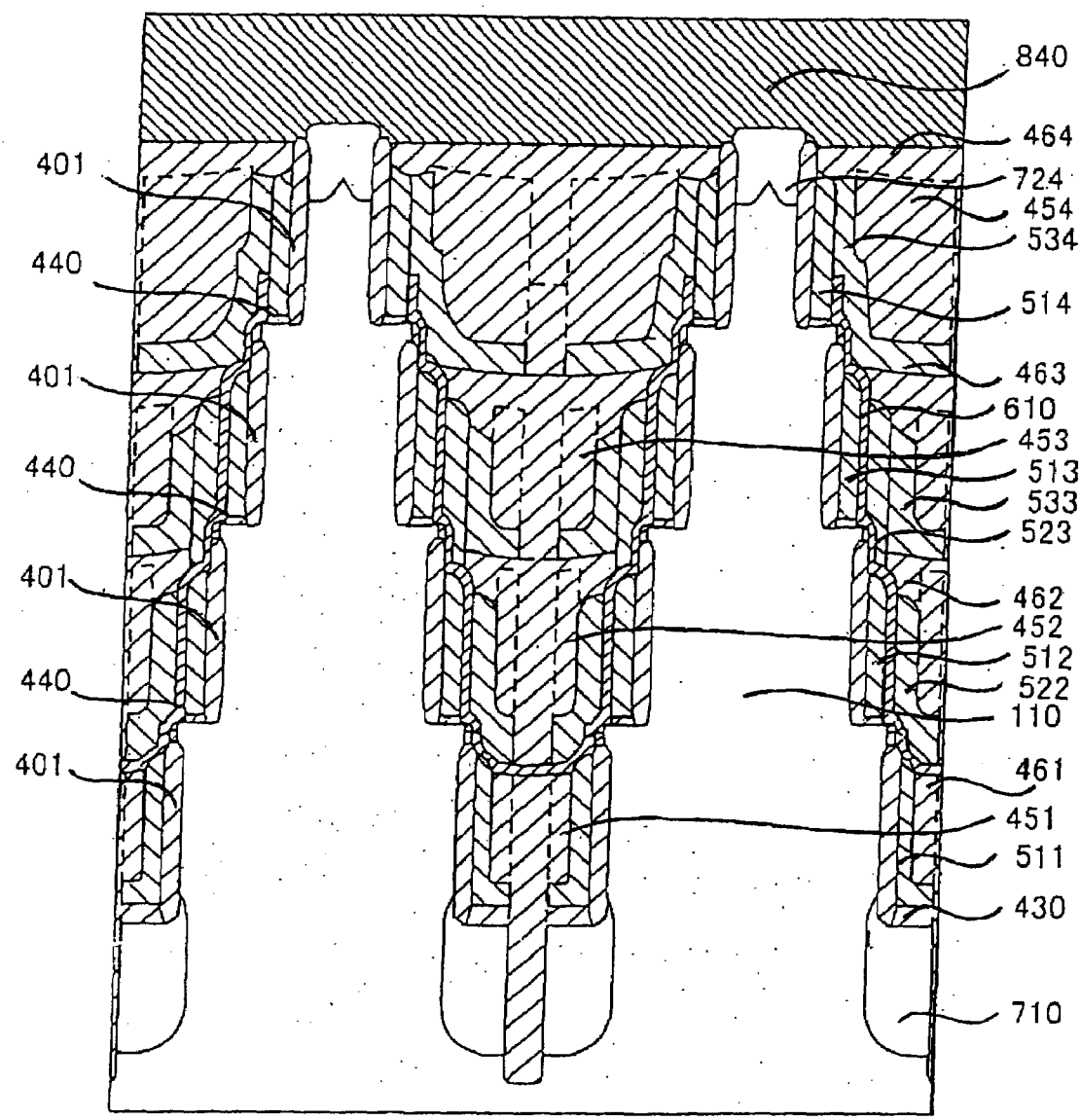
Figure 222:
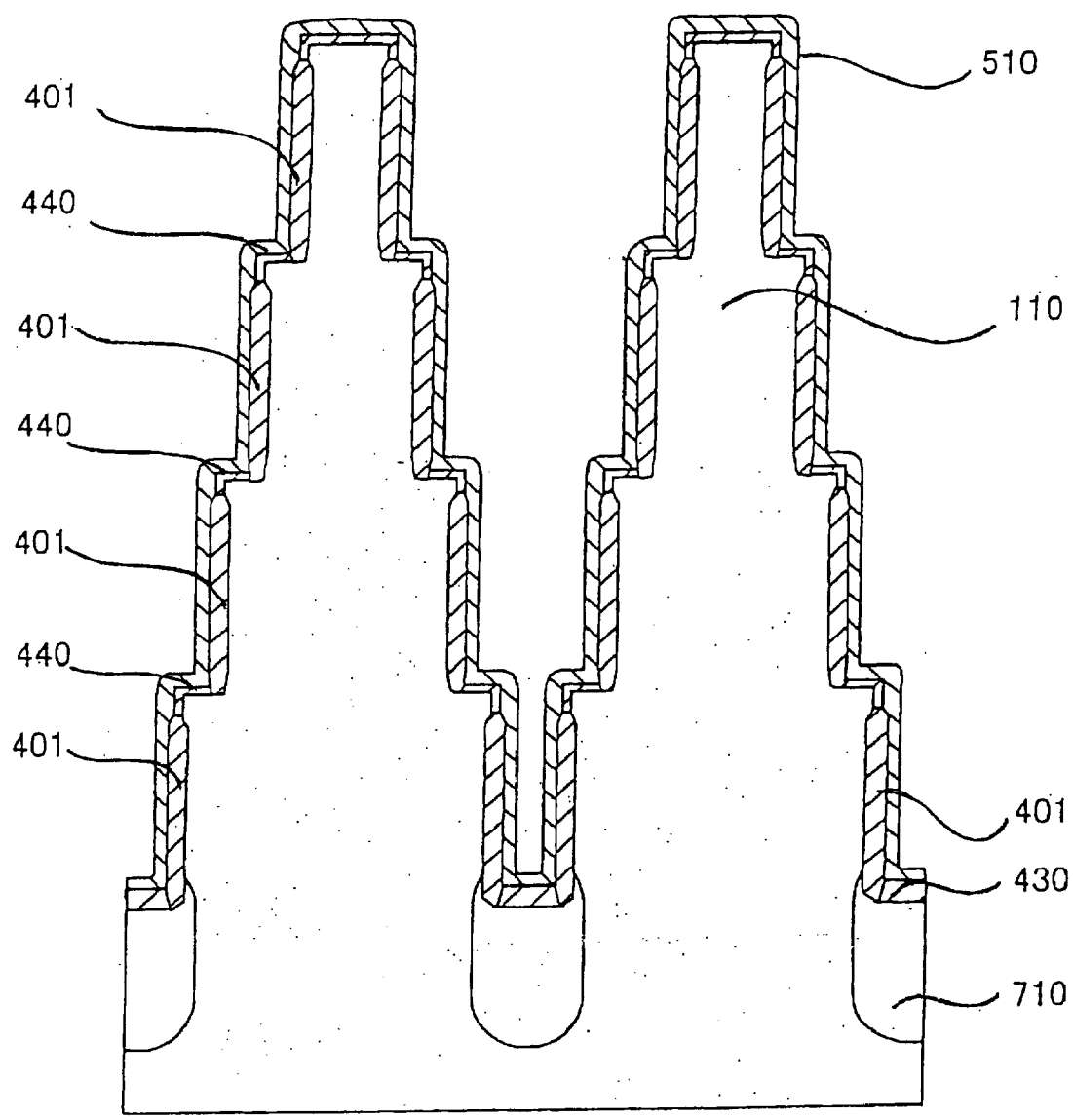
FIGS. 222, 224, 226 and 228 are sectional views showing a production process of a semiconductor memory device of the embodiment 5 (sectional views of A–A' line of FIG. 1).
Figure 223:
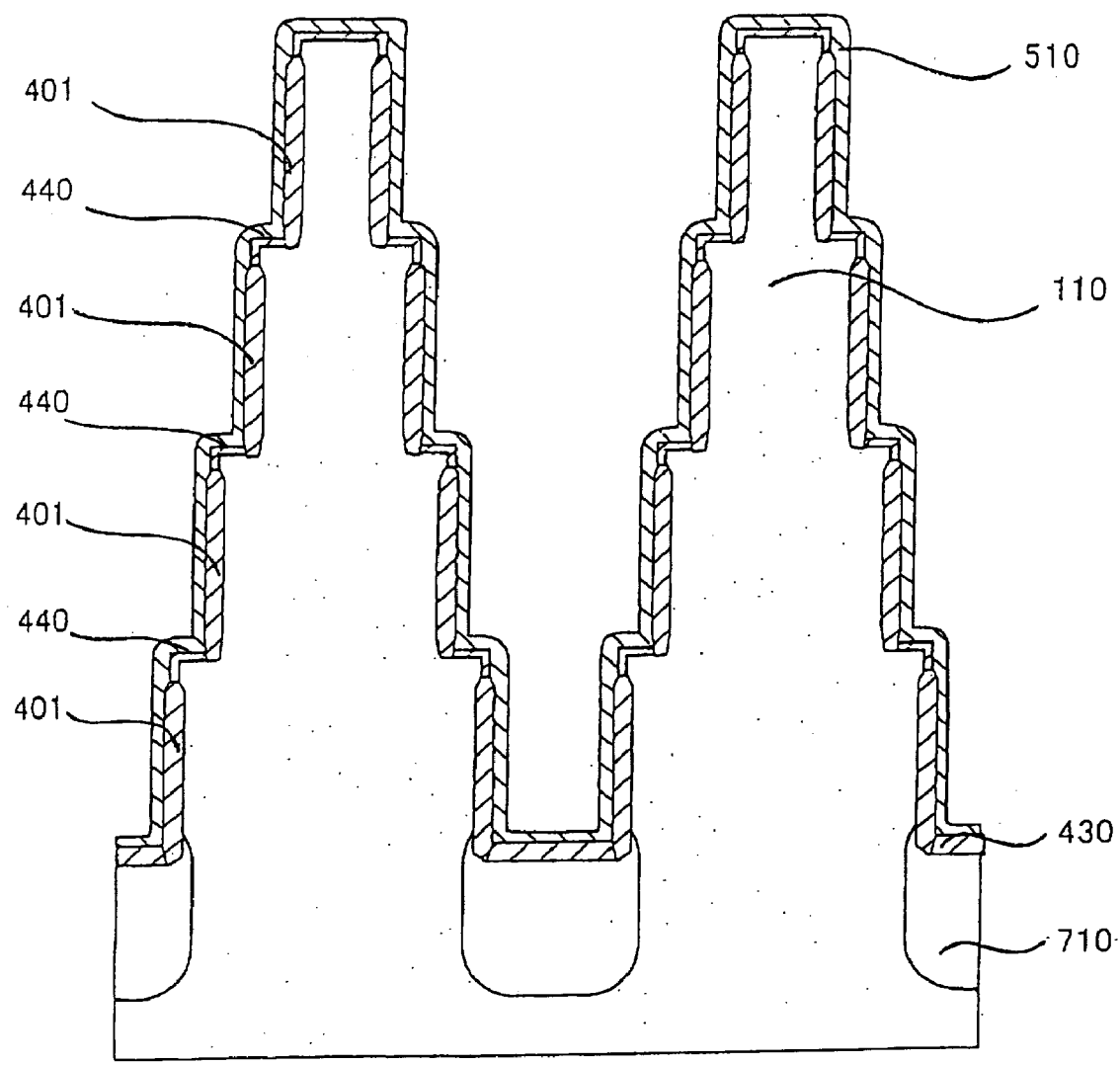
FIGS. 223, 225, 227 and 229 are sectional views showing a production process of a semiconductor memory device of the embodiment 5 (sectional views of B–B' line of FIG. 1).

Subsequently, an interlayer insulating film 610 is formed by an ONO film on the exposed surfaces of the polysilicon films 512, 513 and 514. A polysilicon film 520 is deposited to 15 to 150 nm as a second conductive film (FIGS. 218 and 219). At this time, the burying position of the silicon oxide film 461 is set so that the polysilicon film 520 is disposed between the polysilicon films 511 and 512.

In a manner similar to the production example 1, by making the control gate or selection gate overlapped with the island-like semiconductor layer between the memory transistors or between the selection transistor and the memory transistor with intervention of the ONO film, the semiconductor memory device (FIGS. 220 and 221) in which transistors having a split gate structure are connected in series along the island-like semiconductor layer can be produced.

PRODUCTION EXAMPLE 5

FIGS. 222 to 229 show a production process of a semiconductor memory device of a production example 5. In FIGS. 222 to 229, even-numbered drawings are sectional views taken on line A–A' of FIG. 1 and odd-numbered drawings are sectional views taken on line B–B' of FIG. 1.

A semiconductor memory device in the production example 5 is produced in a manner similar to the production example 1 except that the gate electrode of each of the memory transistor and the selection transistor is formed in an L shape in section along the island-like semiconductor layer 110.

Up to the formation of the silicon oxide film 401 as the seventeenth insulating film on the sidewalls of the island-like semiconductor layer 110, the processes conform to those in the production example 1.

Figure 224:
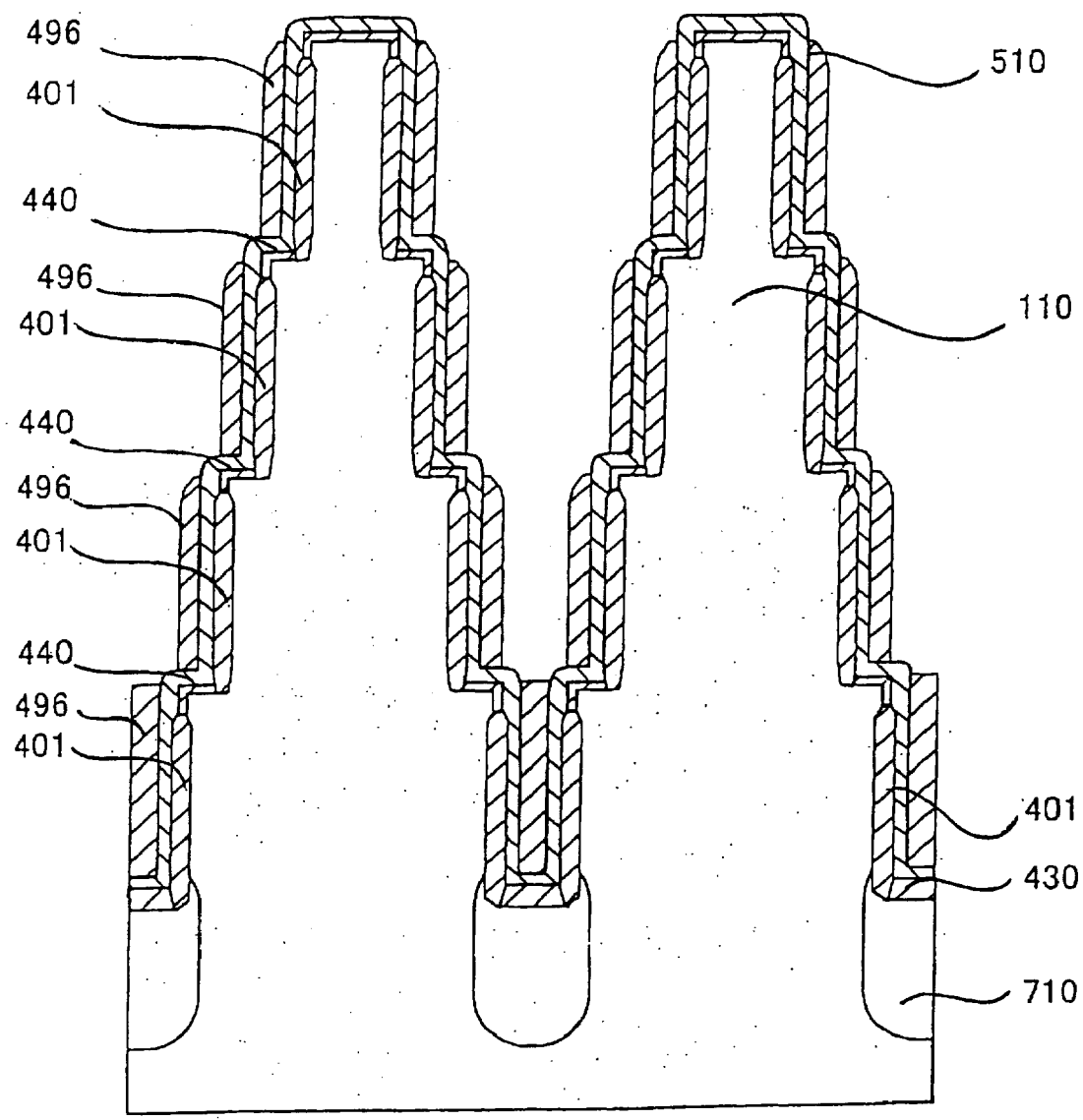
Figure 225:
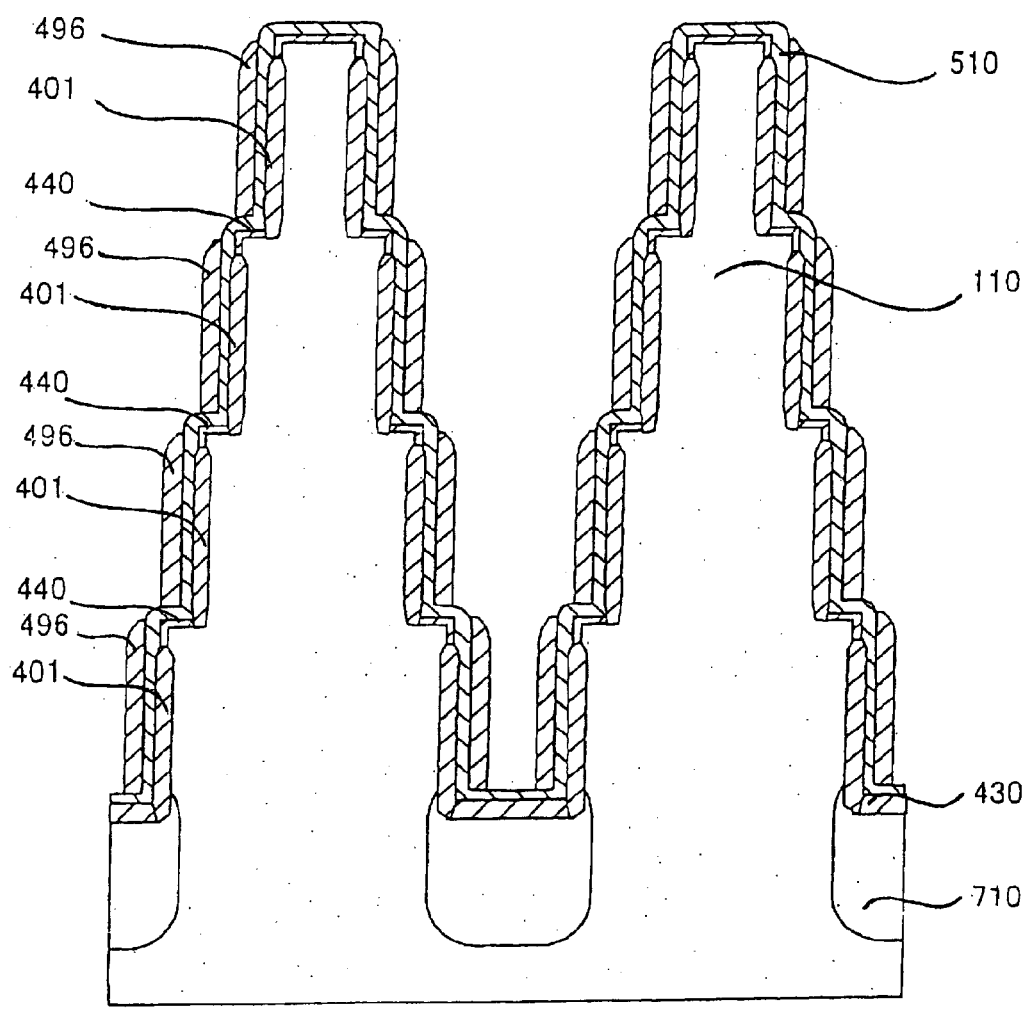

After that, a polysilicon film 510 as a first conductive film is deposited to about 10 to 100 nm (FIGS. 222 and 223), and a silicon oxide film 496 as an eighteenth insulating film is deposited to about 10 to 100 nm and is etched so as to be sidewall spacers in the height of the steps of the island-like semiconductor layer 110 by anisotropic etching (FIGS. 224 and 225).

Figure 226:
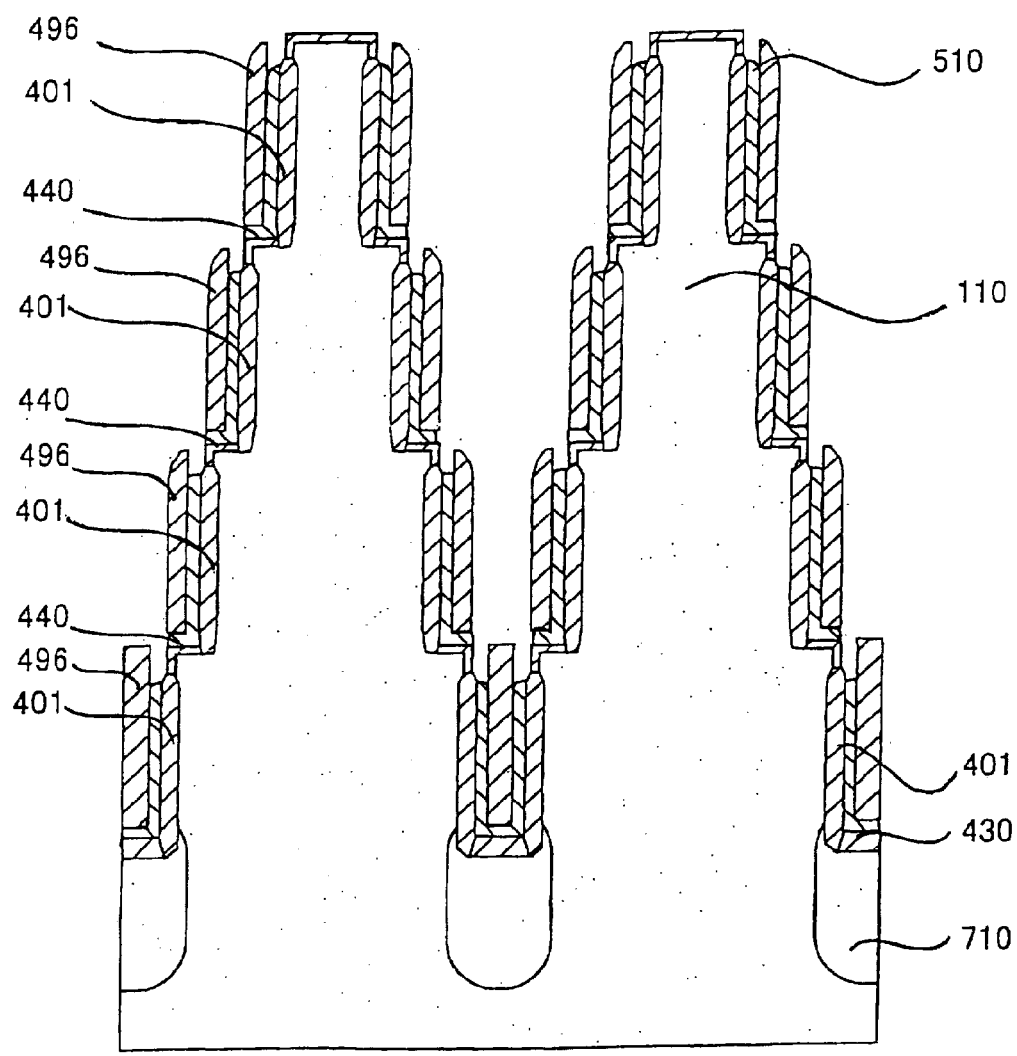
Figure 227:
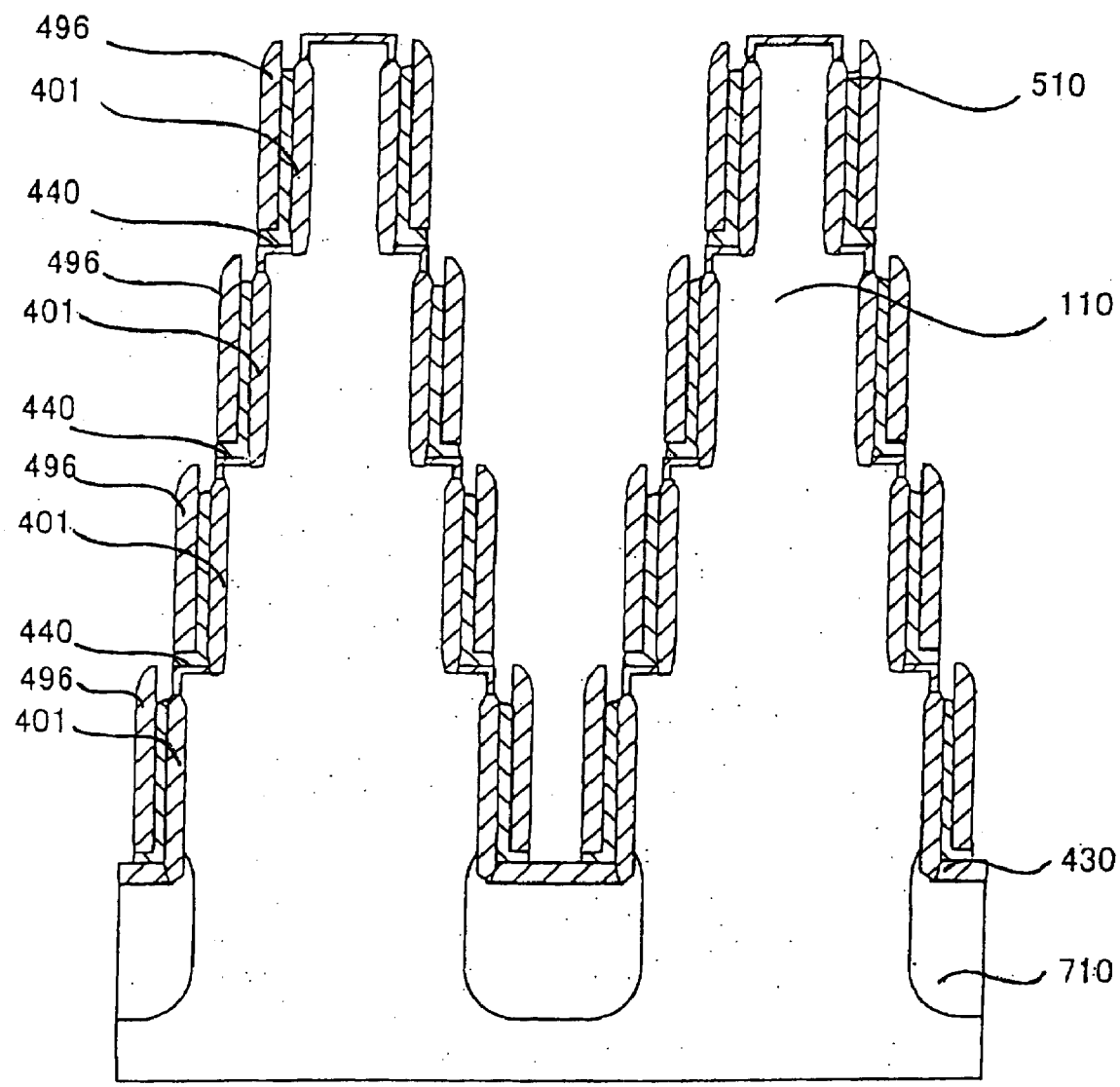

Using the sidewall spacers of the silicon oxide film 496 as a mask, anisotropic or isotropic etching is performed, thereby forming the polysilicon oxide film 501 in an L-shaped sidewall spacer on the sidewall of each of the steps of the island-like semiconductor layer 110. In such a manner, polysilicon films 511, 512, 513, and 514 are formed so as to be separated in a lump (FIGS. 226 and 227).

Figure 228:
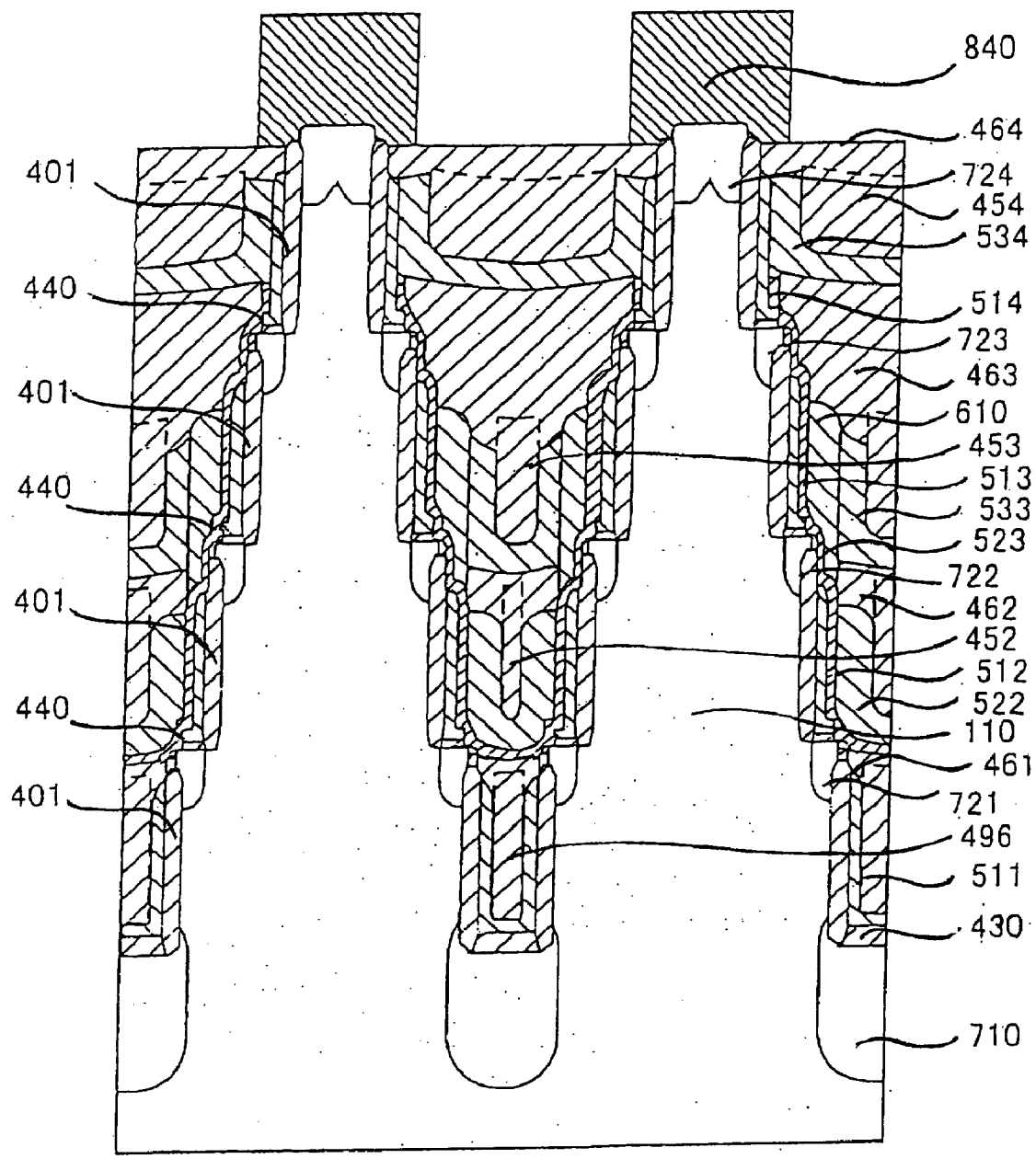
Figure 229:
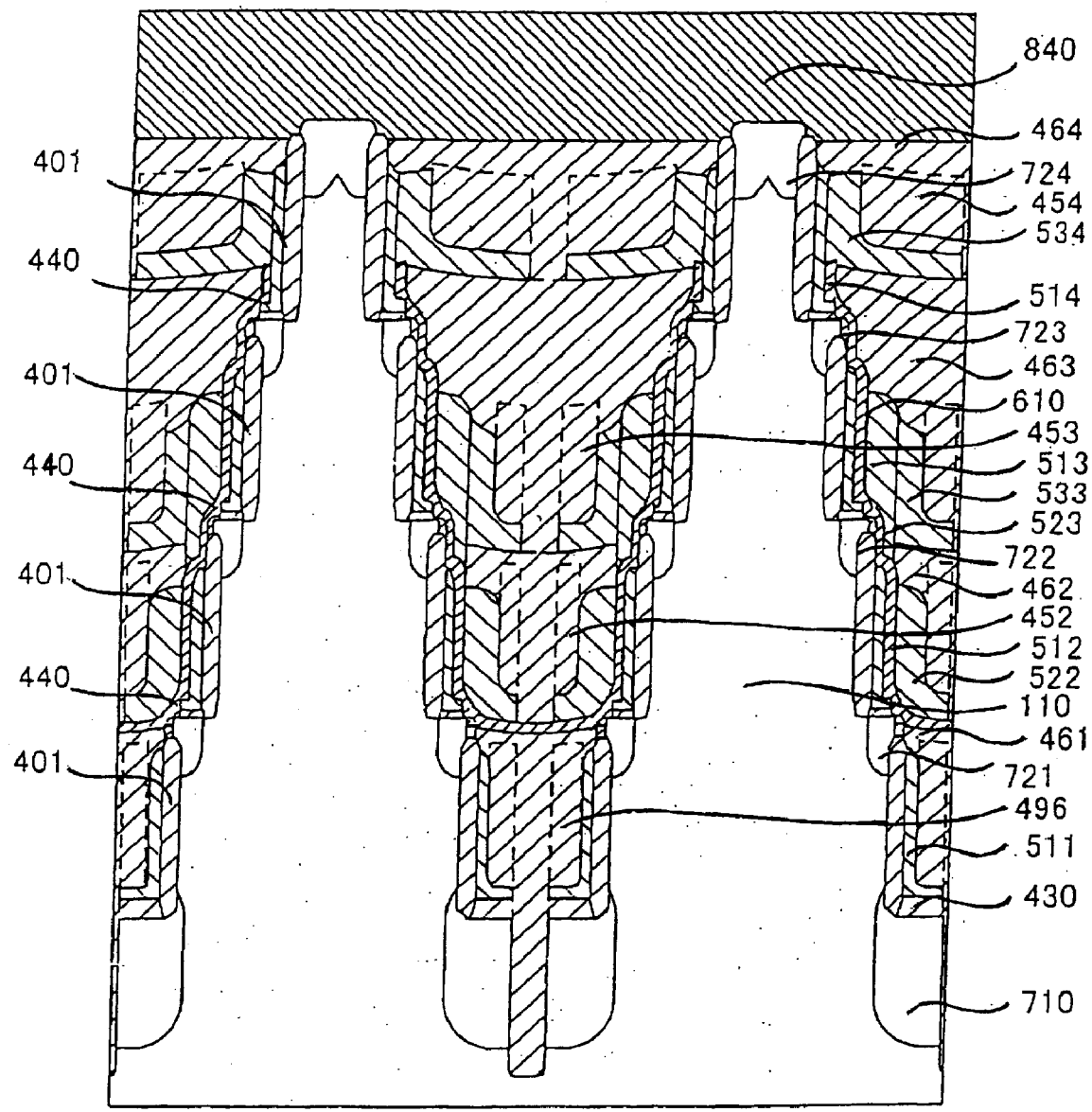

Subsequently, in a manner similar to the production example 1, a semiconductor memory device can be produced while setting the region of the tunnel oxide film formed in the horizontal face of each of the steps of the island-like semiconductor layer 110 at the time of processing the polysilicon film as the first conductive film (FIGS. 228 and 229).

PRODUCTION EXAMPLE 6

FIGS. 230 to 237 show a production process of a semiconductor memory device of a production example 6. In FIGS. 230 to 237, even-numbered drawings are sectional views taken on line A–A' of FIG. 1 and odd-numbered drawings are sectional views taken on line B–B' of FIG. 1.

A semiconductor memory device in the production example 6 is produced in a manner similar to the production example 5 except that the gate electrode of the memory transistor is formed in an L shape in section and the gate electrode of the selection transistor is formed in an I shape in section along the island-like semiconductor layer 110.

Figure 230:
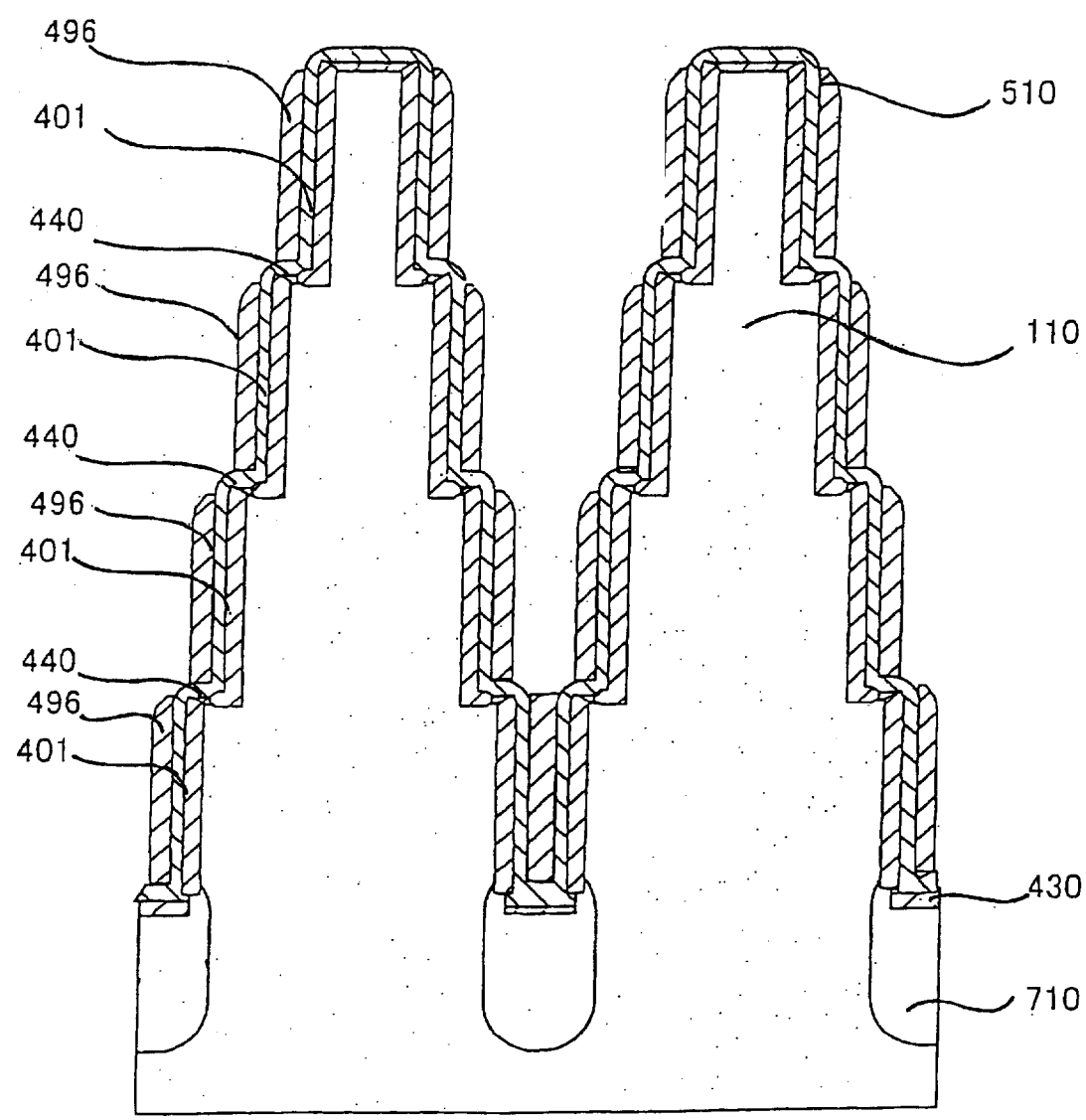
FIGS. 230, 232, 234 and 236 are sectional views showing a production process of a semiconductor memory device of the embodiment 6 (sectional views of A–A' line of FIG. 1).
Figure 231:
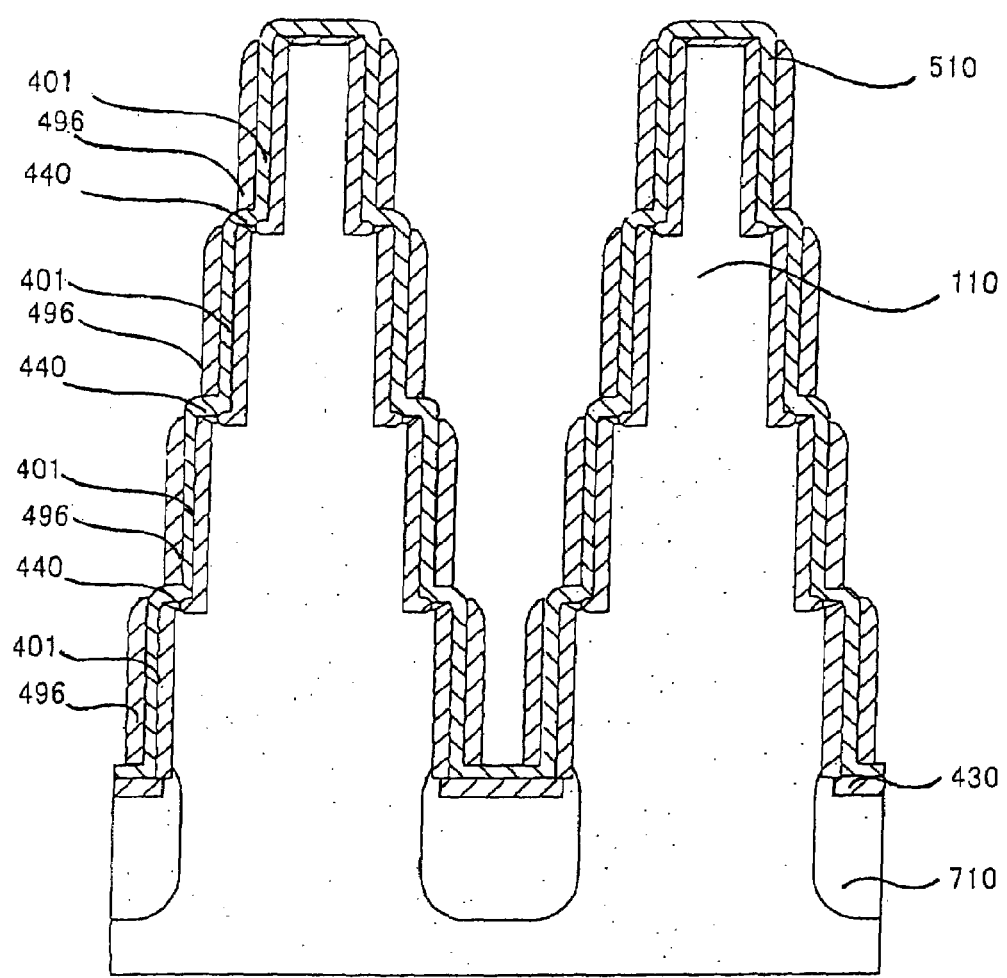
FIGS. 231, 233, 235 and 237 are sectional views showing a production process of a semiconductor memory device of the embodiment 6 (sectional views of B–B' line of FIG. 1).

By a method similar to that of the production example 5, the polysilicon film 510 as a first conductive film is deposited to about 10 to 100 nm on the sidewalls of the island-like semiconductor layer 110 with intervention of the silicon oxide film 401 as a seventeenth insulating film. After that, a silicon oxide film 451 is deposited to 20 to 200 nm as a sixth insulating film and is etched back to a desired depth. A silicon oxide film 496 is deposited to 10 to 100 nm as an eighteenth insulating film and anisotropically etched so as to be sidewall spacers in the height of the steps of the island-like semiconductor layer 110 (FIGS. 230 and 231).

Figure 232:
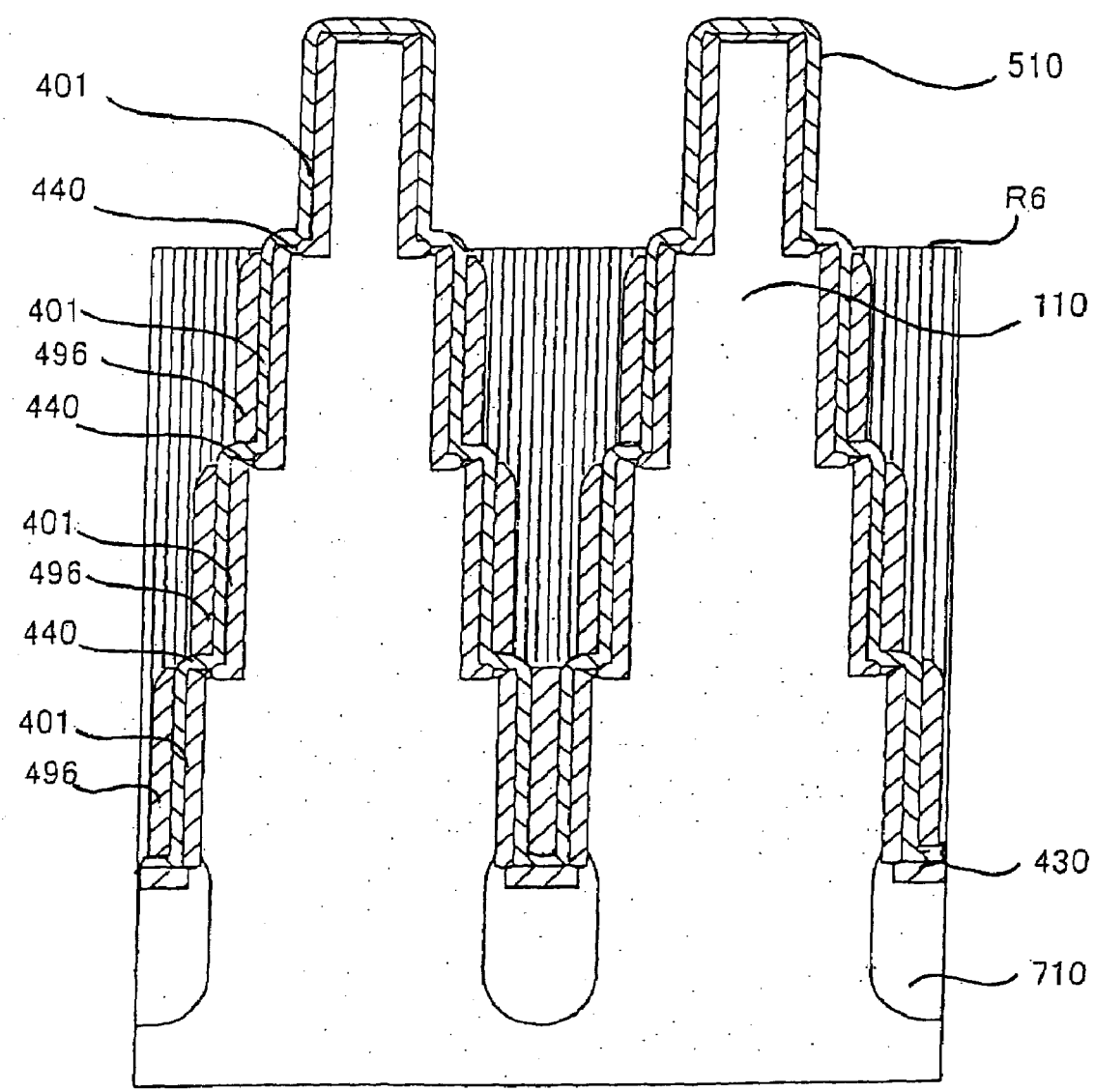
Figure 233:
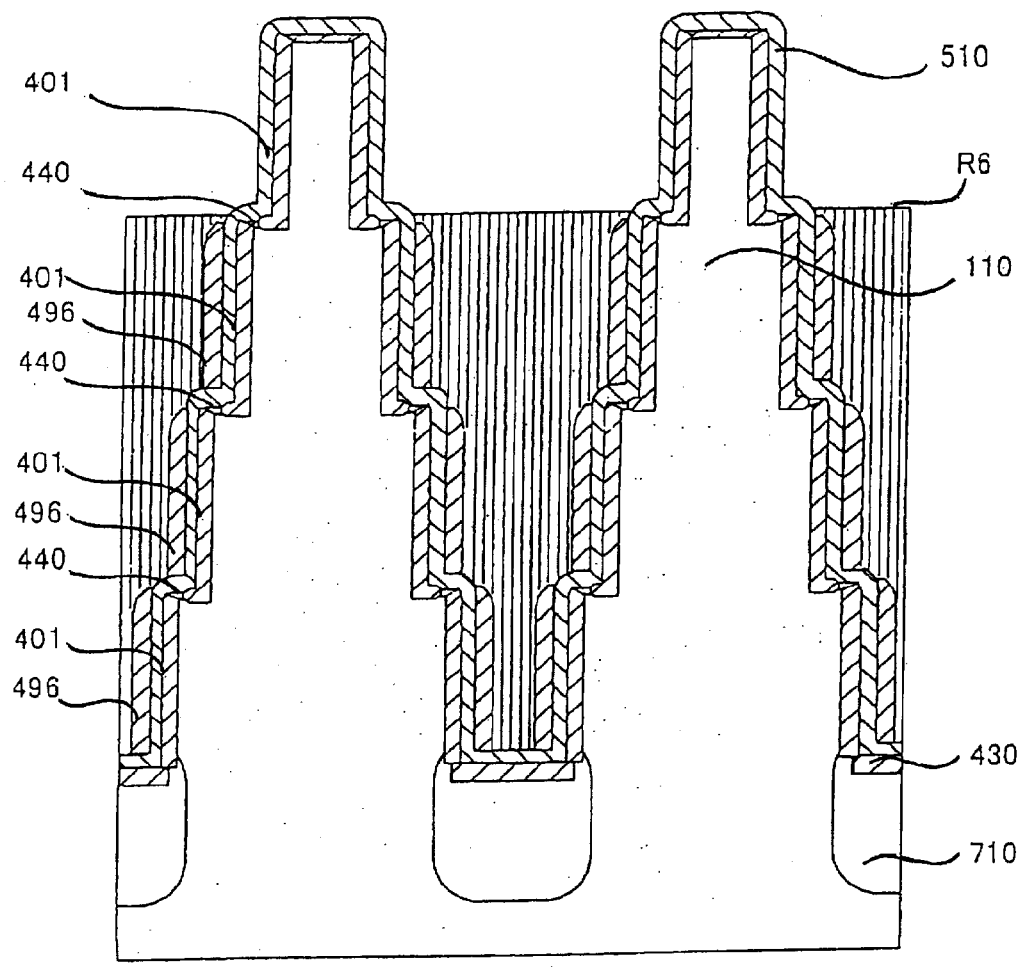

After that, by resist etch back, only the sidewall spacer of the silicon oxide film 496 disposed on the side faces of the selection gate in the uppermost step, that is, the polysilicon film 514 as the first conductive film is removed by diluted HF (FIGS. 232 and 233).

Figure 234:
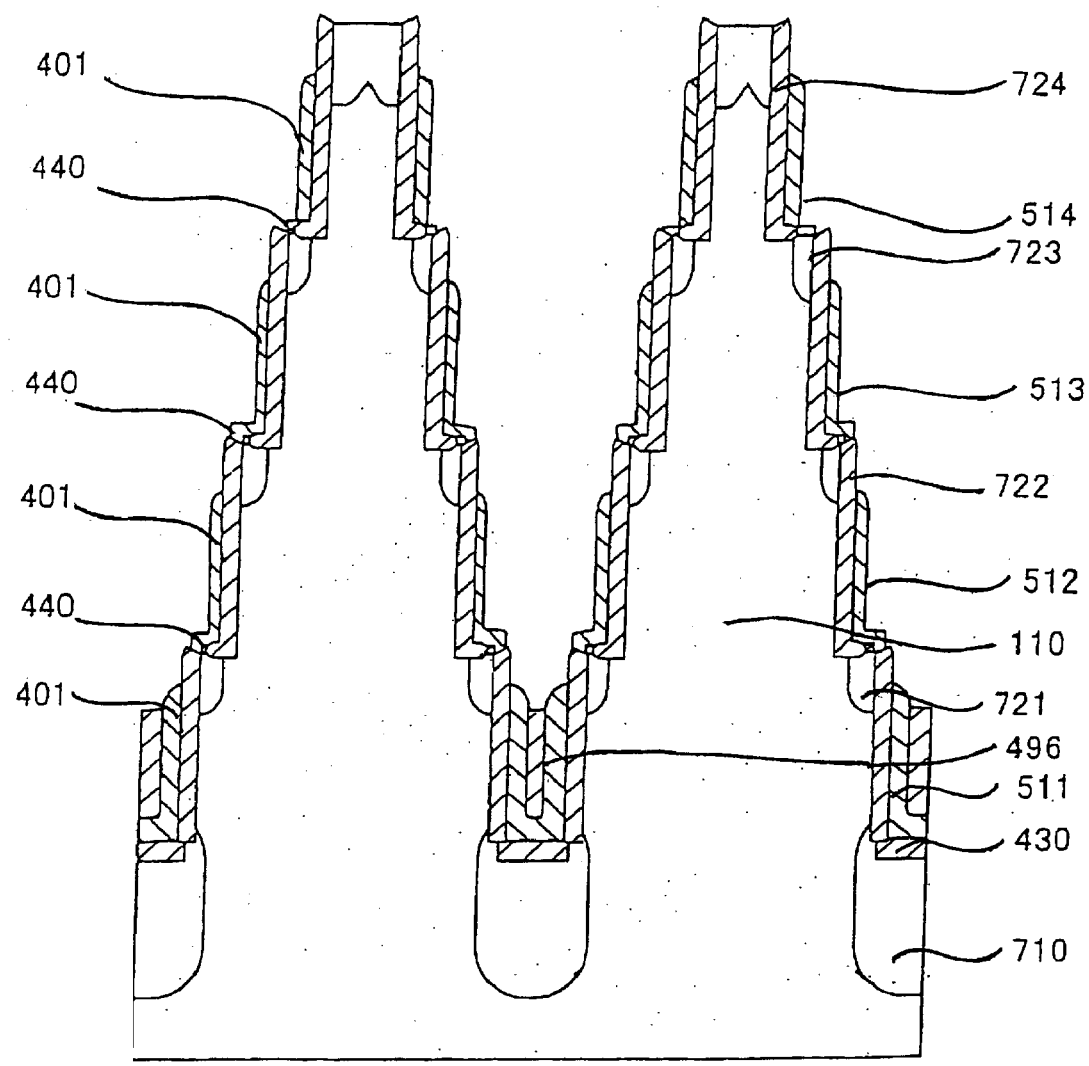
Figure 235:
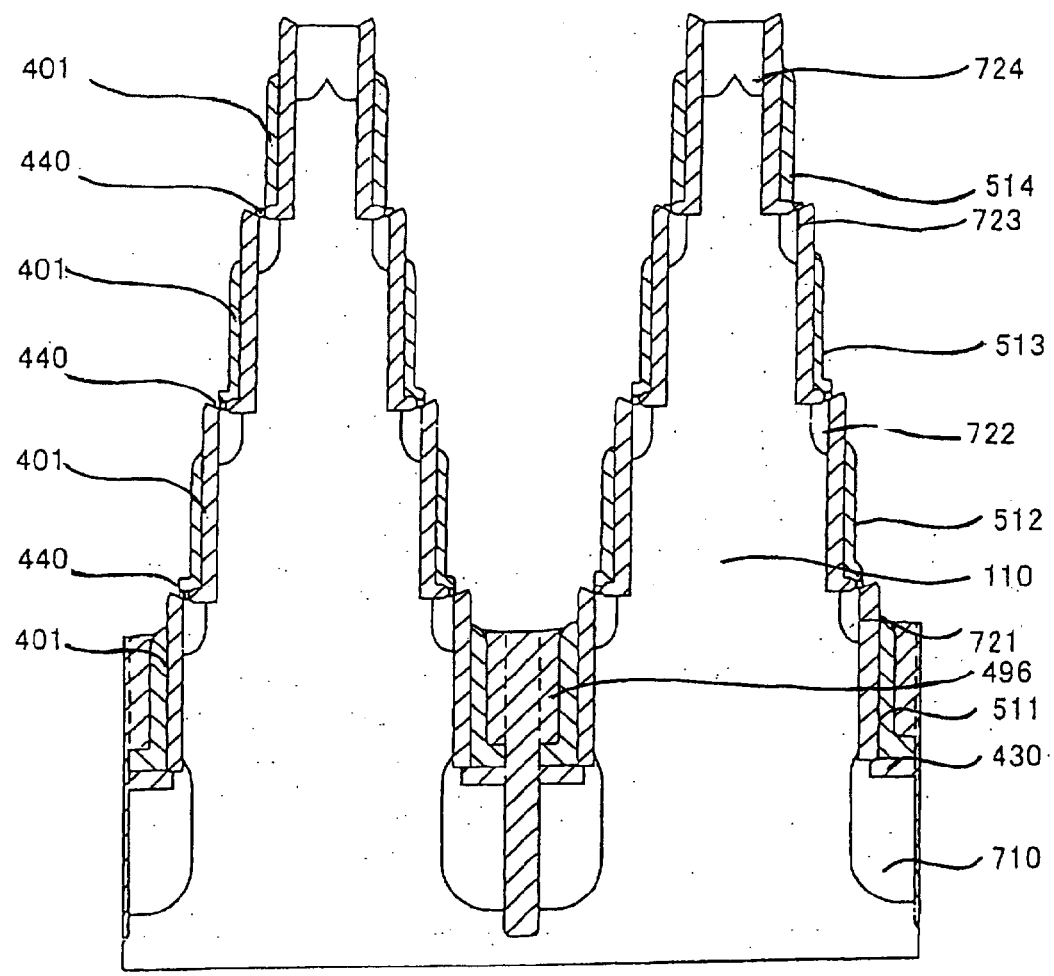
Figure 236:
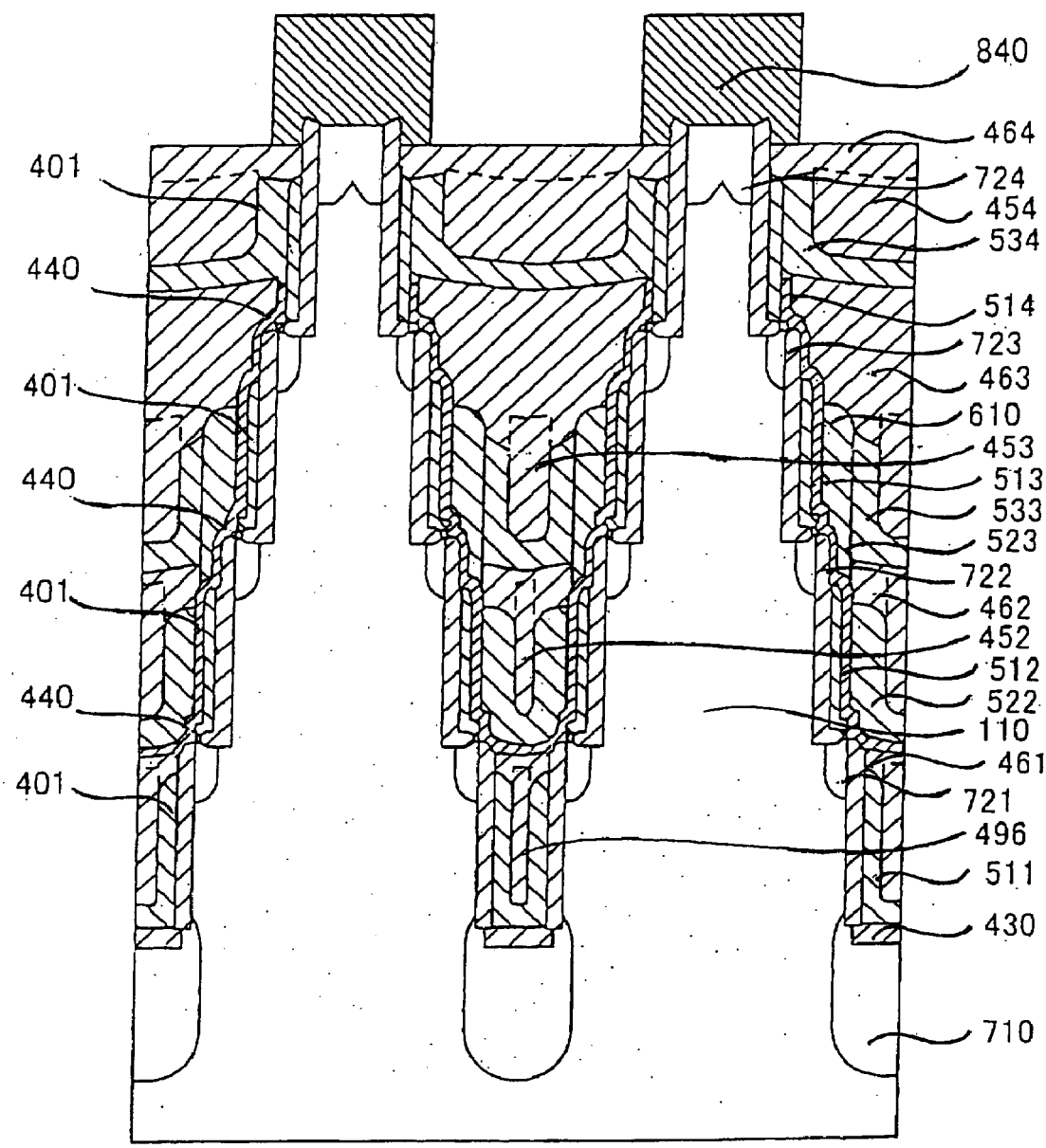
Figure 237:
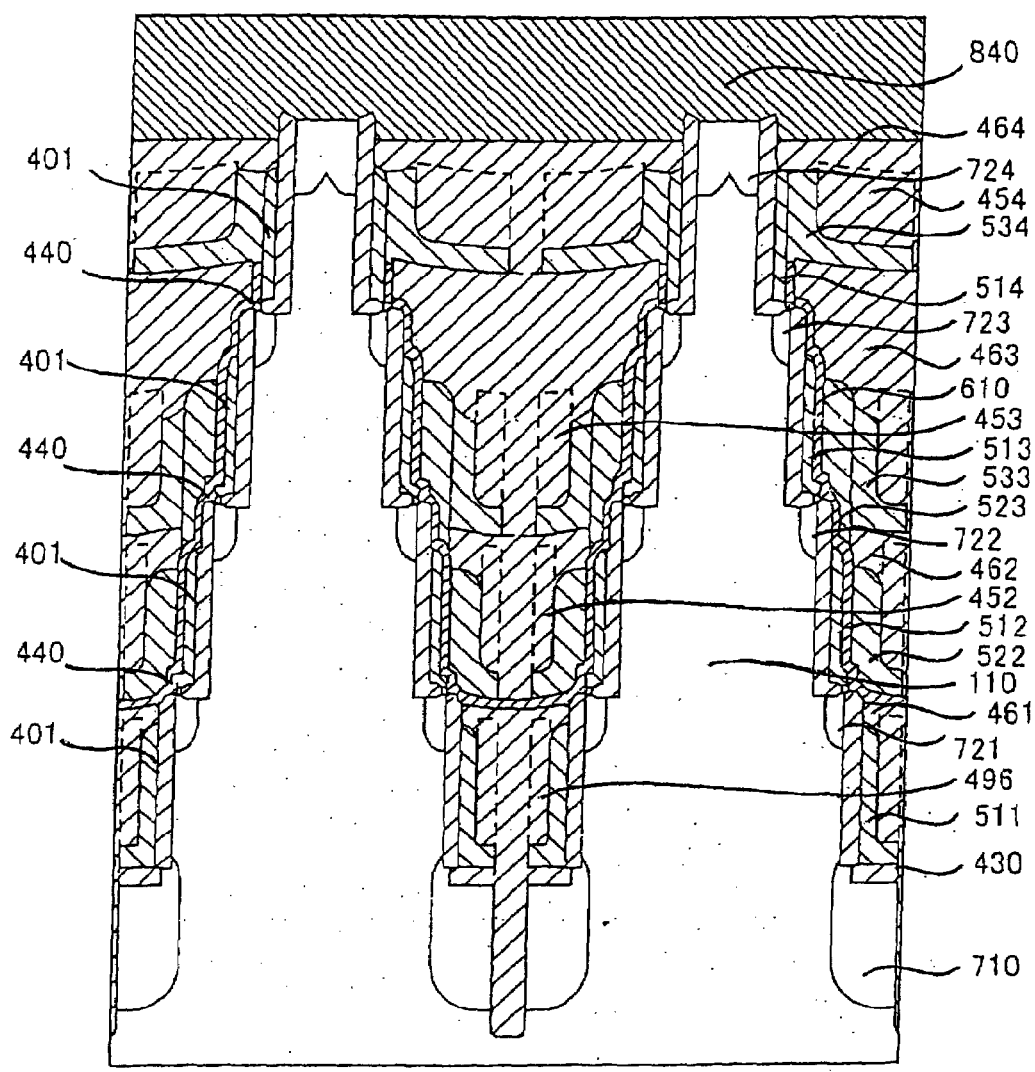
Figure 238:
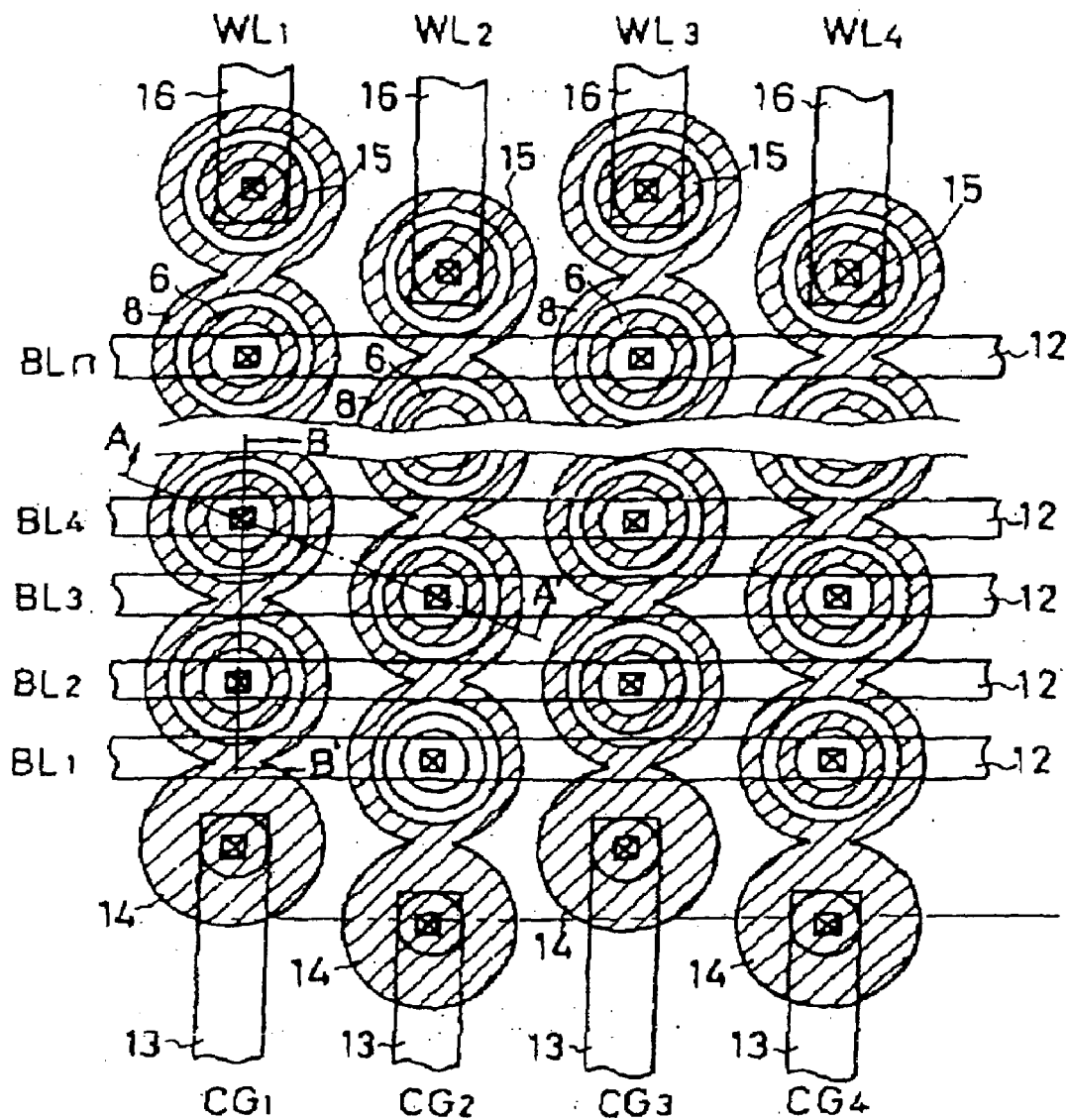
FIG. 238 is a schematic plain view of an EEPROM of prior art.
Figure 239A:
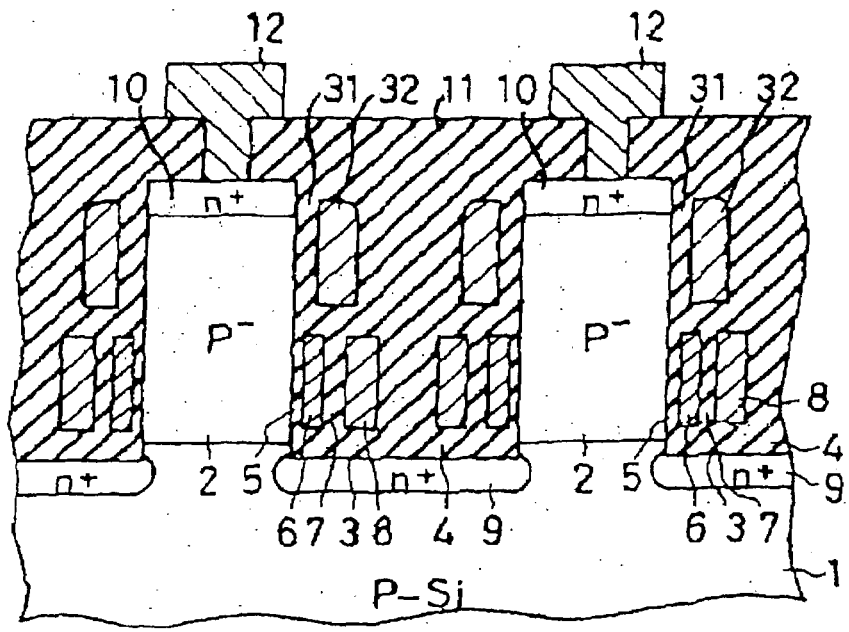
FIGS. 239A and 239B are schematic sectional views of A–A' line and B–B' line of FIG. 238.
Figure 239B:
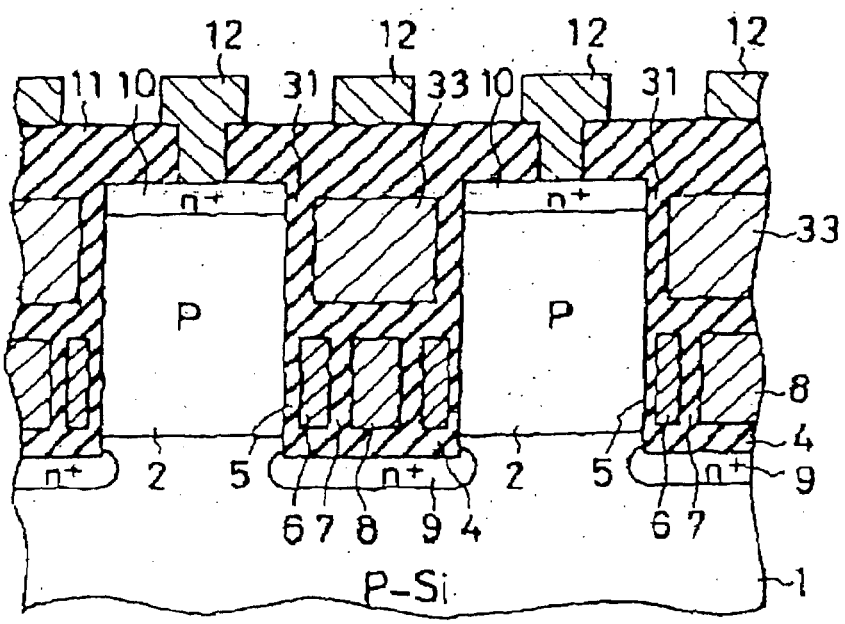
Figure 240A:
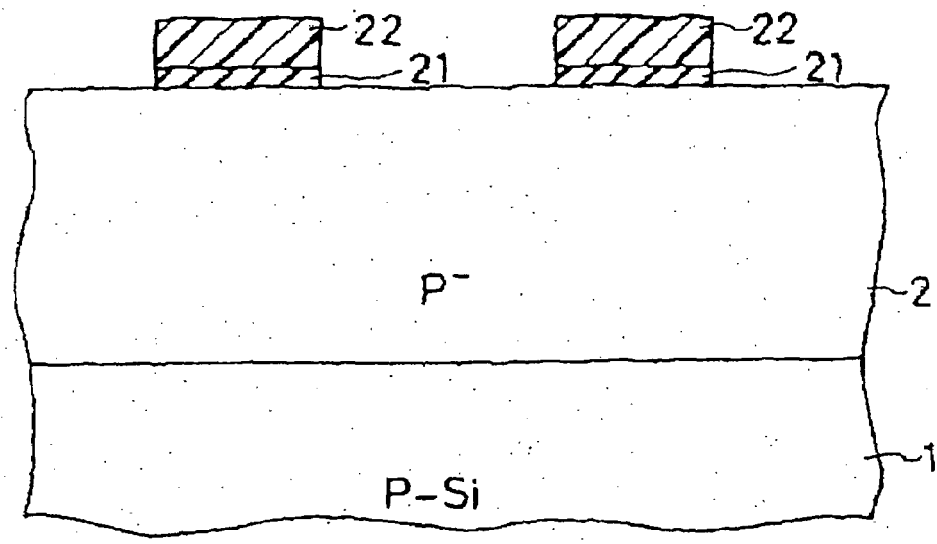
FIGS. 240A to 240G are sectional views showing a production process of an EEPROM of prior art.
Figure 240B:
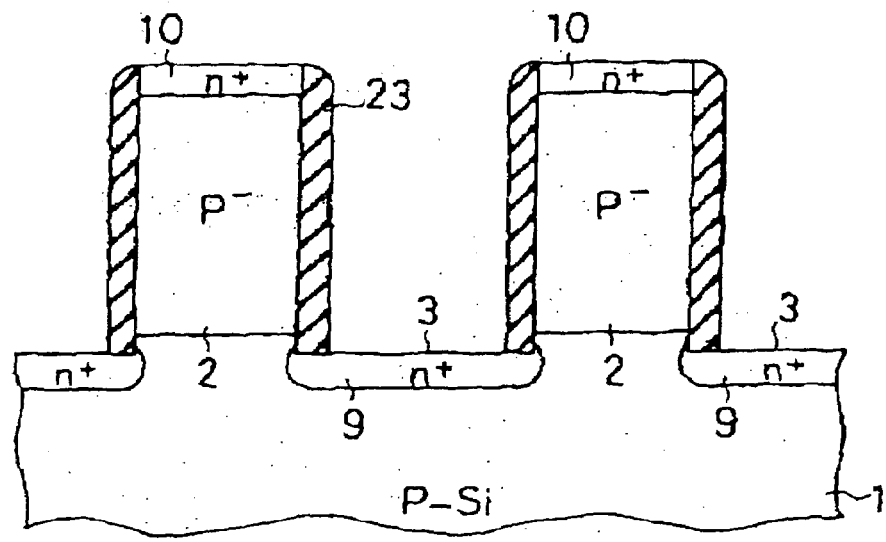
Figure 240C:
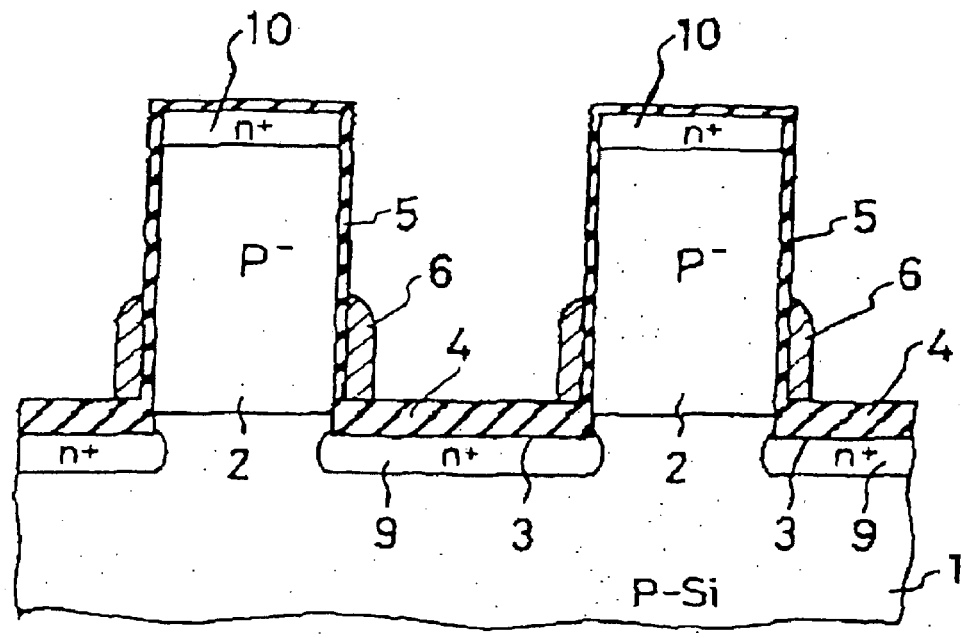
Figure 240D:
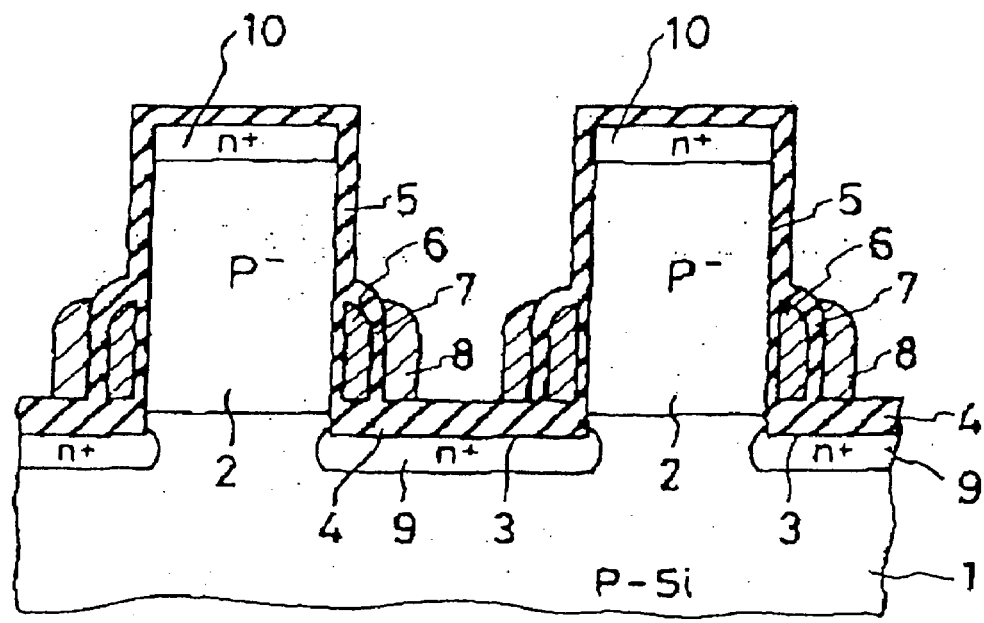
Figure 240E:
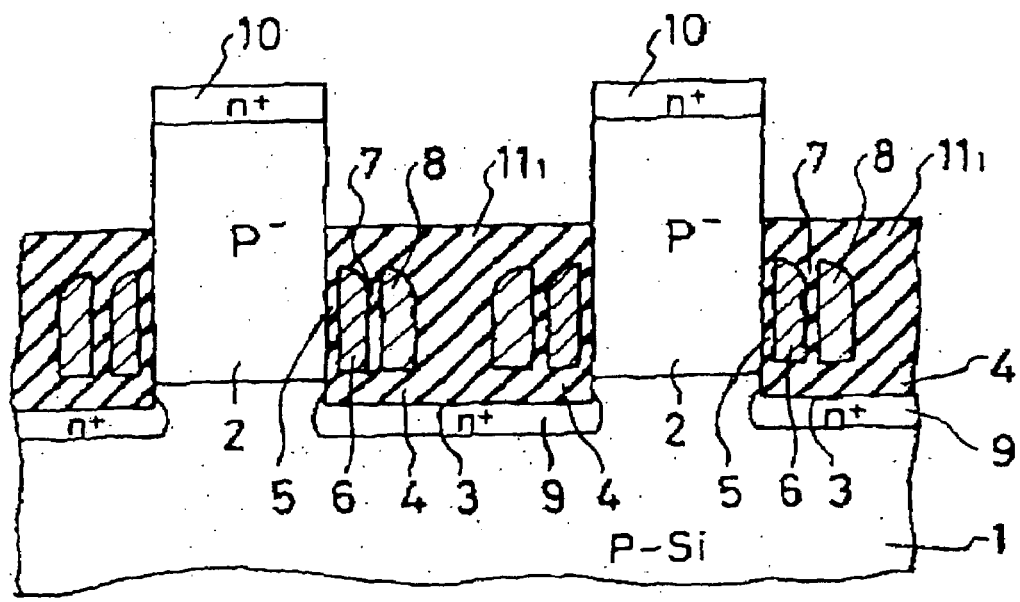
Figure 240F:
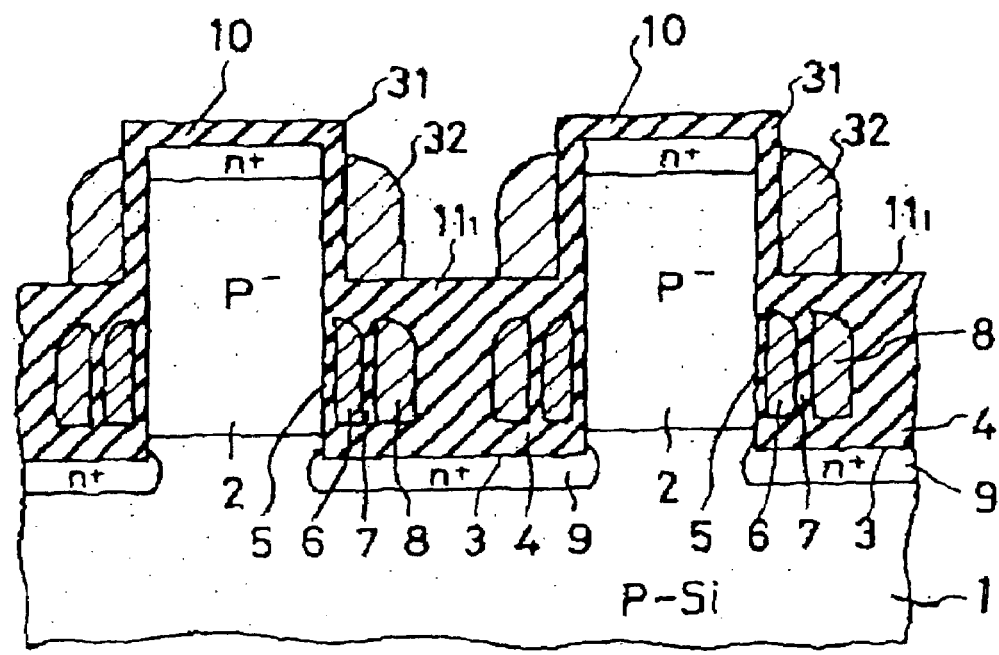
Figure 240G:
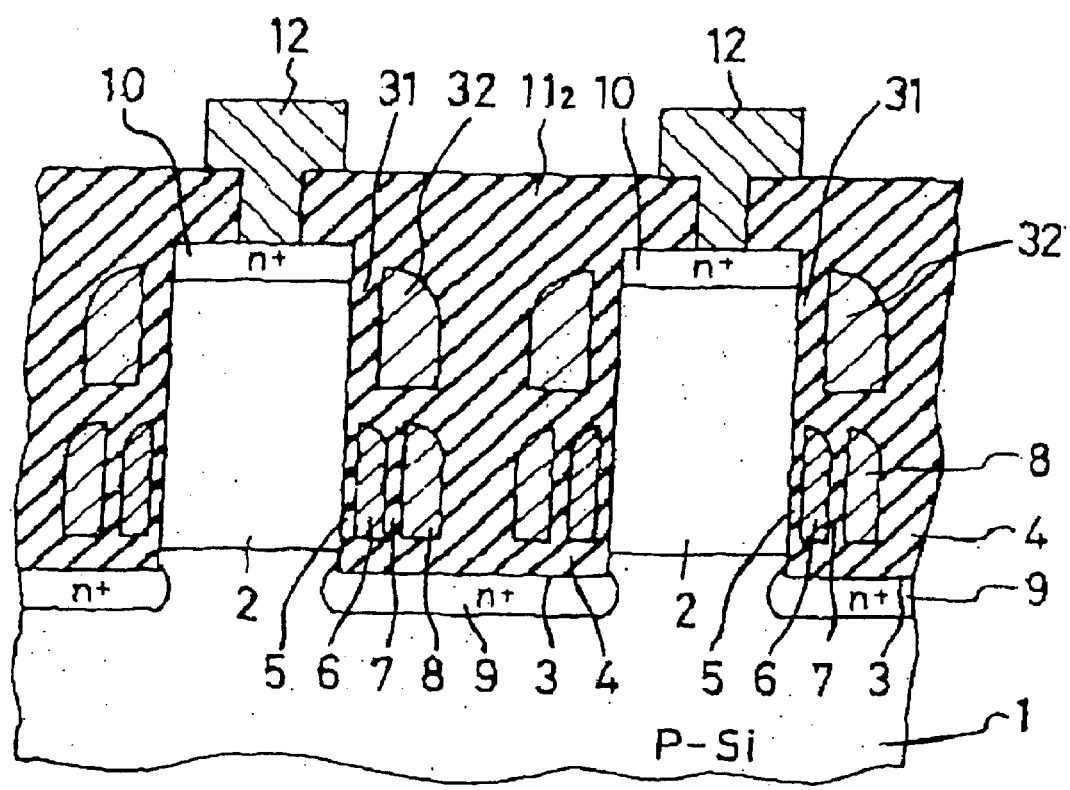
Figure 241A:
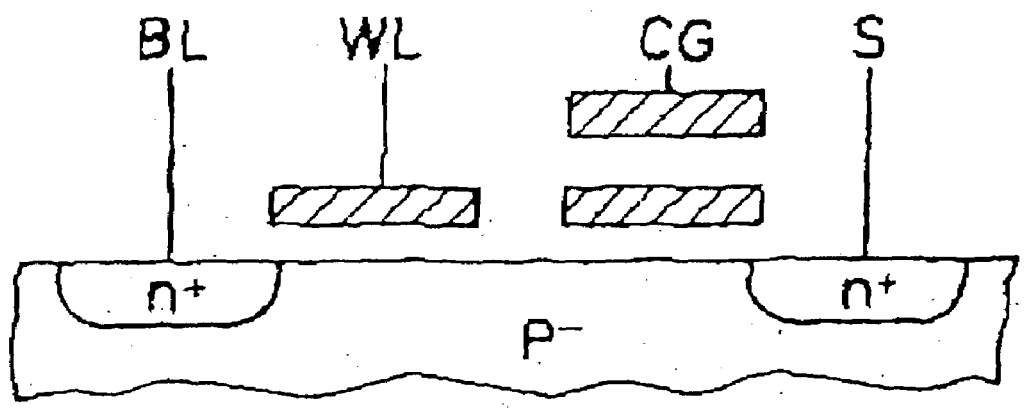
FIG. 241A is a schematic sectional view and FIG. 241B is an equivalent circuit diagram of FIG. 241A.
Figure 241B:
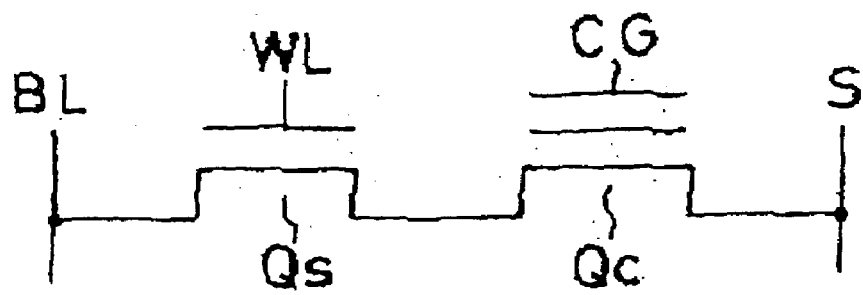
Figure 242:
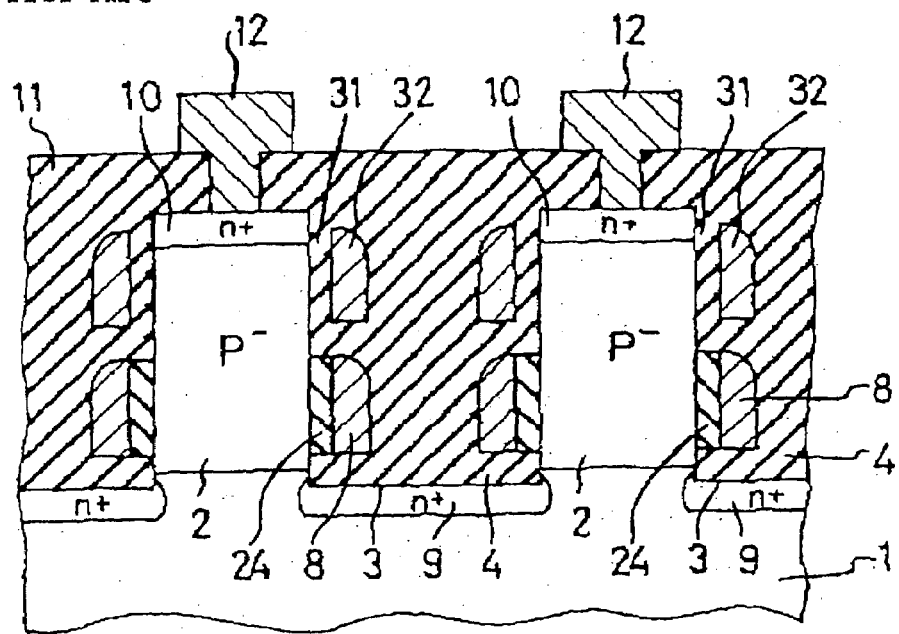
FIG. 242 is a schematic plain view of a MMOS of prior art.
Figure 243:
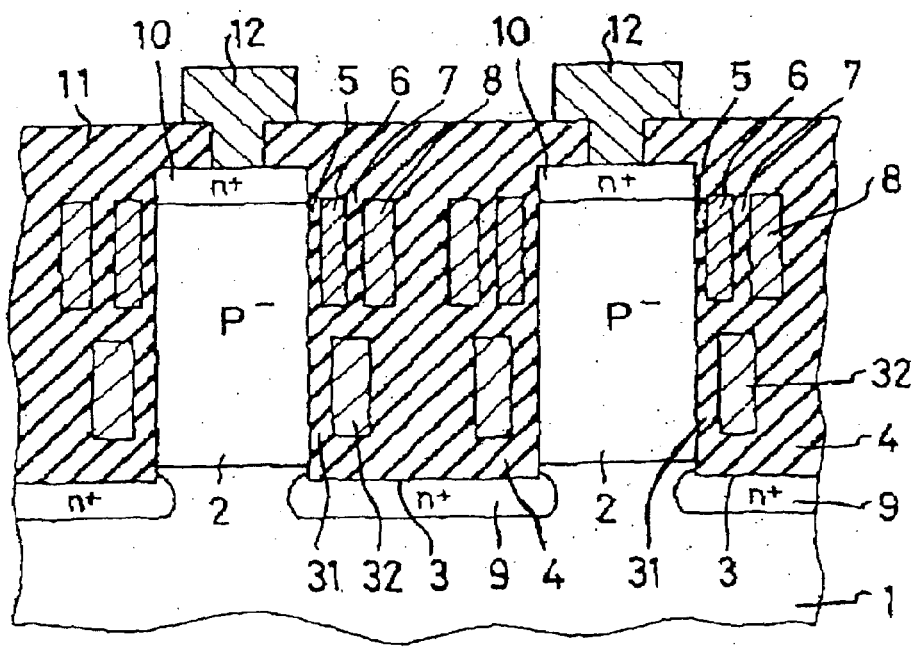
Figure 244:
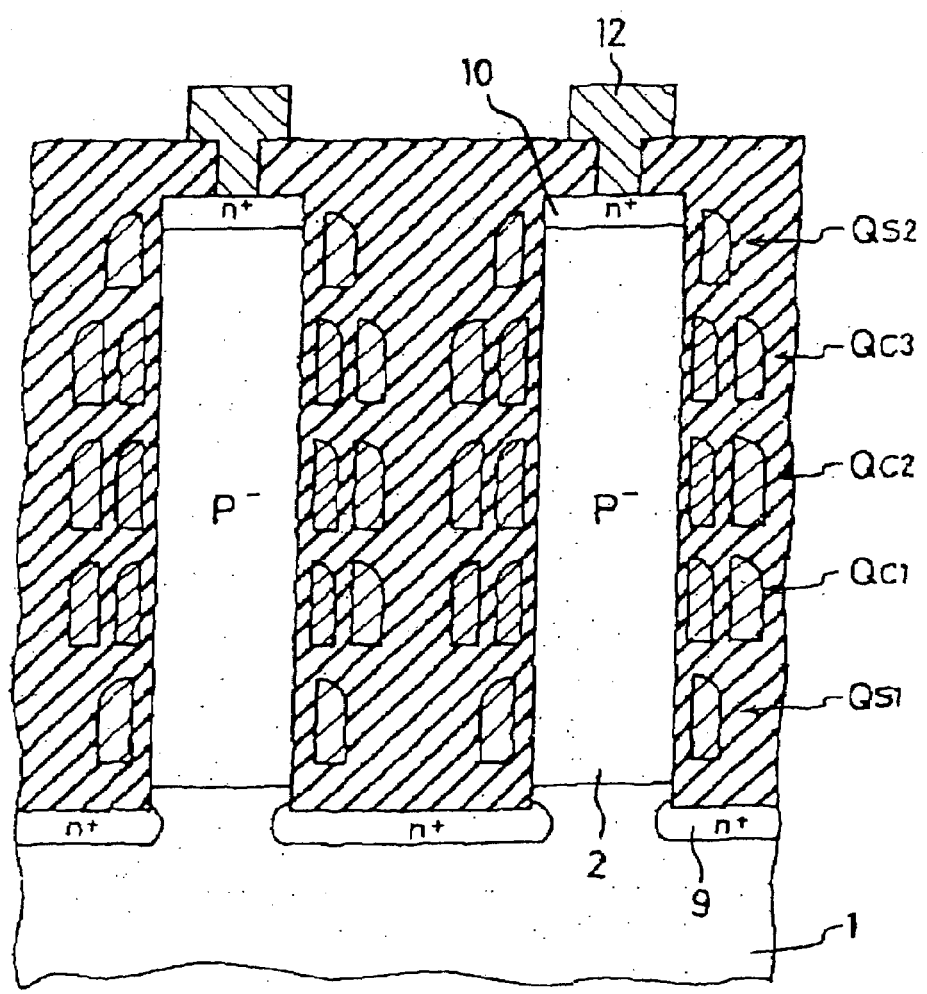
FIG. 244 is a schematic sectional view of a semiconductor memory device which a plurality of memory cells are formed on one columnar silicon layer.

After removing the resist, anisotropic etching is performed by using the remained sidewall spacers of the silicon oxide film 496 as a mask, thereby processing the polysilicon film 510 so as to be separated into the polysilicon films 511, 512, and 513 each taking the form of an L-shaped sidewall spacer and the polysilicon film 514 taking the form of an I-shaped sidewall spacer in memory transistor portions of the island-like semiconductor layer 110 (FIGS. 234 and 235).

After that, in a manner similar to the production example 1, by individually designing the selection gate insulating film and the memory gate insulating film including the tunnel oxide film, and the semiconductor memory device (FIGS. 236 and 237) can be produced.

According to the semiconductor memory device of the present invention, by forming memory transistors on island-like semiconductor layers, it has become possible to increase the capacity of memory transistors greatly, reduce the cell area per bit and reduce the size and costs of a chip. Particularly in the case where the island-like semiconductor layers having the memory transistors are formed to have the minimum patterning diameter (length) and the smallest distance between the island-like semiconductor layers is set to the minimum patterning distance, it is possible to obtain a capacity twice as large as that of the prior-art memory device if two memory transistors are formed on each island-like semiconductor layer. Therefore, the capacity can be raised by multiplication by the number of memory transistor stages per island-like semiconductor layer. Moreover, since the vertical direction which determines the device performance does not depend upon the minimum patterning dimensions, the performance of the memory device can be maintained.

Further, by forming a tunnel oxide film on the surface of the island-like semiconductor layers having steps, for example, by thermal oxidization, depositing a polysilicon film and then anisotropically etching the polysilicon film by reactive ion etching, the polysilicon films are formed by separation into sidewalls simultaneously of the steps. Accordingly, the process of forming the gates does not depend upon the number of steps, and it is not necessary to perform difficult alignment of levels by resist etch-back or the like. Therefore, it is possible to obtain a semiconductor memory device with reduced variations in its characteristics.

Further, the tunnel region can be formed in self-alignment with the shape of the steps of the island-like semiconductor layer and the tunnel region area can be easily designed. Thus, the ratio of the capacitance between the semiconductor layer and the charge storage layer to the capacitance between the charge storage layer and the control gate can be increased without increasing the memory cell occupation area, and reduction in memory operation voltage and improvement in operation speed can be realized.

By forming the impurity diffusion layers so that the active regions of the memory cells are floated from the substrate, the back-bias effect from the substrate can be eliminated. Therefore, variations in the characteristics of the memory cells do not occur due to decrease in the threshold of the memory cells at the time of reading, and the number of cells connected in series between the bit line and the source line can be increased, which allows the capacity to be increased. Also in the case where the bottom portion of the island-like semiconductor layer is a source, even if the active regions of the memory cells are not floated from the substrate, the source has the largest diameter in the island-like semiconductor layer having steps. With the stepwise structure of the island-like semiconductor layer, the source resistance can be decreased and the back-bias effect can be reduced. Therefore, it is possible to obtain a high-performance semiconductor memory device.

The side surfaces of an island-like semiconductor processed in a columnar shape having at least one step is formed as an active region, a tunnel oxide film and a floating gate as a charge storage layer are disposed on the side surface of each of the steps, a control gate is formed on at least a part of the side surface of the floating gate with intervention of an interlayer insulating film and ion implantation with good control, thereby enabling an inter-device diffusion layer to be easy formed in self-alignment with the gates. It is also possible to form the inter-device diffusion layer simultaneously when an impurity is introduced to the floating gate and to the control gate, which allows the inter-device diffusion layer to be formed without an inter-device diffusion layer forming step.

Further, as compared with the formation of inter-device diffusion layer by diffusion from a film highly doped with the impurity, the ion implantation provides a high degree of freedom because it does not limit the species of the diffused impurity due to a problem of segregation. The introduction of arsenic, which is difficult by means of diffusion, can be done relatively easily. Thus, a desired diffusion layer distribution can be obtained more freely.

Moreover, the formation of not only an n-type but also a p-type semiconductor memory device can be realized relatively easily, and realization of an inverter, a logic circuit, or the like by a transistor using a columnar-shape semiconductor substrate is also expected.

The formation of gates in a lump by separation can be realized extremely easily, and it does not depend upon the number of steps. Accordingly, it is possible to form a semiconductor memory device having a structure in which a plurality of memory cells are disposed in series in the direction vertical to the surface of the semiconductor substrate with a small number of process, with good control, at low costs, and in a short time. In addition, it is also possible to obtain the tunnel oxide films and the charge storage layers, or the gate oxide films and the control gates similar to the memory cells or the selection gate transistors. Similarly, the interlayer insulating films and the control gates similar to the memory cells can be obtained. Thus it is possible to easily produce a semiconductor memory device with reduced variations in characteristics.

What is claimed is:

1. A semiconductor memory device comprising:
   a first conductivity type semiconductor substrate;
   a plurality of memory cells each comprising an island-like semiconductor layer which is formed on the semiconductor substrate, and a charge storage layer and a control gate which are formed entirely or partially around a sidewall of the island-like semiconductor layer,
   wherein the plurality of memory cells are disposed in series, and for at least one of the island-like semiconductor layers has different cross-sectional widths varying in stages so as to have different widths at different distances from the semiconductor substrate, and
   an insulating film capable of passing charges is provided at least in a part of a plane of the island-like semiconductor layer horizontal to the semiconductor substrate.

2. The device according to claim 1, wherein the cross-sectional areas of the island-like semiconductor layer are step by step small to the direction of the surface of the semiconductor substrate.

3. The memory device according to claim 1, wherein the cross-sectional areas of the island-like semiconductor layer are step by step large to the direction of the surface of the semiconductor substrate.

4. The device according to claim 1, wherein the cross-sectional area of the island-like semiconductor layer distant from the semiconductor substrate is equal to that of the island-like semiconductor layer close to the semiconductor substrate.

5. The device according to claim 1, wherein the island-like semiconductor layer involves at least two same sizes of the cross-sectional areas thereof.

6. The device according to claim 1, wherein the plurality of memory cells are electrically insulated from the semiconductor substrate by a second conductivity type impurity diffusion layer formed in the semiconductor substrate or in the island-like semiconductor layer, or by both of said second conductivity type impurity diffusion layer and a first conductivity type impurity diffusion layer formed in the second conductivity type impurity diffusion layer.

7. The device according to claim 1, wherein at least one of the memory cells is electrically insulated from another memory cell by a second conductivity type impurity diffusion layer formed in the island-like semiconductor layer, or by both said second conductivity type impurity diffusion layer and a first conductivity type impurity diffusion layer formed in the second conductivity type impurity diffusion layer.

8. The device according to claim 6, wherein at least one of the memory cells is electrically insulated from another memory cell by a depletion layer formed at a junction of the second conductivity type impurity diffusion layer in the semiconductor substrate or the island-like semiconductor layer.

9. The device according to claim 7, wherein at least one of the memory cells is electrically insulated from another memory cell by a depletion layer formed at a junction of the second conductivity type impurity diffusion layer in the semiconductor substrate or the island-like semiconductor layer.

10. The device according to claim 1, wherein an impurity diffusion layer is formed on the surface of the semiconductor substrate and serves as common wiring of the memory cells.

11. The device according to claim 1, wherein a plurality of said island-like semiconductor layers are arranged in matrix, wiring for reading out the state of a charge stored in the memory cells is formed in the island-like semiconductor layers, a plurality of the control gates are disposed continuously in one direction so as to form a control gate line, and a plurality of wirings in a direction crossing the control gate line are connected to form a bit line.

12. The device according to claim 1, wherein a gate electrode for selecting the memory cells formed entirely or partially around the sidewall of the island-like semiconductor layer is formed at least on one end of the island-like semiconductor layer and the gate electrode is disposed in series with the memory cells.

13. The device according to claim 11, wherein the island-like semiconductor layer opposed to the gate electrode is electrically insulated from the semiconductor substrate or the memory cells by a second conductivity type impurity diffusion layer formed in the surface of the semiconductor substrate or the island-like semiconductor layer.

14. The device according to claim 11, wherein a second conductivity type impurity diffusion layer, or the second conductivity type impurity diffusion layer and a first conductivity type impurity diffusion layer formed therein is/are formed, in self-alignment with the charge storage layer, in a part or the entirety of respective corners of the island-like semiconductor layer having a step shape so that channel layers of memory cells are electrically connected to each other.

15. The device according to claim 11, wherein a second conductivity type impurity diffusion layer, or the second conductivity type impurity diffusion layer and a first conductivity type impurity diffusion layer formed therein is/are formed, in self-alignment with the charge storage layer and the gate electrode, in a part or the entirety of respective corners of the island-like semiconductor layer having a step shape so that a channel layer of at least one memory cell and another channel layer which is disposed in the island-like semiconductor layer and opposed to the gate electrode are electrically connected.

16. The device according to claim 1, wherein a plurality of said control gates are disposed close to each other so that channel layers of the memory cells are electrically connected.

17. The device according to claim 11, wherein the control gate and the gate electrode are disposed close to each other so that a channel layer of at least one memory cell and another channel layer which is disposed in the island-like semiconductor layer and opposed to the gate electrode are electrically connected.

18. The device according to claim 1, further comprising an electrode between the control gates for electrically connecting channel layers of the memory cells.

19. The device according to claim 11, further comprising an electrode between the control gate and the gate electrode for electrically connecting a channel layer of at least one memory cell and another channel layer which is disposed in the island-like semiconductor layer and opposed to the gate electrode.

20. The device according to claim 11, wherein the control gate and a part or the entirety of the gate electrode are made of the same material.

21. The device according to claim 11, wherein the charge storage layer and the gate electrode are made of the same material.

22. The device according to claim 1, wherein a plurality of said island-like semiconductor layers are arranged in matrix and the width of the island-like semiconductor layers in one direction is narrower than the distance between the adjacent island-like semiconductor layers in the same direction.

23. The device according to claim 1, wherein a plurality of said island-like semiconductor layers are arranged in matrix and the distance between the island-like semiconductor layers in one direction is shorter than that between the island-like semiconductor layers in a different direction.

* * * * *